US012043633B2

(12) United States Patent
Li et al.

(10) Patent No.: US 12,043,633 B2
(45) Date of Patent: Jul. 23, 2024

(54) METAL COMPLEXES, METHODS, AND USES THEREOF

(71) Applicant: Arizona Board of Regents on behalf of Arizona State University, Scottsdale, AZ (US)

(72) Inventors: Jian Li, Tempe, AZ (US); Eric Turner, Phoenix, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 29 days.

(21) Appl. No.: 17/212,209

(22) Filed: Mar. 25, 2021

(65) Prior Publication Data

US 2021/0230198 A1 Jul. 29, 2021

Related U.S. Application Data

(63) Continuation of application No. 15/905,385, filed on Feb. 26, 2018, now Pat. No. 10,995,108, which is a continuation of application No. 14/437,963, filed as application No. PCT/US2013/066793 on Oct. 25, 2013, now abandoned.

(60) Provisional application No. 61/719,077, filed on Oct. 26, 2012.

(51) Int. Cl.

| | |
|---|---|
| ***C07F 15/00*** | (2006.01) |
| ***C07F 1/08*** | (2006.01) |
| ***C07F 1/10*** | (2006.01) |
| ***C07F 1/12*** | (2006.01) |
| ***C07F 3/06*** | (2006.01) |
| ***C07F 13/00*** | (2006.01) |
| ***C07F 15/04*** | (2006.01) |
| ***C07F 15/06*** | (2006.01) |
| ***C09K 11/06*** | (2006.01) |
| ***H01L 51/50*** | (2006.01) |
| ***H05B 33/14*** | (2006.01) |
| ***H10K 50/11*** | (2023.01) |
| ***H10K 50/12*** | (2023.01) |
| ***H10K 50/125*** | (2023.01) |
| ***H10K 85/30*** | (2023.01) |
| ***H10K 85/40*** | (2023.01) |
| *H10K 101/00* | (2023.01) |
| *H10K 101/10* | (2023.01) |

(52) U.S. Cl.

CPC .............. *C07F 15/006* (2013.01); *C07F 1/08* (2013.01); *C07F 1/10* (2013.01); *C07F 1/12* (2013.01); *C07F 3/06* (2013.01); *C07F 13/00* (2013.01); *C07F 15/0033* (2013.01); *C07F 15/0073* (2013.01); *C07F 15/0086* (2013.01); *C07F 15/04* (2013.01); *C07F 15/06* (2013.01); *C09K 11/06* (2013.01); *H05B 33/14* (2013.01); *H10K 50/11* (2023.02); *H10K 50/121* (2023.02); *H10K 50/125* (2023.02); *H10K 85/331* (2023.02); *H10K 85/341* (2023.02); *H10K 85/342* (2023.02); *H10K 85/346* (2023.02); *H10K 85/371* (2023.02); *H10K 85/381* (2023.02); *H10K 85/40* (2023.02); *C09K 2211/1029* (2013.01); *C09K 2211/1033* (2013.01); *C09K 2211/1044* (2013.01); *C09K 2211/1088* (2013.01); *C09K 2211/1092* (2013.01); *C09K 2211/185* (2013.01); *C09K 2211/187* (2013.01); *C09K 2211/188* (2013.01); *H10K 2101/10* (2023.02); *H10K 2101/27* (2023.02)

(58) Field of Classification Search

CPC ................ C07F 15/006; C07F 15/0086; C07F 15/0073; H01L 51/50; H01L 51/00; H10K 50/00; H10K 50/10

USPC ..................................... 546/2; 313/504, 498

See application file for complete search history.

(56) References Cited

U.S. PATENT DOCUMENTS

| | | | |
|---|---|---|---|
| 4,769,292 | A | 9/1988 | Tang |
| 5,451,674 | A | 9/1995 | Silver |
| 5,641,878 | A | 6/1997 | Dandliker |
| 5,707,745 | A | 1/1998 | Forrest |
| 5,844,363 | A | 12/1998 | Gu |
| 6,200,695 | B1 | 3/2001 | Arai |
| 6,303,238 | B1 | 10/2001 | Thompson |
| 6,780,528 | B2 | 8/2004 | Tsuboyama |
| 7,002,013 | B1 | 2/2006 | Chi |
| 7,037,599 | B2 | 5/2006 | Culligan |
| 7,064,228 | B1 | 6/2006 | Yu |
| 7,268,485 | B2 | 9/2007 | Tyan |
| 7,279,704 | B2 | 10/2007 | Walters |
| 7,332,232 | B2 | 2/2008 | Ma |
| 7,442,797 | B2 | 10/2008 | Itoh |
| 7,501,190 | B2 | 3/2009 | Ise |
| 7,635,792 | B1 | 12/2009 | Cella |
| 7,655,322 | B2 | 2/2010 | Forrest |
| 7,854,513 | B2 | 12/2010 | Quach |

(Continued)

FOREIGN PATENT DOCUMENTS

| | | |
|---|---|---|
| CN | 1680366 A | 10/2005 |
| CN | 1777663 | 5/2006 |

(Continued)

OTHER PUBLICATIONS

The claim set of the U.S. Appl. No. 62/444,973, filed Jan. 11, 2017, Lichang Zeng, 36 pages. (Year: 2017).

(Continued)

*Primary Examiner* — Charanjit Aulakh

(74) *Attorney, Agent, or Firm* — Riverside Law LLP

(57) ABSTRACT

Disclosed herein are metal complexes that exhibit multiple radiative decay mechanisms, together with methods for the preparation and use thereof.

6 Claims, 10 Drawing Sheets

(56) References Cited

U.S. PATENT DOCUMENTS

| | | | |
|---|---|---|---|
| 7,947,383 | B2 | 5/2011 | Ise |
| 8,106,199 | B2 | 1/2012 | Jabbour |
| 8,133,597 | B2 | 3/2012 | Yasukawa |
| 8,389,725 | B2 | 3/2013 | Li |
| 8,617,723 | B2 | 12/2013 | Stoessel |
| 8,669,364 | B2 | 3/2014 | Li |
| 8,778,509 | B2 | 7/2014 | Yasukawa |
| 8,816,080 | B2 | 8/2014 | Li |
| 8,846,940 | B2 | 9/2014 | Li |
| 8,871,361 | B2 | 10/2014 | Xia |
| 8,927,713 | B2 | 1/2015 | Li |
| 8,933,622 | B2 | 1/2015 | Kawami |
| 8,946,417 | B2 | 2/2015 | Jian |
| 8,987,451 | B2 | 3/2015 | Tsai |
| 9,059,412 | B2 | 6/2015 | Zeng |
| 9,076,974 | B2 | 7/2015 | Li |
| 9,082,989 | B2 | 7/2015 | Li |
| 9,203,039 | B2 | 12/2015 | Li |
| 9,221,857 | B2 | 12/2015 | Li |
| 9,224,963 | B2 | 12/2015 | Li |
| 9,238,668 | B2 | 1/2016 | Li |
| 9,312,502 | B2 | 4/2016 | Li |
| 9,312,505 | B2 | 4/2016 | Brooks |
| 9,318,725 | B2 | 4/2016 | Li |
| 9,324,957 | B2 | 4/2016 | Li |
| 9,382,273 | B2 | 7/2016 | Li |
| 9,385,329 | B2 | 7/2016 | Li |
| 9,425,415 | B2 | 8/2016 | Li |
| 9,461,254 | B2 | 10/2016 | Tsai |
| 9,493,698 | B2 | 11/2016 | Beers |
| 9,502,671 | B2 | 11/2016 | Jian |
| 9,550,801 | B2 | 1/2017 | Li |
| 9,598,449 | B2 | 3/2017 | Li |
| 9,617,291 | B2 | 4/2017 | Li |
| 9,666,822 | B2 | 5/2017 | Forrest |
| 9,673,409 | B2 | 6/2017 | Li |
| 9,698,359 | B2 | 7/2017 | Li |
| 9,711,739 | B2 | 7/2017 | Li |
| 9,711,741 | B2 | 7/2017 | Li |
| 9,711,742 | B2 | 7/2017 | Li |
| 9,735,397 | B2 | 8/2017 | Riegel |
| 9,755,163 | B2 | 9/2017 | Li |
| 9,818,959 | B2 | 11/2017 | Li |
| 9,865,825 | B2 | 1/2018 | Li |
| 9,879,039 | B2 | 1/2018 | Li |
| 9,882,150 | B2 | 1/2018 | Li |
| 9,899,614 | B2 | 2/2018 | Li |
| 9,920,242 | B2 | 3/2018 | Li |
| 9,923,155 | B2 | 3/2018 | Li |
| 9,941,479 | B2 | 4/2018 | Li |
| 9,947,881 | B2 | 4/2018 | Li |
| 9,985,224 | B2 | 5/2018 | Li |
| 10,020,455 | B2 | 7/2018 | Li |
| 10,033,003 | B2 | 7/2018 | Li |
| 10,056,564 | B2 | 8/2018 | Li |
| 10,056,567 | B2 | 8/2018 | Li |
| 10,158,091 | B2 | 12/2018 | Li |
| 10,177,323 | B2 | 1/2019 | Li |
| 10,211,411 | B2 | 2/2019 | Li |
| 10,211,414 | B2 | 2/2019 | Li |
| 10,263,197 | B2 | 4/2019 | Li |
| 10,294,417 | B2 | 5/2019 | Li |
| 10,392,387 | B2 | 8/2019 | Li |
| 10,411,202 | B2 | 9/2019 | Li |
| 10,414,785 | B2 | 9/2019 | Li |
| 10,516,117 | B2 | 12/2019 | Li |
| 10,566,553 | B2 | 2/2020 | Li |
| 10,566,554 | B2 | 2/2020 | Li |
| 10,622,571 | B2 | 4/2020 | Li |
| 10,804,475 | B2 | 10/2020 | Zeng |
| 10,836,785 | B2 | 11/2020 | Li |
| 11,183,670 | B2 | 11/2021 | Li |
| 11,594,688 | B2 | 2/2023 | Li |
| 2001/0019782 | A1 | 9/2001 | Igarashi |
| 2002/0068190 | A1 | 6/2002 | Tsuboyama |
| 2003/0062519 | A1 | 4/2003 | Yamazaki |
| 2003/0180574 | A1 | 9/2003 | Huang |
| 2003/0186077 | A1 | 10/2003 | Chen |
| 2004/0230061 | A1 | 11/2004 | Seo |
| 2005/0037232 | A1 | 2/2005 | Tyan |
| 2005/0139810 | A1 | 6/2005 | Kuehl |
| 2005/0170207 | A1 | 8/2005 | Ma |
| 2005/0260446 | A1 | 11/2005 | Mackenzie |
| 2006/0024522 | A1 | 2/2006 | Thompson |
| 2006/0032528 | A1 | 2/2006 | Wang |
| 2006/0066228 | A1 | 3/2006 | Antoniadis |
| 2006/0073359 | A1 | 4/2006 | Ise |
| 2006/0094875 | A1 | 5/2006 | Itoh |
| 2006/0127696 | A1 | 6/2006 | Stossel |
| 2006/0182992 | A1 | 8/2006 | Nii |
| 2006/0202197 | A1 | 9/2006 | Nakayama |
| 2006/0210831 | A1 | 9/2006 | Sano |
| 2006/0255721 | A1 | 11/2006 | Igarashi |
| 2006/0263635 | A1 | 11/2006 | Ise |
| 2006/0286406 | A1 | 12/2006 | Igarashi |
| 2007/0057630 | A1 | 3/2007 | Nishita |
| 2007/0059551 | A1 | 3/2007 | Yamazaki |
| 2007/0082284 | A1 | 4/2007 | Stoessel |
| 2007/0103060 | A1 | 5/2007 | Itoh |
| 2007/0160905 | A1 | 7/2007 | Morishita |
| 2007/0252140 | A1 | 11/2007 | Limmert |
| 2008/0001530 | A1 | 1/2008 | Ise |
| 2008/0036373 | A1 | 2/2008 | Itoh |
| 2008/0054799 | A1 | 3/2008 | Satou |
| 2008/0079358 | A1 | 4/2008 | Satou |
| 2008/0102310 | A1 | 5/2008 | Thompson |
| 2008/0111476 | A1 | 5/2008 | Choi |
| 2008/0241518 | A1 | 10/2008 | Satou |
| 2008/0241589 | A1 | 10/2008 | Fukunaga |
| 2008/0269491 | A1 | 10/2008 | Jabbour |
| 2008/0315187 | A1 | 12/2008 | Bazan |
| 2009/0026936 | A1 | 1/2009 | Satou |
| 2009/0026939 | A1 | 1/2009 | Kinoshita |
| 2009/0032989 | A1 | 2/2009 | Karim |
| 2009/0039768 | A1 | 2/2009 | Igarashi |
| 2009/0079340 | A1 | 3/2009 | Kinoshita |
| 2009/0126796 | A1 | 5/2009 | Yang |
| 2009/0128008 | A1 | 5/2009 | Ise |
| 2009/0136779 | A1 | 5/2009 | Cheng |
| 2009/0153045 | A1 | 6/2009 | Kinoshita |
| 2009/0167157 | A1 | 7/2009 | Murakami |
| 2009/0167167 | A1 | 7/2009 | Aoyama |
| 2009/0205713 | A1 | 8/2009 | Mitra |
| 2009/0218561 | A1 | 9/2009 | Kitamura |
| 2009/0261721 | A1 | 10/2009 | Murakami |
| 2009/0267500 | A1 | 10/2009 | Kinoshita |
| 2010/0000606 | A1 | 1/2010 | Thompson |
| 2010/0013386 | A1 | 1/2010 | Thompson |
| 2010/0043876 | A1 | 2/2010 | Tuttle |
| 2010/0093119 | A1 | 4/2010 | Shimizu |
| 2010/0127246 | A1 | 5/2010 | Nakayama |
| 2010/0141127 | A1 | 6/2010 | Xia |
| 2010/0147386 | A1 | 6/2010 | Benson-Smith |
| 2010/0171111 | A1 | 7/2010 | Takada |
| 2010/0171418 | A1 | 7/2010 | Kinoshita |
| 2010/0200051 | A1 | 8/2010 | Triani |
| 2010/0204467 | A1 | 8/2010 | Lamarque |
| 2010/0270540 | A1 | 10/2010 | Chung |
| 2010/0288362 | A1 | 11/2010 | Hatwar |
| 2010/0297522 | A1 | 11/2010 | Creeth |
| 2010/0301315 | A1 | 12/2010 | Masui |
| 2010/0307594 | A1 | 12/2010 | Zhu |
| 2011/0028723 | A1 | 2/2011 | Li |
| 2011/0049496 | A1 | 3/2011 | Fukuzaki |
| 2011/0062858 | A1 | 3/2011 | Yersin |
| 2011/0132440 | A1 | 6/2011 | Sivarajan |
| 2011/0217544 | A1 | 9/2011 | Young |
| 2011/0227058 | A1 | 9/2011 | Masui |
| 2011/0301351 | A1 | 12/2011 | Li |
| 2012/0024383 | A1 | 2/2012 | Kaiho |
| 2012/0025588 | A1 | 2/2012 | Humbert |
| 2012/0039323 | A1 | 2/2012 | Hirano |
| 2012/0095232 | A1 | 4/2012 | Li |
| 2012/0108806 | A1 | 5/2012 | Li |

(56) References Cited

U.S. PATENT DOCUMENTS

2012/0146012 A1 6/2012 Limmert
2012/0181528 A1 7/2012 Takada
2012/0199823 A1 8/2012 Molt
2012/0202997 A1 8/2012 Parham
2012/0204960 A1 8/2012 Kato
2012/0215001 A1 8/2012 Li
2012/0223634 A1 9/2012 Xia
2012/0264938 A1 10/2012 Li
2012/0273736 A1 11/2012 James
2012/0302753 A1 11/2012 Li
2013/0048963 A1 2/2013 Beers
2013/0082245 A1 4/2013 Kottas
2013/0137870 A1 5/2013 Li
2013/0168656 A1 7/2013 Tsai
2013/0172561 A1 7/2013 Tsai
2013/0200340 A1 8/2013 Otsu
2013/0203996 A1 8/2013 Li
2013/0237706 A1 9/2013 Li
2013/0341600 A1 12/2013 Lin
2014/0014922 A1 1/2014 Lin
2014/0014931 A1 1/2014 Riegel
2014/0027733 A1 1/2014 Zeng
2014/0042475 A1 2/2014 Park
2014/0066628 A1 3/2014 Li
2014/0073798 A1 3/2014 Li
2014/0084261 A1 3/2014 Brooks
2014/0114072 A1 4/2014 Li
2014/0147996 A1 5/2014 Vogt
2014/0148594 A1 5/2014 Li
2014/0191206 A1 7/2014 Cho
2014/0203248 A1 7/2014 Zhou
2014/0249310 A1 9/2014 Li
2014/0326960 A1 11/2014 Kim
2014/0330019 A1 11/2014 Li
2014/0364605 A1 12/2014 Li
2014/0374728 A1 12/2014 Adamovich
2015/0008419 A1 1/2015 Li
2015/0018558 A1 1/2015 Li
2015/0028323 A1 1/2015 Xia
2015/0060804 A1 3/2015 Kanitz
2015/0069334 A1 3/2015 Xia
2015/0105556 A1 4/2015 Li
2015/0123047 A1 5/2015 Maltenberger
2015/0162552 A1 6/2015 Li
2015/0194616 A1 7/2015 Li
2015/0207086 A1 7/2015 Li
2015/0228914 A1 8/2015 Li
2015/0274762 A1 10/2015 Li
2015/0287938 A1 10/2015 Li
2015/0311456 A1 10/2015 Li
2015/0318500 A1 11/2015 Li
2015/0349279 A1 12/2015 Li
2015/0380666 A1 12/2015 Szigethy
2016/0028028 A1 1/2016 Li
2016/0028029 A1 1/2016 Li
2016/0043331 A1 2/2016 Li
2016/0072082 A1 3/2016 Brooks
2016/0133861 A1 5/2016 Li
2016/0133862 A1 5/2016 Li
2016/0181529 A1 6/2016 Tsai
2016/0194344 A1 7/2016 Li
2016/0197285 A1 7/2016 Zeng
2016/0197291 A1 7/2016 Li
2016/0204358 A1 7/2016 Stoessel
2016/0285015 A1 9/2016 Li
2016/0359120 A1 12/2016 Li
2016/0359125 A1 12/2016 Li
2017/0005278 A1 1/2017 Li
2017/0012224 A1 1/2017 Li
2017/0040555 A1 2/2017 Li
2017/0047533 A1 2/2017 Li
2017/0066792 A1 3/2017 Li
2017/0069855 A1 3/2017 Li
2017/0077420 A1 3/2017 Li
2017/0125708 A1 5/2017 Li
2017/0267923 A1 9/2017 Li
2017/0271611 A1 9/2017 Li
2017/0301871 A1 10/2017 Li
2017/0305881 A1 10/2017 Li
2017/0309943 A1 10/2017 Angell
2017/0331056 A1 11/2017 Li
2017/0342098 A1 11/2017 Li
2017/0373260 A1 12/2017 Li
2018/0006246 A1 1/2018 Li
2018/0013096 A1 1/2018 Hamada
2018/0037812 A1 2/2018 Pegington
2018/0052366 A1 2/2018 Hao
2018/0053904 A1 2/2018 Li
2018/0062084 A1 3/2018 Watabe
2018/0130960 A1 5/2018 Li
2018/0138428 A1 5/2018 Li
2018/0148464 A1 5/2018 Li
2018/0159051 A1 6/2018 Li
2018/0166655 A1 6/2018 Li
2018/0175329 A1 6/2018 Li
2018/0194790 A1 7/2018 Li
2018/0198081 A1 7/2018 Zeng
2018/0219161 A1 8/2018 Li
2018/0226592 A1 8/2018 Li
2018/0226593 A1 8/2018 Li
2018/0230173 A1* 8/2018 Ji et al. .................. C07F 15/00
546/2
2018/0277777 A1 9/2018 Li
2018/0301641 A1 10/2018 Li
2018/0312750 A1 11/2018 Li
2018/0331307 A1 11/2018 Li
2018/0334459 A1 11/2018 Li
2018/0337345 A1 11/2018 Li
2018/0337349 A1 11/2018 Li
2018/0337350 A1 11/2018 Li
2018/0353771 A1 12/2018 Kim
2019/0013485 A1 1/2019 Li
2019/0058137 A1 2/2019 Ko
2019/0067602 A1 2/2019 Li
2019/0109288 A1 4/2019 Li
2019/0119312 A1 4/2019 Chen
2019/0157352 A1 5/2019 Li
2019/0194536 A1 6/2019 Li
2019/0221757 A1 7/2019 Tarran
2019/0259963 A1 8/2019 Jian
2019/0276485 A1 9/2019 Li
2019/0312217 A1 10/2019 Li
2019/0367546 A1 12/2019 Li
2019/0389893 A1 12/2019 Li
2020/0006678 A1 1/2020 Li
2020/0055885 A1 2/2020 Tarran
2020/0071330 A1 3/2020 Li
2020/0075868 A1 3/2020 Li
2020/0119288 A1 4/2020 Li
2020/0119289 A1 4/2020 Lin
2020/0140471 A1 5/2020 Chen
2020/0152891 A1 5/2020 Li
2020/0168798 A1 5/2020 Han
2020/0227656 A1 7/2020 Li
2020/0227660 A1 7/2020 Li
2020/0239505 A1 7/2020 Li
2020/0243776 A1 7/2020 Li
2020/0287153 A1 9/2020 Li
2020/0332185 A1 10/2020 Li
2020/0365819 A1 11/2020 Seo
2020/0373505 A1 11/2020 Li
2020/0403167 A1 12/2020 Li
2021/0024526 A1 1/2021 Li
2021/0024559 A1 1/2021 Li
2021/0047296 A1 2/2021 Li
2021/0091316 A1 3/2021 Li
2021/0095195 A1 4/2021 Ma
2021/0292351 A1 9/2021 Macinnis

(56) References Cited

U.S. PATENT DOCUMENTS

| | | | |
|---|---|---|---|
| 2021/0376260 | A1 | 12/2021 | Li |
| 2022/0059786 | A1 | 2/2022 | Seo |

FOREIGN PATENT DOCUMENTS

| | | | |
|---|---|---|---|
| CN | 1894267 | | 1/2007 |
| CN | 1894269 | A | 1/2007 |
| CN | 101142223 | A | 3/2008 |
| CN | 101667626 | | 3/2010 |
| CN | 102449108 | A | 5/2012 |
| CN | 102892860 | A | 1/2013 |
| CN | 102971396 | A | 3/2013 |
| CN | 103102372 | | 5/2013 |
| CN | 104232076 | A | 12/2014 |
| CN | 104377231 | | 2/2015 |
| CN | 104576934 | | 4/2015 |
| CN | 104693243 | A | 6/2015 |
| CN | 105367605 | A | 3/2016 |
| CN | 105418591 | A | 3/2016 |
| CN | 106783922 | | 5/2017 |
| EP | 1617493 | | 1/2006 |
| EP | 1808052 | A1 | 7/2007 |
| EP | 1874893 | A1 | 1/2008 |
| EP | 1874894 | A1 | 1/2008 |
| EP | 1919928 | A1 | 5/2008 |
| EP | 1968131 | | 9/2008 |
| EP | 2020694 | | 2/2009 |
| EP | 2036907 | A1 | 3/2009 |
| EP | 2096690 | | 9/2009 |
| EP | 2112213 | A2 | 10/2009 |
| EP | 2417217 | A2 | 2/2012 |
| EP | 2684932 | | 1/2014 |
| EP | 2711999 | A2 | 3/2014 |
| EP | 3032293 | | 6/2016 |
| JP | 2002010505 | | 1/2002 |
| JP | 2002105055 | | 4/2002 |
| JP | 2003342284 | | 12/2003 |
| JP | 2005031073 | | 2/2005 |
| JP | 2005267557 | | 9/2005 |
| JP | 2005310733 | A | 11/2005 |
| JP | 2006047240 | A | 2/2006 |
| JP | 2006232784 | A | 9/2006 |
| JP | 2006242080 | | 9/2006 |
| JP | 2006242081 | A | 9/2006 |
| JP | 2006256999 | A | 9/2006 |
| JP | 2006257238 | A | 9/2006 |
| JP | 2006261623 | A | 9/2006 |
| JP | 2006290988 | A | 10/2006 |
| JP | 2006313796 | A | 11/2006 |
| JP | 2006332622 | A | 12/2006 |
| JP | 2006351638 | A | 12/2006 |
| JP | 2007019462 | A | 1/2007 |
| JP | 2007031678 | | 2/2007 |
| JP | 2007042875 | A | 2/2007 |
| JP | 2007051243 | A | 3/2007 |
| JP | 2007053132 | A | 3/2007 |
| JP | 2007066581 | | 3/2007 |
| JP | 2007073620 | A | 3/2007 |
| JP | 2007073845 | A | 3/2007 |
| JP | 2007073900 | A | 3/2007 |
| JP | 2007080593 | | 3/2007 |
| JP | 2007080677 | A | 3/2007 |
| JP | 2007088105 | | 4/2007 |
| JP | 2007088164 | A | 4/2007 |
| JP | 2007096259 | A | 4/2007 |
| JP | 2007099765 | A | 4/2007 |
| JP | 2007110067 | | 4/2007 |
| JP | 2007110102 | A | 4/2007 |
| JP | 2007519614 | | 7/2007 |
| JP | 2007258550 | A | 10/2007 |
| JP | 2007324309 | A | 12/2007 |
| JP | 2008010353 | A | 1/2008 |
| JP | 2008091860 | A | 4/2008 |
| JP | 2008103535 | A | 5/2008 |
| JP | 2008108617 | A | 5/2008 |
| JP | 2008109085 | | 5/2008 |
| JP | 2008109103 | A | 5/2008 |
| JP | 2008116343 | A | 5/2008 |
| JP | 2008117545 | A | 5/2008 |
| JP | 2008160087 | A | 7/2008 |
| JP | 2008198801 | A | 8/2008 |
| JP | 2008270729 | A | 11/2008 |
| JP | 2008270736 | | 11/2008 |
| JP | 2008310220 | A | 12/2008 |
| JP | 2009016184 | A | 1/2009 |
| JP | 2009016579 | | 1/2009 |
| JP | 2009032977 | A | 2/2009 |
| JP | 2009032988 | A | 2/2009 |
| JP | 2009059997 | | 3/2009 |
| JP | 2009076509 | | 4/2009 |
| JP | 2009161524 | A | 7/2009 |
| JP | 2009247171 | | 10/2009 |
| JP | 2009266943 | A | 11/2009 |
| JP | 2009267171 | A | 11/2009 |
| JP | 2009267244 | A | 11/2009 |
| JP | 2009272339 | A | 11/2009 |
| JP | 2009283891 | A | 12/2009 |
| JP | 4460952 | | 5/2010 |
| JP | 2010135689 | A | 6/2010 |
| JP | 2010171205 | A | 8/2010 |
| JP | 2011071452 | A | 4/2011 |
| JP | 2012074444 | A | 4/2012 |
| JP | 2012079895 | A | 4/2012 |
| JP | 2012079898 | A | 4/2012 |
| JP | 5604505 | | 9/2012 |
| JP | 2012522843 | | 9/2012 |
| JP | 2012207231 | A | 10/2012 |
| JP | 2012222255 | A | 11/2012 |
| JP | 2012231135 | A | 11/2012 |
| JP | 2013023500 | A | 2/2013 |
| JP | 2013048256 | A | 3/2013 |
| JP | 2013053149 | A | 3/2013 |
| JP | 2013525436 | | 6/2013 |
| JP | 2014019701 | A | 2/2014 |
| JP | 2014058504 | A | 4/2014 |
| JP | 2014520096 | | 8/2014 |
| JP | 2012709899 | | 11/2014 |
| JP | 2014221807 | A | 11/2014 |
| JP | 2014239225 | A | 12/2014 |
| JP | 2015081257 | A | 4/2015 |
| KR | 20060011537 | | 2/2006 |
| KR | 20060015371 | | 2/2006 |
| KR | 20060115371 | | 11/2006 |
| KR | 20070061830 | | 6/2007 |
| KR | 20070112465 | | 11/2007 |
| KR | 20130043460 | | 4/2013 |
| KR | 101338250 | | 12/2013 |
| KR | 20140052501 | | 5/2014 |
| TW | 200701835 | | 1/2007 |
| TW | 201249851 | | 12/2012 |
| TW | 201307365 | A | 2/2013 |
| TW | 201710277 | | 3/2017 |
| WO | 0070655 | A2 | 11/2000 |
| WO | 2000070655 | | 11/2000 |
| WO | 2004003108 | | 1/2004 |
| WO | 2004070655 | | 8/2004 |
| WO | 2004085450 | | 10/2004 |
| WO | 2004108857 | | 12/2004 |
| WO | 2005042444 | A2 | 5/2005 |
| WO | 2005042550 | A1 | 5/2005 |
| WO | 2005113704 | | 12/2005 |
| WO | 2006033440 | A1 | 3/2006 |
| WO | 2006067074 | | 6/2006 |
| WO | 2006081780 | | 8/2006 |
| WO | 2006098505 | A1 | 9/2006 |
| WO | 2006113106 | | 10/2006 |
| WO | 2006115299 | A1 | 11/2006 |
| WO | 2006115301 | | 11/2006 |
| WO | 2007034985 | A1 | 3/2007 |
| WO | 2007069498 | A1 | 6/2007 |
| WO | 2008054578 | | 5/2008 |
| WO | 2008066192 | A1 | 6/2008 |
| WO | 2008066195 | A1 | 6/2008 |
| WO | 2008066196 | A1 | 6/2008 |

(56) References Cited

FOREIGN PATENT DOCUMENTS

| | | | |
|---|---|---|---|
| WO | 2008101842 A1 | 8/2008 | |
| WO | 2008117889 | 10/2008 | |
| WO | 2008123540 | 10/2008 | |
| WO | 2008131932 A1 | 11/2008 | |
| WO | 2009003455 | 1/2009 | |
| WO | 2009008277 | 1/2009 | |
| WO | 2009011327 | 1/2009 | |
| WO | 2009017211 A1 | 2/2009 | |
| WO | 2009023667 | 2/2009 | |
| WO | 2009086209 | 7/2009 | |
| WO | 2009111299 | 9/2009 | |
| WO | 2010007098 A1 | 1/2010 | |
| WO | 2010056669 | 5/2010 | |
| WO | 2010093176 | 8/2010 | |
| WO | 2010105141 | 9/2010 | |
| WO | 2010118026 A2 | 10/2010 | |
| WO | 2011064335 A1 | 6/2011 | |
| WO | 2011070989 A1 | 6/2011 | |
| WO | 2011089163 | 7/2011 | |
| WO | 2011137429 A2 | 11/2011 | |
| WO | 2011137431 A2 | 11/2011 | |
| WO | 2012074909 | 6/2012 | |
| WO | 2012112853 A1 | 8/2012 | |
| WO | 2012116231 | 8/2012 | |
| WO | 2012142387 | 10/2012 | |
| WO | 2012162488 A1 | 11/2012 | |
| WO | 2012163471 A1 | 12/2012 | |
| WO | 2013130483 A1 | 9/2013 | |
| WO | 2014009310 | 1/2014 | |
| WO | 2014016611 | 1/2014 | |
| WO | 2014031977 | 2/2014 | |
| WO | 2014047616 A1 | 3/2014 | |
| WO | 2014109814 | 7/2014 | |
| WO | 2014208271 | 12/2014 | |
| WO | 2015027060 A1 | 2/2015 | |
| WO | 2015131158 | 9/2015 | |
| WO | 2016025921 | 2/2016 | |
| WO | 2016029137 | 2/2016 | |
| WO | 2016029186 | 2/2016 | |
| WO | WO 2016/088354 A1 * | 9/2016 | ............. C07F 15/00 |
| WO | 2016197019 | 12/2016 | |
| WO | 2017117935 | 7/2017 | |
| WO | 2018071697 | 4/2018 | |
| WO | 2018140765 | 8/2018 | |
| WO | 2019079505 | 4/2019 | |
| WO | 2019079508 | 4/2019 | |
| WO | 2019079509 | 4/2019 | |
| WO | 2019236541 | 12/2019 | |
| WO | 2020018476 | 1/2020 | |

OTHER PUBLICATIONS

Korean Office Action (with English translation) for App. No. KR10-2015-0104260, dated Jan. 12, 2022, 12 pages.

Machine-translated English version of JP 2012/074444 A, Sekine Noboru, Apr. 12, 2012 (Year: 2012) 75 pages.

Tyler Fleetham, "Phosphorescent Pt(II) and Pd(II) Complexes for Efficient, High-Color-Quality, and Stable OLEDs", 52 pages, Material Science and Engineering, Arizona State University (Year: 2016).

Ayan Maity et al., "Room-temperature synthesis of cyclometalated iridium(III) complexes; kinetic isomers and reactive functionalities" Chem. Sci., vol. 4, pp. 1175-1181 (2013).

Baldo et al., "Highly Efficient Phosphorescent Emission from Organic Electroluminescent Devices," Nature, vol. 395, Sep. 10, 1998, pp. 151-154.

Baldo et al., "Very High-Efficiency Green Organic Light-Emitting Devices Based on Electrophosphorescence", Appl Phys Lett, 75(3):4-6 (1999).

Barry O'Brien et al.: White organic light emitting diodes using Pt-based red, green and blue phosphorescent dopants. Proc. SPIE, vol. 8829, pp. 1-6, Aug. 25, 2013.

Barry O'Brien et al., "High efficiency white organic light emitting diodes employing blue and red platinum emitters," Journal of Photonics for Energy, vol. 4, 2014, pp. 043597-1-043597-8.

Berson et al. (2007). "Poly(3-hexylthiophene) fibers for photovoltaic applications," Adv. Funct. Mat., 17, 1377-84.

Bouman et al. (1994). "Chiroptical properties of regioregular chiral polythiophenes," Mol. Cryst. Liq. Cryst., 256, 439-48.

Brian W. D'Andrade et al., "Controlling Exciton Diffusion in Multilayer White Phosphorescent Organic Light Emitting Devices", Adv. Mater., vol. 14, No. 2, Jan. 16, 2002, pp. 147-151.

Campbell et al. (2008). "Low-temperature control of nanoscale morphology for high performance polymer photovoltaics," Nano Lett., 8, 3942-47.

Chi et al.; Transition-metal phosphors with cyclometalating ligands: fundamentals and applications, Chemical Society Reviews, vol. 39, No. 2, Feb. 2010, pp. 638-655.

Chi-Ming Che et al. "Photophysical Properties and OLEO Applications of Phosphorescent Platinum(II) Schiff Base Complexes," Chem. Eur. J., vol. 16, 2010, pp. 233-247.

Christoph Ulbricht et al., "Synthesis and Characterization of Oxetane-Functionalized Phosphorescent Ir(III)-Complexes", Macromol. Chem. Phys. 2009, 210, pp. 531-541.

Coakley et al. (2004). "Conjugated polymer photovoltaic cells," Chem. Mater., 16, 4533-4542.

Dan Wang et al., "Carbazole and arylamine functionalized iridium complexes for efficient electro-phosphorescent light-emitting diodes", Inorganica Chimica Acta 370 (2011) pp. 340-345.

Dileep A. K. Vezzu et al., "Highly Luminescent Tetradentate Bis-Cyclometalated Platinum Complexes: Design, Synthesis, Structure, Photophysics, and Electroluminescence Application," Inorg. Chem., vol. 49, 2010, pp. 5107-5119.

Dorwald; "Side Reactions in Organic Synthesis: A Guide to Successful Synthesis Design," Chapter 1, 2005 Wiley-VCH Verlag GmbH & Co. KGaA, Wienheim, 32 pages.

Eric Turner et al., "Cyclometalated Platinum Complexes with Luminescent Quantum Yields Approaching 100%," Inorg. Chem., 2013, vol. 52, pp. 7344-7351.

Evan L. Williams et al., "Excimer-Based White Phosphorescent Organic Light Emitting Diodes with Nearly 100% Internal Quantum Efficiency," Adv. Mater., vol. 19, 2007, pp. 197-202.

Finikova,M.A et al., New Selective Synthesis of Substituted Tetrabenzoporphyris, Doklady Chemistry, 2003, vol. 391, No. 4-6, pp. 222-224.

Galanin et al. Synthesis and Properties of meso-Phenyl-Substituted Tetrabenzoazaporphines Magnesium Complexes. Russian Journal of Organic Chemistry (Translation of Zhurnal Organicheskoi Khimii) (2002), 38(8), 1200-1203.

Galanin et al., meso-Phenyltetrabenzoazaporphyrins and their zinc complexes. Synthesis and spectral properties, Russian Journal of General Chemistry (2005), 75(4), 651-655.

Glauco Ponterini et al., "Comparison of Radiationless Decay Processes in Osmium and Platinum Porphyrins," J. Am. Chem. Soc., vol. 105, No. 14, 1983, pp. 4639-4645.

Gong et al., Highly Selective Complexation of Metal Ions by the Self-Tuning Tetraazacalixpyridine macrocycles, Tetrahedron, 65(1): 87-92 (2009).

Gottumukkala, V. et al., Synthesis, cellular uptake and animal toxicity of a tetra carboranylphenyl N-tetrabenzoporphyr in, Bioorganic & Medicinal Chemistry, 2006, vol. 14, pp. 1871-1879.

Guijie Li et al., "Efficient and stable red organic light emitting devices from a tetradentate cyclometalated platinum complex," Organic Electronics, 2014, vol. 15 pp. 1862-1867.

Guijie Li et al., "Modifying Emission Spectral Bandwidth of Phosphorescent Platinum(II) Complexes Through Synthetic Control," Inorg. Chem. 2017, 56, 8244-8256.

Guijie Li et al., Efficient and Stable White Organic Light-Emitting Diodes Employing a Single Emitter, Adv. Mater., 2014, vol. 26, pp. 2931-2936.

Hansen (1969). "The universality of the solubility parameter," I & EC Product Research and Development, 8, 2-11.

Hirohiko Fukagawa et al., "Highly Efficient and Stable Red Phosphorescent Organic Light-Emitting Diodes Using Platinum Complexes," Adv. Mater., 2012, vol. 24, pp. 5099-5103.

(56) References Cited

OTHER PUBLICATIONS

Hoe-Joo Seo et al., "Blue phosphorescent iridium(III) complexes containing carbazole-functionalized phenyl pyridine for organic light-emitting diodes: energy transfer from carbazolyl moieties to iridium(III) cores", RSC Advances, 2011, 1, pp. 755-757.
Huaijun Tang et al., "Novel yellow phosphorescent iridium complexes containing a carbazoleeoxadiazole unit used in polymeric light-emitting diodes", Dyes and Pigments 91 (2011) pp. 413-421.
Imre et al.(1996). "Liquid-liquid demixing ffrom solutions of polystyrene. 1. A review. 2. Improved correlation with solvent properties," J. Phys. Chem. Ref. Data, 25, 637-61.
Jack W. Levell et al., "Carbazole/iridium dendrimer side-chain phosphorescent copolymers for efficient light emitting devices", New J. Chem., 2012, vol. 36, pp. 407-413.
Jan Kalinowski et al., "Light-emitting devices based on organometallic platinum complexes as emitters," Coordination Chemistry Reviews, vol. 255, 2011, pp. 2401-2425.
Jeong et al. (2010). "Improved efficiency of bulk heterojunction poly (3-hexylthiophene):[6,6]-phenyl-C61-butyric acid methyl ester photovoltaic devices using discotic liquid crystal additives," Appl. Phys. Lett . . . 96, 183305. (3 pages).
Jeonghun Kwak et al., "Bright and Efficient Full-Color Colloidal Quantum Dot Light-Emitting Diodes Using an Inverted Device Structure," Nano Letters 12, Apr. 2, 2012, pp. 2362-2366.
Ji Hyun Seo et al., "Efficient blue-green organic light-emitting diodes based on heteroleptic tris-cyclometalated iridium (III) complexes". Thin Solid Films, vol. 517, pp. 1807-1810 (2009).
Kai Li et al., "Light-emitting platinum(II) complexes supported by tetradentate dianionic bis(N-heterocyclic carbene) ligands: towards robust blue electrophosphors," Chem. Sci., 2013, vol. 4, pp. 2630-2644.
Ke Feng et al., "Norbornene-Based Copolymers Containing Platinum Complexes and Bis(carbazolyl)benzene Groups in Their Side-Chains," Macromolecules, vol. 42, 2009, pp. 6855-6864.
Kim et al(2009). "Altering the thermodynamics of phase separation in inverted bulk-heterojunction organic solar cells," Adv. Mater., 21, 3110-15.
Kim et al. (2005). "Device annealing effect in organic solar cells with blends of regioregular poly (3-hexylthiophene) and soluble fullerene," Appl. Phys. Lett. 86, 063502. (3 pages).
Kroon et al. (2008). "Small bandgap olymers for organic solar cells," Polymer Reviews, 48, 531-82.
Lee et al. (2008). "Processing additives for inproved efficiency from bulk heterojunction solar cells," J. Am. Chem. Soc, 130, 3619-23.
Li et al. (2005). "Investigation of annealing effects and film thickness dependence of polymer solar cells based on poly (3-hexylthiophene)," J. Appl. Phys., 98, 043704. (5 pages).
Li et al. (2007). "Solvent annealing effect in polymer solar cells based on poly(3-hexylthiophene) and methanofullerenes," Adv. Funct. Mater, 17, 1636-44.
Liang, et al. (2010). "For the bright future-bulk heterojunction polymer solar cells with power conversion efficiency of 7.4%," Adv. Mater. 22, E135-38.
Maestri et al., "Absorption Spectra and Luminescence Properties of Isomeric Platinum (II) and Palladium (II) Complexes Containing 1,1'-Biphenyldiyl, 2-Phenylpyridine, and 2,2'-Bipyridine as Ligands," Helvetica Chimica Acta, vol. 71, Issue 5, Aug. 10, 1988, pp. 1053-1059.
Marc Lepeltier et al., "Efficient blue green organic light-emitting devices based on a monofluorinated heteroleptic iridium(III) complex," Synthetic Metals, vol. 199, 2015, pp. 139-146.
Morana et al. (2007). "Organic field-effect devices as tool to characterize the bipolar transport in polymer-fullerene blends: the case of P3HT-PCBM," Adv. Funct. Mat., 17, 3274-83.
Moule et al. (2008). "Controlling morphology in Polymer-Fullerene mixtures," Adv. Mater., 20, 240-45.
Murakami; JP 2007324309, English machine translation from EPO, dated Dec. 13, 2007, 89 pages.
Nicholas R. Evans et al., "Triplet Energy Back Transfer in Conjugated Polymers with Pendant Phosphorescent Iridium Complexes," J. Am. Chem. Soc., vol. 128, 2006, pp. 6647-6656.
Nillson et al. (2007). "Morphology and phase segregation of spincasted films of polyfluorene/PCBM Blends," Macromolecules, 40, 8291-8301.
Olynick et al. (2009). "The link between nanoscale feature development in a negative resist and the Hansen solubility sphere," Journal of Polymer Science: Part B: Polymer Physics, 47, 2091-2105.
Peet et al. (2007). "Efficiency enhancement in low-bandgap polymer solar cells by processing with alkane dithiols," Nature Materials, 6, 497-500.
Pivrikas et al. (2008). "Substituting the postproduction treatment for bulk-heterojunction solar cells using chemical additives," Organic Electronics, 9, 775-82.
Pui Keong Chow et al., "Strongly Phosphorescent Palladium(II) Complexes of Tetradentate Ligands with Mixed Oxygen, Carbon, and Nitrogen Donor Atoms: Photophysics, Photochemistry, and Applications," Angew. Chem. Int. Ed. 2013, 52, 11775-11779.
Pui-Keong Chow et al., "Highly luminescent palladium(II) complexes with sub-millisecond blue to green phosphorescent excited states. Photocatalysis and highly efficient PSF-OLEDs," Chem. Sci., 2016, 7, 6083-6098.
Rui Zhu et al., "Color tuning based on a six-membered chelated iridium (III) complex with aza-aromatic ligand," Chemistry Letters, vol. 34, No. 12, 2005, pp. 1668-1669.
Russell J. Holmes et al., "Blue and Near-UV Phosphorescence from Iridium Complexes with Cyclometalated Pyrazolyl or N-Heterocyclic Carbene Ligands," Inorganic Chemistry, 2005, vol. 44, No. 22, pp. 7995-8003.
Saricifci et al. (1993). "Semiconducting polymerbuckminsterfullerene heterojunctions: diodes photodiodes, and photovoltaic cells," Appl. Phys. Lett., 62, 585-87.
Satake et al., "Interconvertible Cationic and Neutral Pyridinylimidazole η3-Allylpalladium Complexes. Structural Assignment by 1H, 13C, and 15N Nmr and X-ray Diffraction", Organometallics, vol. 18, No. 24, 1999, pp. 5108-5111.
Saunders et al. (2008). "Nanoparticle-polymer photovoltaic cells," Advances in Colloid and Interface Science, 138, 1-23.
Shih-Chun Lo et al. "High-Triplet-Energy Dendrons: Enhancing the Luminescence of Deep Blue Phosphorescent Indium(III) Complexes" J. Am. Chem. Soc., vol. 131, 2009, p. 16681-16688.
Shin et al. (2010). "Abrupt morphology change upon thermal annealing in Poly(3-hexathiophene)/ soluble fullerene blend films for polymer solar cells," Adv. Funct. Mater., 20, 748-54.
Shiro Koseki et al., "Spin-orbit coupling analyses of the geometrical effects on phosphorescence in Ir(ppy)3 and its derivatives", J. Phys. Chem. C, vol. 117, pp. 5314-5327 (2013).
Shizuo Tokito et al. "Confinement of triplet energy on phosphorescent molecules for highly-efficient organic blue-light-emitting devices" Applied Physics Letters, vol. 83, No. 3, Jul. 21, 2003, pp. 569-571.
Stefan Bernhard, "The First Six Years: A Report," Department of Chemistry, Princeton University, May 2008, 11 pages.
Stephen R. Forrest, "The path to ubiquitous and low-cost organic electronic appliances on plastic," Nature, vol. 428, Apr. 29, 2004, pp. 911-918.
Steven C. F. Kui et al., "Robust phosphorescent platinum(II) complexes with tetradentate ONCN ligands: high efficiency OLEDs with excellent efficiency stability," Chem. Commun., 2013, vol. 49, pp. 1497-1499.
Steven C. F. Kui et al., "Robust Phosphorescent Platinum(II) Complexes Containing Tetradentate ONCN Ligands: Excimeric Excited State and Application in Organic White-Light-Emitting Diodes," Chem. Eur. J., 2013, vol. 19, pp. 69-73.
Supporting Information: Xiao-Chun Hang et al., "Highly Efficient Blue-Emitting Cyclometalated Platinum(II) Complexes by Judicious Molecular Design," Wiley-VCH 2013, 7 pages.
Sylvia Bettington et al. "Tris-Cyclometalated Iridium(III) Complexes of Carbazole(fluorenyl)pyridine Ligands: Synthesis, Redox and Photophysical Properties, and Electrophosphorescent Light-Emitting Diodes" Chemistry: A European Journal, 2007, vol. 13, pp. 1423-1431.

(56) References Cited

OTHER PUBLICATIONS

Tyler Fleetham et al., "Efficient "pure" blue OLEDs employing tetradentate Pt complexes with a narrow spectral bandwidth," Advanced Materials (Weinheim, Germany), Vo. 26, No. 41, 2014, pp. 7116-7121.
Tyler Fleetham et al., "Efficient Red-Emitting Platinum Complex with Long Operational Stability," ACS Appl. Mater. Interfaces 2015, 7, 16240-16246.
V. Thamilarasan et al., "Green-emitting phosphorescent iridium(III) complex: Structural, photophysical and electrochemical properties," Inorganica Chimica Acta, vol. 408, 2013, pp. 240-245.
Vanessa Wood et al., "Colloidal quantum dot light-emitting devices," Nano Reviews 1, Jul. 2010, pp. 5202. (7 pages).
Wang et al. (2010). "The development of nanoscale morphology in polymer: fullerene photovoltaic blends during solvent casting," Soft Matter, 6, 4128-4134.
Wang et al., C(aryl)-C(alkyl) bond formation from Cu(Cl04)2-mediated oxidative cross coupling reaction between arenes and alkyllithium reagents through structurally well-defined Ar—Cu(III) intermediates, Chem Commun, 48: 9418-9420 (2012).
Wong. Challenges in organometallic research—Great opportunity for solar cells and OLEDs. Journal of Organometallic Chemistry 2009, vol. 694, pp. 2644-2647.
Xiao-Chu Hang et al., "Highly Efficient Blue-Emitting Cyclometalated Platinum(II) Complexes by Judicious Molecular Design," Angewandte Chemie, International Edition, vol. 52, Issue 26, Jun. 24, 2013, pp. 6753-6756.
Xiaofan Ren et al., "Ultrahigh Energy Gap Hosts in Deep Blue Organic Electrophosphorescent Devices," Chem. Mater., vol. 16, 2004, pp. 4743-4747.
Xin Li et al., "Density functional theory study of photophysical properties of iridium (III) complexes with phenylisoquinoline and phenylpyridine ligands", The Journal of Physical Chemistry C, 2011, vol. 115, No. 42, pp. 20722-20731.
Yakubov, L.A. et al., Synthesis and Properties of Zinc Complexes of mesoHexadecyloxy-Substituted Tetrabenzoporphyrin and Tetrabenzoazaporphyrins, Russian Journal of Organic Chemistry, 2008, vol. 44, No. 5, pp. 755-760.
Yang et al. (2005). "Nanoscale morphology of high-performance polymer solar cells," Nano Lett., 5, 579-83.
Yao et al. (2008). "Effect of solvent mixture on nanoscale phase separation in polymer solar cells," Adv. Funct. Mater., 18, 1783-89.
Yao et al., Cu(Cl04)2-Mediated Arene C—H Bond Halogenations of Azacalixaromatics Using Alkali Metal Halides as Halogen Sources, The Journal of Organic Chemistry, 77(7): 3336-3340 (2012).
Ying Yang et al., "Induction of Circularly Polarized Electroluminescence from an Achiral Light-Emitting Polymer via a Chiral Small-Molecule Dopant," Advanced Materials, vol. 25, Issue 18, May 14, 2013, pp. 2624-2628.
Yu et al. (1995). "Polymer Photovoltaic Cells: Enhanced efficiencies via a network of internal donor-acceptor heterojunctions," Science, 270, 1789-91.
Z Liu et al., "Green and blue-green phosphorescent heteroleptic iridium complexes containing carbazole-functionalized beta-diketonate for non-doped organic light-emitting diodes", Organic Electronics 9 (2008) pp. 171-182.
Z Xu et al., "Synthesis and properties of iridium complexes based 1,3,4-oxadiazoles derivatives", Tetrahedron 64 (2008) pp. 1860-1867.
Zhi-Qiang Zhu et al., "Efficient Cyclometalated Platinum(II) Complex with Superior Operational Stability," Adv. Mater. 29 (2017) 1605002, pp. 1-5.
Zhi-Qiang Zhu et.al., "Harvesting All Electrogenerated Excitons through Metal Assisted Delayed Fluorescent Materials," Adv. Mater. 27 (2015) 2533-2537.
Adachi, C. et al., "High-efficiency organic electrophosphorescent devices with tris(2-phenylpyridine)iridium doped into electron-transporting materials", Applied Physics Letters, Aug. 2000, vol. 77, No. 6, pp. 904-906 <DOI:10.1063/1.1306639>.
Baldo et al., "Very high-efficiency green organic light-emitting devices based on electrophosphorescence," Applied Physics Letters, vol. 75, No. 1, Jul. 5, 1999, pp. 4-6.
Baldo, M. et al., "Excitonic singlet-triplet ratio in a semiconducting organic thin film", Physical Review B, Nov. 1999, vol. 60, No. 20, pp. 14422-14428 <DOI:10.1103/PhysRevB.60.14422>.
Baldo, M. et al., "High-efficiency fluorescent organic light-emitting devices using a phosphorescent sensitizer", Nature, Feb. 2000, vol. 403, pp. 750-753.
Bronner; "Dipyrrin based luminescent cyclometallated palladium and platinum complexes", Dalton Trans., 2010, 39, 180-184. DOI: 10.1039/b908424j (Year: 2010) (5 pages).
Brooks, J. et al., "Synthesis and Characterization of Phosphorescent Cyclometalated Platinum Complexes", Inorganic Chemistry, May 2002, vol. 41, No. 12, pp. 3055-3066 <DOI:10.1021/ic0255508>.
Brown, A. et al., "Optical spectroscopy of triplet excitons and charged excitations in poly(p-phenylenevinylene) light-emitting diodes", Chemical Physics Letters, Jul. 1993, vol. 210, No. 1-3, pp. 61-66 <DOI:10.1016/0009-2614(93)89100-V>.
Burroughes, J. et al., "Light-emitting diodes based on conjugated polymers", Nature, Oct. 1990, vol. 347, pp. 539-541.
Chen, F. et al., "High-performance polymer light-emitting diodes doped with a red phosphorescent iridium complex", Applied Physics Letters, Apr. 2002 [available online Mar. 2002], vol. 80, No. 13, pp. 2308-2310 <10.1063/1.1462862>.
Chen, X., et al., "Fluorescent Chemosensors Based on Spiroring-Opening of Xanthenes and Related Derivatives", Chemical Reviews, 2012 [available online Oct. 2011], vol. 112, No. 3, pp. 1910-1956 <DOI:10.1021/cr200201z>.
Chew, S. et al: Photoluminescence and electroluminescence of a new blue-emitting homoleptic iridium complex. Applied Phys. Letters; vol. 88, pp. 093510-1-093510-3, 2006.
Chow; "Strongly Phosphorescent Palladium (II) Complexes of Tetradentate Ligands with Mixed Oxygen, Carbon, and Nitrogen Donor Atoms: Photophysics, Photochemistry, and Applications", Angew. Chem. Int. Ed. 2013, 52, 11775-11779. DOI: 10.1002/anie.201305590 (Year: 2013) (5 pages).
Colombo, M. et al., "Synthesis and high-resolution optical spectroscopy of bis[2-(2-thienyl)pyridinato-C3, N'](2,2'-bipyridine)iridium(III)", Inorganic Chemistry, Jul. 1993, vol. 32, No. 14, pp. 3081-3087 <DOI:10.1021/ic00066a019>.
D.F. O'Brien et al., "Improved energy transfer in electrophosphorescent devices," Appl. Phys. Lett., vol. 74, No. 3, Jan. 18, 1999, pp. 442-444.
D'Andrade, B et al., "Operational stability of electrophosphorescent devices containing p and n doped transport layers ", Applied Physics Letters, Nov. 2003, vol. 83, No. 19, pp. 3858-3860 <DOI:10.1063/1.1624473>.
Dorwald, Side Reactions in Organic Synthesis 2005, Wiley:VCH Weinheim Preface, pp. 1-15 & Chapter 1, pp. 279-308.
Dsouza, R., et al., "Fluorescent Dyes and Their Supramolecular Host/Guest Complexes with Macrocycles in Aqueous Solution", Oct. 2011, vol. 111, No. 12, pp. 7941-7980 <DOI:10.1021/cr200213s>.
Fuchs, C. et al., "Enhanced light emission from top-emitting organic light-emitting diodes by optimizing surface plasmon polariton losses", arXiv, submitted Mar. 2015, 11 pages, arXiv:1503.01309.
Fuchs, C. et al., "Enhanced light emission from top-emitting organic light-emitting diodes by optimizing surface plasmon polariton losses", Physical Review B, Dec. 2015, vol. 92, No. 24, pp. 245306-1-245306-10 <DOI:10.1103/PhysRevB.92.245306>.
Gather, M. et al., "Recent advances in light outcoupling from white organic light-emitting diodes," Journal of Photonics for Energy, May 2015, vol. 5, No. 1, 057607-1-057607-20 <DOI:10.1117/1.JPE.5.057607>.
Graf, A. et al., "Correlating the transition dipole moment orientation of phosphorescent emitter molecules in OLEDs with basic material properties", Journal of Materials Chemistry C, Oct. 2014, vol. 2, No. 48, p. 10298-10304 <DOI: 10.1039/c4tc00997e>.
Hatakeyama, T. et al., "Ultrapure Blue Thermally Activated Delayed Fluorescence Molecules: Efficient HOMO-LUMO Separation by the Multiple Resonance Effect", Advanced Materials, Apr. 2016, vol. 28, No. 14, pp. 2777-2781, <DOI:10.1002/adma.201505491>.

(56) References Cited

OTHER PUBLICATIONS

Holmes, R. et al., "Efficient, deep-blue organic electrophosphorescence by guest charge trapping", Applied Physics Letters, Nov. 2003 [available online Oct. 2003], vol. 83, No. 18, pp. 3818-3820 <DOI:10.1063/1.1624639>.

Ivaylo Ivanov et al., "Comparison of the INDO band structures of polyacetylene, polythiophene, polyfuran, and polypyrrole," Synthetic Metals, vol. 116, Issues 1-3, Jan. 1, 2001, pp. 111-114.

Kim, HY. et al., "Crystal Organic Light-Emitting Diodes with Perfectly Oriented Non-Doped Pt-Based Emitting Layer", Advanced Functional Materials, Feb. 2016, vol. 28, No. 13, pp. 2526-2532 <DOI:10.1002/adma.201504451>.

Kim, JJ., "Setting up the new efficiency limit of OLEDs; Abstract" [online], Electrical Engineering-Princeton University, Aug. 2014 [retrieved on Aug. 24, 2016], retrieved from the internet: <URL:http://ee.princeton.edu/events/setting-new-efficiency-limit-oled> 2 pages.

Kim, SY. et al., "Organic Light-Emitting Diodes with 30% External Quantum Efficiency Based on a Horizontally Oriented Emitter", Advanced Functional Materials, Mar. 2013, vol. 23, No. 31, pp. 3896-3900 <DOI:10.1002/adfm.201300104>.

Kwon-Hyeon Kim et al., "Controlling Emitting Dipole Orientation with Methyl Substituents on Main Ligand of Iridium Complexes for Highly Efficient Phosphorescent Organic Light-Emitting Diodes", Adv. Optical Mater. 2015, 3, pp. 1191-1196.

Kwon-Hyeon Kim et al., "Crystal Organic Light-Emitting Diodes with Perfectly Oriented Non-Doped Pt-Based Emitting Layer", Adv. Mater. 2016, 28, pp. 2526-2532.

Kwong, R. et al., "High operational stability of electrophosphorescent devices", Applied Physics Letters, Jul. 2002 [available online Jun. 2002], vol. 81, No. 1, pp. 162-164 <DOI:10.1063/1.1489503>.

Lamansky, S. et al., "Cyclometalated Ir complexes in polymer organic light-emitting devices", Journal of Applied Physics, Aug. 2002 [available online Jul. 2002], vol. 92, No. 3, pp. 1570-1575 <10.1063/1.1491587>.

Lamansky, S. et al., "Synthesis and Characterization of Phosphorescent Cyclometalated Iridium Complexes", Inorganic Chemistry, Mar. 2001, vol. 40, No. 7, pp. 1704-1711 <DOI:10.1021/ic0008969>.

Lampe, T. et al., "Dependence of Phosphorescent Emitter Orientation on Deposition Technique in Doped Organic Films", Chemistry of Materials, Jan. 2016, vol. 28, pp. 712-715 <DOI:10.1021/acs.chemmater.5b04607>.

Li, J et al., "Synthesis and characterization of cyclometalated Ir(III) complexes with pyrazolyl ancillary ligands", Polyhedron, Jan. 2004, vol. 23, No. 2-3, pp. 419-428 <DOI:10.1016/j.poly.2003.11.028>.

Li, J., "Efficient and Stable OLEDs Employing Square Planar Metal Complexes and Inorganic Nanoparticles", in DOE SSL R&D Workshop (Raleigh, North Carolina, 2016), Feb. 2016, 15 pages.

Li, J., et al., "Synthetic Control of Excited-State Properties in Cyclometalated Ir(III) Complexes Using Ancillary Ligands", Inorganic Chemistry, Feb. 2005, vol. 44, No. 6, pp. 1713-1727 <DOI:10.1021/ic048599h>.

Lin, TA et al., "Sky-Blue Organic Light Emitting Diode with 37% External Quantum Efficiency Using Thermally Activated Delayed Fluorescence from Spiroacridine-Triazine Hybrid", Advanced Materials, Aug. 2016, vol. 28, No. 32, pp. 6876-6983 <DOI:10.1002/adma.201601675>.

Markham, J. et al., "High-efficiency green phosphorescence from spin-coated single-layer dendrimer light-emitting diodes ", Applied Physics Lettersm Apr. 2002, vol. 80, vol. 15, pp. 2645-2647 <DOI:10.1063/1.1469218>.

Matthew J. Jurow et al., "Understanding and predicting the orientation of heteroleptic phosphors in organic light-emitting materials", Nature Materials, vol. 15, Jan. 2016, pp. 85-93.

Michl, J., "Relationship of bonding to electronic spectra", Accounts of Chemical Research, May 1990, vol. 23, No. 5, pp. 127-128 <DOI:10.1021/ar00173a001>.

Miller, R. et al., "Polysilane high polymers", Chemical Reviews, Sep. 1989, vol. 89, No. 6, pp. 1359-1410 <DOI:10.1021/cr00096a006>.

Nazeeruddin, M. et al., "Highly Phosphorescence Iridium Complexes and Their Application in Organic Light-Emitting Devices", Journal of the American Chemical Society, Jun. 2003, vol. 125, No. 29, pp. 8790-8797 <DOI:10.1021/ja021413y>.

Results from SciFinder Compound Search on Dec. 8, 2016. (17 pages).

Sajoto, T. et al., "Temperature Dependence of Blue Phosphorescent Cyclometalated Ir(III) Complexes", Journal of the American Chemical Society, Jun. 2009, vol. 131, No. 28, pp. 9813-9822 <DOI:10.1021/ja903317w>.

Sakai, Y. et al., "Simple model-free estimation of orientation order parameters of vacuum-deposited and spin-coated amorphous films used in organic light-emitting diodes", Applied Physics Express, Aug. 2015, vol. 8, No. 9, pp. 096601-1-096601-4 <DOI:10.7567/APEX.8.096601>.

Senes, A. et al., "Transition dipole moment orientation in films of solution processed fluorescent oligomers: investigating the influence of molecular anisotropy", Journal of Materials Chemistry C, Jun. 2016, vol. 4, No. 26, pp. 6302-6308 <DOI: 10.1039/c5tc03481g>.

Strouse, G. et al., "Optical Spectroscopy of Single Crystal [Re(bpy)(CO)4](PF6): Mixing between Charge Transfer and Ligand Centered Excited States", Inorganic Chemistry, Oct. 1995, vol. 34, No. 22, pp. 5578-5587 <DOI:10.1021/ic00126a031>.

Tang, C. et al., "Organic electroluminescent diodes", Applied Physics Letters, Jul. 1987, vol. 51, No. 12, pp. 913-915 <DOI:10.1063/1.98799>.

Tsuoboyama, A. et al., "Homoleptic Cyclometalated Iridium Complexes with Highly Efficient Red Phosphorescence and Application to Organic Light-Emitting Diode", Journal of the American Chemical Society, Sep. 2003, vol. 125, No. 42, pp. 12971-12979 <DOI:10.1021/ja034732d>.

Turro, N., "Modern Molecular Photochemistry" (Sausalito, California, University Science Books, 1991), p. 48. (3 pages).

V. Adamovich et al., "High efficiency single dopant white electrophosphorescent light emitting diodes", New J. Chem, vol. 26, pp. 1171-1178. 2002.

Williams, E. et al., "Excimer□ Based White Phosphorescent Organic Light Emitting Diodes with Nearly 100 % Internal Quantum Efficiency", Advanced Materials, Jan. 2007, vol. 19, No. 2, pp. 197-202 <DOI:10.1002/adma.200602174>.

Williams, E. et al., "Organic light-emitting diodes having exclusive near-infrared electrophosphorescence", Applied Physics Letters, Aug. 2006, vol. 89, No. 8, pp. 083506-1-083506-3 <DOI:10.1063/1.2335275>.

Yang, X. et al., "Efficient Blue□ and White Emitting Electrophosphorescent Devices Based on Platinum(II) [1,3□Difluoro□4,6□di(2□pyridinyl)benzene] Chloride", Advanced Materials, Jun. 2008, vol. 20, No. 12, pp. 2405-2409 <DOI:10.1002/adma.200702940>.

Zhu, W. et al., "Highly efficient electrophosphorescent devices based on conjugated polymers doped with iridium complexes", Applied Physics Letters, Mar. 2002, vol. 80, No. 12, pp. 2045-2047 <DOI:10.1063/1.1461418>.

Vezzu, D. et al.: Highly luminescent tridentate platinum complexes featured in fused five-six-membered metallocycle and diminishing quenching. Inorganic Chem., vol. 50 (17), pp. 8261-8273, 2011.

JP4460952 machine translation downloaded from Google patents Dec. 30, 2022, 21 pages.

J. Park et al., 26 Semicond. Sci. Technol., 1-9 (2011) (Year: 2011).

S. Kunic et al., 54th International Symposium ELMAR-2012, 31-35 (2012) (Year: 2012).

T. Fleetham et al., 25 Advanced Materials, 2573-2576 (2013) (Year: 2013).

Y. Karzazi, 5 J. Mater. Environ. Sci., 1-12 (2014) (Year: 2014).

* cited by examiner (a)

(b)

METAL COMPLEXES, METHODS, AND USES THEREOF

CROSS-REFERENCE TO RELATED APPLICATIONS

The present application is a continuation of U.S. application Ser. No. 15/905,385, filed Feb. 26, 2018, now allowed, which is a continuation of U.S. application Ser. No. 14/437,963, filed Apr. 23, 2015, which is a U.S. National Phase Application of International Application No. PCT/US2013/066793, filed Oct. 25, 2013, which claims priority to U.S. Application No. 61/719,077, filed Oct. 26, 2012, all of which applications are incorporated herein by reference in their entirety.

STATEMENT OF GOVERNMENT SUPPORT

This invention was made with government support under grant number 0748867, awarded by the National Science Foundation. The government has certain rights in the invention.

BACKGROUND

Technical Field

The present disclosure relates to metal complexes or compounds having multiple radiative decay mechanisms, together with methods for the preparation and use thereof.

Technical Background

Compounds capable of absorbing and/or emitting light can be ideally suited for use in a wide variety of optical and electro-optical devices, including, for example, photo-absorbing devices such as solar- and photo-sensitive devices, photo-emitting devices, organic light emitting diodes (OLEDs), or devices capable of both photo-absorption and emission. Much research has been devoted to the discovery and optimization of organic and organometallic materials for using in optical and electro-optical devices. Metal complexes can be used for many applications, including as emitters use in for OLEDs.

Despite advances in research devoted to optical and electro-optical materials, many currently available materials exhibit a number of disadvantages, including poor processing ability, inefficient mission or absorption, and less than ideal stability, among others. Thus, a need exists for new materials which exhibit improved performance in optical and electro-optical devices. This need and other needs are satisfied by the present invention.

SUMMARY

The present invention relates to metal complexes having multiple radiative decay mechanisms, together with methods for the preparation and use thereof.

In one aspect, Disclosed herein is a metal-assisted delayed fluorescent emitter represented by one or more of the formulas (a)

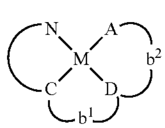

and/or

-continued (b)

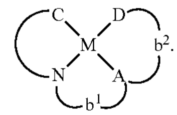

wherein A is an accepting group comprising one or more of the following structures, which can optionally be substituted

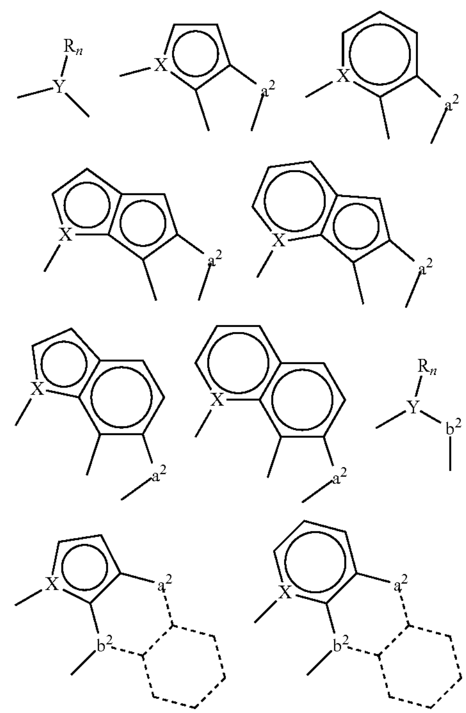

wherein D is a donor group comprising of one or more of the following structures, which can optionally be substituted,

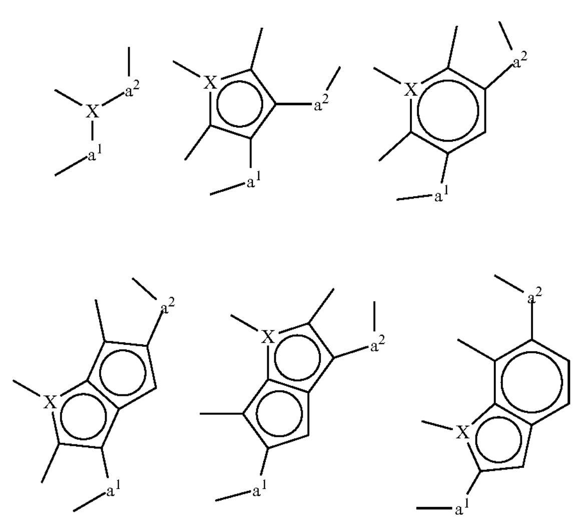

-continued
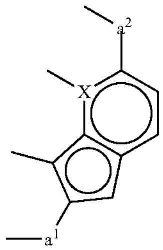
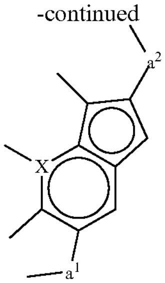
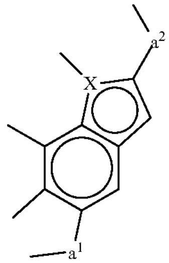
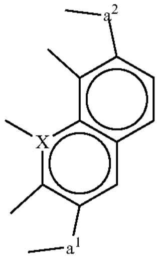
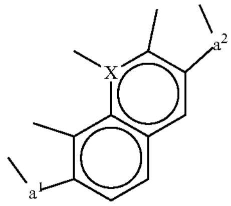
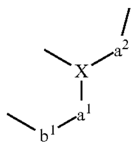
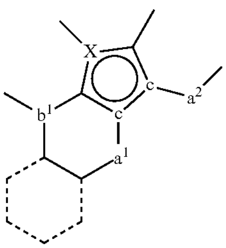
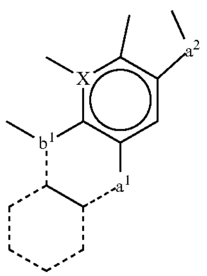
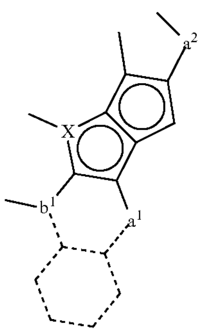
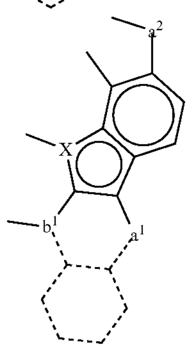
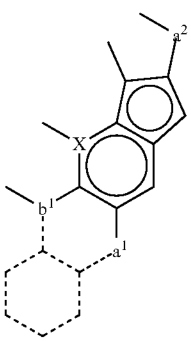
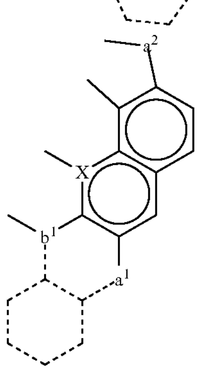
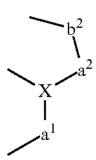
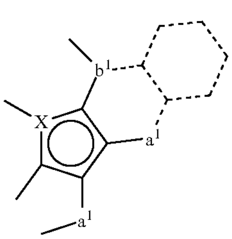
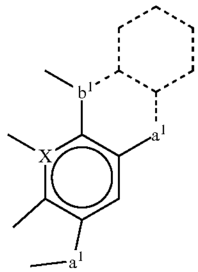
-continued
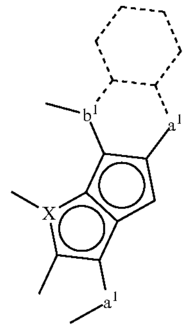
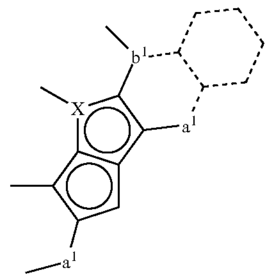
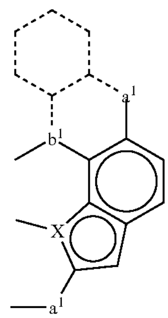
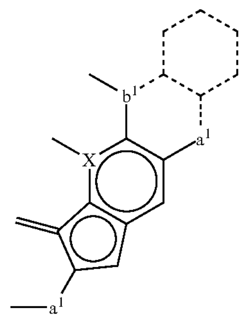
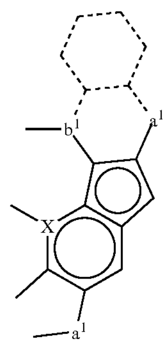
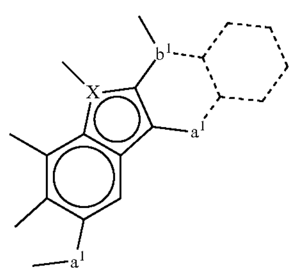
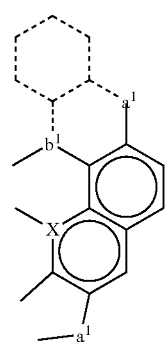
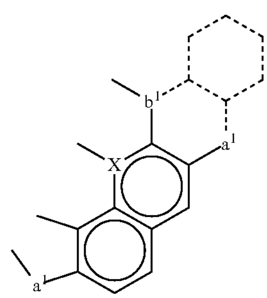
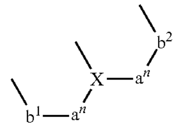
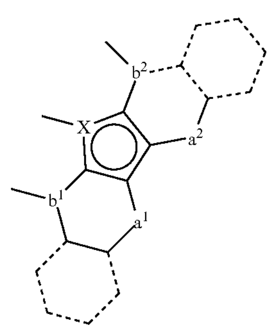

-continued
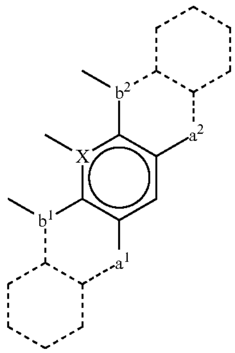
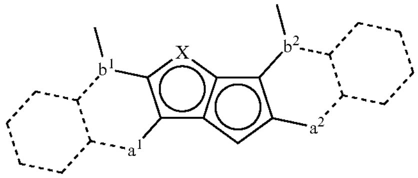
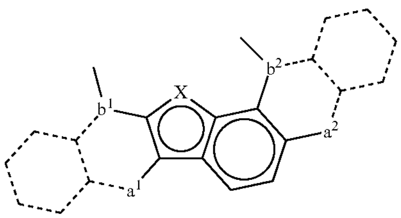
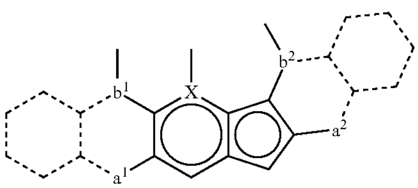
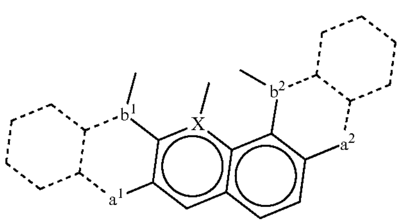
wherein C in structure (a) or (b) comprises one or more of the following structures, which can optionally be substituted
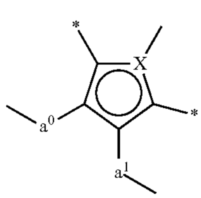
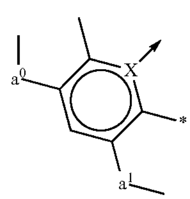
-continued
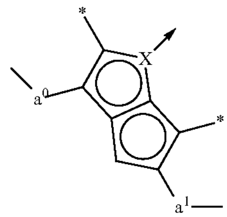
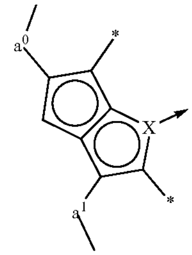
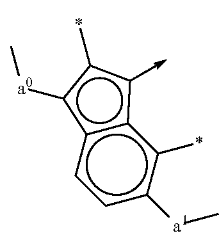
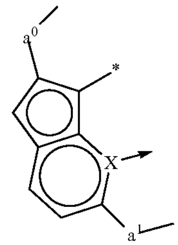
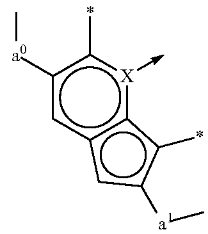
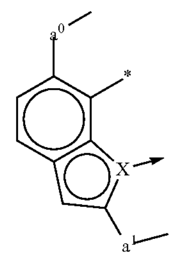
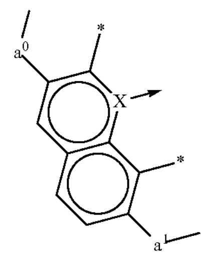
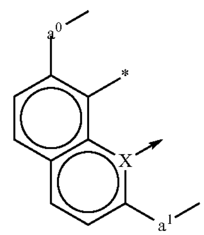
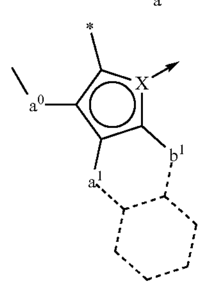
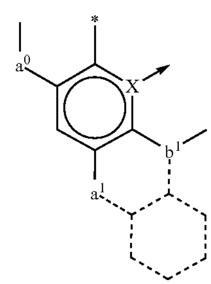
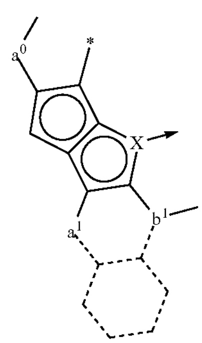
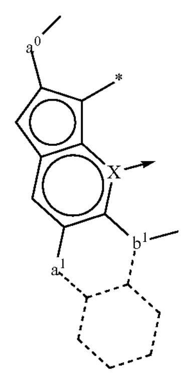

-continued

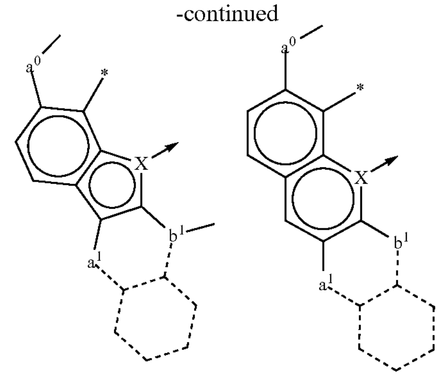

wherein N in structure (a) or (b) comprises one or more of the following structures, which can optionally be substituted

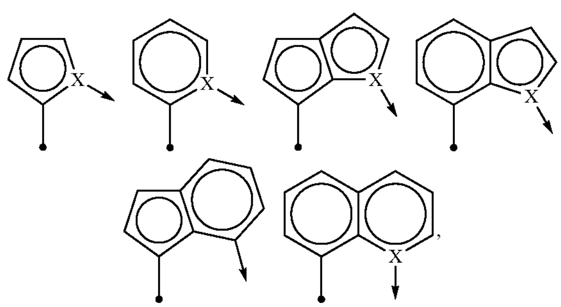

wherein each of $a^0$, $a^1$, and $a^2$ in dependently is present or absent, and if present,

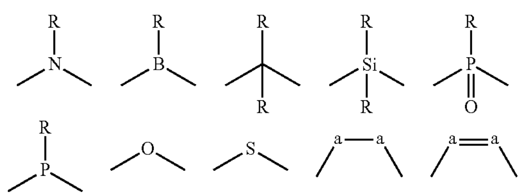

comprises a direct bond and/or linking group comprising one or more of the following, wherein $b^1$ and $b^2$ independently is present or absent, and if present, comprises a linking group comprising one or more of the following

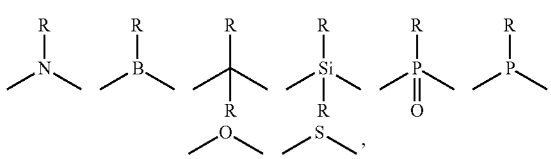

wherein X is B, C, N, O, Si, P, S, Ge, As, Se, Sn, Sb, or Te, wherein Y is O, S, S═O, $SO_2$, Se, N, $NR^3$, $PR^3$, RP═O, $CR^1R^2$, C═O, $SiR^1R^2$, $GeR^1R^2$, BH, P(O)H, PH, NH, $CR^1H$, $CH_2$, $SiH_2$, $SiHR^1$, BH, or $BR^3$, wherein each of R, $R^1$, $R^2$, and $R^3$ independently is hydrogen, aryl, cycloalkyl, cycloalkenyl, heterocyclyl, heteroaryl, alkyl, alkenyl, alkynyl, deuterium, halogen, hydroxyl, thiol, nitro, cyano, amino, a mono- or di-alkylamino, a mono- or diaryl amino, alkoxy, aryloxy, haloalkyl, aralkyl, ester, nitrile, isonitrile, alkoxycarbonyl, acylamino, alkoxycarbonylamino, aryloxycarbonylamino, sulfonylamino, sulfamoyl, carbamoyl, alkylthio, sulfinyl, ureido, phosphoramide, amercapto, sulfo, carboxyl, hydrazino, substituted silyl, or polymerizable, or any conjugate or combination thereof, wherein n is a number that satisfies the valency of Y, wherein M is platinum (II), palladium (II), nickel (II), manganese (II), zinc (II), gold (III), silver (III), copper (III), iridium (I), rhodium (I), or cobalt (I).

Also disclosed are devices comprising one or more of the disclosed complexes or compounds.

BRIEF DESCRIPTION OF THE FIGURES

The accompanying figures, which are incorporated in and constitute a part of this specification, illustrate several aspects and together with the description serve to explain the principles of the invention.

DESCRIPTION

Figure 1:
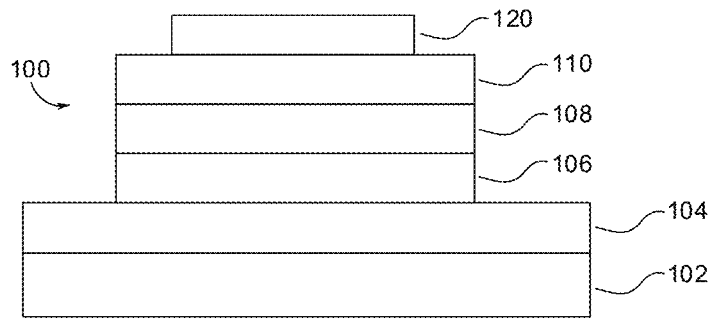
FIG. 1 is a drawing of a cross-section of an exemplary organic light-emitting diode (OLED).

The present invention can be understood more readily by reference to the following detailed description of the invention and the Examples included therein.

Before the present compounds, devices, and/or methods are disclosed and described, it is to be understood that they are not limited to specific synthetic methods unless otherwise specified, or to particular reagents unless otherwise specified, as such can, of course, vary. It is also to be understood that the terminology used herein is for the purpose of describing particular aspects only and is not intended to be limiting. Although any methods and materials similar or equivalent to those described herein can be used in the practice or testing of the present invention, example methods and materials are now described.

As used in the specification and the appended claims, the singular forms "a," "an," and "the" include plural referents unless the context clearly dictates otherwise. Thus, for example, reference to "a component" includes mixtures of two or more components.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. It is also understood that each unit between two particular units are also disclosed. For example, if 10 and 15 are disclosed, then 11, 12, 13, and 14 are also disclosed.

As used herein, the terms "optional" or "optionally" means that the subsequently described event or circumstance can or cannot occur, and that the description includes instances where said event or circumstance occurs and instances where it does not.

Disclosed are the components to be used to prepare the compositions of the invention as well as the compositions themselves to be used within the methods disclosed herein. These and other materials are disclosed herein, and it is understood that when combinations, subsets, interactions, groups, etc. of these materials are disclosed that while specific reference of each various individual and collective combinations and permutation of these compounds cannot be explicitly disclosed, each is specifically contemplated and described herein. For example, if a particular compound is disclosed and discussed and a number of modifications that can be made to a number of molecules including the compounds are discussed, specifically contemplated is each and every combination and permutation of the compound and the modifications that are possible unless specifically indicated to the contrary. Thus, if a class of molecules A, B, and C are disclosed as well as a class of molecules D, E, and F and an example of a combination molecule, A-D is disclosed, then even if each is not individually recited each is individually and collectively contemplated meaning combinations, A-E, A-F, B-D, B-E, B-F, C-D, C-E, and C-F are considered disclosed. Likewise, any subset or combination of these is also disclosed. Thus, for example, the sub-group of A-E, B-F, and C-E would be considered disclosed. This concept applies to all aspects of this application including, but not limited to, steps in methods of making and using the compositions of the invention. Thus, if there are a variety of additional steps that can be performed it is understood that each of these additional steps can be performed with any specific embodiment or combination of embodiments of the methods of the invention.

The term "alkyl" as used herein is a branched or unbranched saturated hydrocarbon group of 1 to 24 carbon atoms, such as methyl, ethyl, n-propyl, isopropyl, n-butyl, isobutyl, s-butyl, t-butyl, n-pentyl, isopentyl, s-pentyl, neopentyl, hexyl, heptyl, octyl, nonyl, decyl, dodecyl, tetradecyl, hexadecyl, eicosyl, tetracosyl, and the like. The alkyl group can be cyclic or acyclic. The alkyl group can be branched or unbranched. The alkyl group can also be substituted or unsubstituted. For example, the alkyl group can be substituted with one or more groups including, but not limited to, optionally substituted alkyl, cycloalkyl, alkoxy, amino, ether, halide, hydroxy, nitro, silyl, sulfo-oxo, or thiol, as described herein. A "lower alkyl" group is an alkyl group containing from one to six (e.g., from one to four) carbon atoms.

The terms "amine" or "amino" as used herein are represented by the formula $NA^1A^2A^3$, where $A^1$, $A^2$, and $A^3$ can be, independently, hydrogen or optionally substituted alkyl, cycloalkyl, alkenyl, cycloalkenyl, alkynyl, cycloalkynyl, aryl, or heteroaryl group as described herein.

The term "halide" as used herein refers to the halogens fluorine, chlorine, bromine, and iodine.

The term "hydroxyl" as used herein is represented by the formula —OH.

The term "nitro" as used herein is represented by the formula $—NO_2$.

The term "nitrile" as used herein is represented by the formula —CN.

The term "thiol" as used herein is represented by the formula —SH.

The term "heterocyclyl" or the like terms refer to cyclic structures including a heteroatom. Thus, "heterocyclyl" includes both aromatic and non-aromatic ring structures with one or more heteroatoms. Non-limiting examples of heterocyclic includes, pyridine, isoquinoline, methylpyrrole and thiophene etc. "Heteroaryl" specifically denotes an aromatic cyclic structure including a heteroatom.

A dashed line outlining ring structures as used herein refers to an optional ring structure. The ring structure can be aromatic or non-aromatic. For example, the ring structure can comprise double bonds or can contain only single bonds within the ring structure. For example,

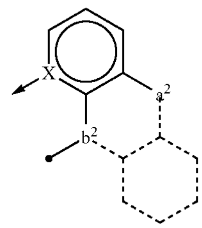

can have the structure

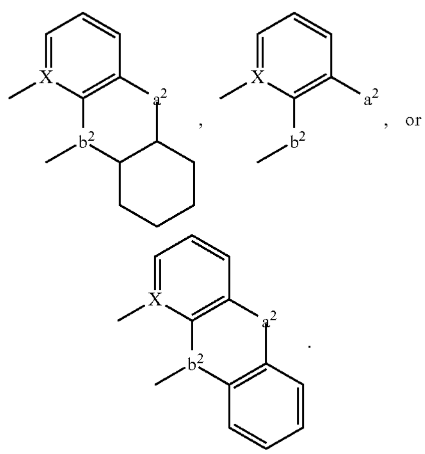

In one aspect, as used herein each of $a^0$, $a^1$, $a^2$, b, $b^1$, or $b^2$ can independently be replaced with anyone of $a^0$, $a^1$, $a^2$, b, $b^1$, and $b^2$. For example, $b^1$ in one structure can be replaced with $a^1$ in the same structure.

In one aspect, a complex that includes more than one of the same of X, Y, $a^0$, $a_1$, $a_2$, $b^1$, or $b^2$, then the two recited X, Y, $a^0$, $a^1$, $a^2$, $b^1$, or $b^2$ can have different structures. For example, if a complex recites two $b^1$ moieties, then the structure of one of the $b^1$'s can be different or the same of the other $b^1$.

Phosphorescent metal complexes have exclusive emission from the lowest triplet state. When the energy of the singlet excited state/states of metal complexes is/are closer to the energy of the lowest triplet state, metal complexes will emit simultaneously from the lowest triplet state and the singlet excited state/states at the room temperature or elevated temperature. Such metal complexes can be defined as metal-assisted delayed fluorescent emitters, and such dual emission process are defined as phosphorescence and thermal activated delayed fluorescence.

As briefly described above, the present invention is directed a metal complex having multiple radiative decay mechanisms. Metal complexes can be used for many applications including, for example, as emitters for OLEDs. In another aspect, the inventive complex can have a dual emission pathway. In one aspect, the dual emission characteristics of the inventive complex can be an enhancement of conventional phosphorescence typically found in organometallic emitters. In another aspect, the inventive complex can exhibit both a delayed fluorescence and a phosphorescence emission. In yet another aspect, the inventive complex can simultaneously and/or substantially simultaneously exhibit both singlet and triplet excitons. In one aspect, such an inventive complex can emit directly from a singlet excited state, so as to provide a blue-shifted emission spectrum. In another aspect, the inventive complex can be designed such that the lowest singlet excited state is thermally accessible from the lowest triplet excited state.

In one aspect, when emission from a complex is generated primarily from the fluorescent decay of thermally populated singlets, light, for example, red, blue, and/or green light, can be produced with improved efficiency and good color purity. In another aspect, when emission from a complex is generated from a combination of fluorescent emission from a higher energy singlet state and phosphorescent emission from a lower energy triplet state, the overall emission of the complex can be useful to provide white light.

In one aspect, the inventive complex exhibits a singlet excited state (S1) that is thermally accessible from the lowest triplet excited state (T1). In another aspect, and while not wishing to be bound by theory, this can be accomplished by tailoring the chemical structure, for example, the linkages between ligands N and C ("N^C") and between ligands D and A ("D^A"), as illustrated in the formulas herein. In one aspect, C^N can illustrate an emitting component which determines the triplet emission energy of the resulting metal complex. In another aspect, D^A can illustrate a donor-acceptor group containing the highest occupied molecular orbital (HOMO) and the lowest unoccupied molecular orbital (LUMO). In various aspects, the C^N ligand and D^A ligand can optionally share or not share any structural components.

Figure 2:
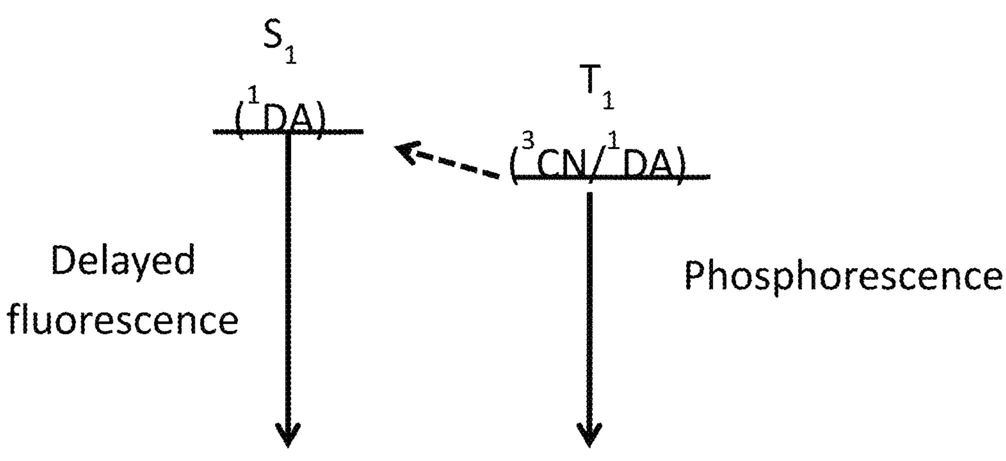
FIG. 2 is a schematic illustration of dual emission pathways in metal complexes, where the lowest triplet excited state ($T_1$) has a lower but similar energy level to the lowest singlet excited state ($S_1$), in accordance with various aspects of the present disclosure.

With reference to the figures, FIG. 2 illustrates an exemplary schematic of a dual emission pathway, wherein the lowest triplet excited state (T1) has a lower, but similar energy level to the lowest singlet excited state (S1). Thus, the inventive complex can exhibit both a phosphorescence pathway (T1 to S0) and a delayed fluorescence pathway (S1 to S0). The two radiative decay processes illustrated in FIG. 2 can occur simultaneously, enabling the inventive complex to have dual emission pathways. In the inventive complexes described herein, the T1 state can comprise a triplet ligand-centered state (3C^N) combined with at least some charge-transfer characteristics (1D-A). Similarly, the S1 state of the inventive complexes described herein can comprise singlet charge-transfer characteristics (1D-A). FIG. 2 illustrates an exemplary PdN3N complex, wherein the C^N component is represented by a solid line and the D^A component is represented by a dashed line. In such an inventive complex, a portion of the ligand structure may be shared between the C^N and D^A components.

Figure 3A:
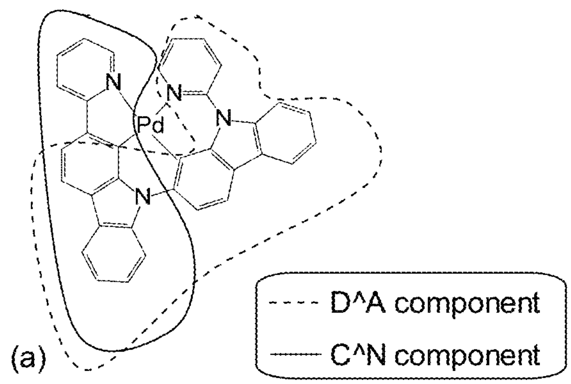
FIG. 3 (*a*) illustrates an exemplary PdN3N complex, in accordance with various aspects of the present disclosure, wherein the C^N component and D^A components are illustrated by solid and dashed lines, respectively; and (b) a UV-Vis absorption spectra of the complex illustrated in the inset, together with 77K and room temperature photoluminescence spectra of compound PdN3N.
Figure 3B:
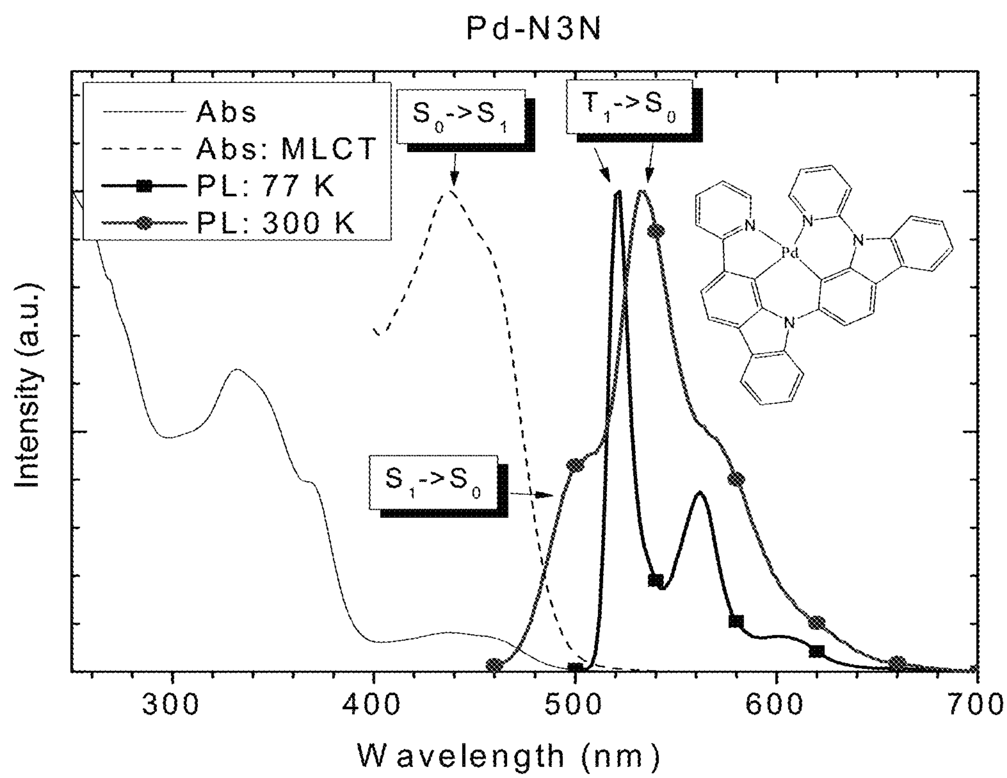
Figure 4:
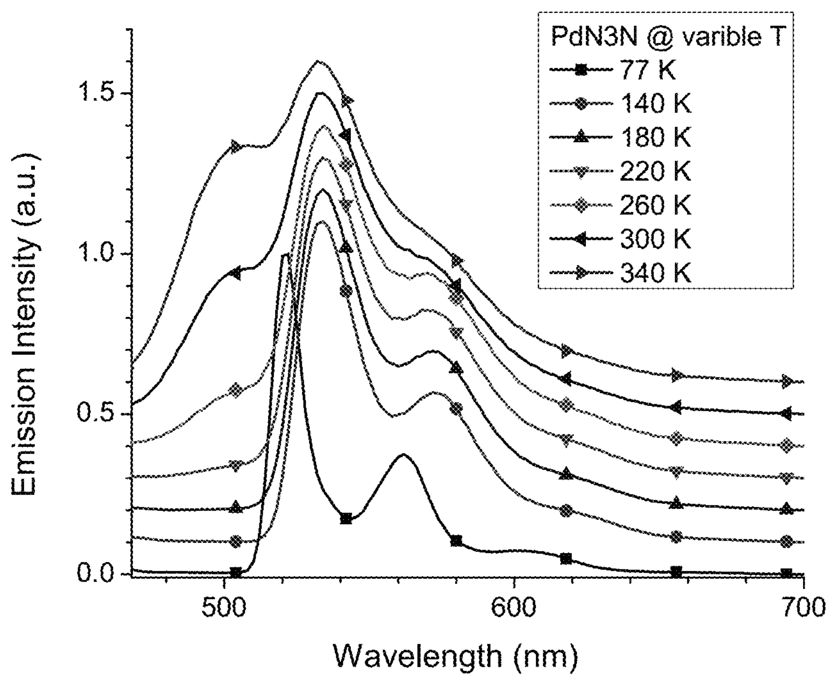
FIG. 4 illustrates emission spectra of a PdN3N complex at various temperatures ranging from 77 K to 340 K, in accordance with various aspects of the present disclosure.
Figure 5:
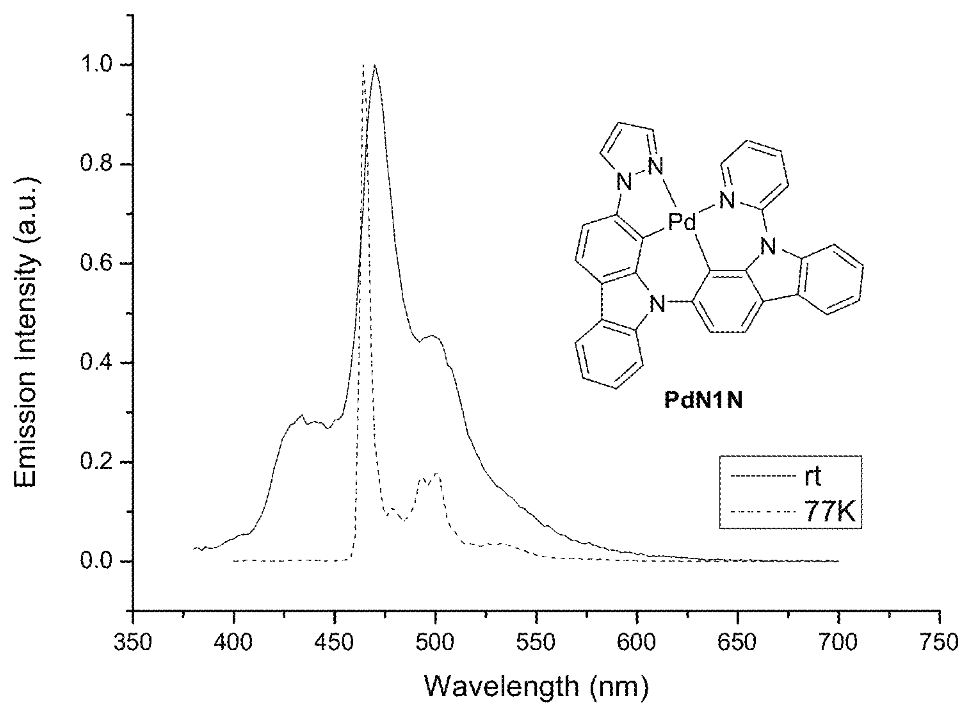
FIG. 5 illustrates emission spectra of a PdN1N complex in solution at 77 K and room temperature.
Figure 6:
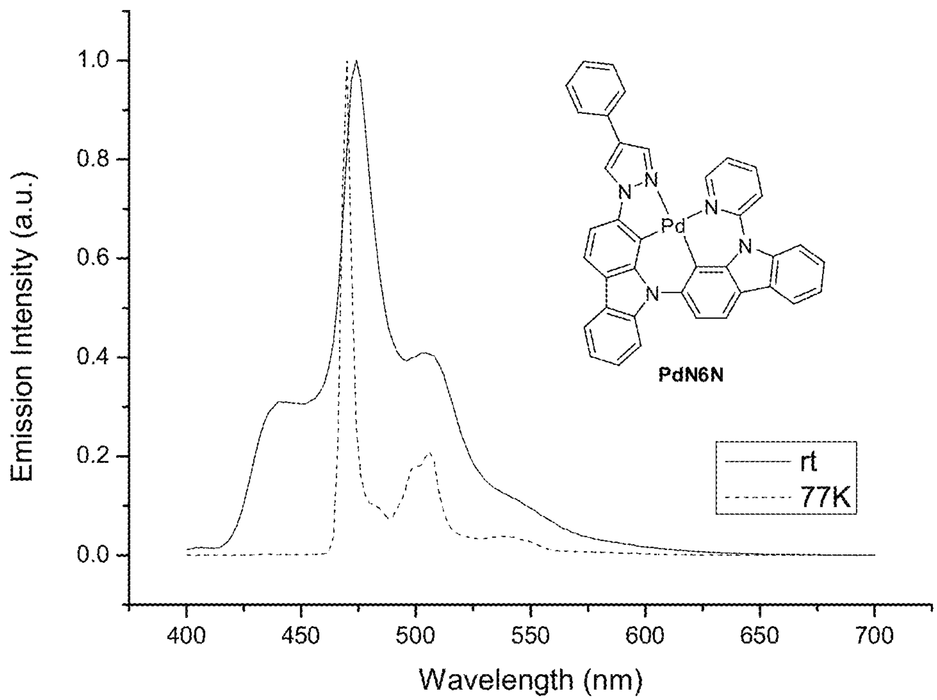
FIG. 6 illustrates emission spectra of a PdN6N complex in solution at 77 K and room temperature.
Figure 7:
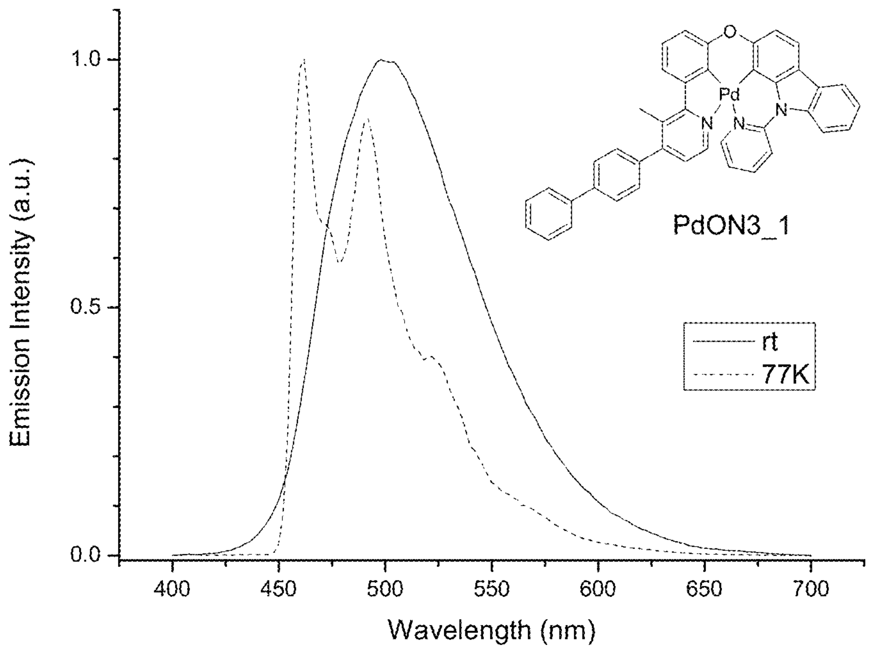
FIG. 7 illustrates emission spectra of a PdON3_1 complex in solution at 77 K and room temperature.
Figure 8:
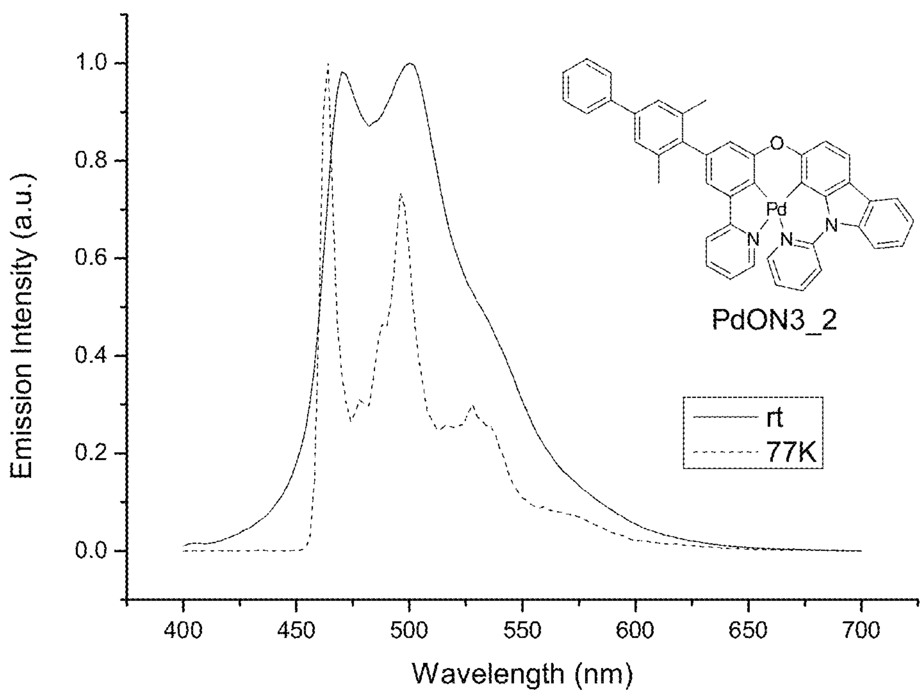
FIG. 8 illustrates emission spectra of a PdON3_2 complex in solution at 77 K and room temperature.
Figure 9:
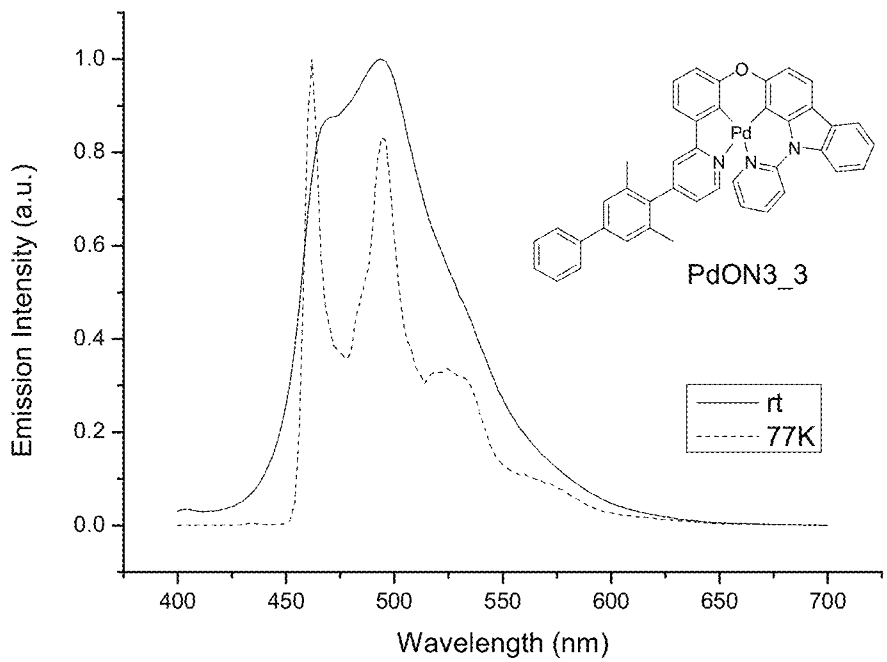
FIG. 9 illustrates emission spectra of a PdON3_3 complex in solution at 77 K and room temperature.
Figure 10:
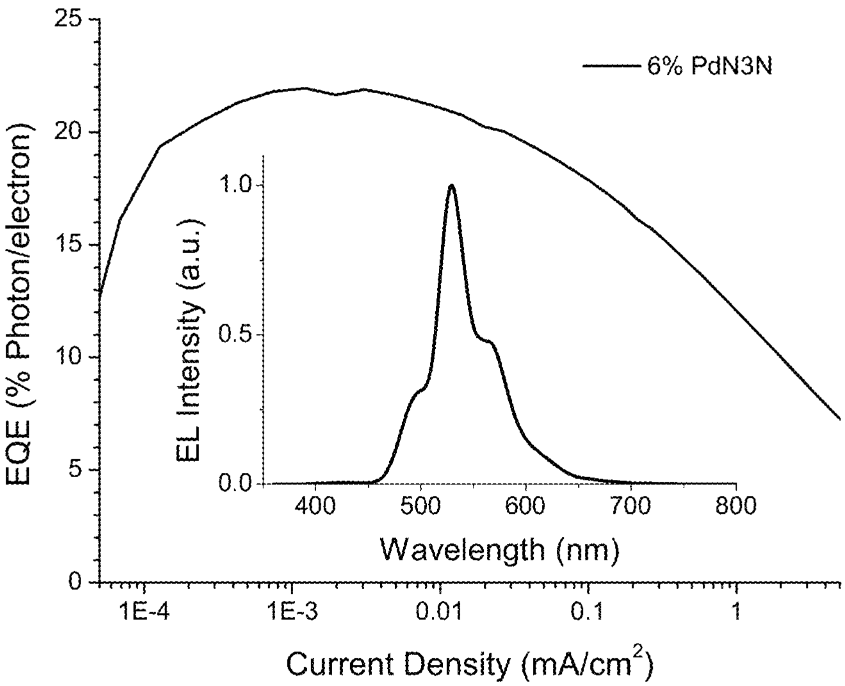
FIG. 10 illustrates plots of external quantum efficiency vs. current density and the electroluminescent spectrum (inset) for the device of ITO/HATCN (10 nm)/NPD (40 nm)/TAP C (10 nm)/6% PdN3N:26mCPy (25 nm)/DPP S (10 nm)/BmPyPB (40 nm)/LiF/Al.
Figure 11:
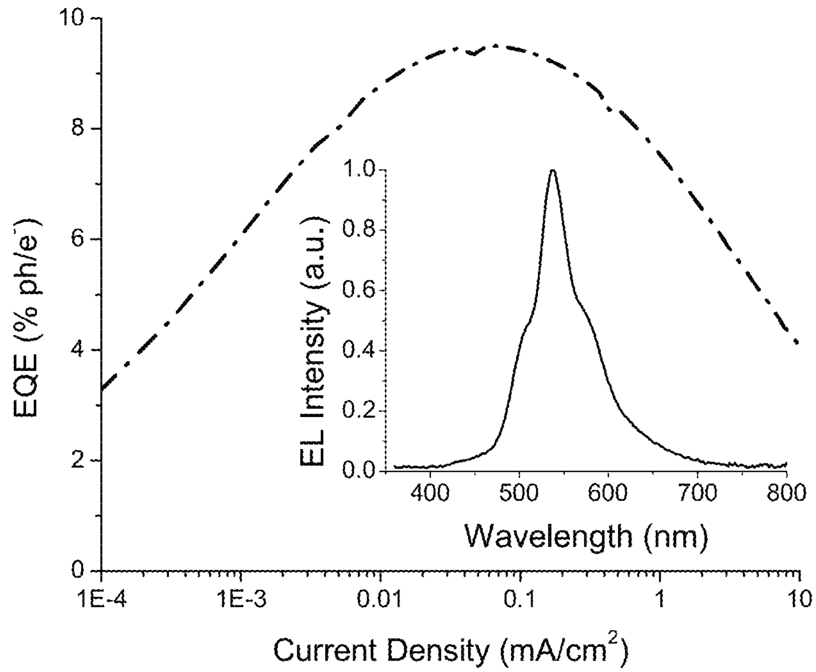
FIG. 11 illustrates plots of external quantum efficiency vs. current density and the electroluminescent spectrum (inset) for the device of ITO/HATCN (10 nm)/NPD (40 nm)/6% PdN3N:CBP (25 nm)/BAlQ (10 nm)/$AlQ_3$ (30 nm)/LiF/Al.
Figure 12:
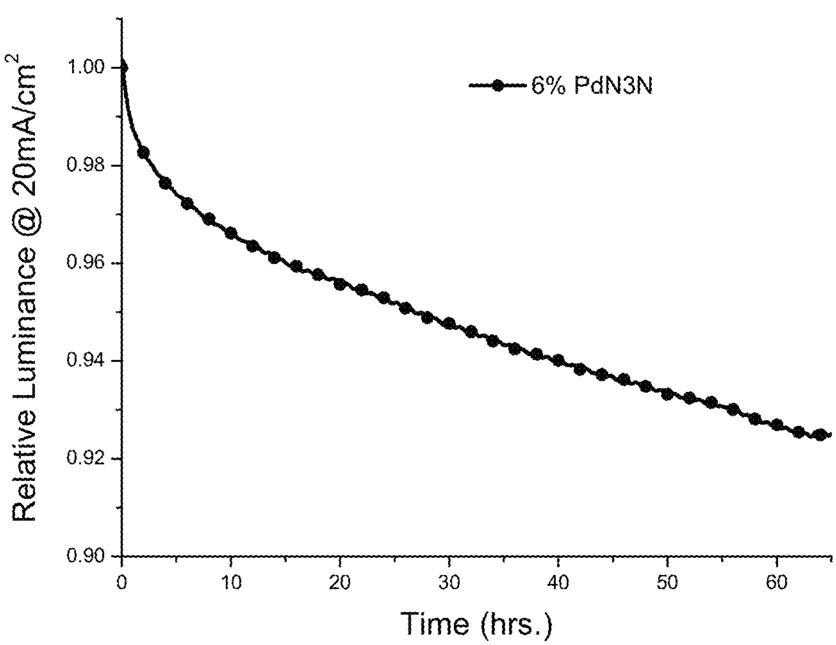
FIG. 12 illustrates plot of relative luminance at the constant current of 20 mA/$cm^2$ vs. operational time for the device of ITO/HATCN (10 nm)/NPD (40 nm)/6% PdN3N:CBP (25 nm)/BAlQ (10 nm)/$AlQ_3$ (30 nm)/LiF/Al.
Figure 13:
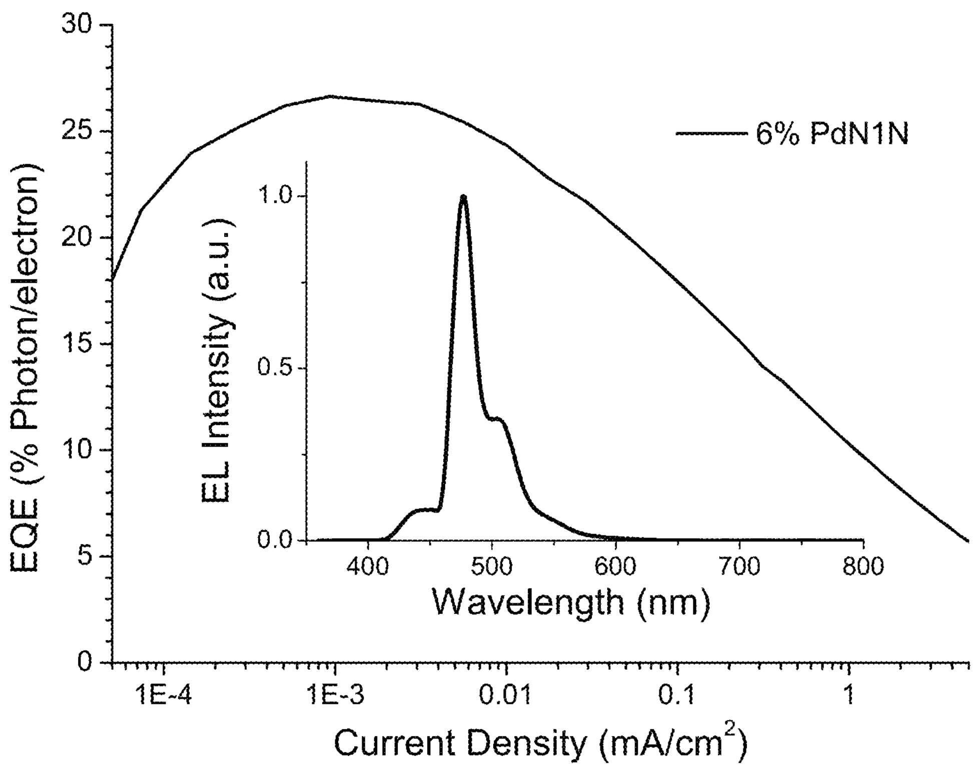
FIG. 13 illustrates plots of external quantum efficiency vs. current density and the electroluminescent spectrum (inset) for the device of ITO/HATCN (10 nm)/NPD (40 nm)/TAPC (10 nm)/6% PdN1N:26mCPy (25 nm)/DPPS (10 nm)/BmPyPB (40 nm)/LiF/Al. Additional aspects of the invention will be set forth in part in the description which follows, and in part will be obvious from the description, or can be learned by practice of the invention. The advantages of the invention will be realized and attained by means of the elements and combinations particularly pointed out in the appended claims. It is to be understood that both the foregoing general description and the following detailed description are exemplary and explanatory only and are not restrictive of the invention, as claimed.

In a specific aspect, the inventive complex can comprise a palladium based complex, referenced by PdN3N, which exhibits a blue-shifted emission spectrum at room temperature as compared to the emission spectrum at 77 K, as illustrated in FIG. 3. Such an emission profile represents an emission process from an excited state with a higher energy than the T1 state.

In one aspect, the intensity of at least a portion of the emission spectra, for example, from about 480 nm to about 500 nm, can increase as the temperature increases. In such an aspect, the temperature dependence indicates a thermally activated, E-type delayed fluorescence process.

In one aspect, the inventive complex can comprise four coordinating ligands with a metal center. In another aspect, the inventive complex can be a tetradentate complex that can provide dual emission pathways through an emitting component and a donor-acceptor component, wherein in various aspects the emitting component and the donor-acceptor component can optionally share structural components. In one aspect, a least a portion of the structural components between the emitting component and the donor-acceptor component are shared. In another aspect, there are no shared structural components between the emitting and donor-acceptor components of the complex.

In another aspect, the inventive complex can be useful as, for example, a luminescent label, an emitter for an OLED, and/or in other lighting applications. In one aspect, the inventive dual emission complexes described herein can be useful as emitters in a variety of color displays and lighting applications. In one aspect, the inventive complex can provide a broad emission spectrum that can be useful, for example, in white OLEDs. In another aspect, the inventive complex can provide a deep blue emission have a narrow emission for use in, for example, a display device.

In another aspect, the emission of such inventive complexes can be tuned, for example, by modifying the structure of one or more ligands. In one aspect, the compounds of the present disclosure can be prepared so as to have a desirable emission spectrum for an intended application. In another aspect, the inventive complexes can provide a broad emission spectrum, such that the complex can be useful in generating white light having a high color rendering index (CRI).

In any of the formulas and/or chemical structures recited herein, bonds represented by an arrow indicate coordination to a metal, whereas bonds represented by dashed lines indicate intra-ligand bonds. In addition, carbon atoms in any aryl rings can optionally be substituted in any position so as to form a heterocyclic aryl ring, and can optionally have atoms, functional groups, and/or fused ring systems substituted for hydrogen at any one or more available positions on the aryl ring.

Disclosed herein is a metal-assisted delayed fluorescent emitter, wherein the energy of the singlet excited state/states is/are slightly higher (0.2 eV or less) than the energy of the lowest triplet state, and metal-assisted delayed fluorescent emitter will emit simultaneously from the lowest triplet state and the singlet excited state/states at the room temperature or elevated temperature and the metal-assisted delayed fluorescent emitter can harvest both electrogenerated singlet and triplet excitons.

In one aspect, the metal-assisted delayed fluorescent emitter has 100% internal quantum efficiency in a device setting.

Disclosed herein is a metal-assisted delayed fluorescent emitter represented by one or more of the formulas (a)

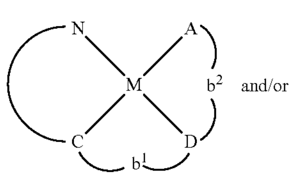

(b)

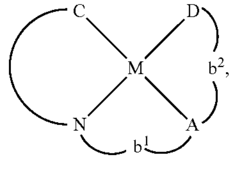

wherein A is an accepting group comprising one or more of the following structures, which can optionally be substituted

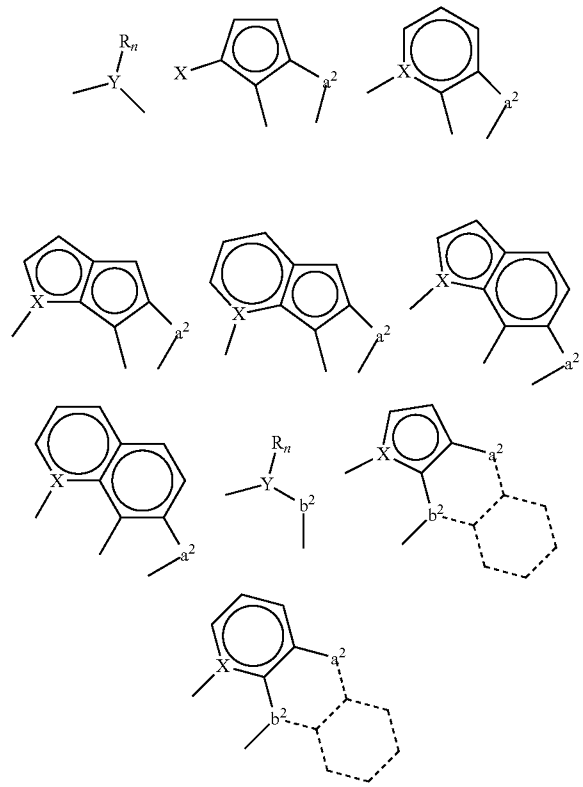

wherein D is a donor group comprising of one or more of the following structures, which can optionally be substituted,

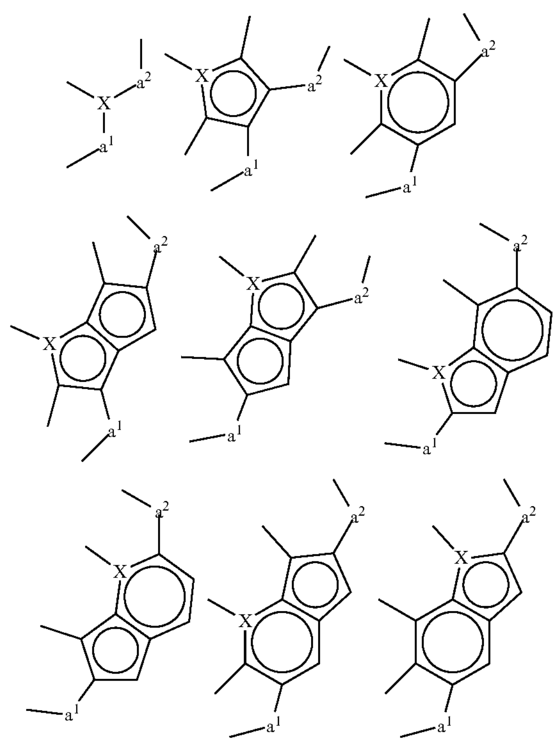

-continued
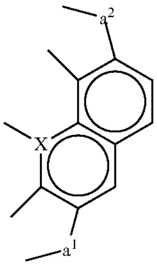
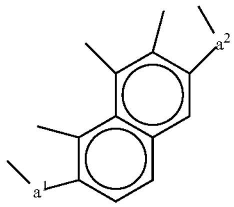
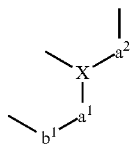
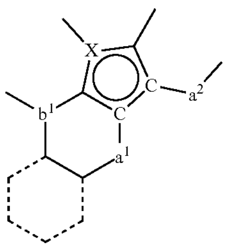
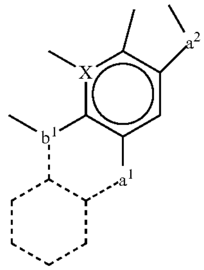
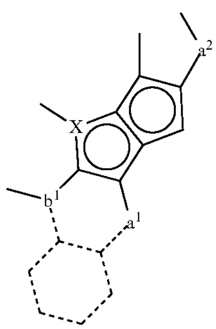
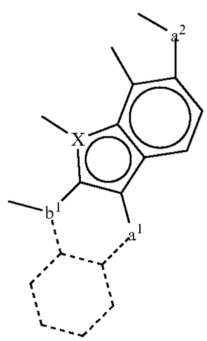
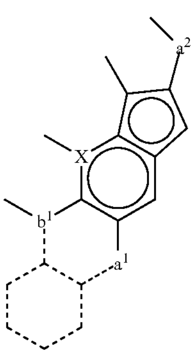
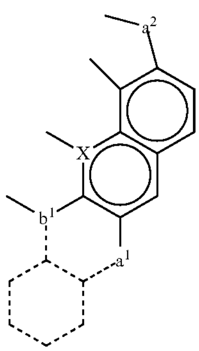
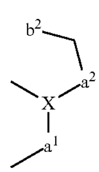
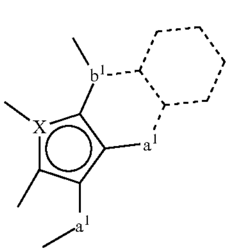
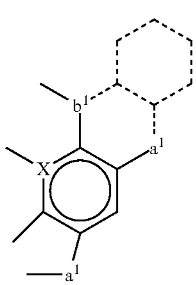
-continued
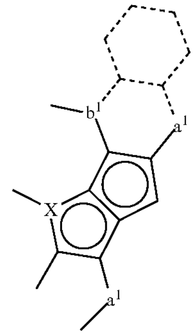
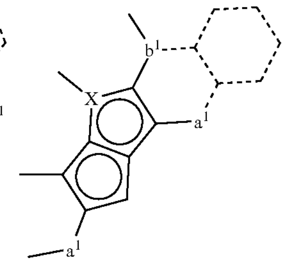
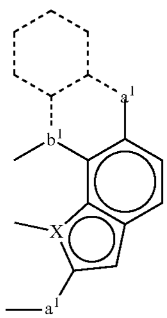
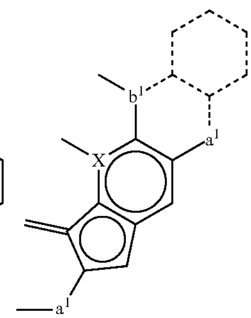
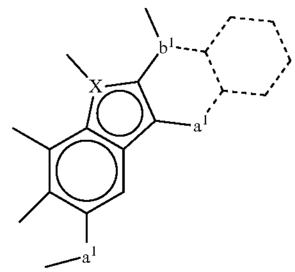
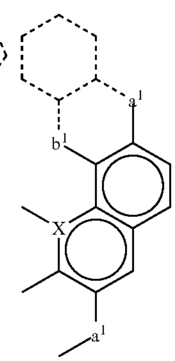
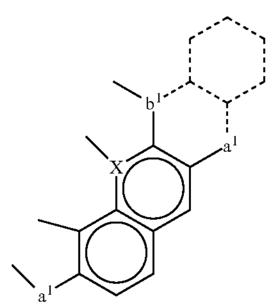
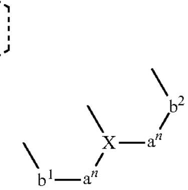
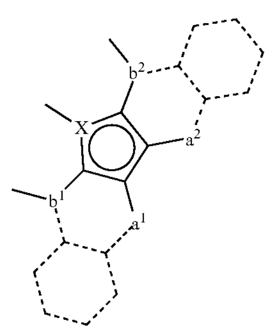
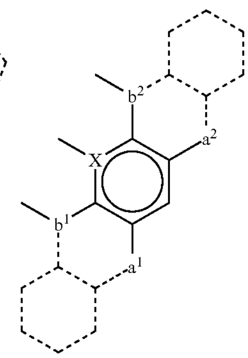

-continued
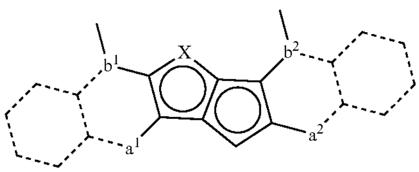
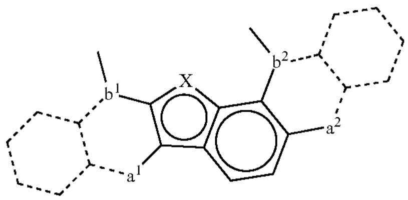
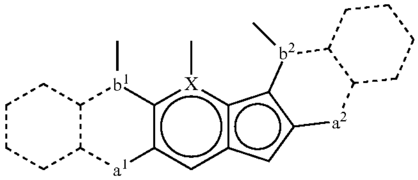
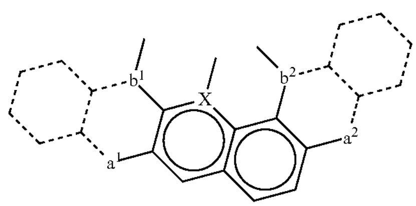
wherein C in structure (a) or (b) comprises one or more of the following structures, which can optionally be substituted
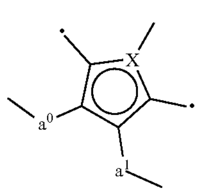
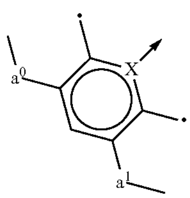
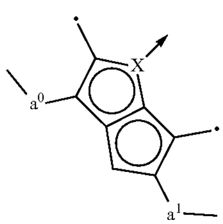
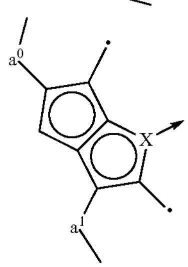
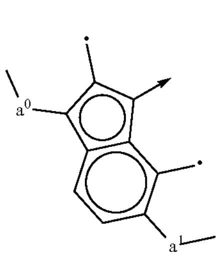
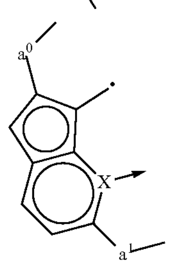
-continued
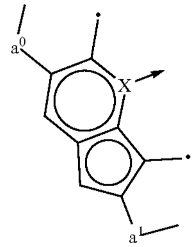
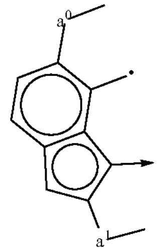
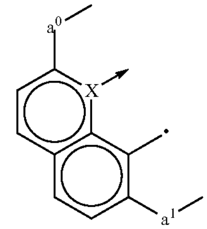
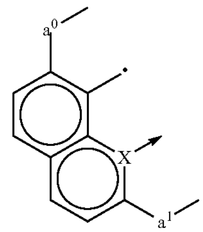
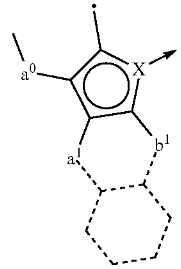
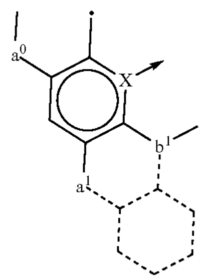
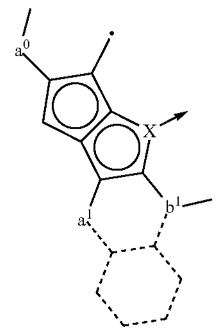
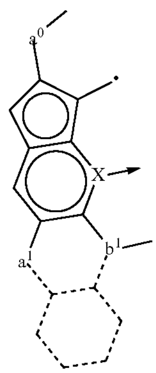
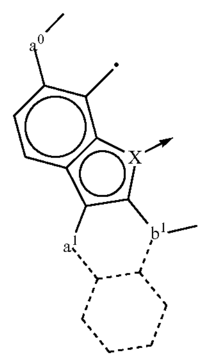
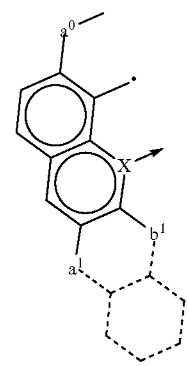
wherein N in structure (a) or (b) comprises one or more of the following structures, which can optionally be substituted
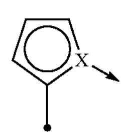
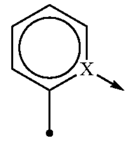
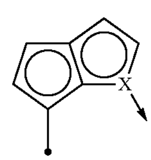
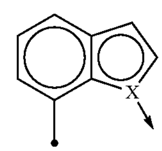
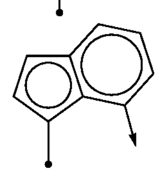
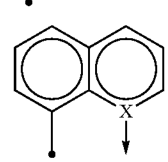, wherein each of $a^0$, $a^1$, and $a^2$ in dependently is present or absent, and if present, comprises a direct bond and/or linking group comprising one or more of the following

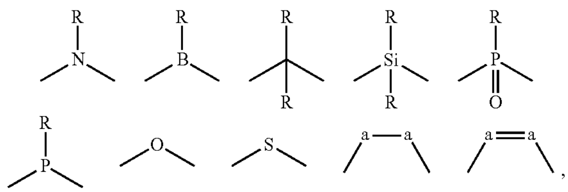

wherein $b^1$ and $b^2$ independently is present or absent, and if present, comprises a linking group comprising one or more of the following

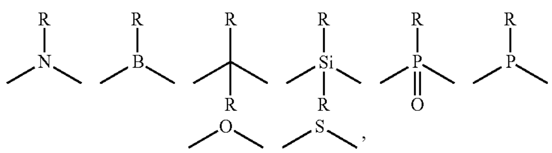

wherein X is B, C, N, O, Si, P, S, Ge, As, Se, Sn, Sb, or Te, wherein Y is O, S, S═O, $SO_2$, Se, N, $NR^3$, $PR^3$, RP═O, $CR^1R^2$, C═O, $SiR^1R^2$, $GeR^1R^2$, BH, P(O)H, PH, NH, $CR^1H$, $CH_2$, $SiH_2$, $SiHR^1$, BH, or $BR^3$, wherein each of R, $R^1$, $R^2$, and $R^3$ independently is hydrogen, aryl, cycloalkyl, cycloalkenyl, heterocyclyl, heteroaryl, alkyl, alkenyl, alkynyl, deuterium, halogen, hydroxyl, thiol, nitro, cyano, amino, a mono- or di-alkylamino, a mono- or diaryl amino, alkoxy, aryloxy, haloalkyl, aralkyl, ester, nitrile, isonitrile, alkoxycarbonyl, acylamino, alkoxycarbonylamino, aryloxycarbonylamino, sulfonylamino, sulfamoyl, carbamoyl, alkylthio, sulfinyl, ureido, phosphoramide, amercapto, sulfo, carboxyl, hydrazino, substituted silyl, or polymerizable, or any conjugate or combination thereof, wherein n is a number that satisfies the valency of Y, wherein M is platinum (II), palladium (II), nickel (II), manganese (II), zinc (II), gold (III), silver (III), copper (III), iridium (I), rhodium (I), or cobalt (I).

In one aspect, in:

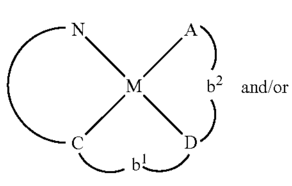
(a)

and/or

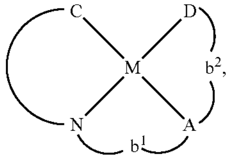
(b)

M comprises a metal, wherein X, if present, comprises C, N, P, and/or Si, wherein Y, if present, comprises B, C, N, O, Si, P, S, Ge, As, Se, Sn, Sb, or Te, and wherein R, if present, can optionally represent any substituent group. Furthermore, in all aryl rings depicted, carbon may be optionally substituted in any position(s) to form a heterocyclic aryl ring, and may have atoms, functional groups, and/or fused rings systems substituted for hydrogen along the aryl ring in any available position(s).

In one aspect, the complex has the structure (a). In another aspect, the complex has the structure (b).

In one aspect, M is platinum (II), palladium (II), nickel (II), manganese (II), zinc (II), gold (III), silver (III), copper (III), iridium (I), rhodium (I), or cobalt (I). For example, M can be platinum (II). In another example, M can be palladium (II). In yet another example, M can be manganese (II). In yet another example, M can be zinc (II),In yet another example, M can be gold (III),In yet another example, M can be silver (III),In yet another example, M can be copper (III),In yet another example, M can be iridium (I). In yet another example, M can be rhodium (I). In yet another example, M can be cobalt (I).

In one aspect, A is an aryl. In another aspect, A is a heteroaryl.

In one aspect, $a^2$ is absent in structure A. In another aspect, $a^2$ is present in structure A. In yet another aspect, $a^2$ and $b^2$ are absent. In yet another aspect, $a^2$, $b^1$, and $b^2$ are absent. In one aspect, at least one of $a^2$, $b^1$, and $b^2$ are present.

In another aspect, Y, if present, can comprise a carbon, nitrogen, oxygen, silicon, phosphorous, and/or sulfur, and/or a compound comprising a carbon, nitrogen, oxygen, silicon, phosphorous, and/or sulfur atom. In a specific aspect, Y, if present, comprises carbon, nitrogen, oxygen, silicon, phosphorous, and/or sulfur. In one aspect, Y is N. In another aspect, Y is C.

In one aspect, X is B, C, N, O, Si, P, S, Ge, As, Se, Sn, Sb, or Te. For example, X can be B, C, or N. In another aspect, Y, if present, can comprise boron, carbon, nitrogen, oxygen, silicon, phosphorous, silicon, germanium, arsenic, selenium, tin, antimony, and/or telenium, and/or a compound comprising a boron, carbon, nitrogen, oxygen, silicon, phosphorous, silicon, germanium, arsenic, selenium, tin, antimony, and/or telenium. In a specific aspect, X, if present, comprises boron, carbon, nitrogen, oxygen, silicon, phosphorous, silicon, germanium, arsenic, selenium, tin, antimony, and/or telenium In yet another aspect, R, if present, can comprise any substituent group suitable for use in the complex and intended application. In another aspect, R, if present, comprises a group that does not adversely affect the desirable emission properties of the complex.

In one aspect, A, D, C, and/or N in structures (a) or (b) can be substituted with R as described herein. For example, N in structures (a) or (b) can be substituted with R, wherein R is aryl, cycloalkyl, cycloalkenyl, heterocyclyl, heteroaryl, alkyl, alkenyl, alkynyl, deuterium, halogen, hydroxyl, thiol, nitro, cyano, amino, a mono- or di-alkylamino, a mono- or diaryl amino, alkoxy, aryloxy, haloalkyl, aralkyl, ester, nitrile, isonitrile, alkoxycarbonyl, acylamino, alkoxycarbonylamino, aryloxycarbonylamino, sulfonylamino, sulfamoyl, carbamoyl, alkylthio, sulfinyl, ureido, phosphoramide, amercapto, sulfo, carboxyl, hydrazino, substituted silyl, or polymerizable, or any conjugate or combination thereof. In another example, C in structures (a) or (b) can be substituted with R, wherein R is aryl, cycloalkyl, cycloalkenyl, heterocyclyl, heteroaryl, alkyl, alkenyl, alkynyl, deuterium, halogen, hydroxyl, thiol, nitro, cyano, amino, a mono- or di-alkylamino, a mono- or diaryl amino, alkoxy, aryloxy, haloalkyl, aralkyl, ester, nitrile, isonitrile, alkoxycarbonyl, acylamino, alkoxycarbonylamino, aryloxycarbonylamino, sulfonylamino, sulfamoyl, carbamoyl, alkylthio, sulfinyl, ureido, phosphoramide, amercapto, sulfo, carboxyl, hydrazino, substituted silyl, or polymerizable, or any conjugate or combination thereof.

In one aspect, the dashed line outlining ring structures in A, D, C, and/or N in structures (a) or (b) represents present bonds which form a ring structure. In one aspect, the dashed line outlining ring structures in A, D, C, and/or N in structures (a) or (b) are absent. For example, the dashed lines

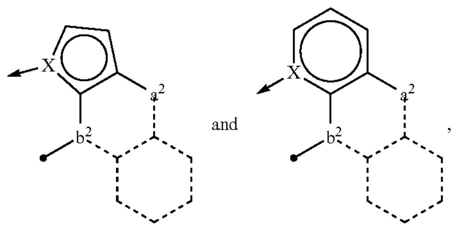

in one aspect represents present bonds and in another aspect are absent.

In one aspect, A is

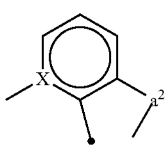

wherein $a^2$ is absent, wherein $b^2$ are absent, wherein D is

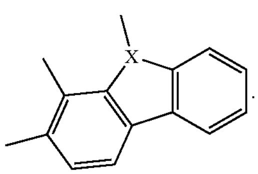

In another aspect, C in structure (a) or (b) is

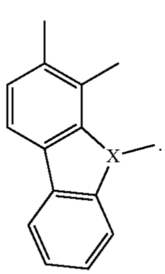

In another aspect, N in structure (a) or (b) is

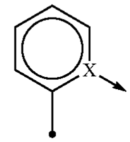

or R substituted

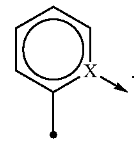

In one aspect, the emitter is represented by any one of

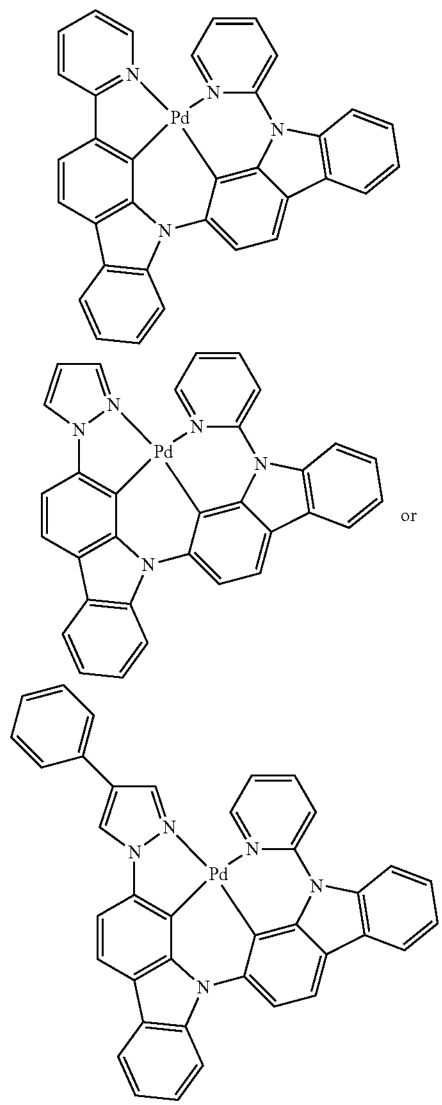

Also disclosed herein are delayed fluorescent emitters with the structure

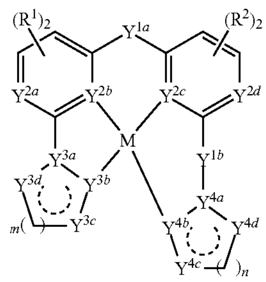

wherein M comprises Ir, Rh, Mn, Ni, Ag, Cu, or Ag;

wherein each of $R^1$ and $R^2$ independently are hydrogen, substituted or unsubstituted alkyl, alkenyl, alkynyl, aryl, heteroaryl, cycloalkane, cycloalkane, heterocyclyl, amino, nitro hydroxyl, halogen, thio, alkoxy, haloalkyl, arylalkane, or arylalkene;

wherein each of $Y^{1a}$ and $Y^{1b}$ independently is O, $NR^2$, $CR^2R^3$, S, $AsR^2$, $BR^2$, $PR^2$, $P(O)R^2$, or $SiR^2R^3$, or a combination thereof, wherein each of $R^2$ and $R^3$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, arylalkene, or $R^2$ and $R^3$ together form C═O, wherein each of $R^2$ and $R^3$ independently is optionally linked to an adjacent ring structure, thereby forming a cyclic structure;

wherein each of $Y^{2a}$, $Y^{2b}$, $Y^{2c}$ and $Y^{2d}$ independently is N, $NR^{6a}$, or $CR^{6b}$, wherein each of $R^{6a}$ and $R^{6b}$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene;

each of $Y^{3a}$, $Y^{3b}$, $Y^{3c}$, $Y^{3d}$, $Y^{4a}$, $Y^{4b}$, $Y^{4c}$ and $Y^{4d}$ independently is N, O, S, $NR^{6a}$, $CR^{6b}$, wherein each of $R^{6a}$ and $R^{6b}$ independently hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene; or $Z(R^{6c})_2$, wherein Z is C or Si, and wherein each $R^{6c}$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene;

wherein each of m and n independently are an integer 1 or 2;

wherein each of

independently is partial or full unsaturation of the ring with which it is associated.

In one aspect, each of $Y^{1a}$ and $Y^{1b}$ independently is O, $NR^2$, $CR^2R^3$ or S. For example, each of $Y^{1a}$ and $Y^{1b}$ independently is O or $NR^2$.

In one aspect, $Y^{2b}$ is CH, wherein $Y^{2c}$, $Y^{3b}$ and $Y^{4b}$ is N, wherein M is Ir or Rh.

In one aspect, if m is 1, each of $Y^{2a}$ and $Y^{2d}$ is CH and each of $Y^{2b}$ and $Y^{2c}$ is N, then at least one of $Y^{4a}$, $Y^{4b}$, $Y^{3a}$, or $Y^{3d}$ is not N.

In one aspect, if n is 1, each of $Y^{2a}$ and $Y^{2d}$ is CH and each of $Y^{2b}$ and $Y^{2c}$ is N, then at least one of $Y^{4a}$, $Y^{4b}$, or $Y^{3d}$ is not N Also disclosed herein is a metal-assisted delayed fluorescent emitters having the structure

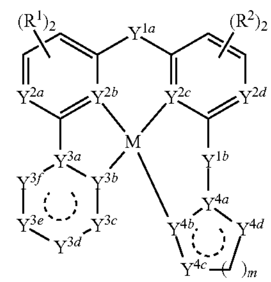

wherein M comprises Pt, Pd and Au;

wherein each of $R^1$ and $R^2$ independently are hydrogen, substituted or unsubstituted alkyl, alkenyl, alkynyl, aryl, heteroaryl, cycloalkane, cycloalkane, heterocyclyl, amino, nitro hydroxyl, halogen, thio, alkoxy, haloalkyl, arylalkane, or arylalkene;

wherein each of $Y^{1a}$ and $Y^{1b}$ independently is O, $NR^2$, $CR^2R^3$, S, $AsR^2$, $BR^2$, $PR^2$, $P(O)R^2$, or $SiR^2R^3$, or a combination thereof, wherein each of $R^2$ and $R^3$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, arylalkene, or $R^2$ and $R^3$ together form C═O, wherein each of $R^2$ and $R^3$ independently is optionally linked to an adjacent ring structure, thereby forming a cyclic structure;

wherein each of $Y^{2a}$, $Y^{2b}$, $Y^{2c}$, and $Y^{2d}$ independently is N, $NR^{6a}$, or $CR^{6b}$, wherein each of $R^{6a}$ and $R^{6b}$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene;

each of $Y^{3a}$, $Y^{3b}$, $Y^{3c}$, $Y^{3d}$, $Y^{3e}$, $Y^{3f}$, $Y^{4a}$, $Y^{4b}$, $Y^{4c}$ and $Y^{4d}$ independently is N, O, S, $NR^{6a}$, $CR^{6b}$, wherein each of $R^{6a}$ and $R^{6b}$ independently hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene; or $Z(R^{6c})_2$, wherein Z is C or Si, and wherein each $R^{6c}$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene;

wherein each of m is an integer 1 or 2;

wherein each of

independently is partial or full unsaturation of the ring with which it is associated.

In one aspect, $Y^{2b}$ and $Y^{2c}$ is CH, wherein $Y^{3b}$ and $Y^{4b}$ is N, and wherein M is Pt or Pd.

In one aspect, $Y^{2b}$ and $Y^{2c}$ is CH, wherein $Y^{3b}$ and $Y^{4b}$ is N, wherein each of $Y^{1a}$ and $Y^{1b}$ independently is O, $NR^2$, $CR^2R^3$, S, $AsR^2$, $BR^2$, $PR^2$, $P(O)R^2$, or $SiR^2R^3$, or a combination thereof, wherein each of $R^2$ and $R^3$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, arylalkene, or $R^2$ and $R^3$ together form C═O, wherein each of $R^2$ and $R^3$ independently is optionally linked to an adjacent ring structure, thereby forming a cyclic structure; herein M is Pt or Pd.

In one aspect, $Y^{2b}$, $Y^{2c}$ and $Y^{4b}$ is CH, wherein $Y^{3b}$ is N, wherein each of $Y^{1a}$ and $Y^{1b}$ independently is O, $NR^2$, $CR^2R^3$, S, $AsR^2$, $BR^2$, $PR^2$, $P(O)R^2$, or $SiR^2R^3$, or a combination thereof, wherein each of $R^2$ and $R^3$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, arylalkene, or $R^2$ and $R^3$ together form C═O, wherein each of $R^2$ and $R^3$ independently is optionally linked to an adjacent ring structure, thereby forming a cyclic structure; wherein M is Au.

In one aspect, $Y^{2b}$ and $Y^{2c}$ is CH, wherein $Y^{3b}$ and $Y^{4b}$ is N, wherein one of $Y^{1a}$ and $Y^{1b}$ is) $B(R^2)^2$ and the other of $Y^{1a}$ and $Y^{1b}$ is O, $NR^2$, $CR^2R^3$, S, $AsR^2$, $BR^2$, $PR^2$, $P(O)R^2$, or $SiR^2R^3$, or a combination thereof, wherein each of $R^2$ and $R^3$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, arylalkene, or $R^2$ and $R^3$ together form C═O, wherein each of $R^2$ and $R^3$ independently is optionally linked to an adjacent ring structure, thereby forming a cyclic structure; wherein M is Au.

In one aspect, m is 1, each of $Y^{2a}$ and $Y^{2d}$ is CH and each of $Y^{2b}$ and $Y^{2c}$ is N, then at least one of $Y^{4a}$, $Y^{4b}$, $Y^{3a}$, or $Y^{3d}$ is not N.

Also disclosed herein is a metal-assisted delayed fluorescent emitters having the structure:

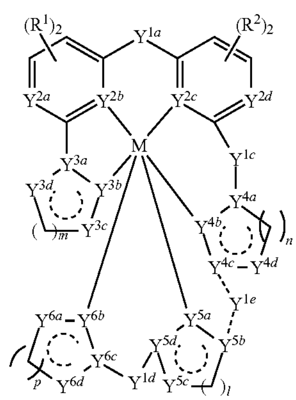

wherein M comprises Ir, Rh, Pt, Os, Zr, Co, or Ru;

wherein each of $R^1$ and $R^2$ independently are hydrogen, substituted or unsubstituted alkyl, alkenyl, alkynyl, aryl, heteroaryl, cycloalkane, cycloalkane, heterocyclyl, amino, nitro hydroxyl, halogen, thio, alkoxy, haloalkyl, arylalkane, or arylalkene;

wherein each of $Y^{1a}$, $Y^{1b}$, $Y^{1c}$ and $Y^{1d}$ independently is O, $NR^2$, $CR^2R^3$, S, $AsR^2$, $BR^2$, $PR^2$, $P(O)R^2$, or $SiR^2R^3$, or a combination thereof, wherein each of $R^2$ and $R^3$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, arylalkene, or $R^2$ and $R^3$ together form C═O, wherein each of $R^2$ and $R^3$ independently is optionally linked to an adjacent ring structure, thereby forming a cyclic structure;

wherein $Y^{1e}$ is O, $NR^2$, $CR^2R^3$, S, $AsR^2$, $BR^2$, $PR^2$, $P(O)R^2$, or $SiR^2R^3$, or a combination thereof, or nothing, wherein each of $R^2$ and $R^3$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, arylalkene, or $R^2$ and $R^3$ together form C═O, wherein each of $R^2$ and $R^3$ independently is optionally linked to an adjacent ring structure, thereby forming a cyclic structure;

wherein each of $Y^{2a}$, $Y^{2b}$, $Y^{2c}$ and $Y^{2d}$ independently is N, $NR^{6a}$, or $CR^{6b}$, wherein each of $R^{6a}$ and $R^{6b}$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene;

wherein each of $Y^{3a}$, $Y^{3b}$, $Y^{3c}$, $Y^{3d}$, $Y^{3e}$, $Y^{4a}$, $Y^{4b}$, $Y^{4c}$, and $Y^{4d}$ independently is N, O, S, $NR^{6a}$, $CR^{6b}$, wherein each of $R^{6a}$ and $R^{6b}$ independently hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene; or $Z(R^{6c})_2$, wherein Z is C or Si, and wherein each $R^{6c}$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene;

wherein in each of each of $Y^{5a}$, $Y^{5b}$, $Y^{5c}$, $Y^{5d}$, $Y^{6a}$, $Y^{6b}$, $Y^{6c}$ and $Y^{6d}$ independently is N, O, S, $NR^{6a}$, or $CR^{6b}$;

wherein each of m, n, l and p independently are an integer 1 or 2;

wherein each of

independently is partial or full unsaturation of the ring with which it is associated.

A metal-assisted delayed fluorescent emitters having the structure

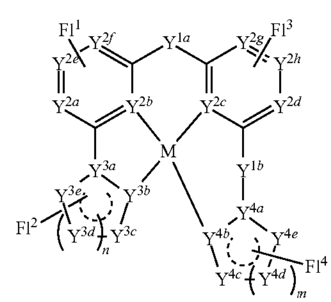

wherein M comprises Pd, Ir, Rh, Au, Co, Mn, Ni, Ag, or Cu;

wherein each of $Y^{1a}$ and $Y^{1b}$ independently is O, $NR^2$, $CR^2R^3$, S, $AsR^2$, $BR^2$, $B(R^2)_2$, $PR^2$, $P(O)R^2$, or $SiR^2R^3$, or a combination thereof, wherein each of $R^2$ and $R^3$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, arylalkene, or $R^2$ and $R^3$ together form C═O, wherein each of $R^2$ and $R^3$ independently is optionally linked to an adjacent ring structure, thereby forming a cyclic structure;

wherein each of $Y^{2a}$, $Y^{2b}$, $Y^{2c}$, $Y^{2d}$, $Y^{2e}$, $Y^{2f}$, $Y^{2g}$, and $Y^{2h}$ independently is N, $NR^{6a}$, or $CR^{6b}$, wherein each of $R^{6a}$ and $R^{6b}$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene;

each of $Y^{3a}$, $Y^{3b}$, $Y^{3c}$, $Y^{3d}$, $Y^{3e}$, $Y^{4a}$, $Y^{4b}$, $Y^{4c}$, $Y^{4d}$, and $Y^{4e}$ independently is N, O, S, $NR^{6a}$, $CR^{6b}$, wherein each of $R^{6a}$ and $R^{6b}$ independently hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene; or $Z(R^{6c})_2$, wherein Z is C or Si, and wherein each $R^{6c}$ independently is hydrogen, substituted or unsubstituted alkyl, alkenyl, alkynyl, aryl, heteroaryl, cycloalkane, cycloalkane, heterocyclyl, amino, hydroxyl, halogen, thio, alkoxy, haloalkyl, arylalkane, or arylalkene;

wherein each of m is an integer 1 or 2;

wherein each of n is an integer 1 or 2;

wherein each of

independently is partial or full unsaturation of the ring with which it is associated.

wherein each of $Fl^1$, $Fl^2$, $Fl^3$ and $Fl^4$ independently are fluorescent emitters with tunable singlet excited state energies which are covenantly bonded to selected atoms among $Y^{2a}$, $Y^{2d}$, $Y^{2e}$, $Y^{2f}$, $Y^{2g}$, $Y^{2h}$, $Y^{3c}$, $Y^{3d}$, $Y^{3e}$, $Y^{4c}$, $Y^{4d}$, and $Y^{4e}$.

In one aspect, the inventive complex can exhibit an overall neutral charge. In another aspect, the inventive complex can exhibit a non-neutral overall charge. In other aspects, the metal center of the inventive complex can comprise a metal having a +1, a +2, and/or a +3 oxidation state.

In one aspect, the inventive complex can comprise a neutral complex having the structure (a)

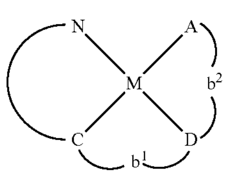

wherein the M represents a metal having a +1 oxidation state.

In another aspect, the inventive complex can comprise a neutral complex having the structure (b)

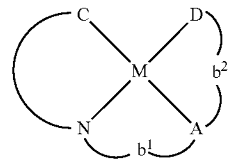

wherein the M represents a metal having a +1 oxidation state.

In one aspect, the inventive complex can comprise a neutral complex having the structure (a)

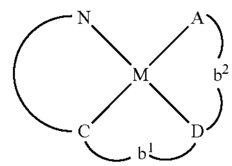

wherein the M represents a metal having a +2 oxidation state.

In one aspect, the inventive complex can comprise a neutral complex having the structure (a)

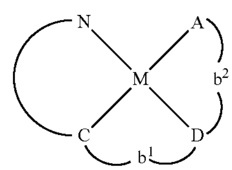

wherein the M represents a metal having a +3 oxidation state. In another aspect, the inventive complex can comprise a neutral complex having the structure (b)

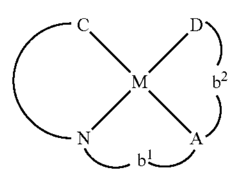

wherein the M represents a metal having a +3 oxidation state.

In various aspects, such an inventive complex can comprise any one or more of the following:

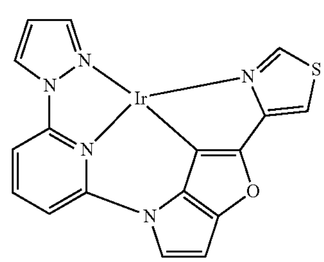

-continued
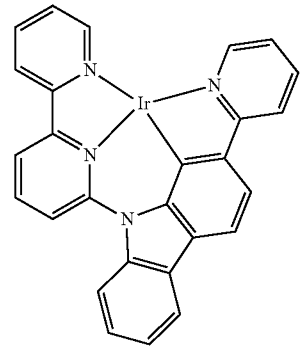
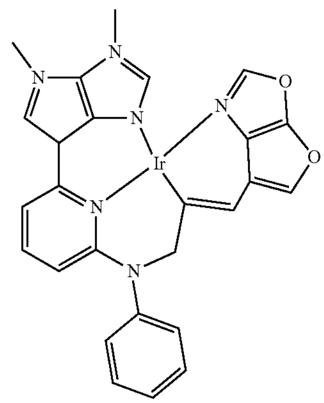
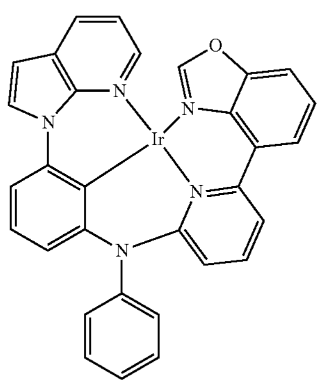
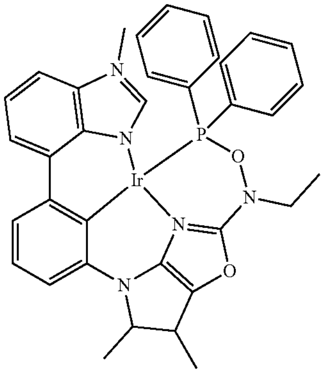
-continued
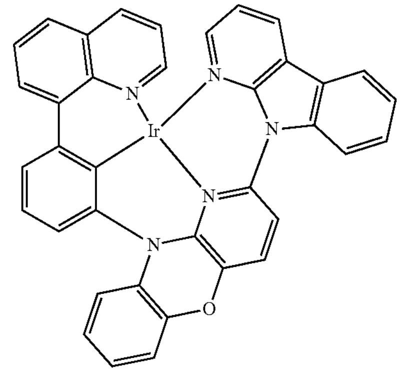
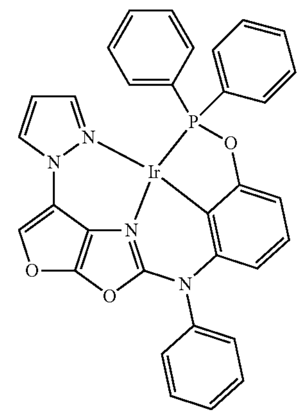
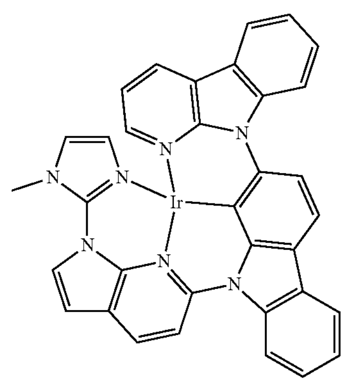
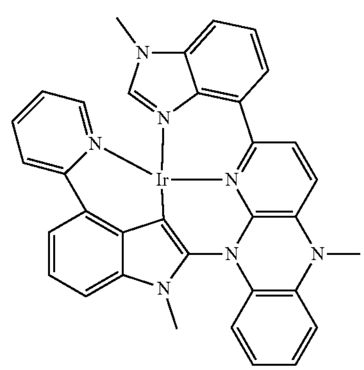

-continued
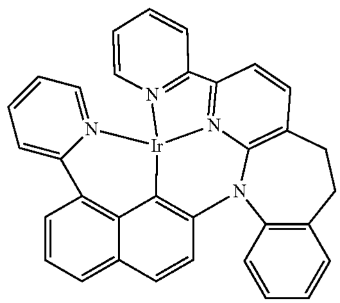
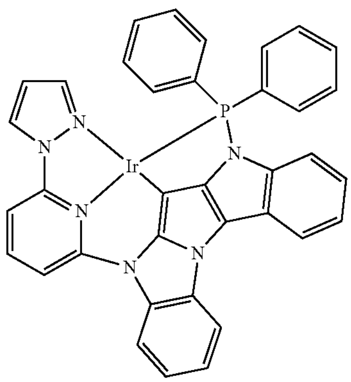
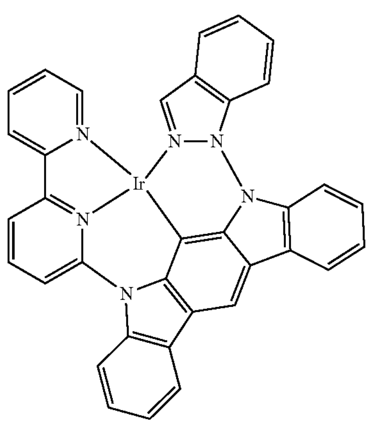
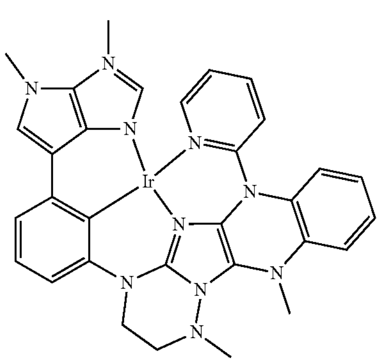
-continued
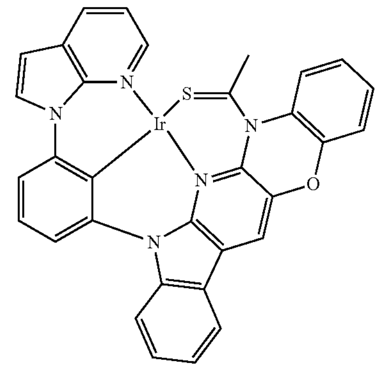
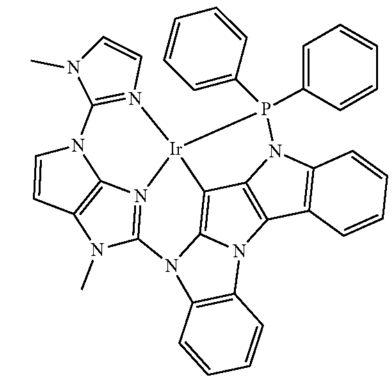
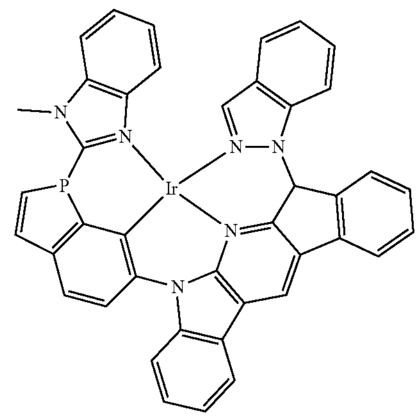
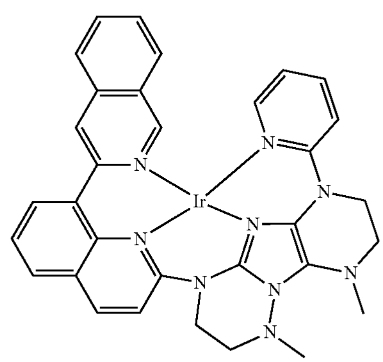

-continued
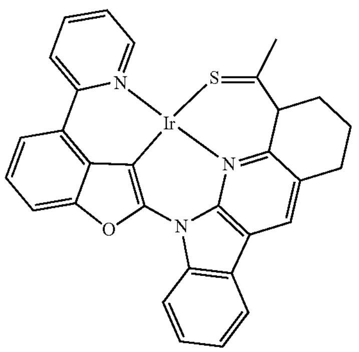
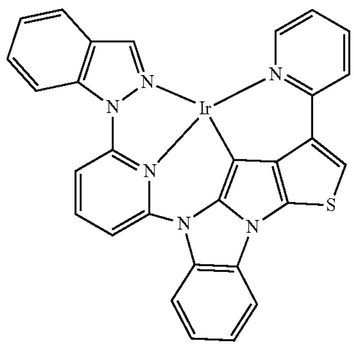
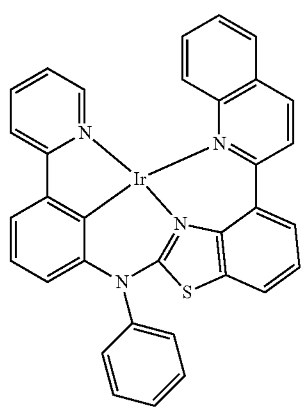
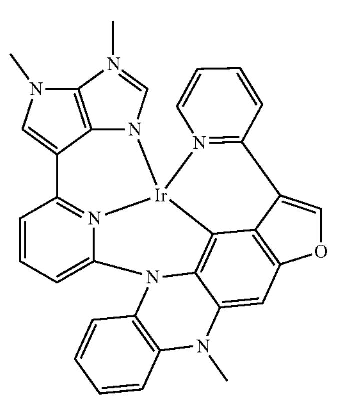
-continued
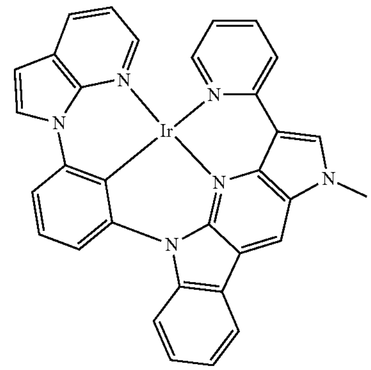
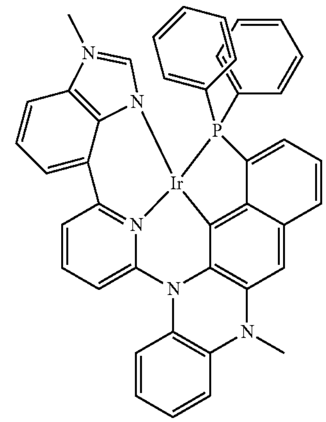
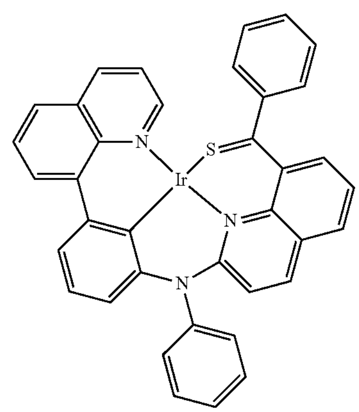
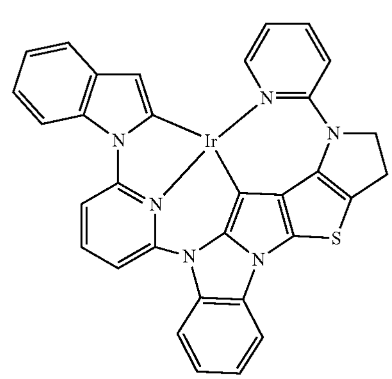

-continued
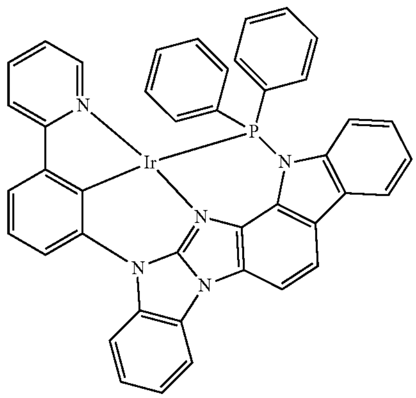
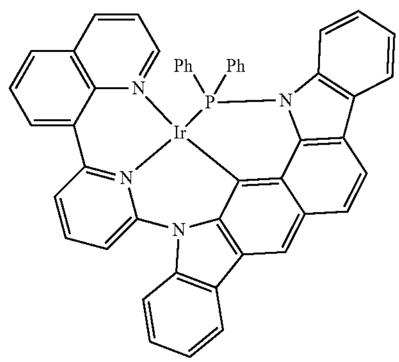
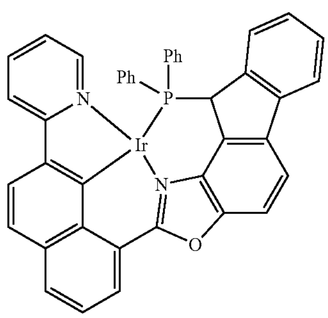
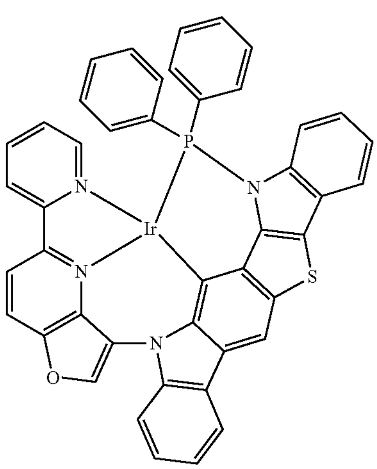
-continued
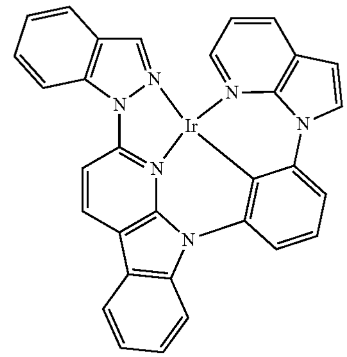
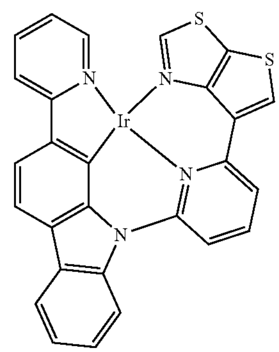
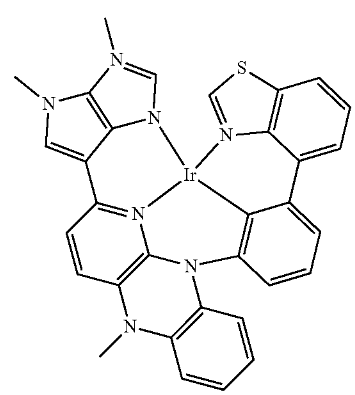
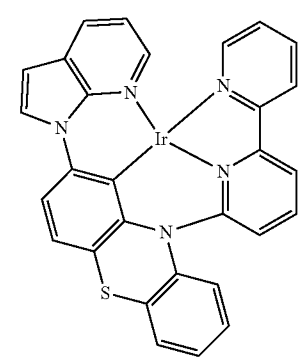

-continued
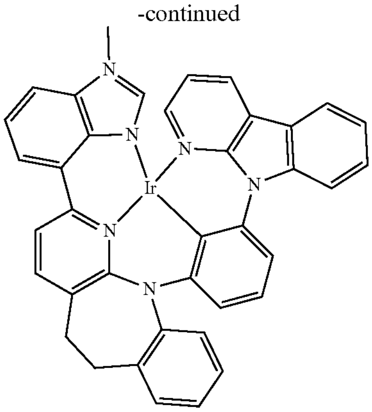
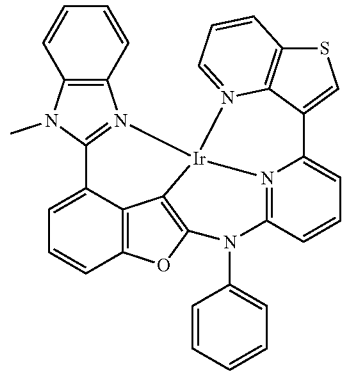
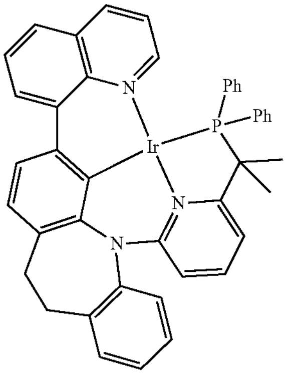
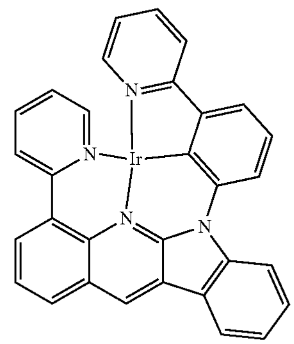
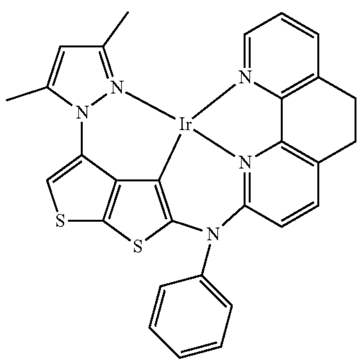
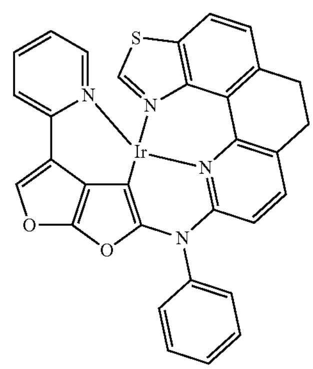
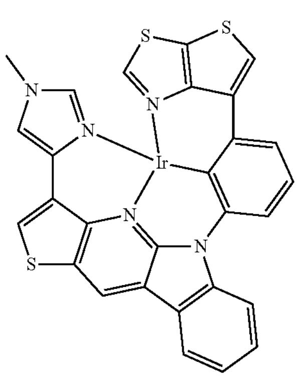
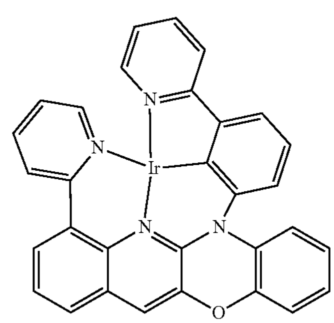

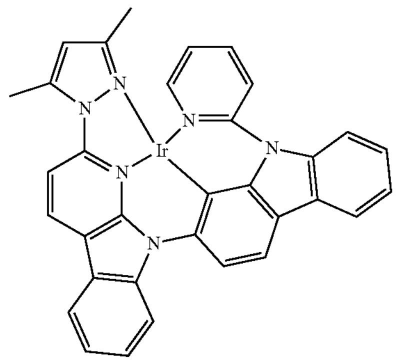
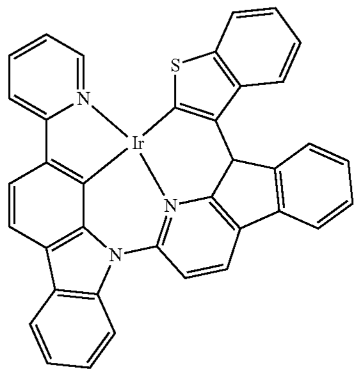
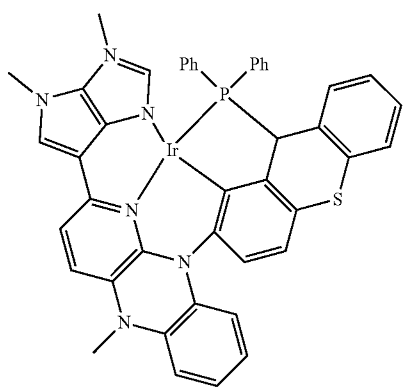
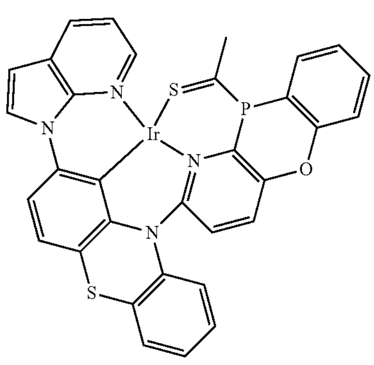
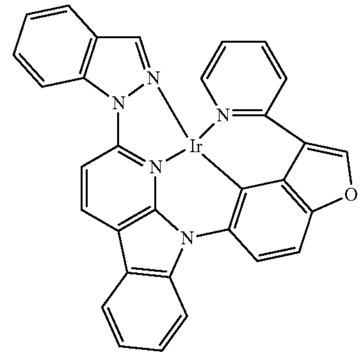
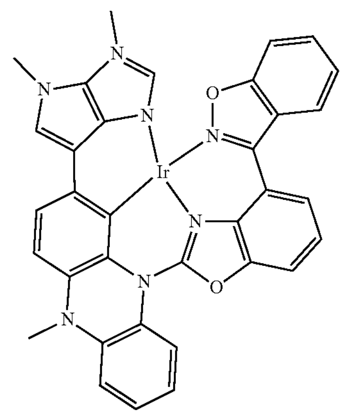
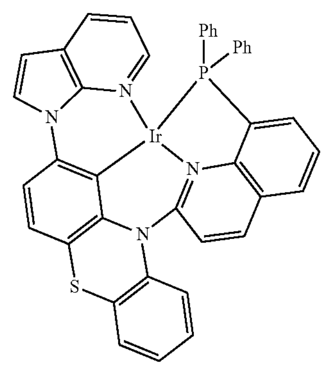
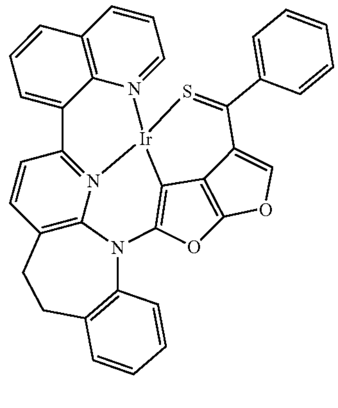

-continued
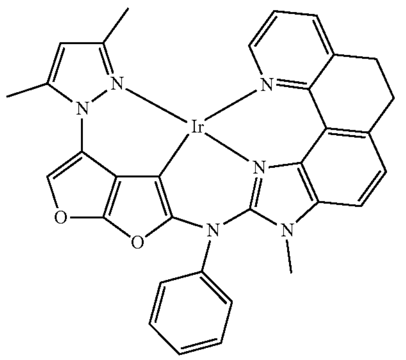
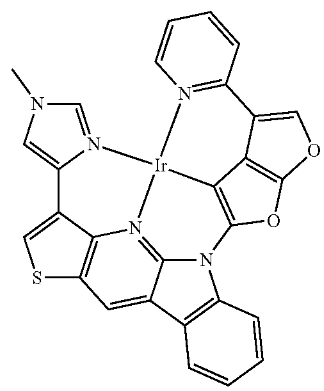
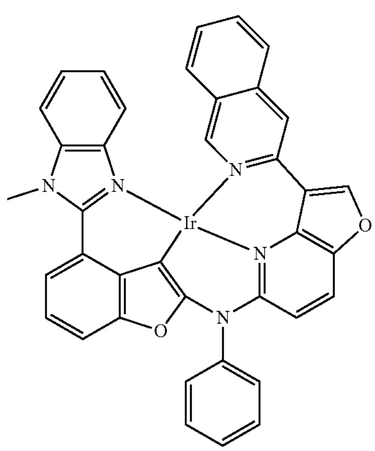
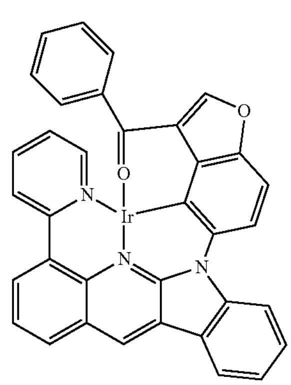
-continued
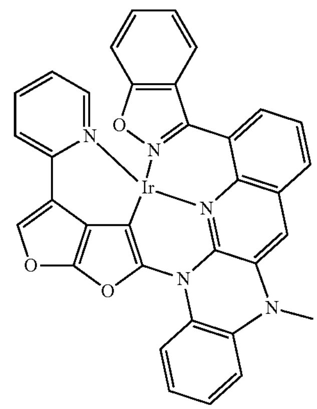
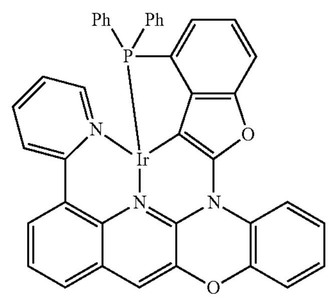
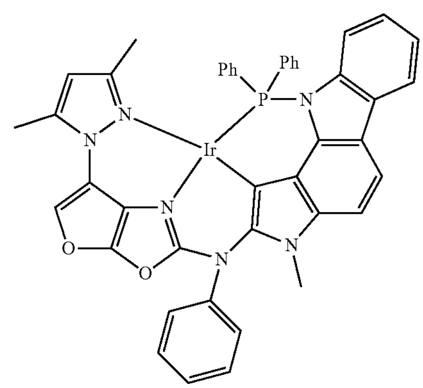
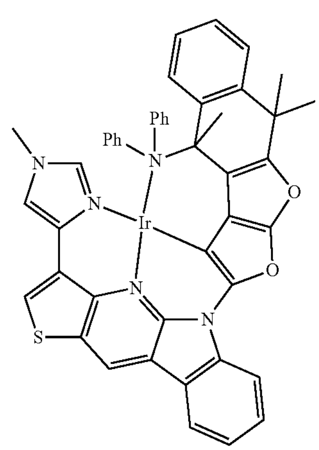

-continued
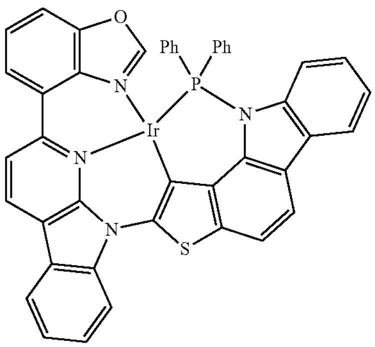
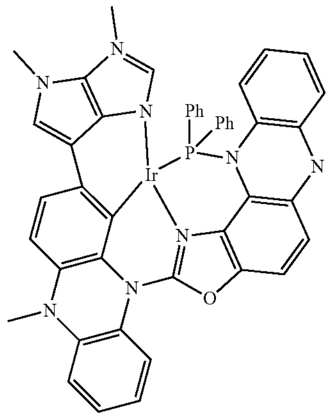
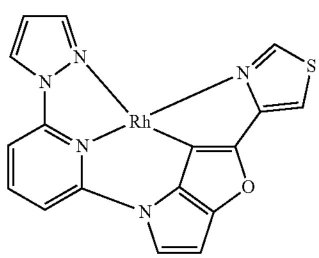
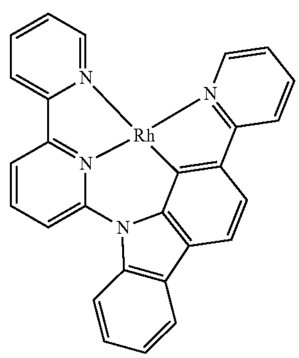
-continued
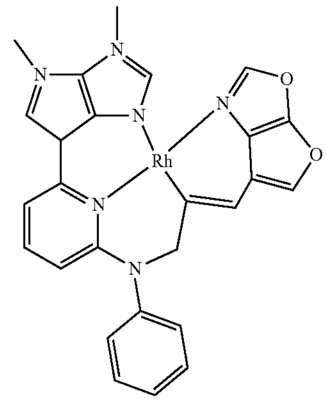
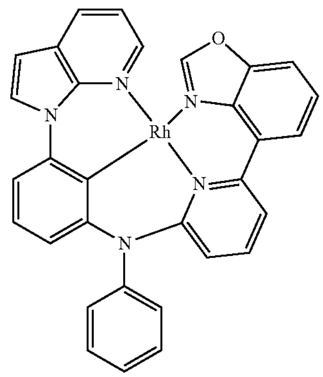
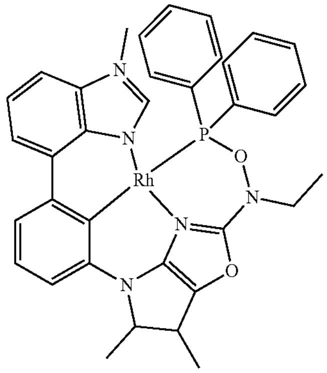
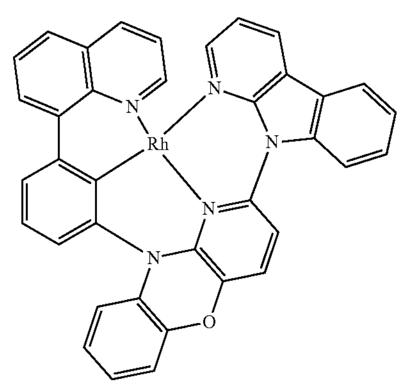

-continued
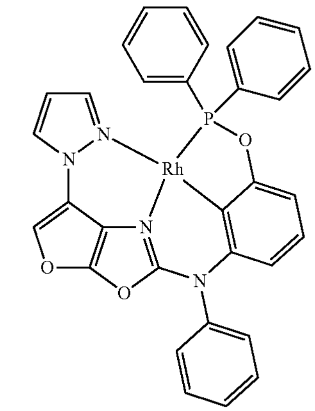
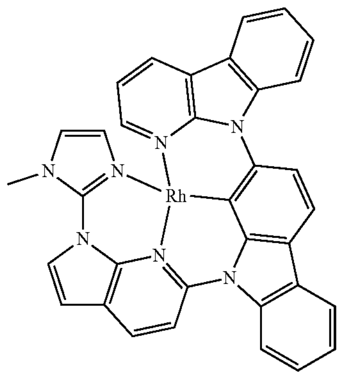
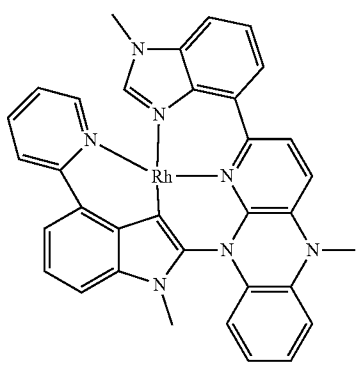
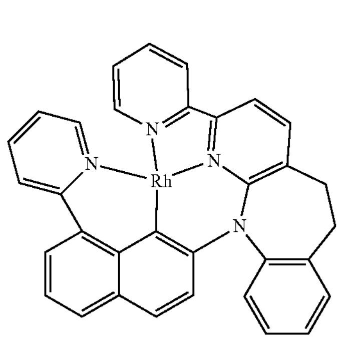
-continued
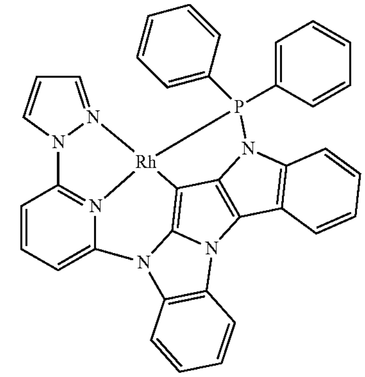
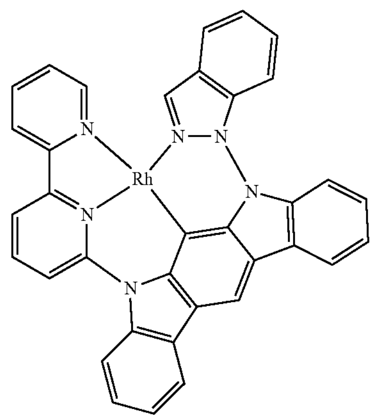
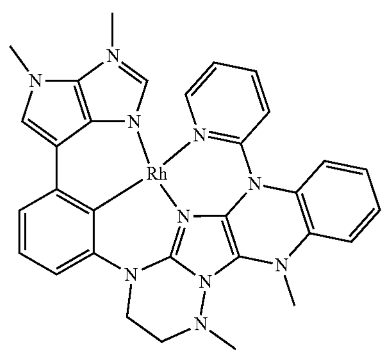
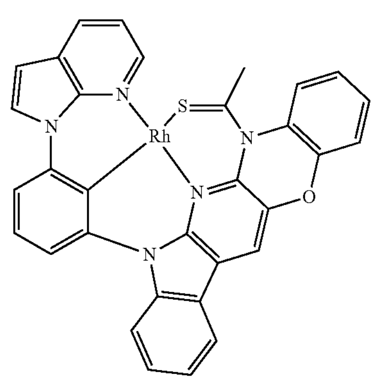

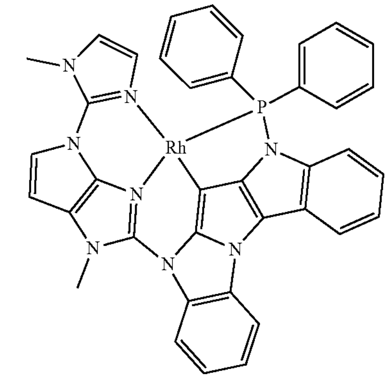
N
N
P
N
Rh
N
N
N
N
N
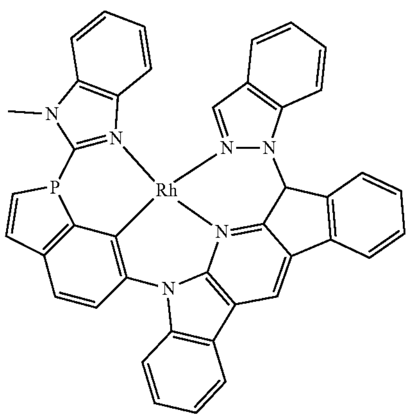
N
N
P
Rh
N
N
N
N
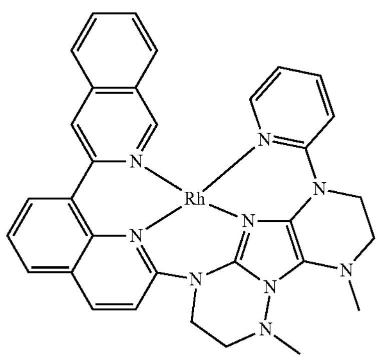
N
N
Rh
N
N
N
N
N
N
N
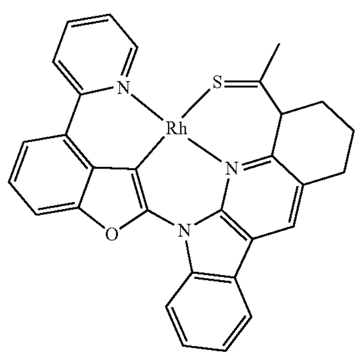
N
S
Rh
N
N
O
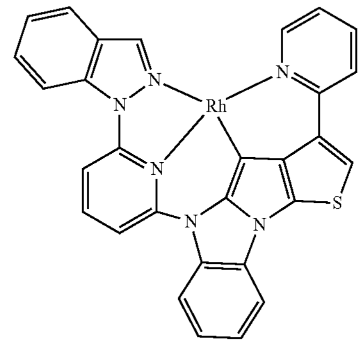
N
N
N
Rh
N
N
N
S
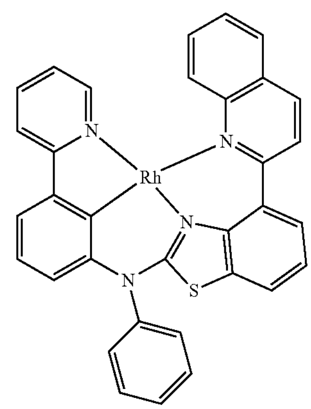
N
N
Rh
N
N
S
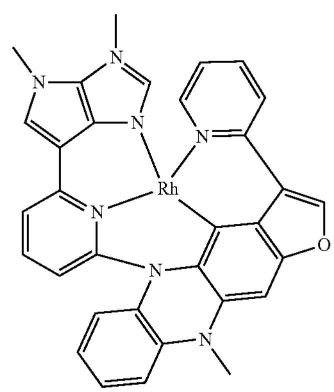
N
N
N
N
Rh
N
N
O
N
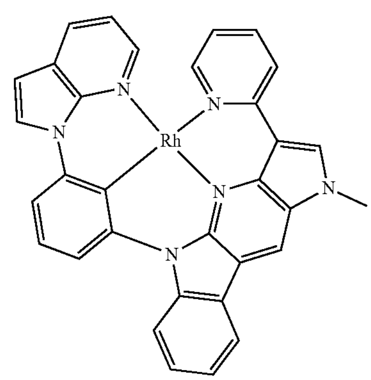
N
N
N
Rh
N
N
N -continued
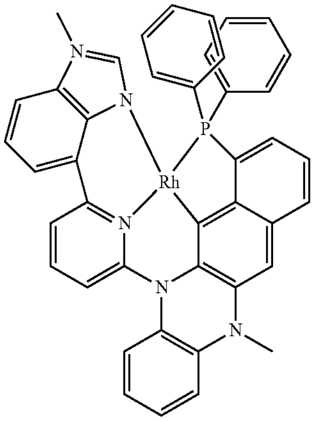
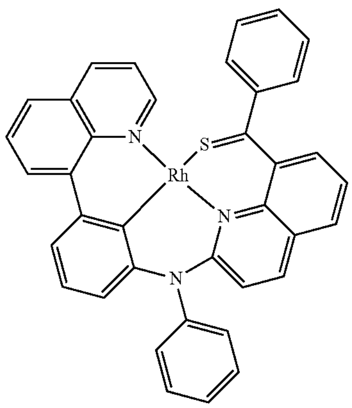
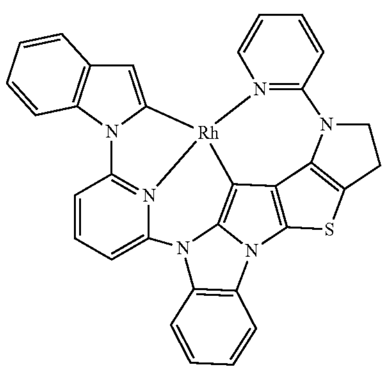
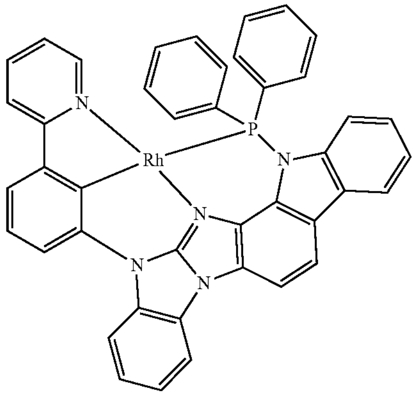
-continued
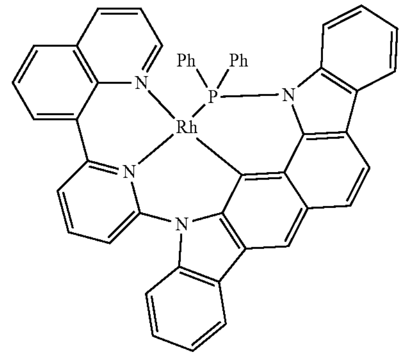
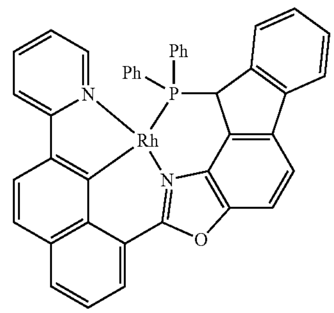
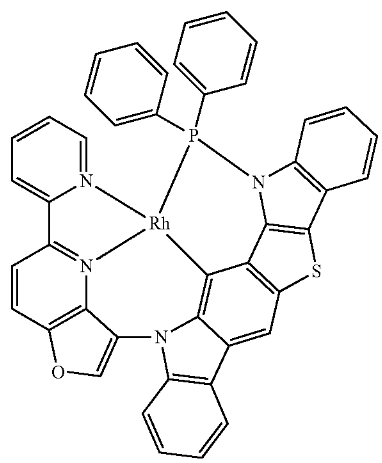
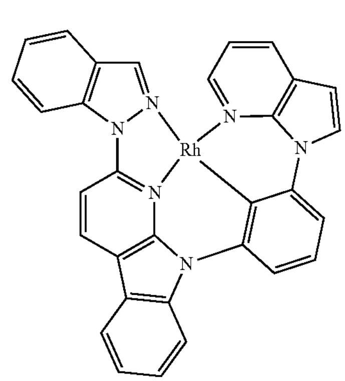

-continued
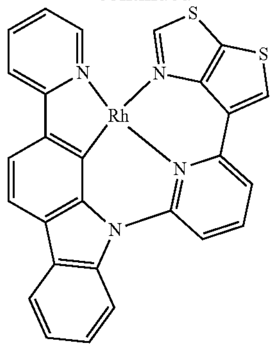
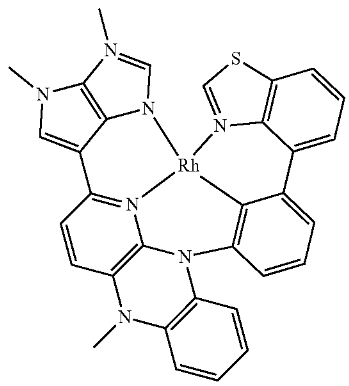
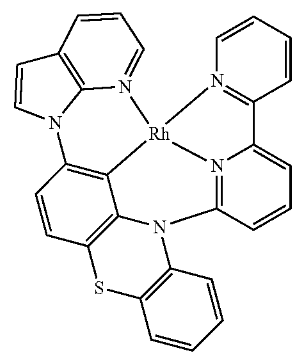
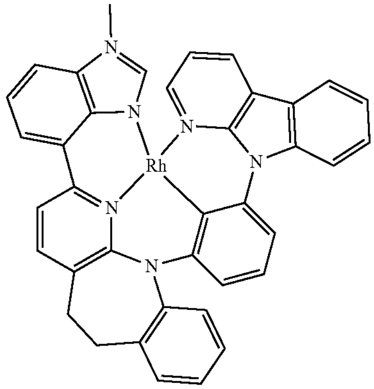
-continued
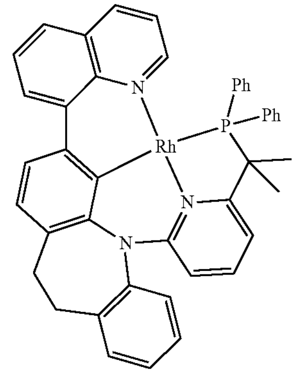
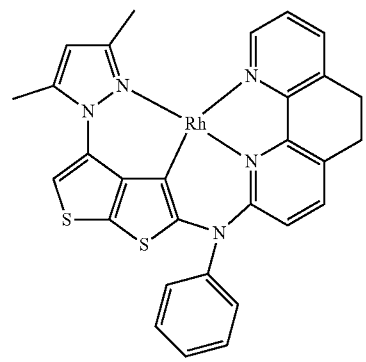
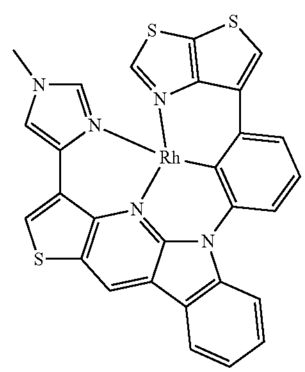
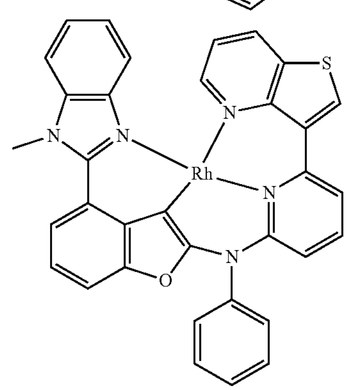

-continued
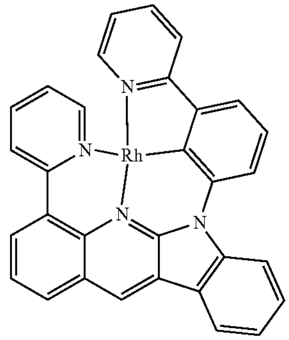
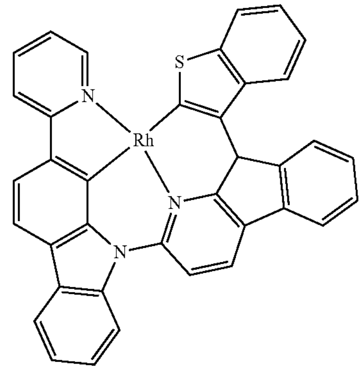
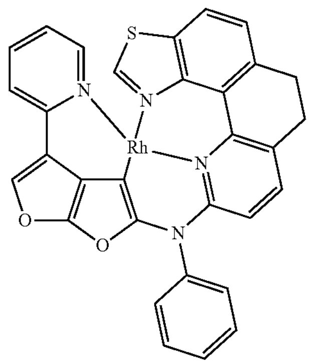
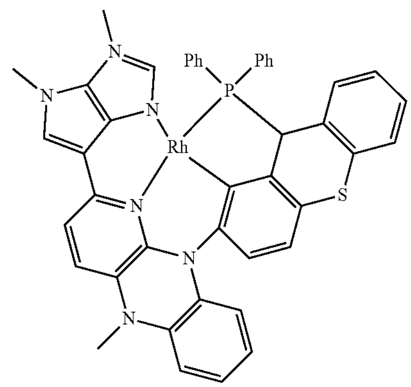
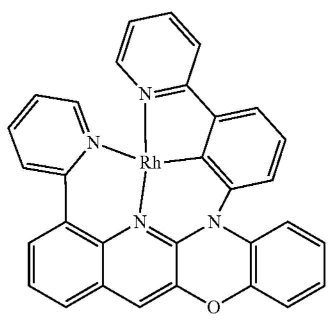
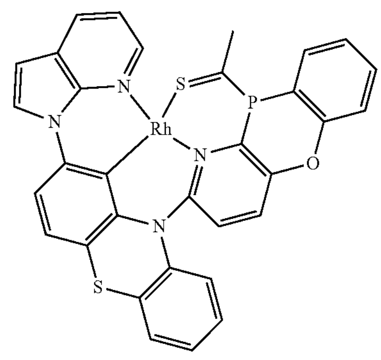
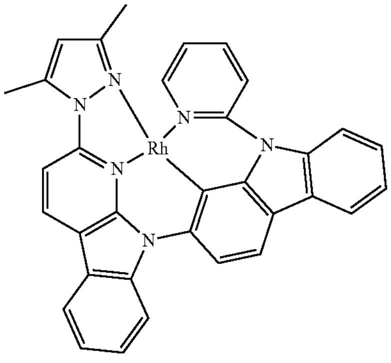
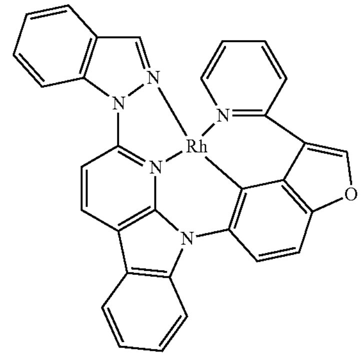

-continued
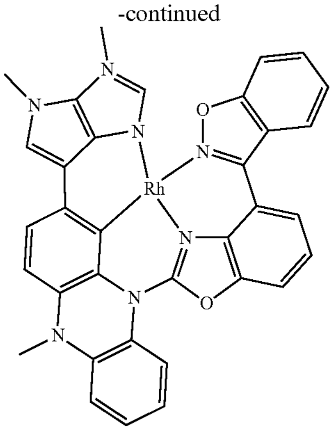
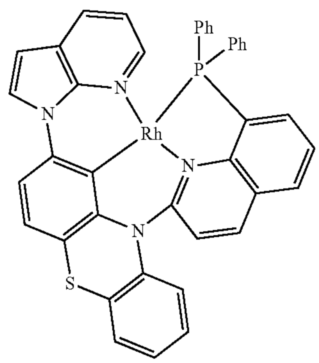
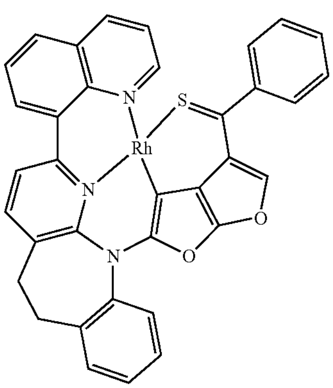
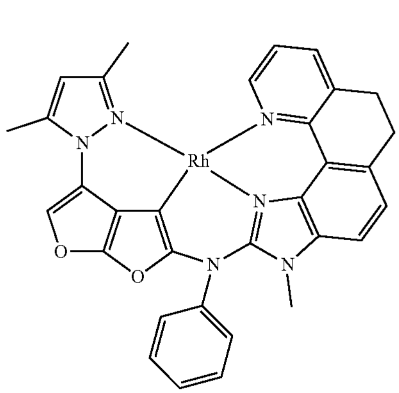
-continued
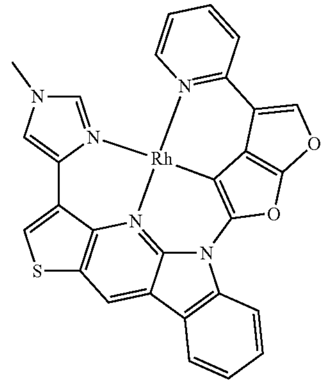
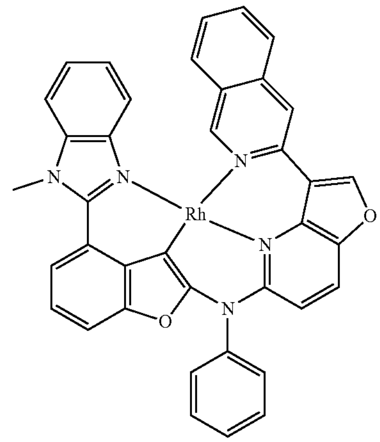
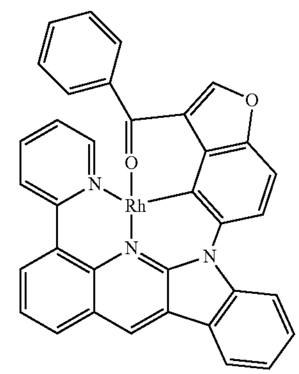
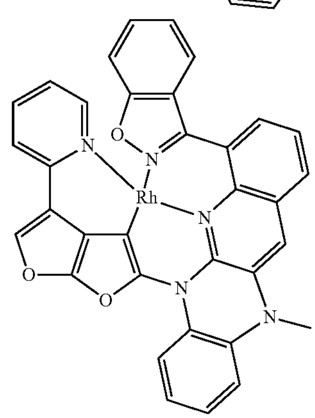

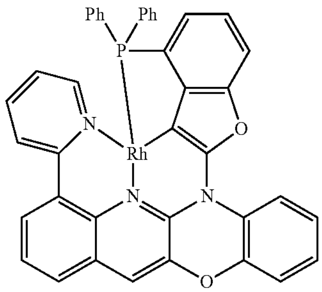
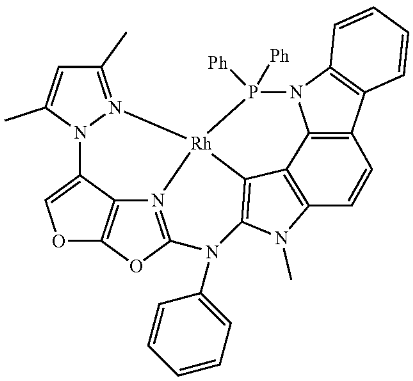
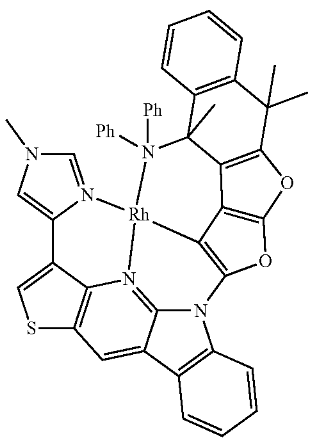
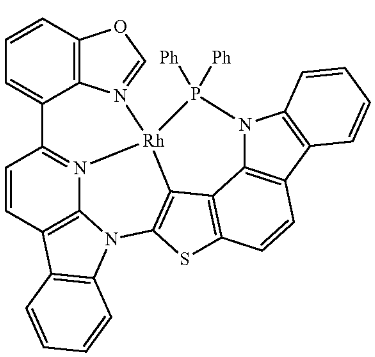
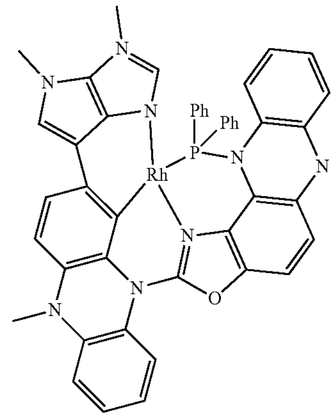
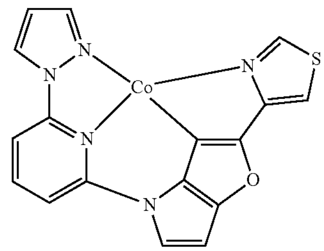
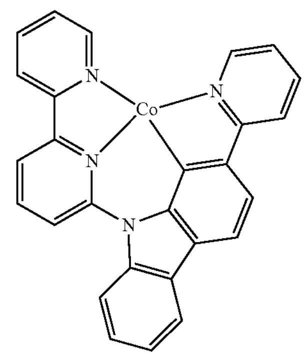
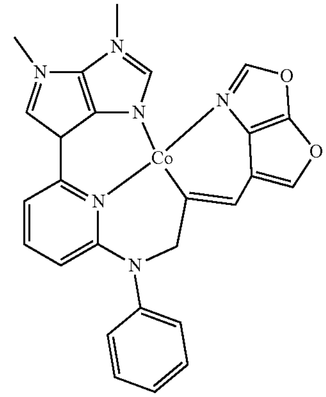

-continued
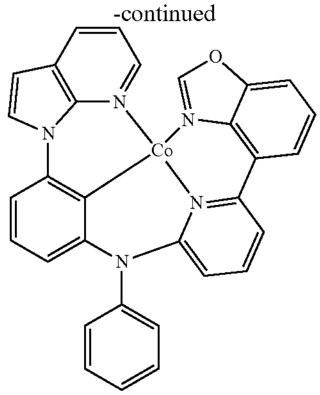
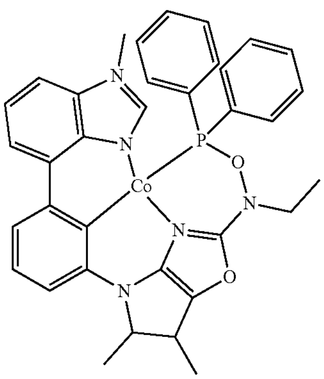
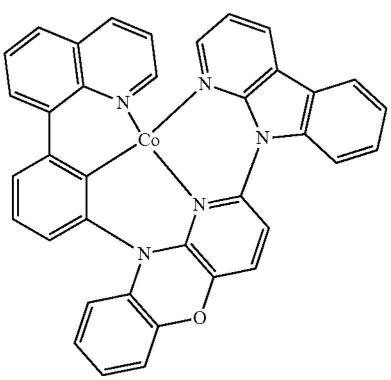
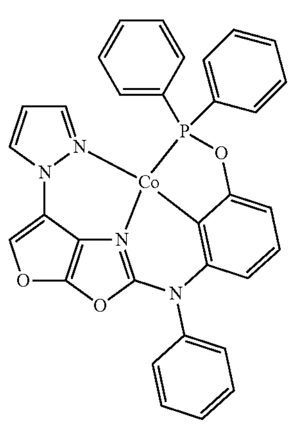
-continued
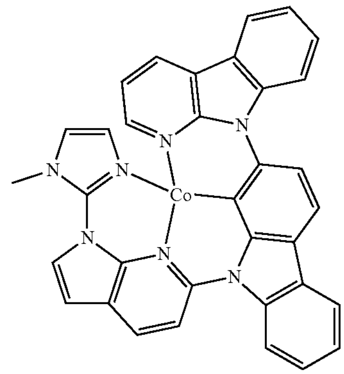
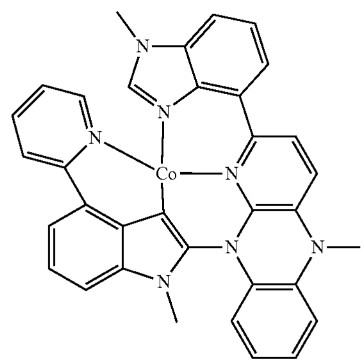
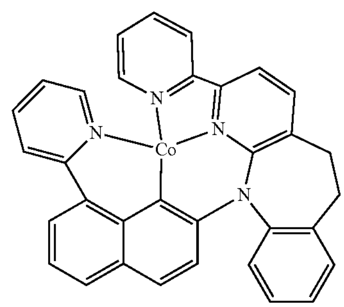
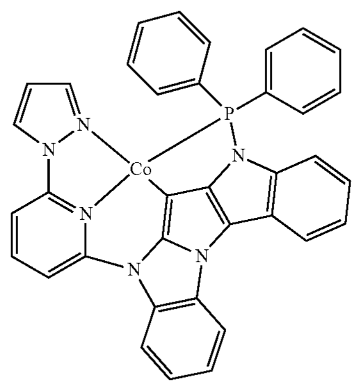

-continued
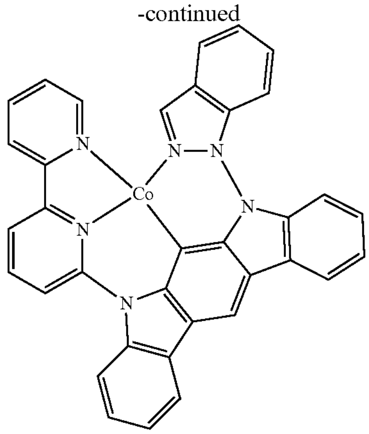
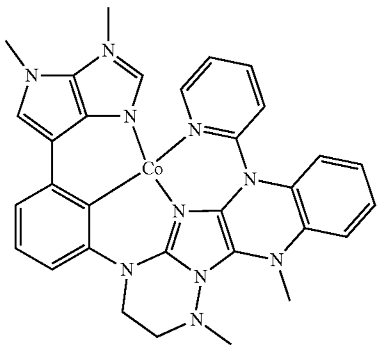
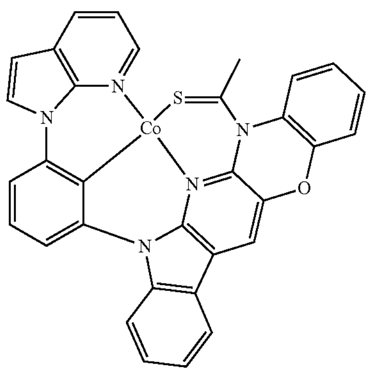
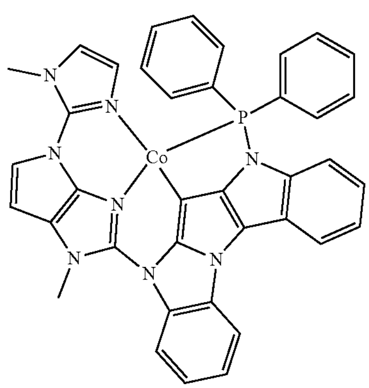
-continued
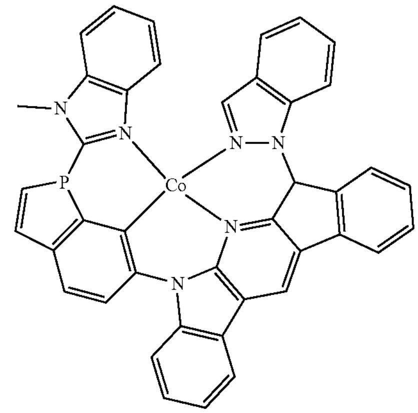
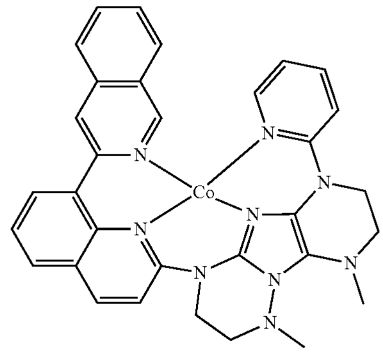
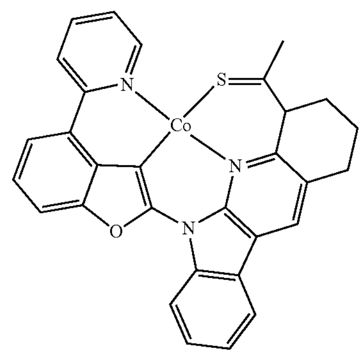
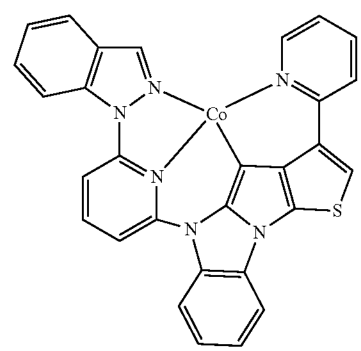

-continued
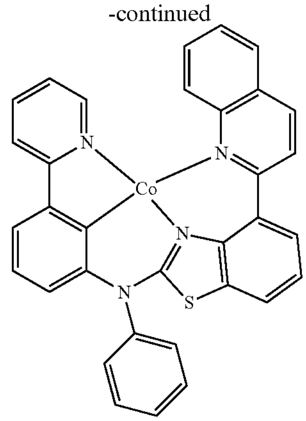
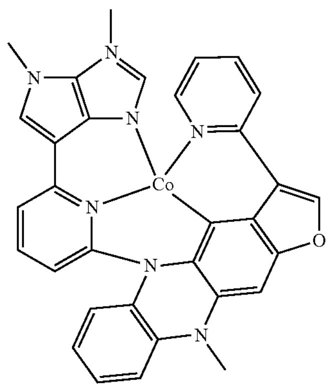
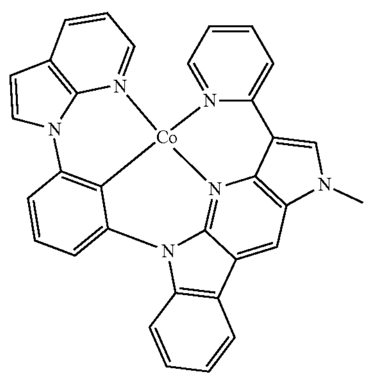
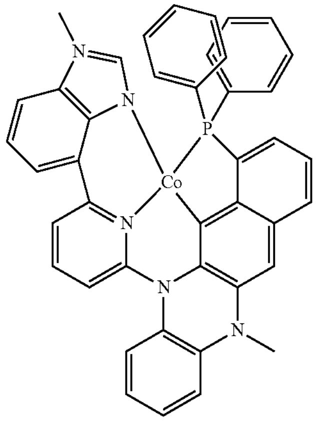
-continued
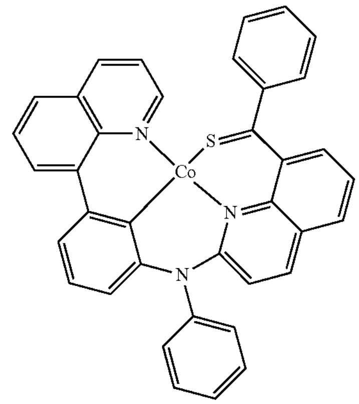
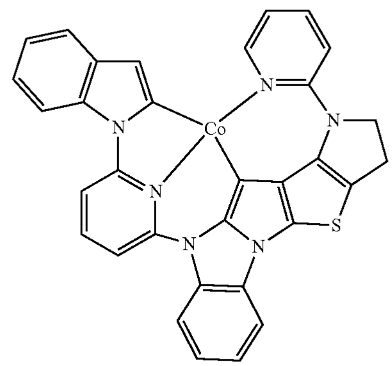
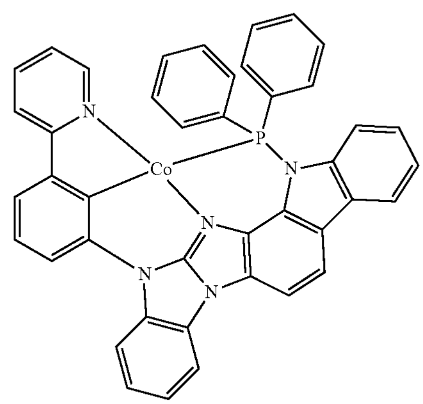
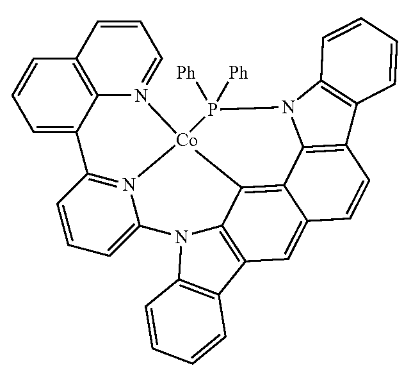

-continued
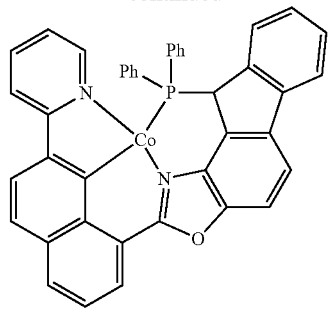
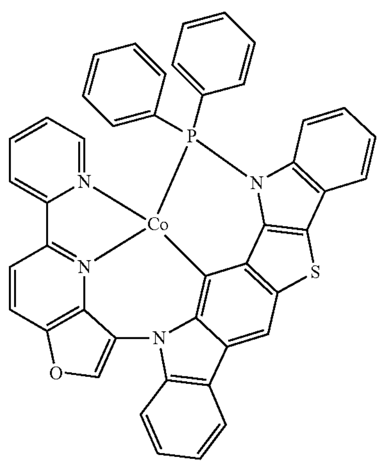
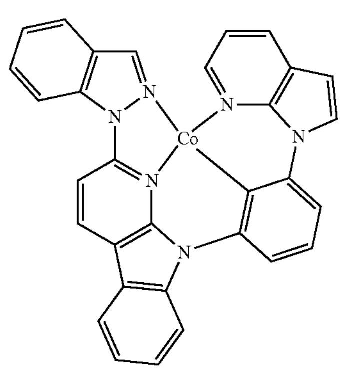
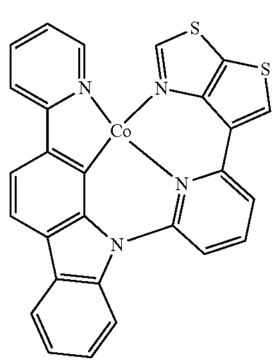
-continued
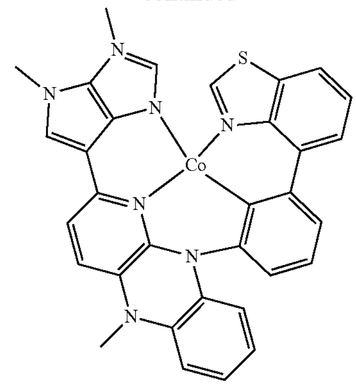
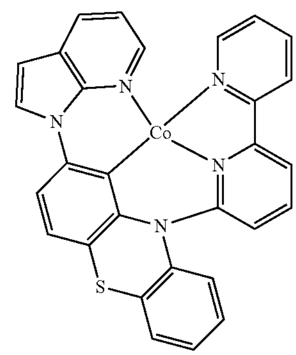
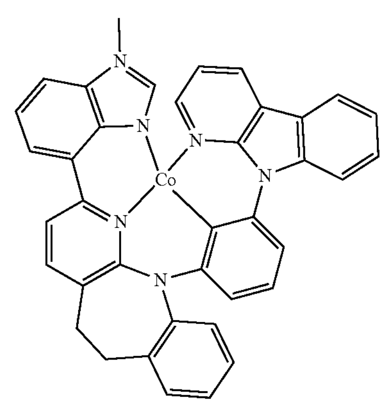
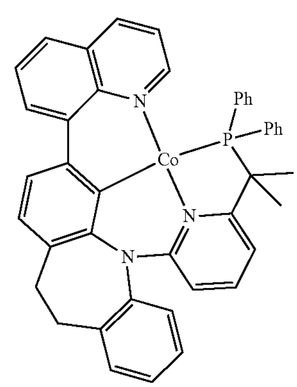

-continued
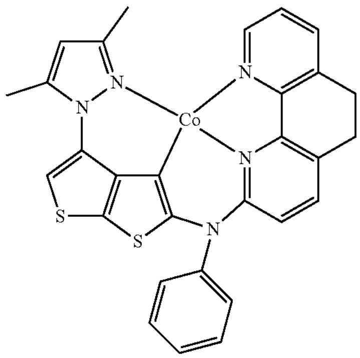
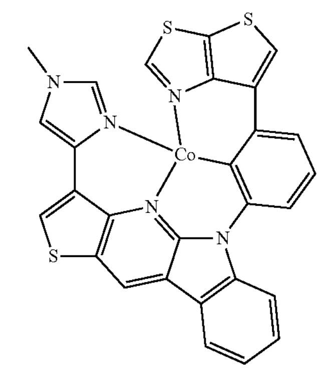
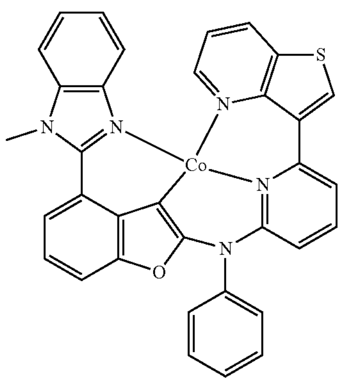
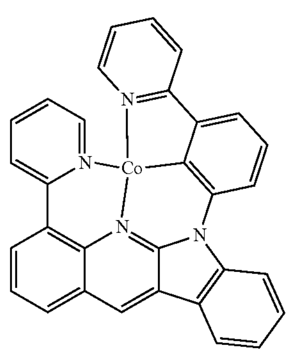
-continued
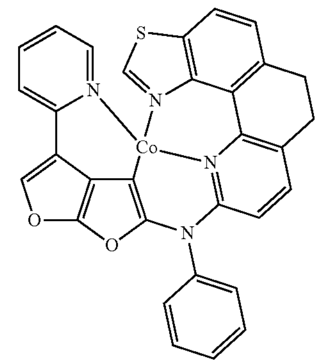
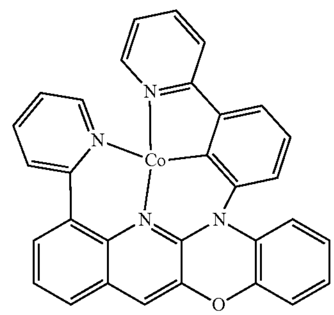
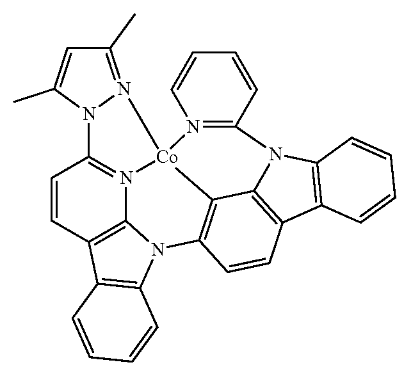
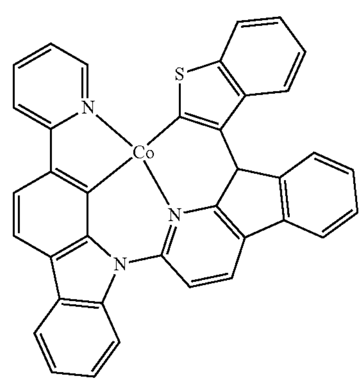

-continued
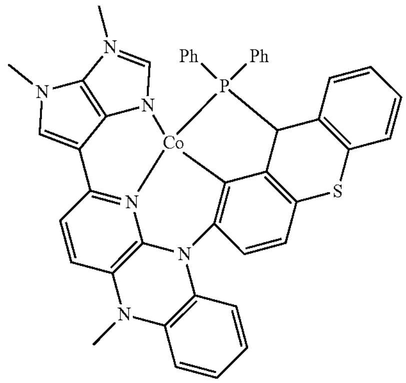
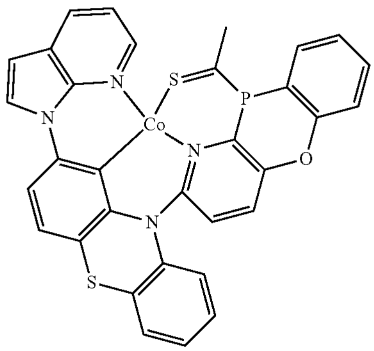
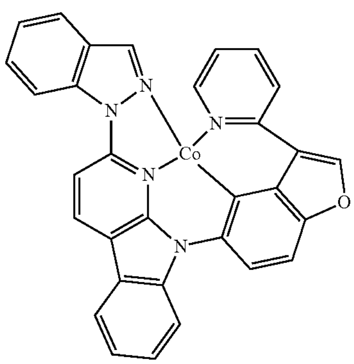
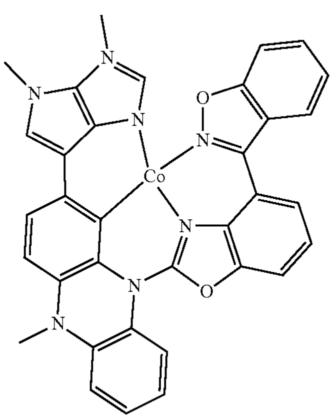
-continued
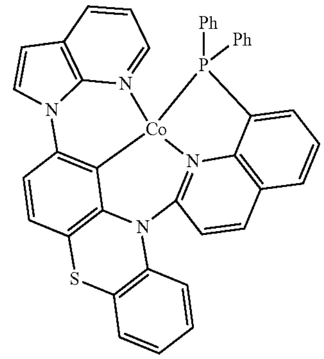
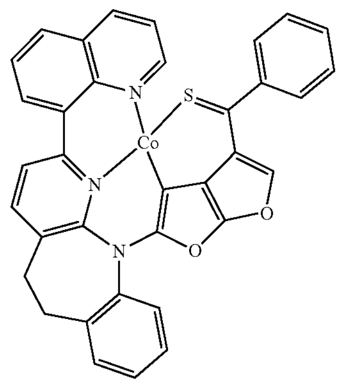
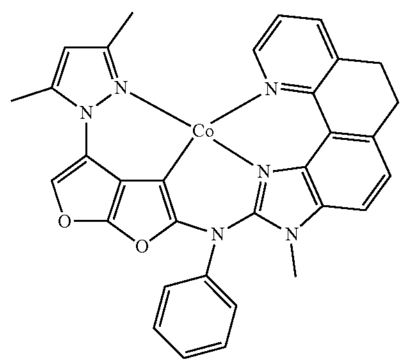
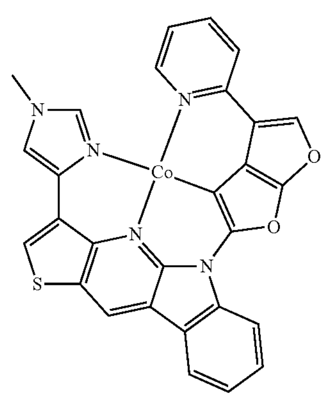

-continued
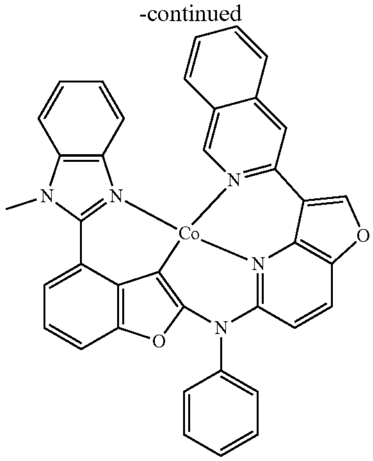
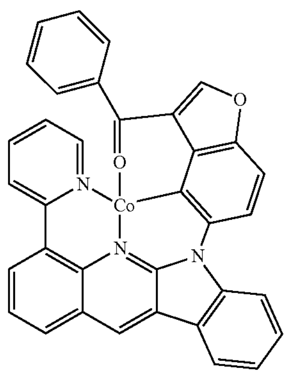
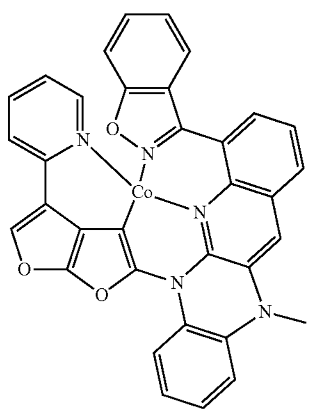
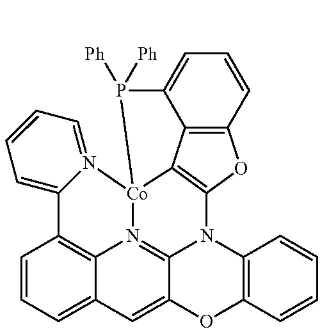
-continued
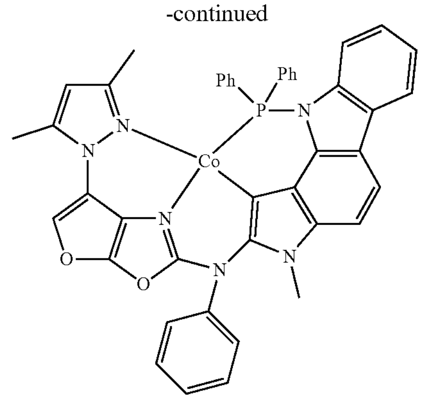
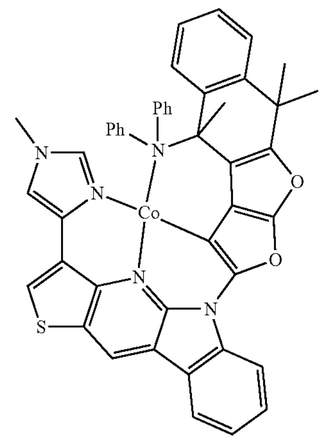
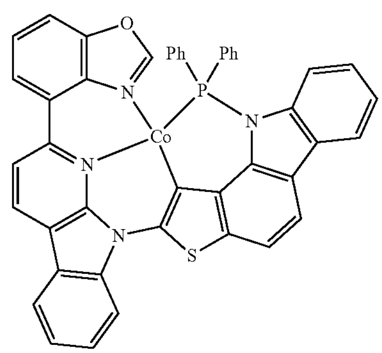
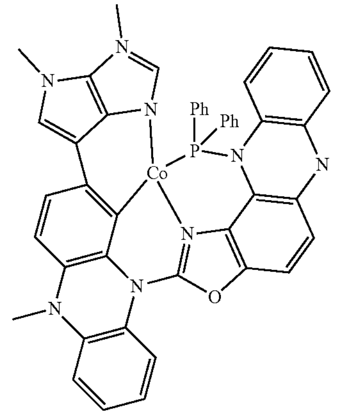

-continued
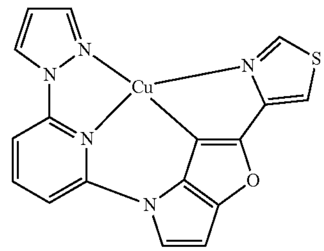
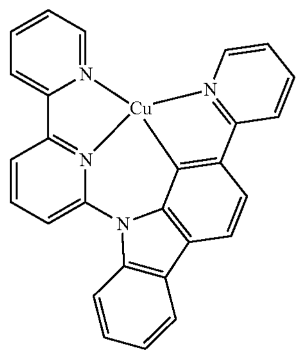
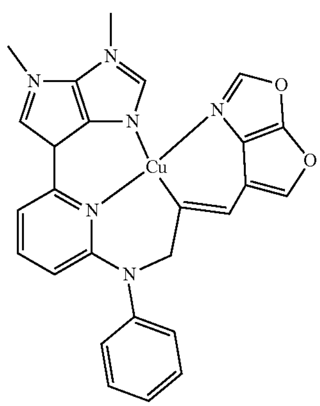
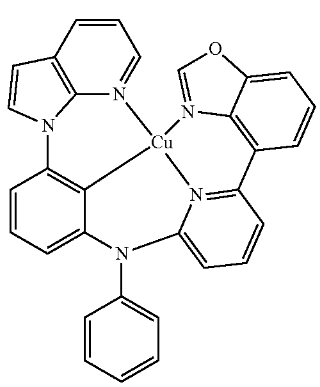
-continued
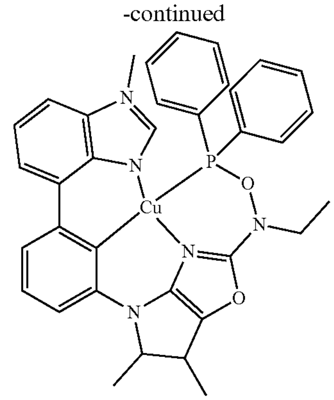
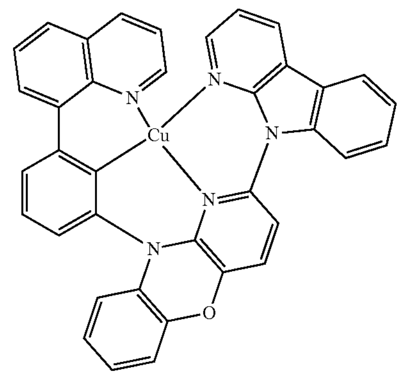
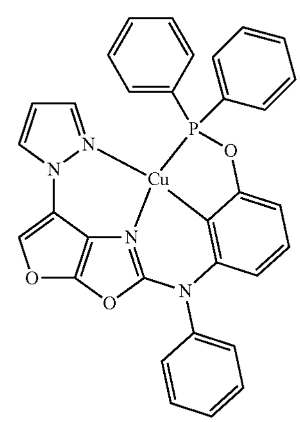
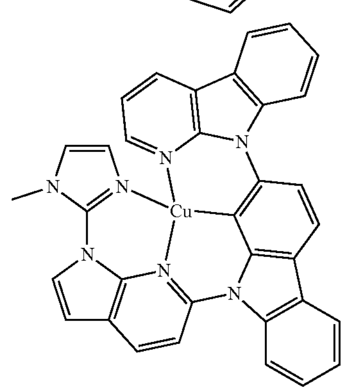

-continued
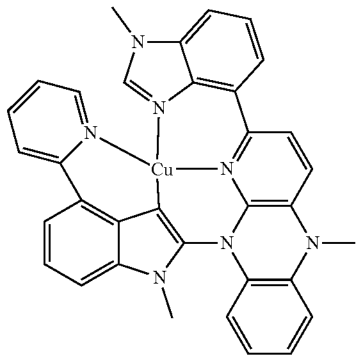
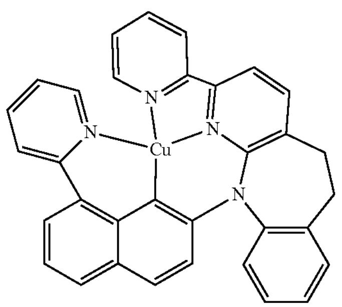
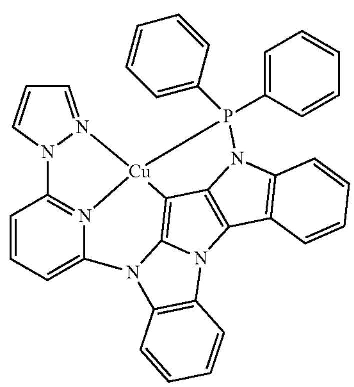
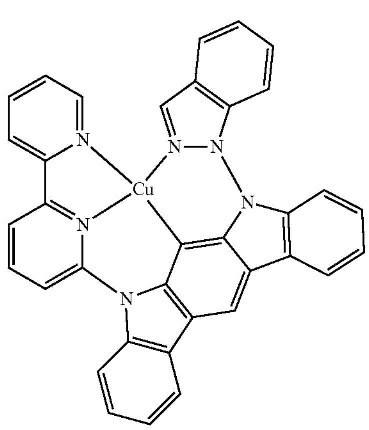
-continued
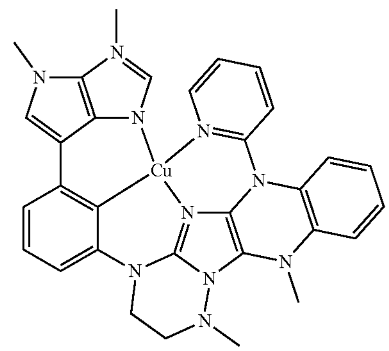
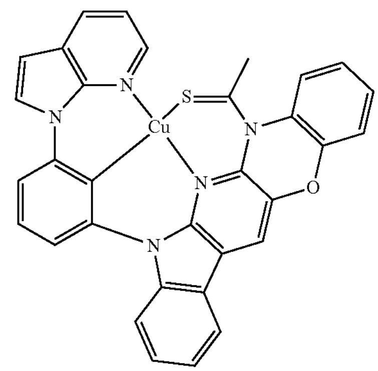
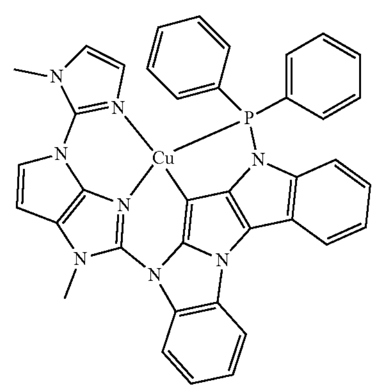
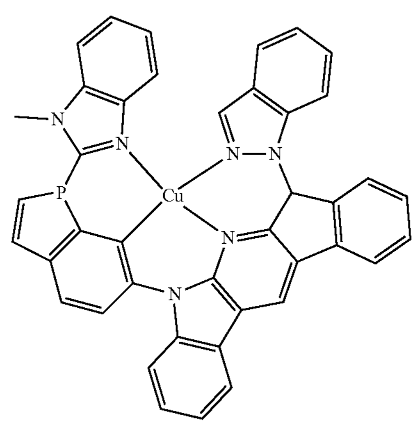

-continued
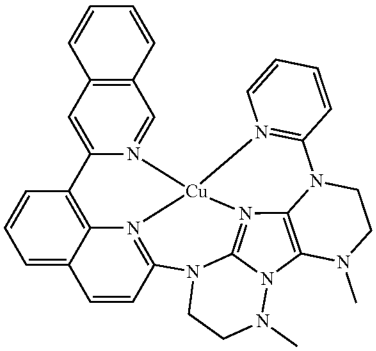
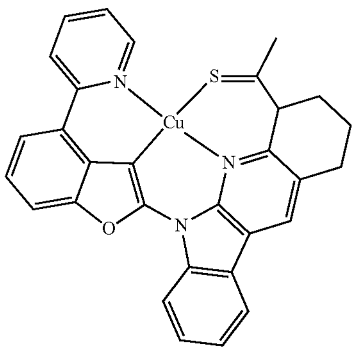
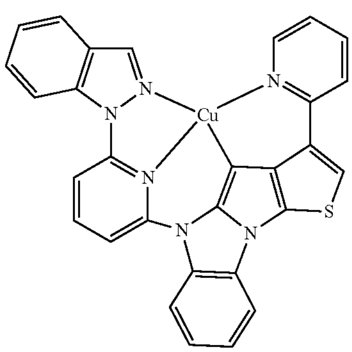
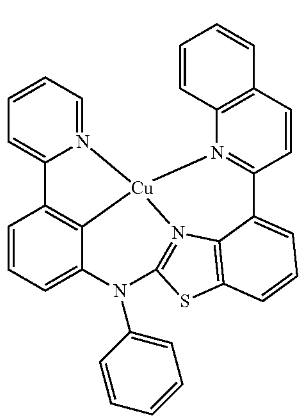
-continued
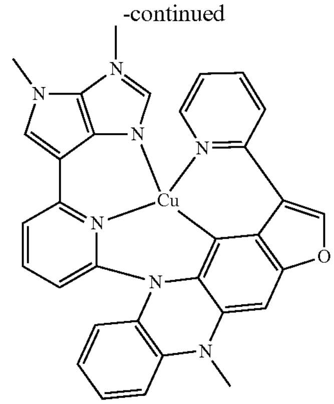
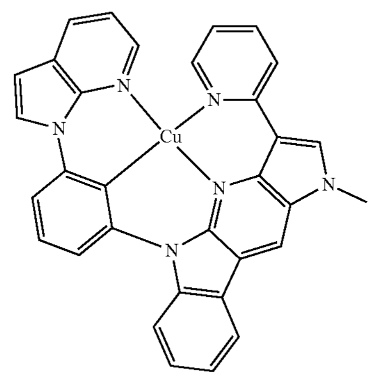
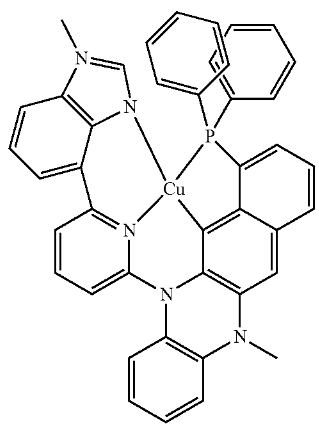
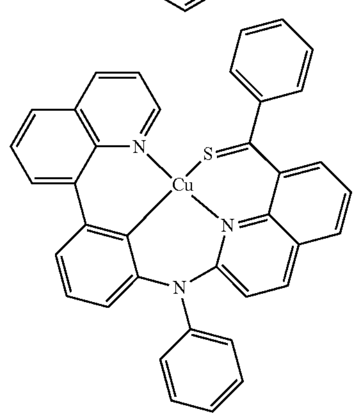

-continued
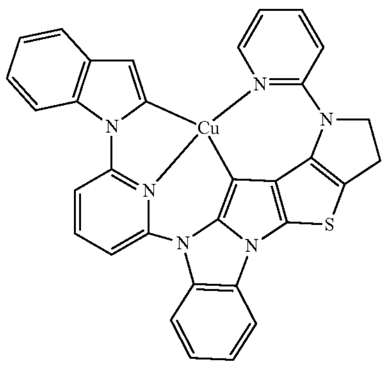
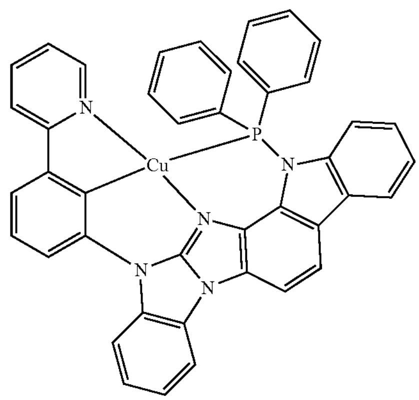
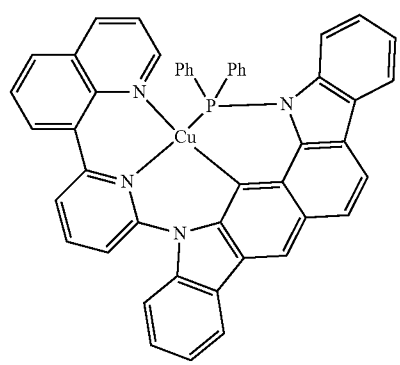
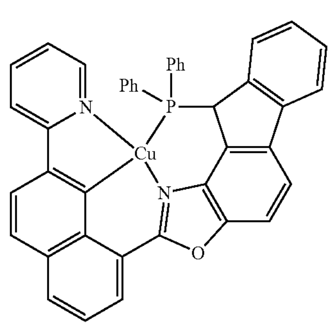
-continued
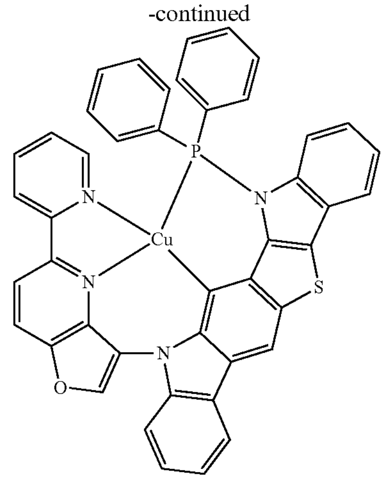
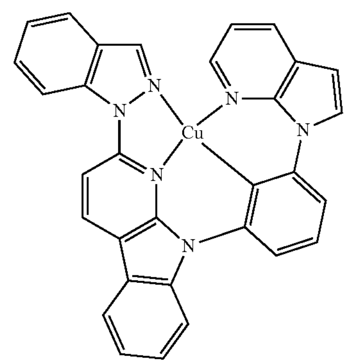
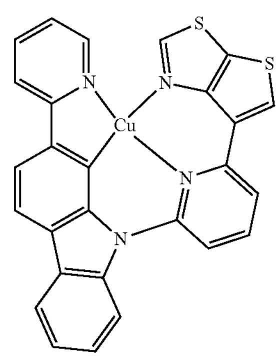
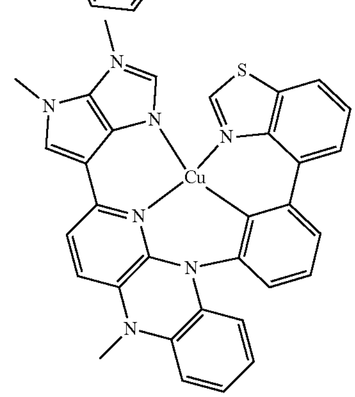

-continued
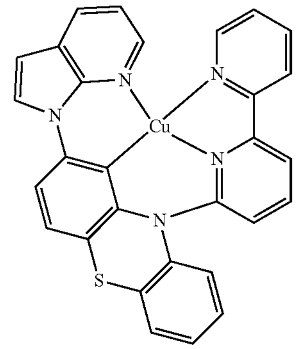
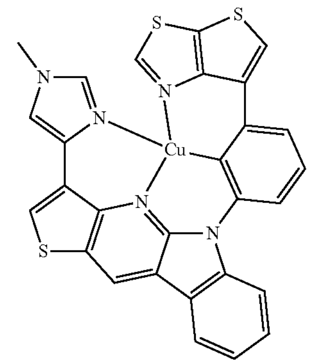
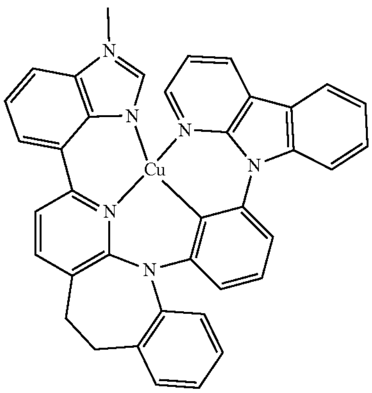
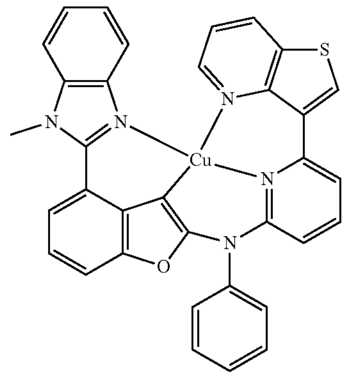
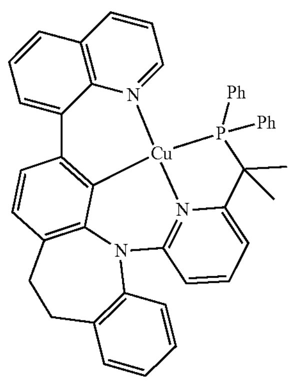
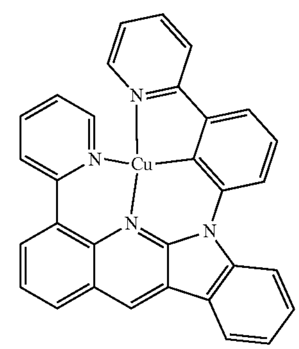
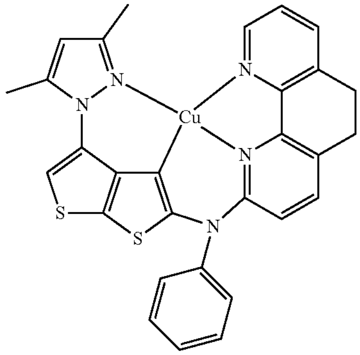
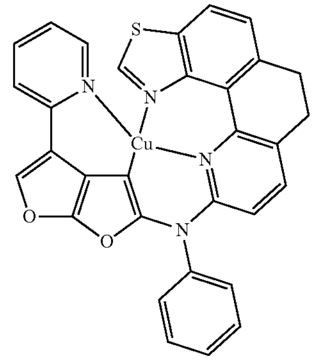

-continued
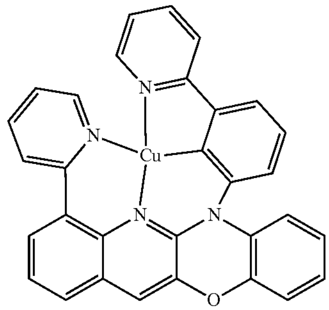
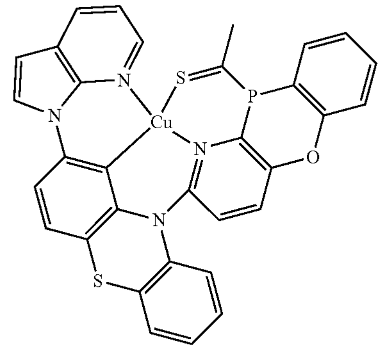
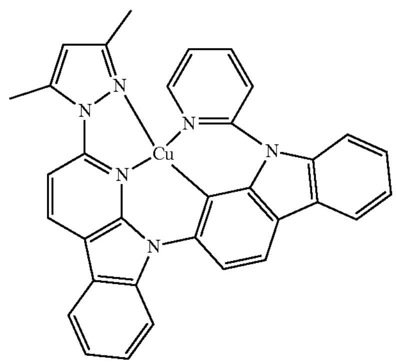
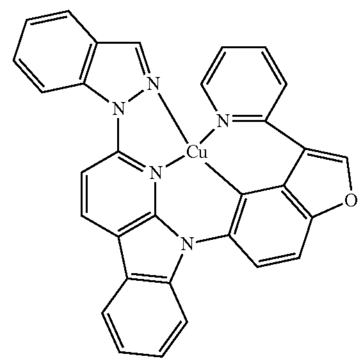
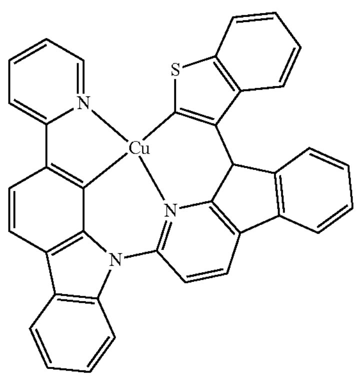
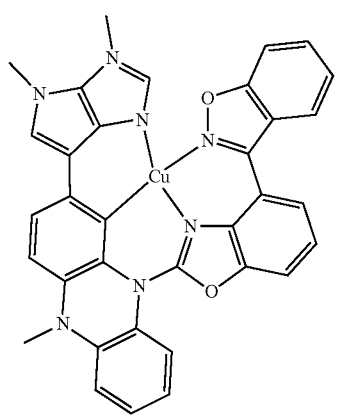
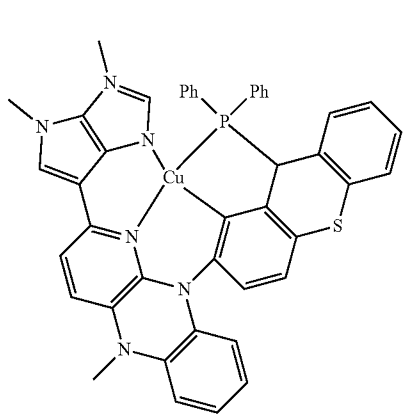
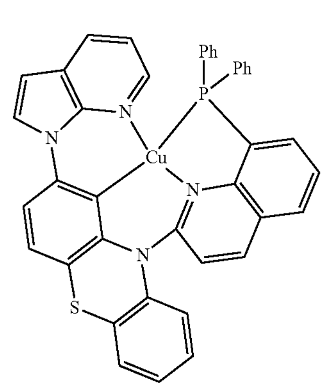

-continued
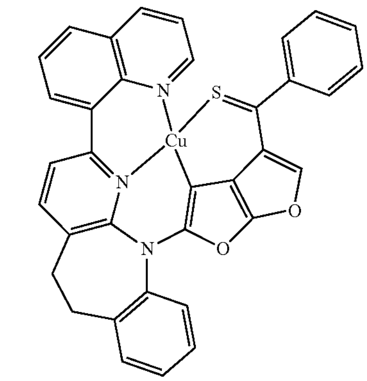
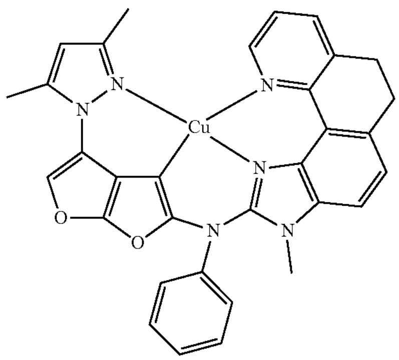
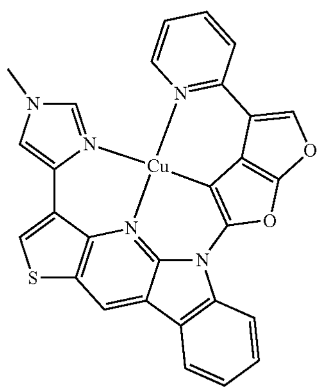
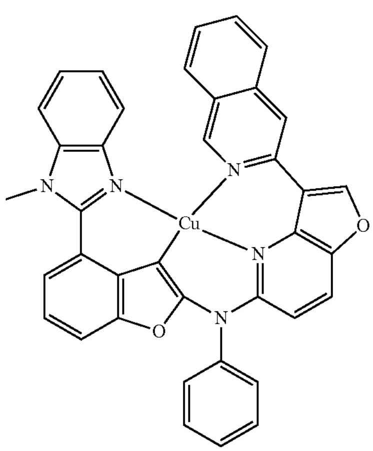
-continued
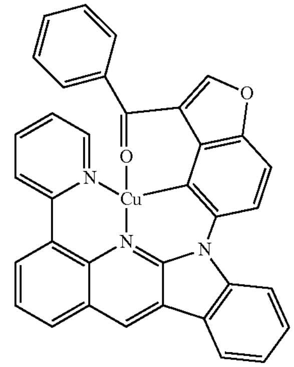
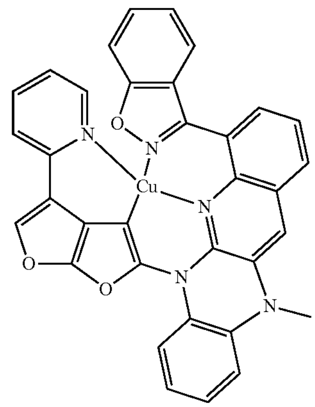
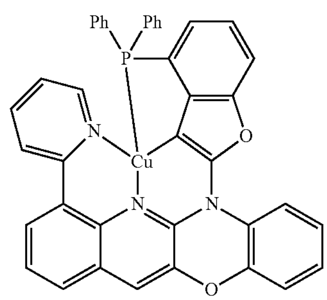
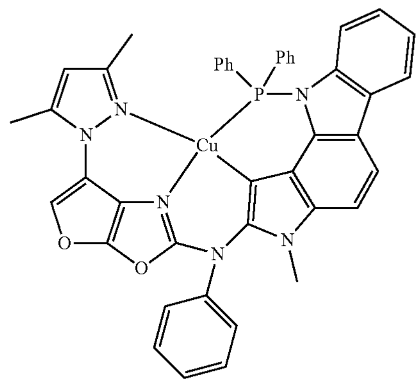

-continued
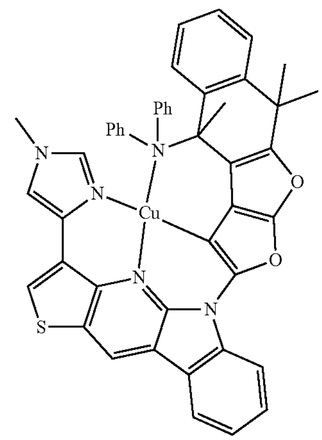
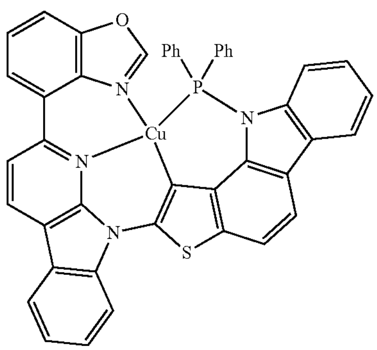
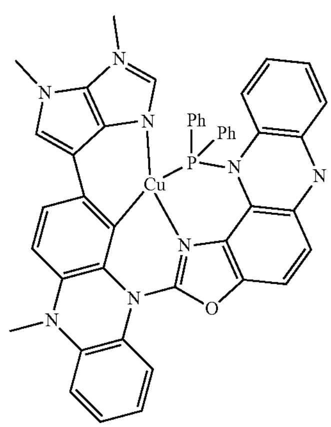
In various aspects, such an inventive complex can comprise any one or more of the following:
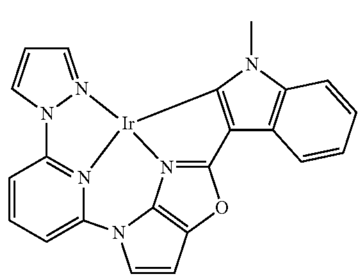
-continued
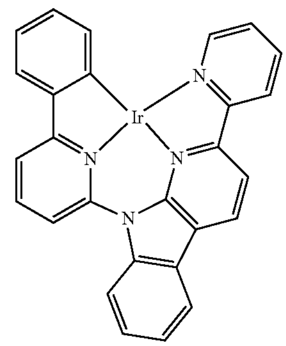
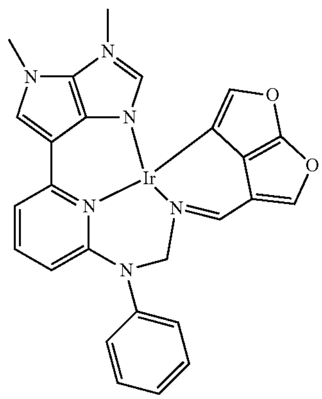
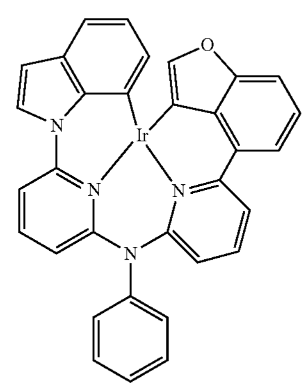
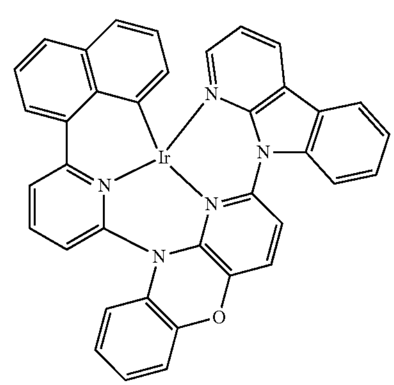

-continued
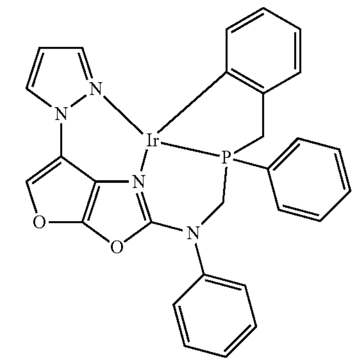
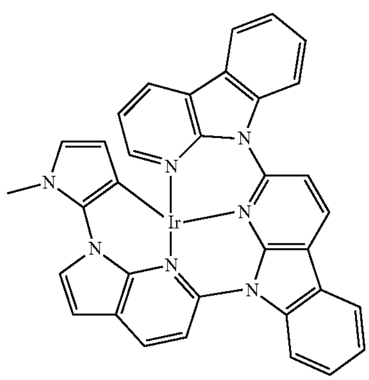
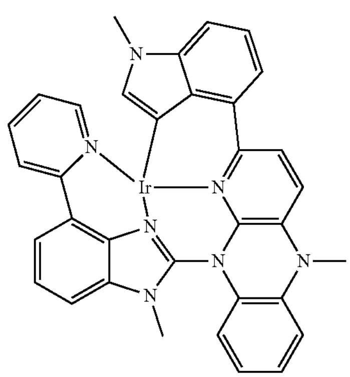
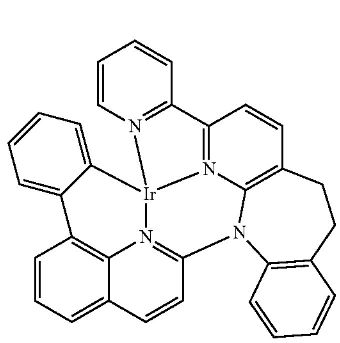
-continued
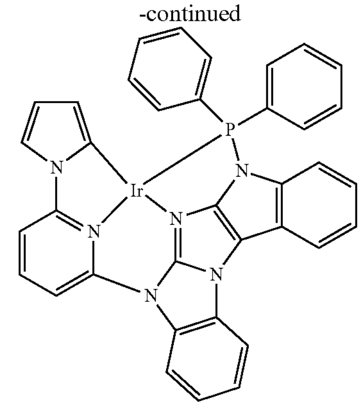
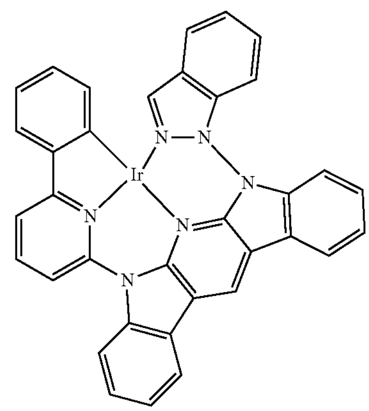
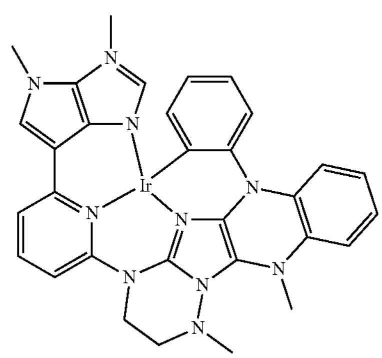
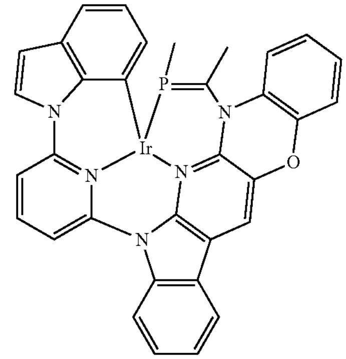

-continued
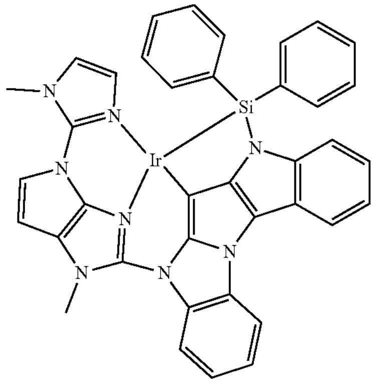
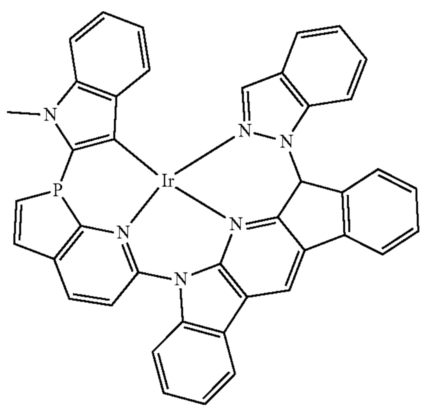
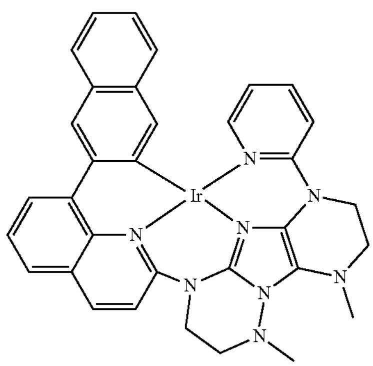
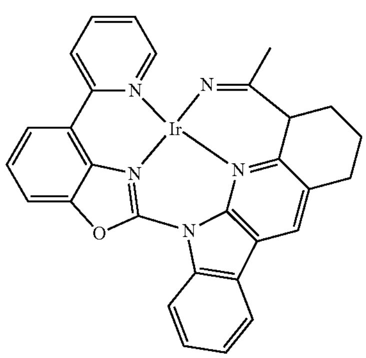
-continued
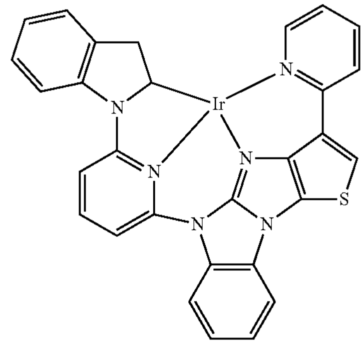
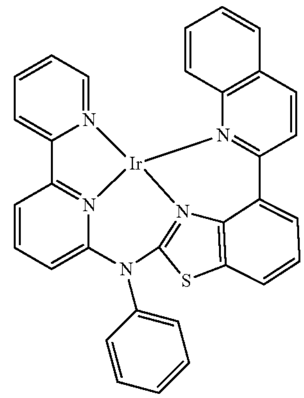
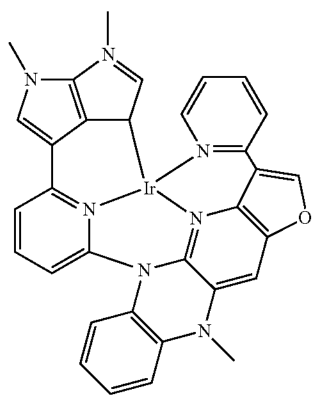
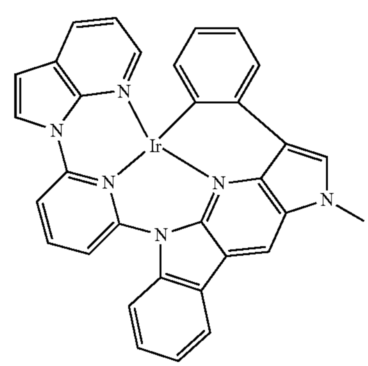

-continued
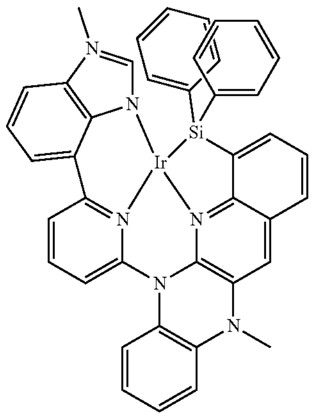
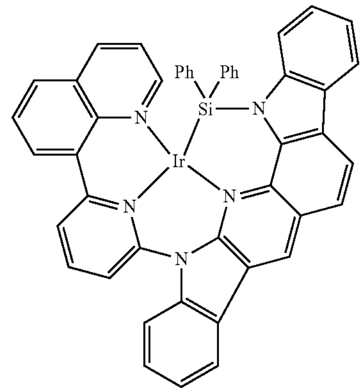
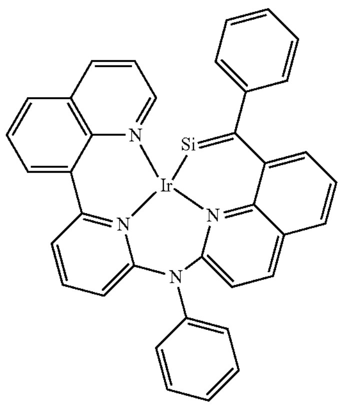
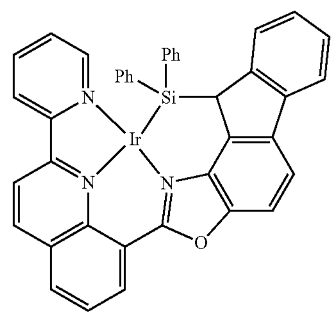
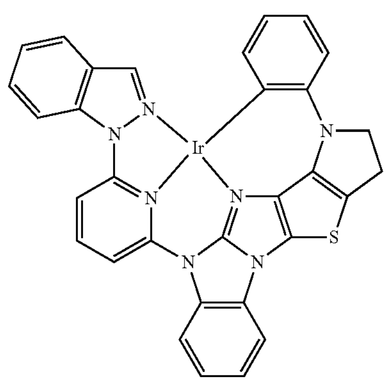
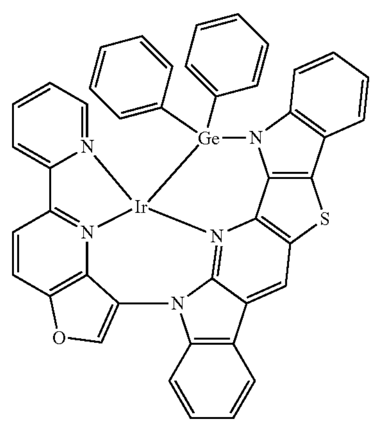
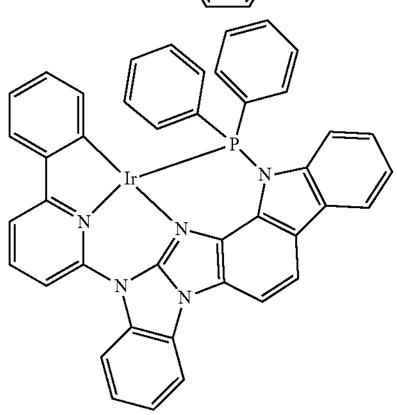
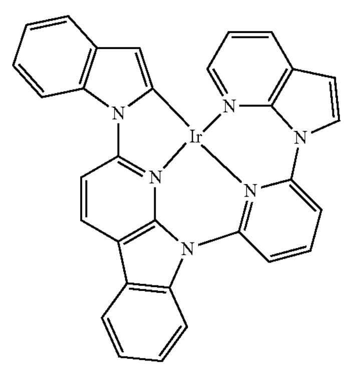

-continued
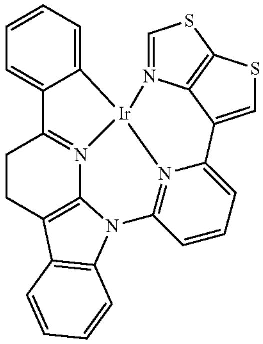
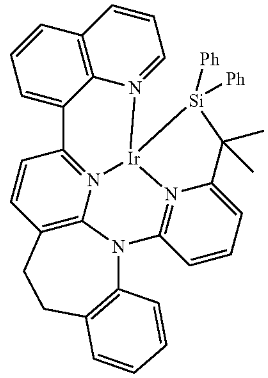
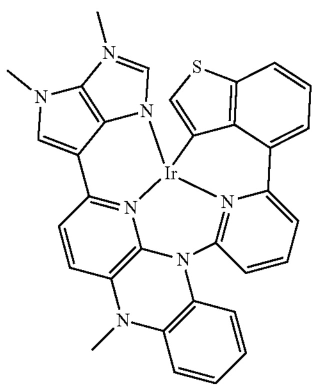
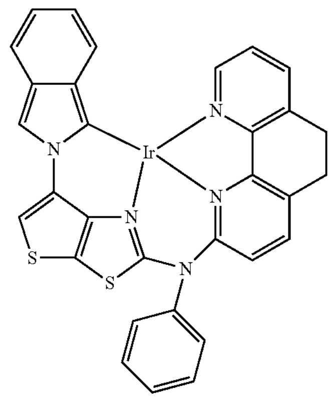
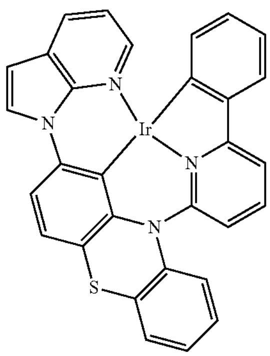
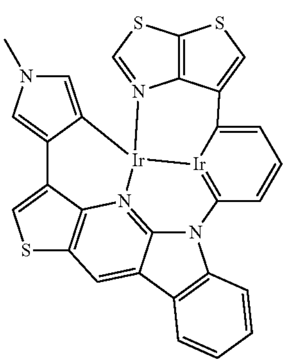
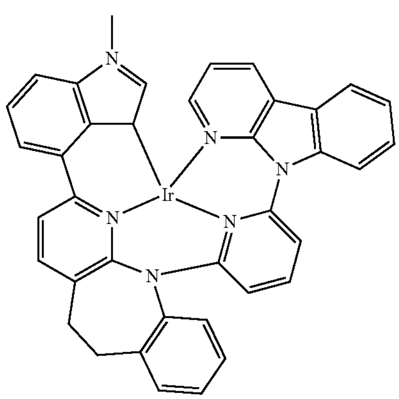
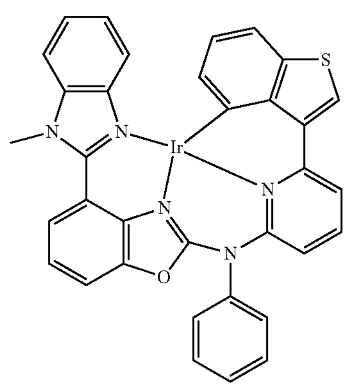

-continued
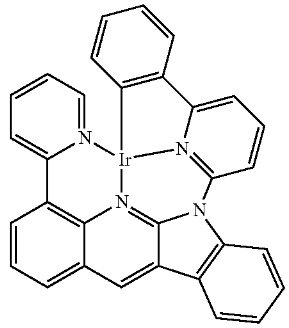
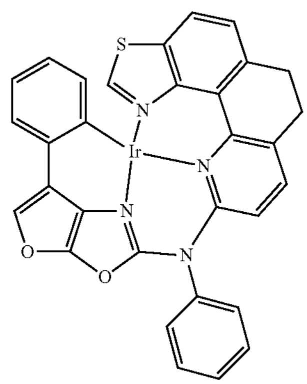
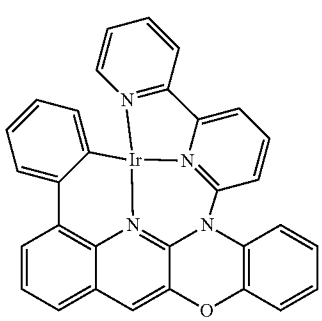
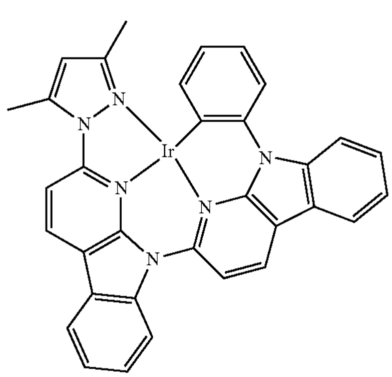
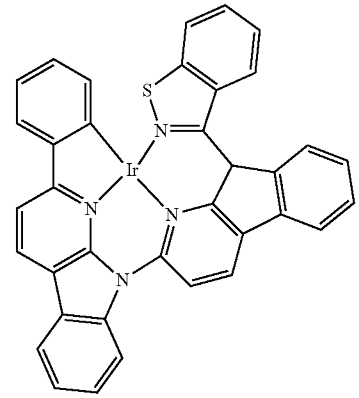
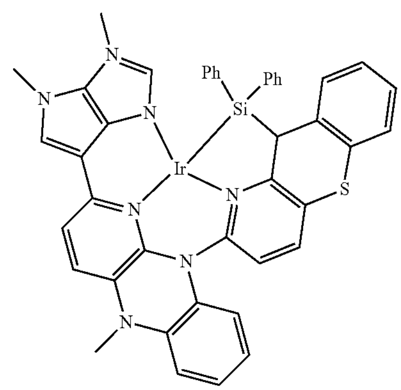
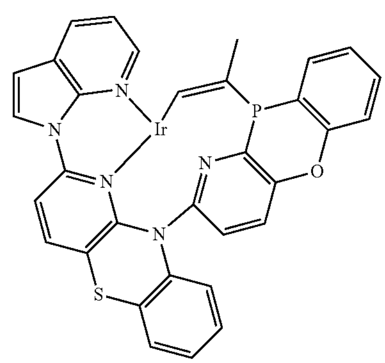
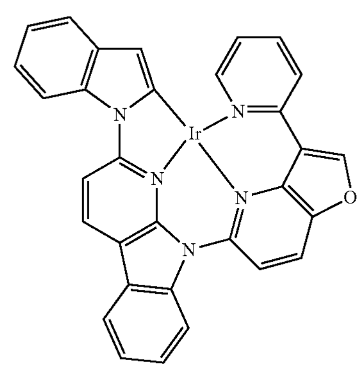

-continued
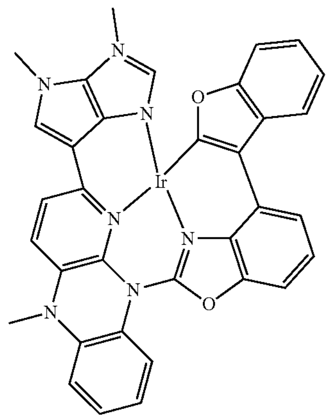
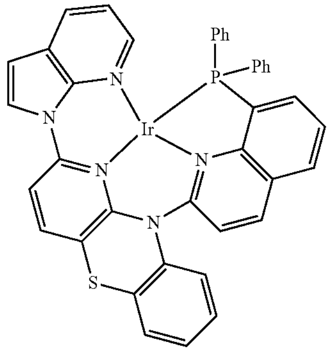
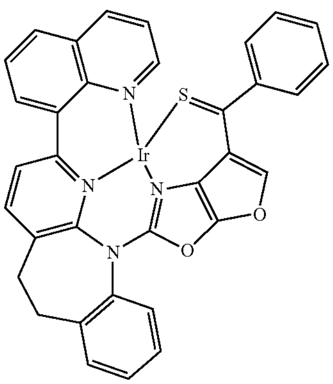
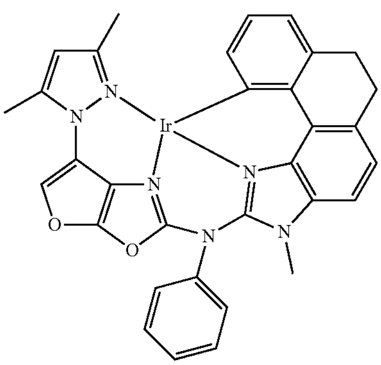
-continued
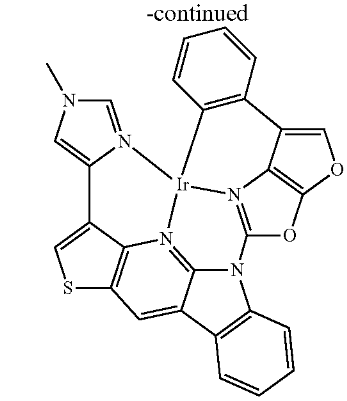
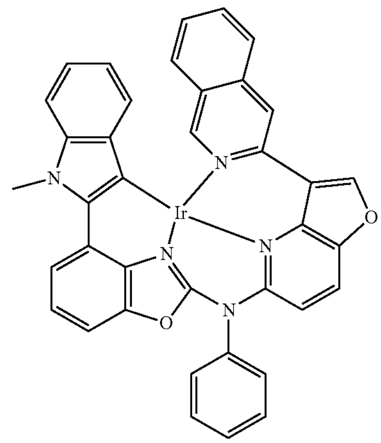
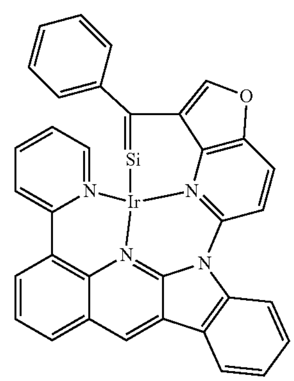
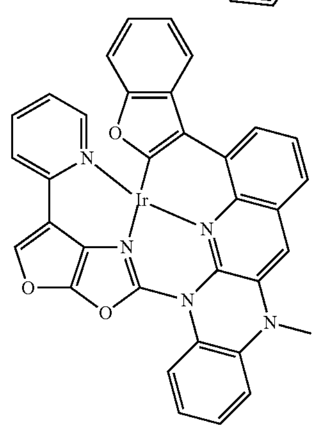

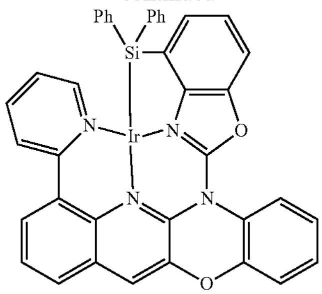
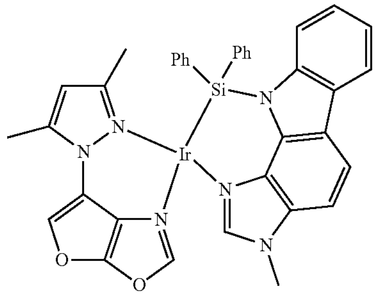
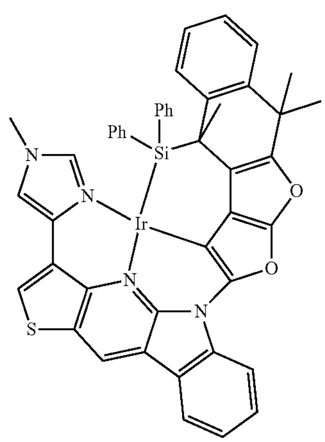
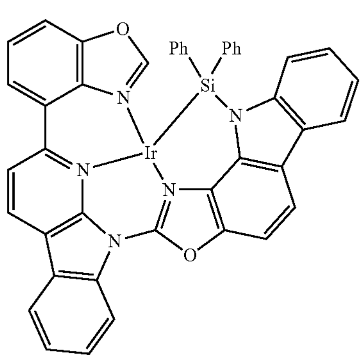
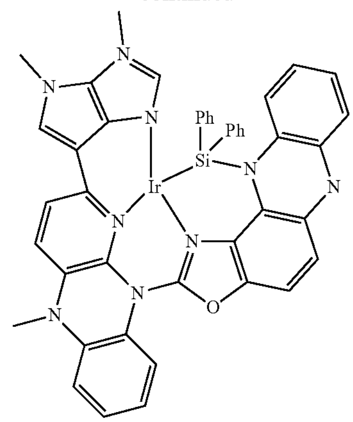
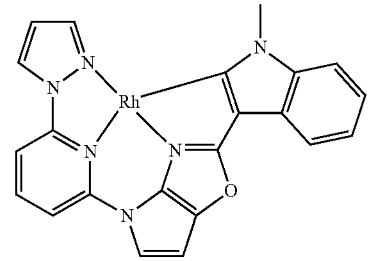
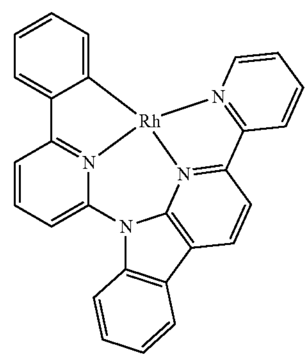
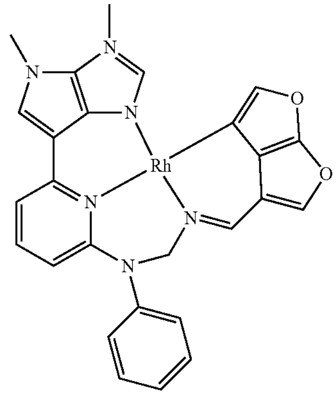

-continued
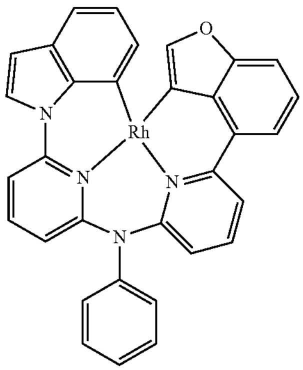
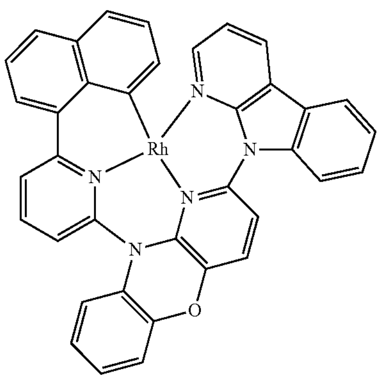
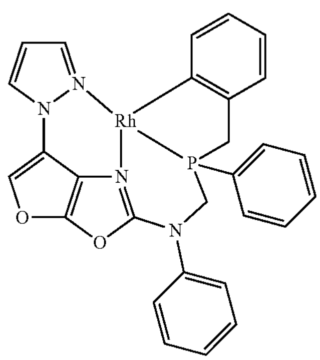
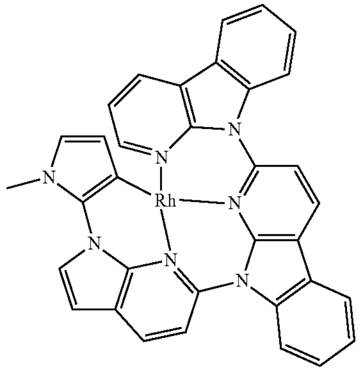
-continued
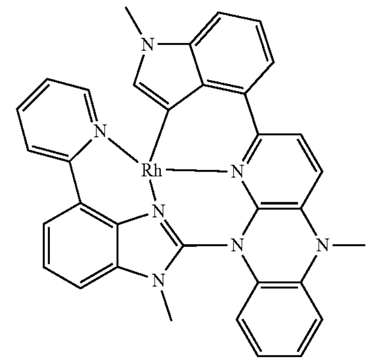
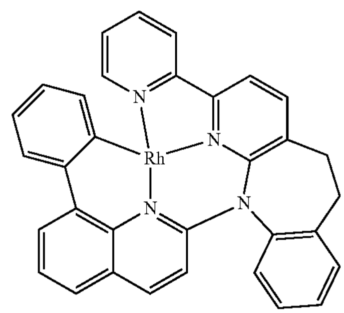
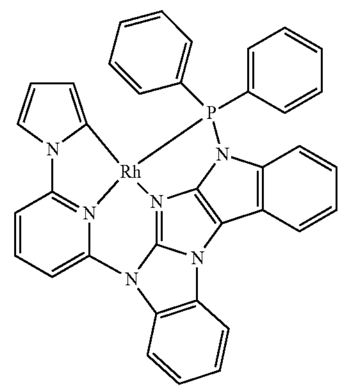
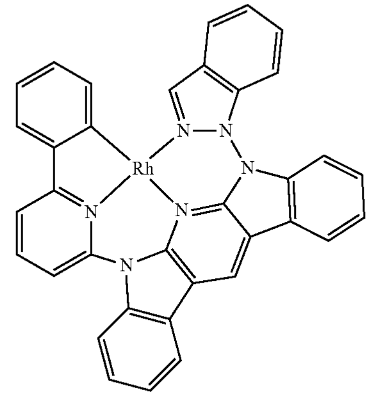

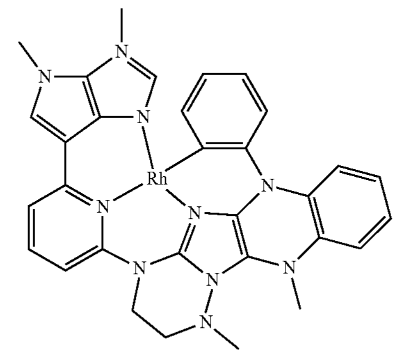
N
N
N
N
Rh
N
N
N
N
N
N
N
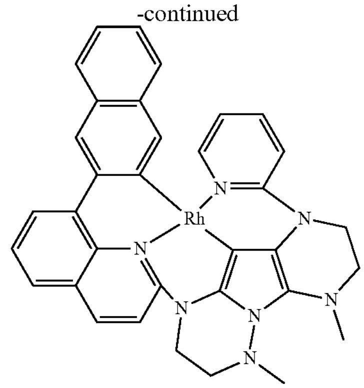
N
N
Rh
N
N
Rh
N
N
N
N
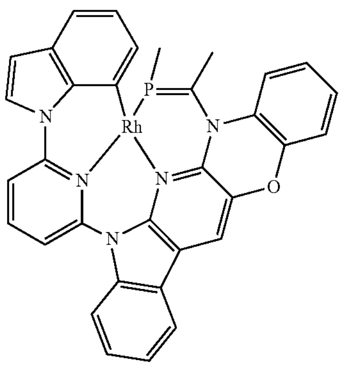
N
P
Rh
N
N
N
O
N
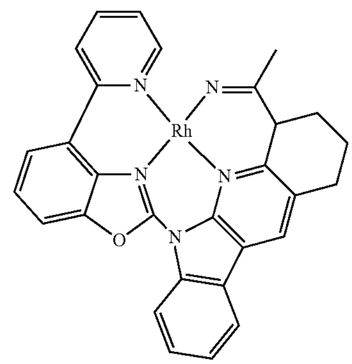
N
N
Rh
N
N
O
N
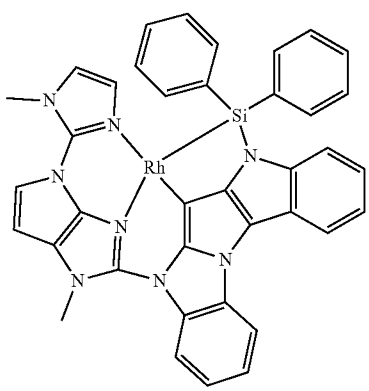
Si
N
N
Rh
N
N
N
N
N
N
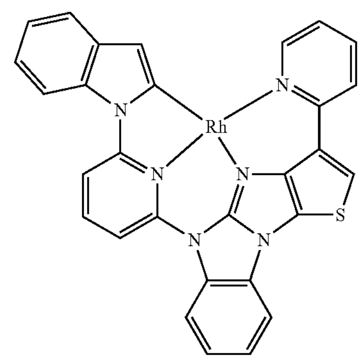
N
N
Rh
N
N
N
N
S
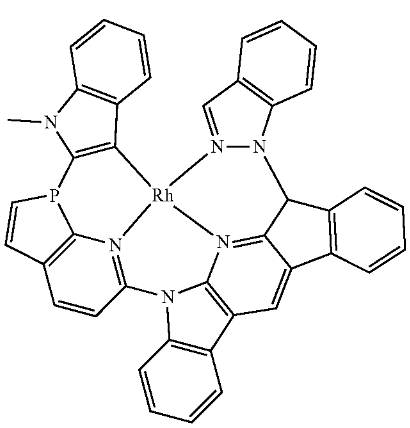
N
N
N
Rh
P
N
N
N
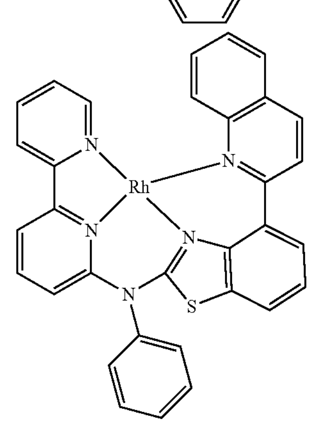
N
N
Rh
N
N
N
S -continued
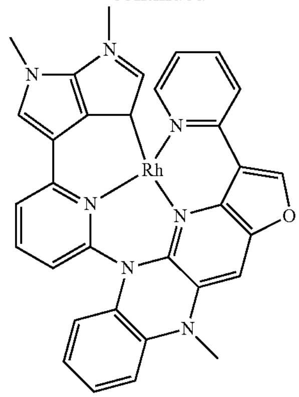
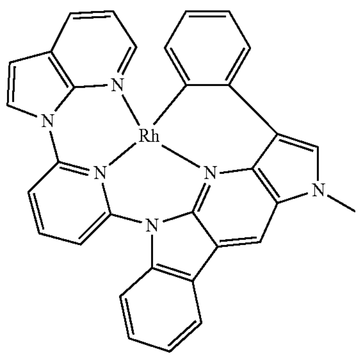
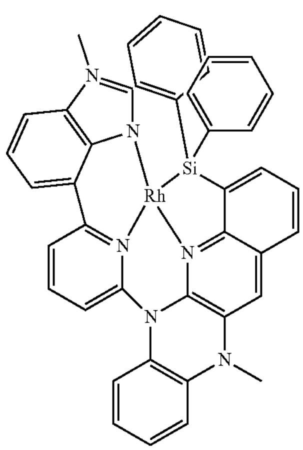
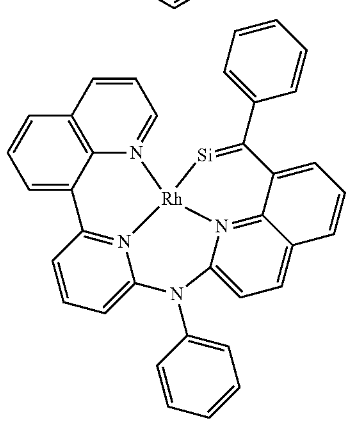
-continued
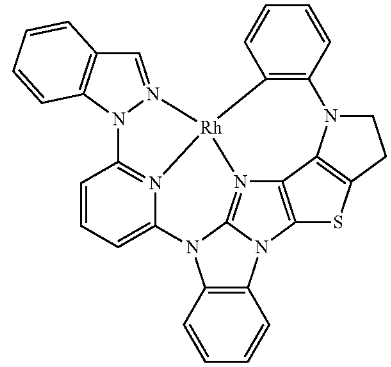
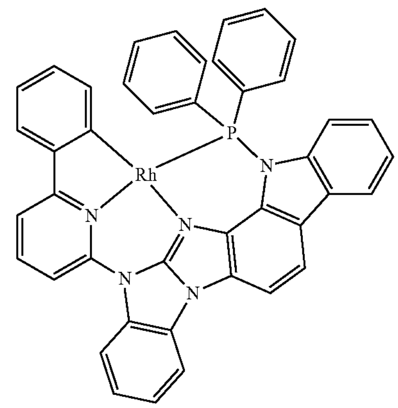
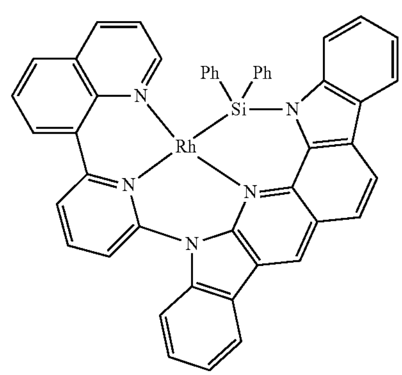
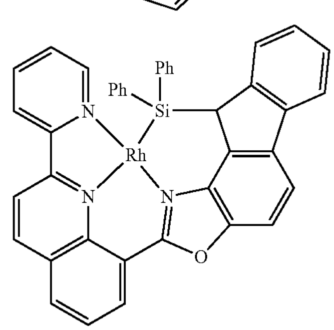

-continued
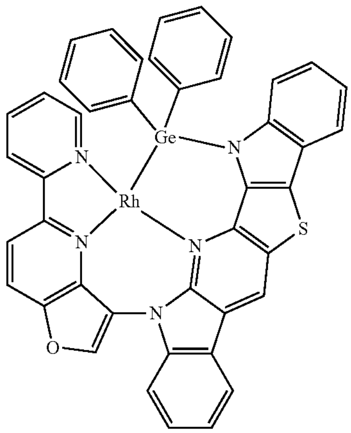
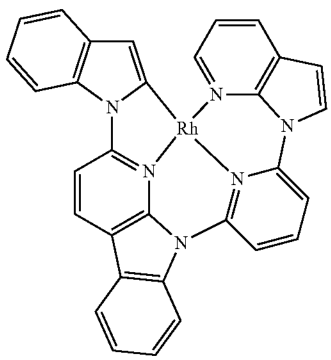
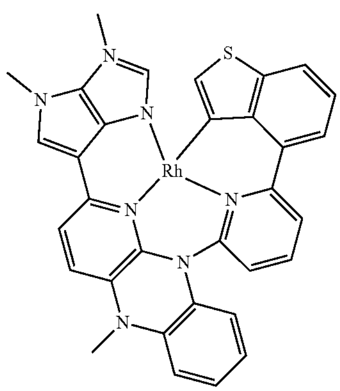
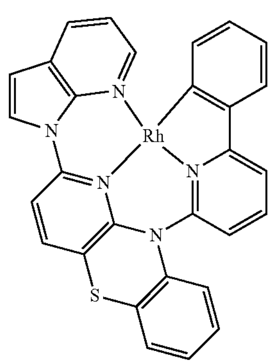
-continued
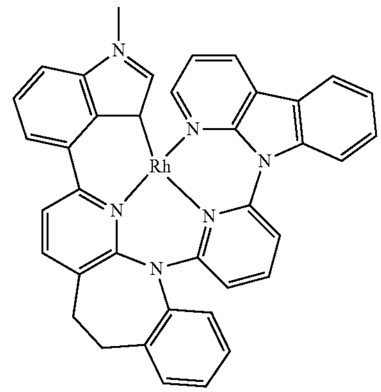
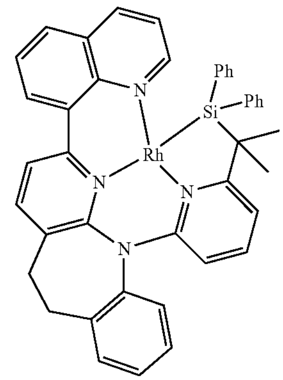
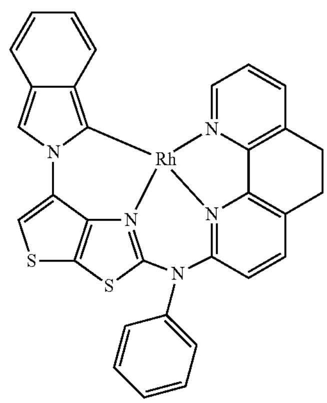
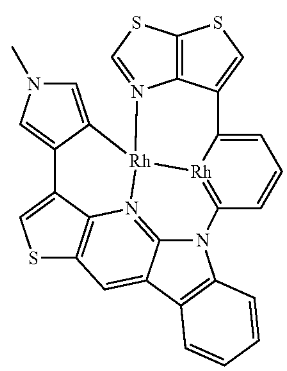

-continued
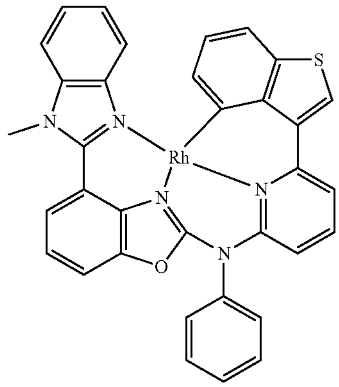
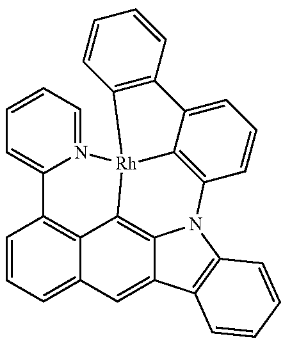
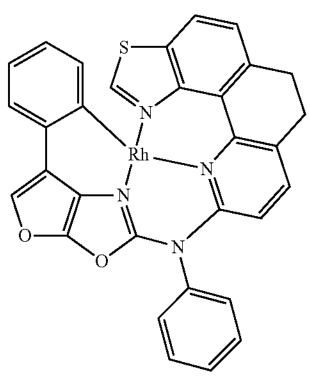
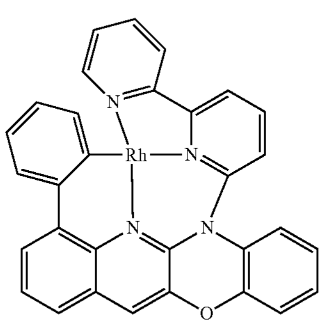
-continued
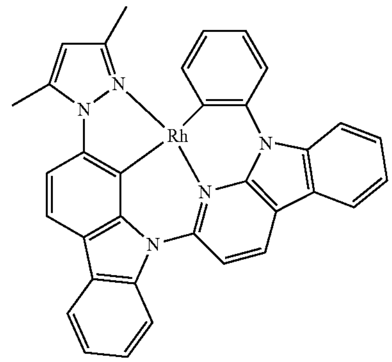
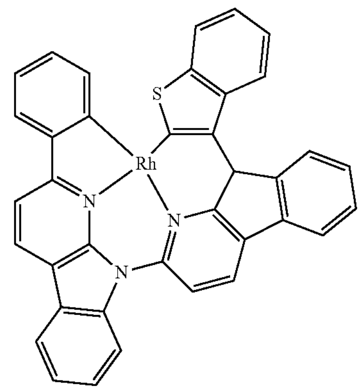
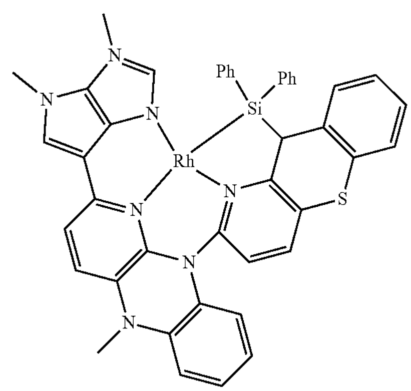
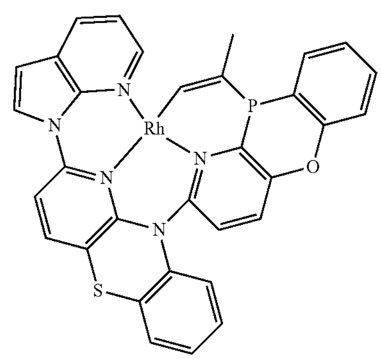

-continued
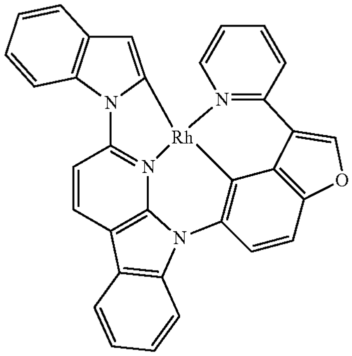
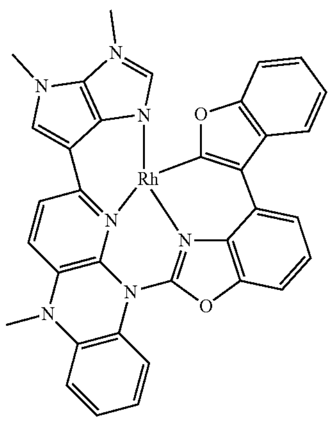
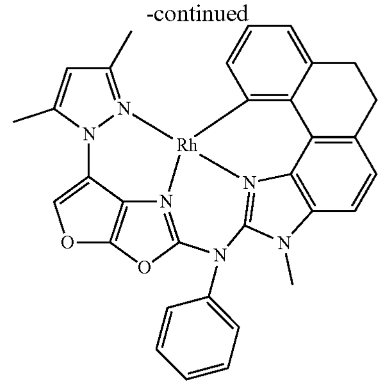
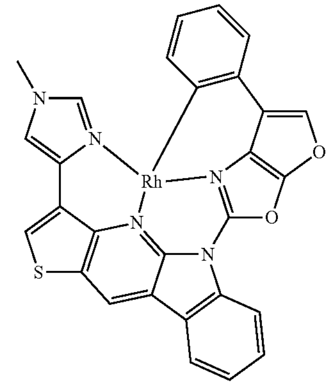
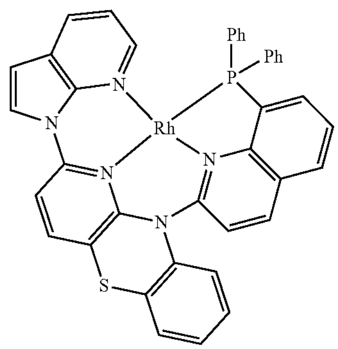
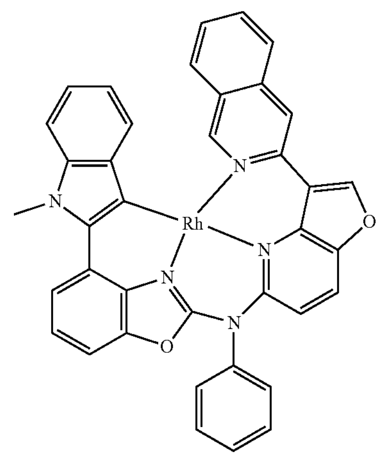
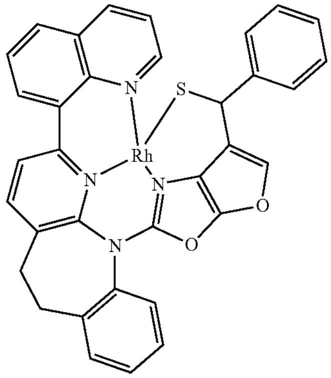
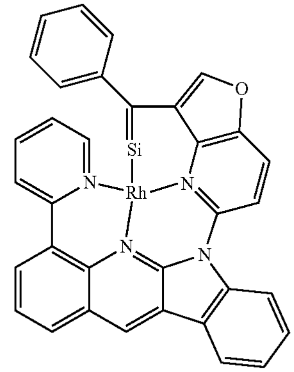
-continued

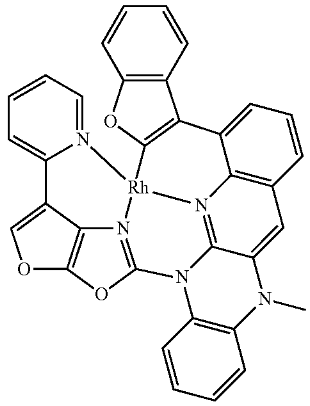
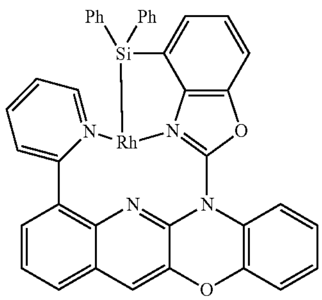
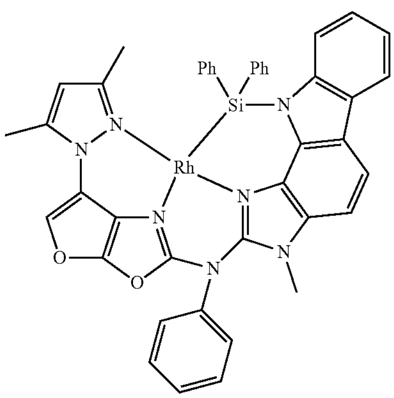
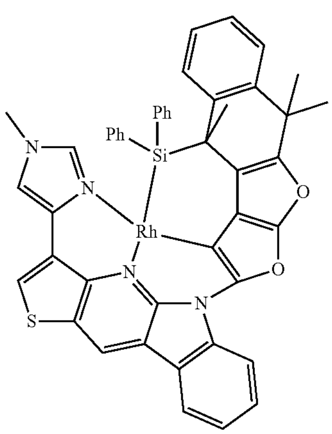
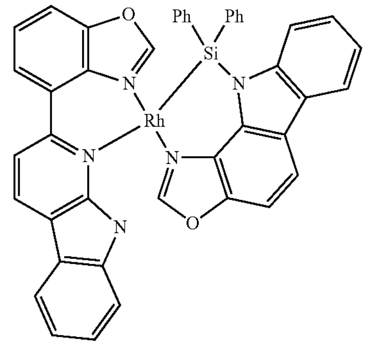
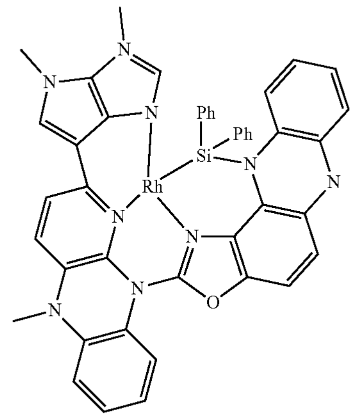
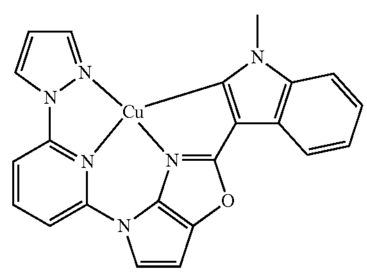
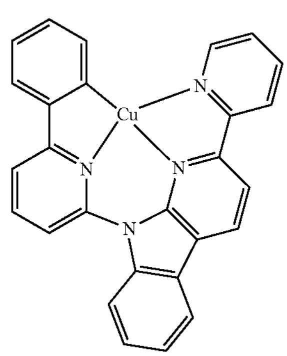

-continued
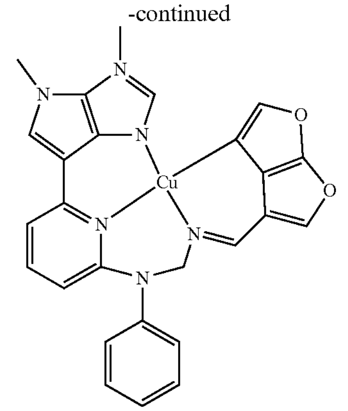
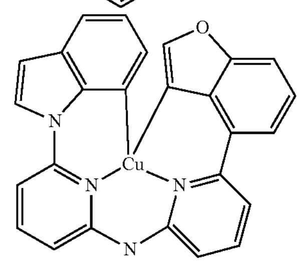
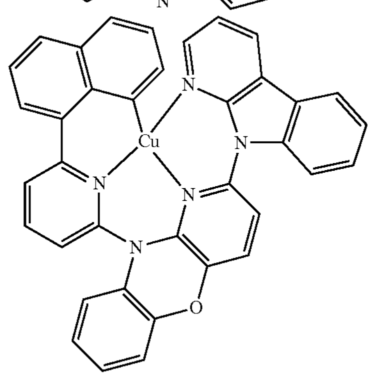
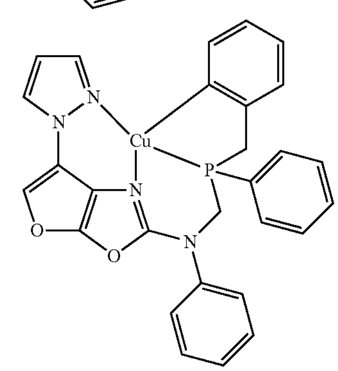
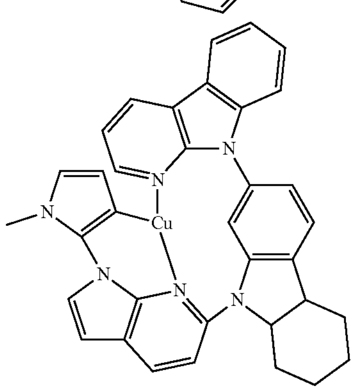
-continued
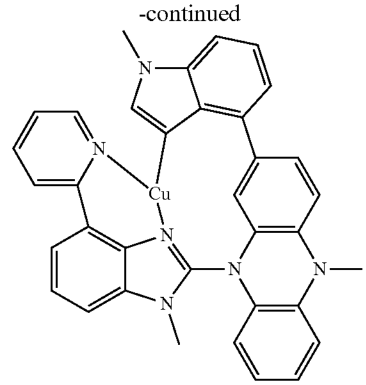
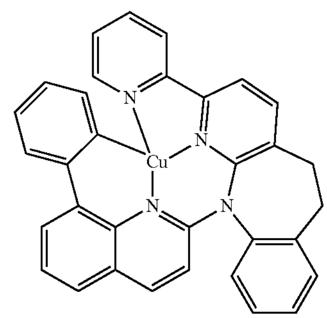
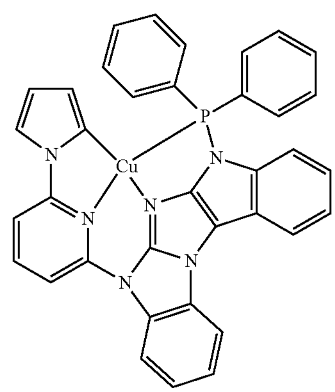
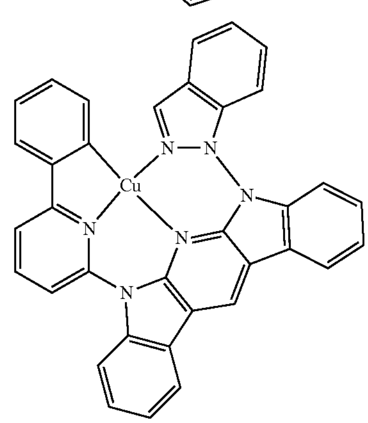

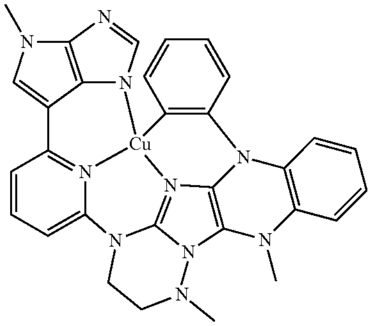
N
N
N
Cu
N
N
N
N
N
N
N
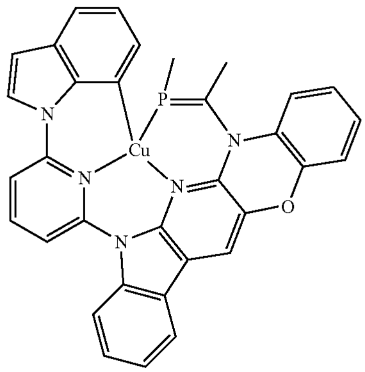
N
P
Cu
N
N
N
O
N
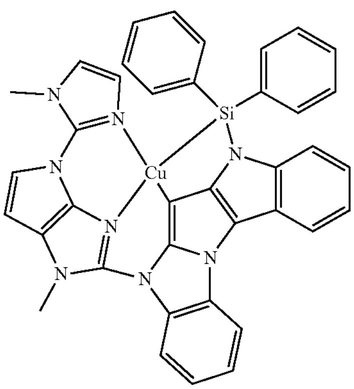
N
N
Si
N
Cu
N
N
N
N
N
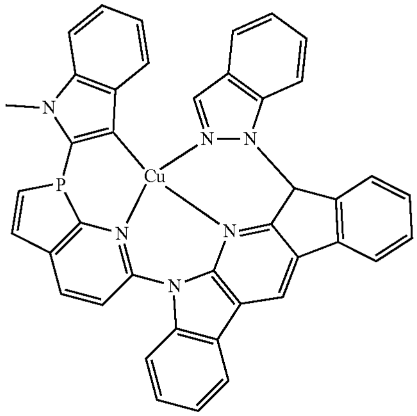
N
N
N
P
Cu
N
N
N
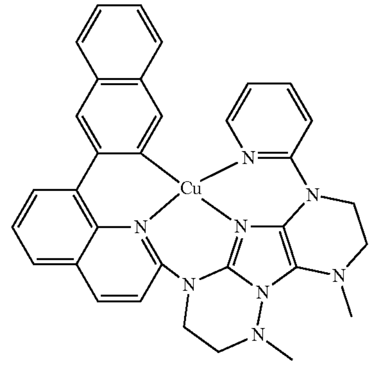
N
Cu
N
N
N
N
N
N
N
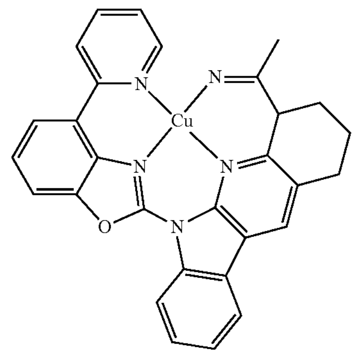
N
N
Cu
N
N
O
N
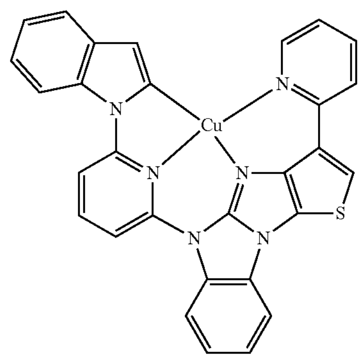
N
Cu
N
N
N
S
N
N
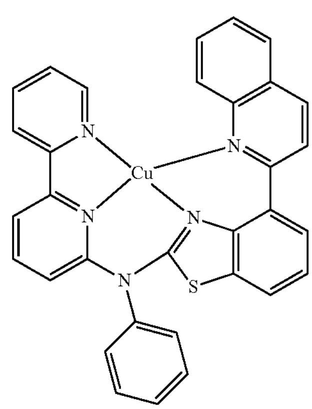
N
N
Cu
N
N
N
S -continued
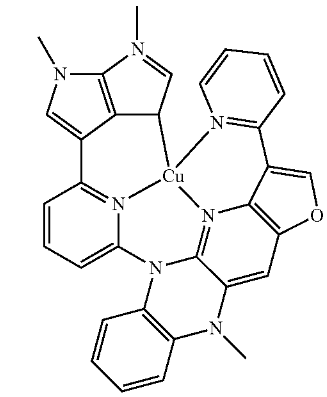
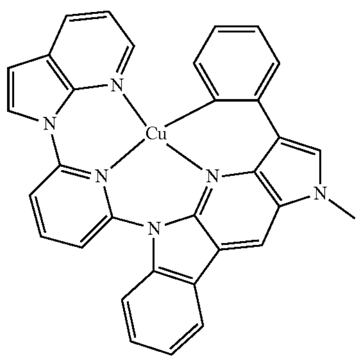
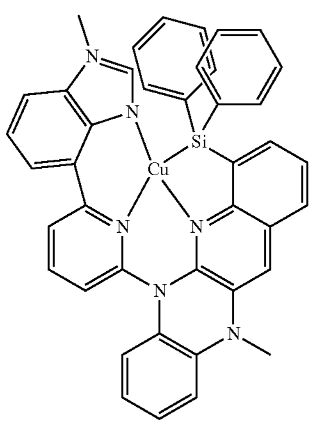
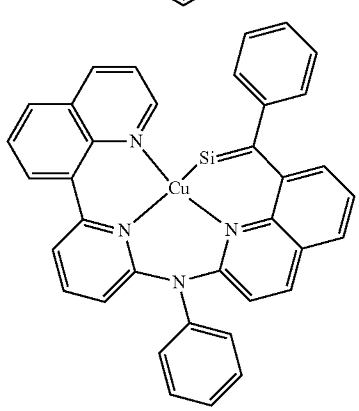
-continued
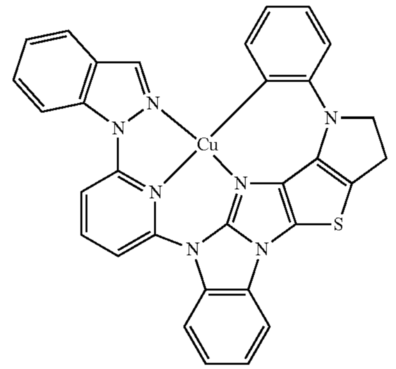
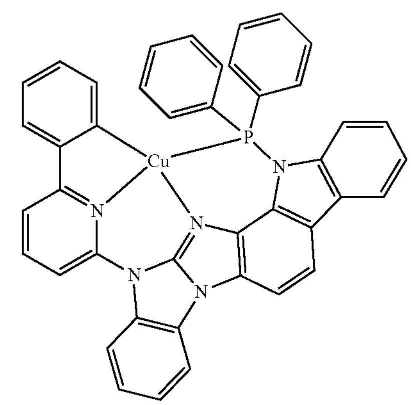
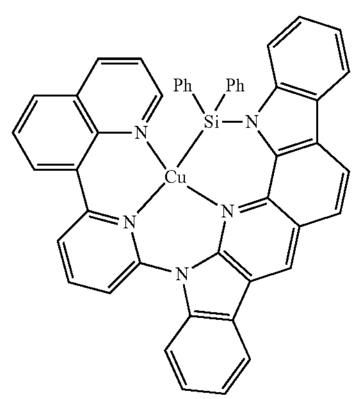
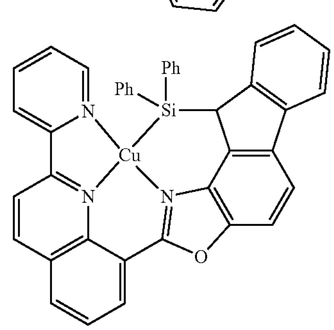

-continued
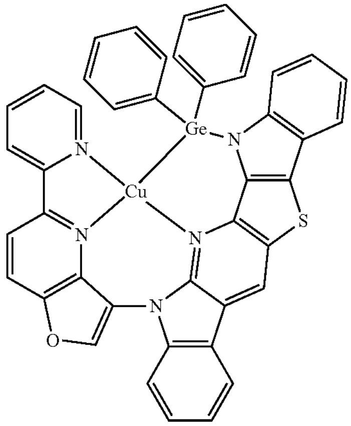
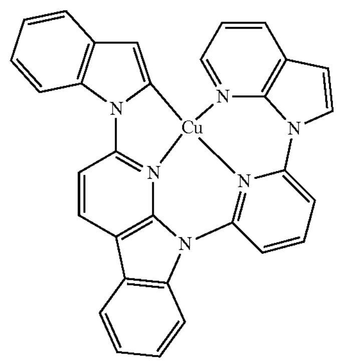
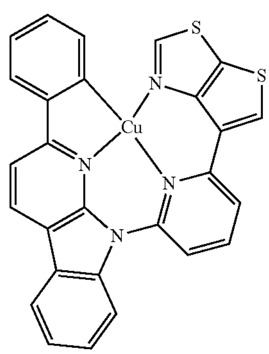
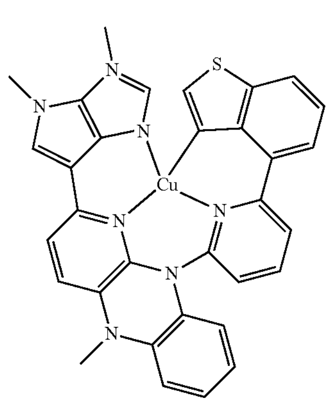
-continued
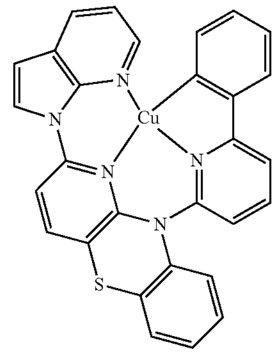
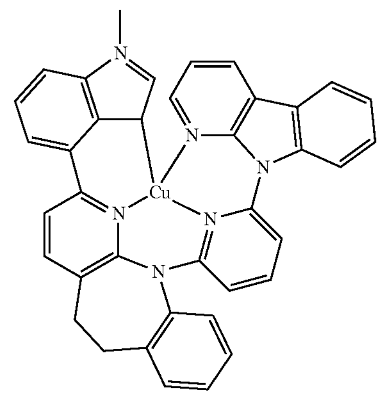
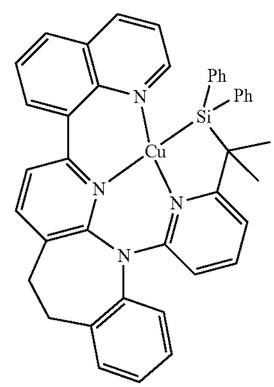
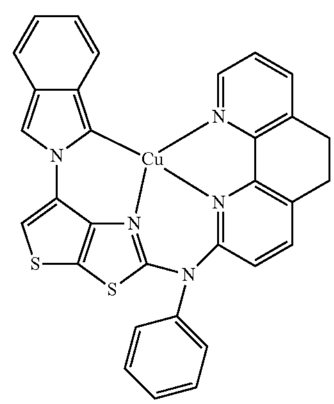

-continued
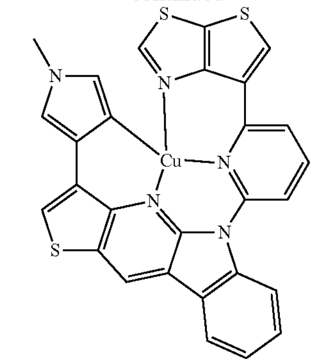
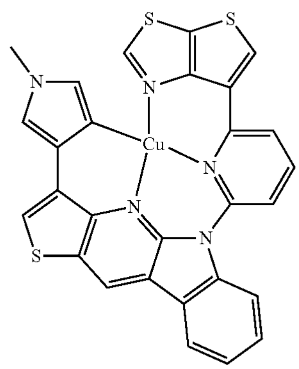
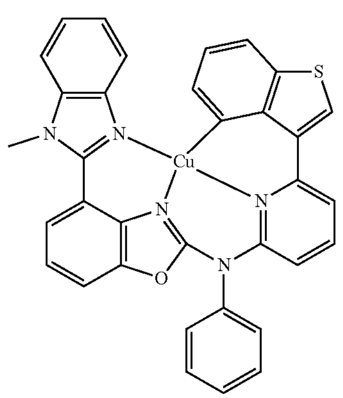
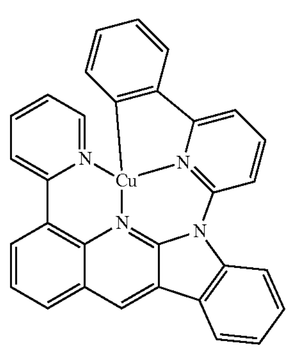
-continued
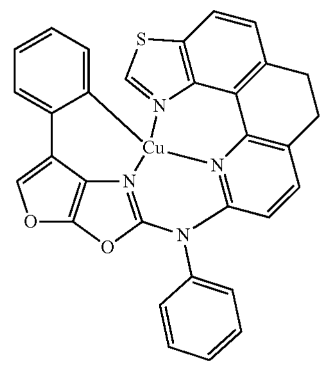
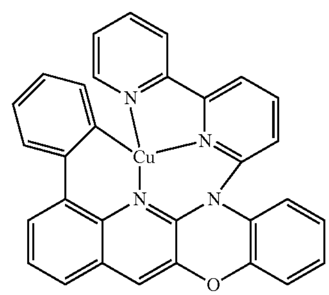
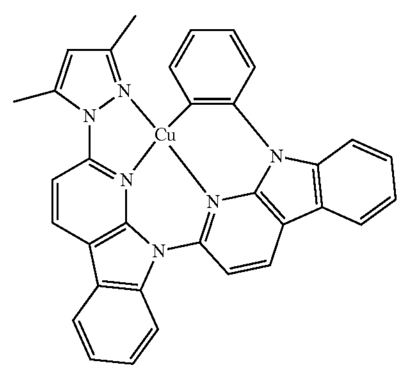
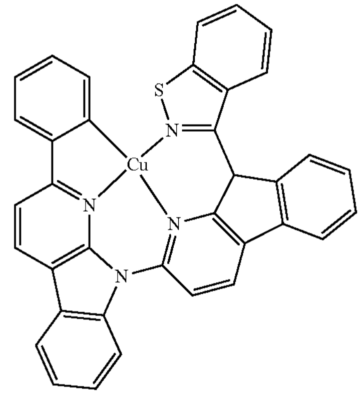

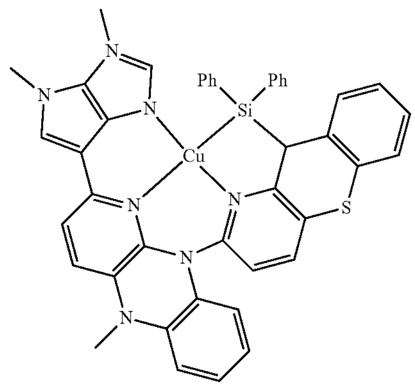
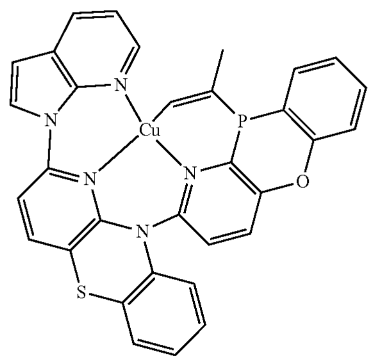
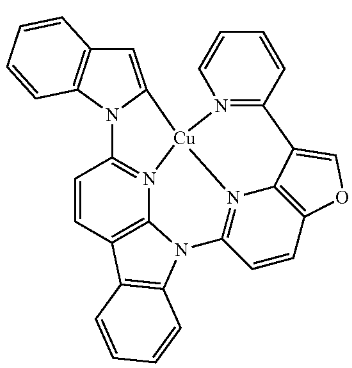
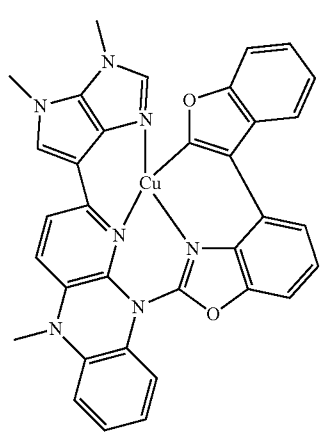
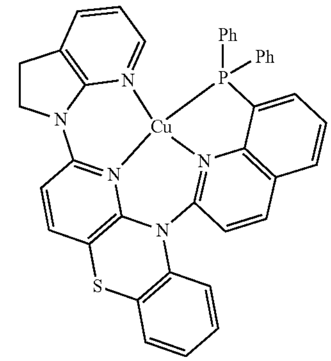
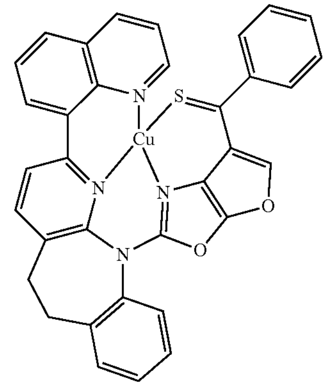
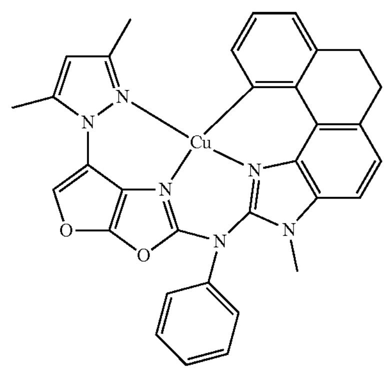
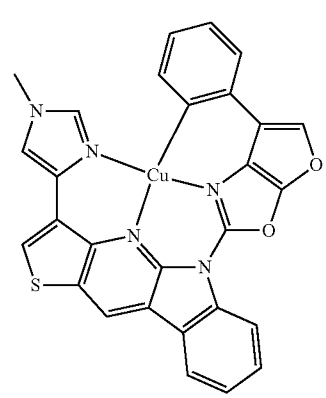

-continued
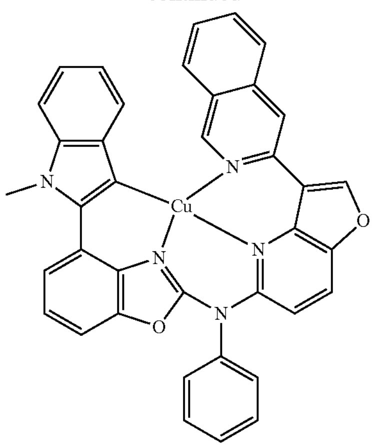
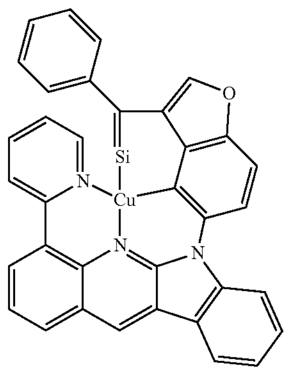
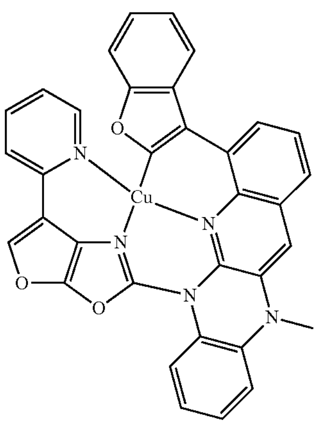
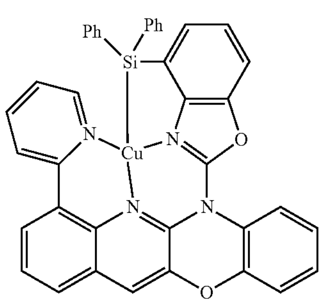
-continued
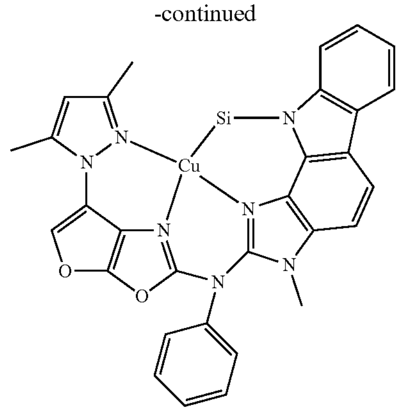
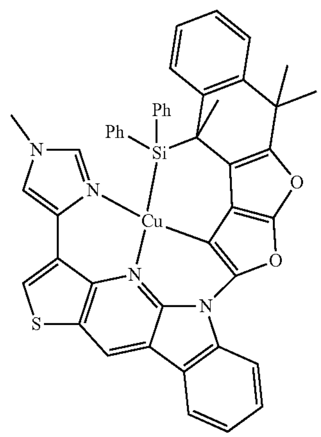
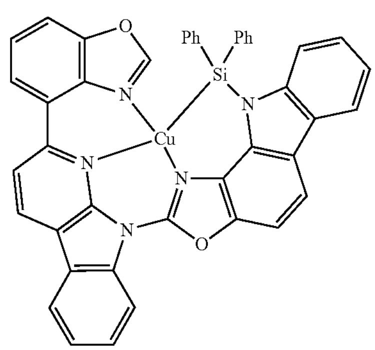
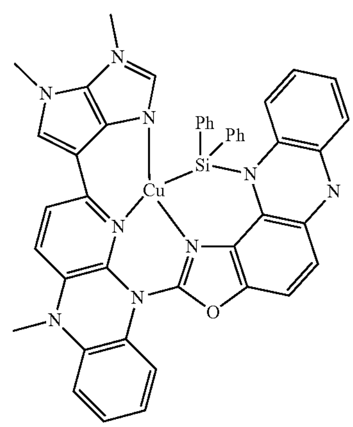

-continued
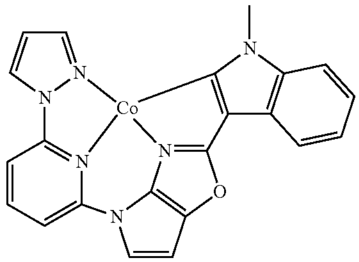
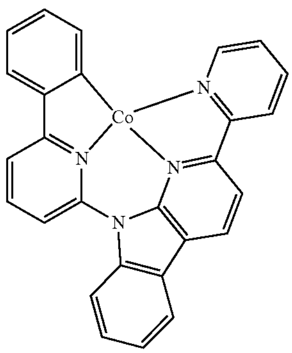
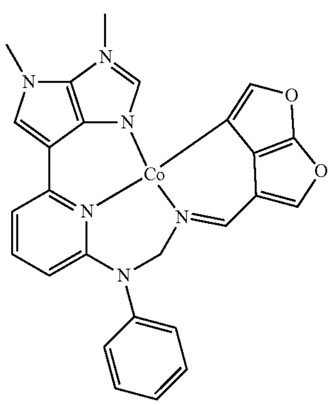
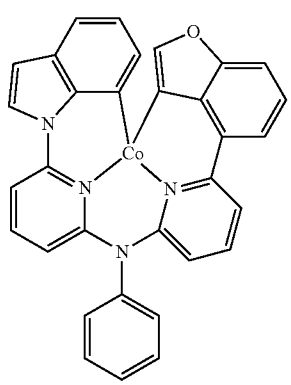
-continued
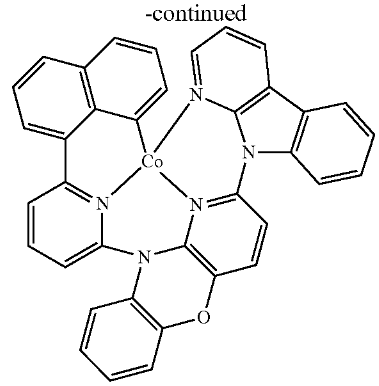
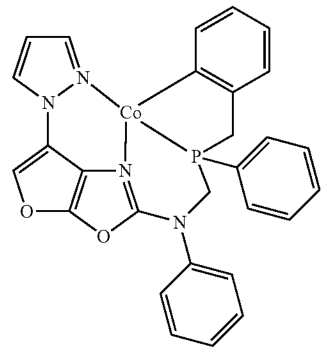
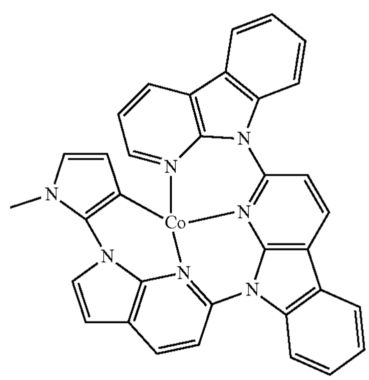
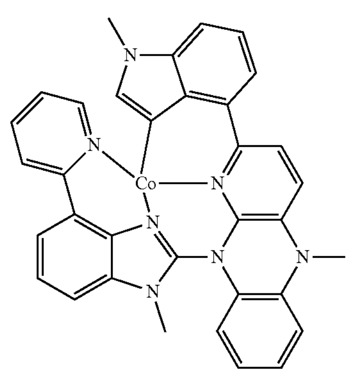

-continued
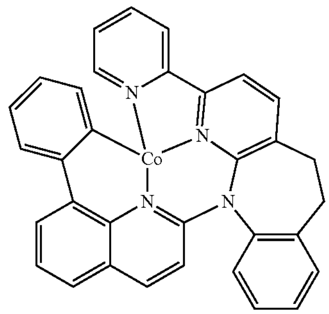
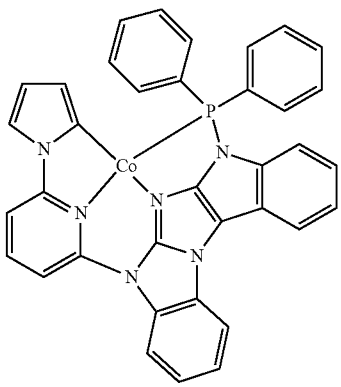
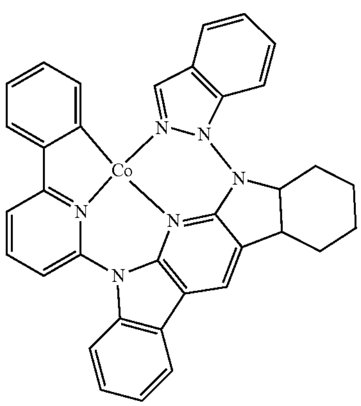
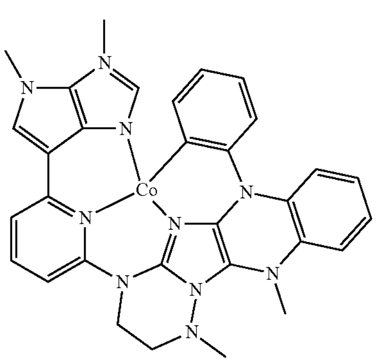
-continued
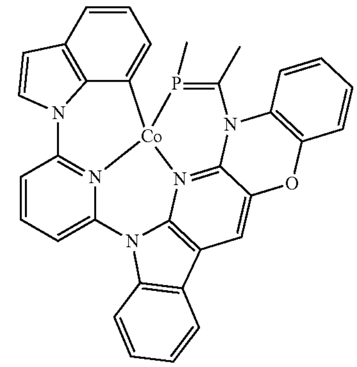
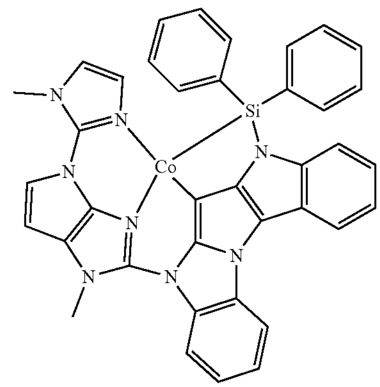
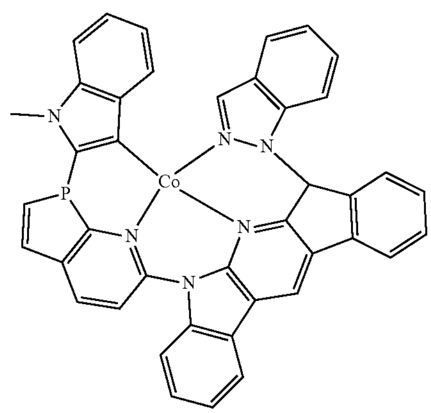
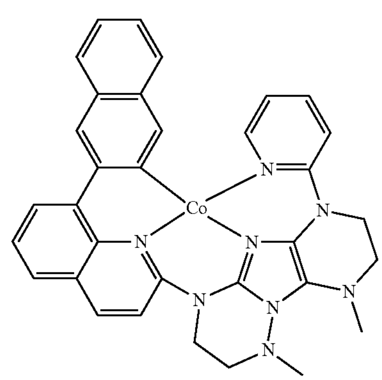

-continued
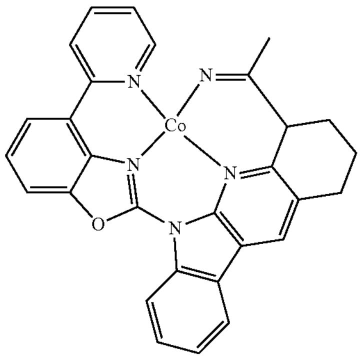
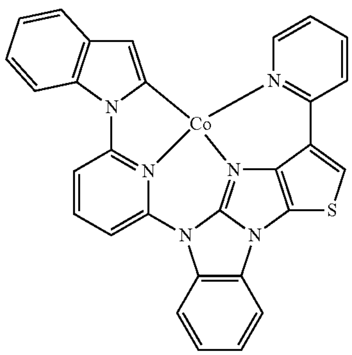
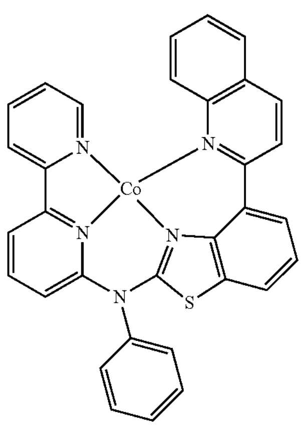
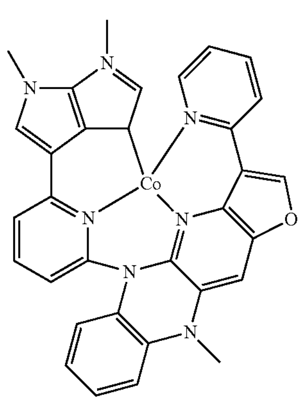
-continued
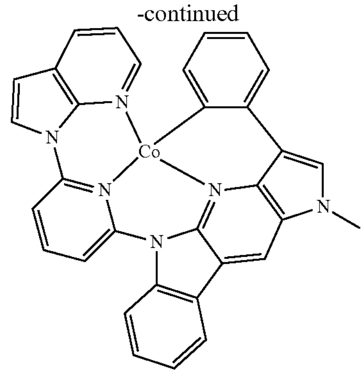
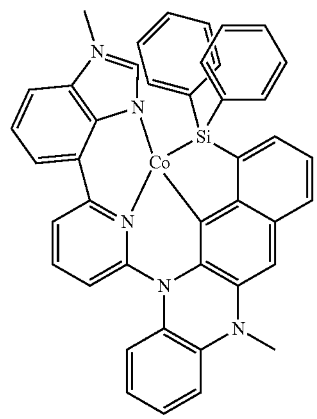
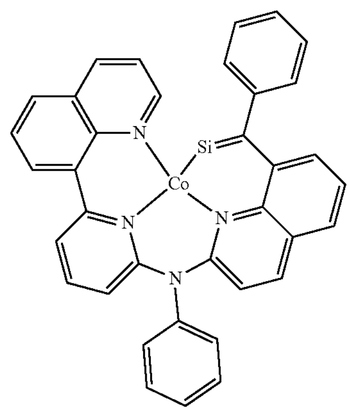
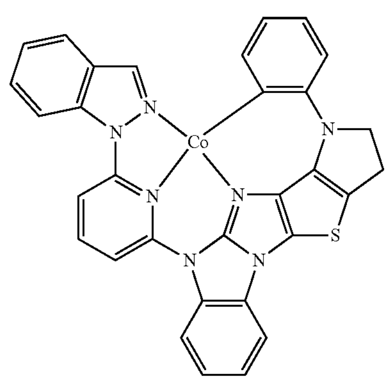

-continued
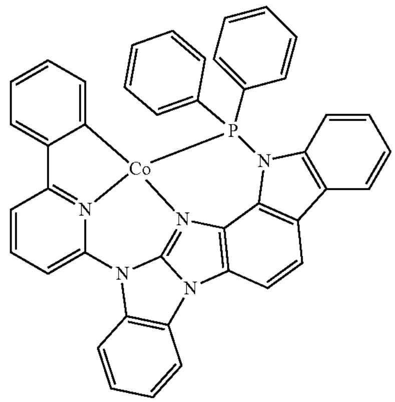
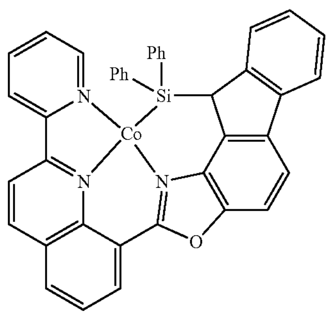
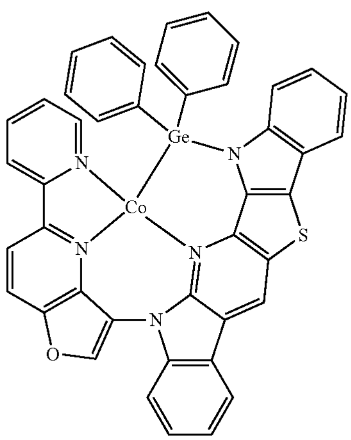
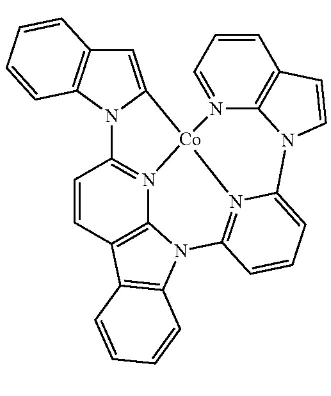
-continued
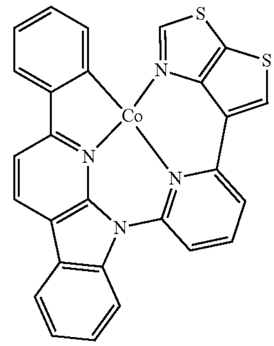
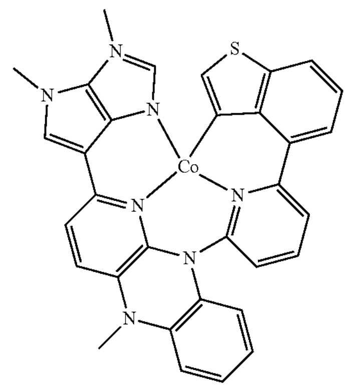
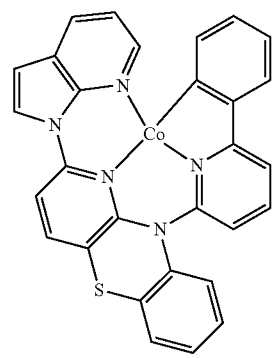
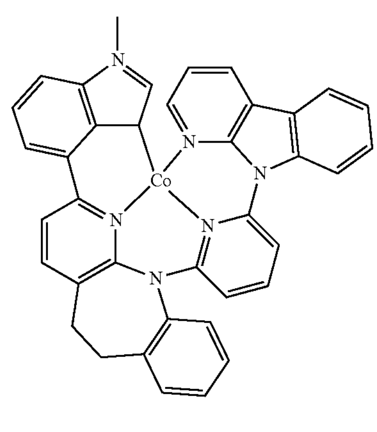

-continued
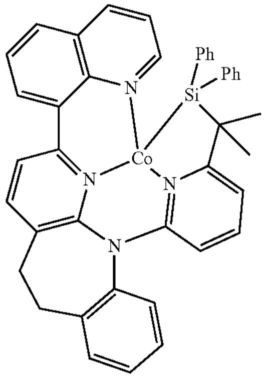
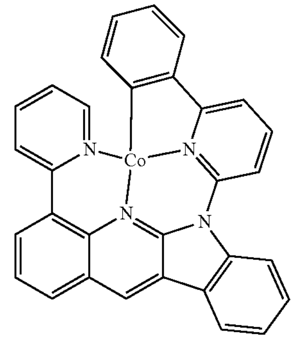
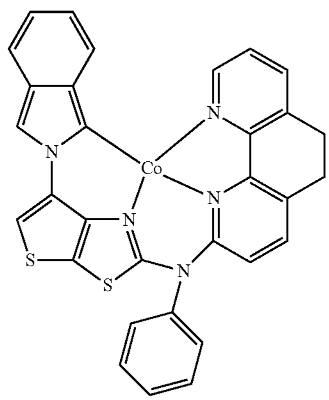
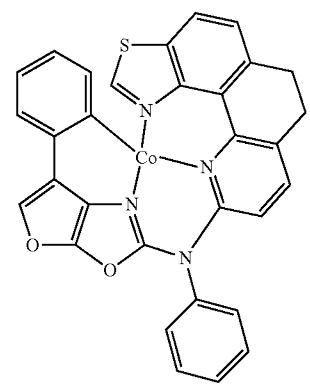
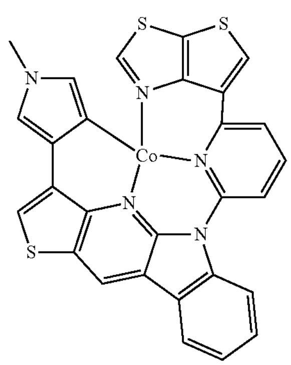
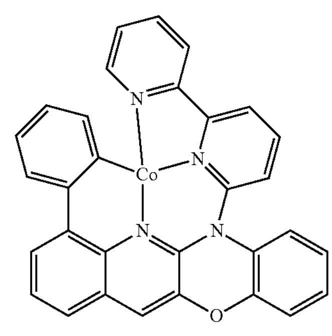
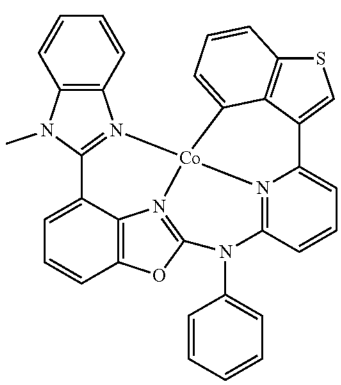
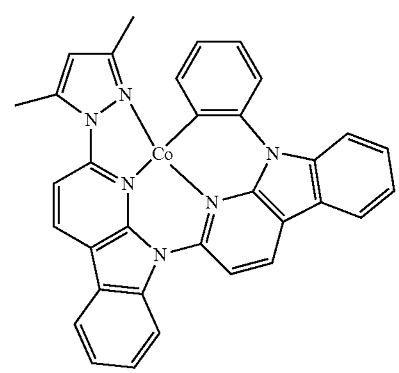

-continued
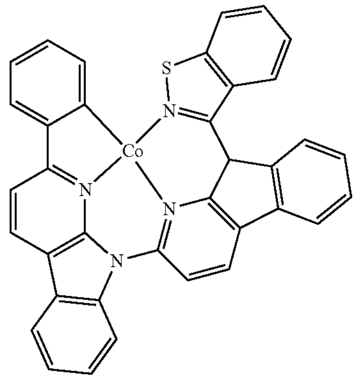
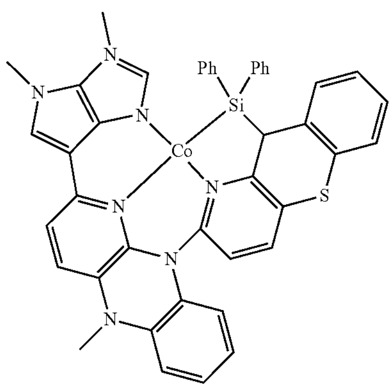
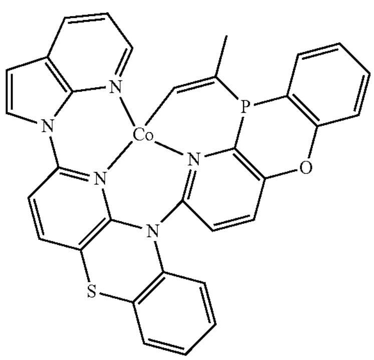
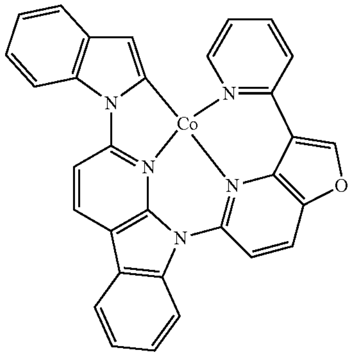
-continued
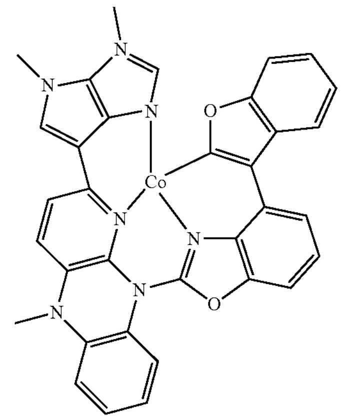
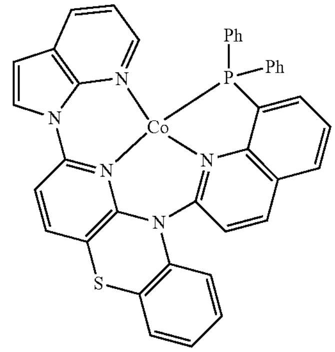
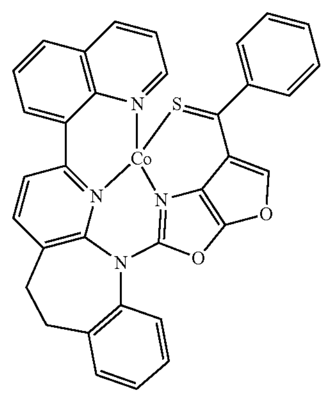
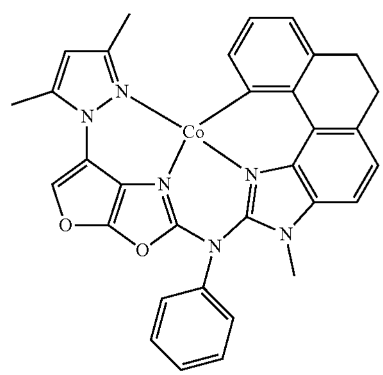

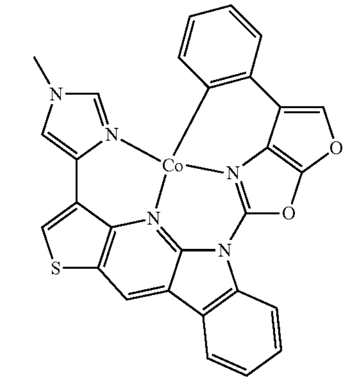
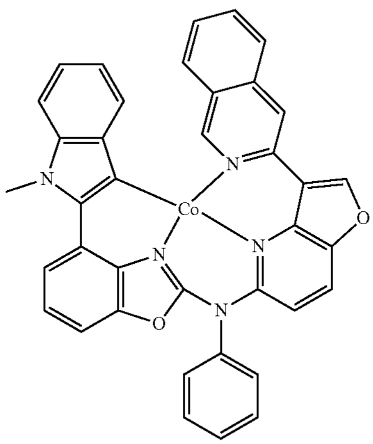
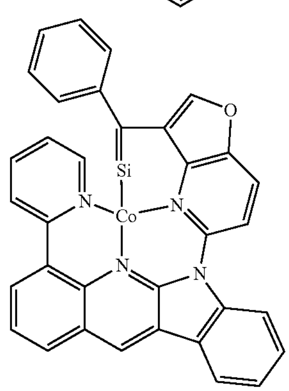
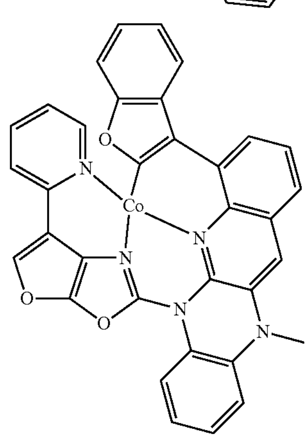
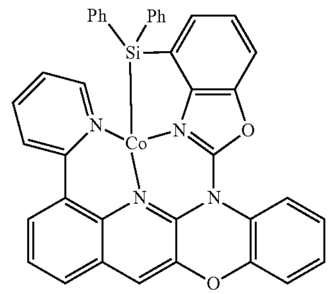
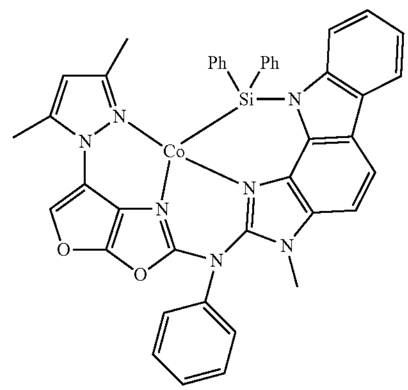
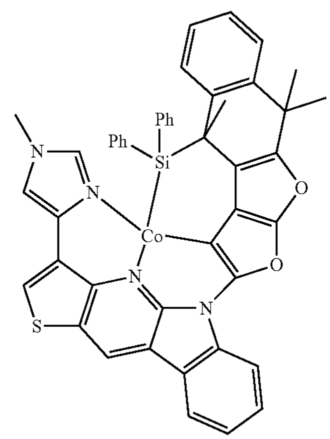
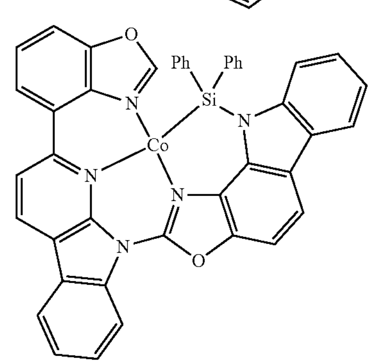

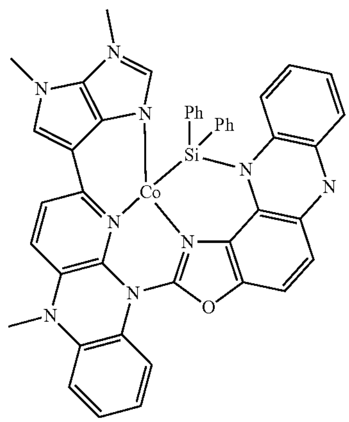
In various aspects, such an inventive complex can comprise any one or more of the following:
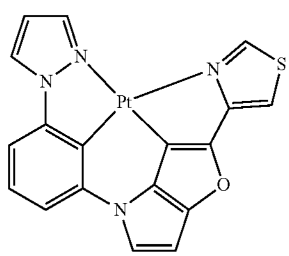
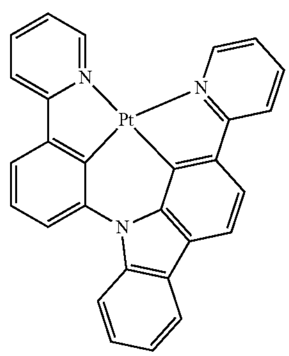
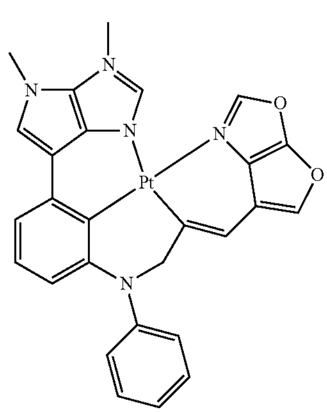
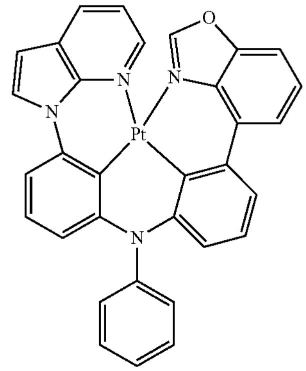
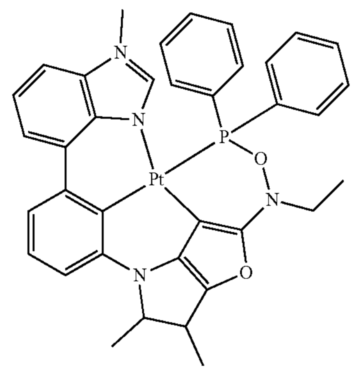
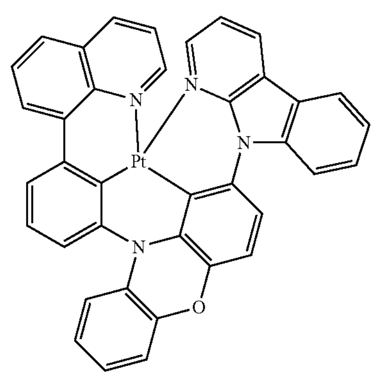
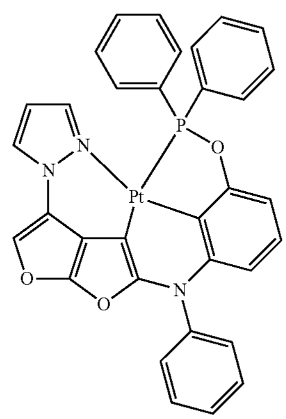

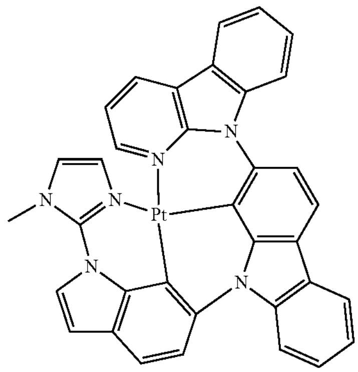
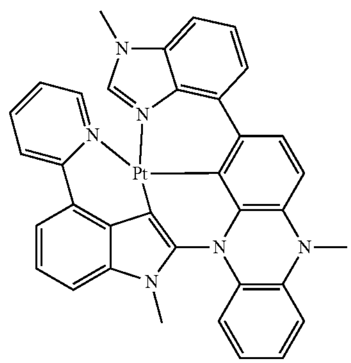
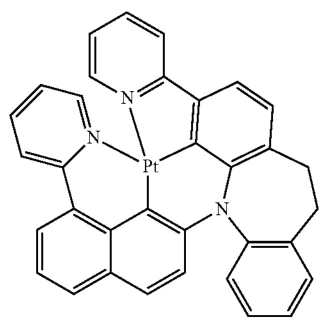
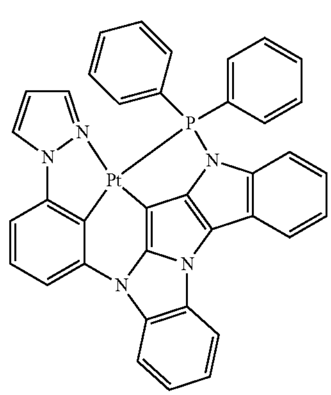
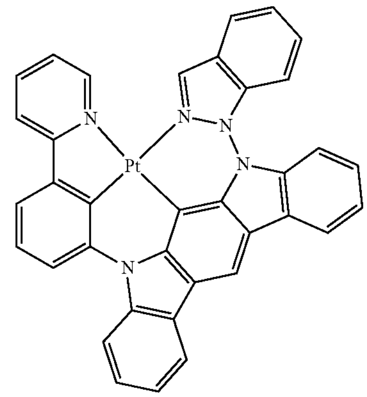
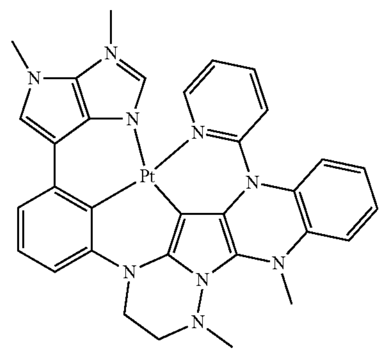
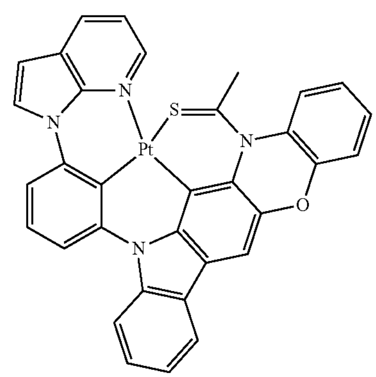
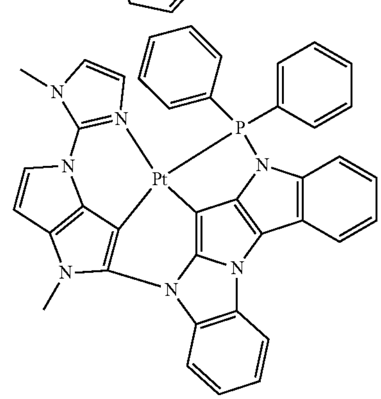

-continued
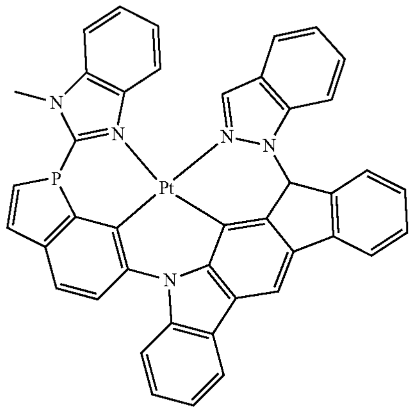
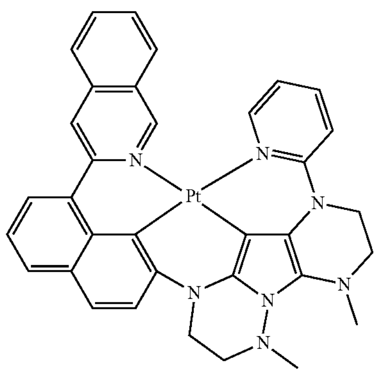
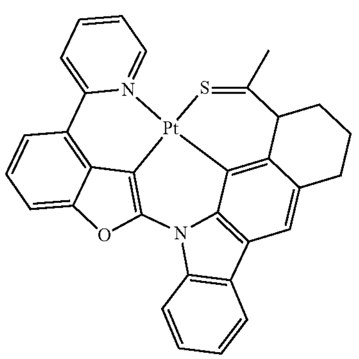
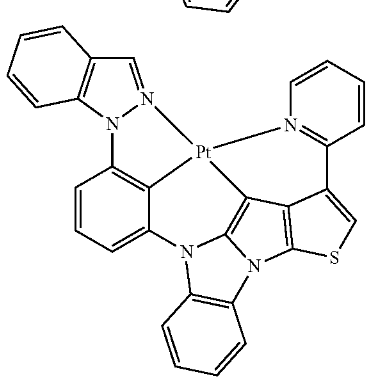
-continued
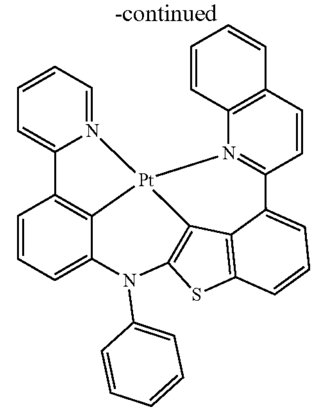
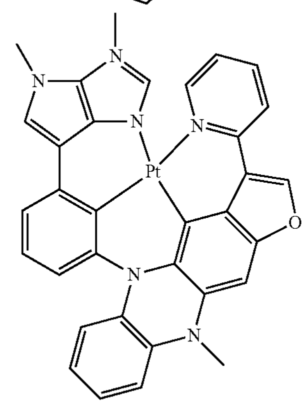
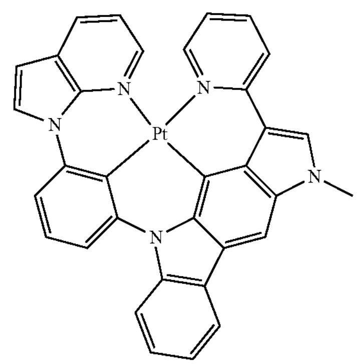
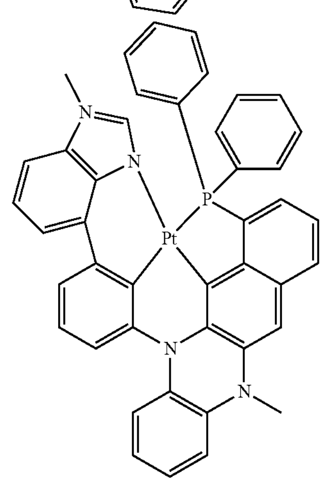

-continued
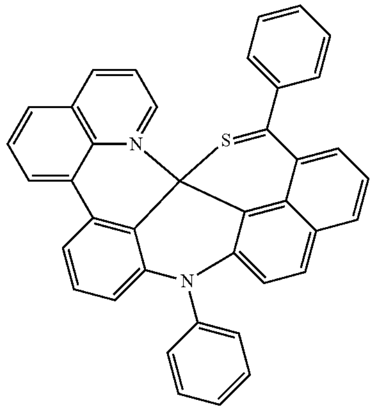
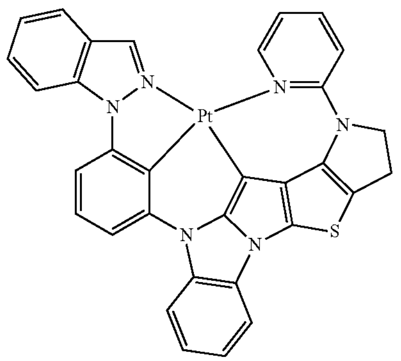
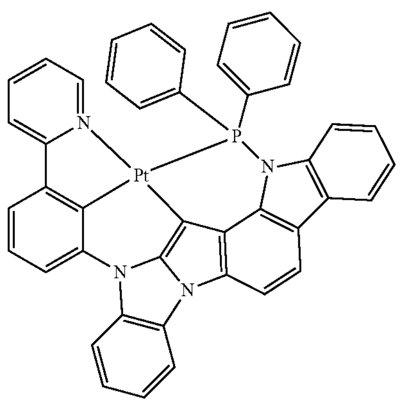
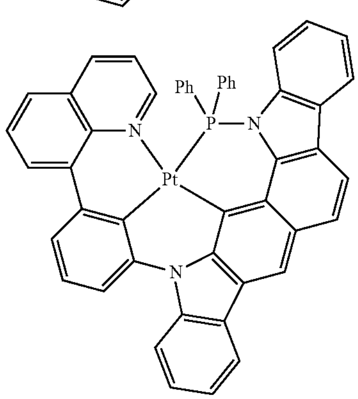
-continued
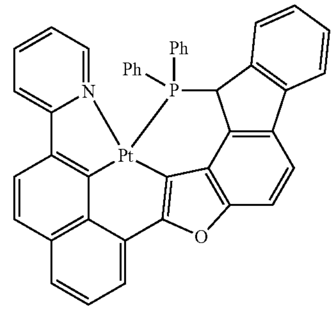
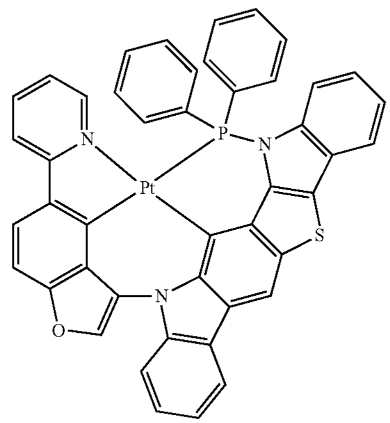
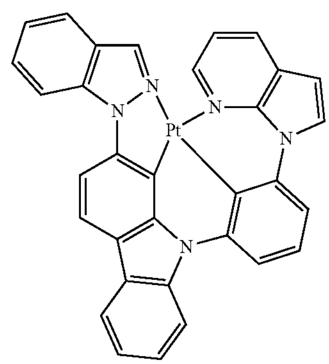
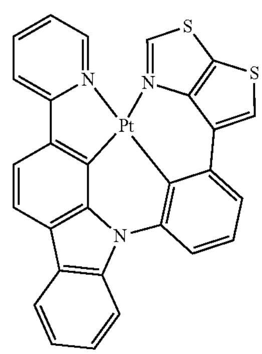

-continued
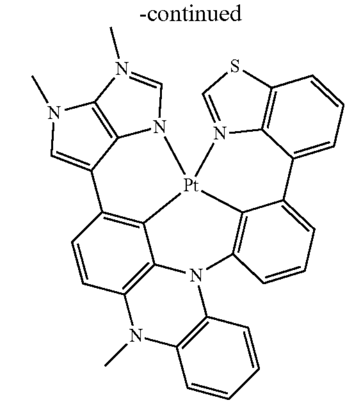
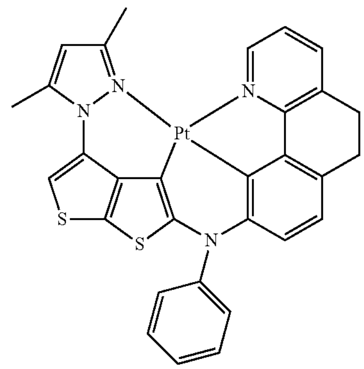
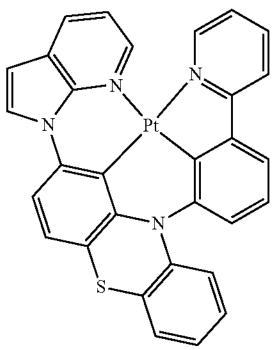
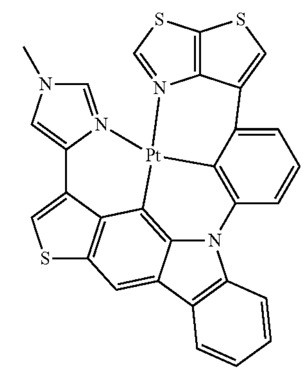
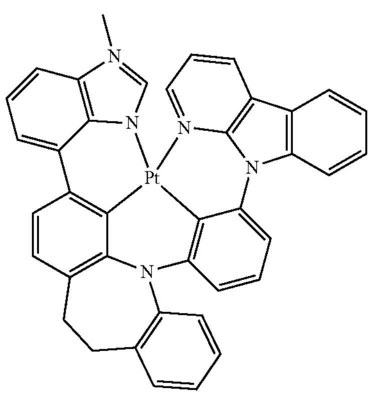
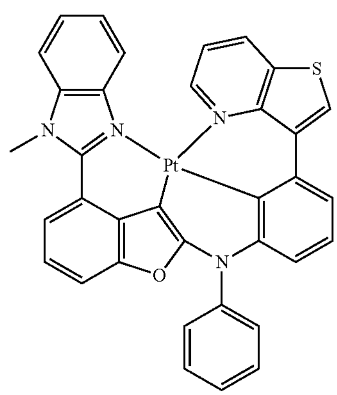
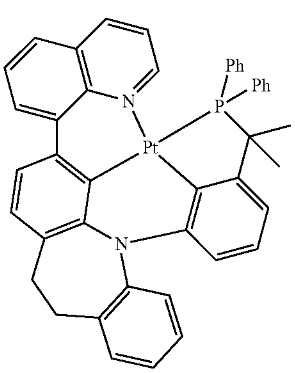
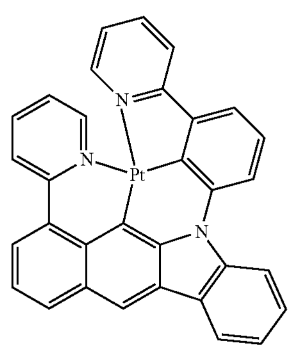

-continued
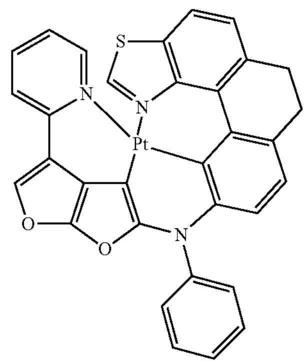
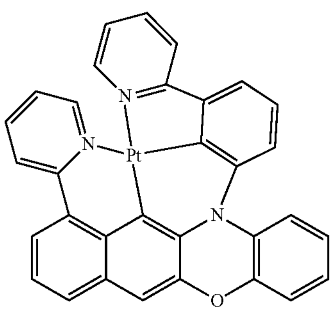
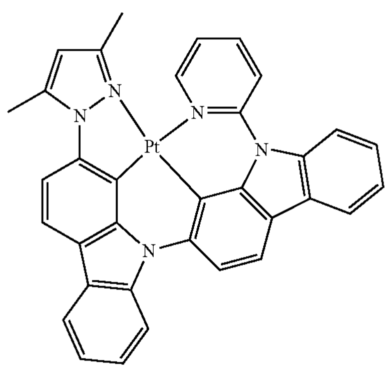
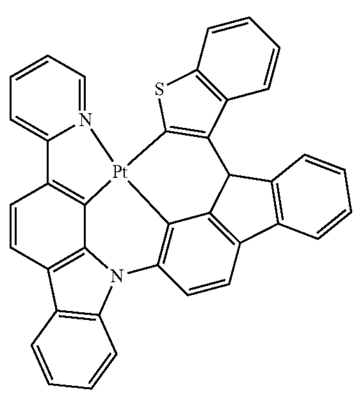
-continued
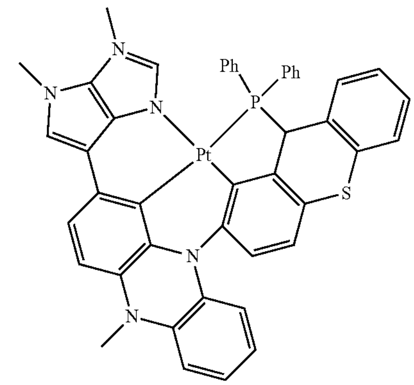
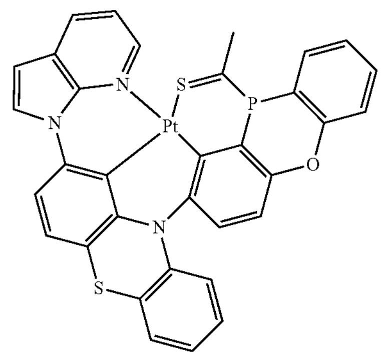
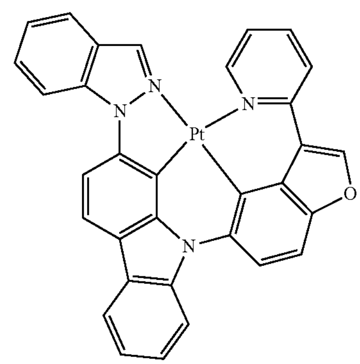
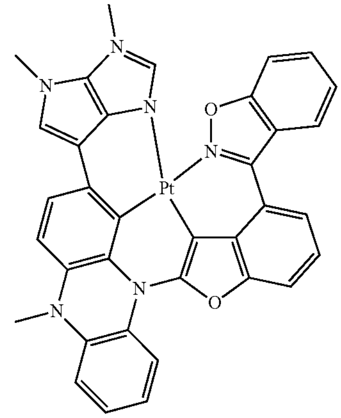

-continued
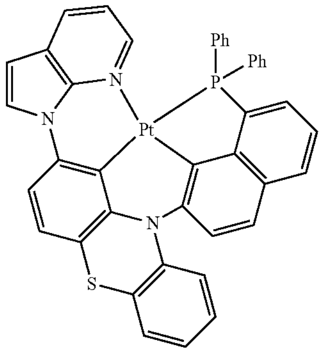
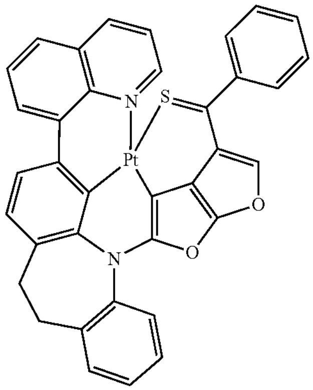
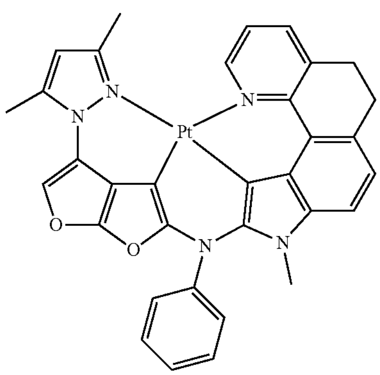
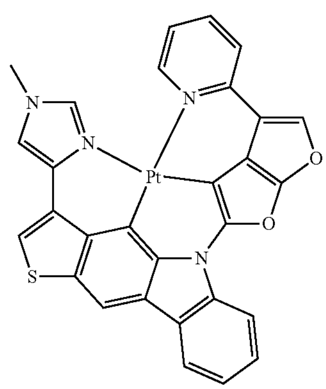
-continued
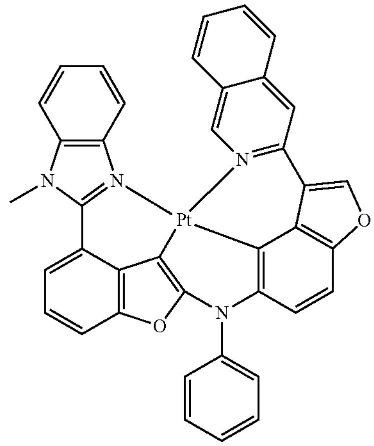
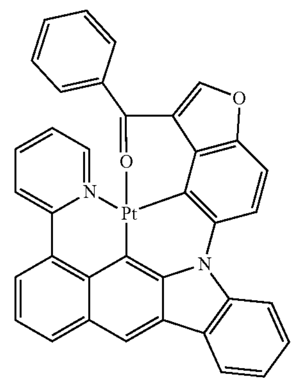
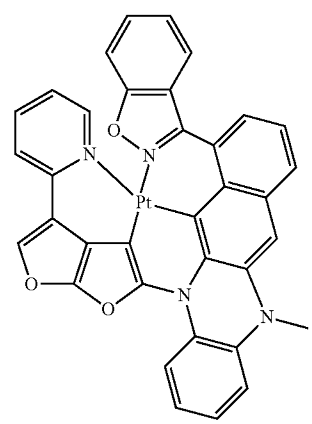
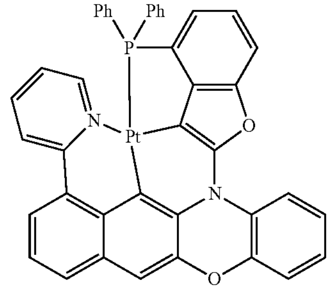

-continued
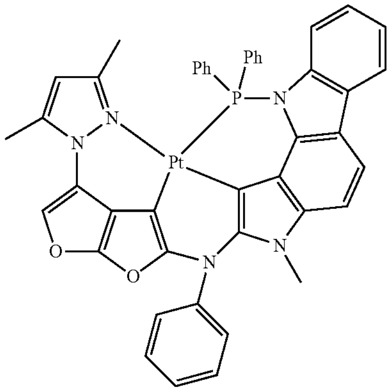
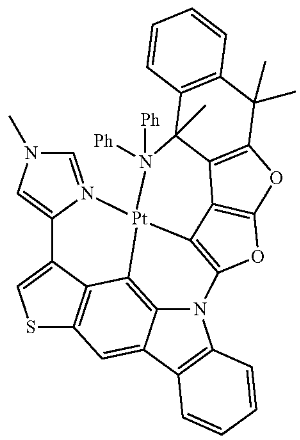
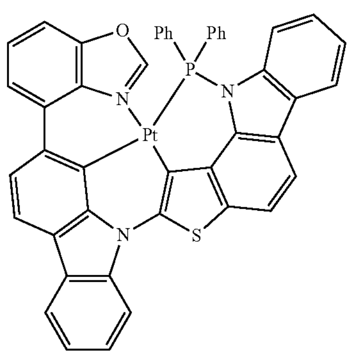
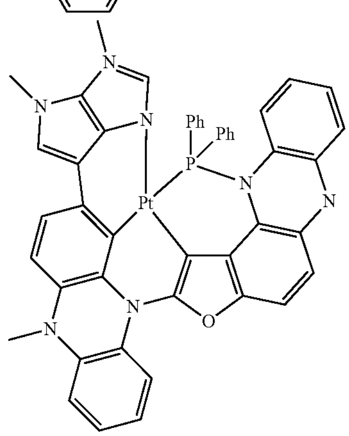
-continued
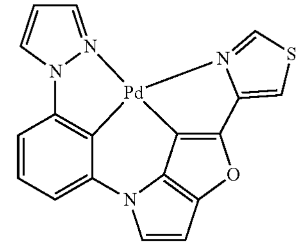
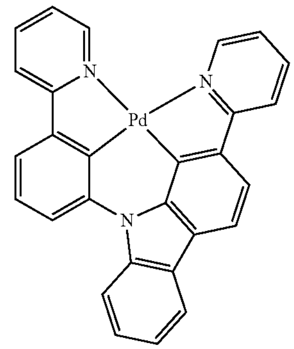
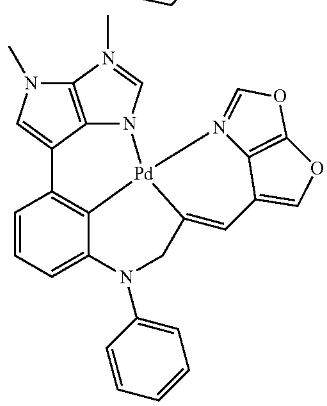
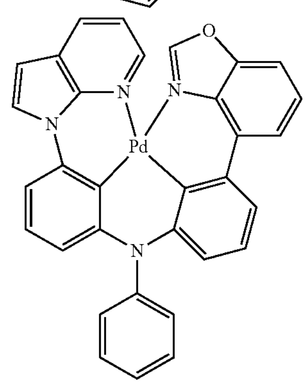
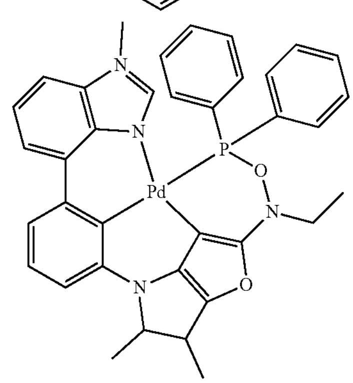

-continued
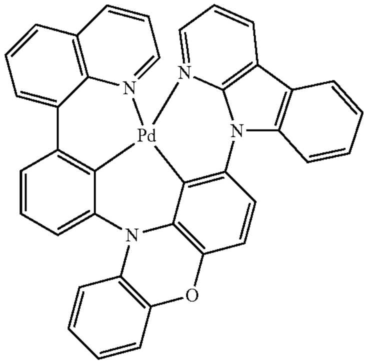
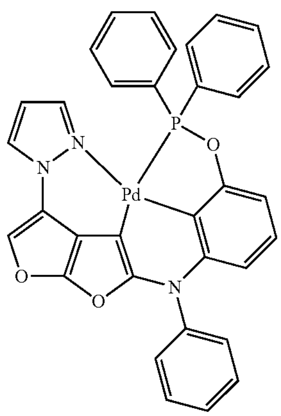
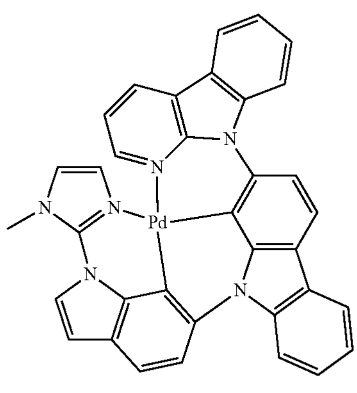
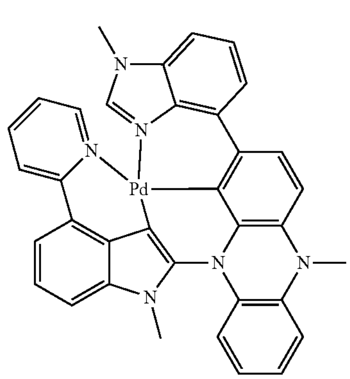
-continued
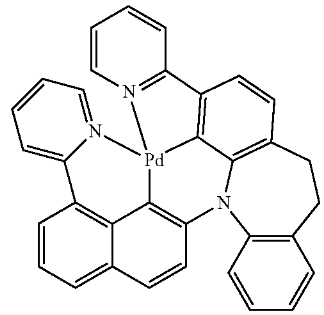
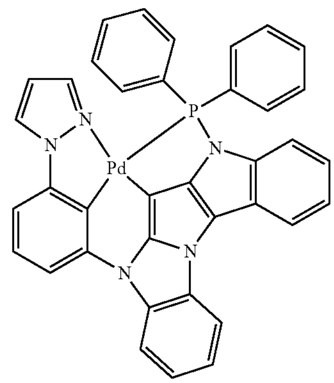
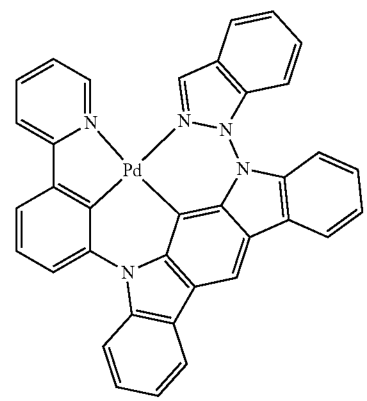
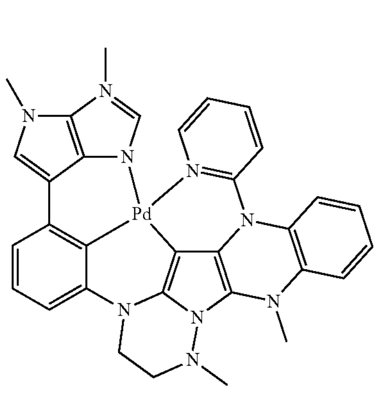

-continued
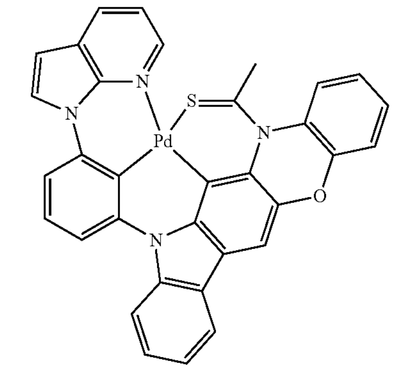
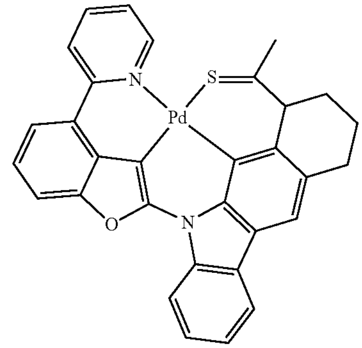
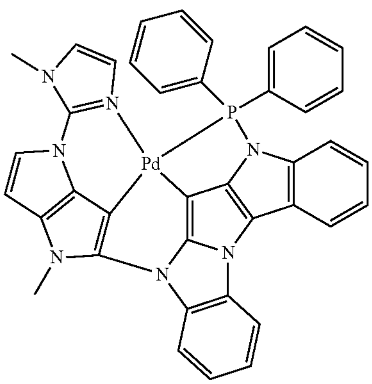
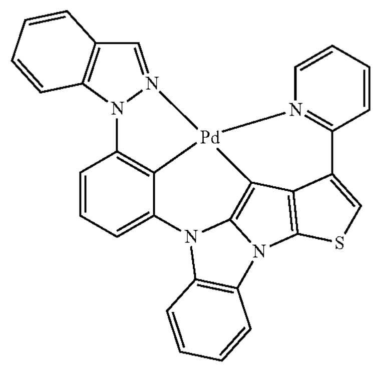
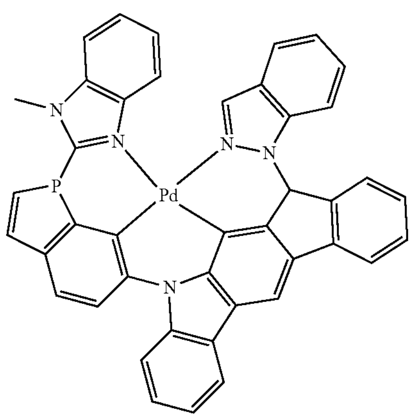
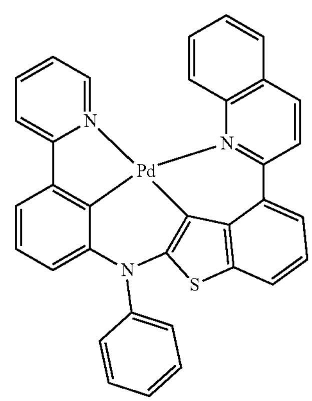
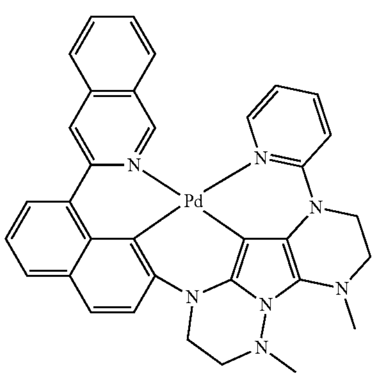
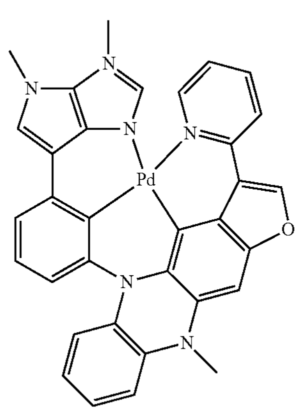

-continued
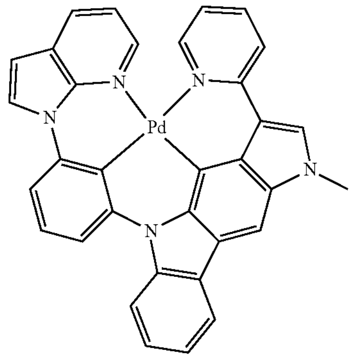
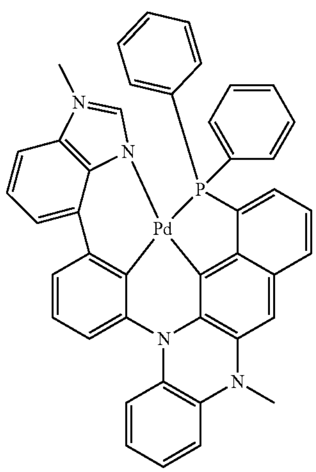
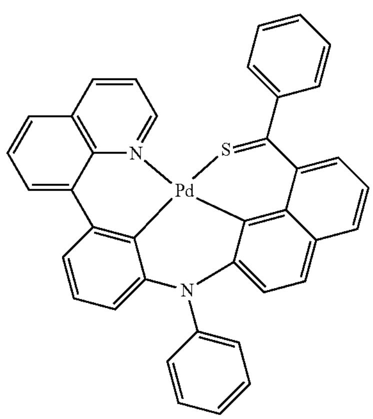
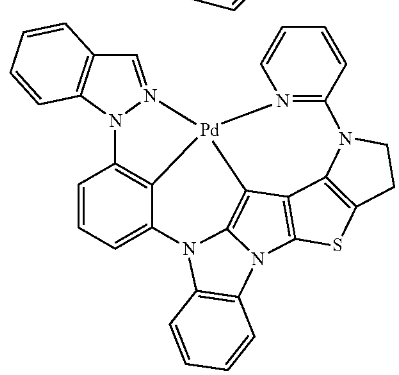
-continued
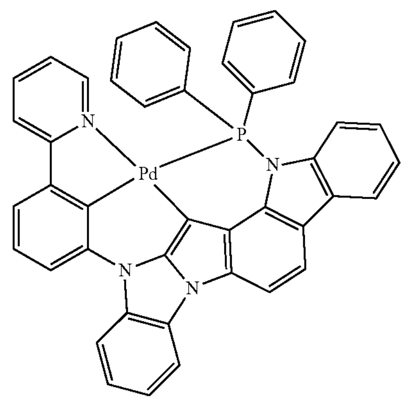
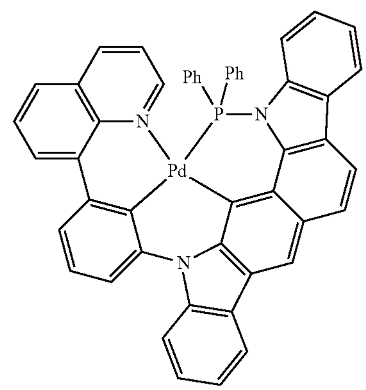
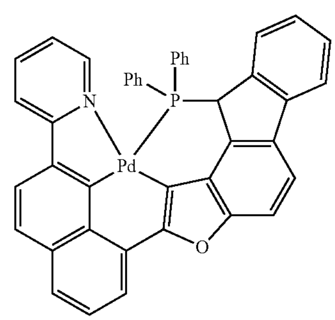
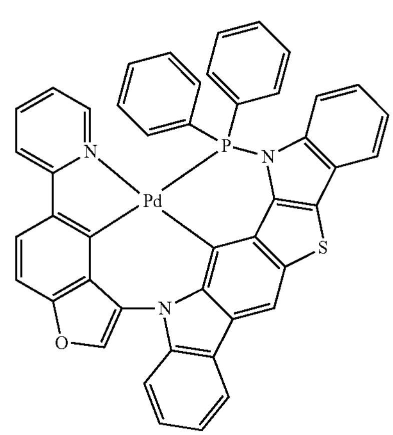

-continued
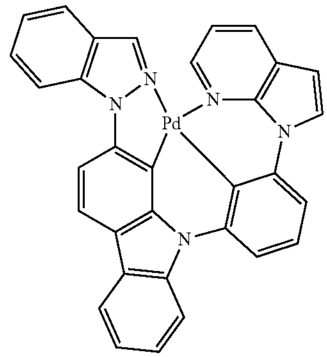
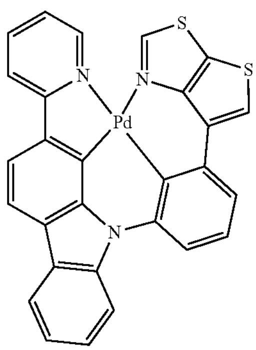
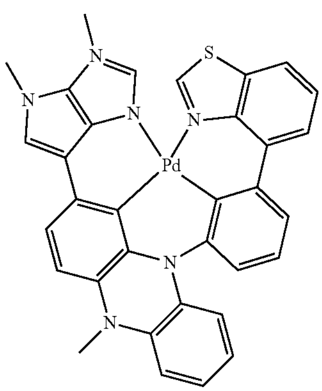
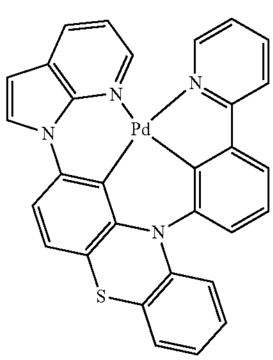
-continued
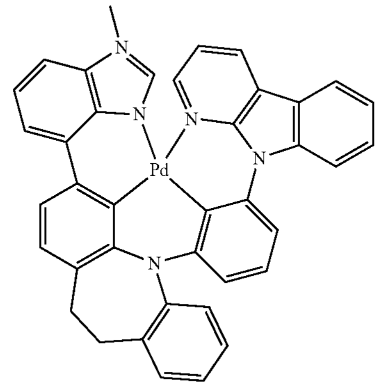
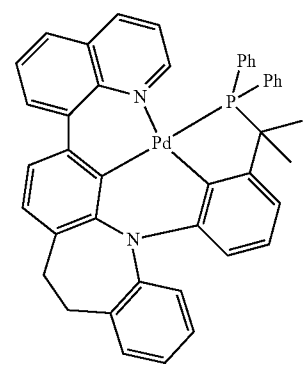
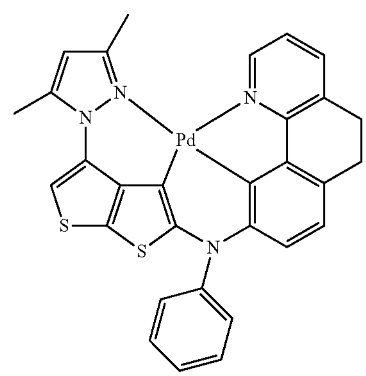
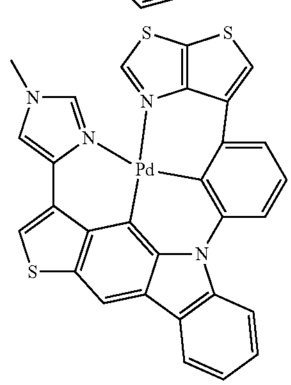

-continued
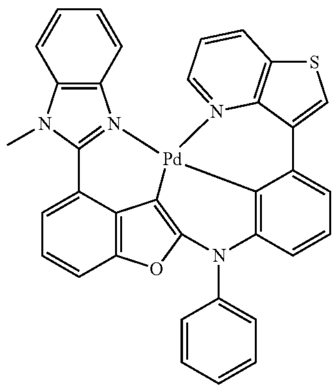
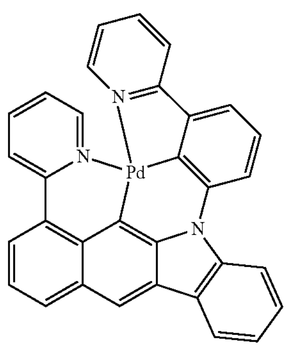
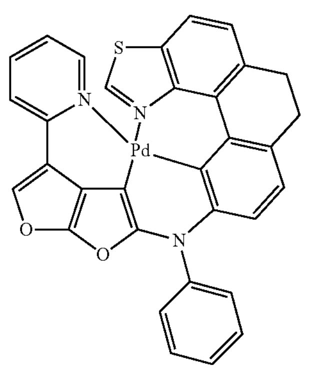
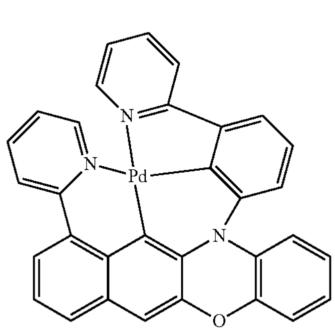
-continued
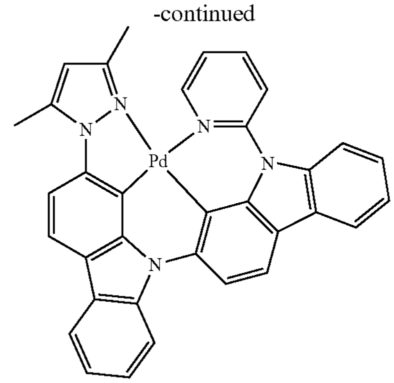
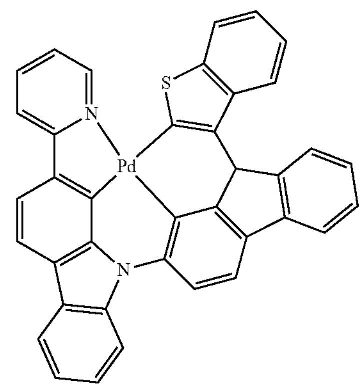
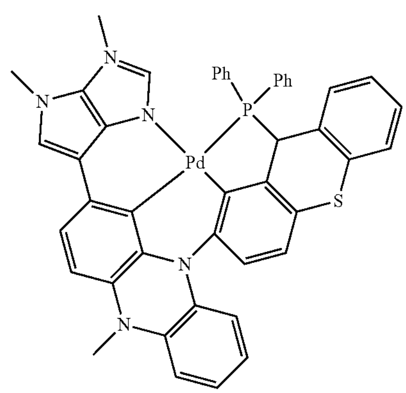
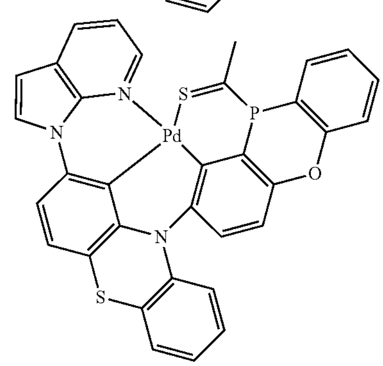

-continued
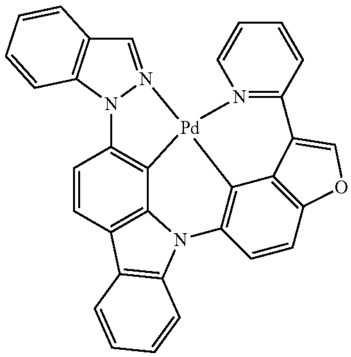
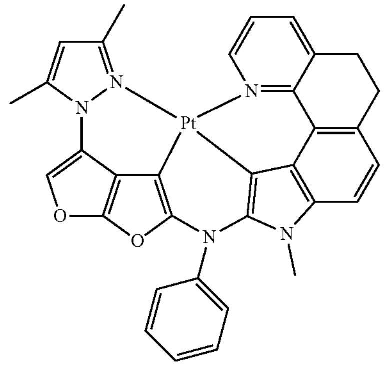
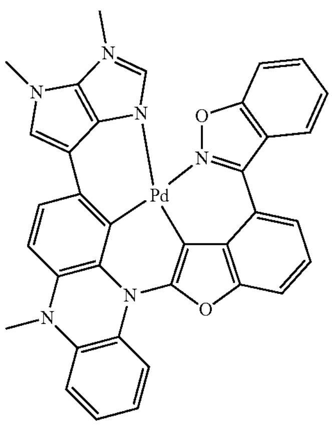
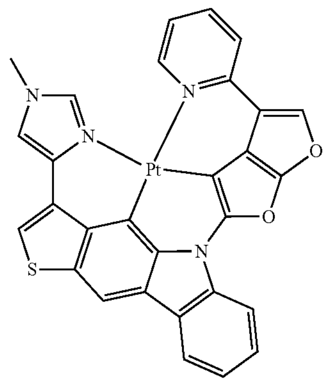
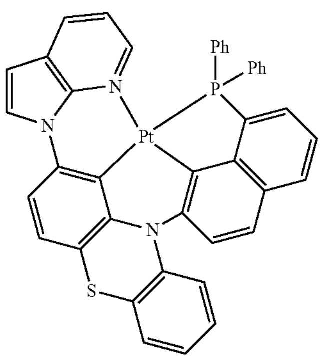
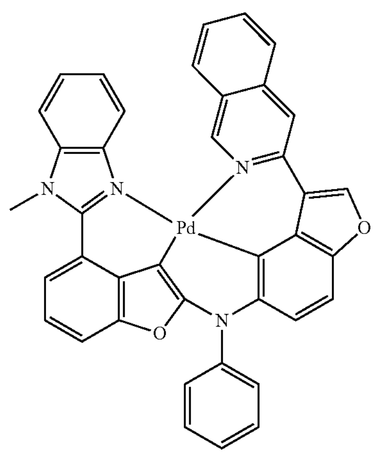
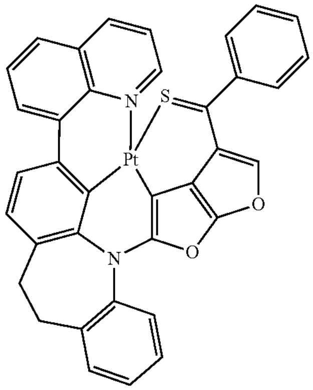
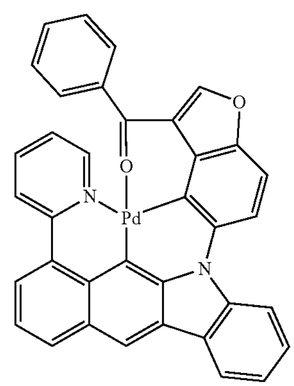

-continued
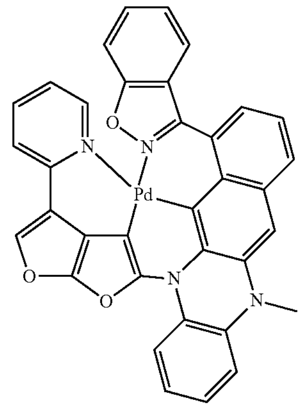
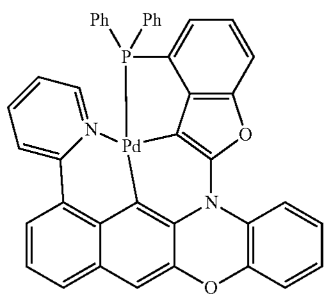
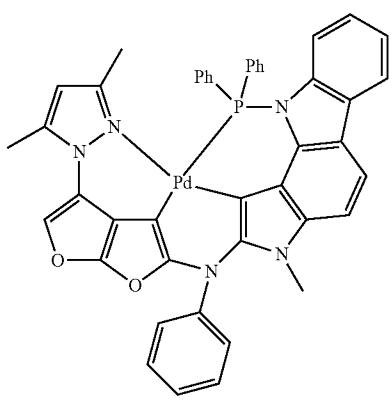
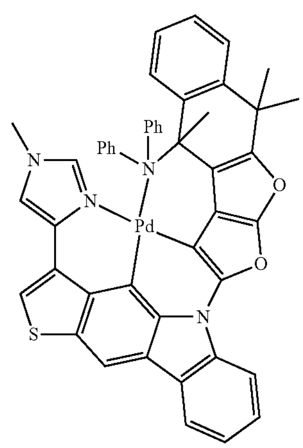
-continued
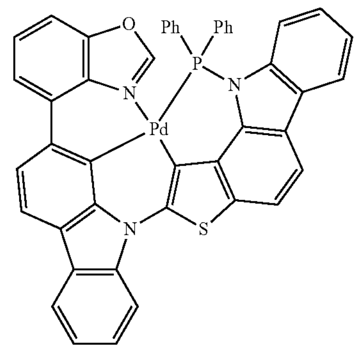
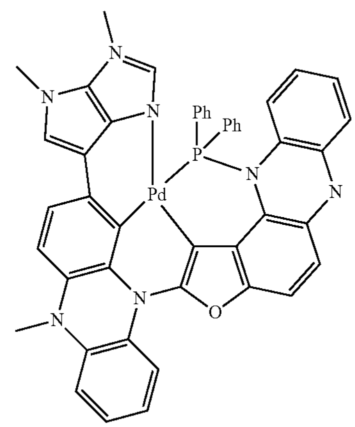
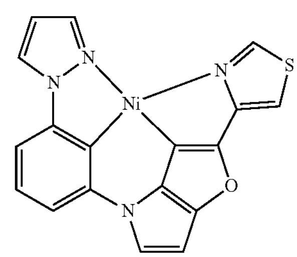
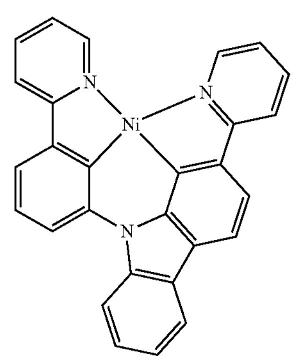

-continued
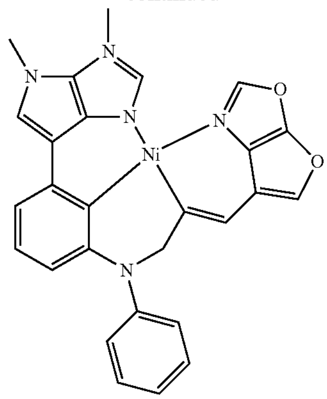
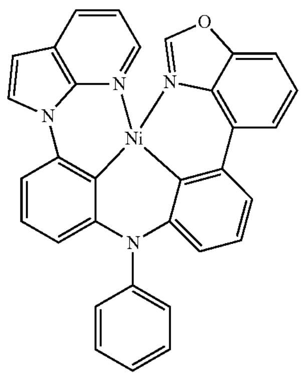
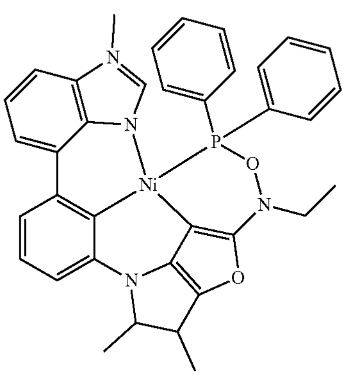
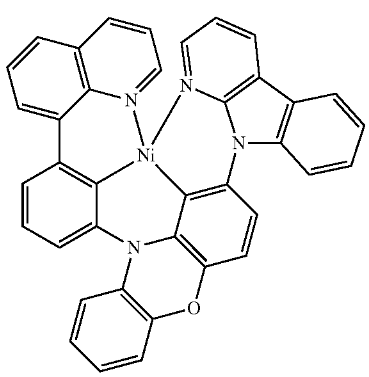
-continued
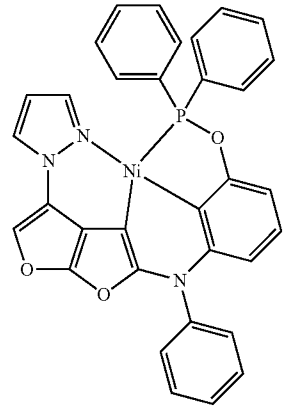
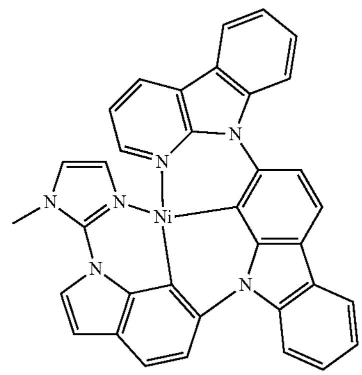
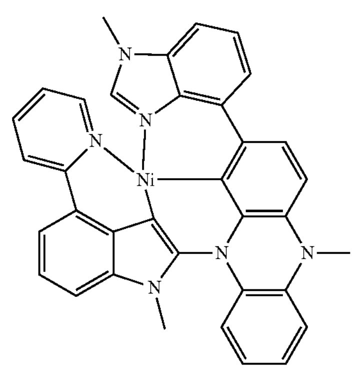
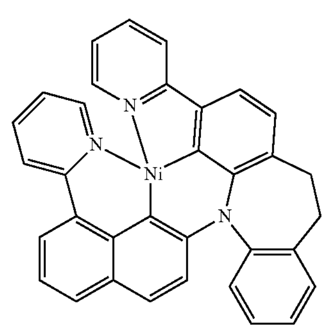

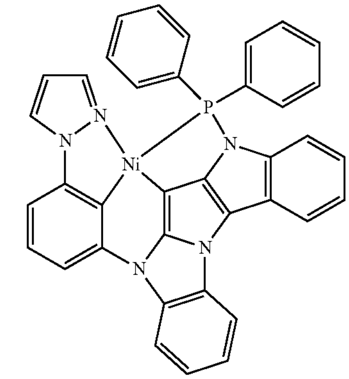
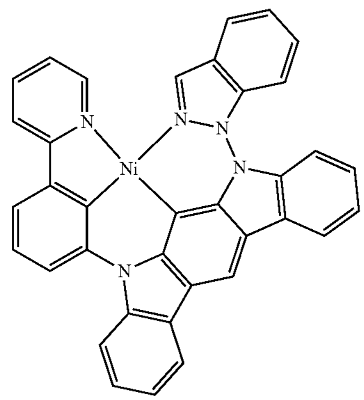
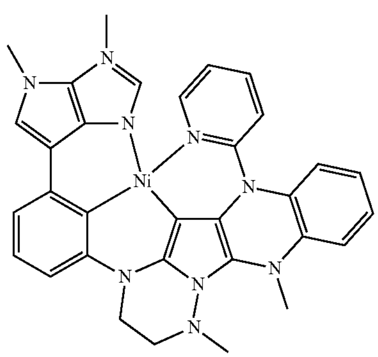
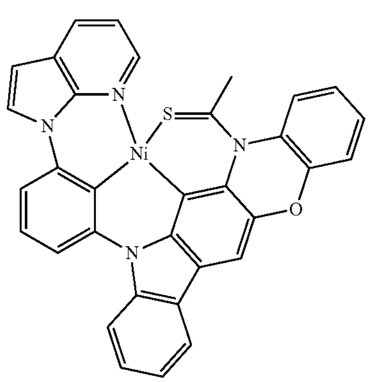
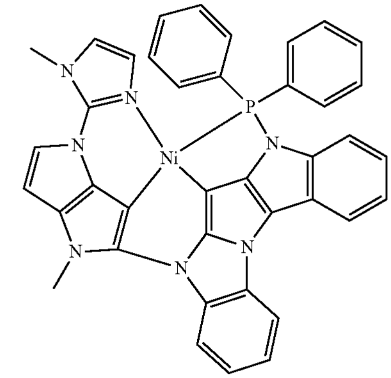
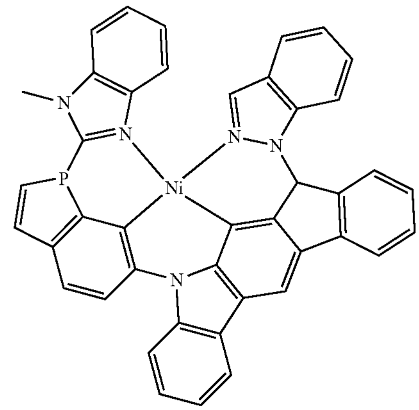
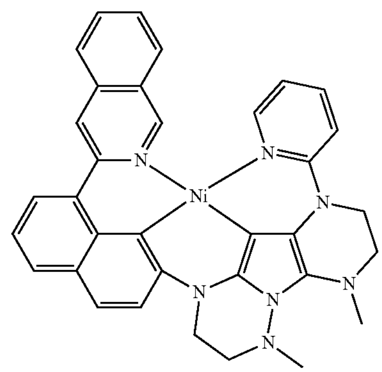
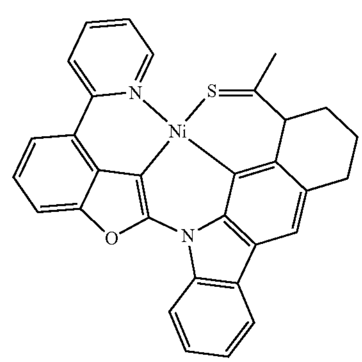

-continued
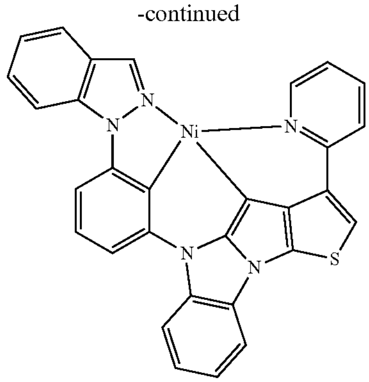
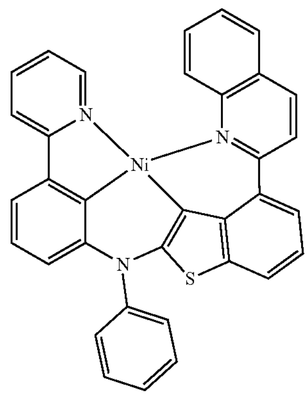
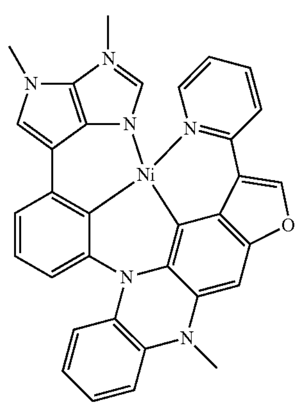
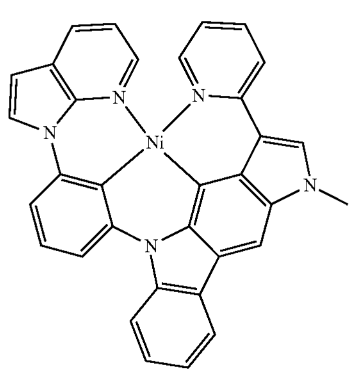
-continued
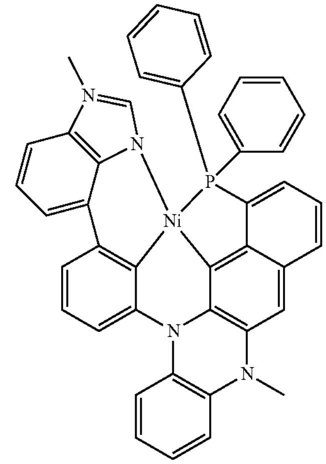
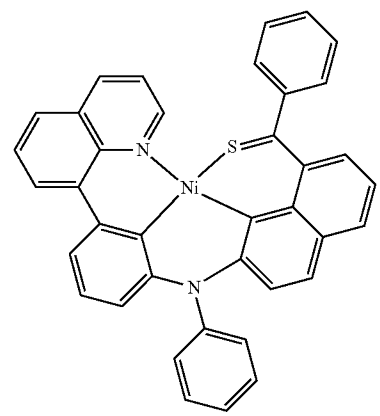
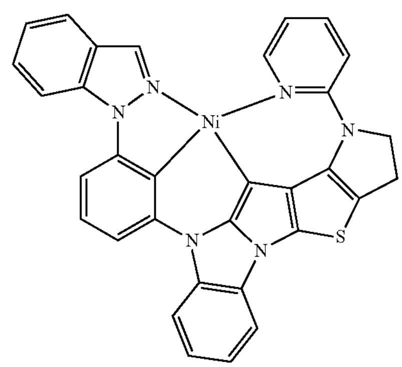
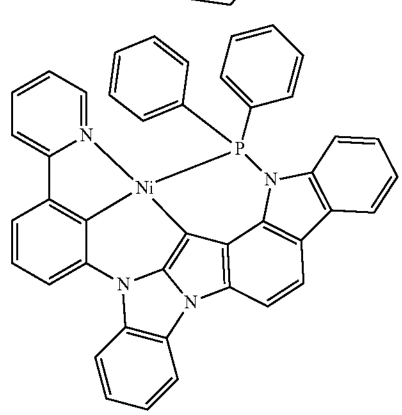

-continued
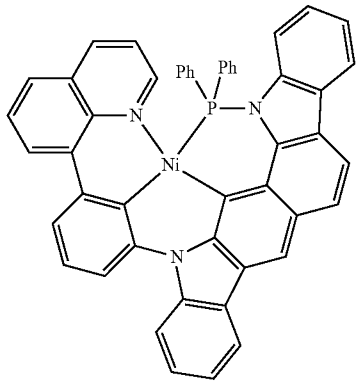
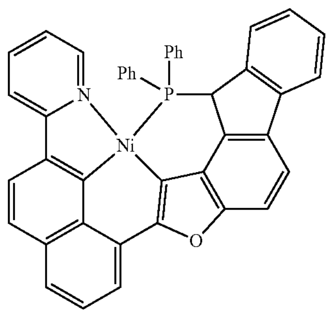
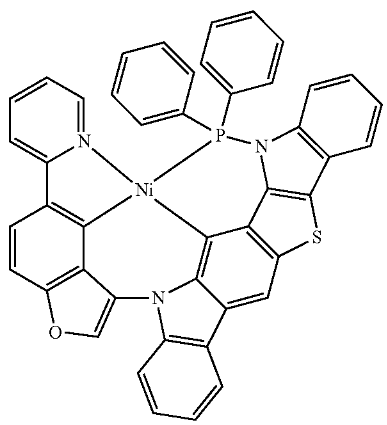
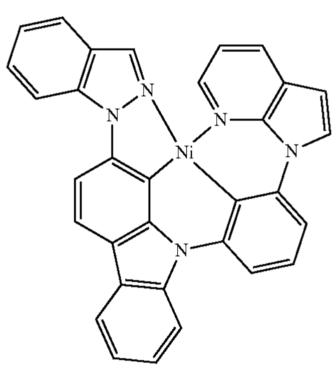
-continued
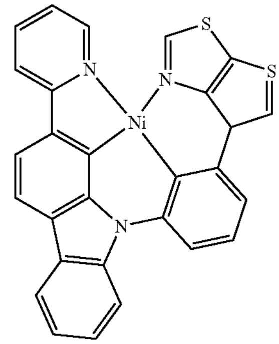
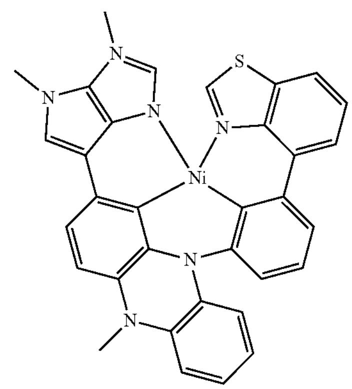
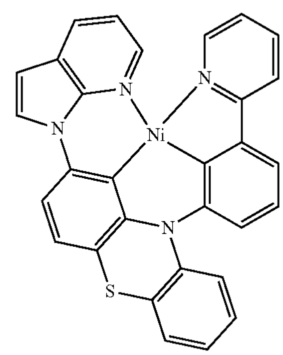
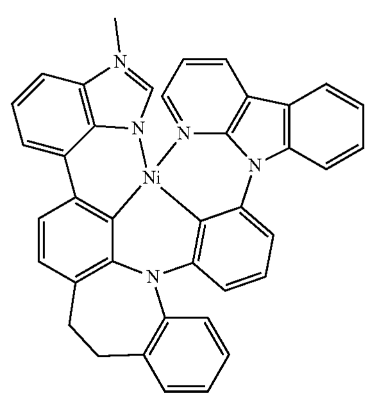

-continued
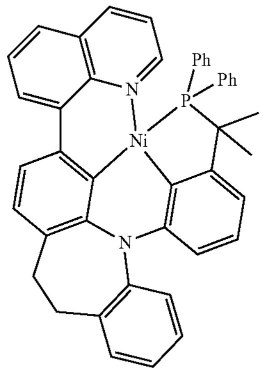
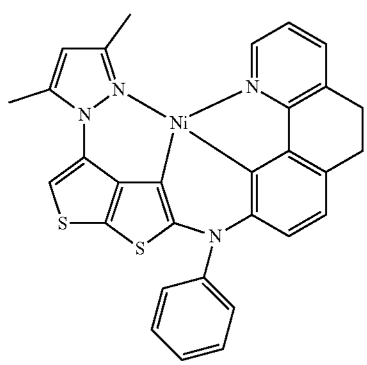
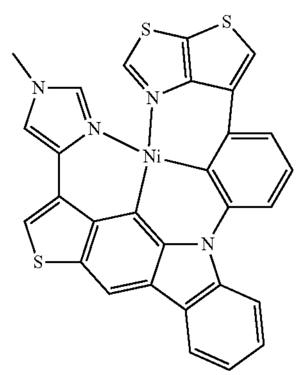
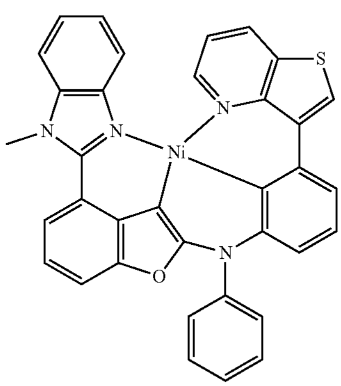
-continued
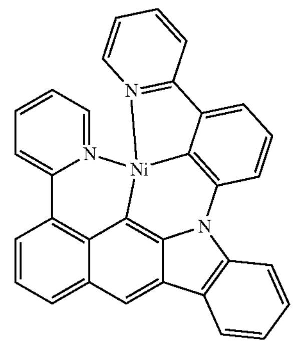
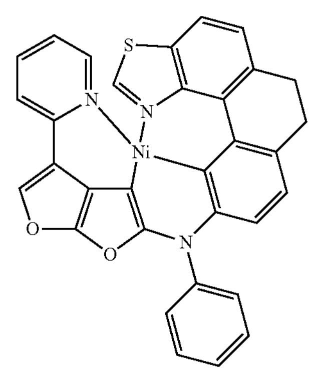
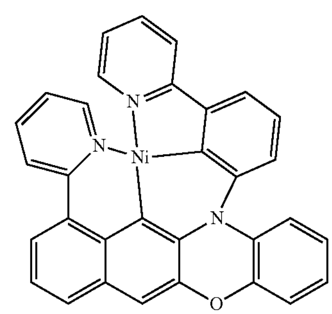
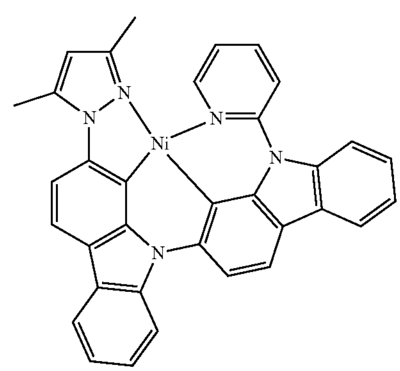

-continued
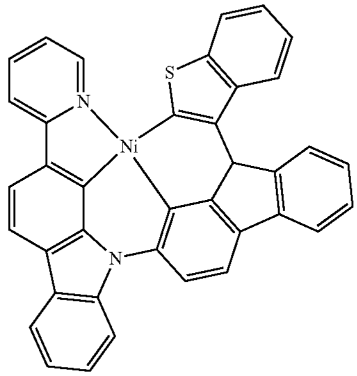
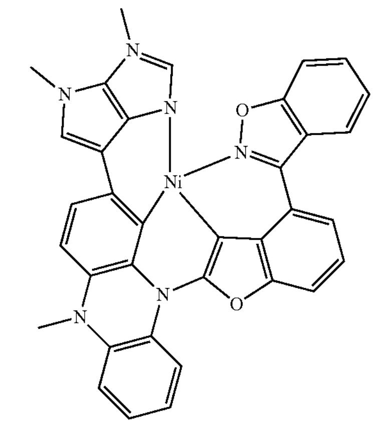
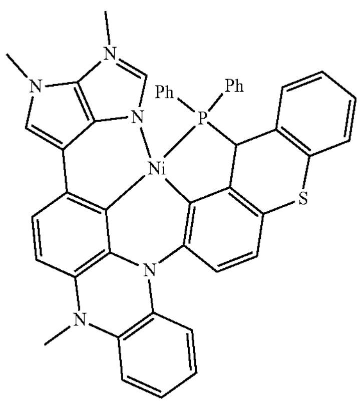
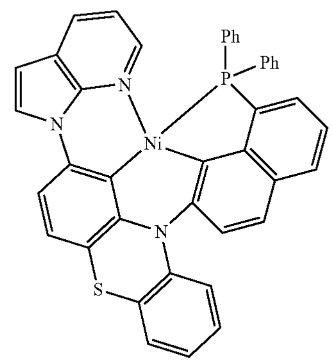
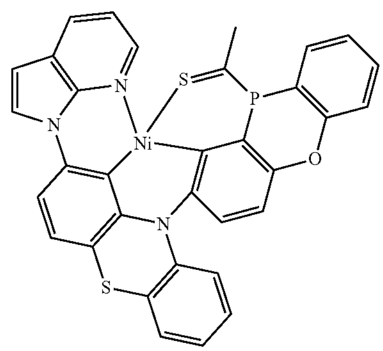
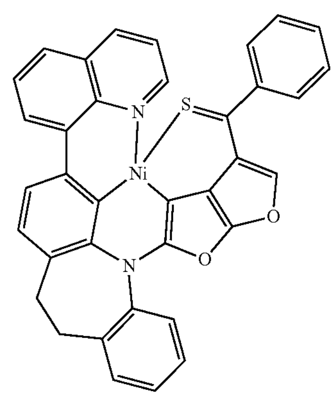
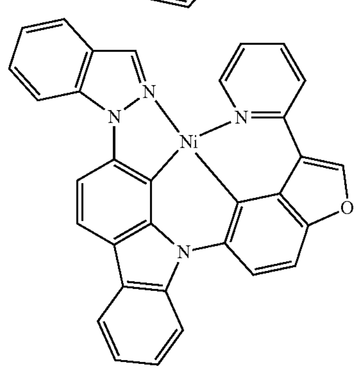
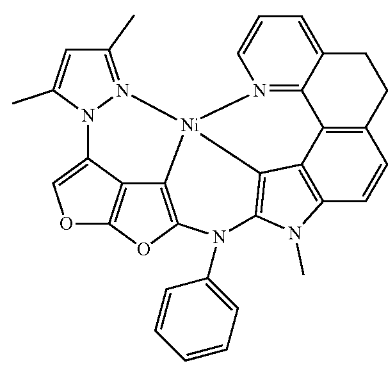

-continued
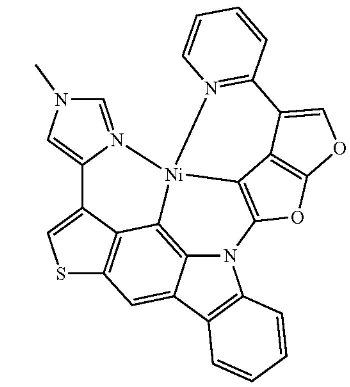
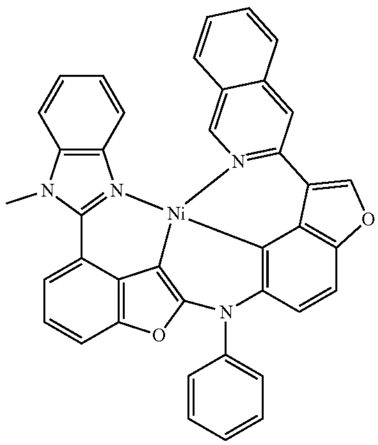
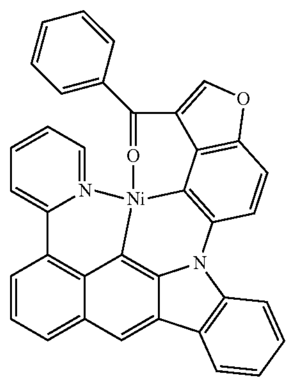
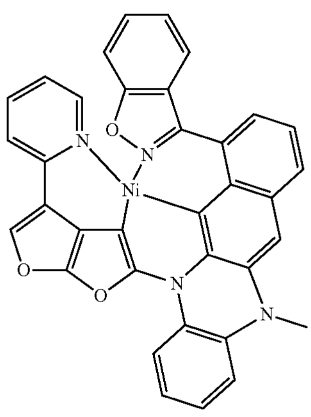
-continued
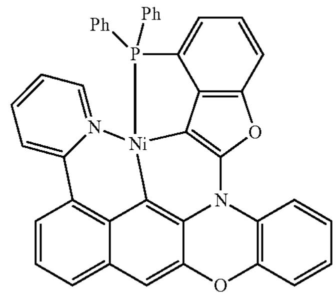
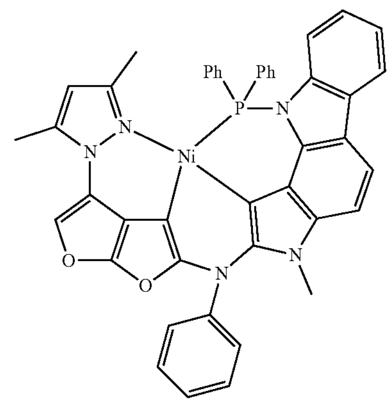
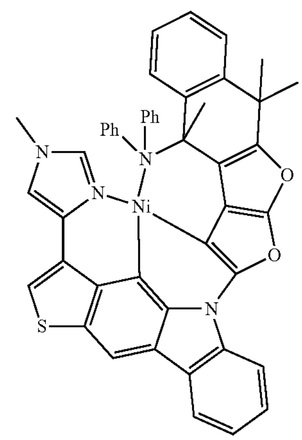
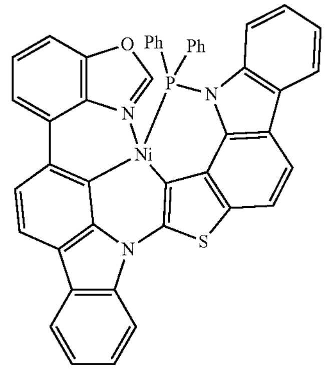

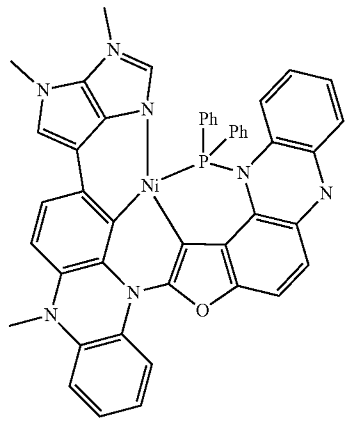
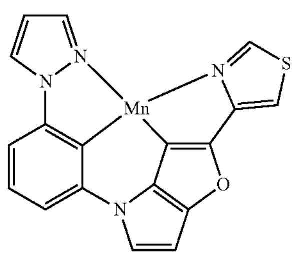
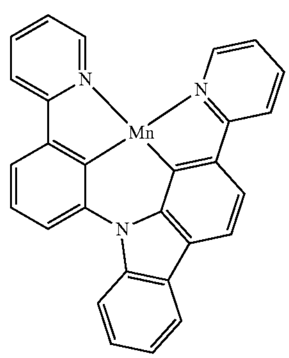
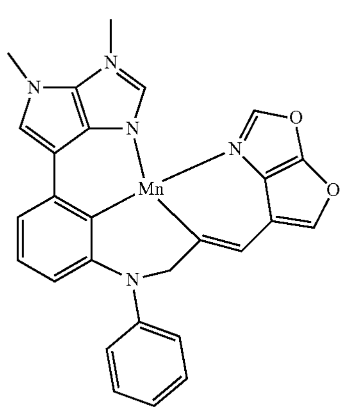
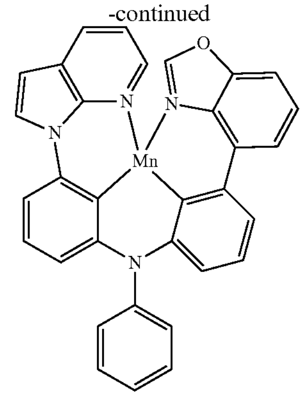
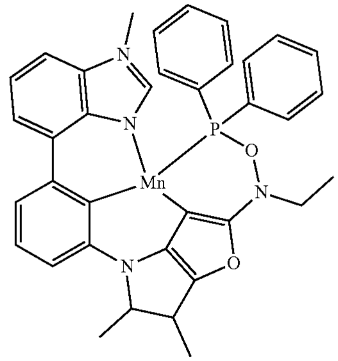
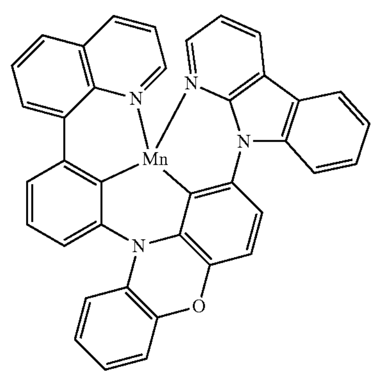
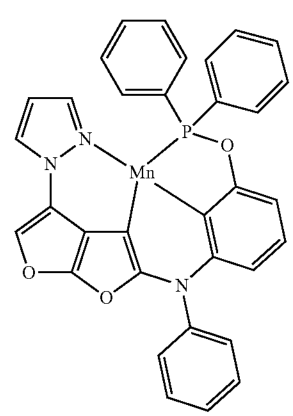

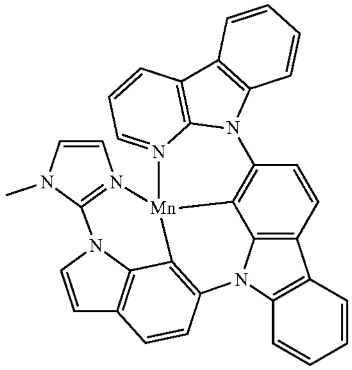
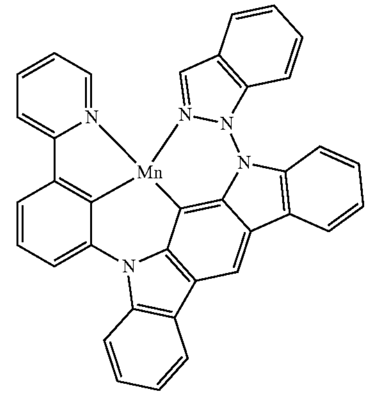
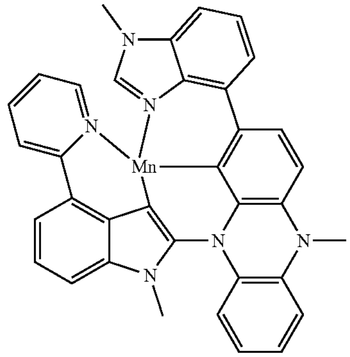
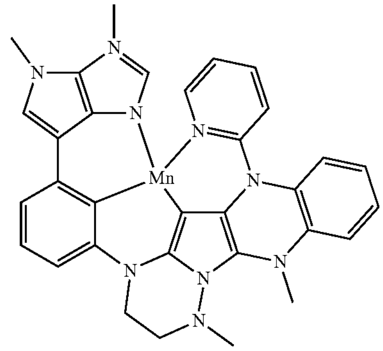
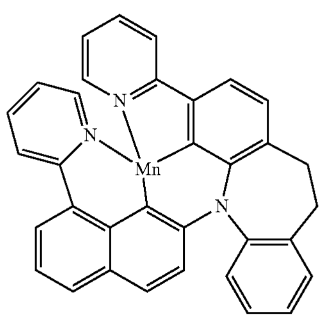
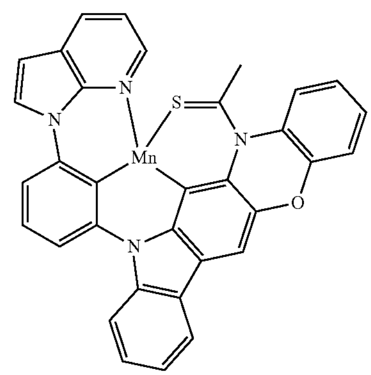
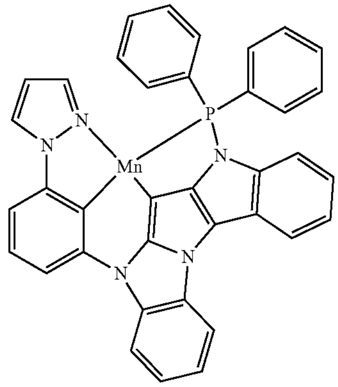
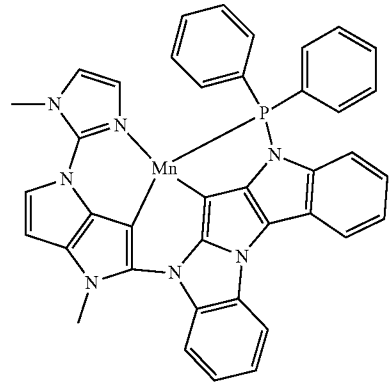

-continued
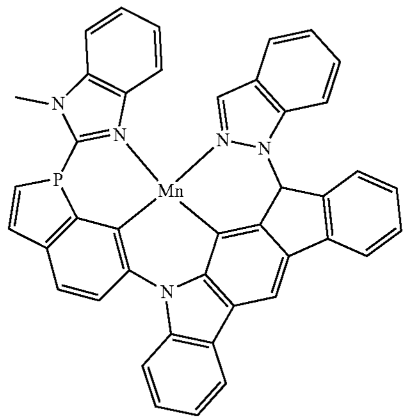
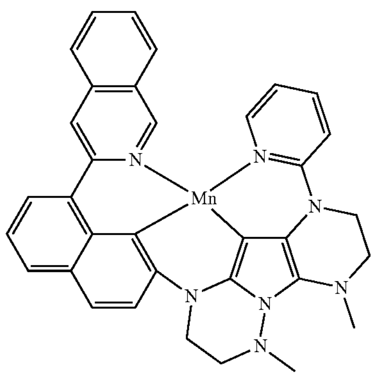
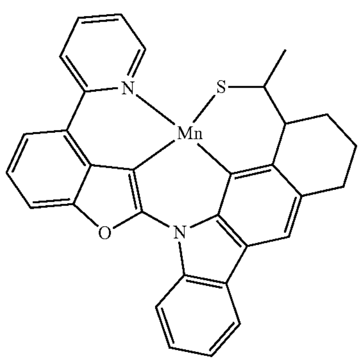
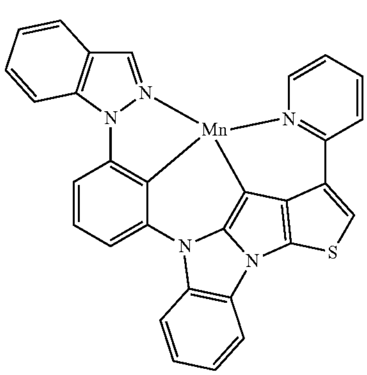
-continued
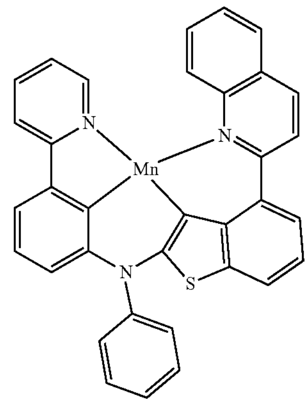
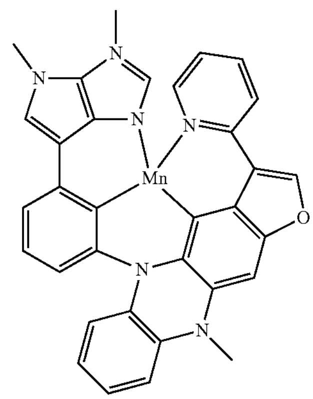
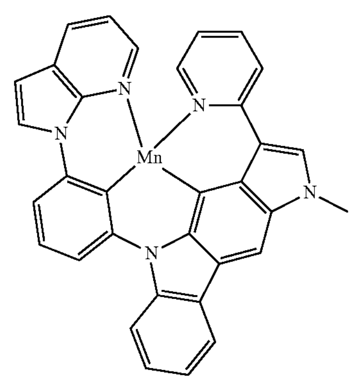
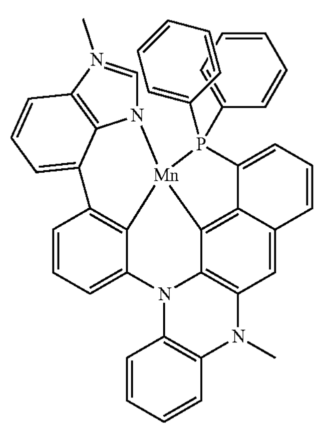

-continued
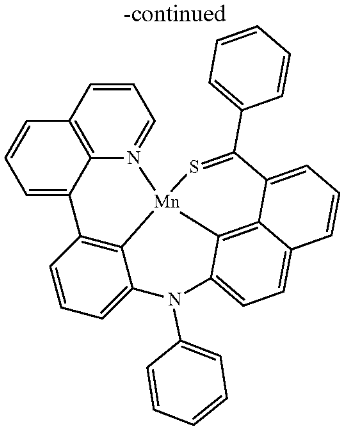
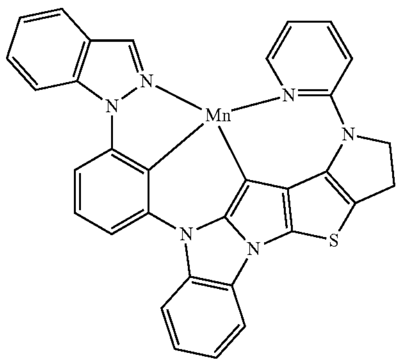
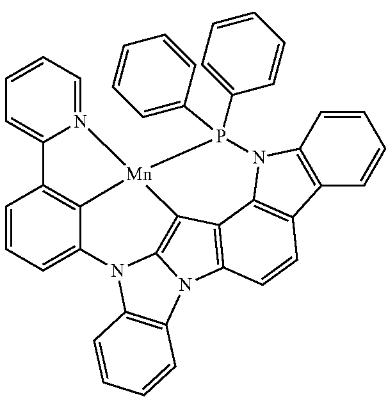
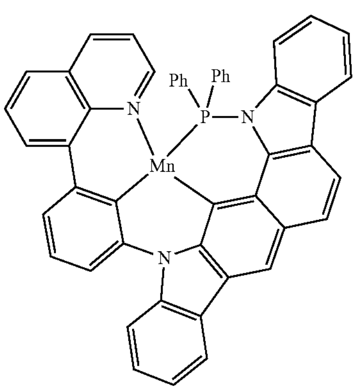
-continued
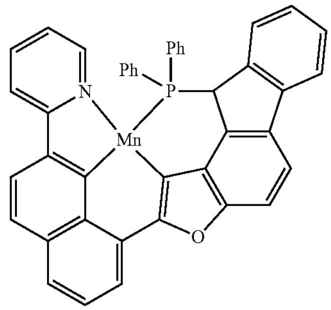
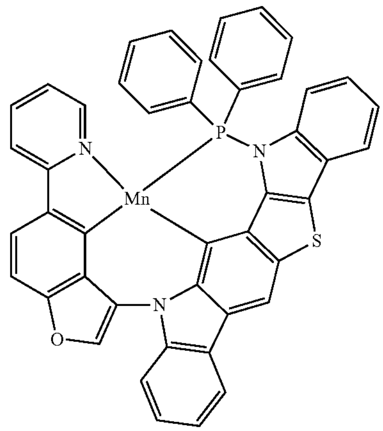
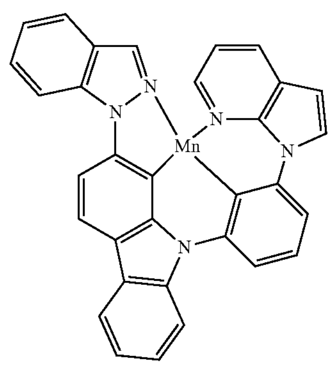
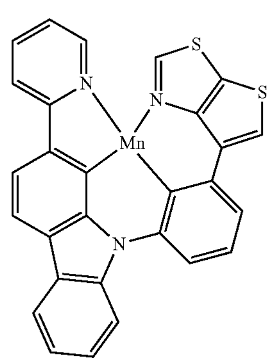

-continued
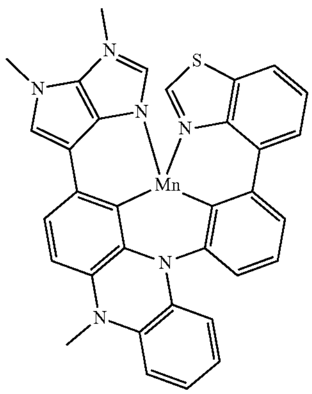
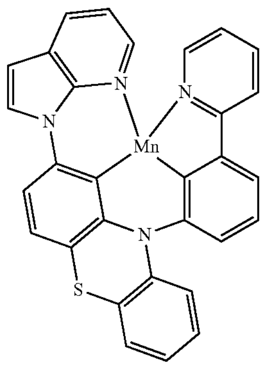
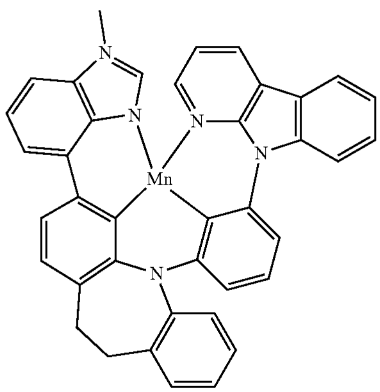
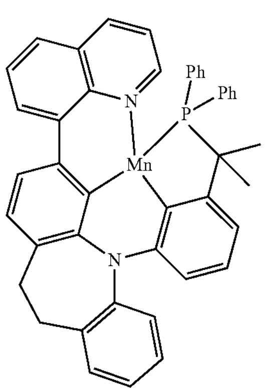
-continued
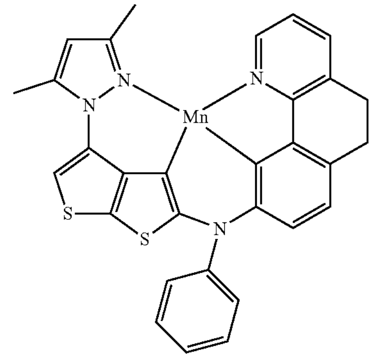
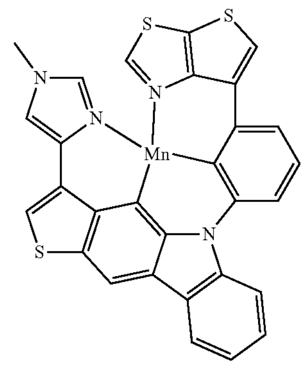
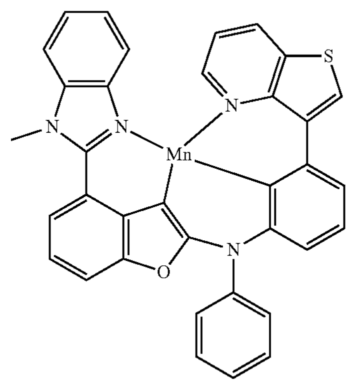
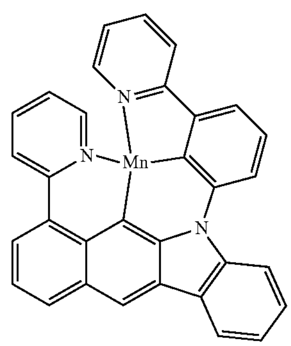

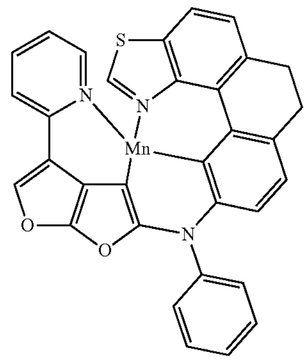
S
N
N
Mn
O
O
N
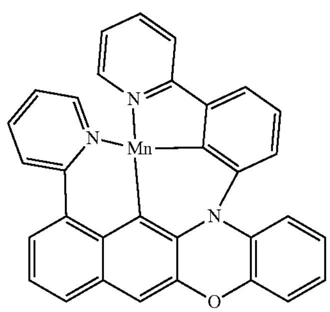
N
N
Mn
N
O
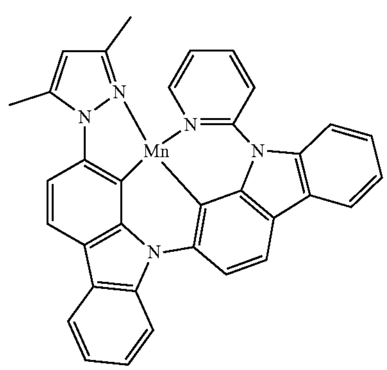
N
N
Mn
N
N
N
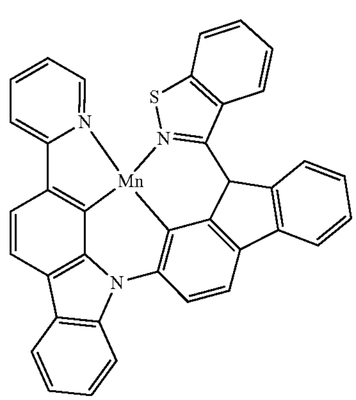
N
S
N
Mn
N
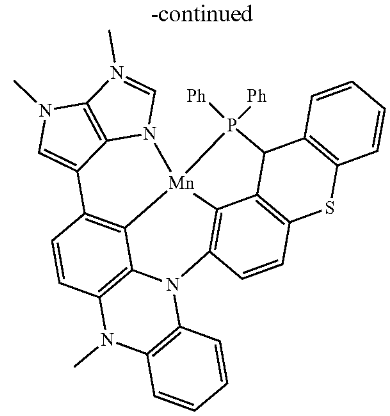
N
N
N
Ph
Ph
P
Mn
S
N
N
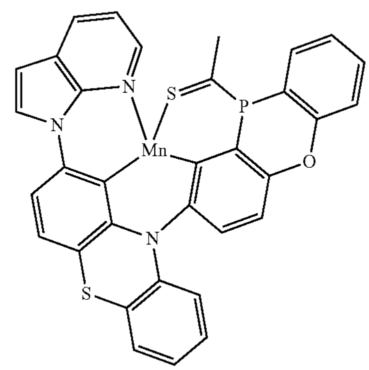
N
N
S
P
Mn
O
N
S
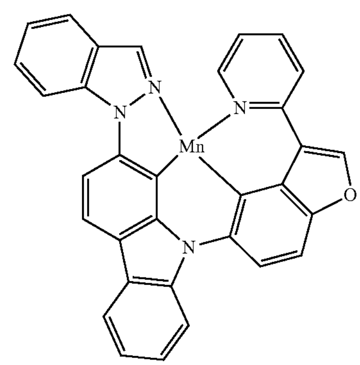
N
N
N
Mn
O
N
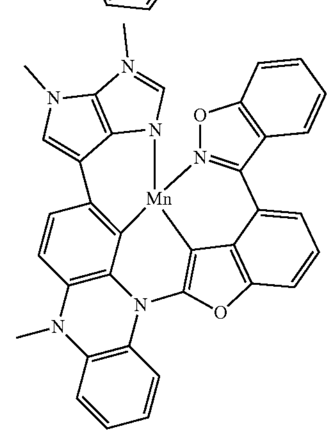
N
N
N
O
N
Mn
N
O
N -continued
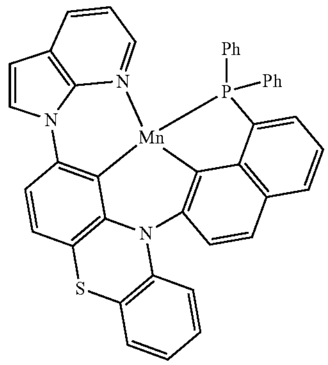
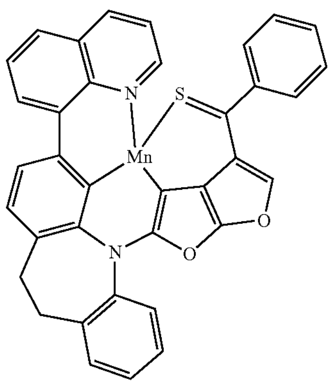
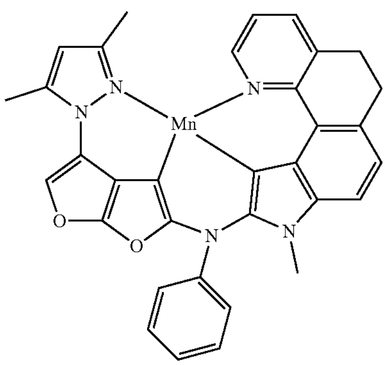
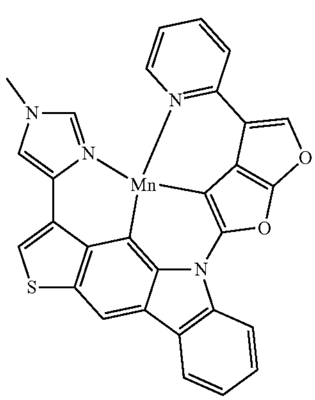
-continued
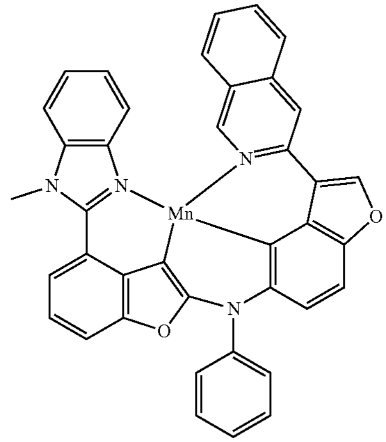
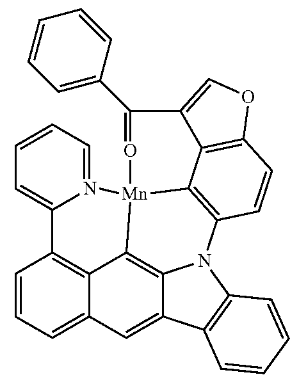
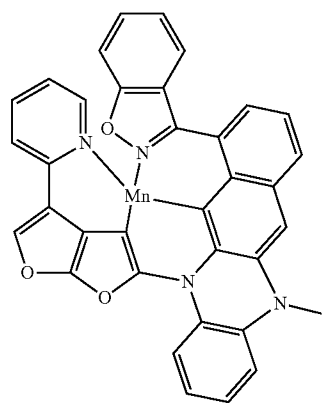
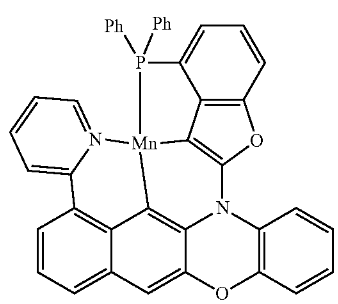

-continued
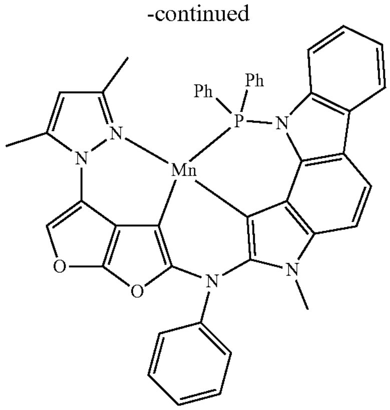
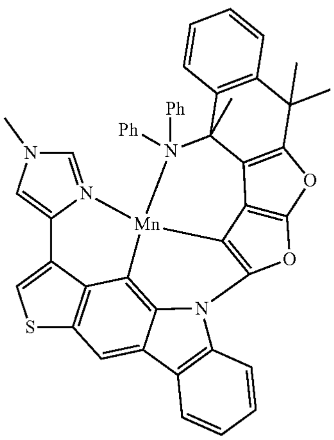
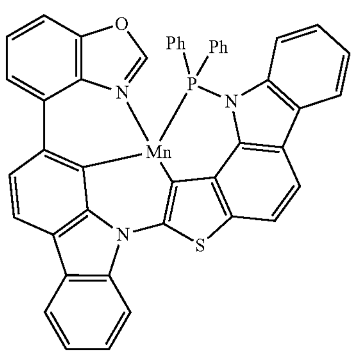
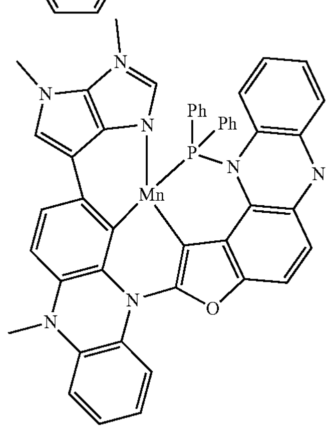
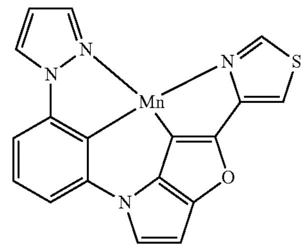
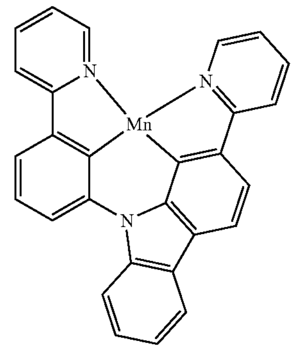
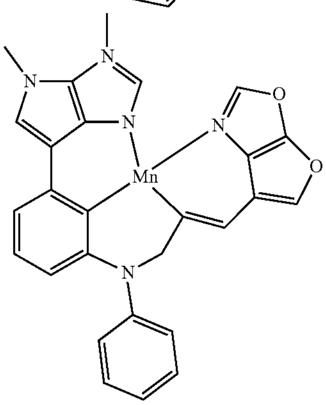
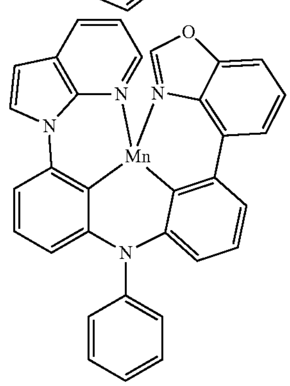
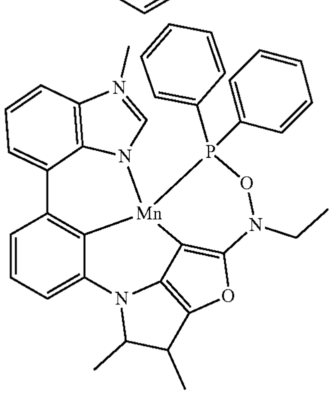

-continued
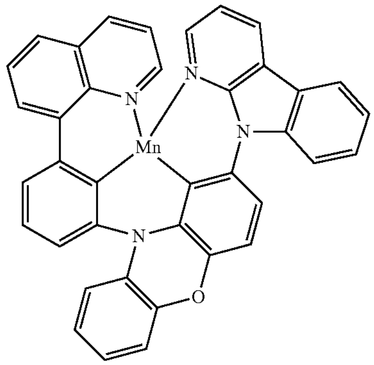
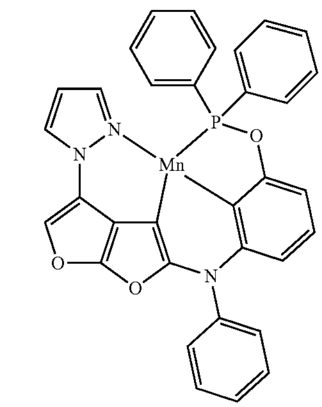
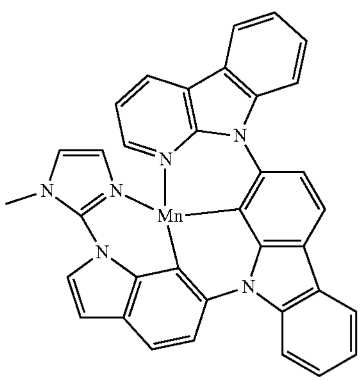
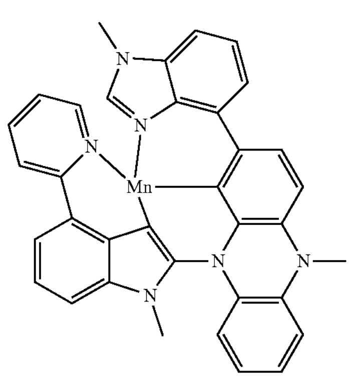
-continued
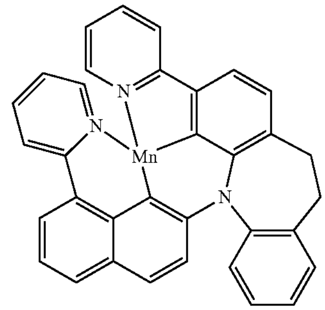
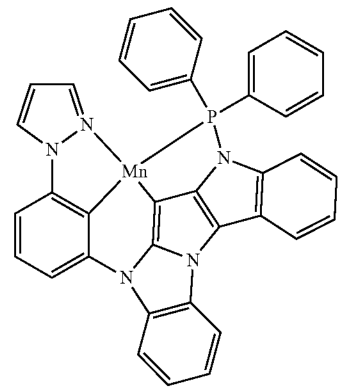
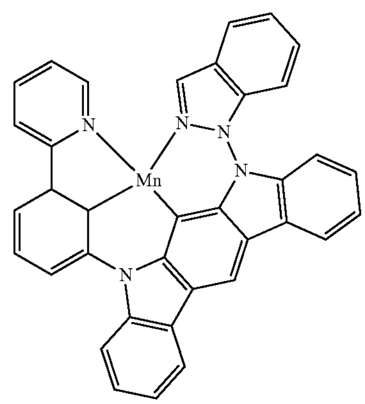
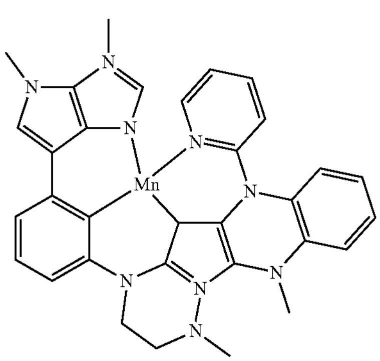

-continued
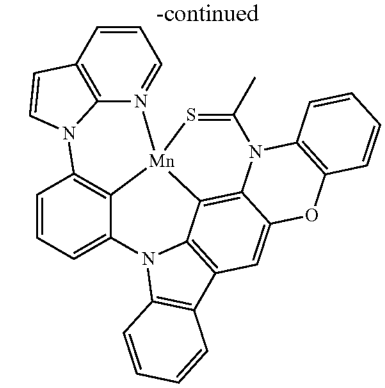
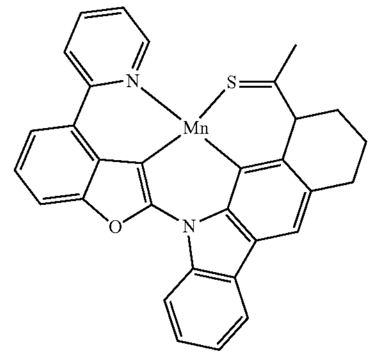
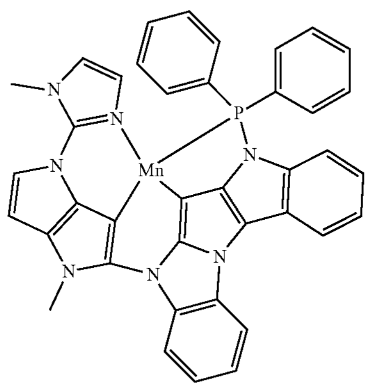
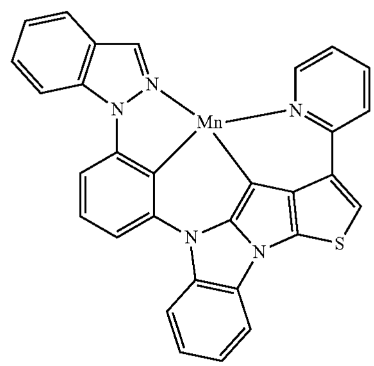
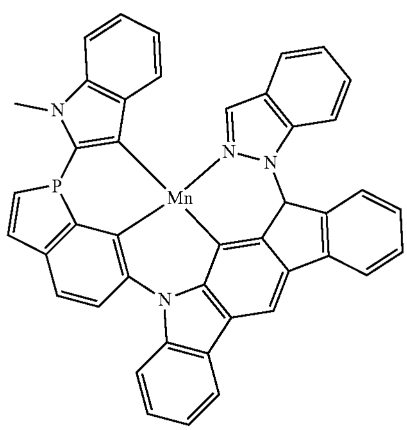
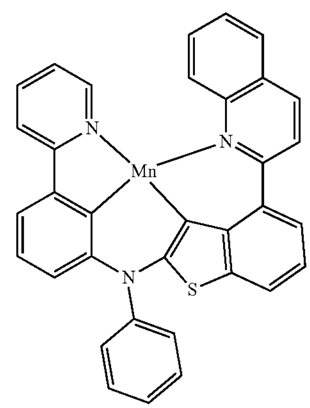
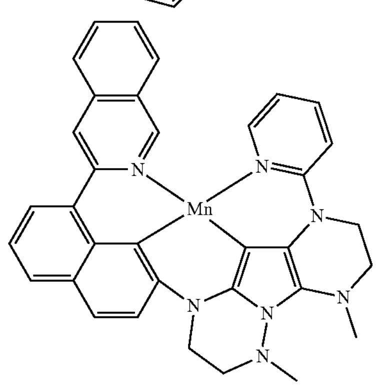
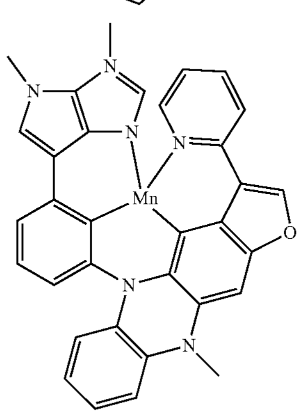

-continued
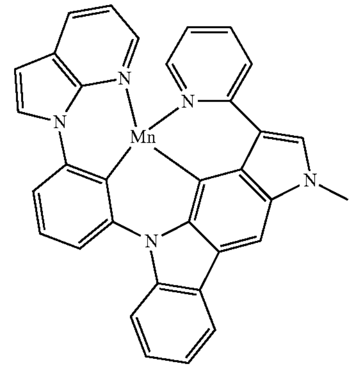
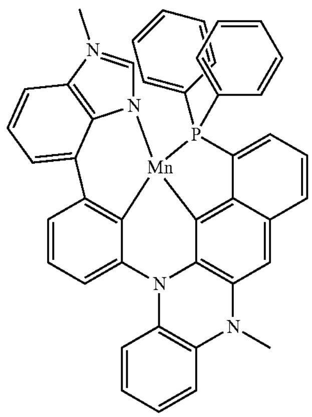
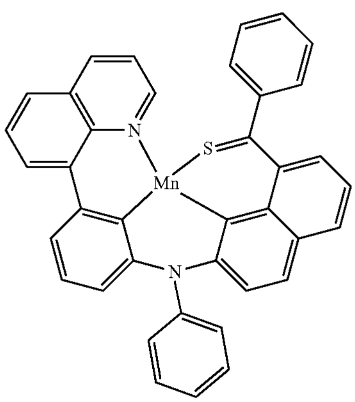
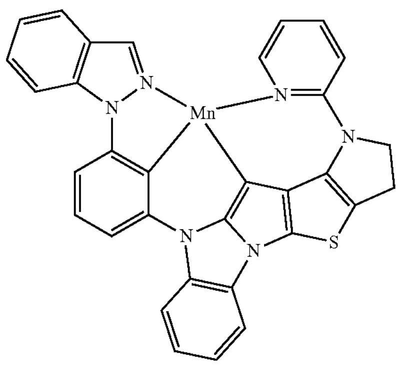
-continued
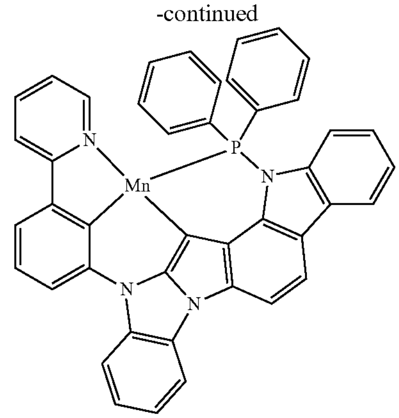
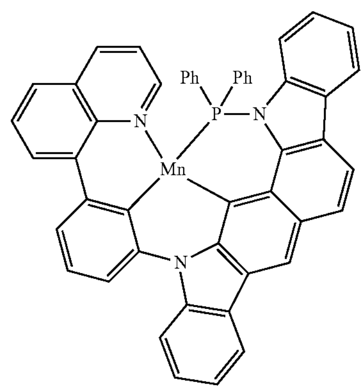
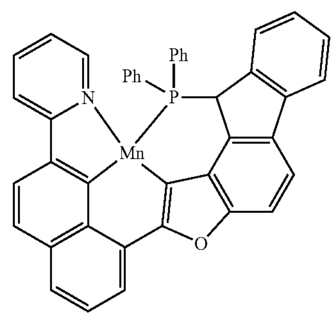
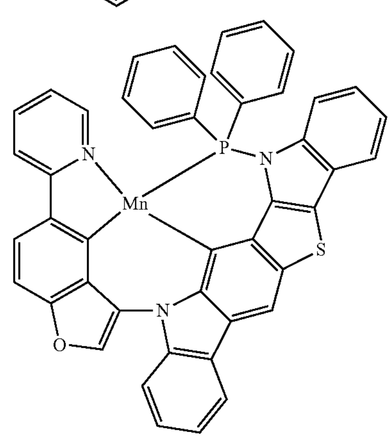

-continued
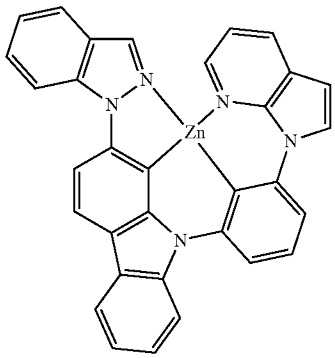
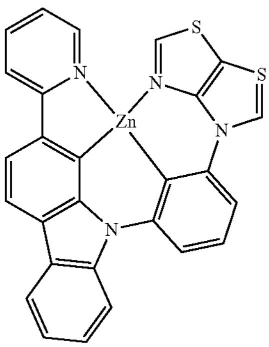
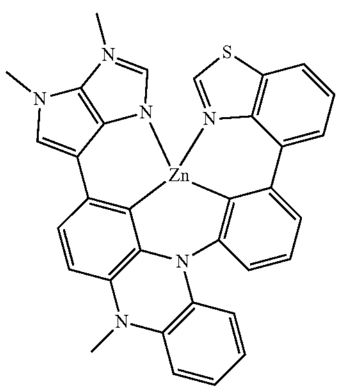
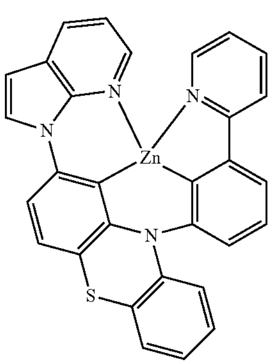
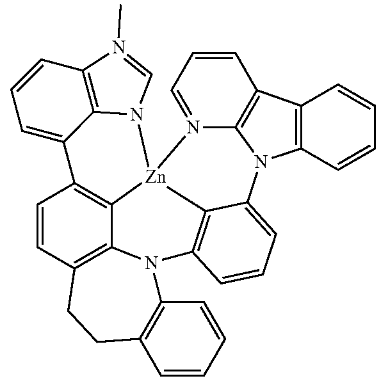
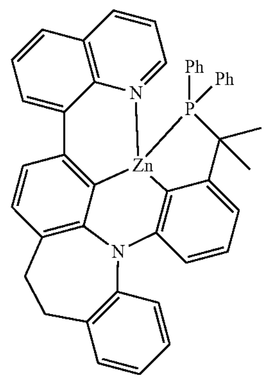
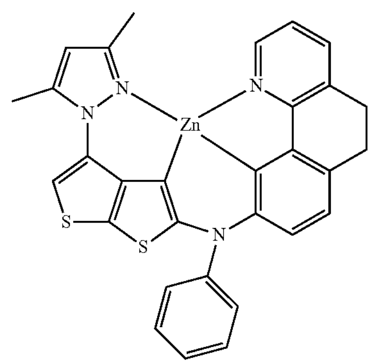
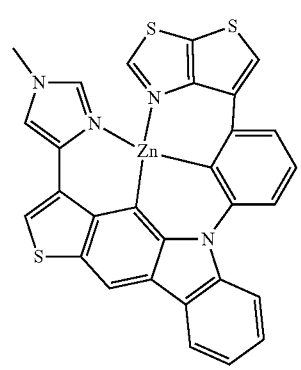

-continued
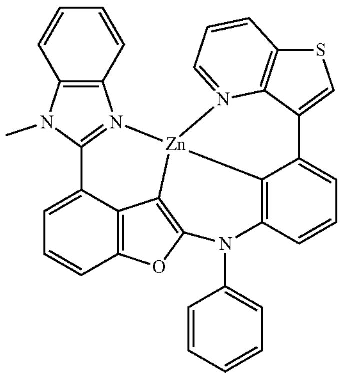
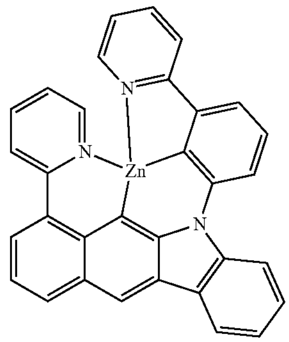
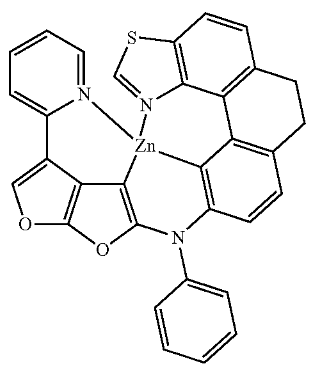
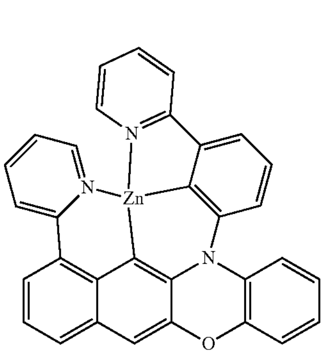
-continued
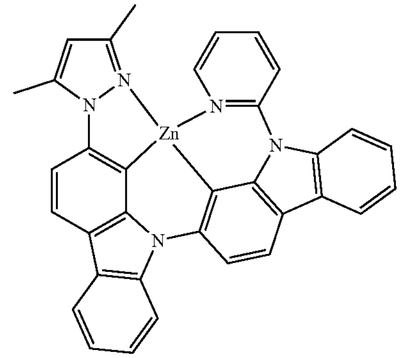
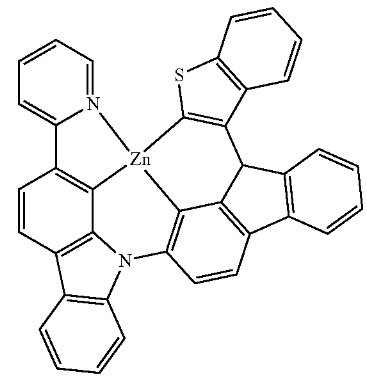
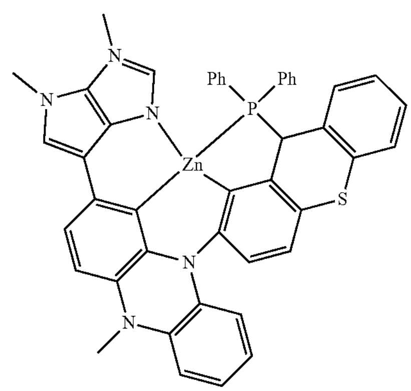
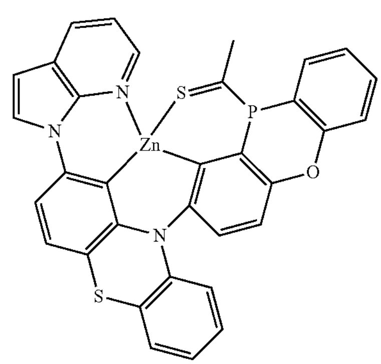

-continued
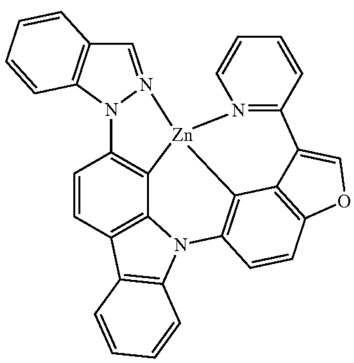
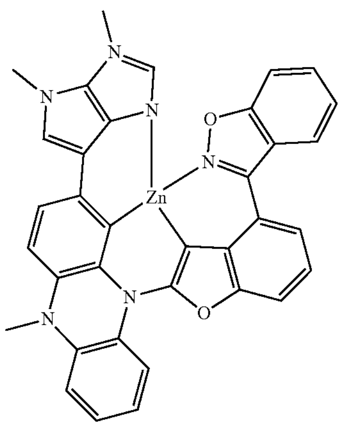
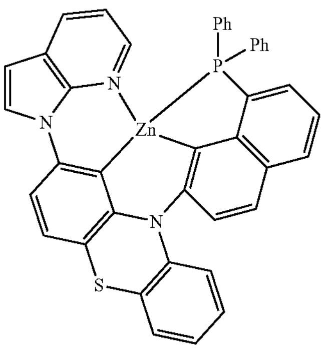
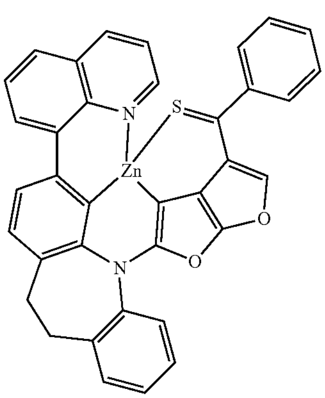
-continued
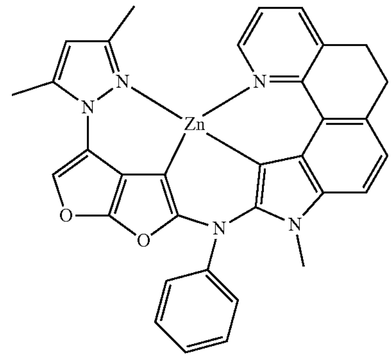
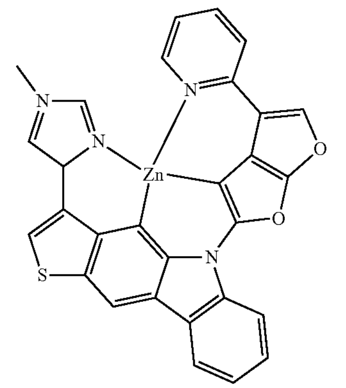
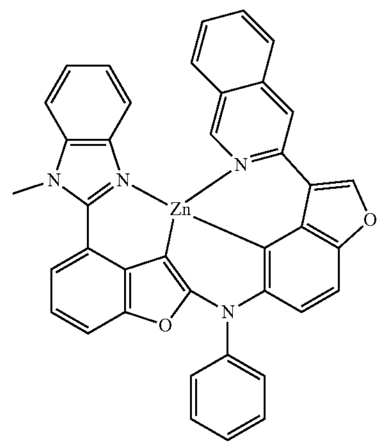
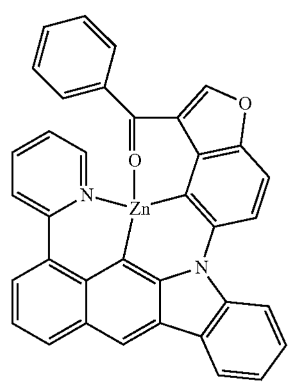

-continued
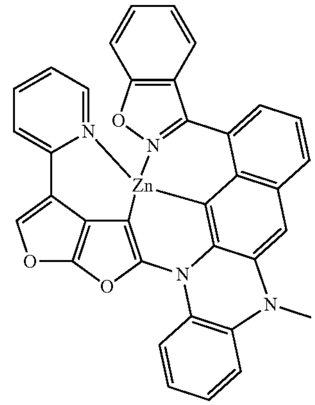
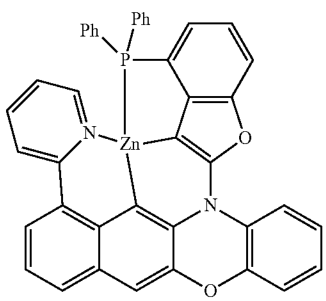
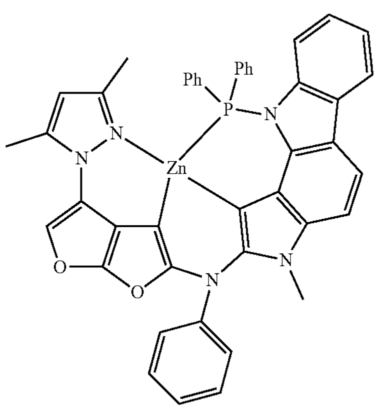
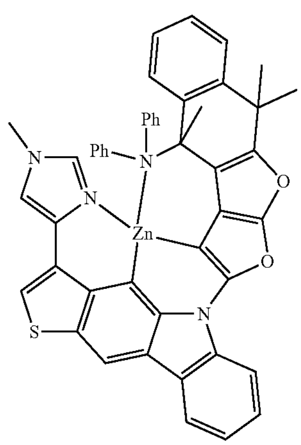
-continued
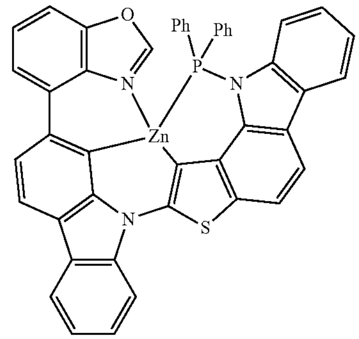
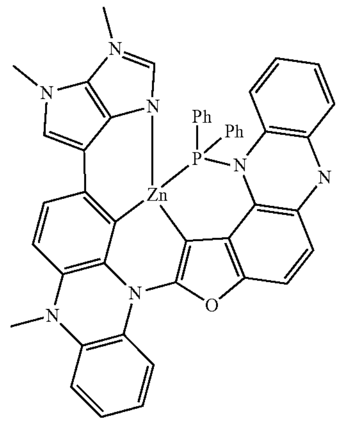
In another aspect, the inventive complex can comprise a neutral complex having the structure
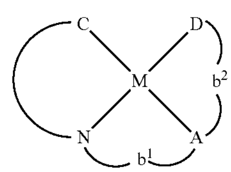
(b)
wherein the M represents a metal having a +2 oxidation state.
In various aspects, such an inventive complex can comprise any one or more of the following:
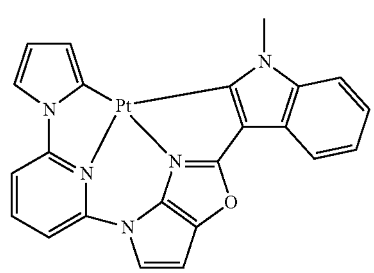

-continued
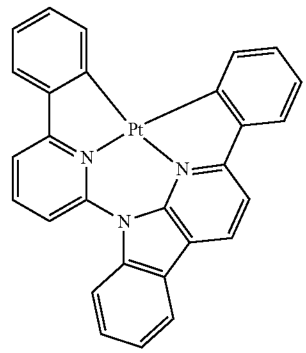
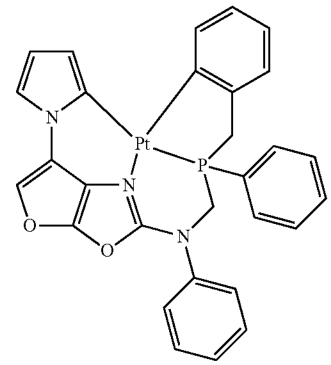
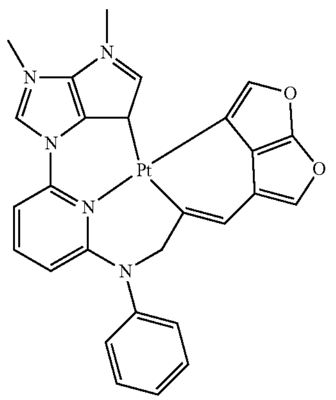
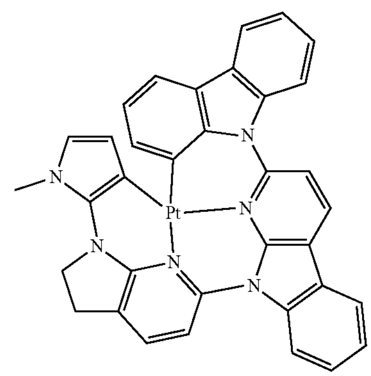
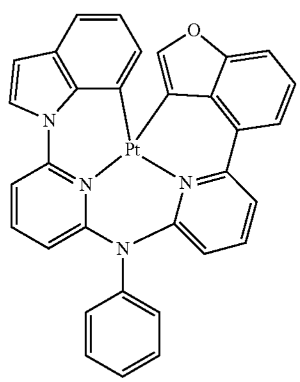
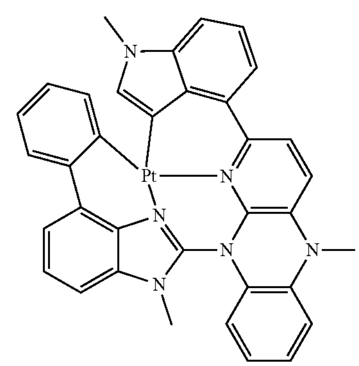
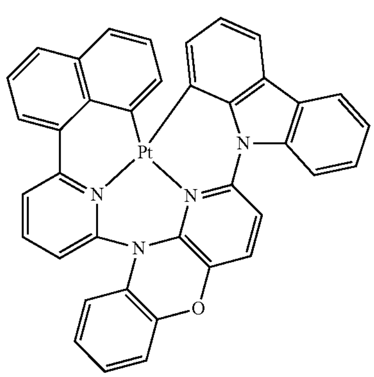
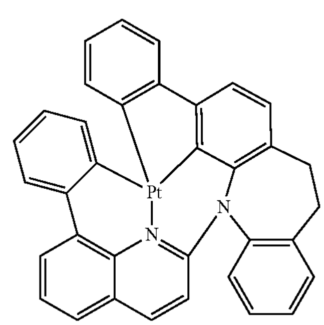
-continued -continued
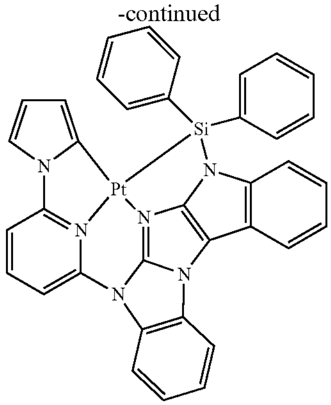
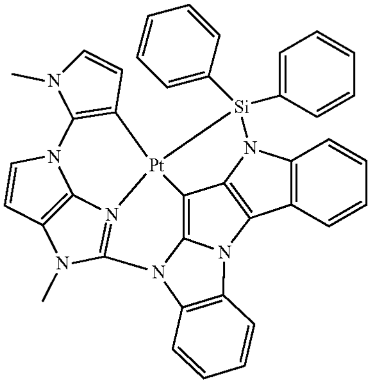
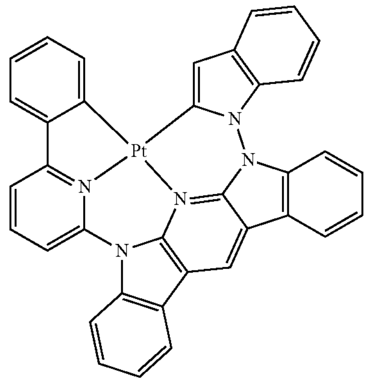
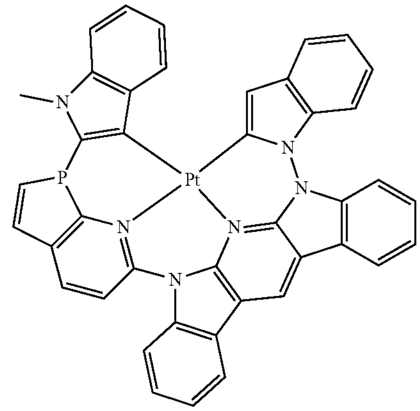
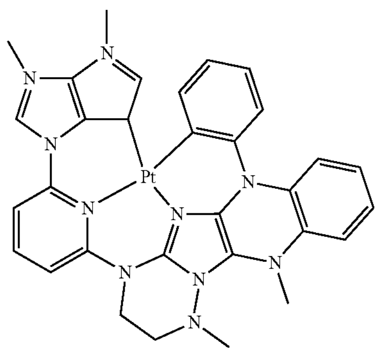
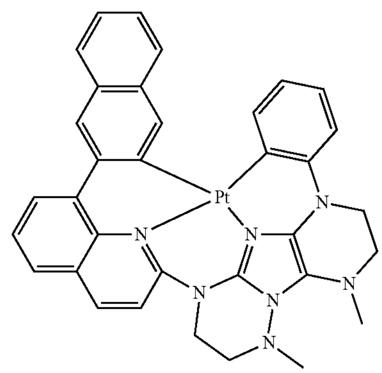
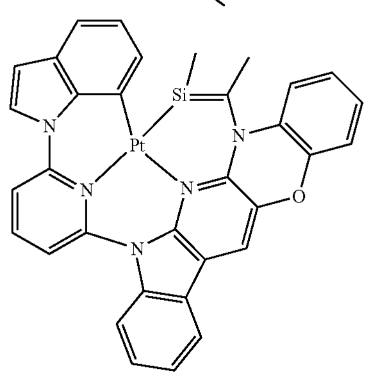
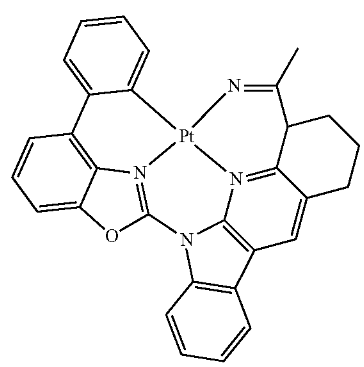
-continued -continued
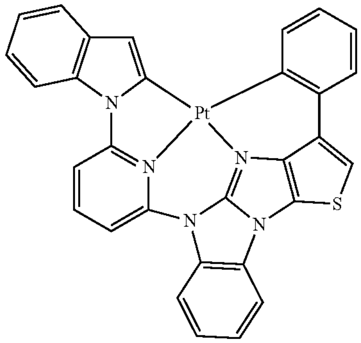
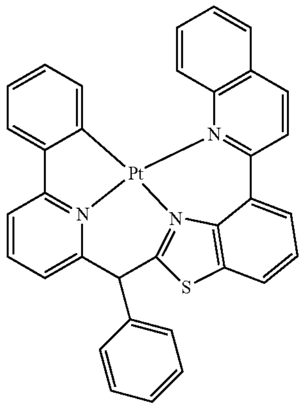
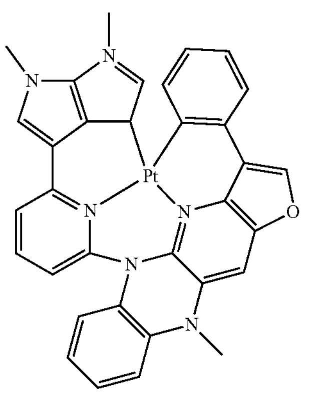
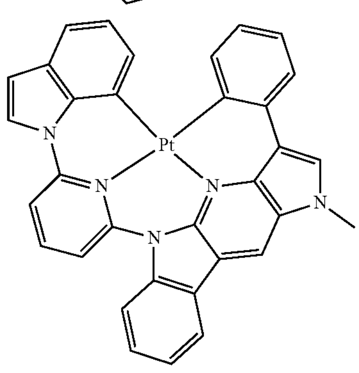
-continued
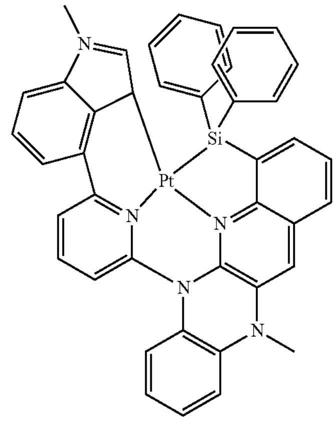
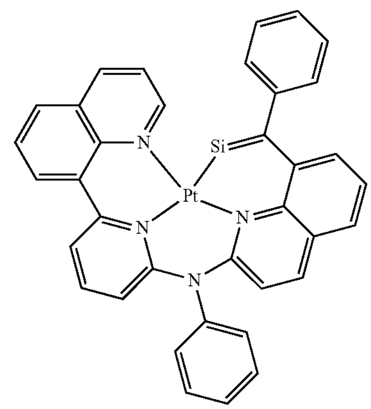
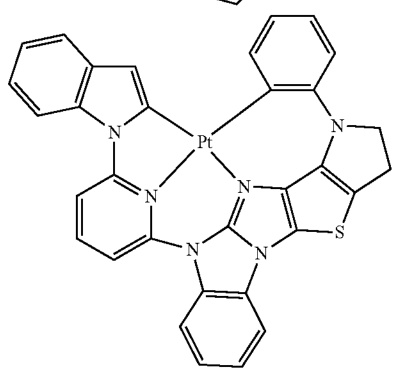
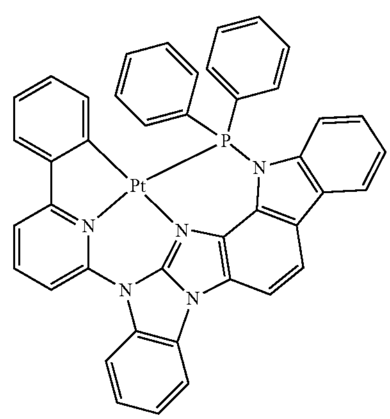

-continued
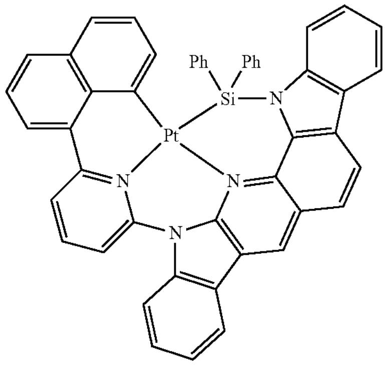
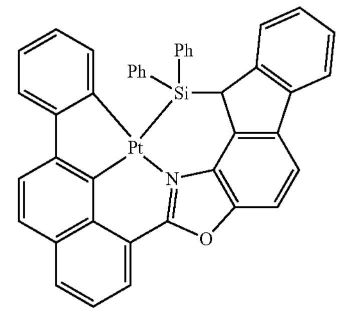
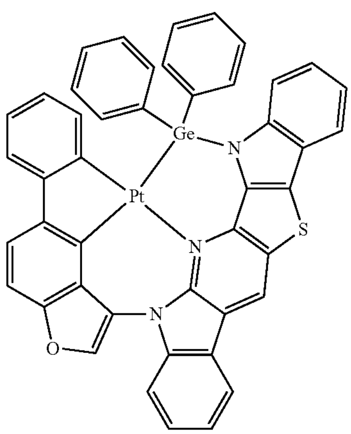
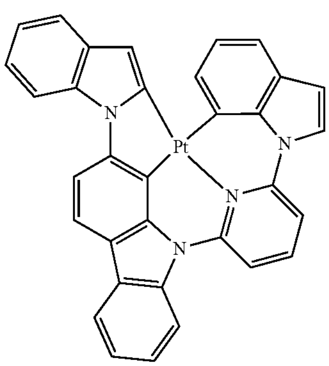
-continued
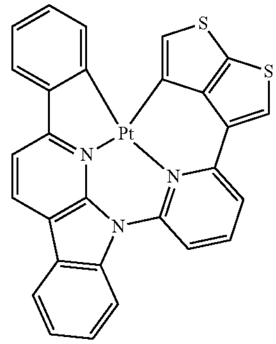
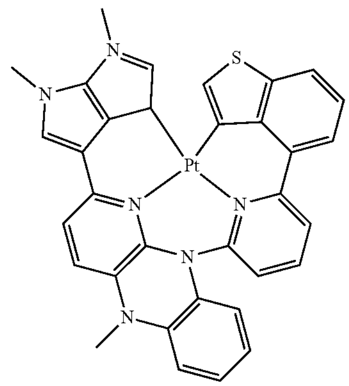
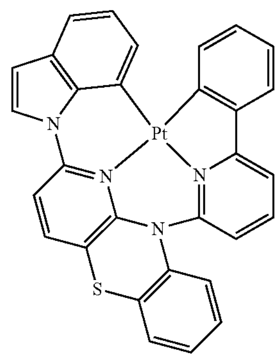
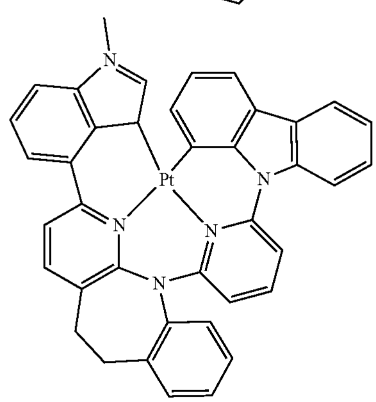

-continued
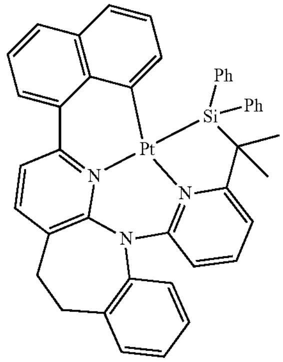
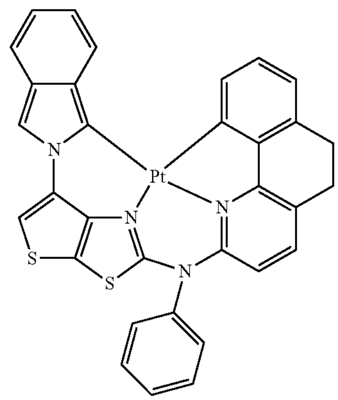
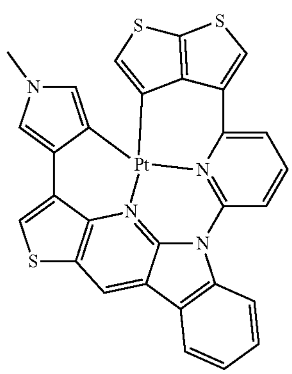
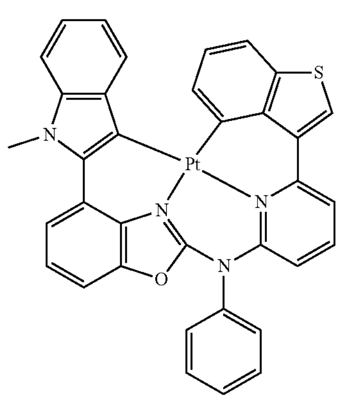
-continued
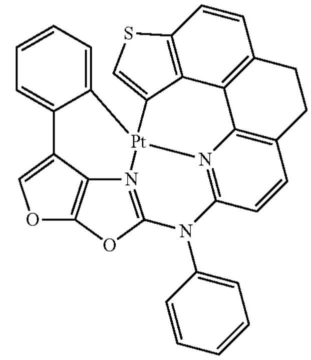
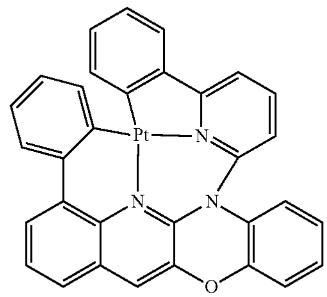
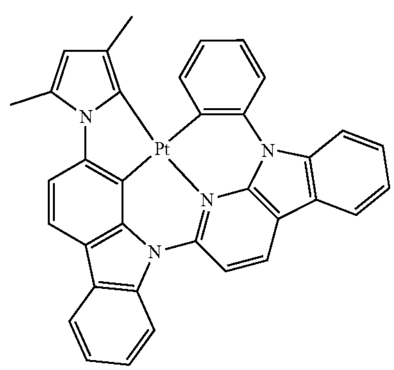
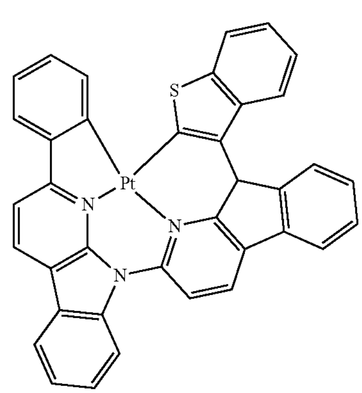

-continued
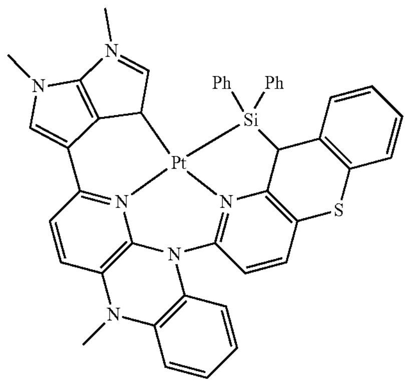
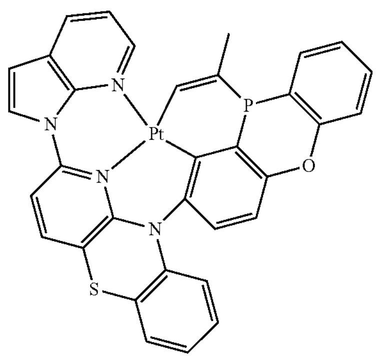
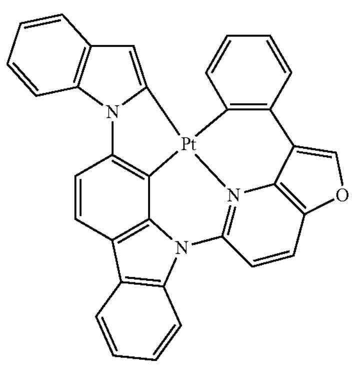
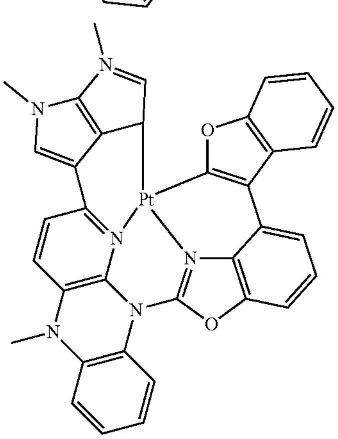
-continued
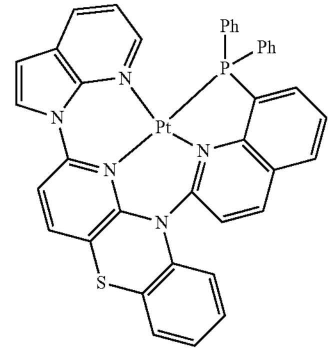
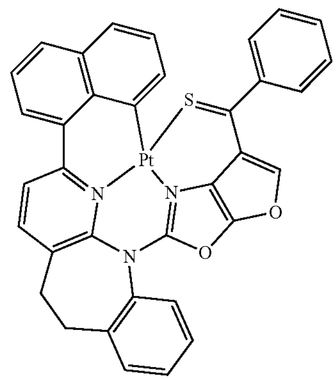
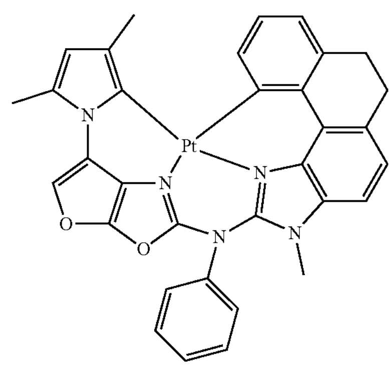
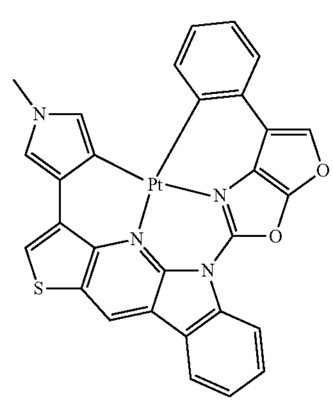

-continued
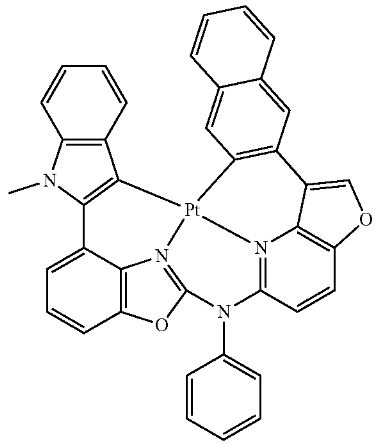
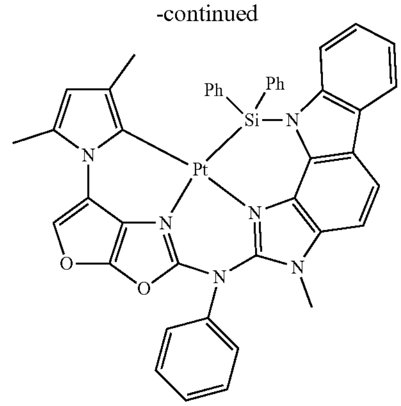
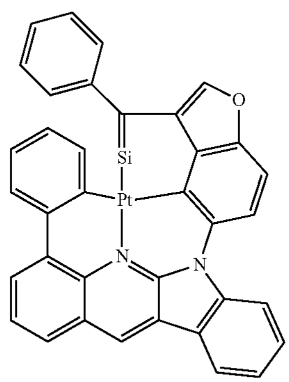
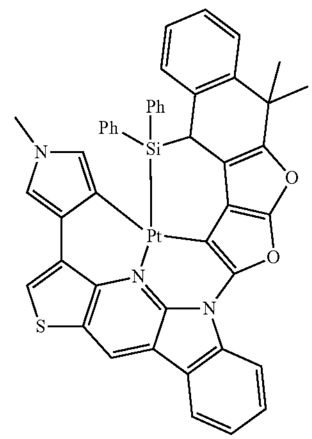
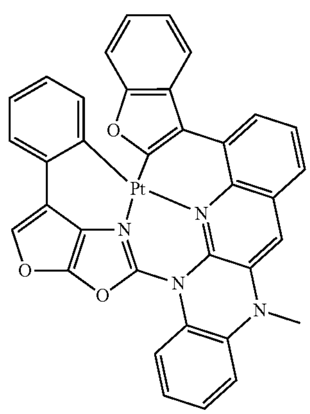
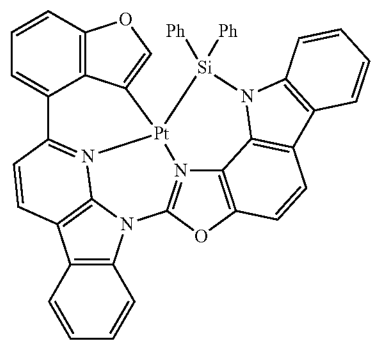
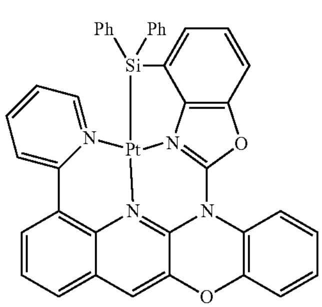
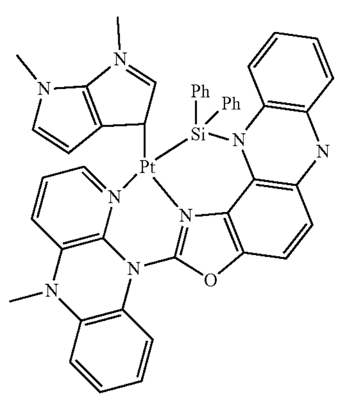

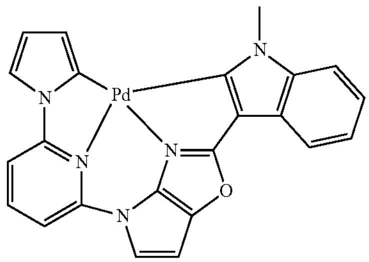
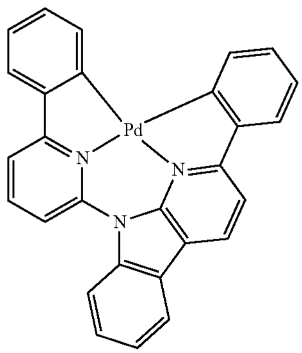
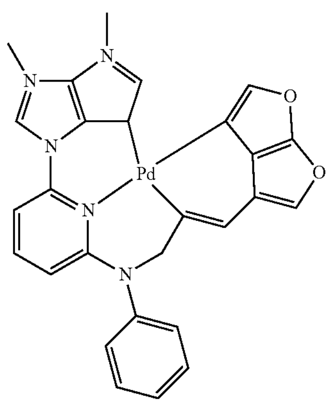
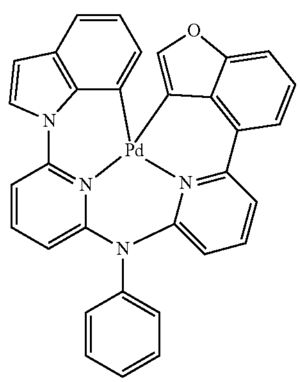
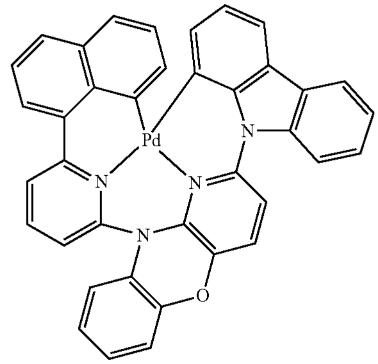
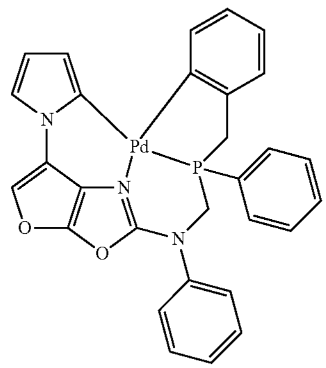
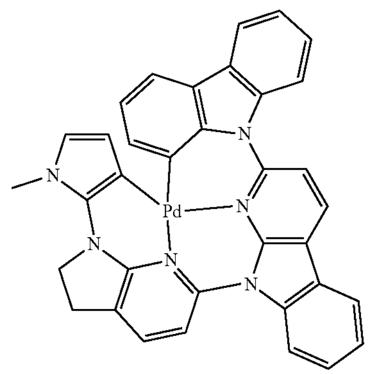
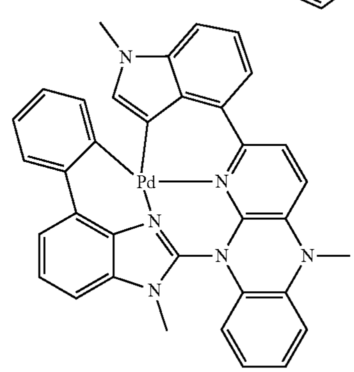

-continued
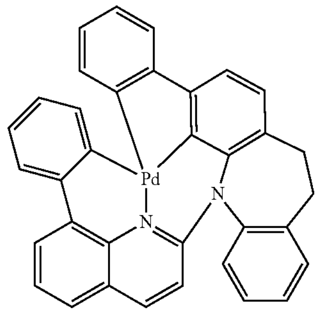
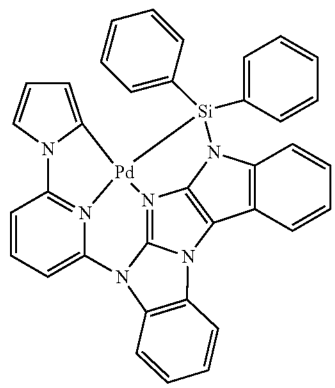
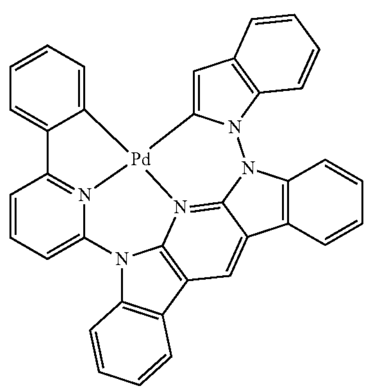
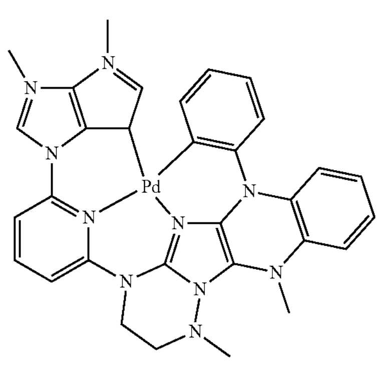
-continued
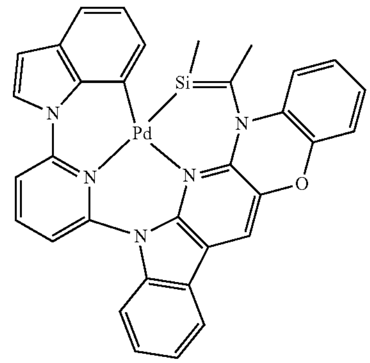
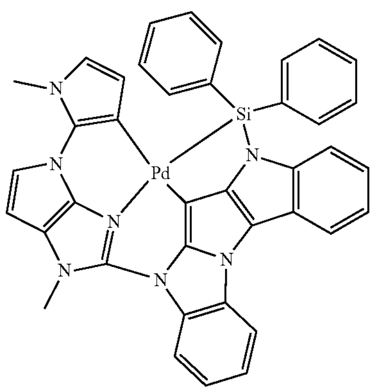
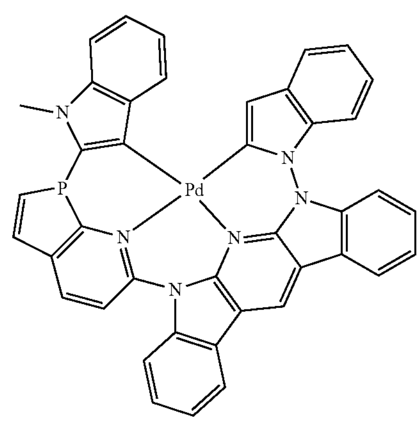
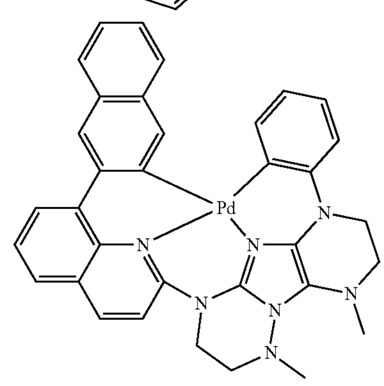

-continued
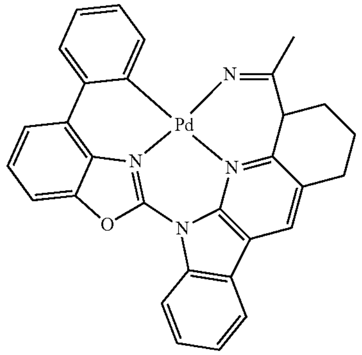
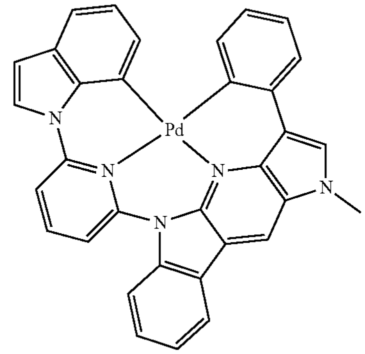
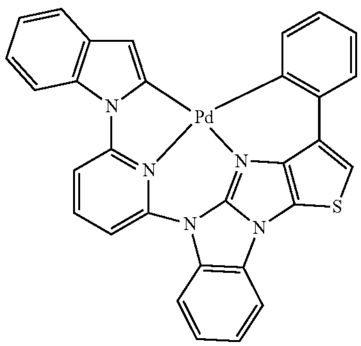
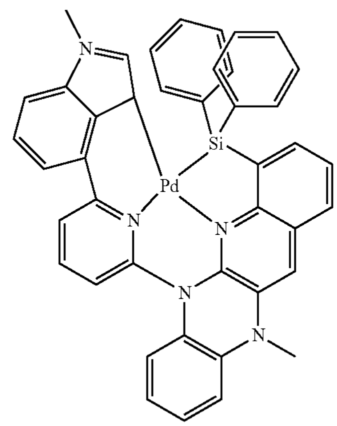
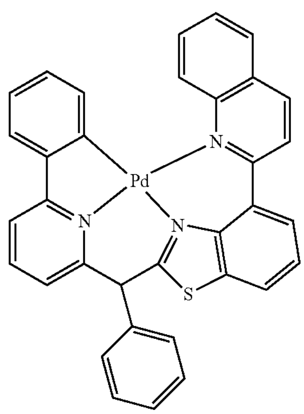
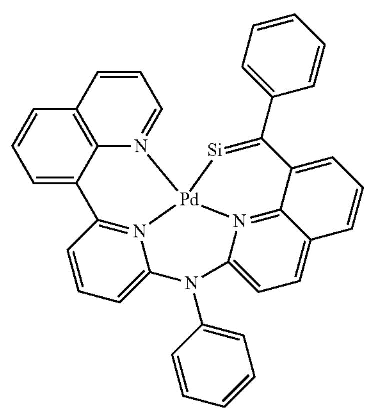
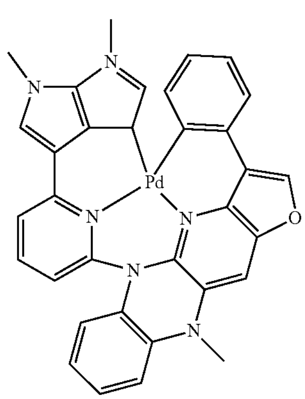
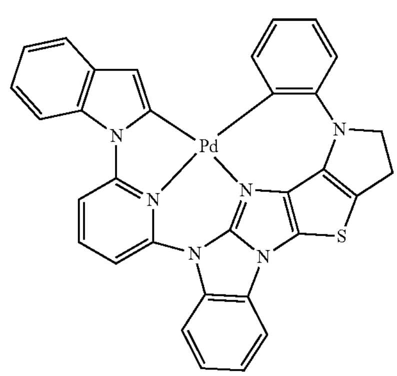

-continued
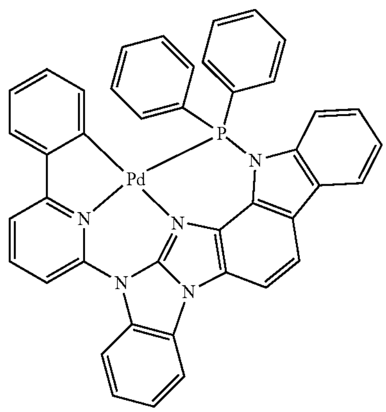
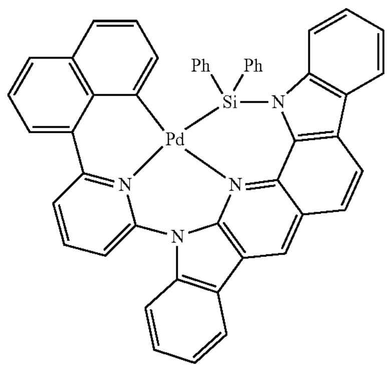
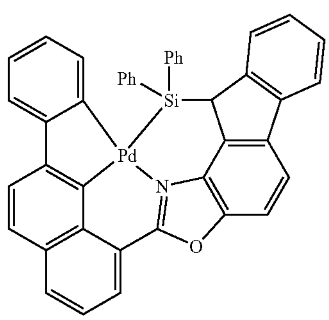
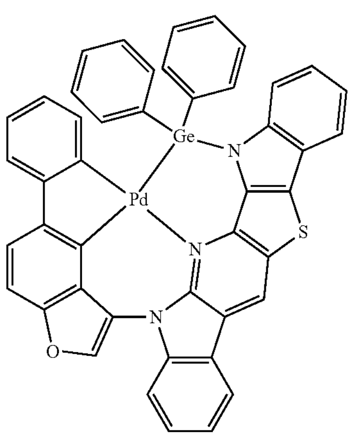
-continued
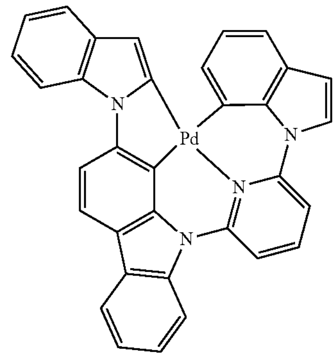
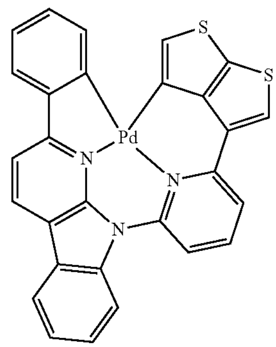
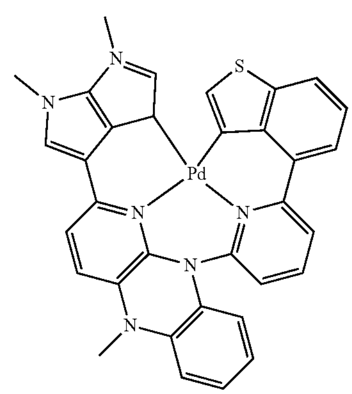
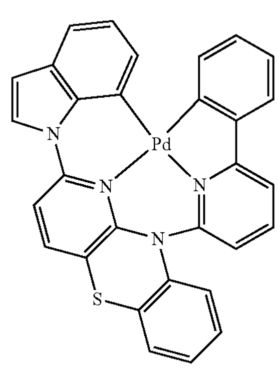

-continued
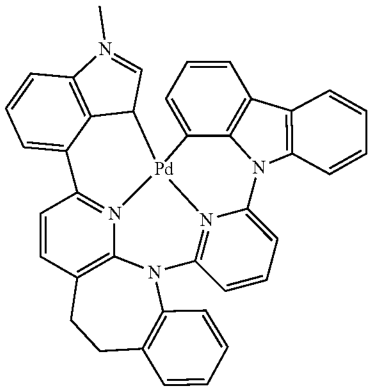
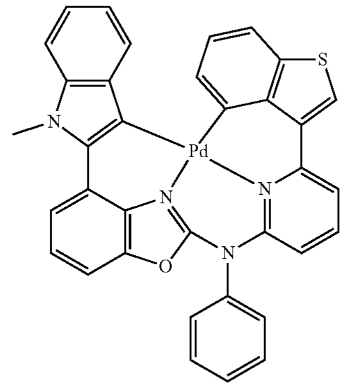
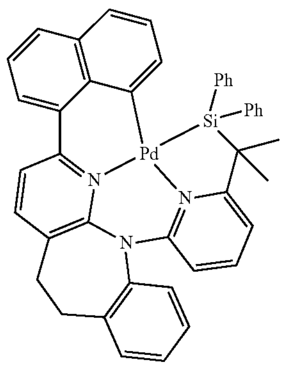
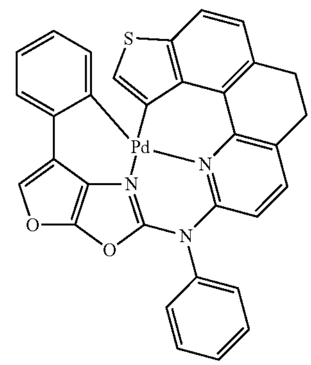
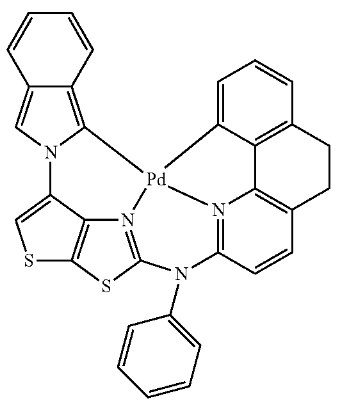
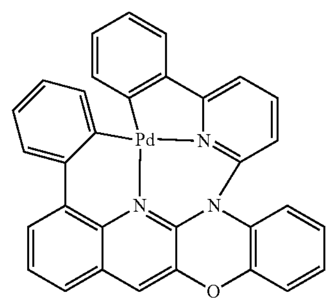
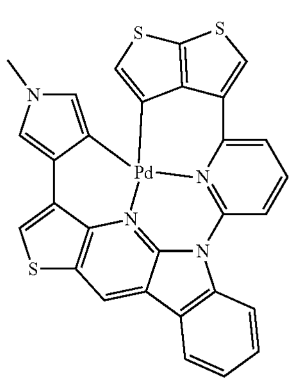
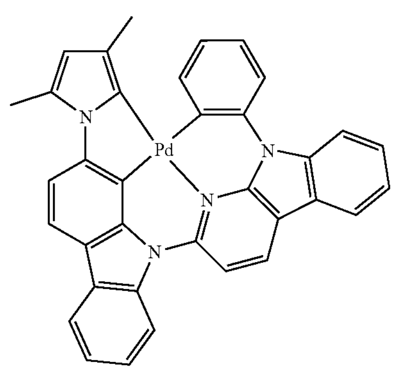

-continued
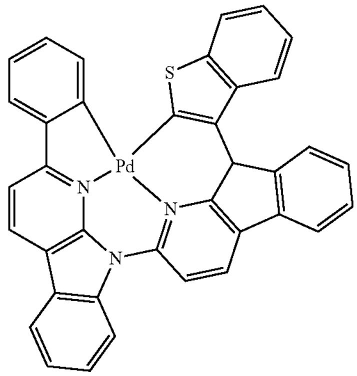
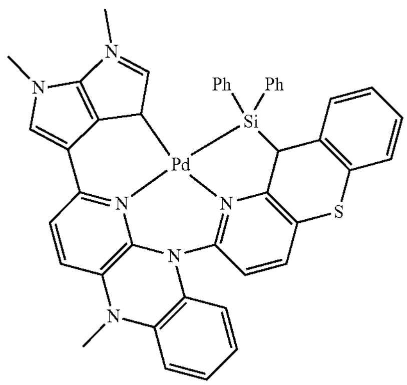
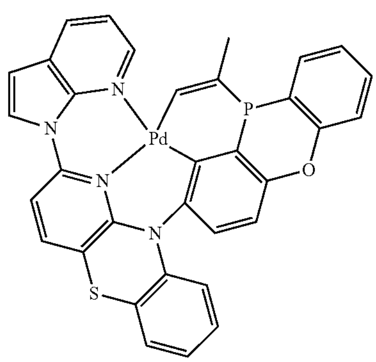
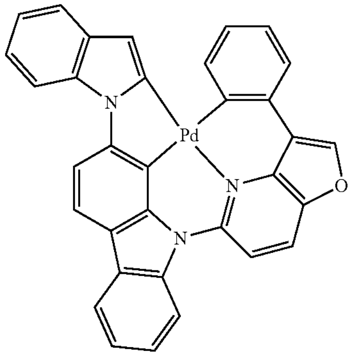
-continued
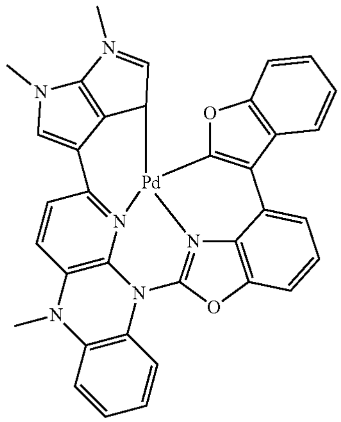
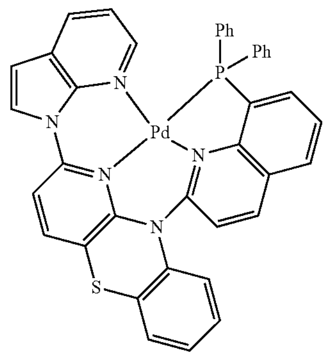
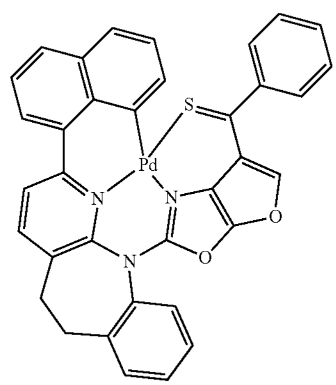
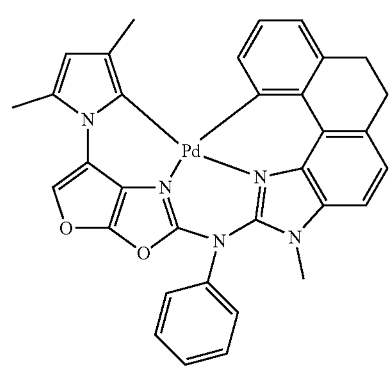

-continued
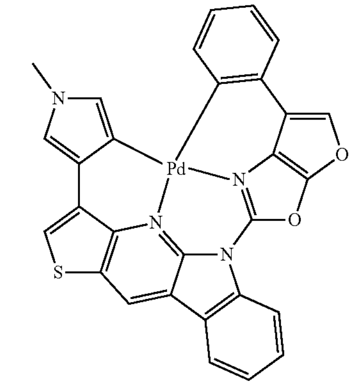
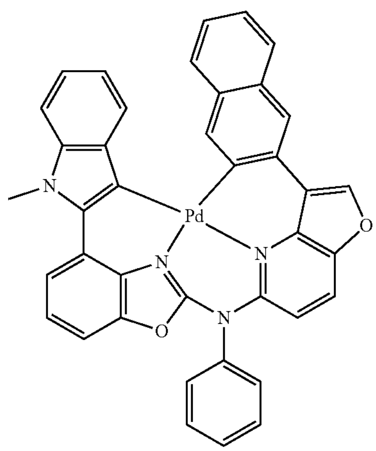
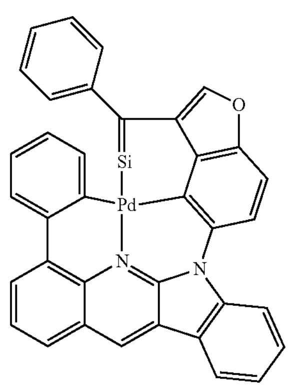
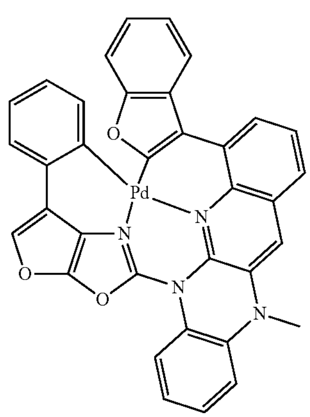
-continued
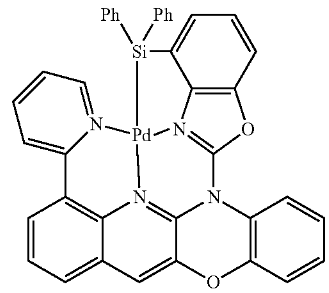
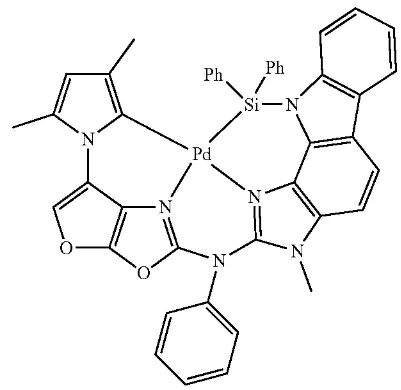
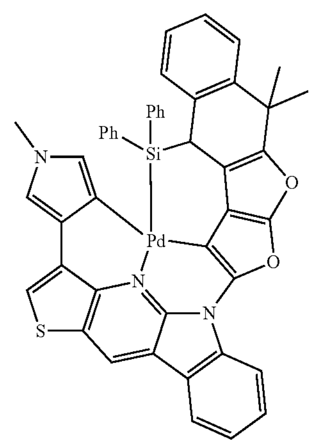
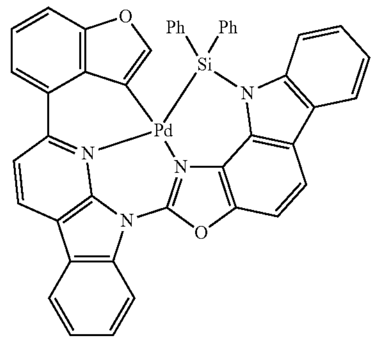

-continued
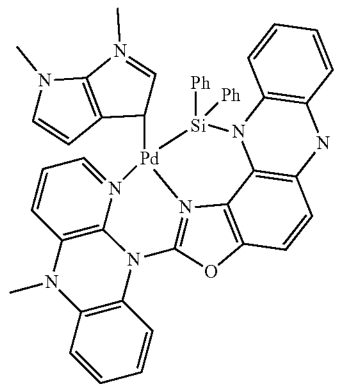
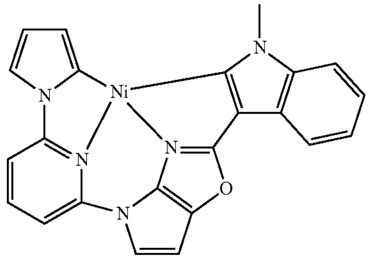
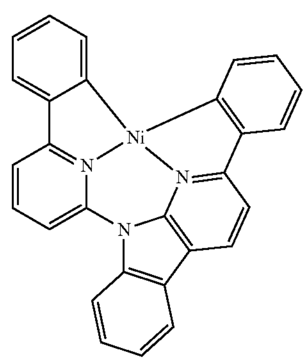
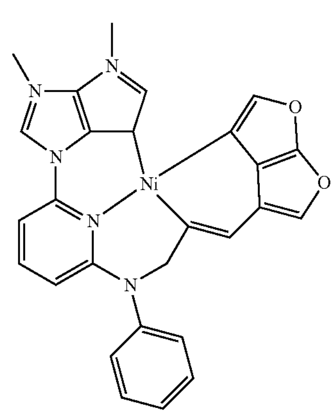
-continued
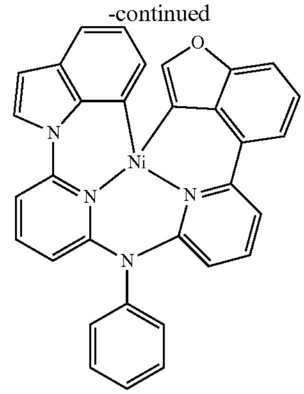
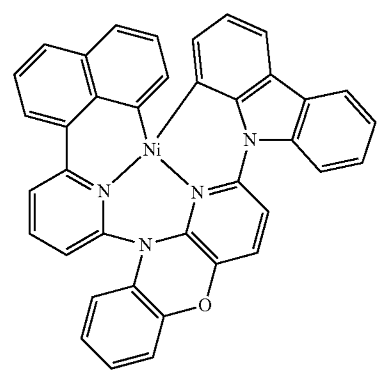
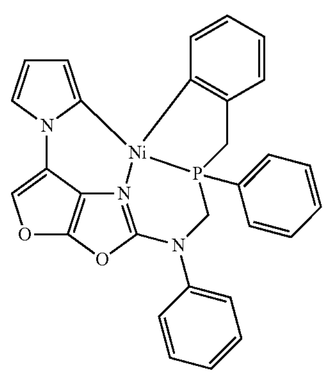
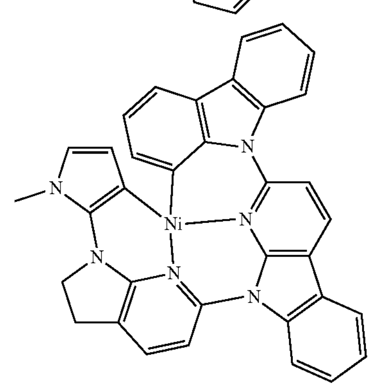

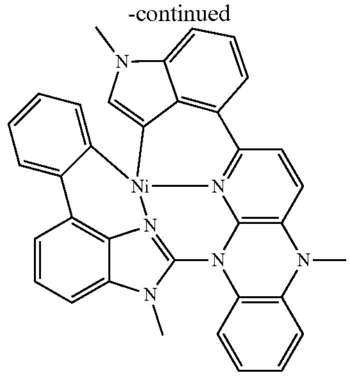
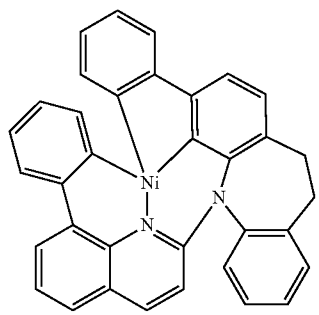
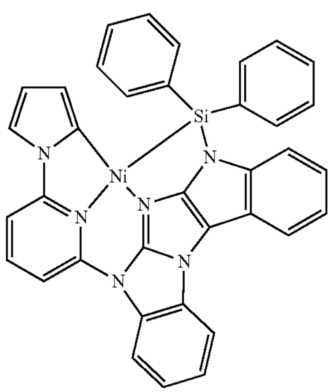
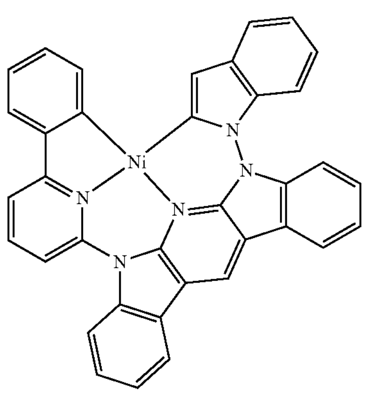
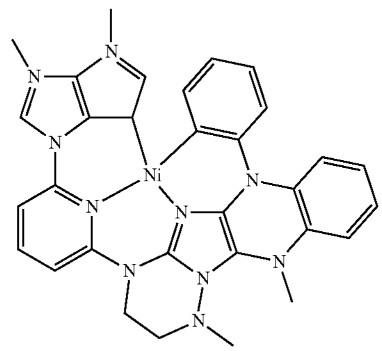
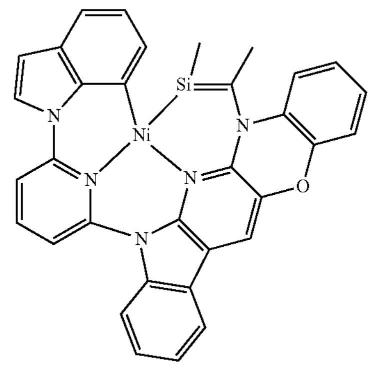
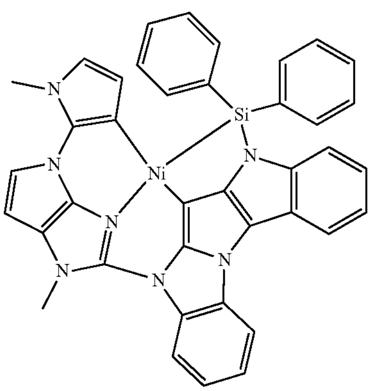
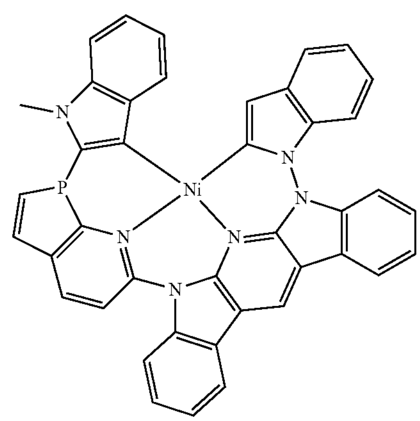

-continued
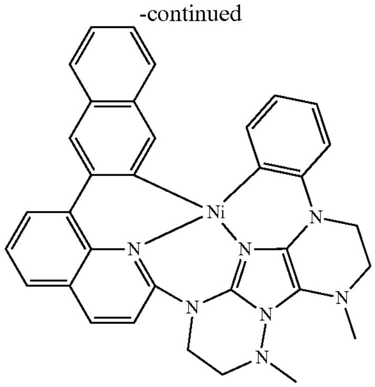
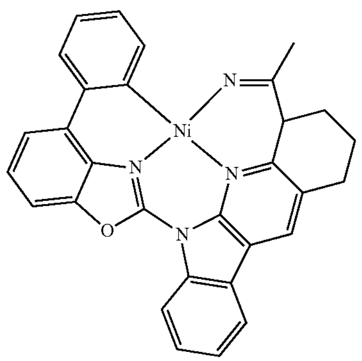
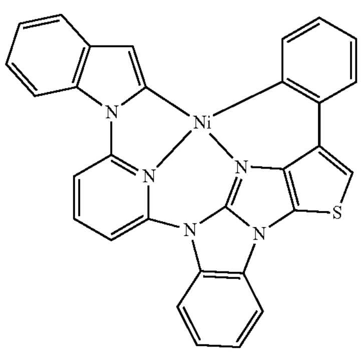
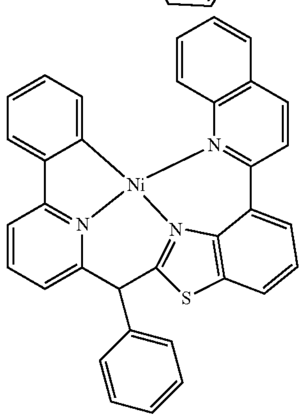
-continued
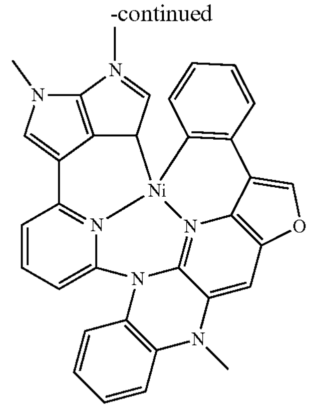
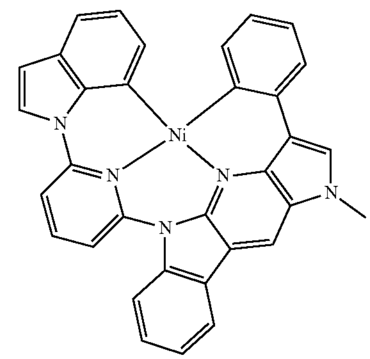
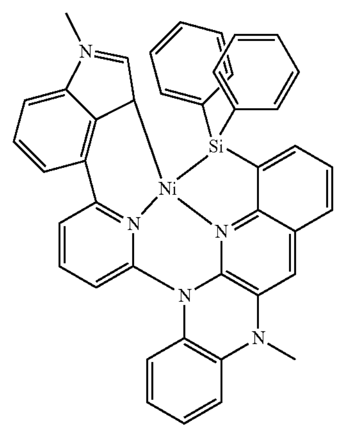
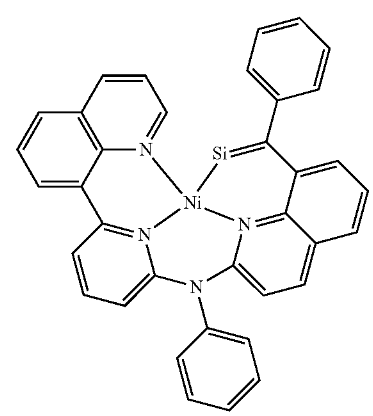

-continued
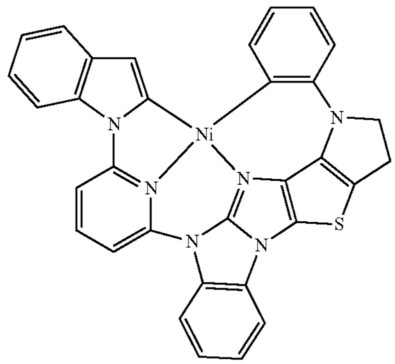
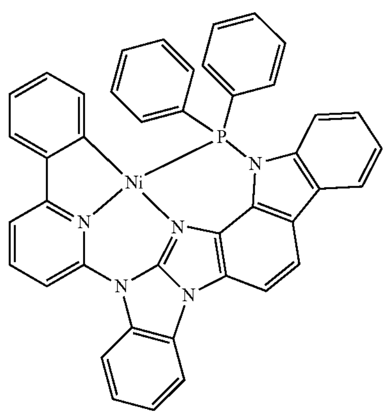
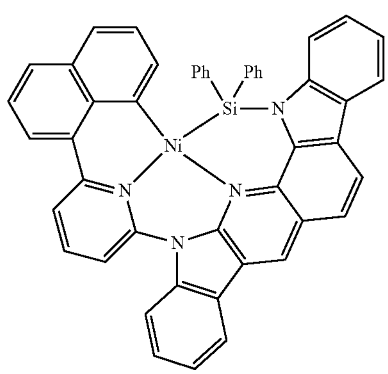
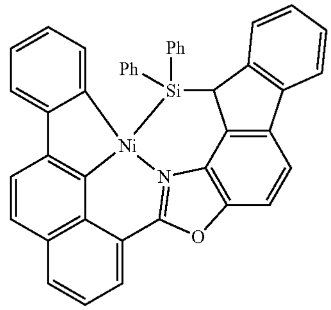
-continued
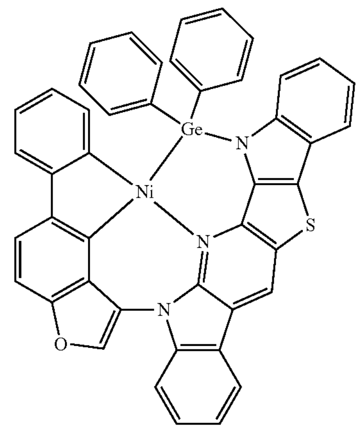
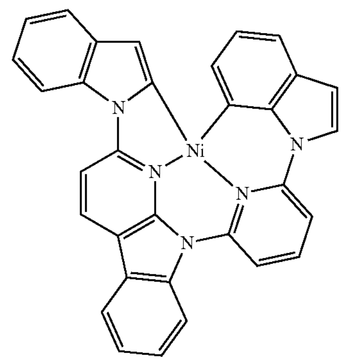
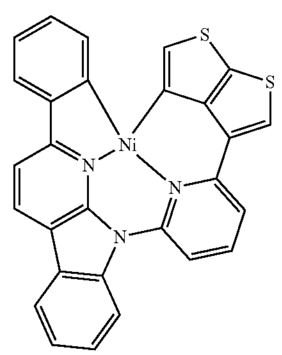
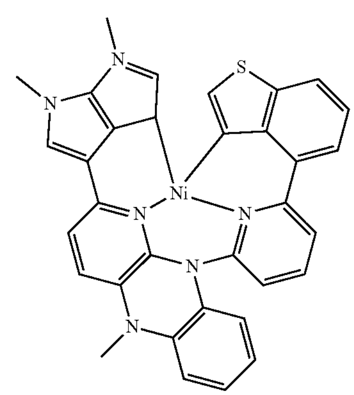

-continued
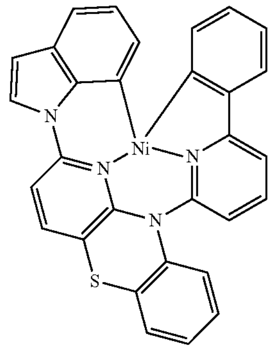
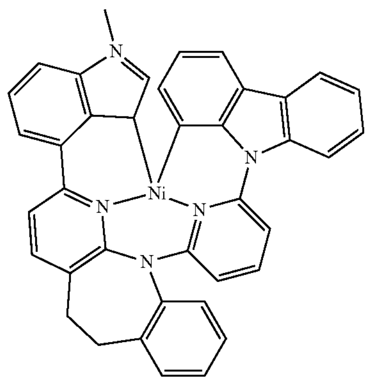
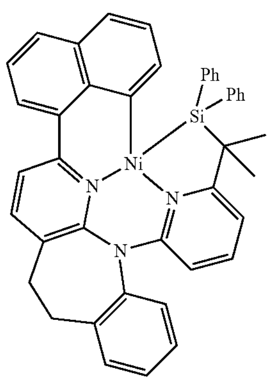
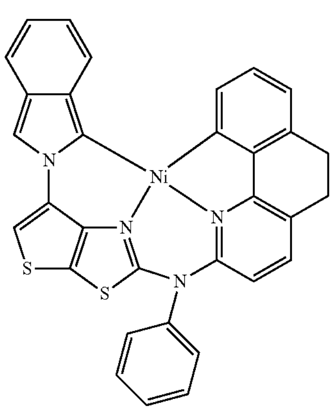
-continued
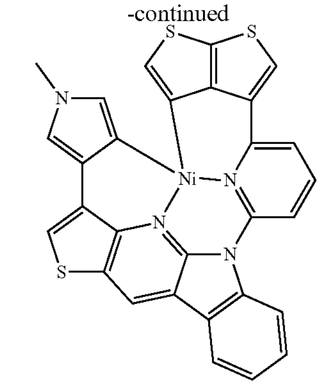
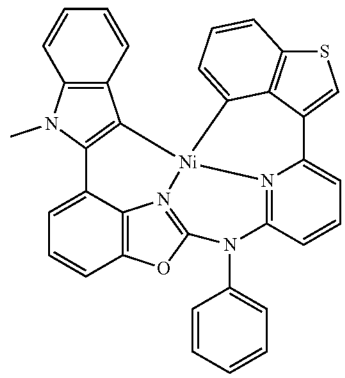
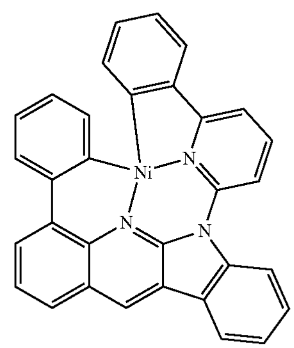
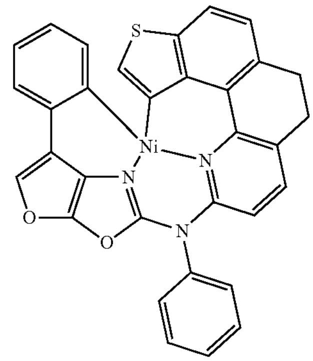

-continued
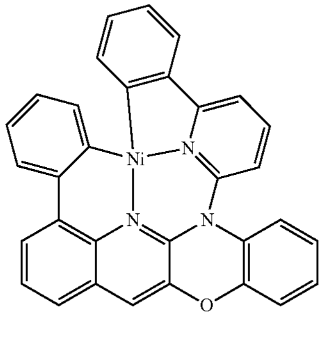
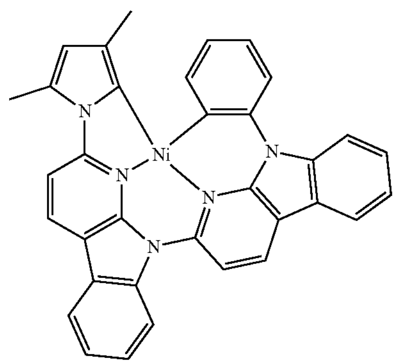
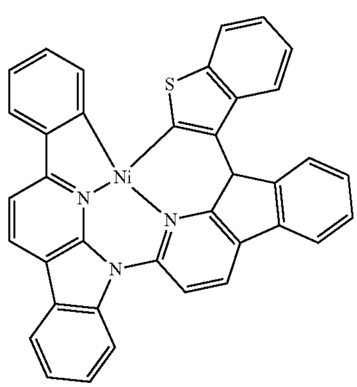
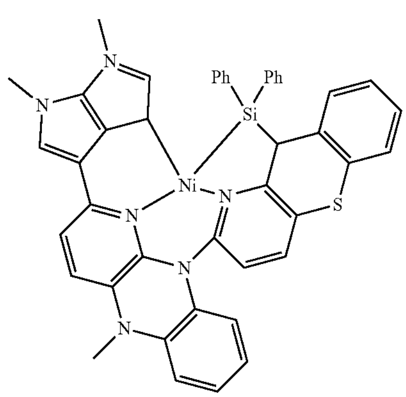
-continued
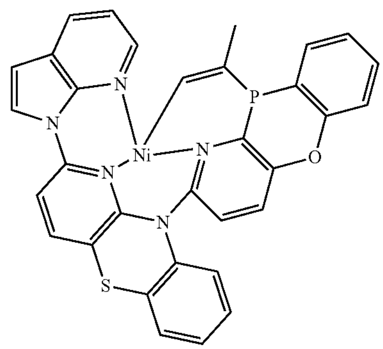
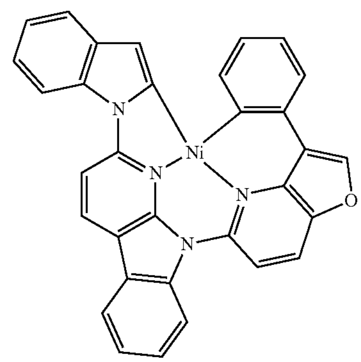
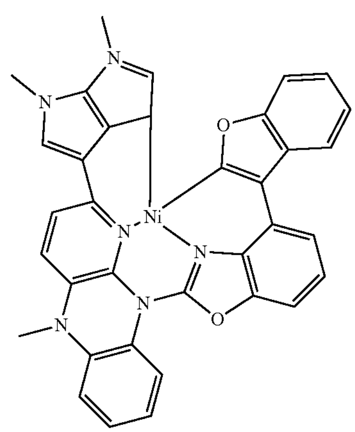
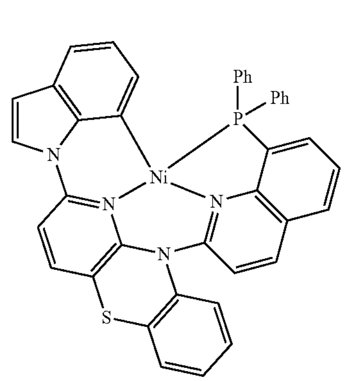

-continued
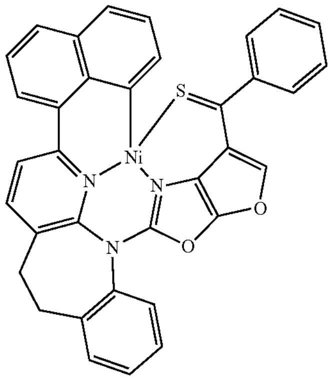
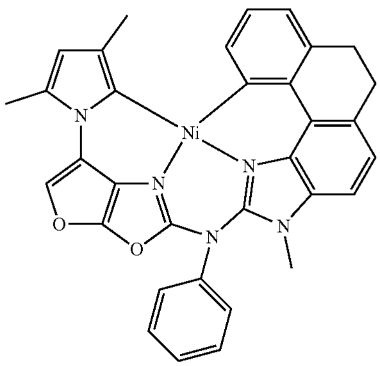
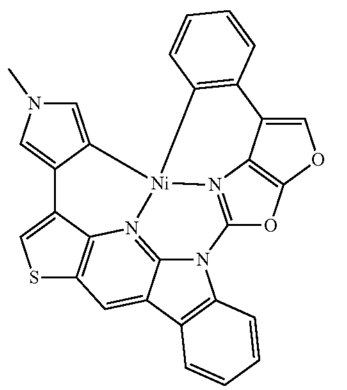
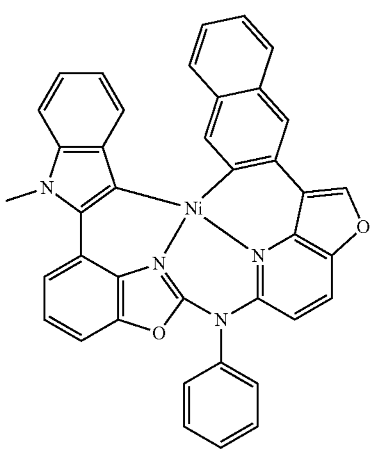
-continued
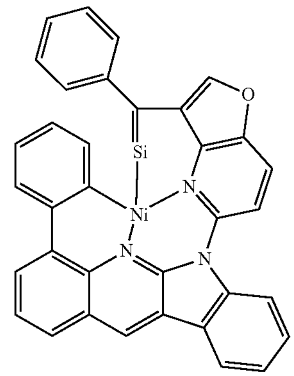
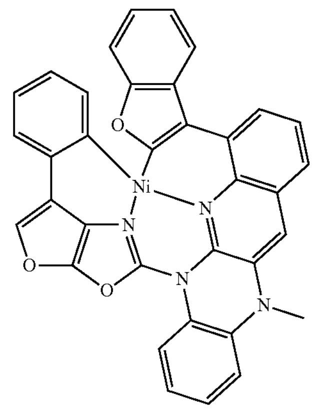
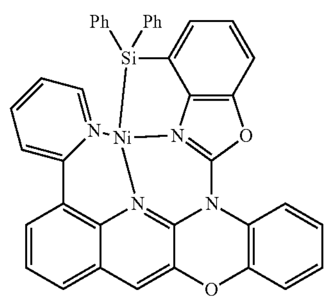
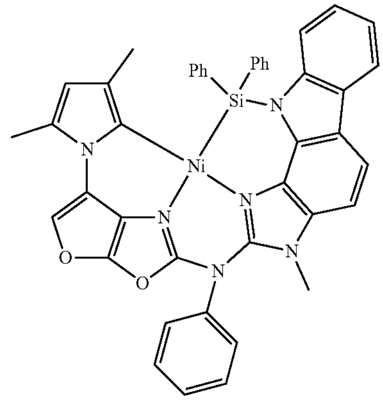

-continued
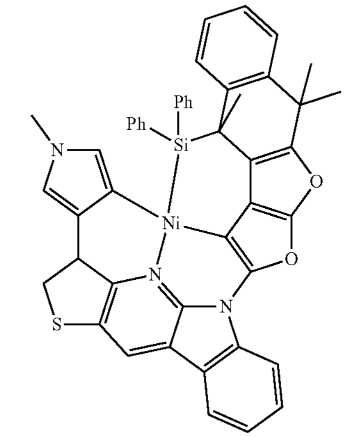
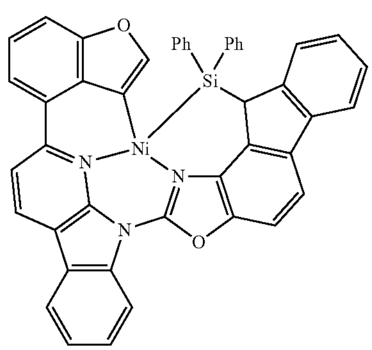
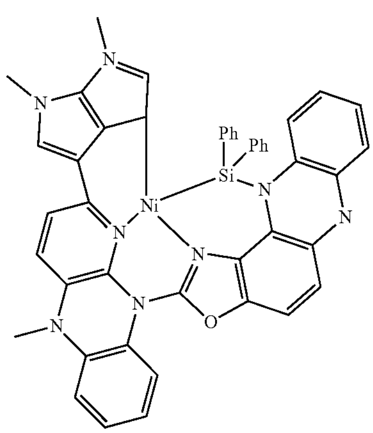
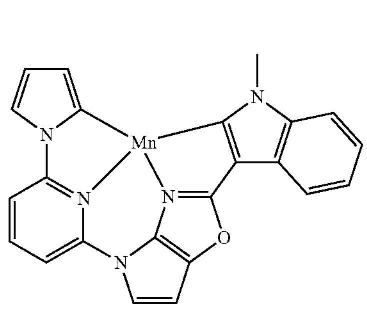
-continued
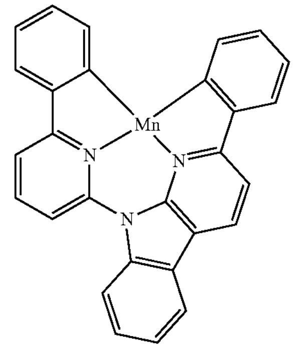
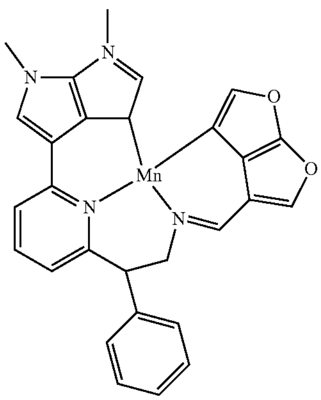
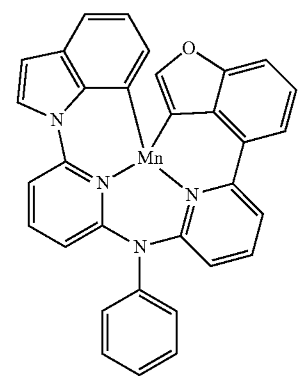
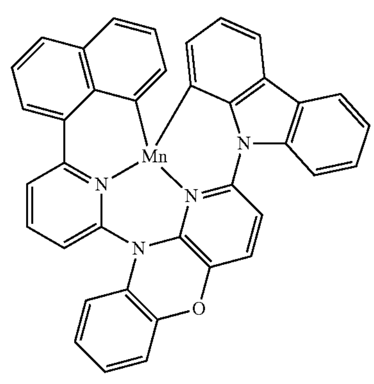

-continued
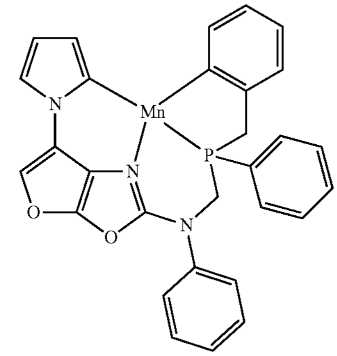
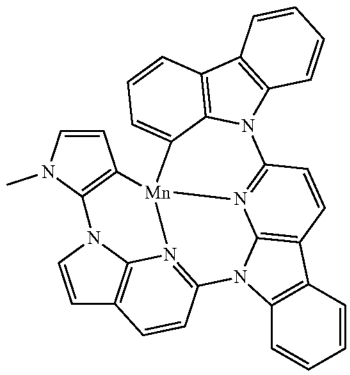
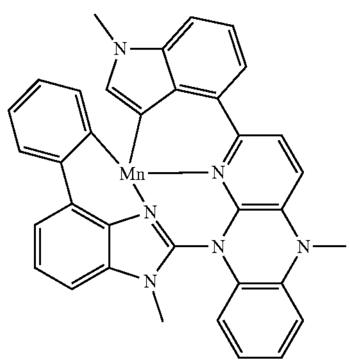
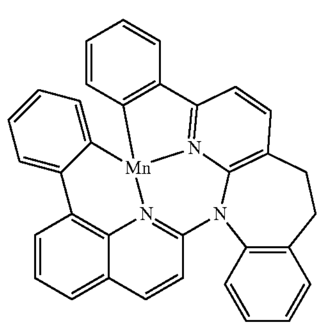
-continued
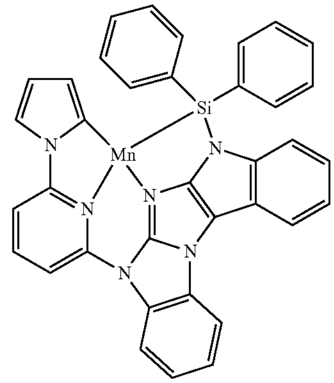
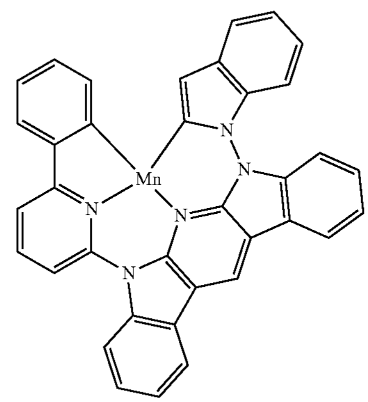
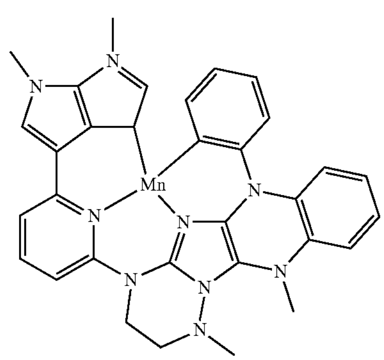
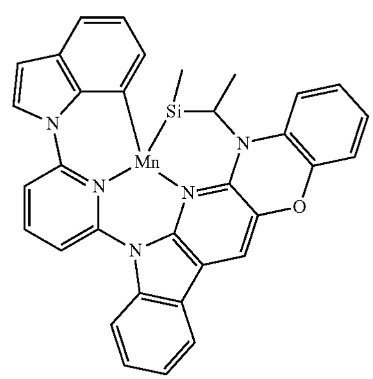

-continued
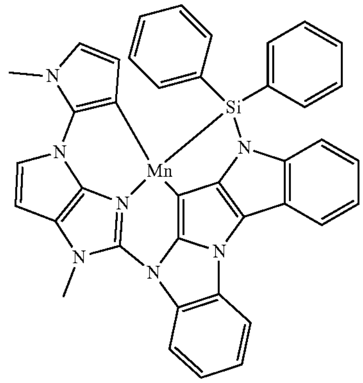
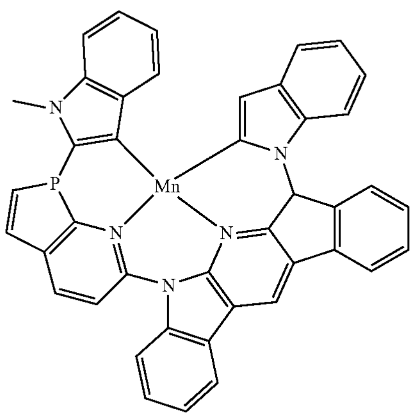
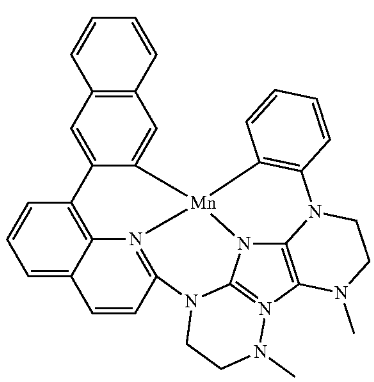
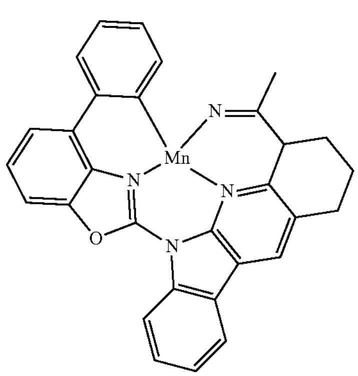
-continued
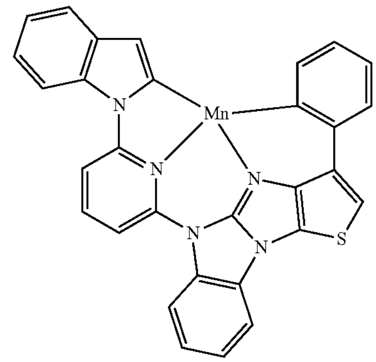
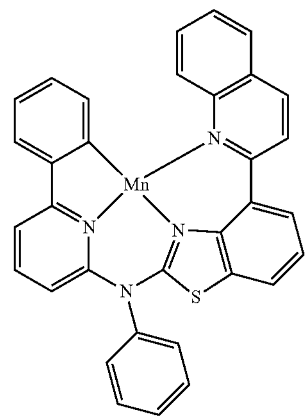
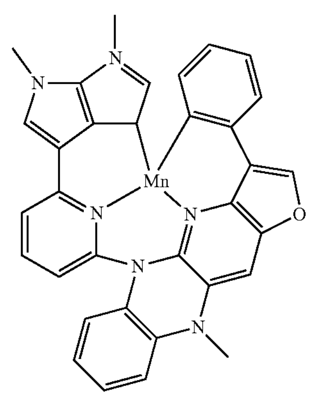
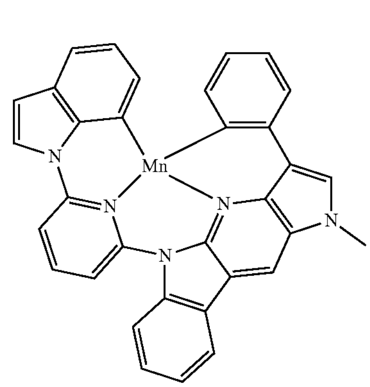

-continued
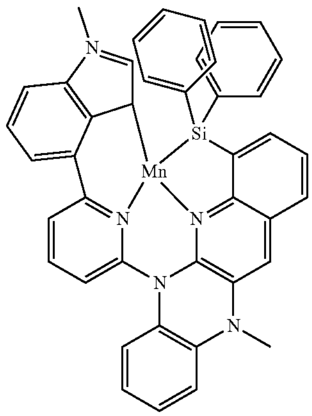
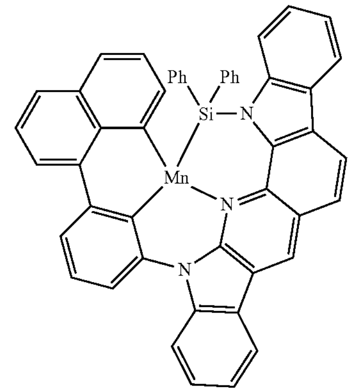
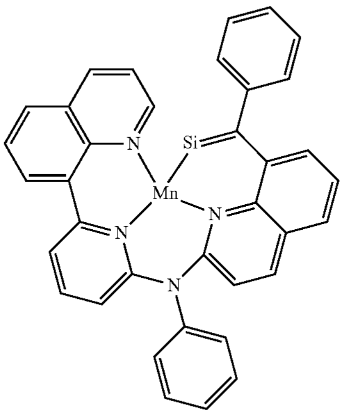
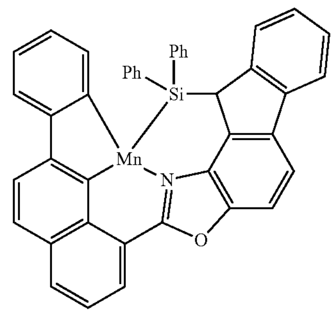
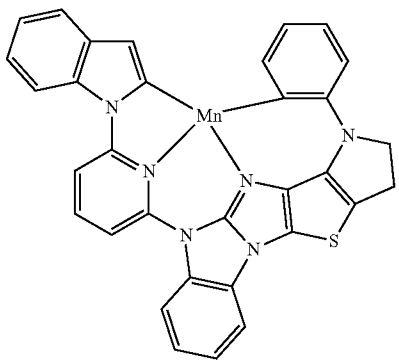
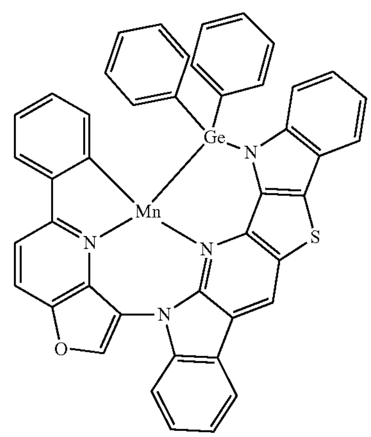
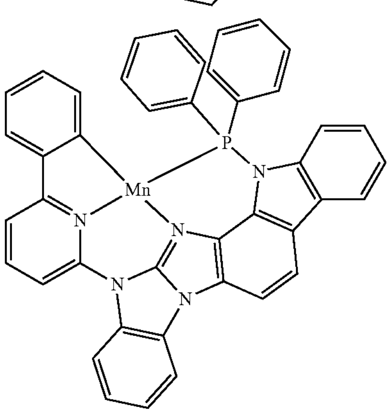
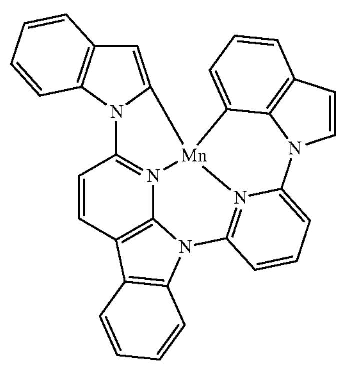

-continued
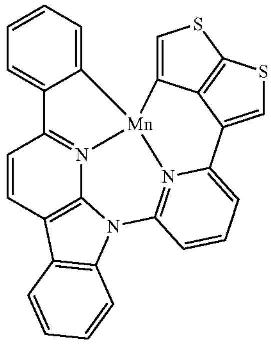
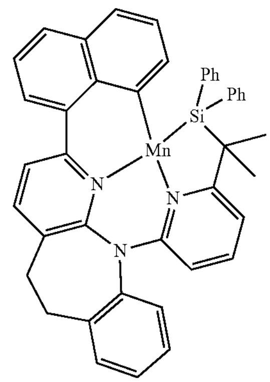
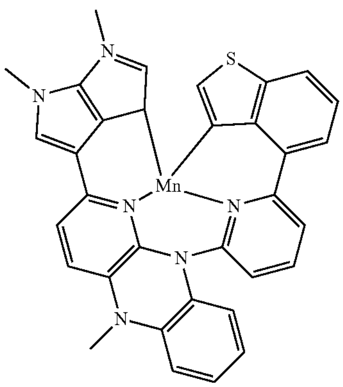
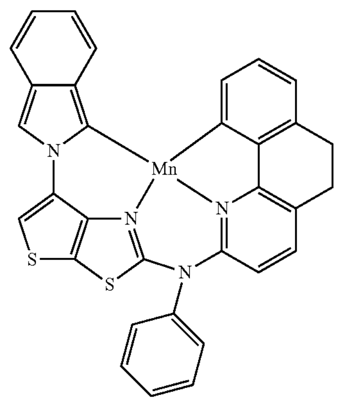
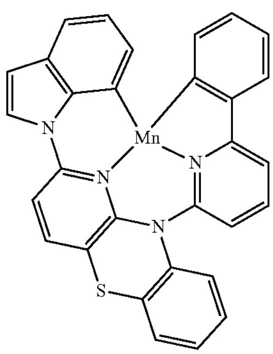
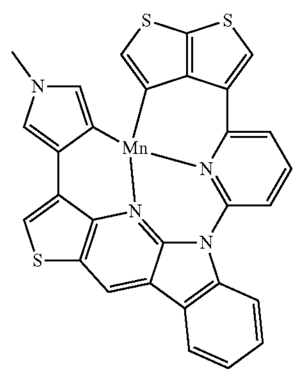
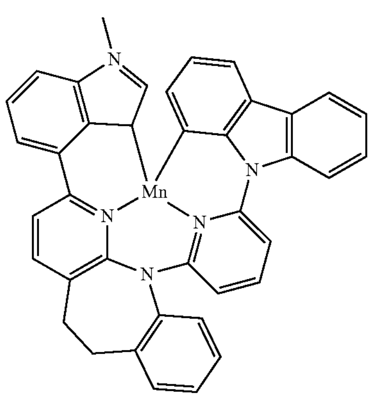
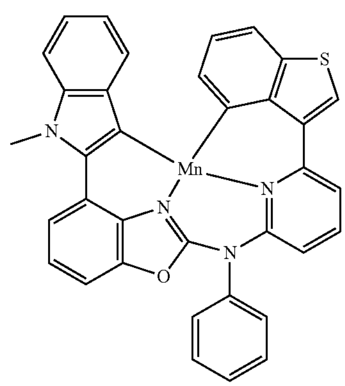

-continued
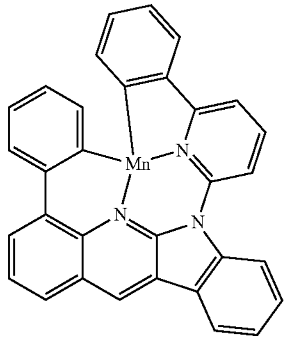
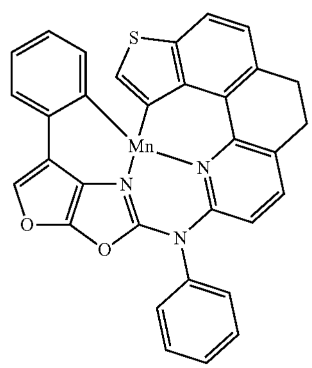
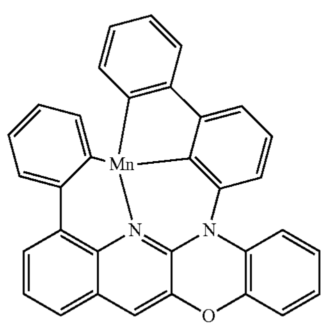
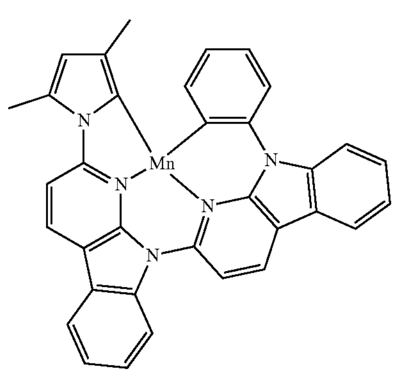
-continued
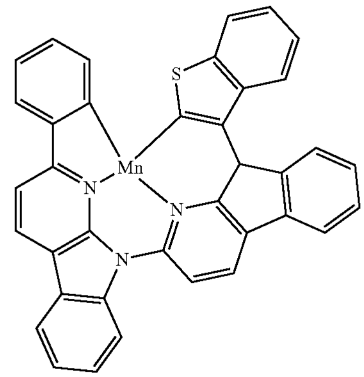
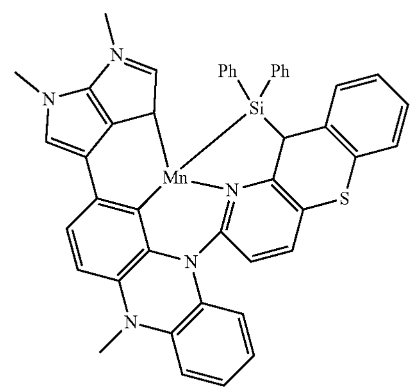
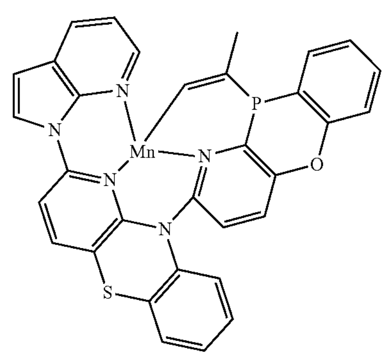
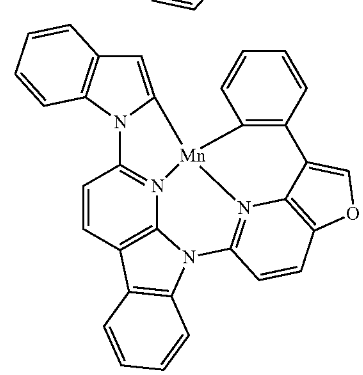

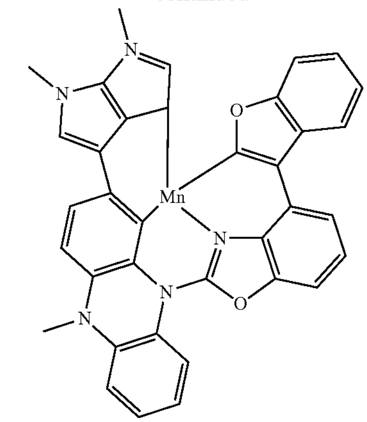
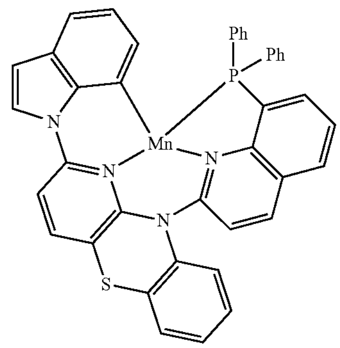
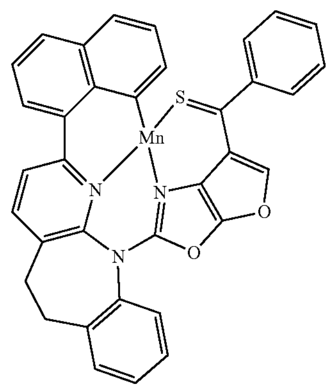
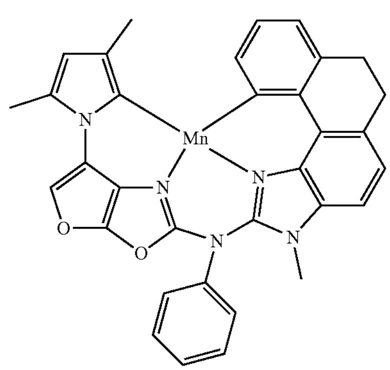
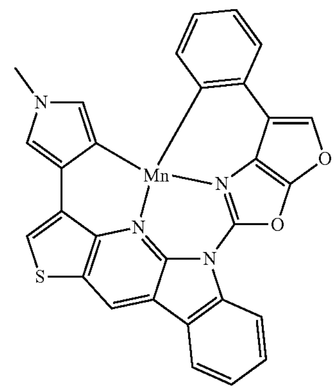
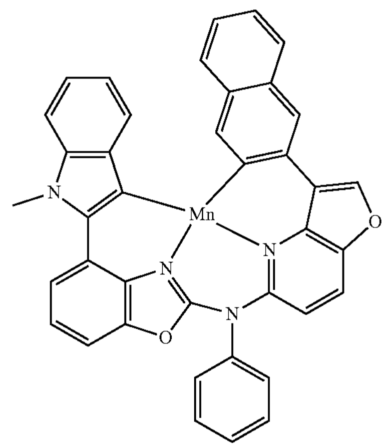
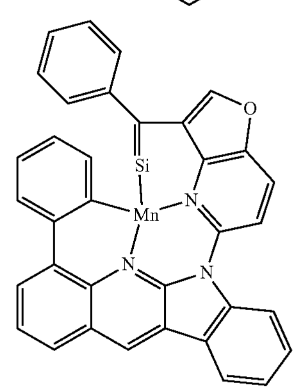
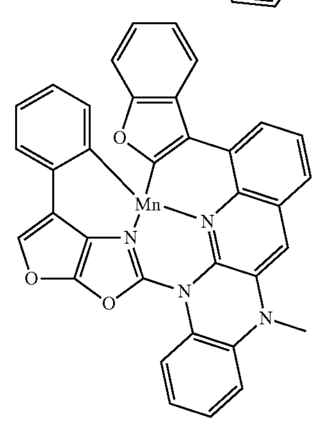

-continued
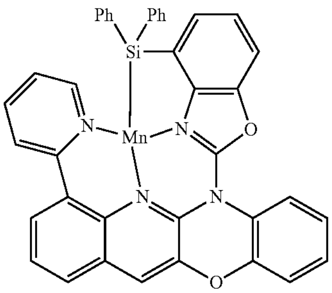
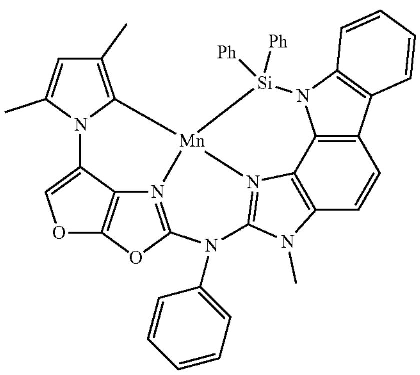
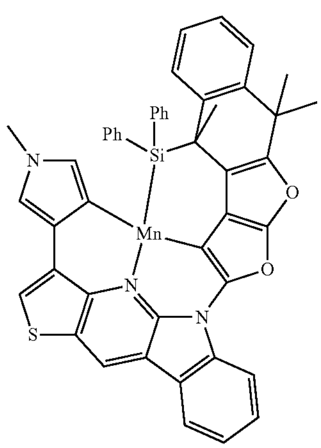
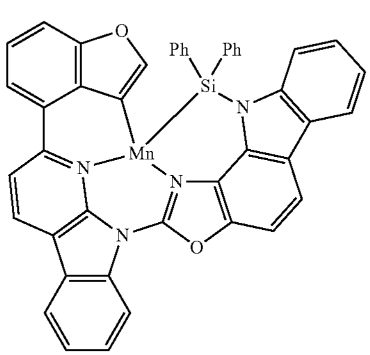
-continued
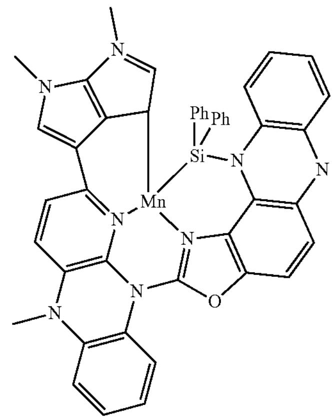
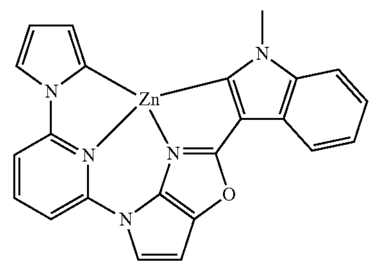
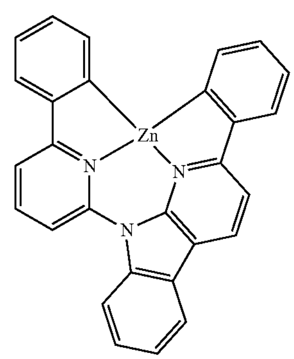
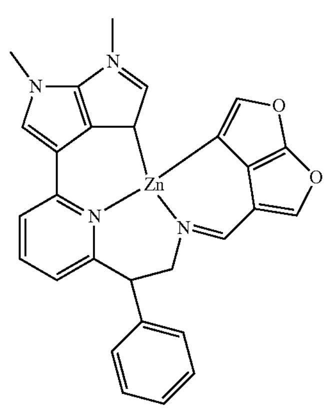

-continued
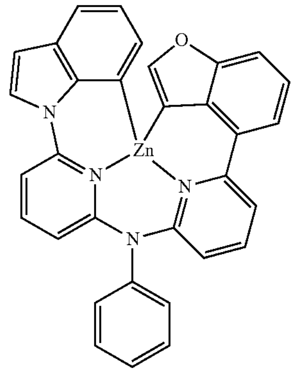
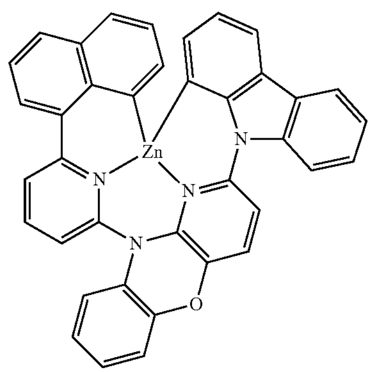
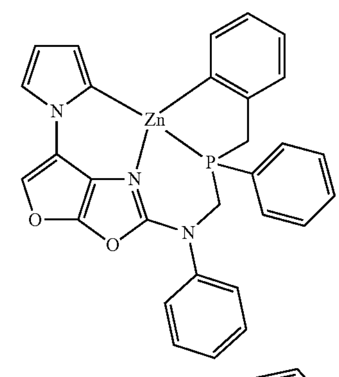
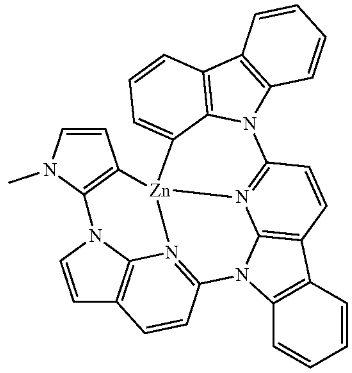
-continued
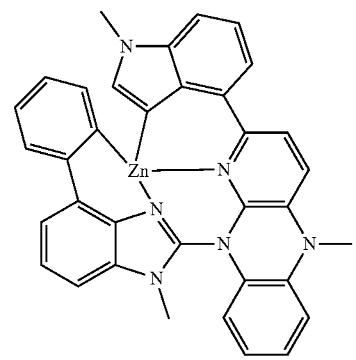
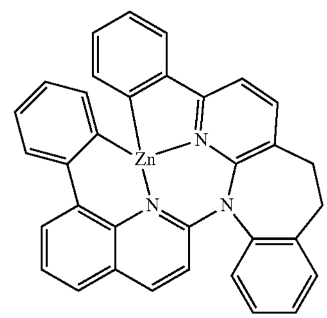
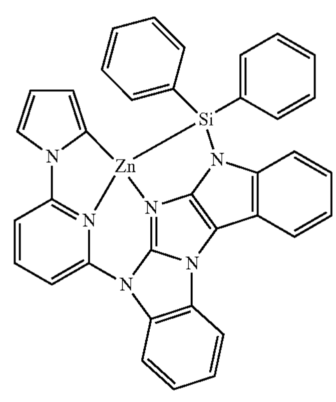
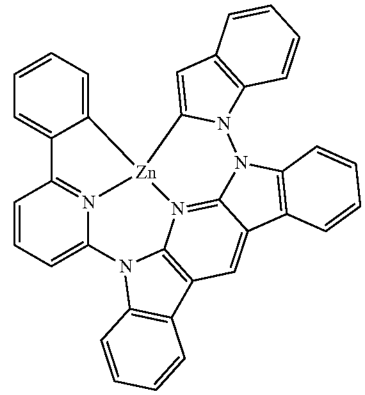

-continued
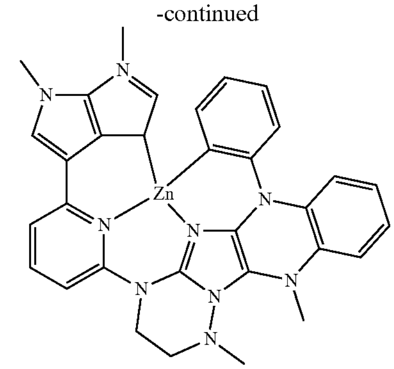
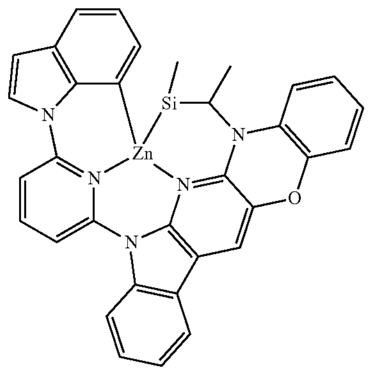
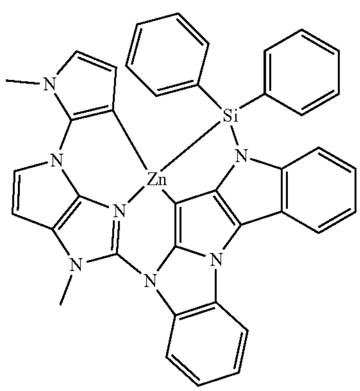
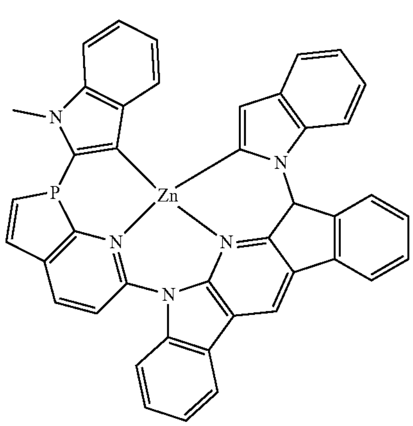
-continued
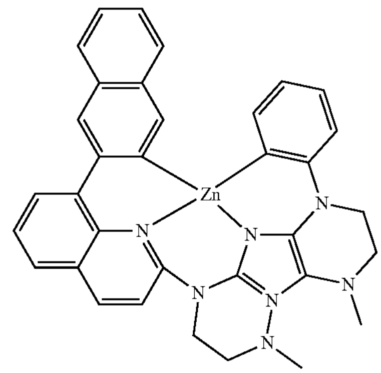
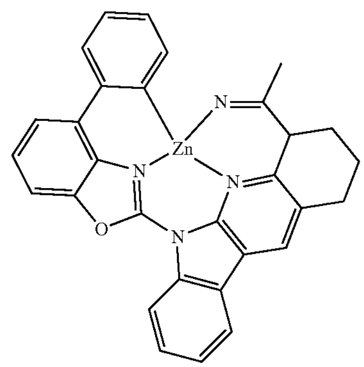
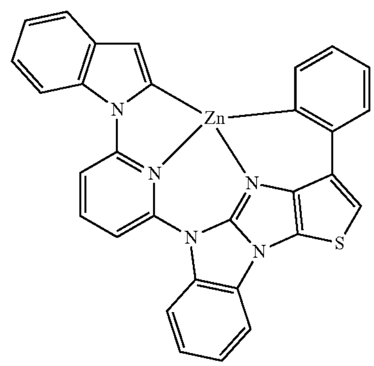
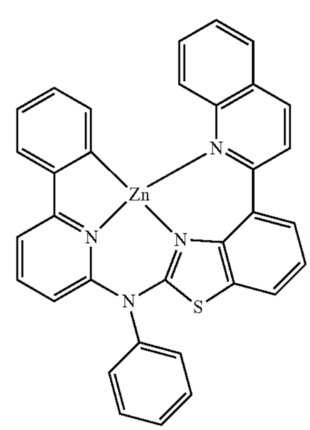

-continued
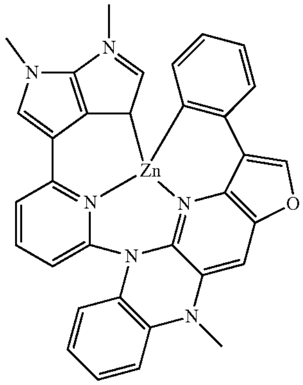
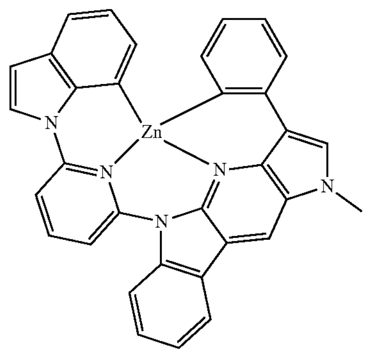
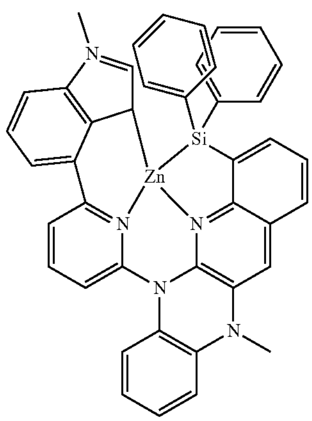
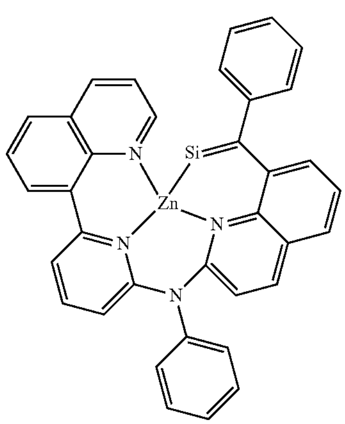
-continued
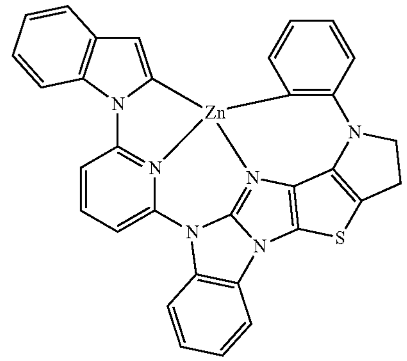
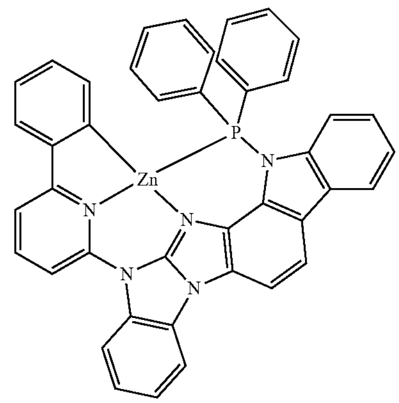
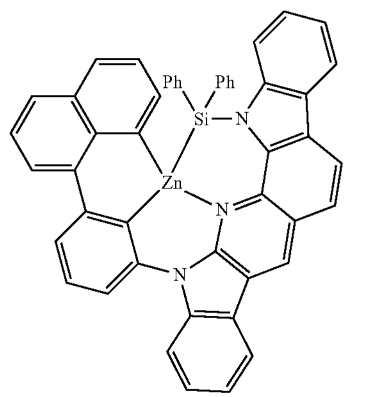
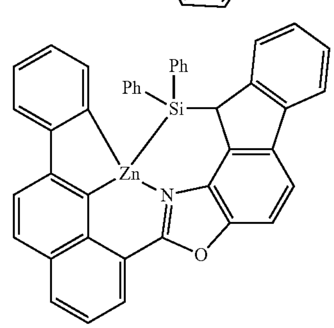

-continued
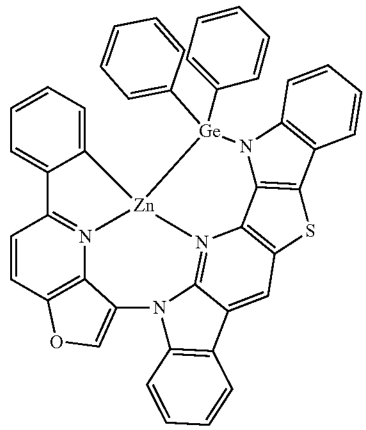
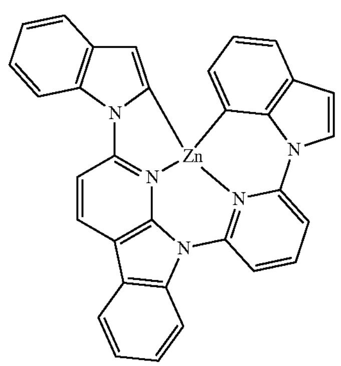
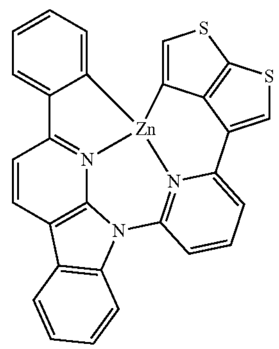
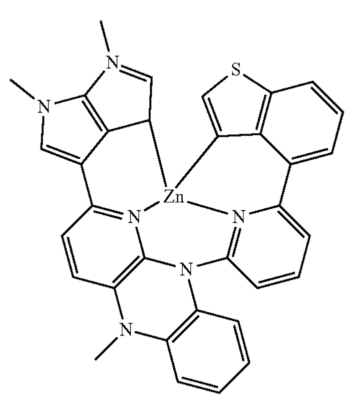
-continued
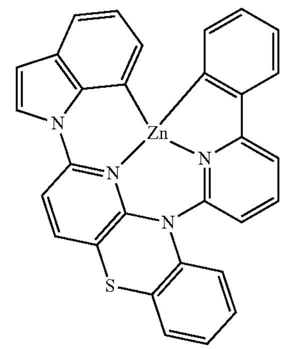
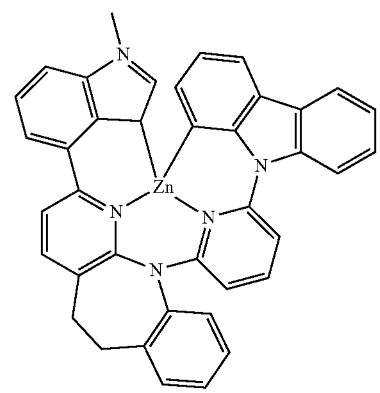
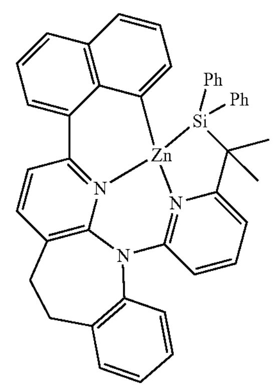
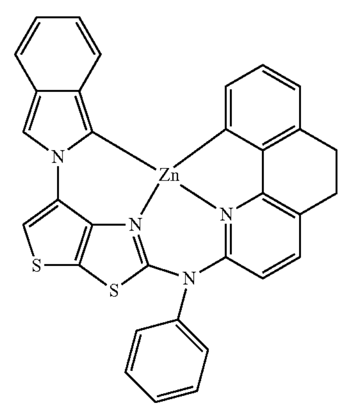

-continued
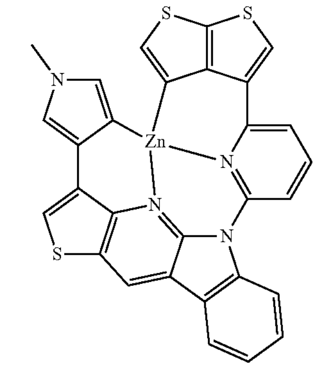
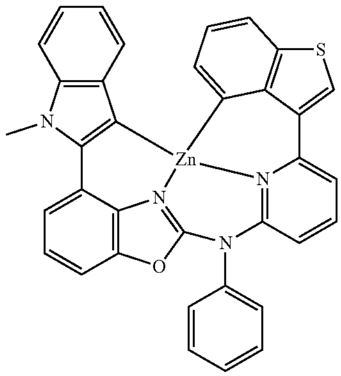
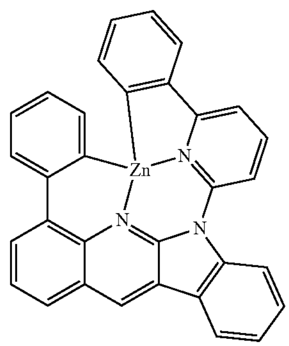
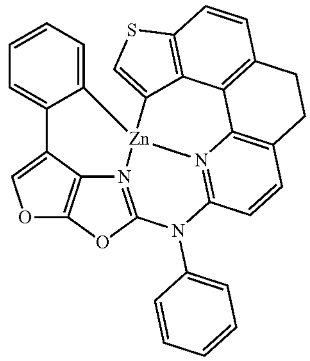
-continued
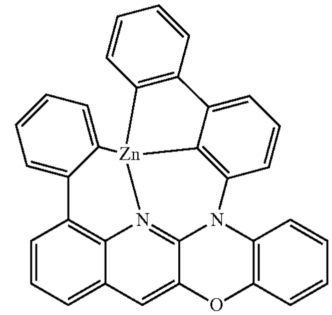
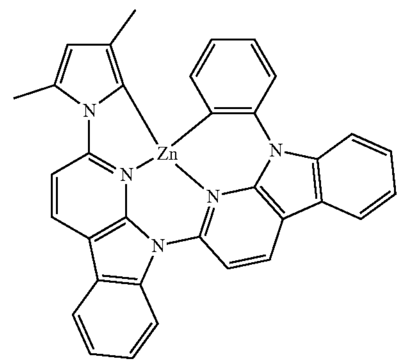
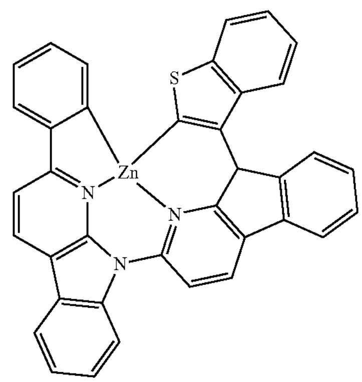
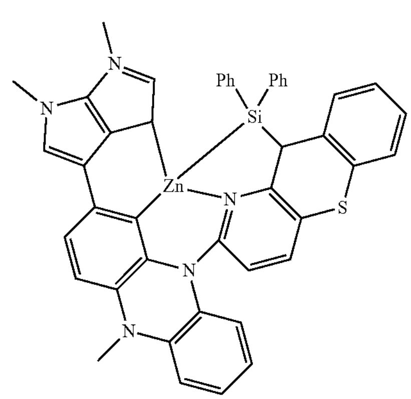

-continued
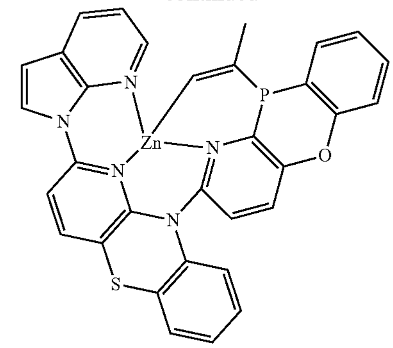
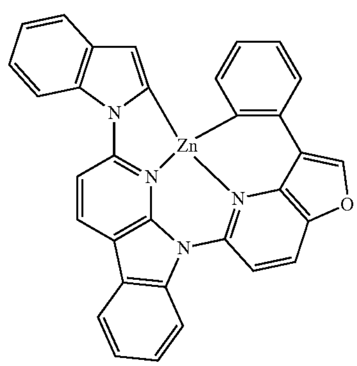
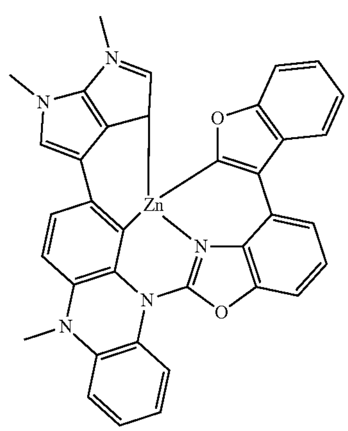
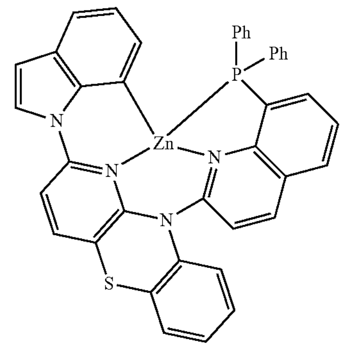
-continued
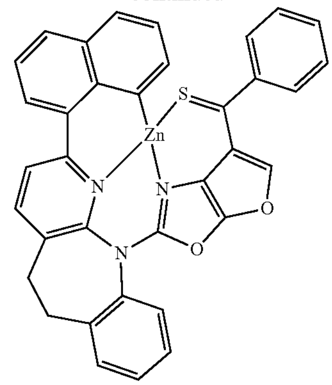
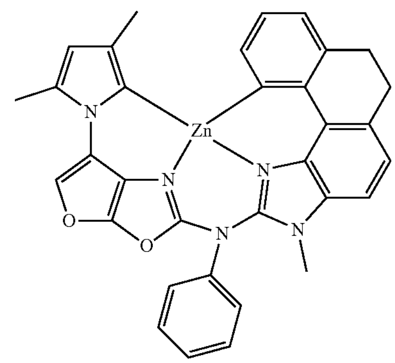
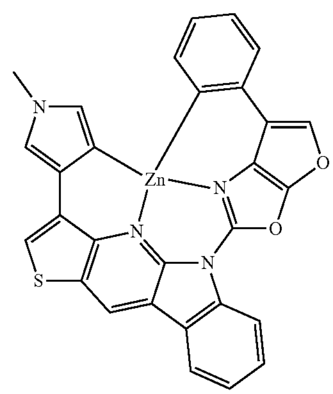
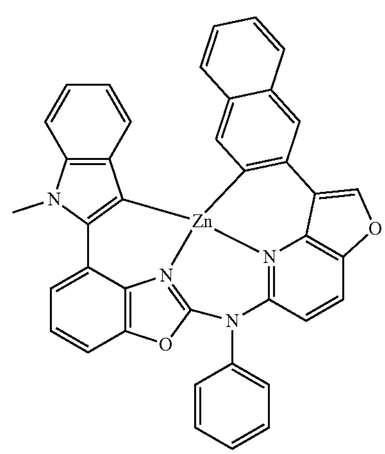

-continued
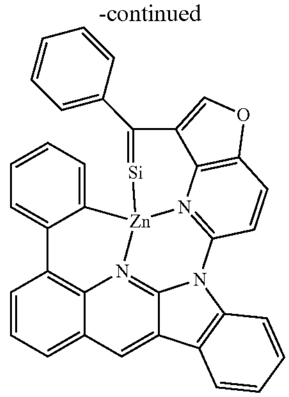
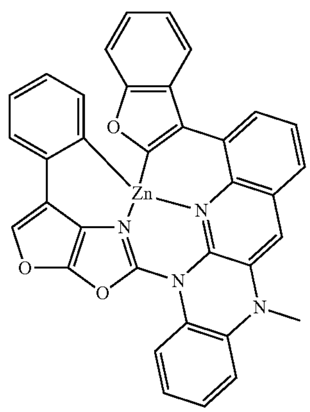
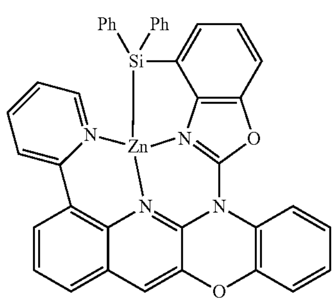
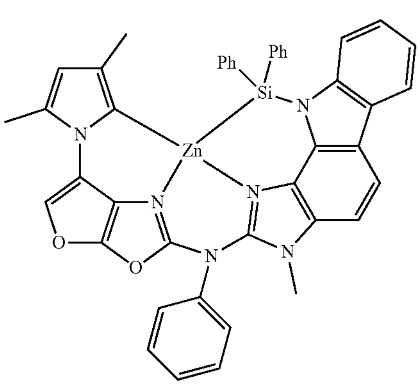
-continued
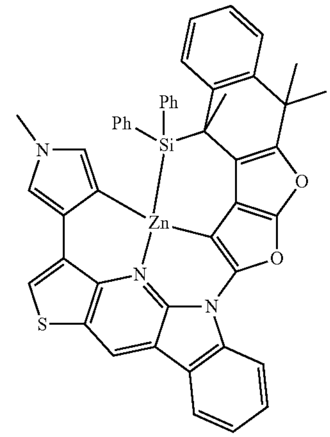
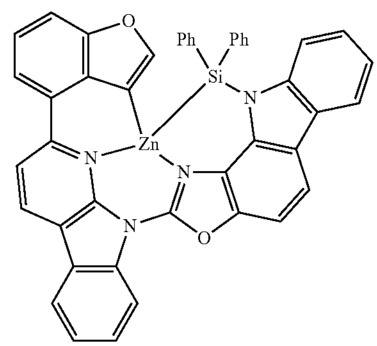
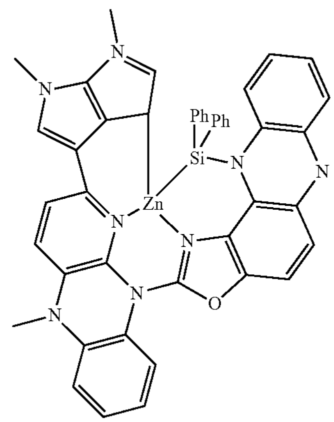
In various aspects, such an inventive complex can comprise any one or more of the following:
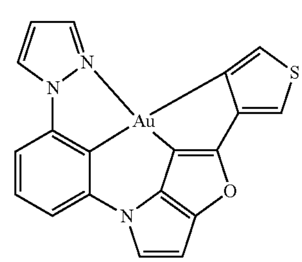

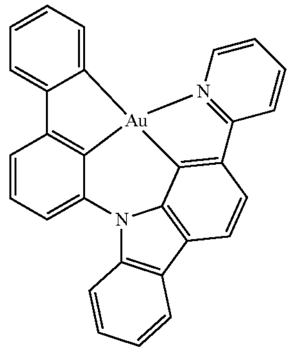
Au
N
N
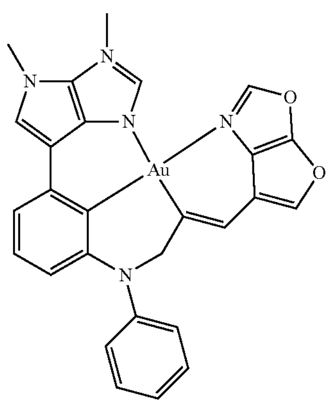
N
N
N
Au
N
O
O
N
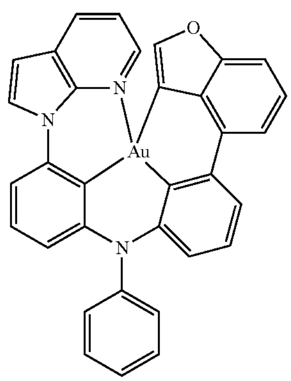
O
N
N
Au
N
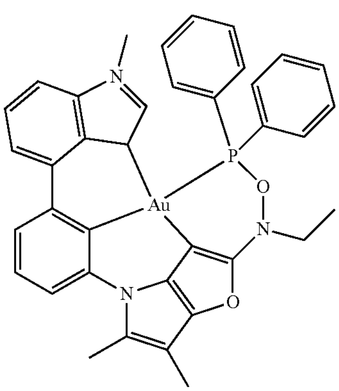
N
P
O
Au
N
N
O
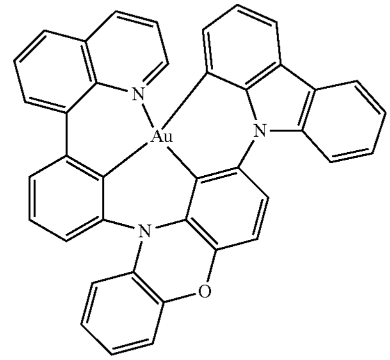
N
Au
N
N
O
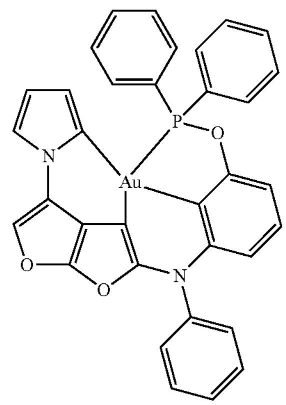
P
O
N
Au
O
O
N
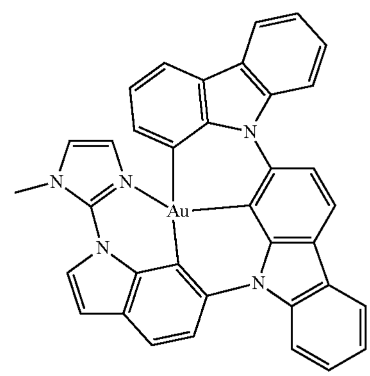
N
N
N
Au
N
N
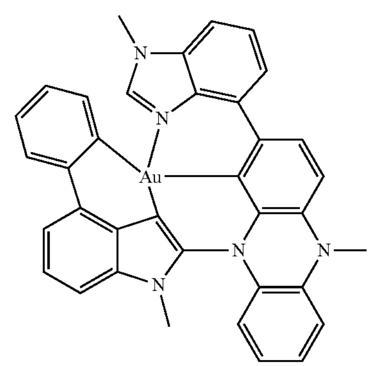
N
N
Au
N
N
N -continued
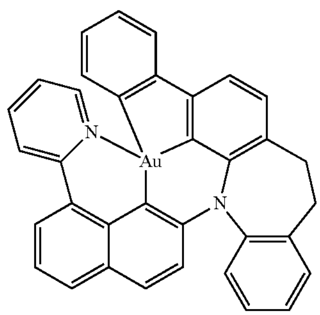
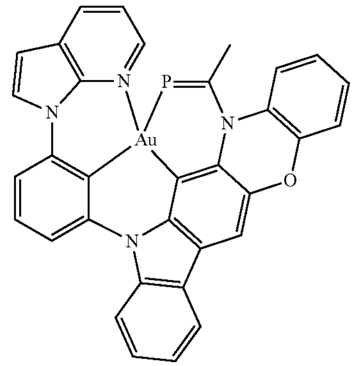
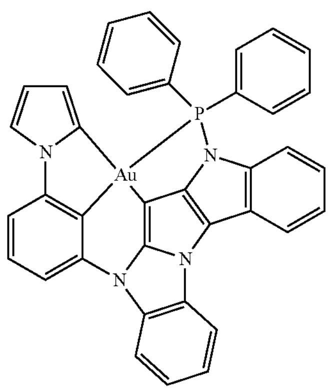
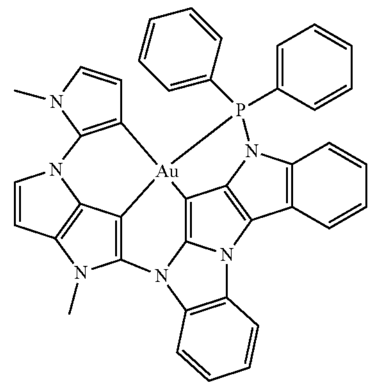
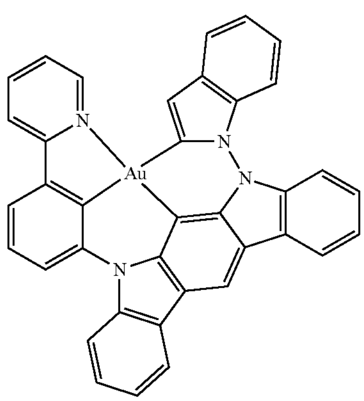
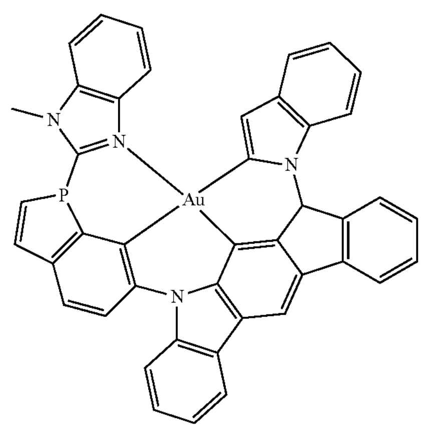
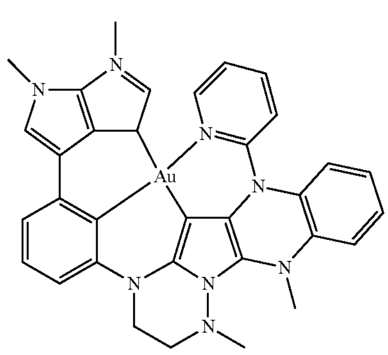
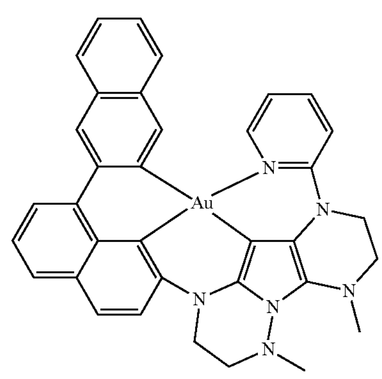

-continued
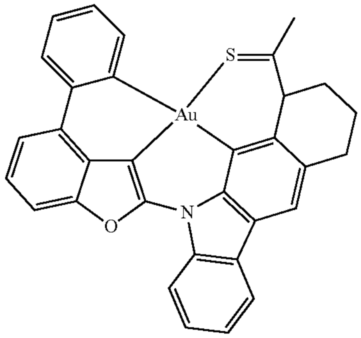
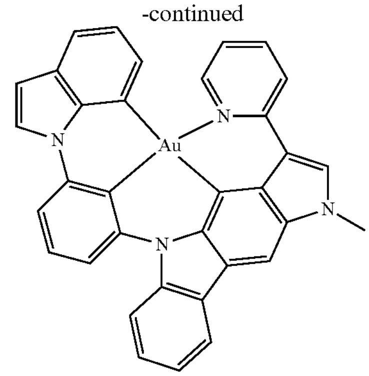
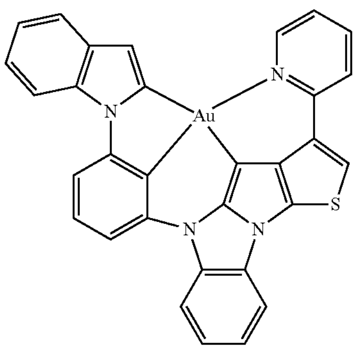
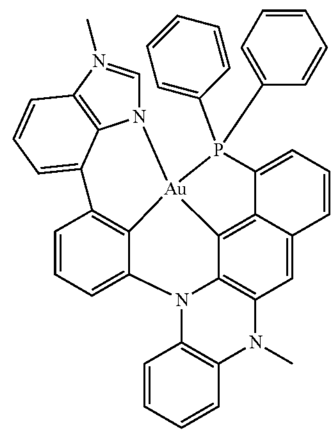
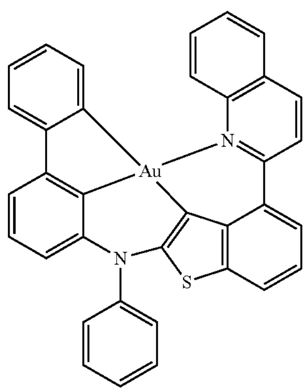
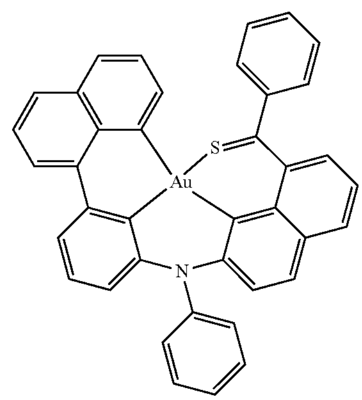
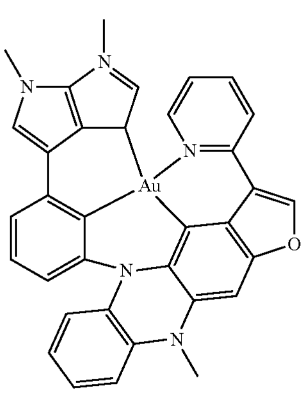
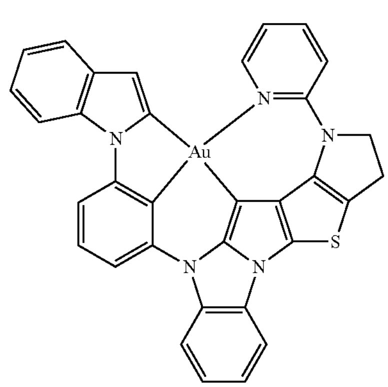

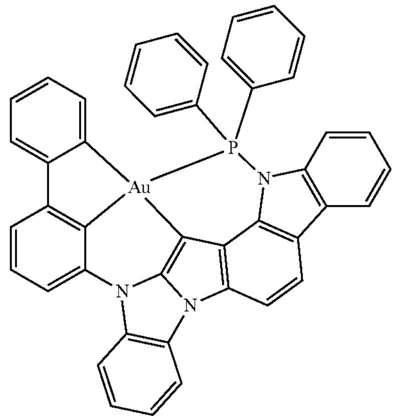
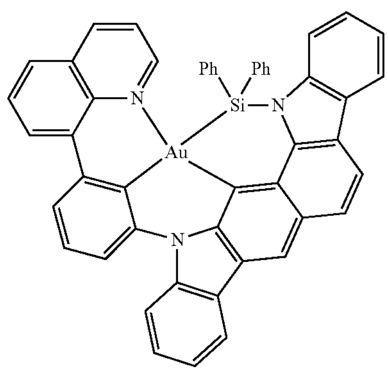
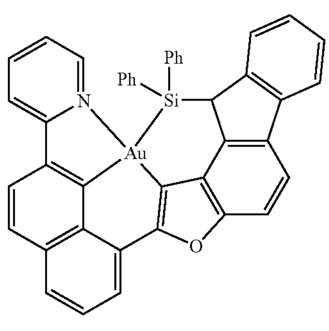
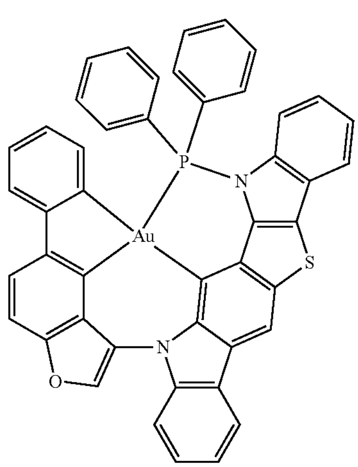
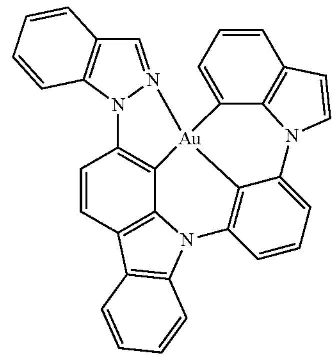
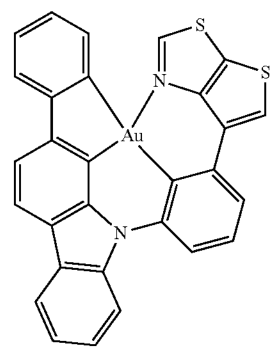
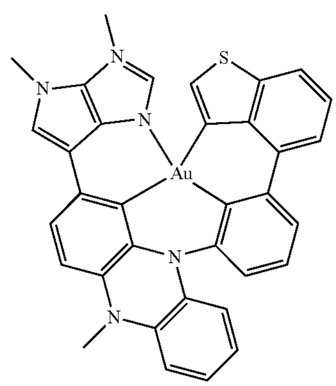
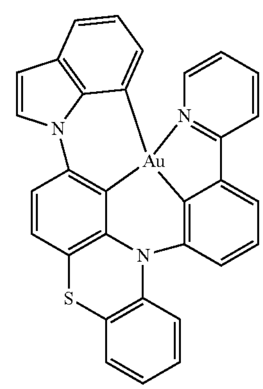

-continued
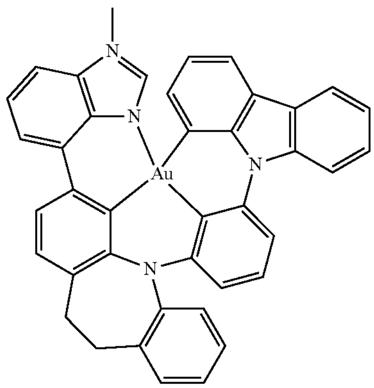
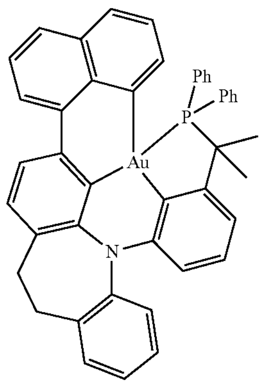
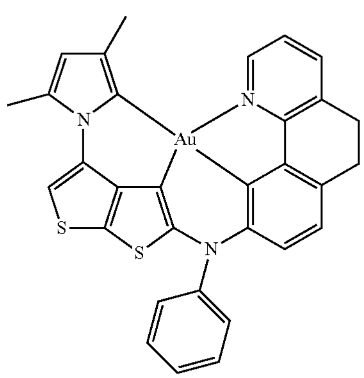
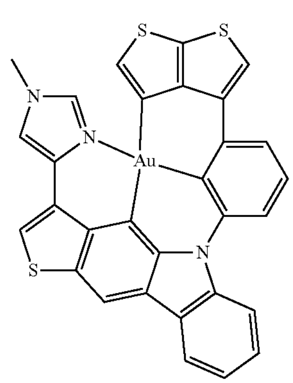
-continued
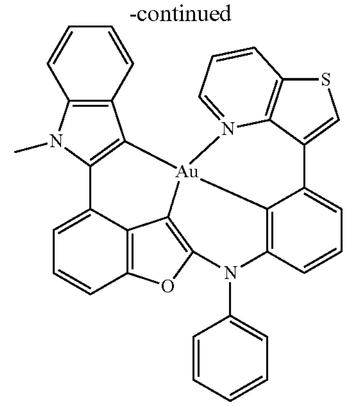
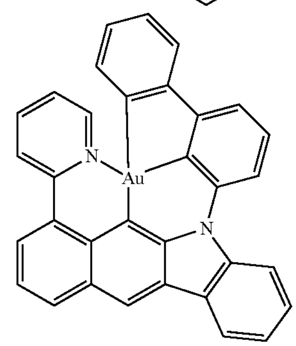
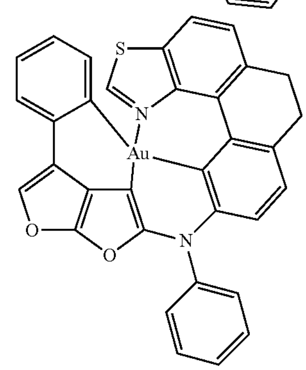
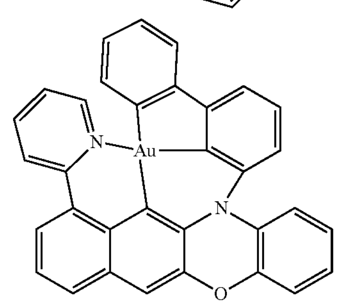
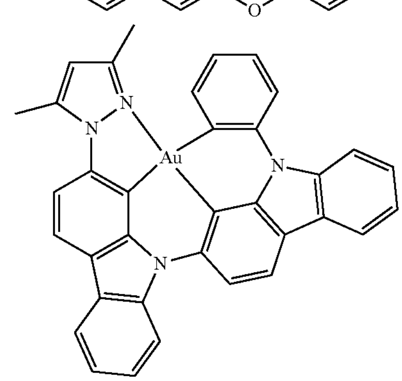

-continued
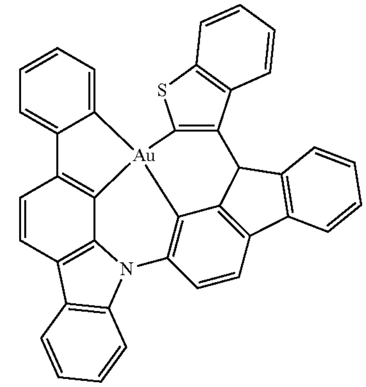
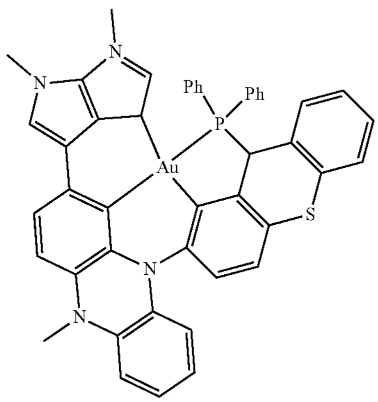
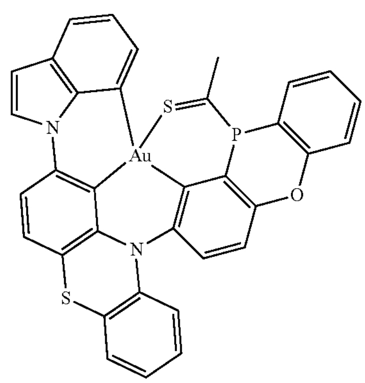
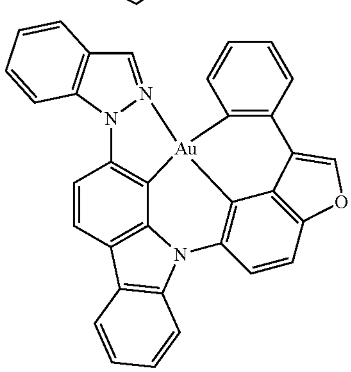
-continued
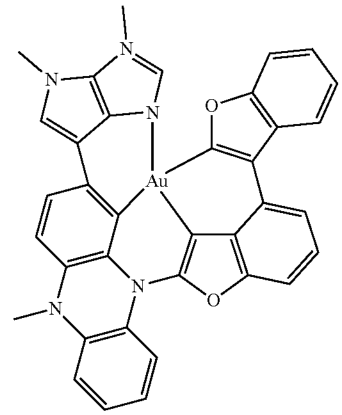
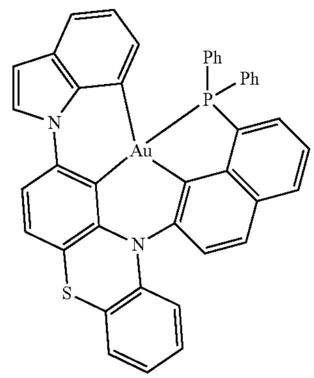
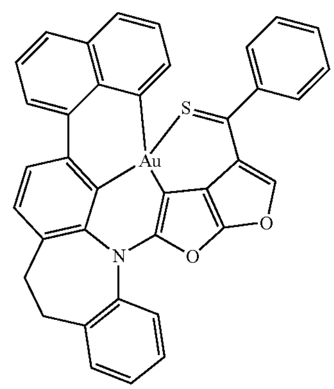
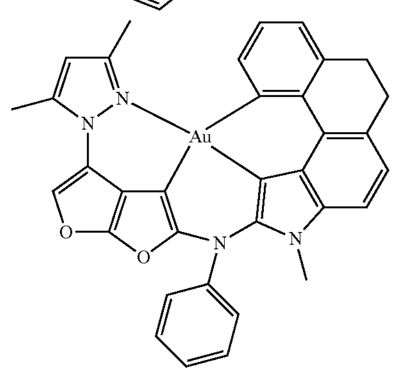

-continued
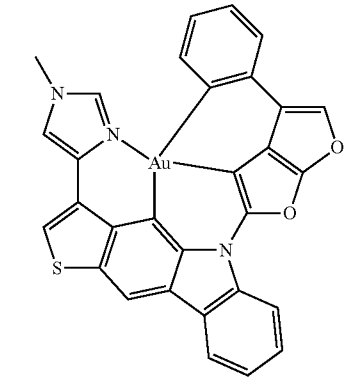
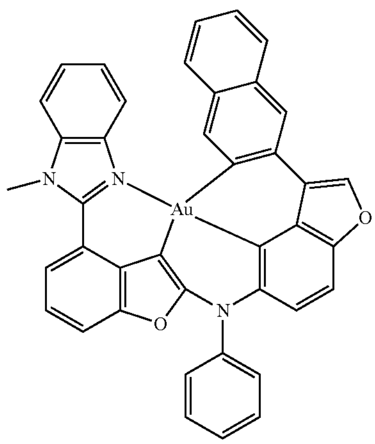
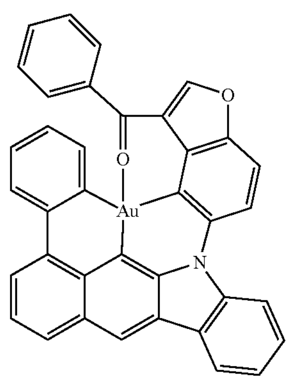
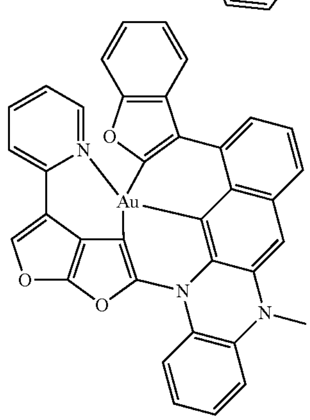
-continued
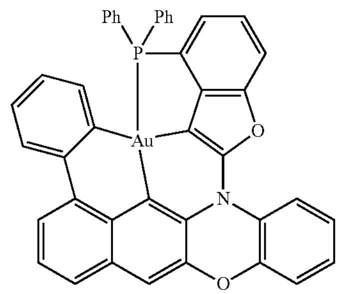
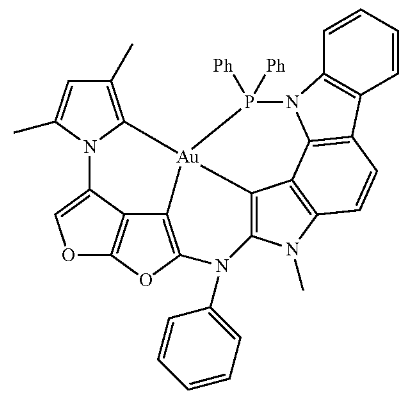
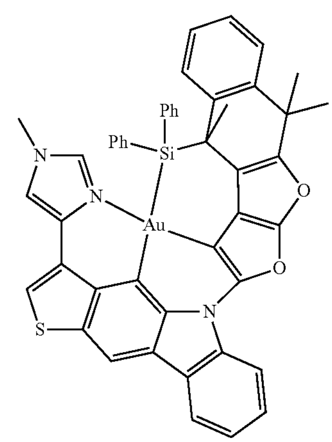
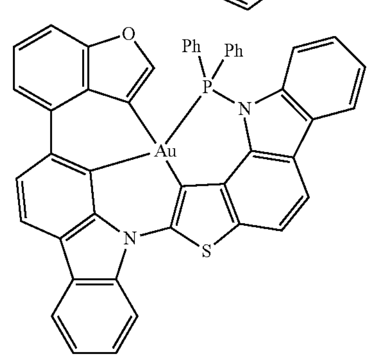

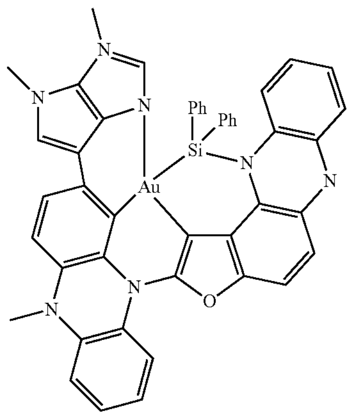
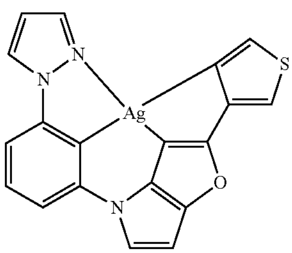
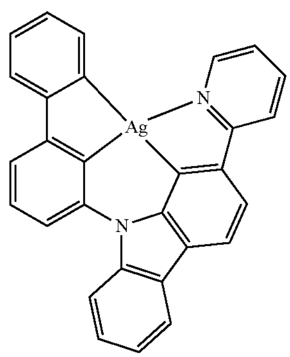
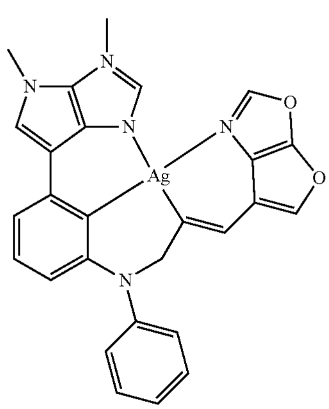
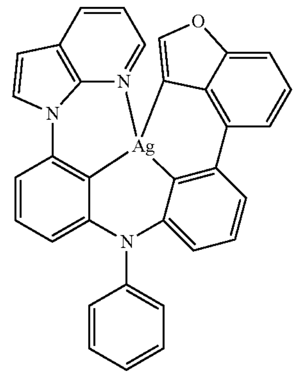
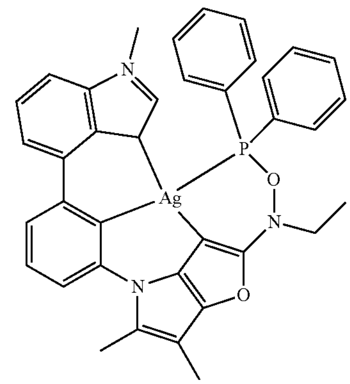
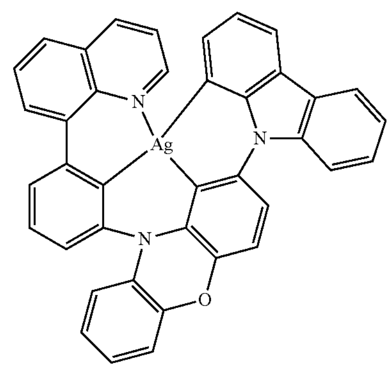
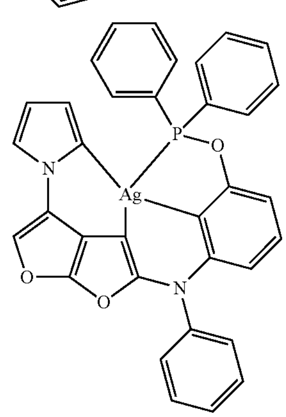

-continued
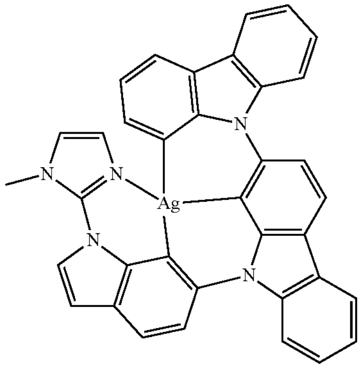
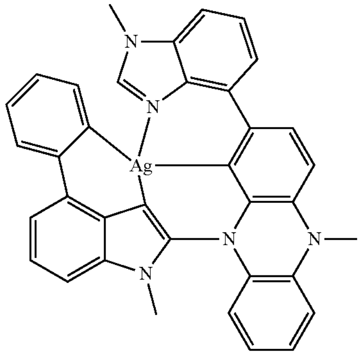
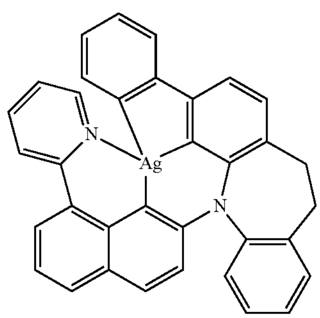
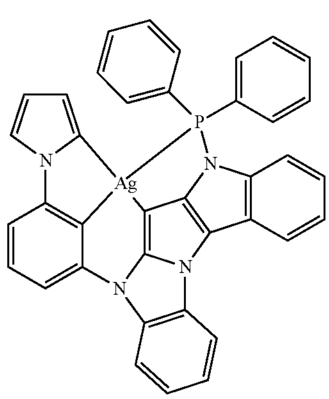
-continued
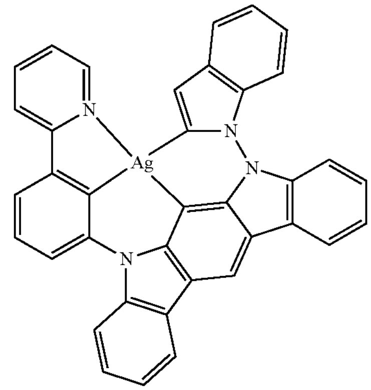
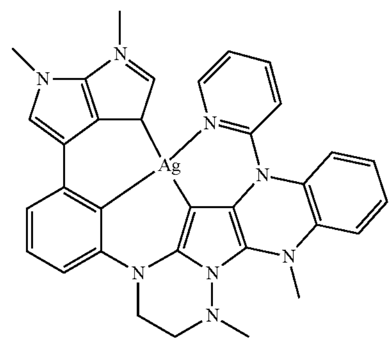
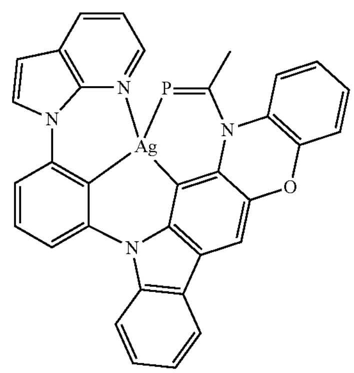
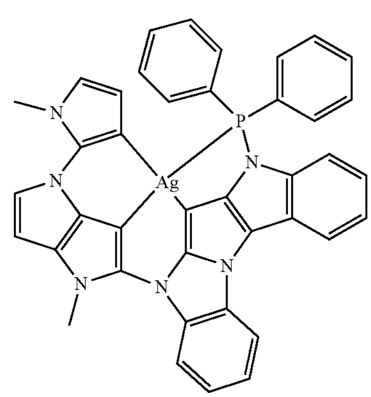

-continued
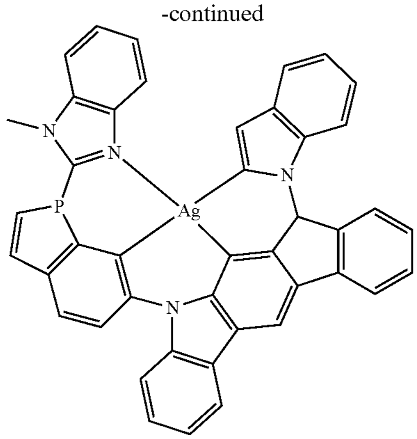
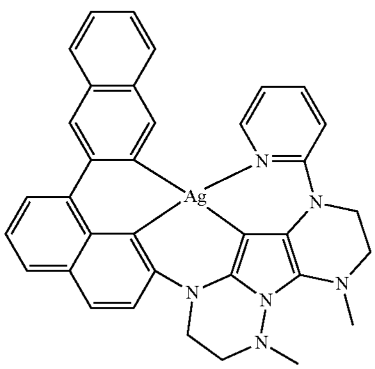
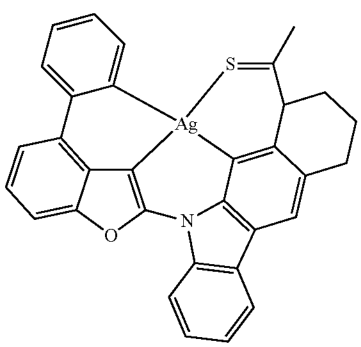
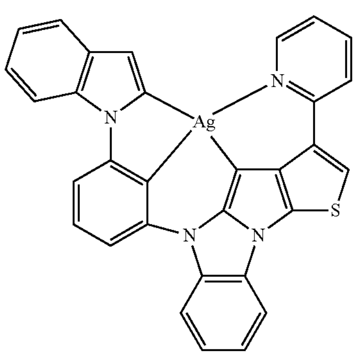
-continued
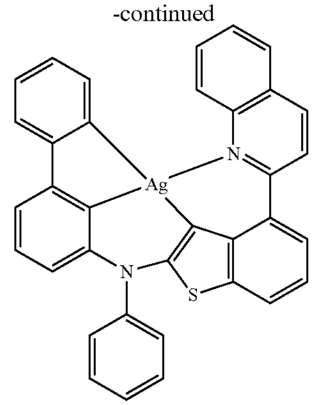
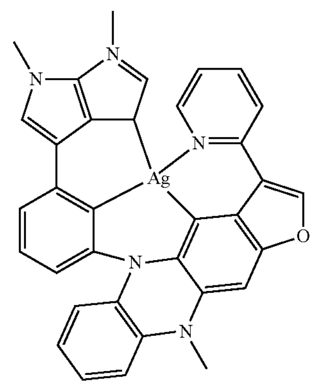
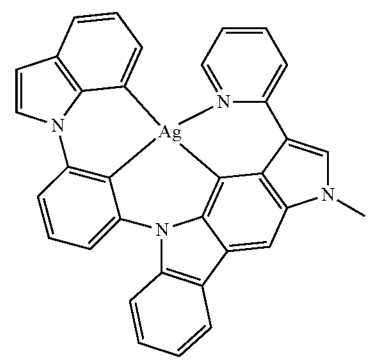
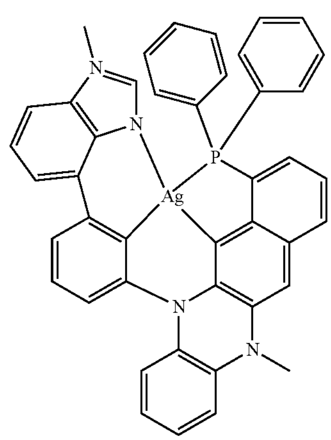

-continued
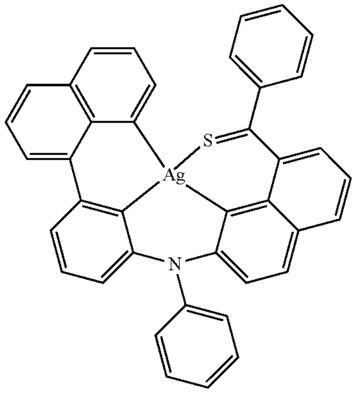
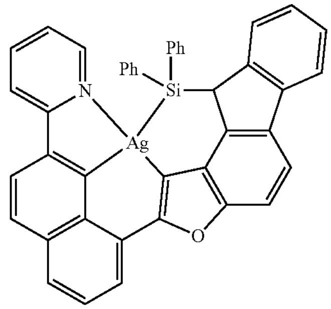
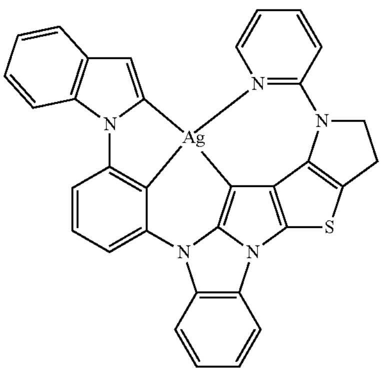
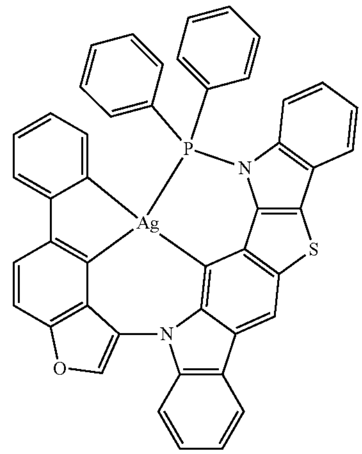
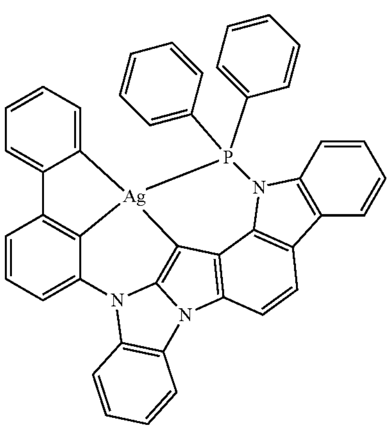
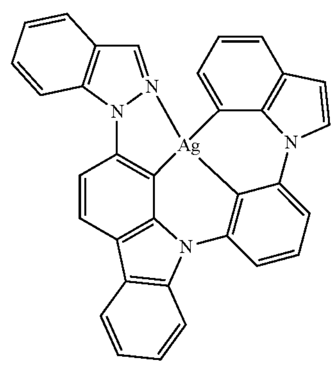
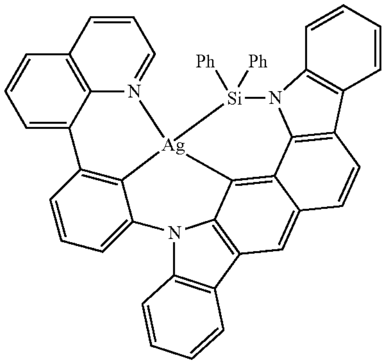
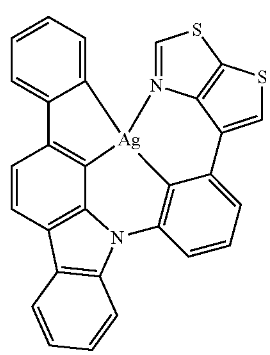

-continued
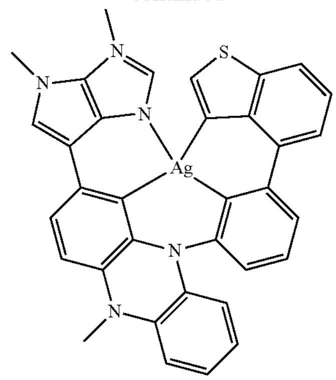
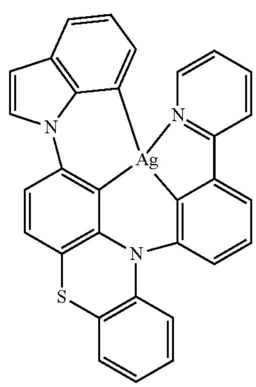
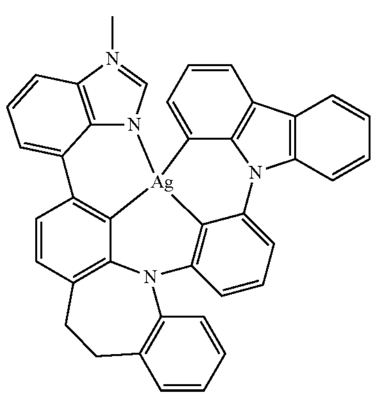
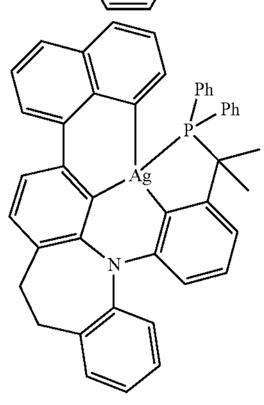
-continued
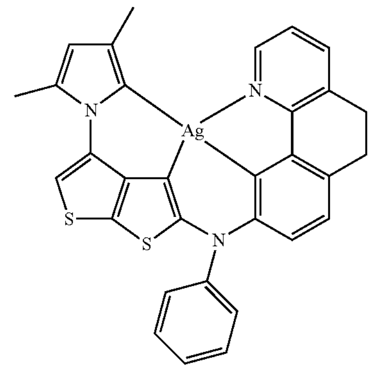
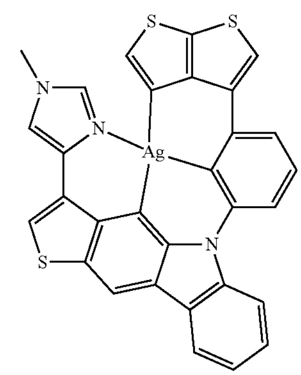
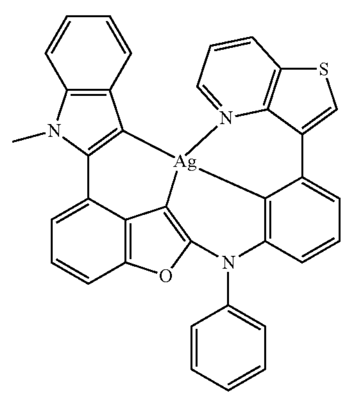
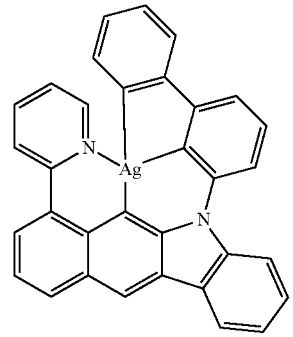

-continued
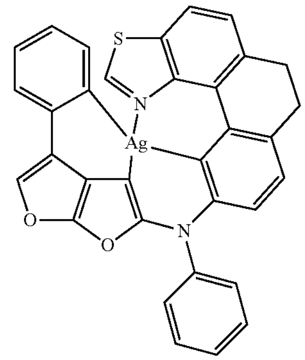
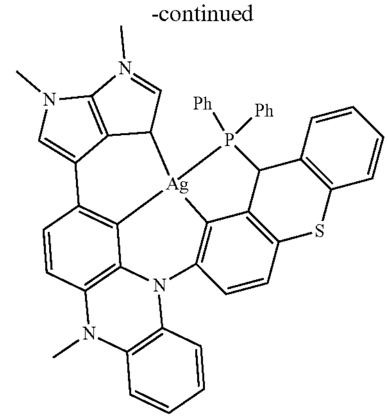
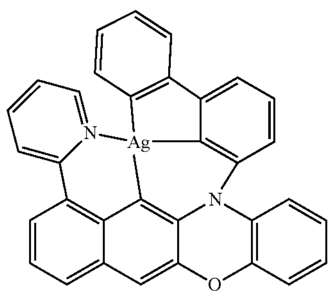
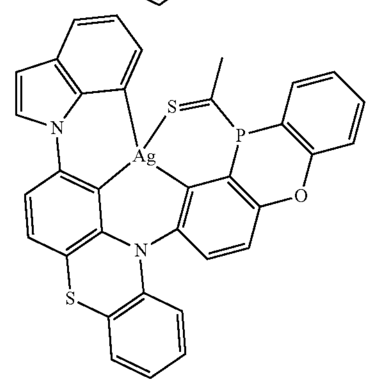
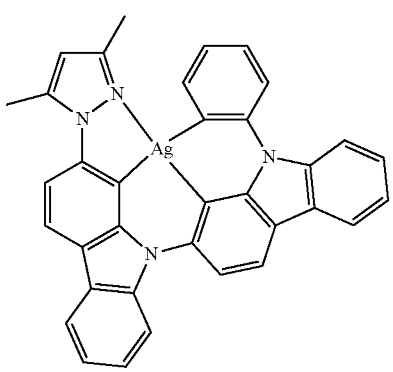
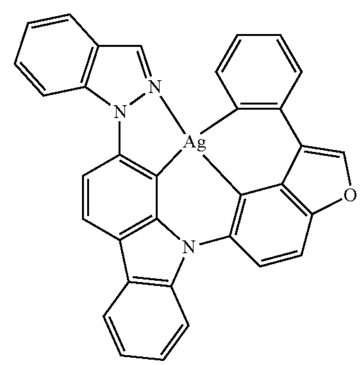
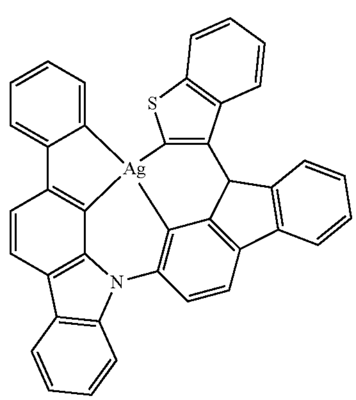
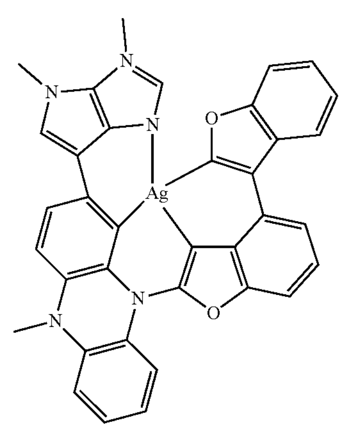

-continued
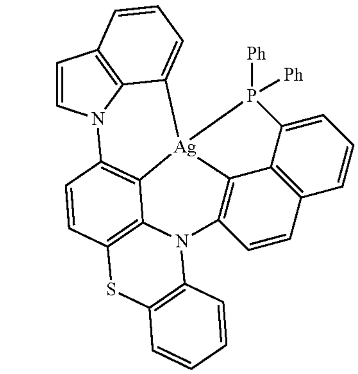
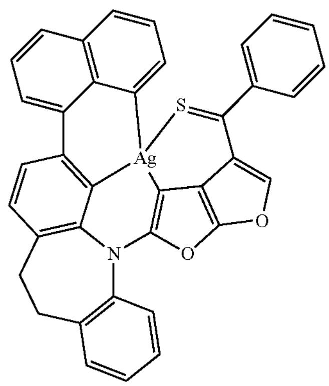
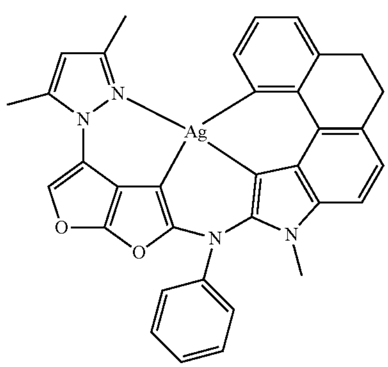
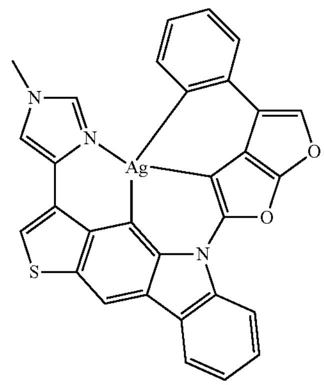
-continued
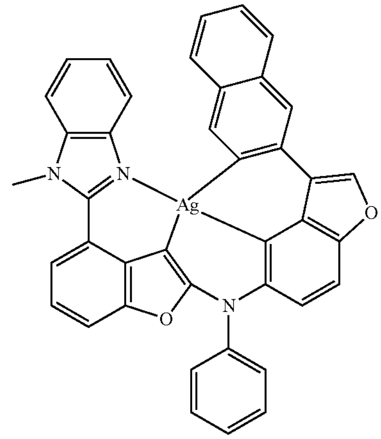
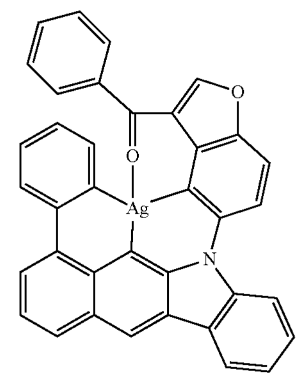
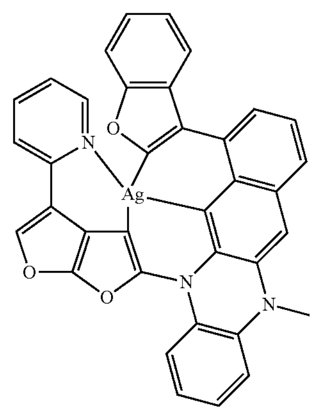
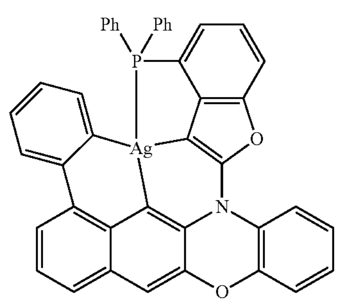

-continued
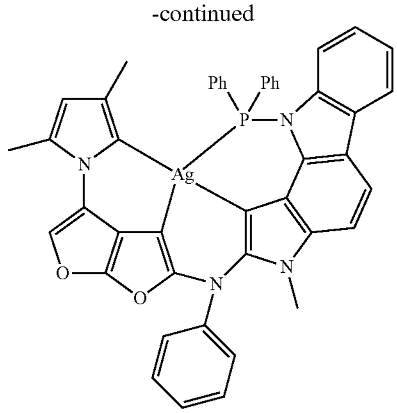
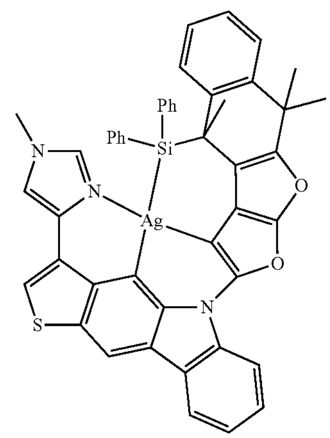
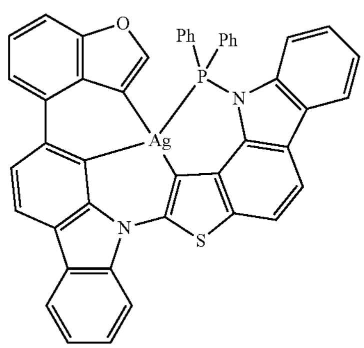
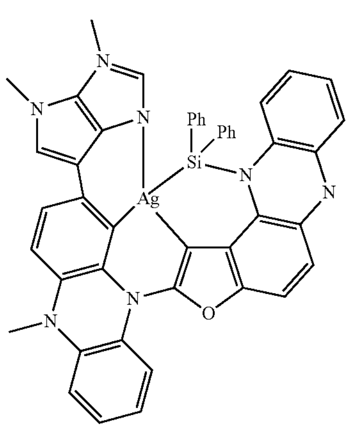
-continued
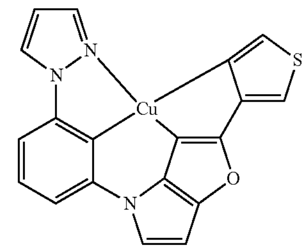
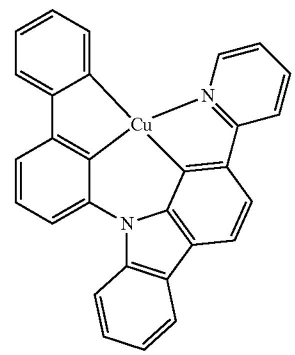
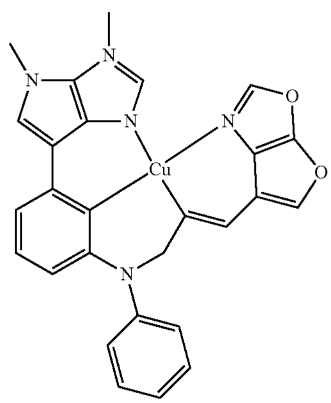
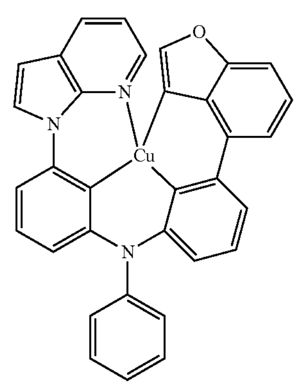

-continued
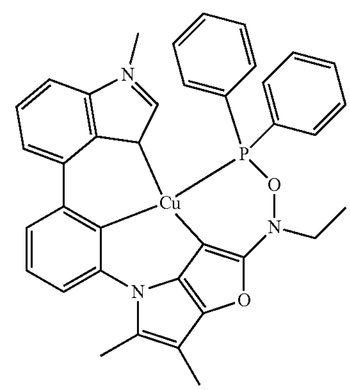
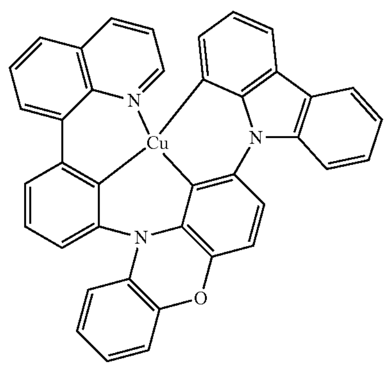
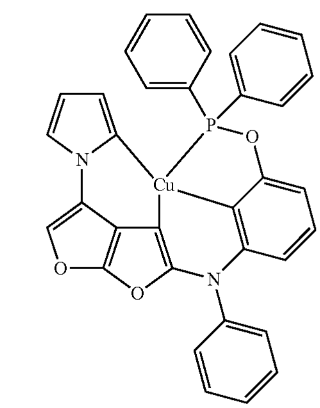
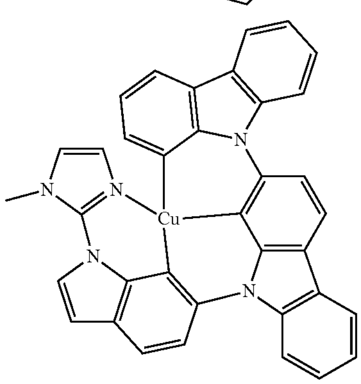
-continued
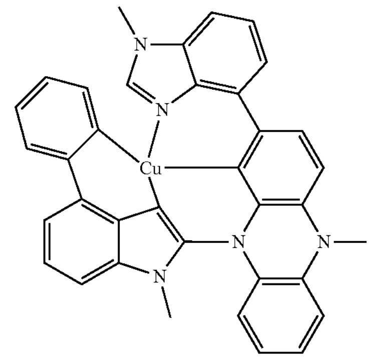
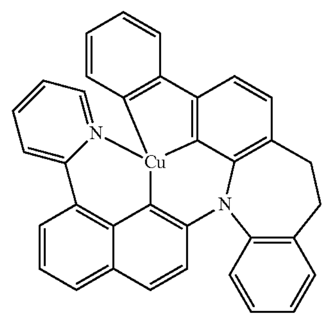
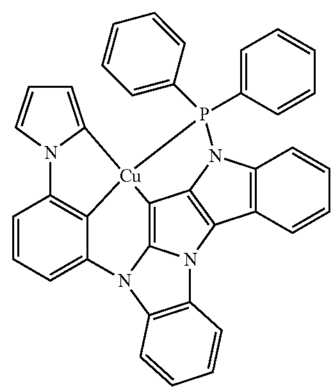
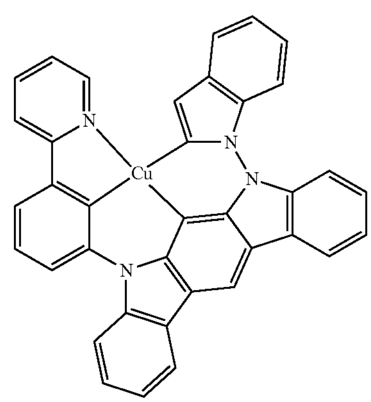

-continued
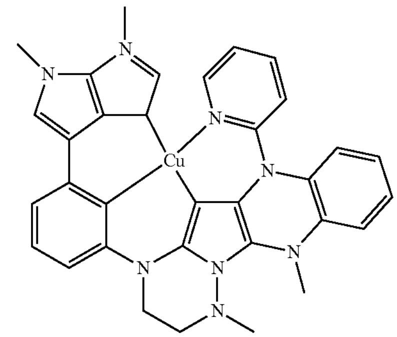
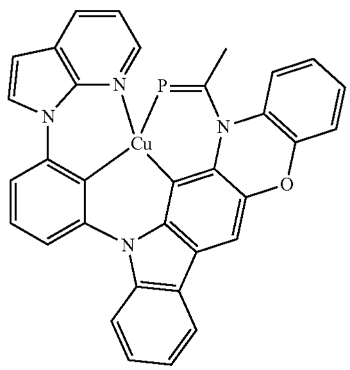
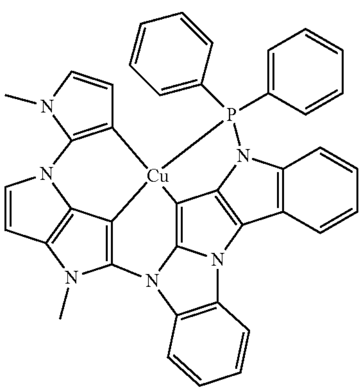
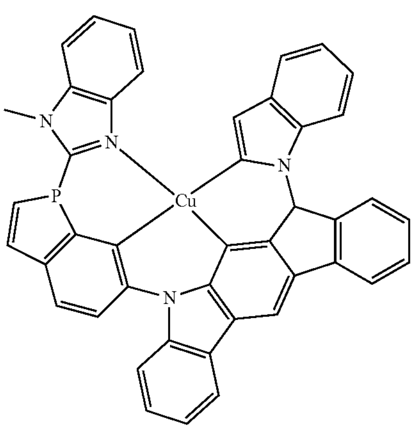
-continued
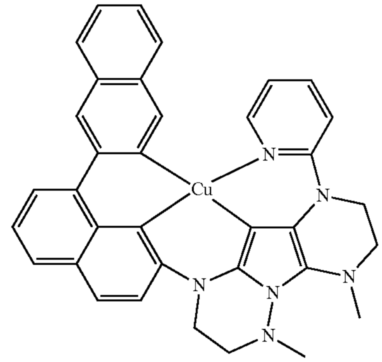
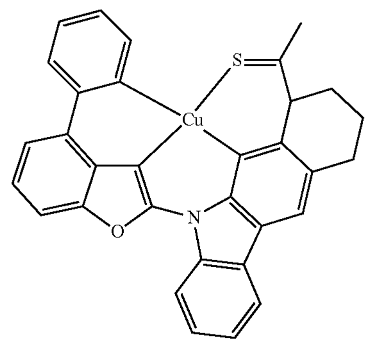
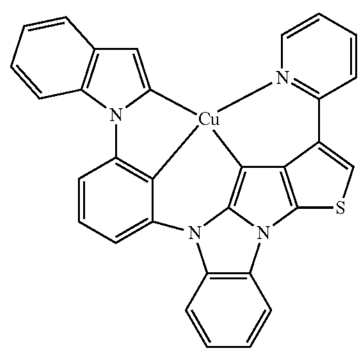
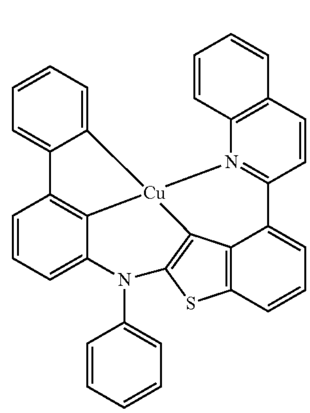

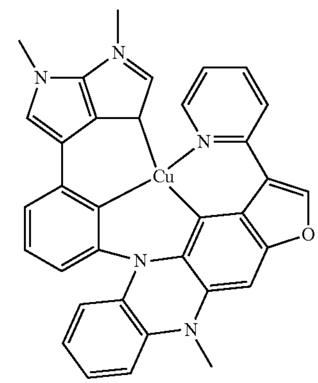
N
N
N
Cu
N
O
N
N
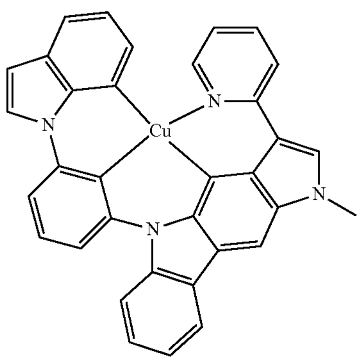
N
Cu
N
N
N
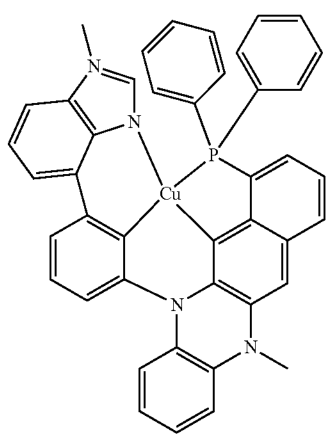
N
N
P
Cu
N
N
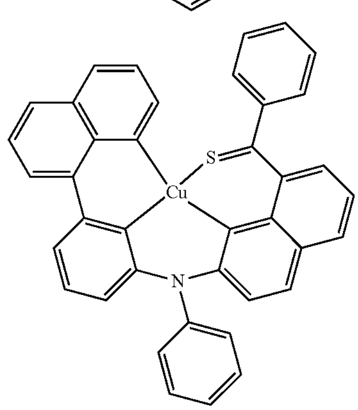
S
Cu
N
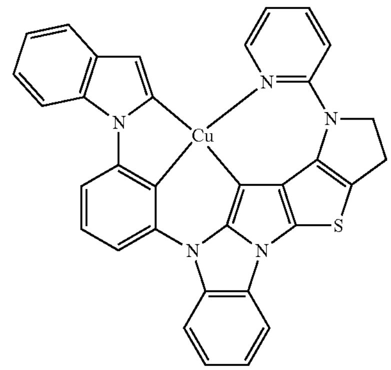
N
N
Cu
N
N
N
S
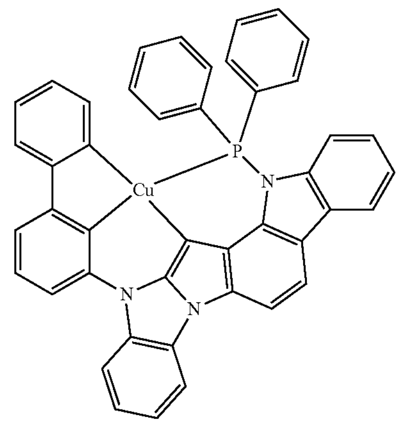
P
Cu
N
N
N
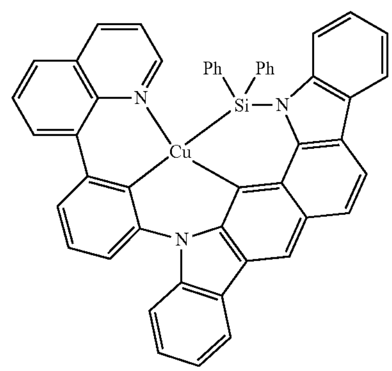
Ph
Ph
N
Si
N
Cu
N
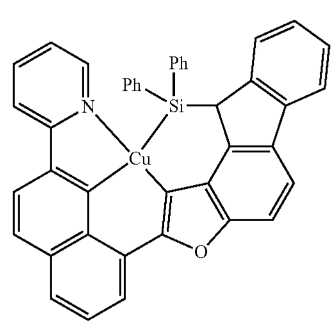
Ph
Ph
N
Si
Cu
O

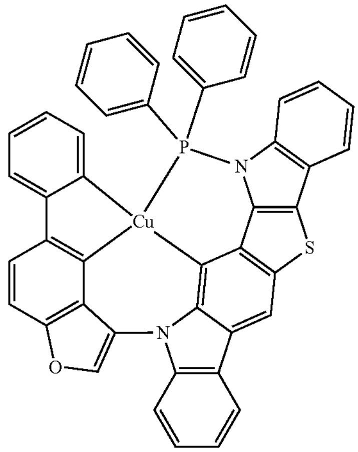
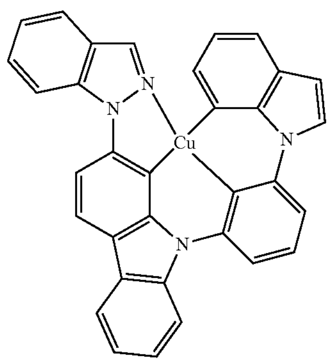
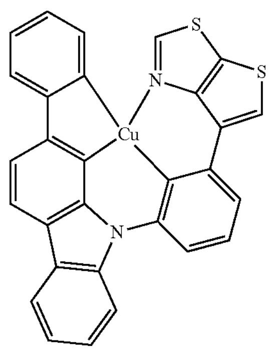
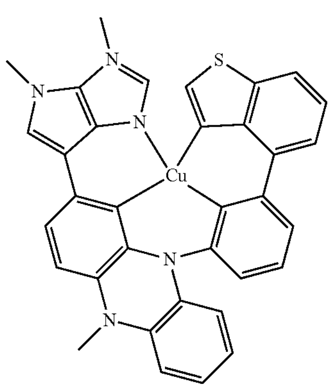
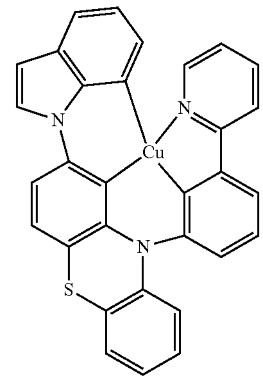
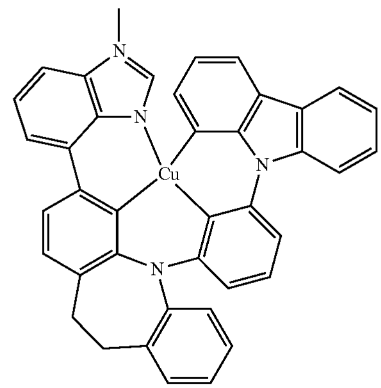
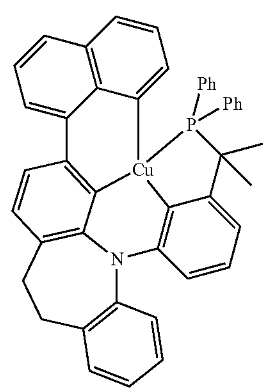
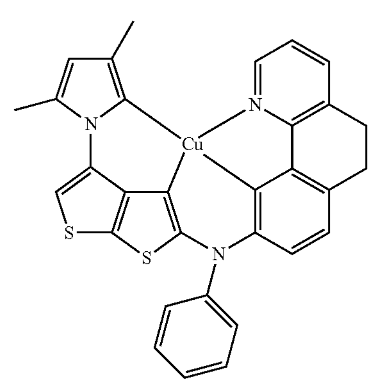

-continued
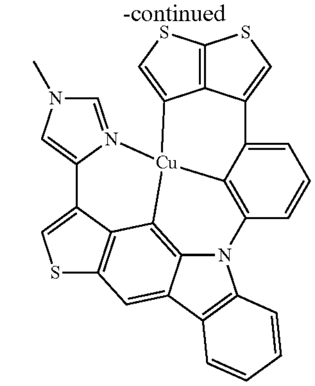
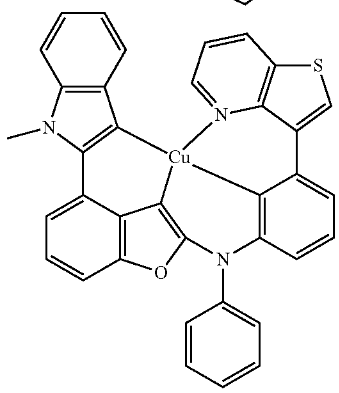
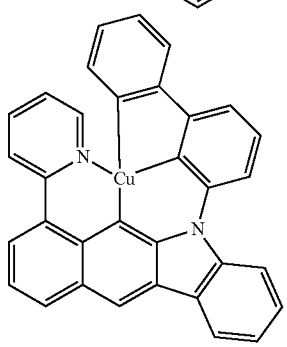
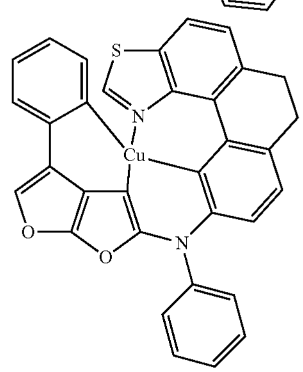
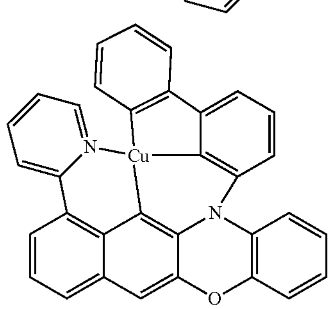
-continued
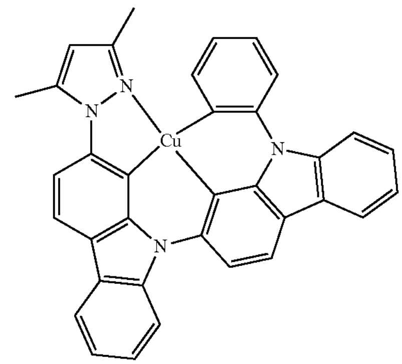
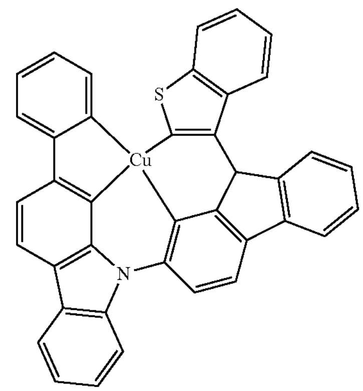
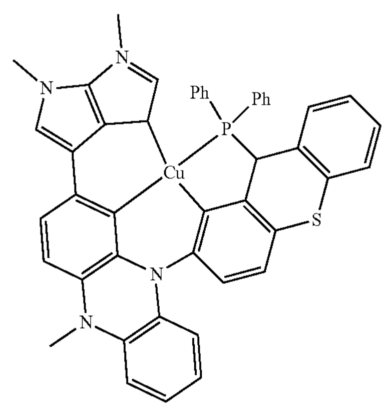
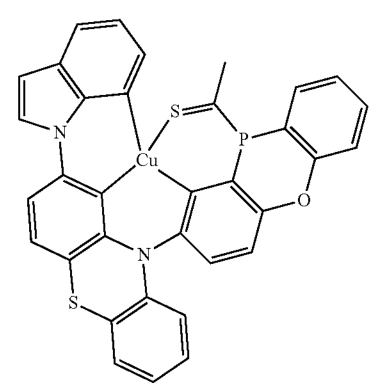

-continued
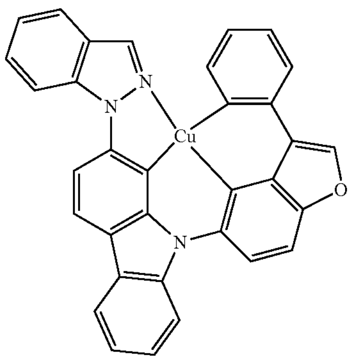
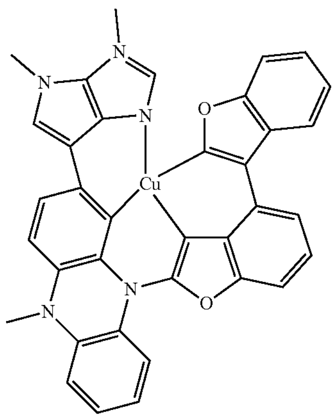
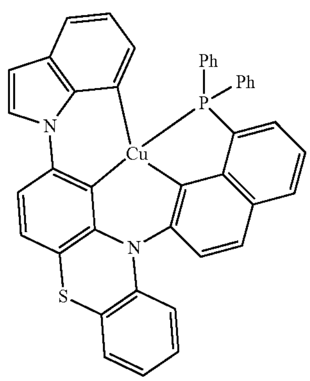
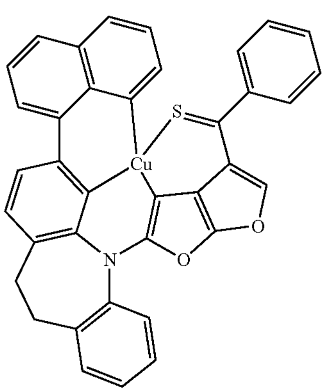
-continued
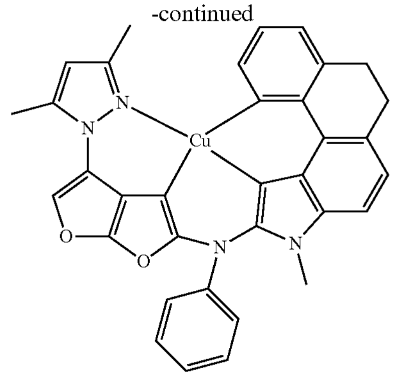
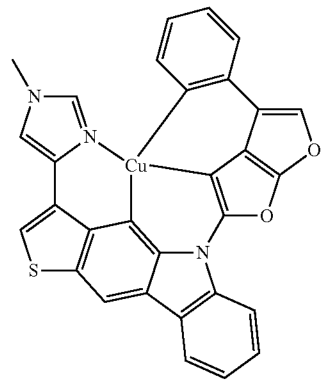
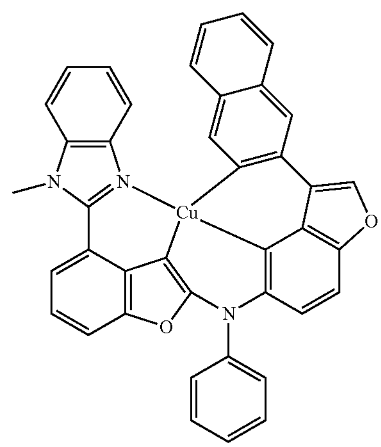
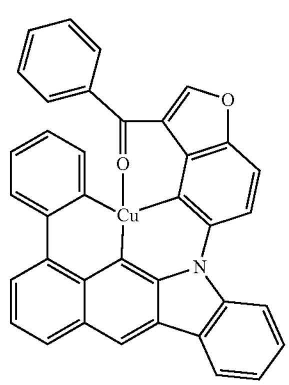

-continued
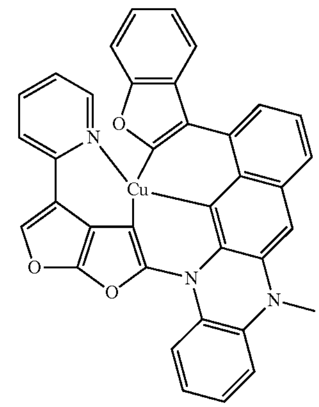
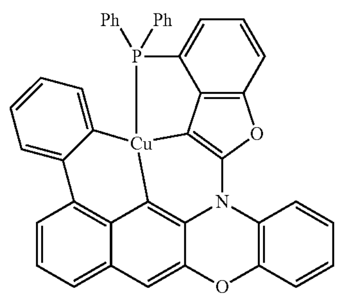
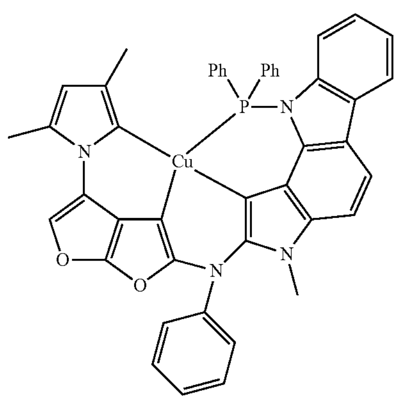
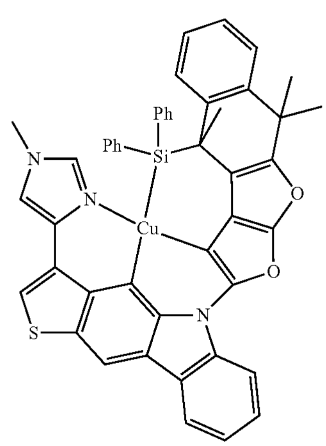
-continued
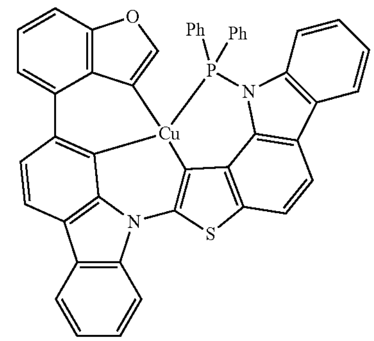
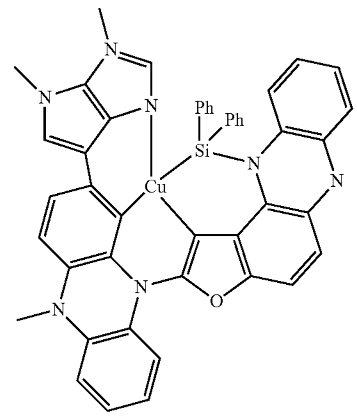
In various aspects, such an inventive complex can comprise any one or more of the following:
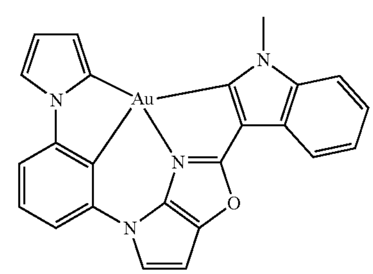
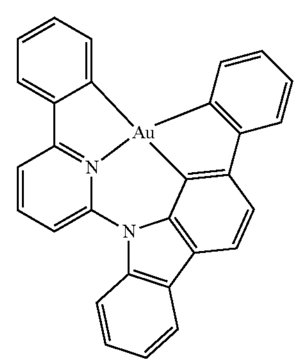

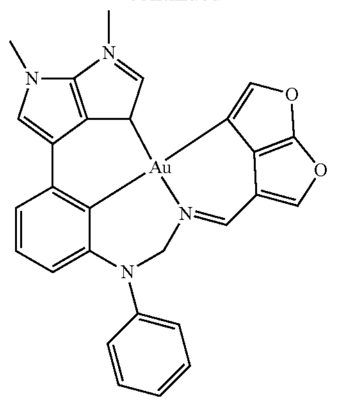
N
N
Au
O
O
N
N
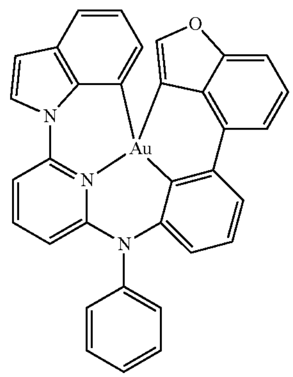
O
N
Au
N
N
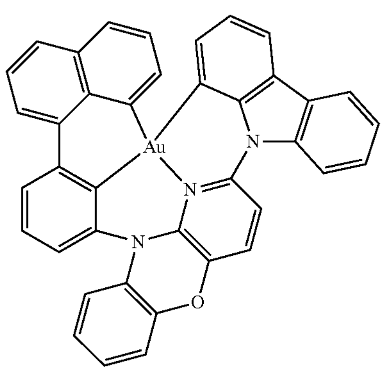
Au
N
N
N
O
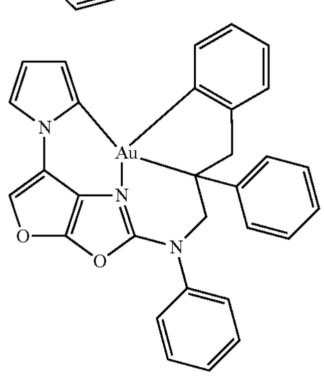
N
Au
N
O
O
N
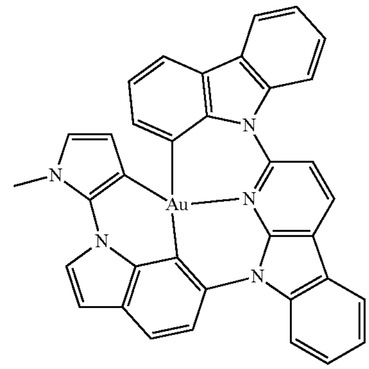
N
N
Au
N
N
N
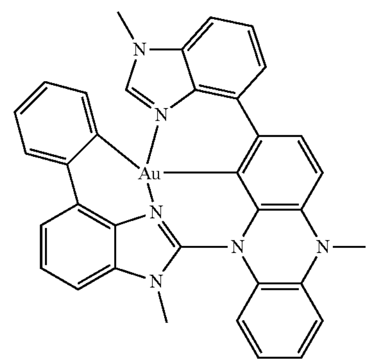
N
N
Au
N
N
N
N
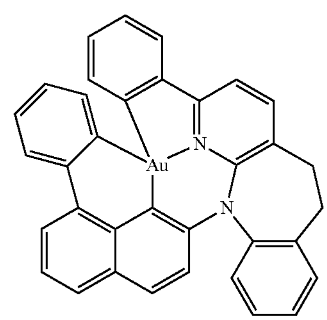
N
Au
N
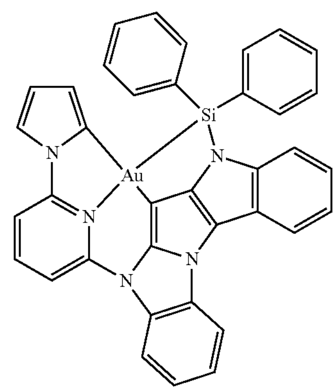
Si
N
Au
N
N
N
N

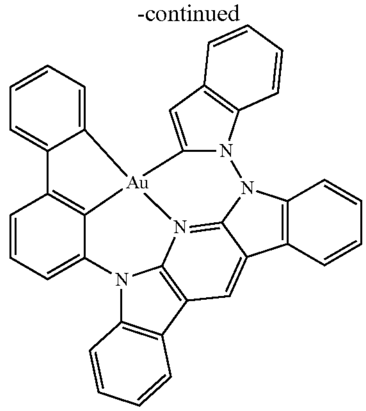
Au
N
N
N
N
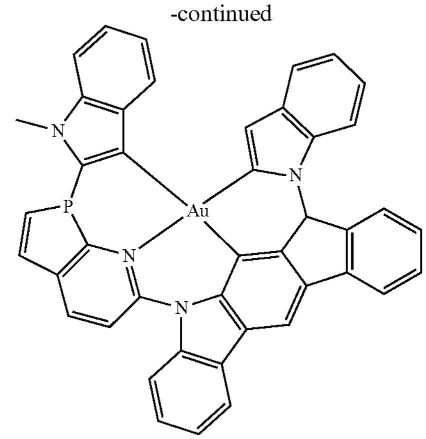
N
P
Au
N
N
N
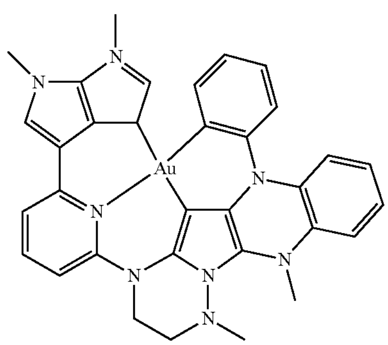
N
N
Au
N
N
N
N
N
N
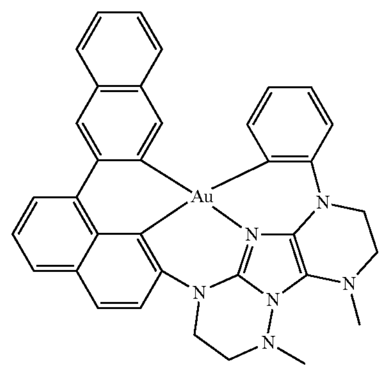
Au
N
N
N
N
N
N
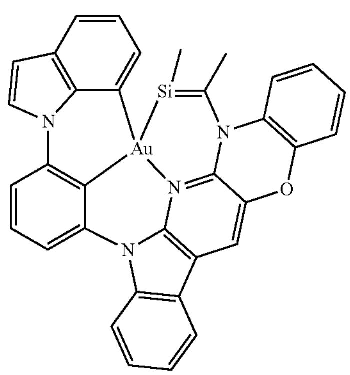
Si
N
Au
N
O
N
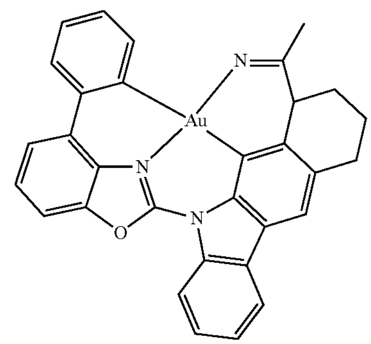
N
Au
N
O
N
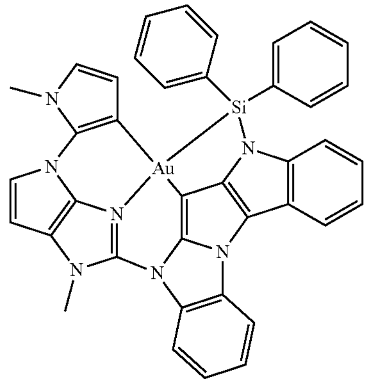
N
Si
N
Au
N
N
N
N
N
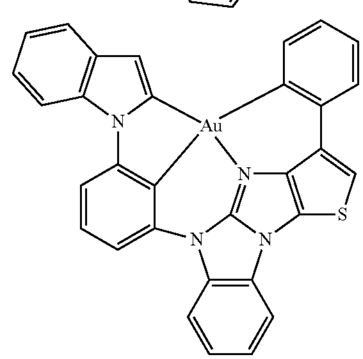
N
Au
N
N
N
S -continued
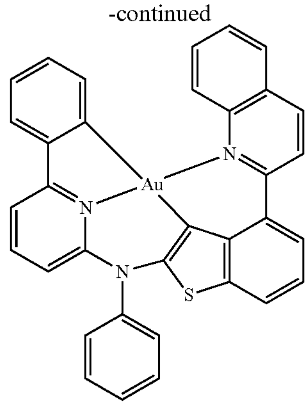
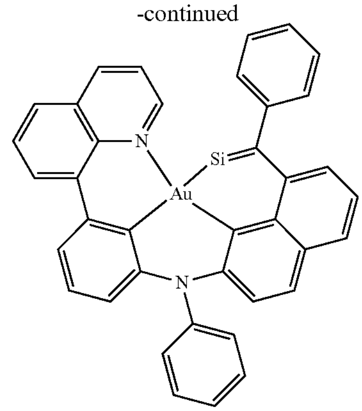
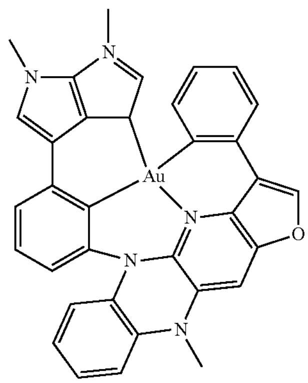
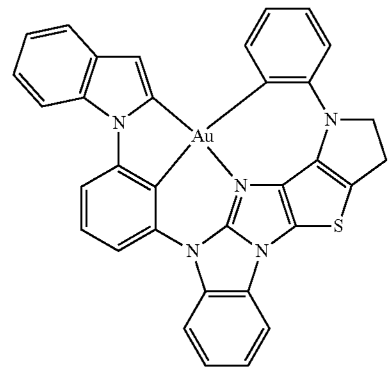
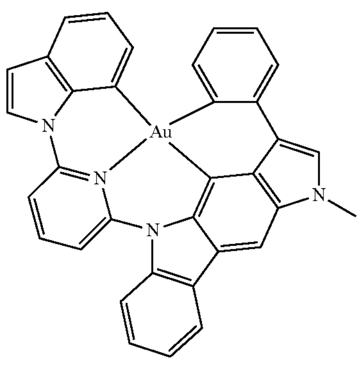
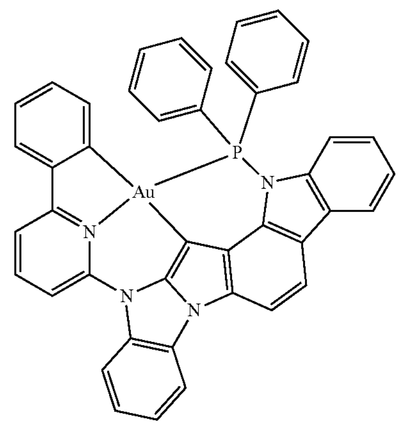
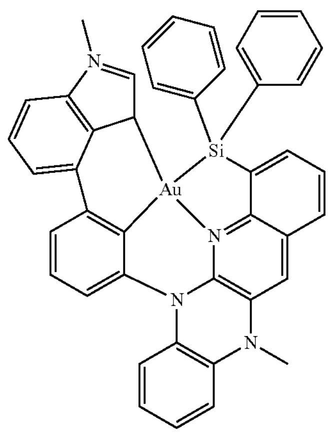
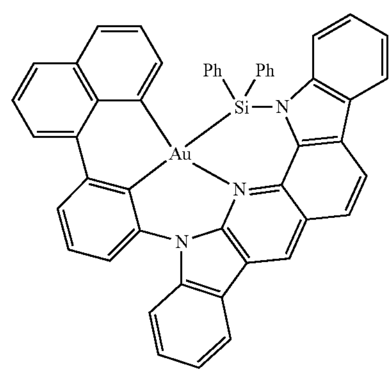

-continued
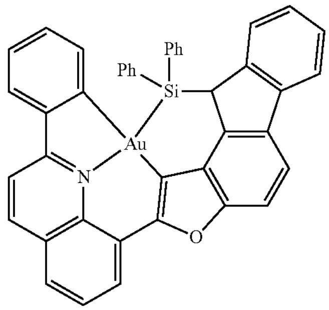
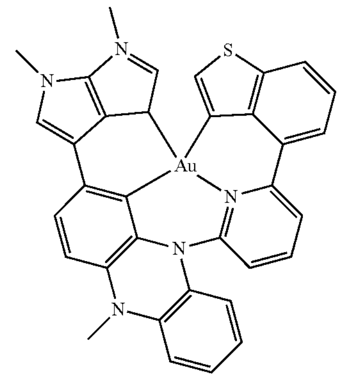
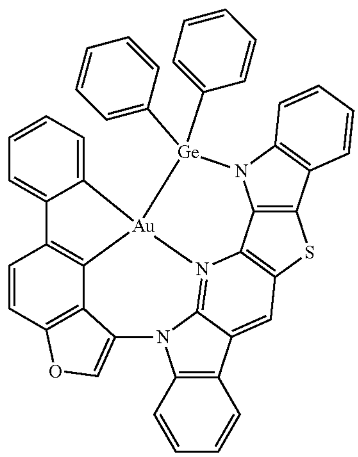
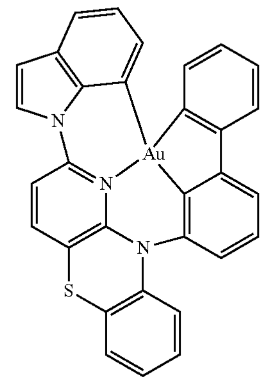
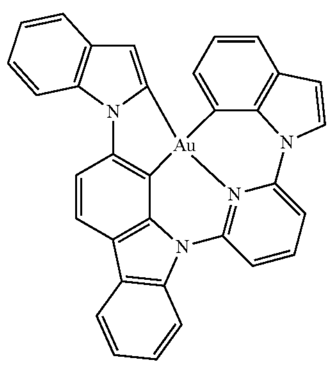
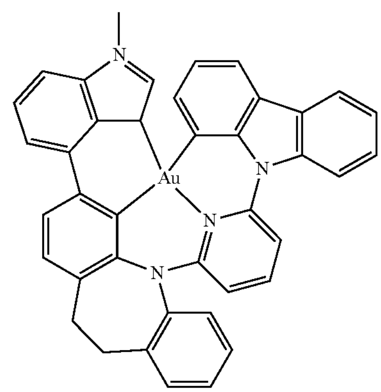
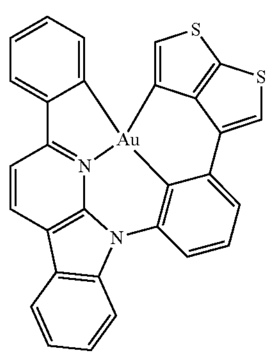
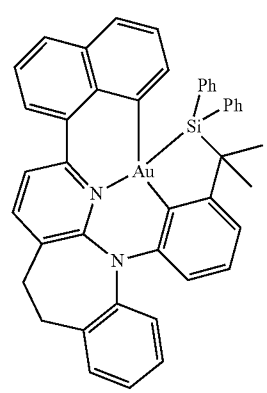

-continued
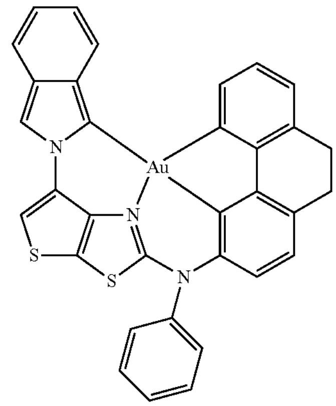
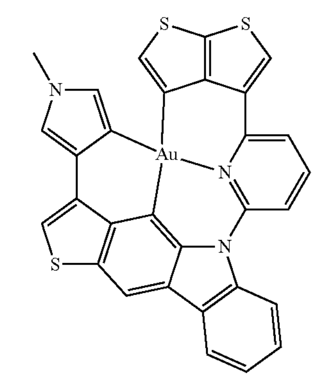
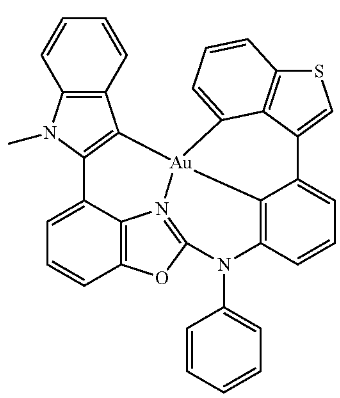
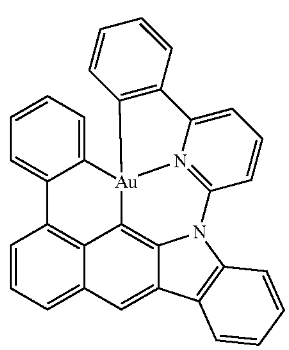
-continued
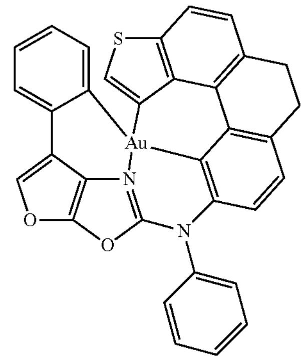
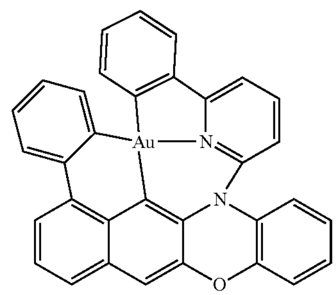
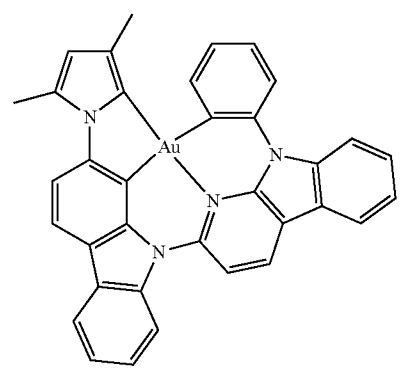
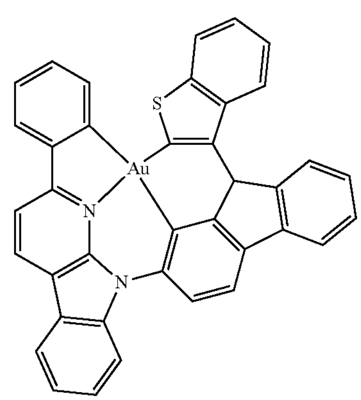

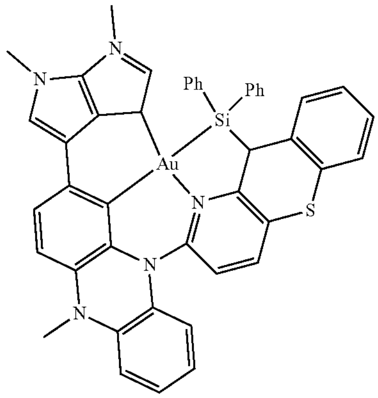
N
N
Ph
Ph
Si
Au
N
S
N
N
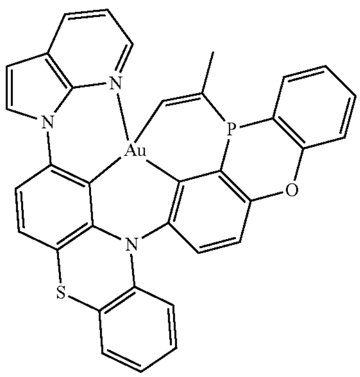
N
N
P
Au
O
N
S
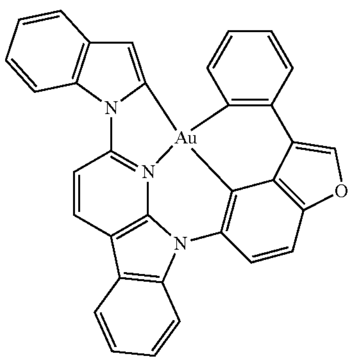
N
Au
N
N
O
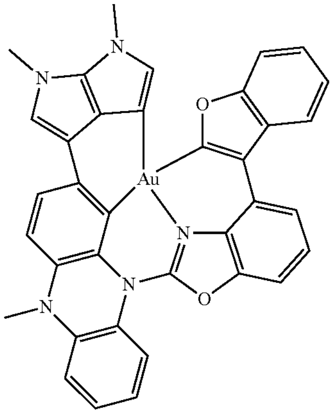
N
N
O
Au
N
N
O
N
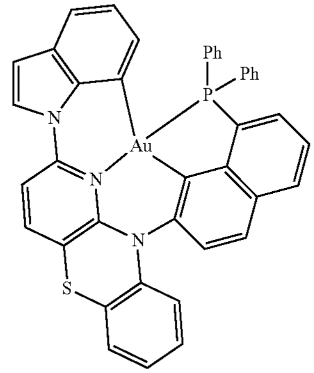
Ph
Ph
P
N
Au
N
N
S
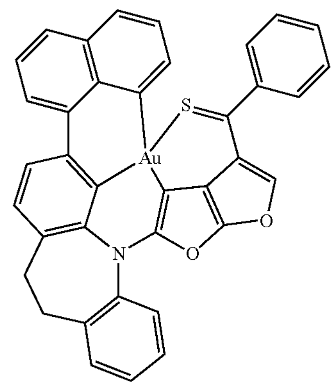
S
Au
O
O
N
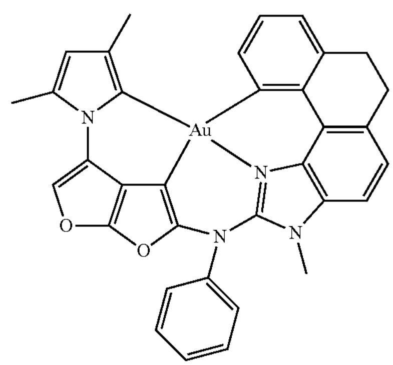
N
Au
N
O
O
N
N
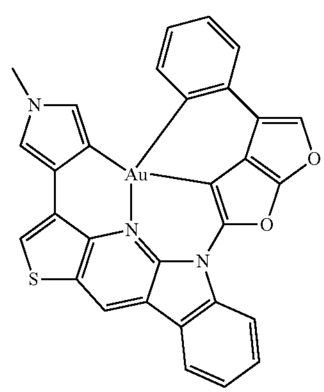
N
Au
O
N
O
S
N

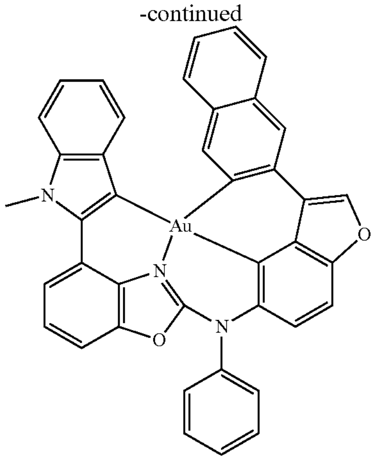
Au
N
O
N
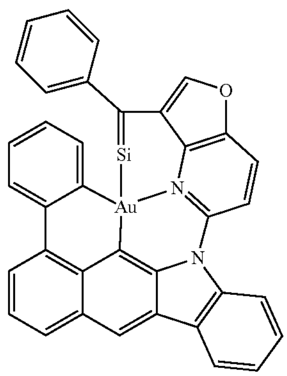
O
Si
Au
N
N
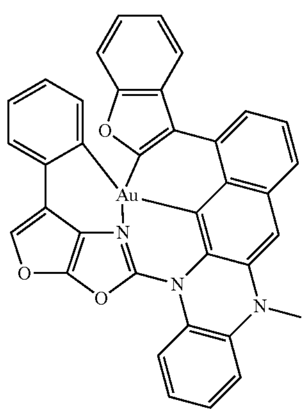
O
Au
N
O
O
N
N
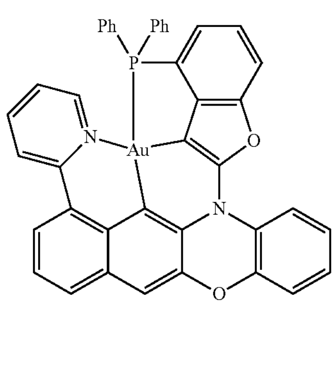
Ph
Ph
P
N
Au
O
N
O
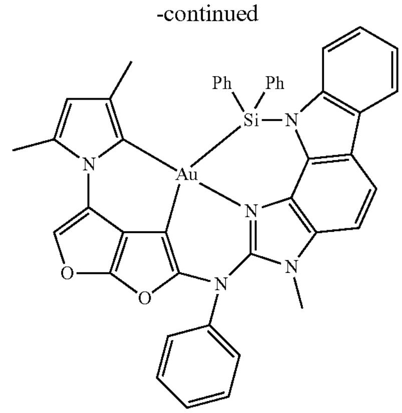
Ph
Ph
Si
N
N
Au
N
O
O
N
N
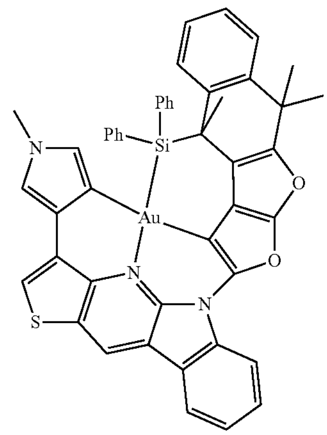
Ph
Ph
Si
N
O
Au
N
O
N
S
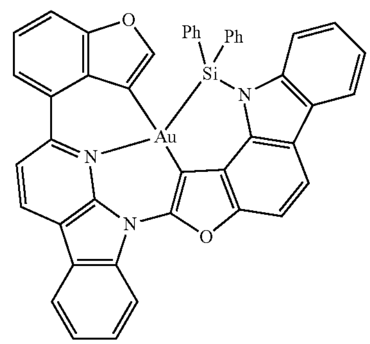
O
Ph
Ph
Si
N
N
Au
N
O
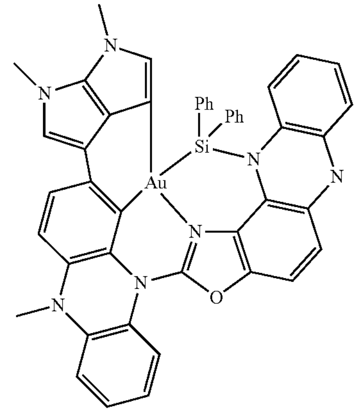
N
N
Ph
Ph
Si
N
N
Au
N
N
N
O -continued
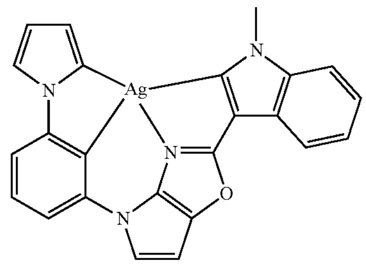
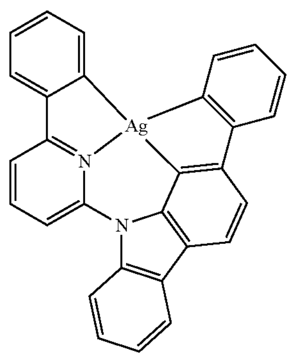
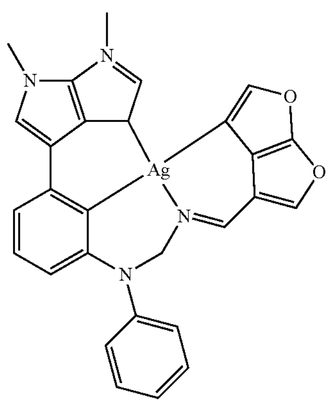
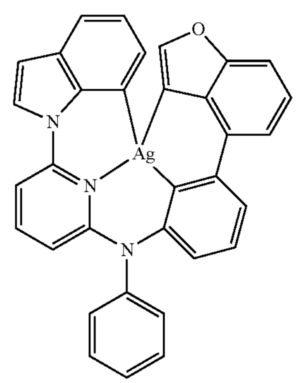
-continued
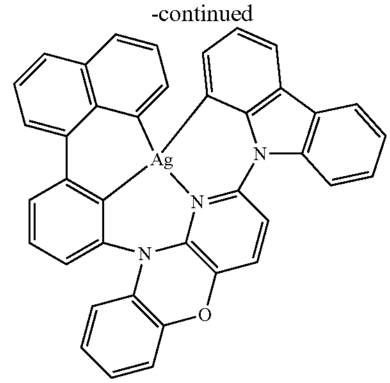
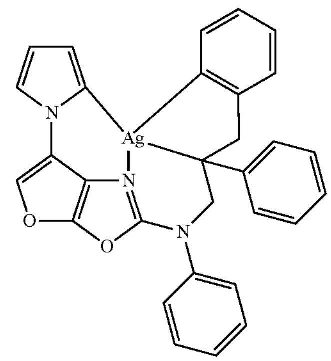
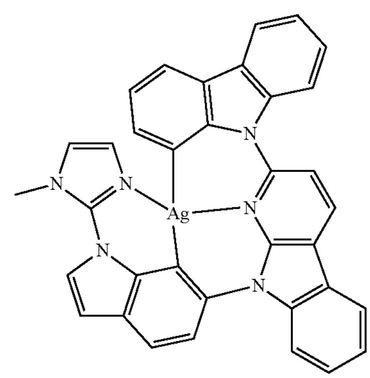
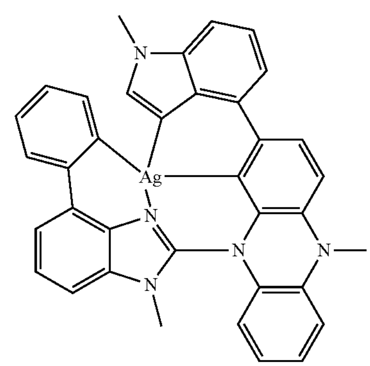

-continued
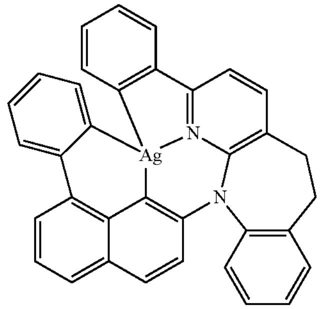
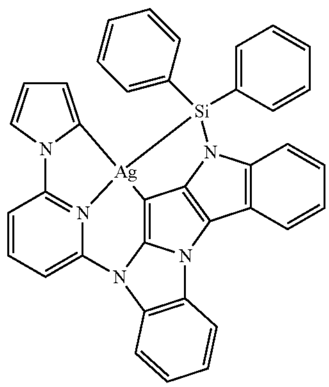
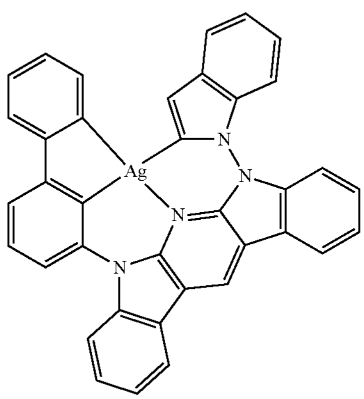
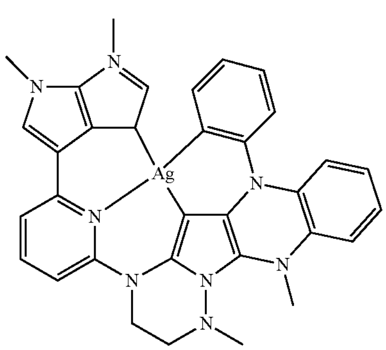
-continued
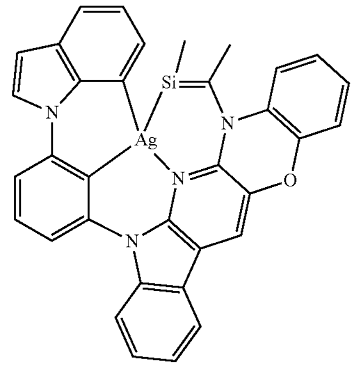
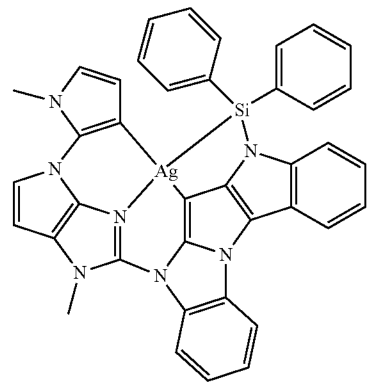
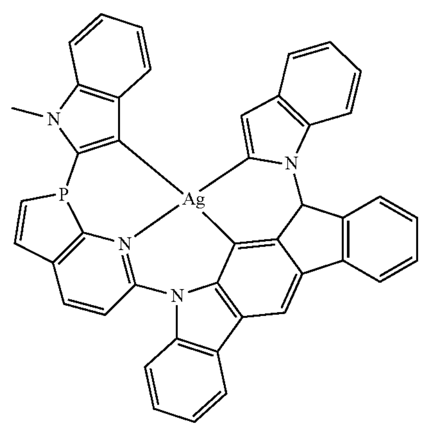
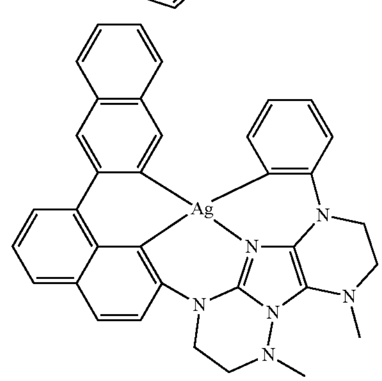

-continued
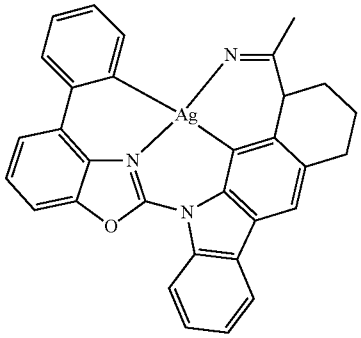
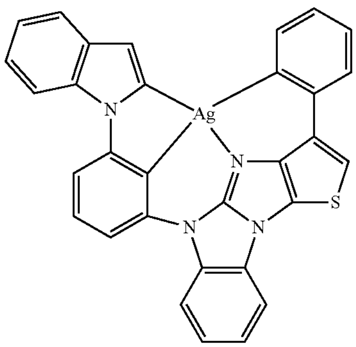
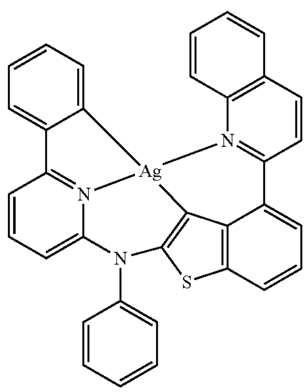
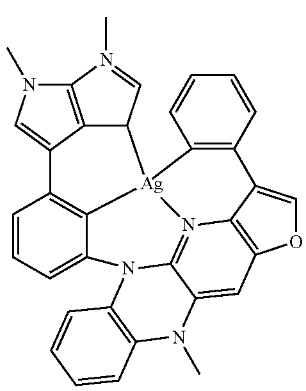
-continued
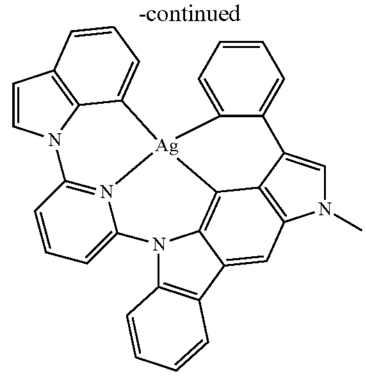
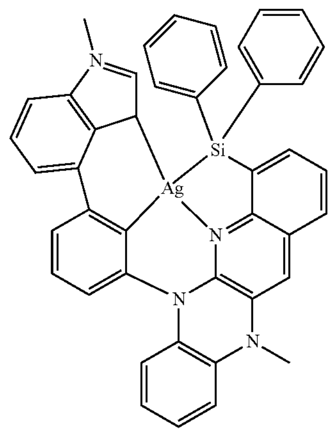
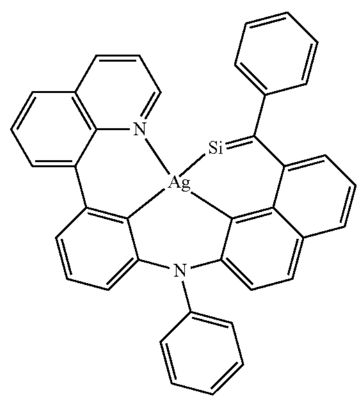
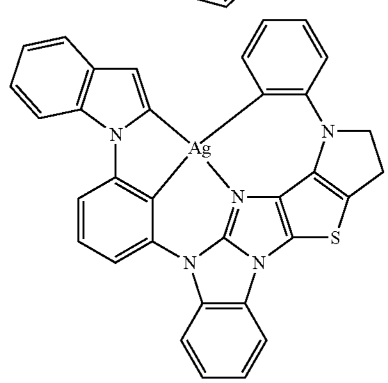

-continued
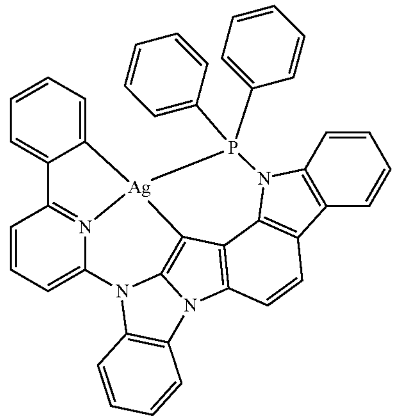
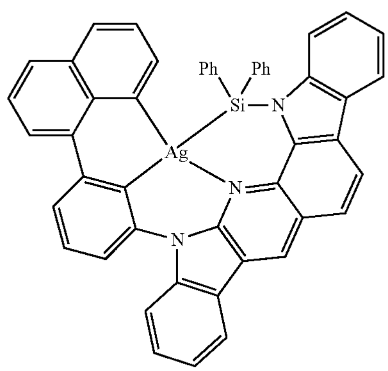
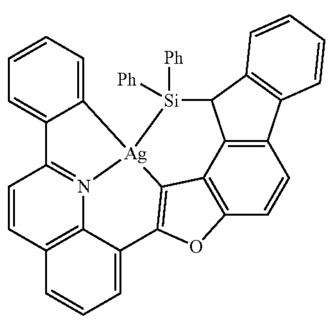
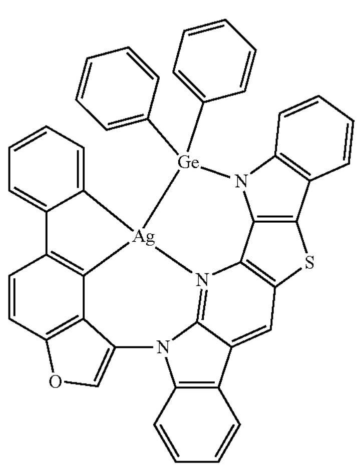
-continued
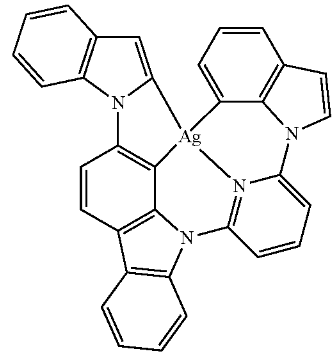
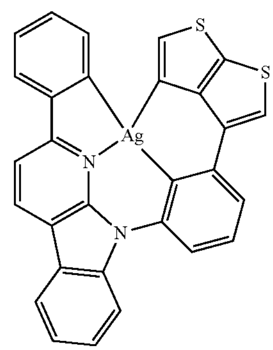
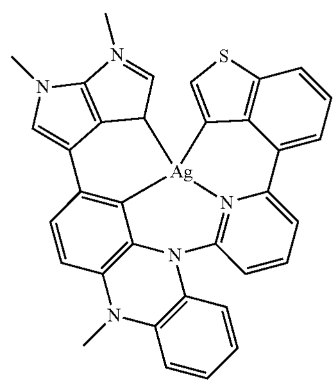
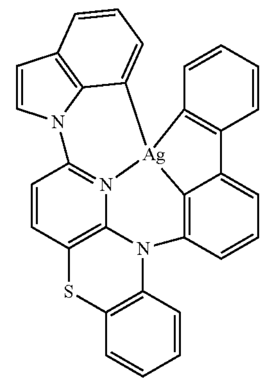

-continued
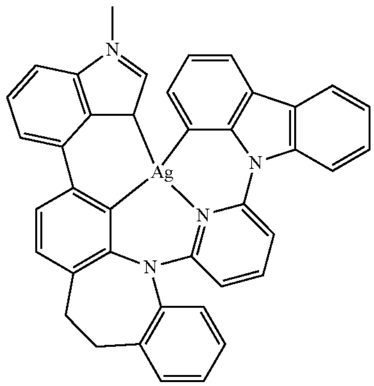
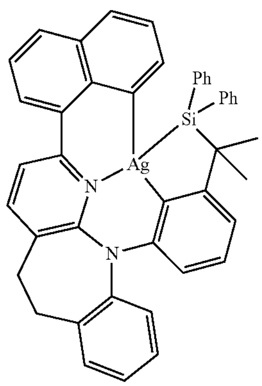
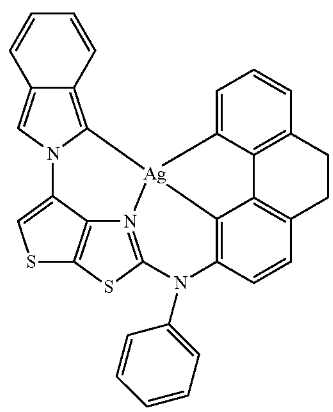
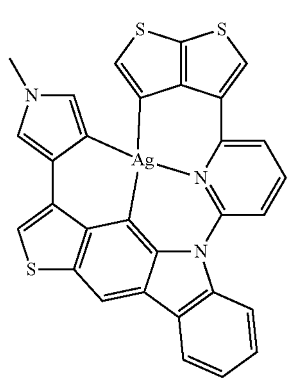
-continued
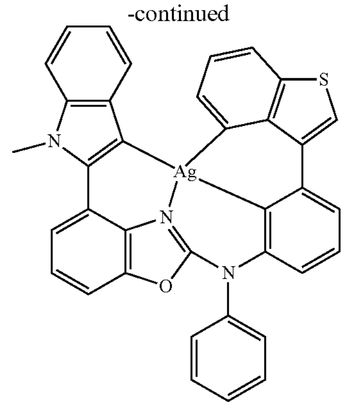
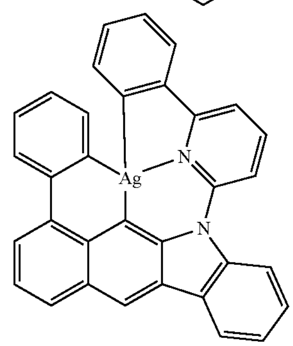
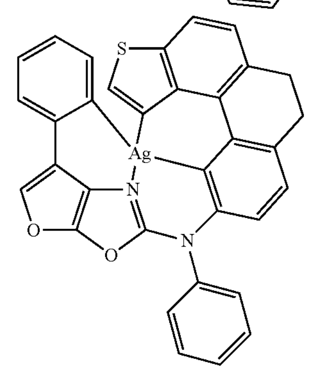
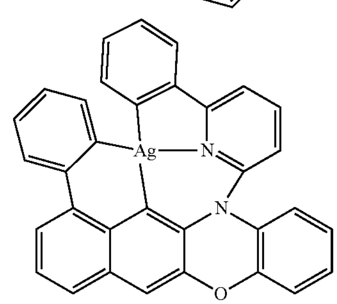
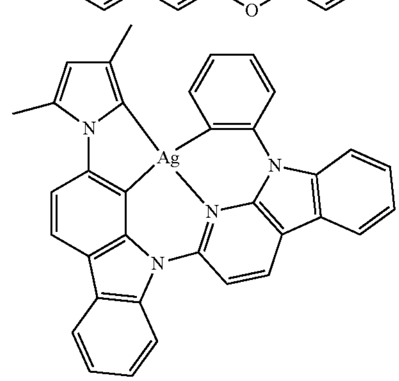

-continued
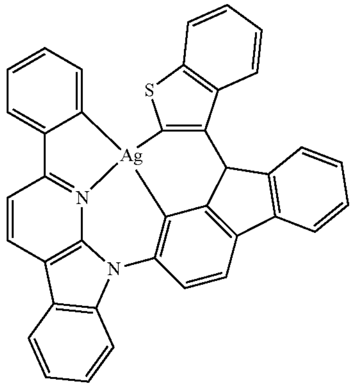
-continued
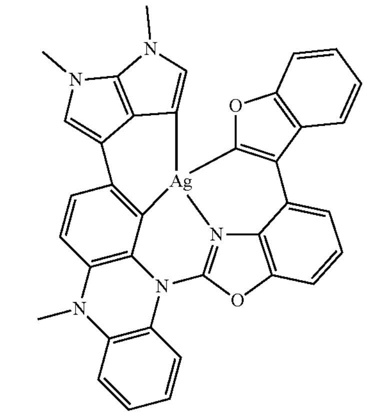
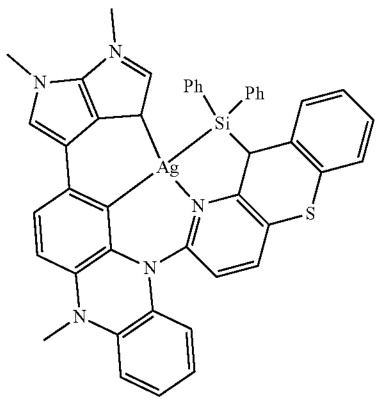
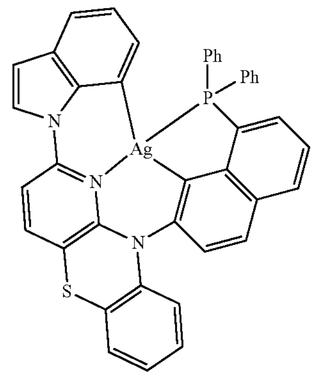
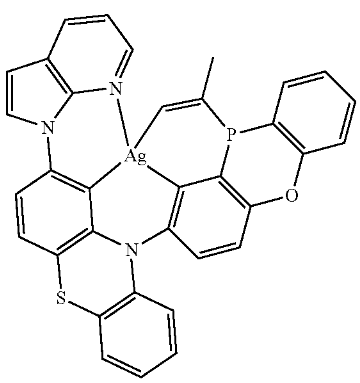
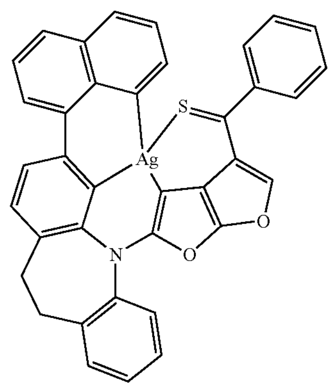
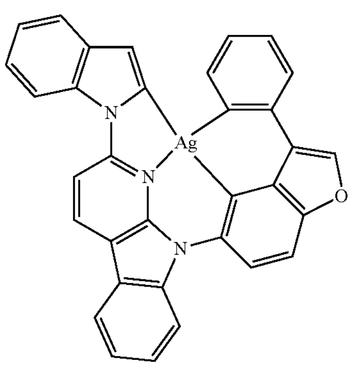
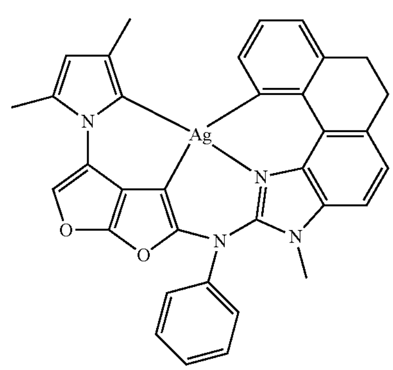

-continued
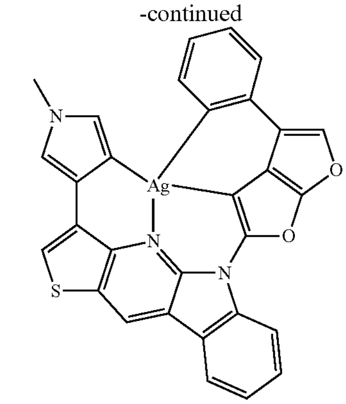
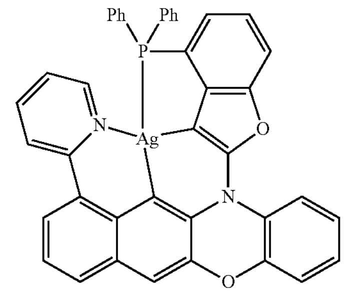
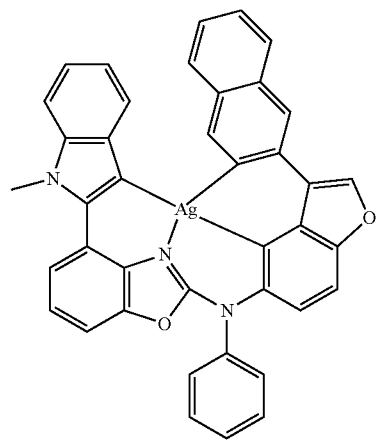
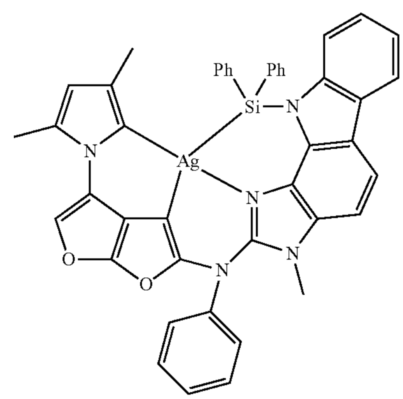
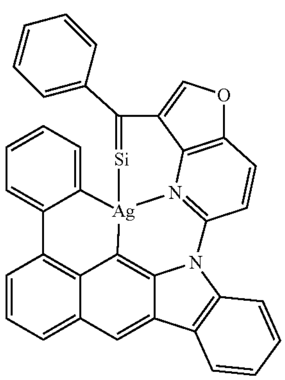
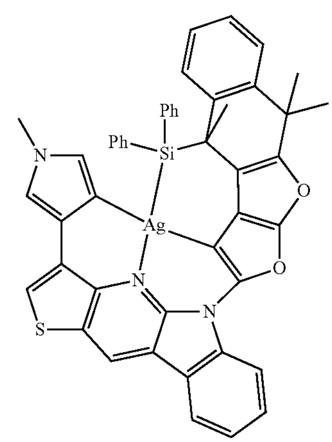
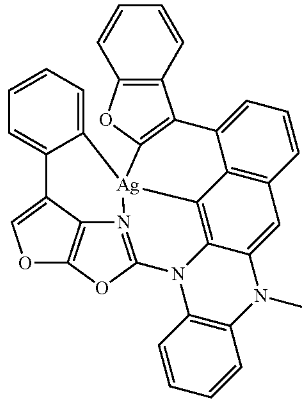
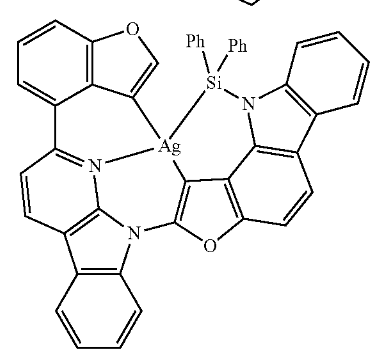

-continued
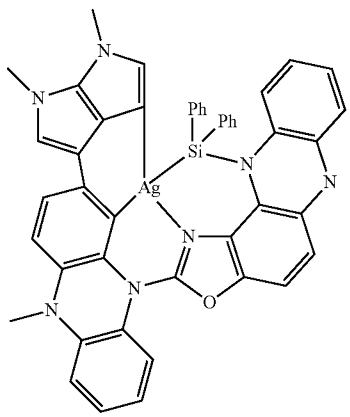
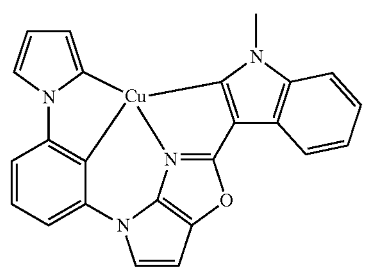
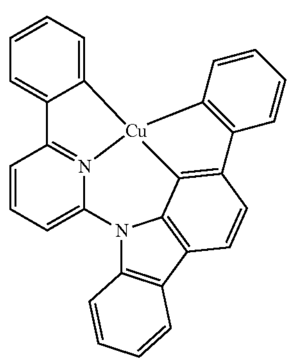
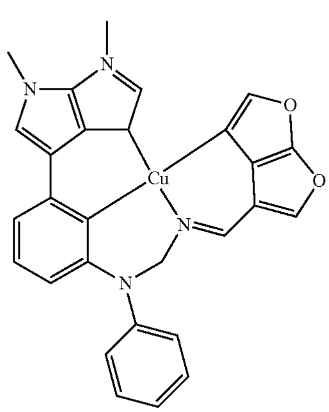
-continued
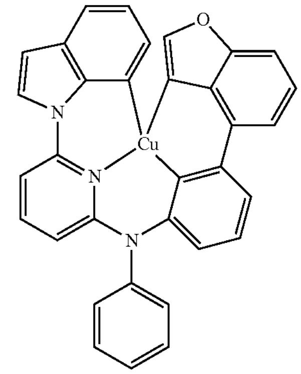
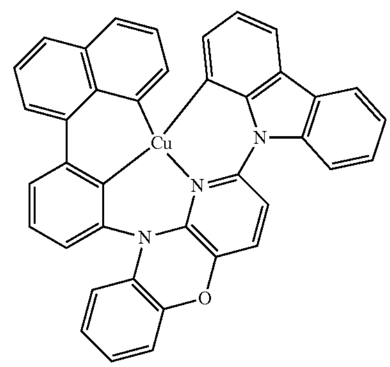
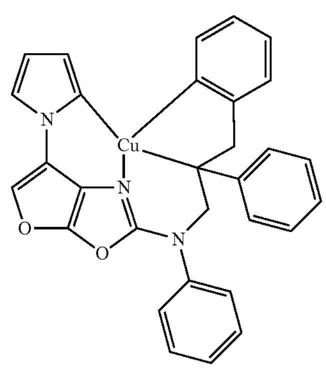
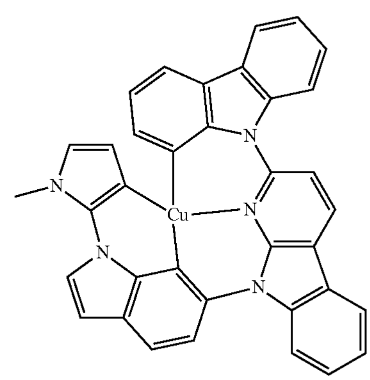

-continued
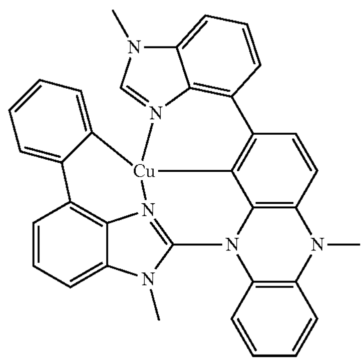
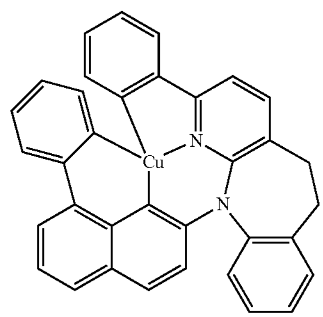
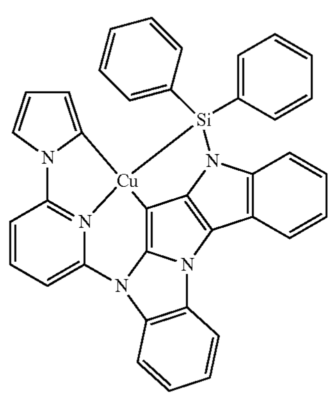
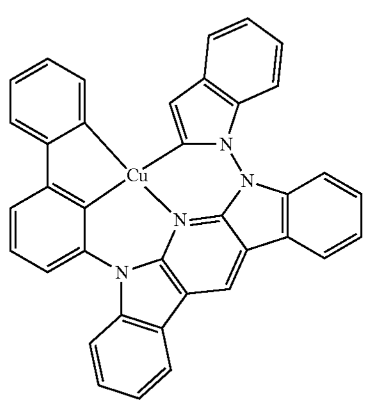
-continued
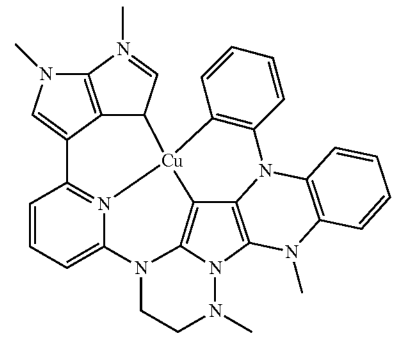
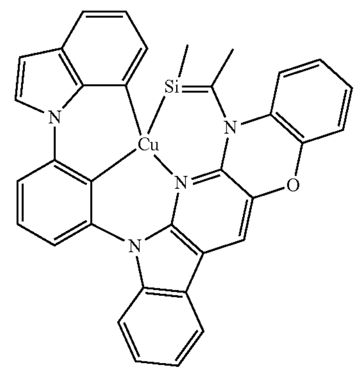
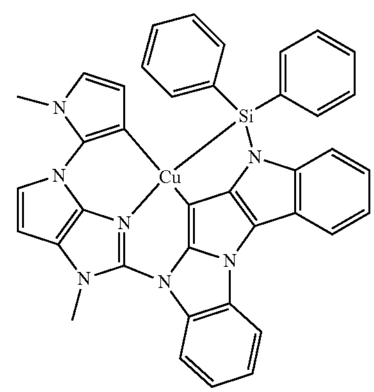
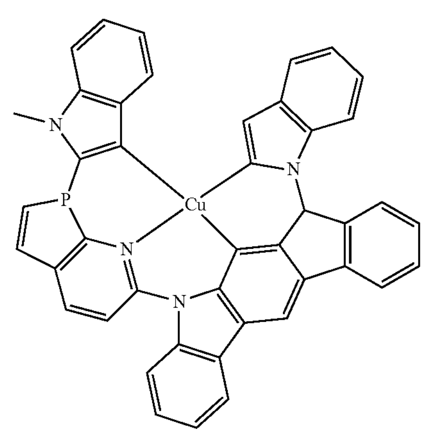

-continued
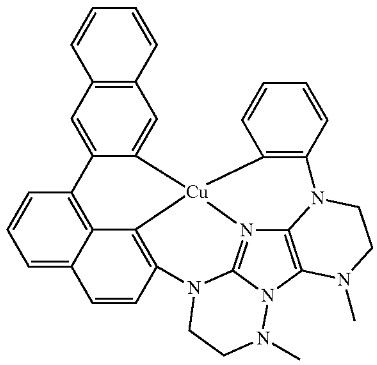
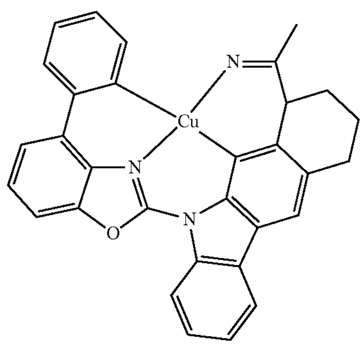
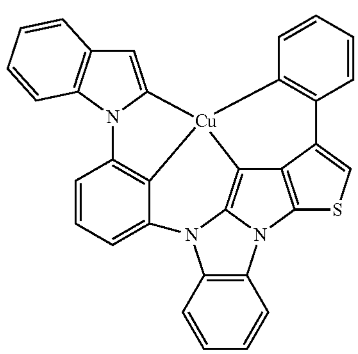
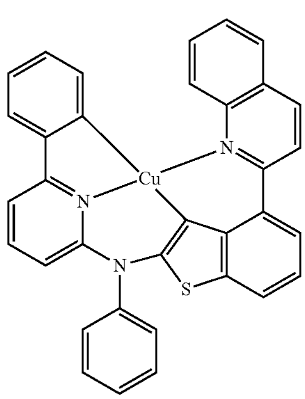
-continued
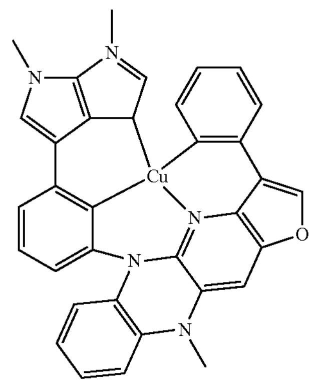
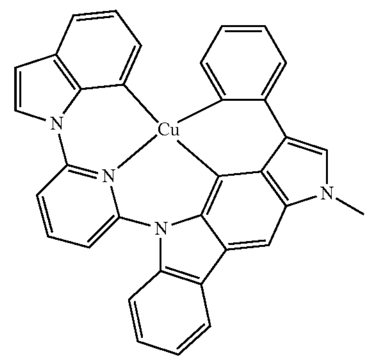
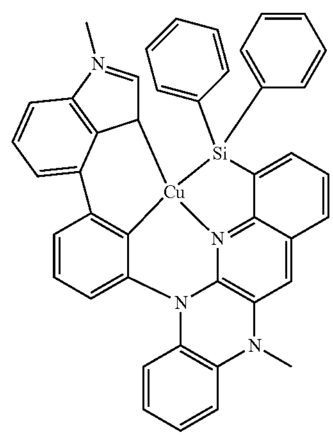
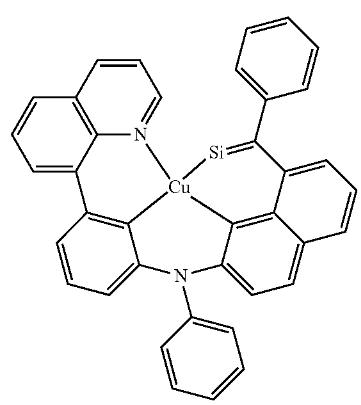

-continued
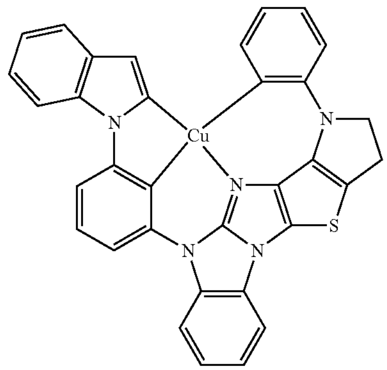
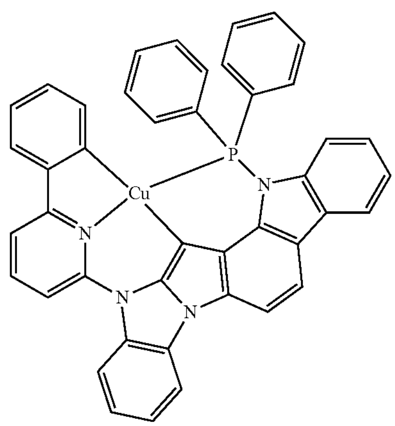
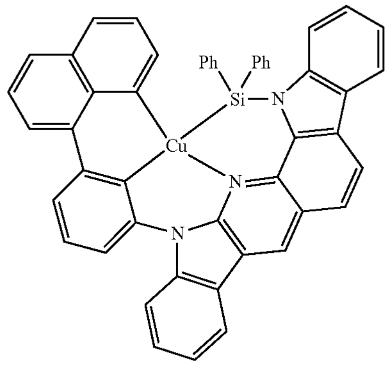
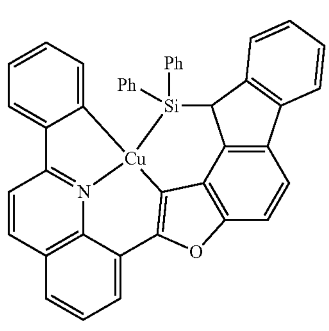
-continued
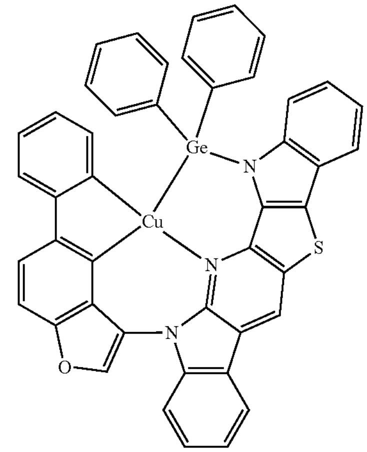
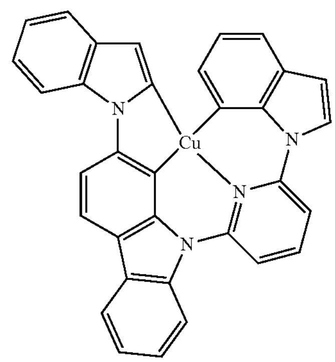
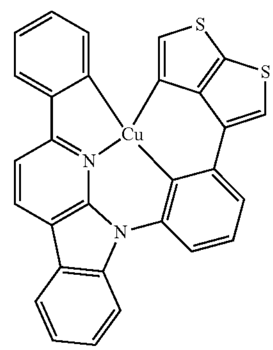
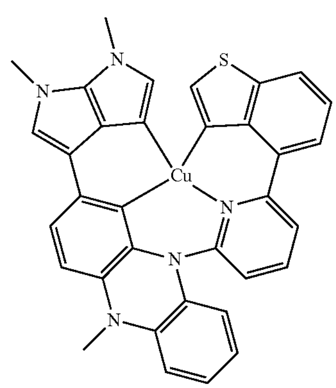

-continued
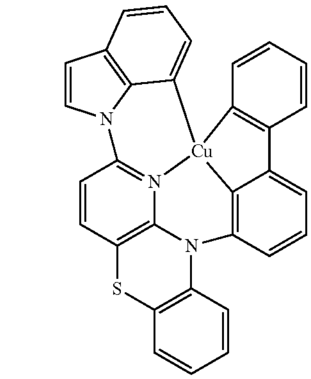
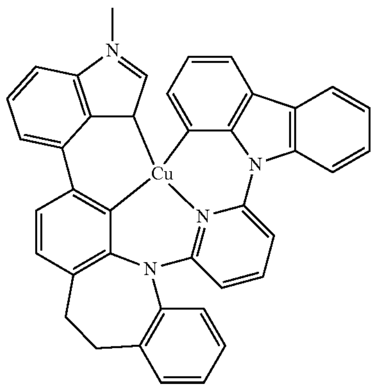
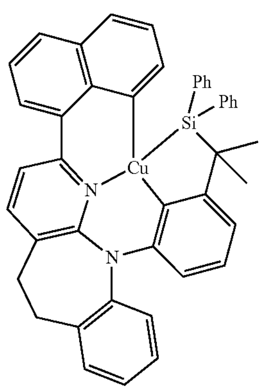
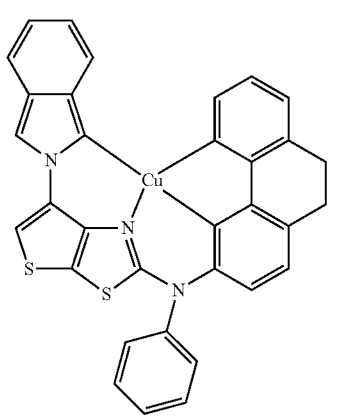
-continued
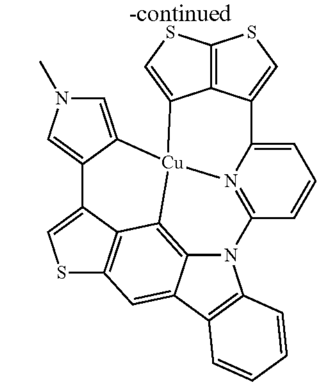
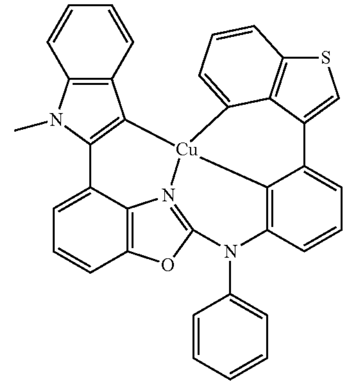
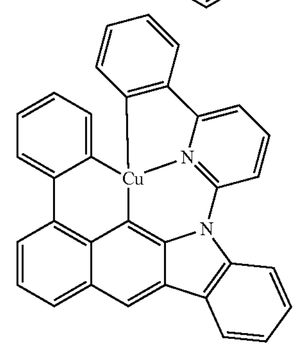
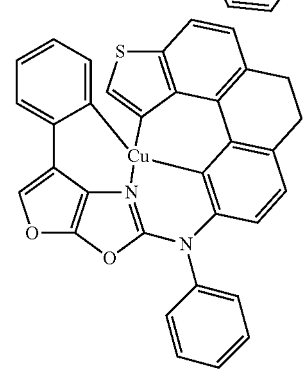
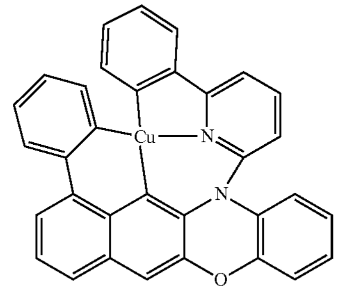

-continued
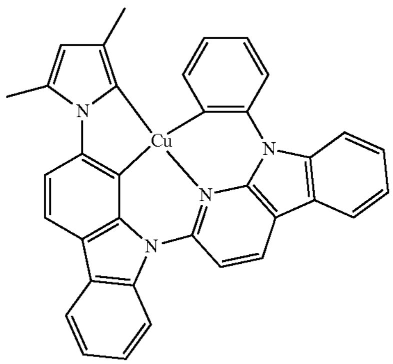
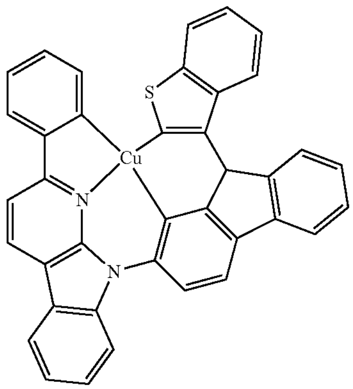
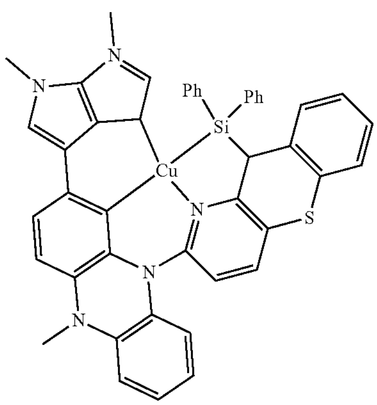
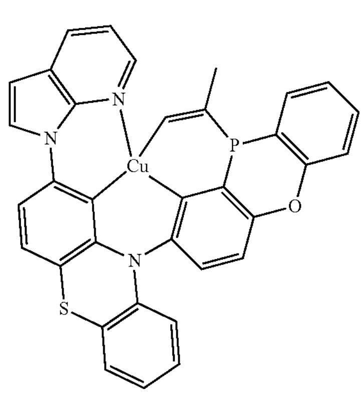
-continued
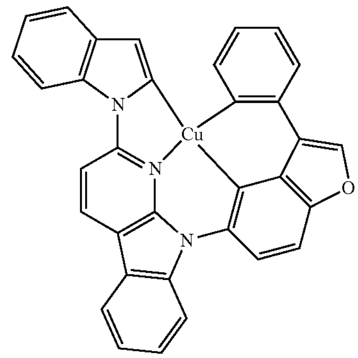
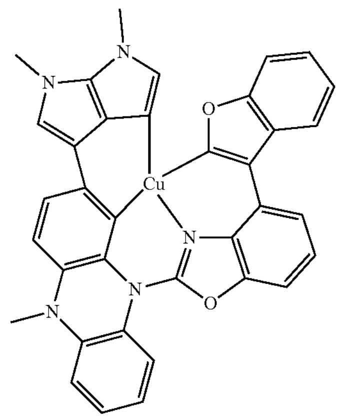
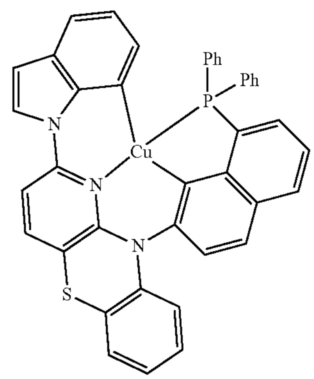
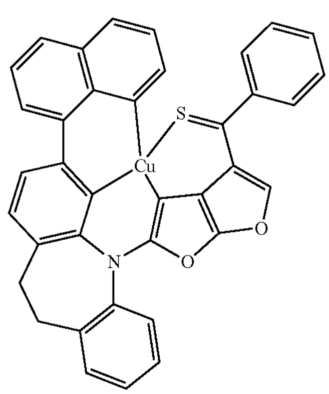

-continued
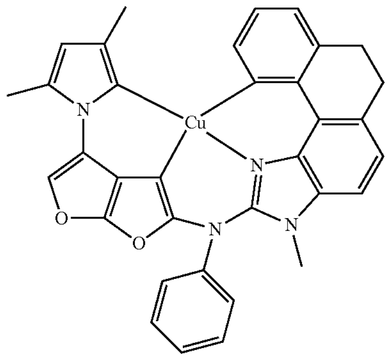
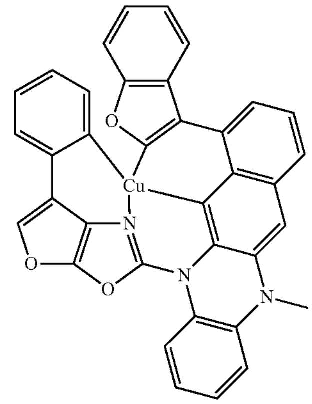
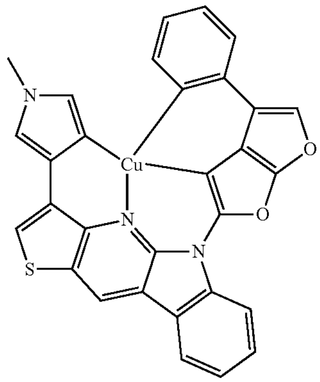
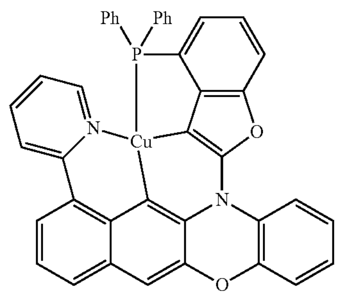
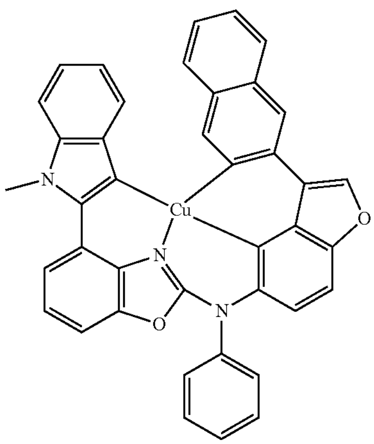
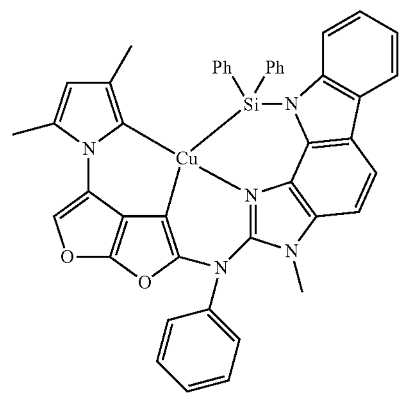
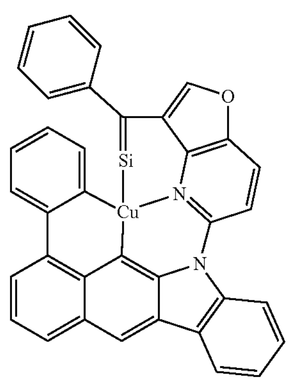
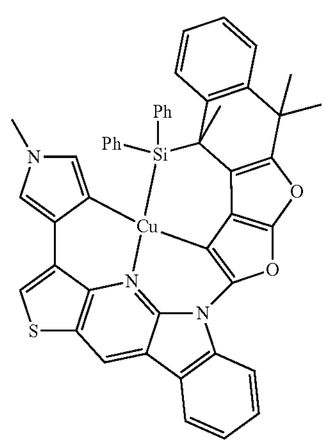

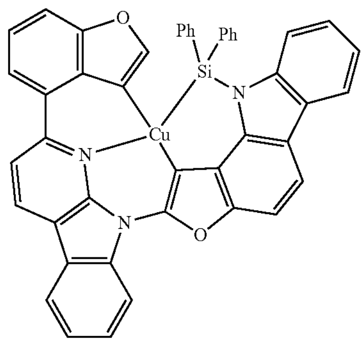
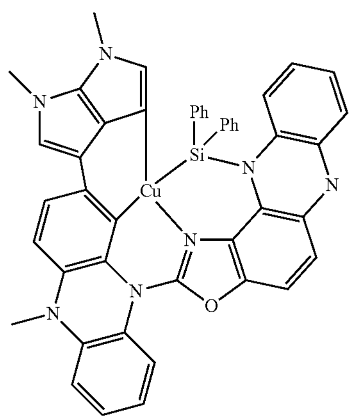
In one aspect, a complex disclosed herein can have the structure:
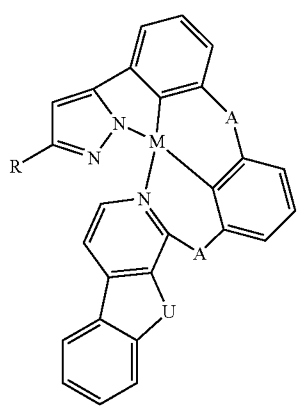
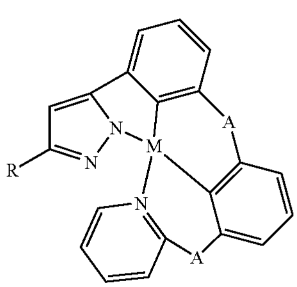
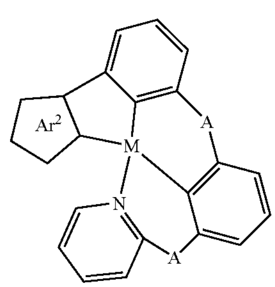
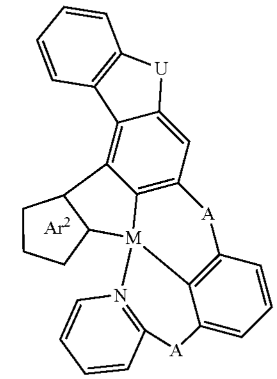
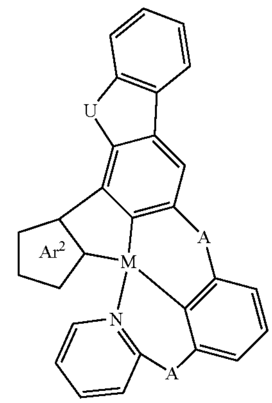
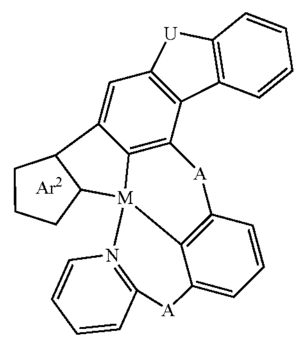
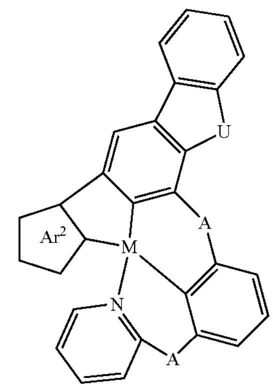
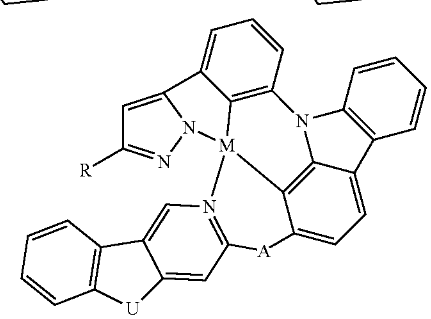
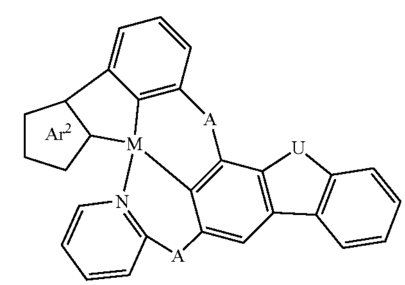
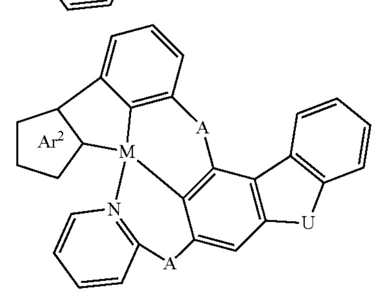

-continued
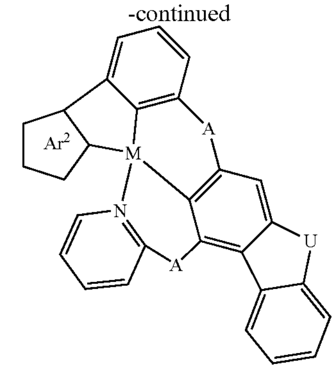
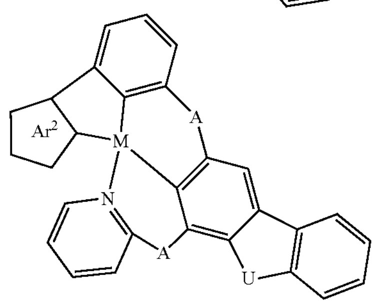
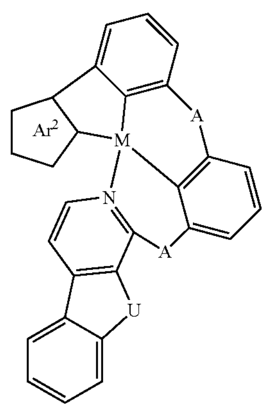
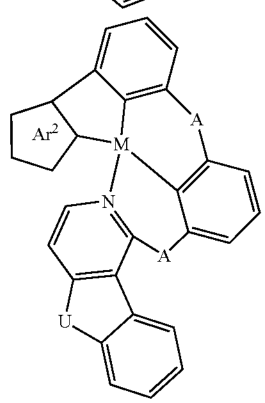
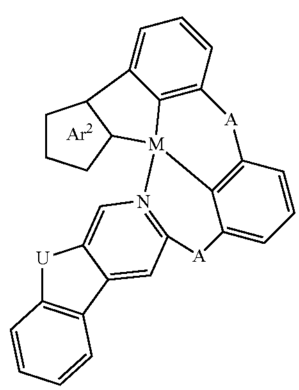
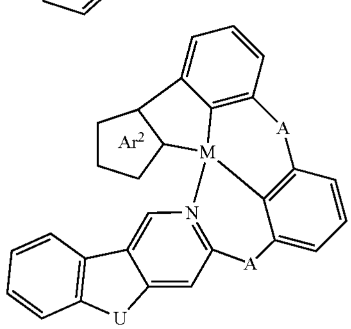
-continued
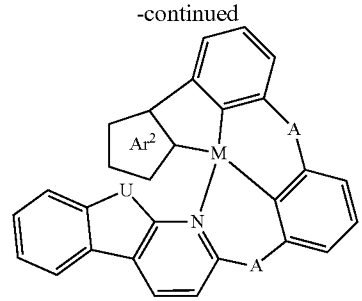
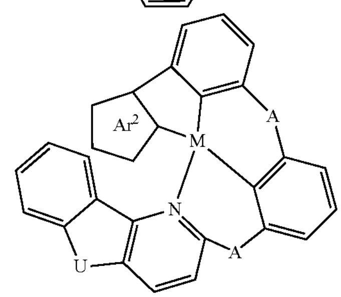
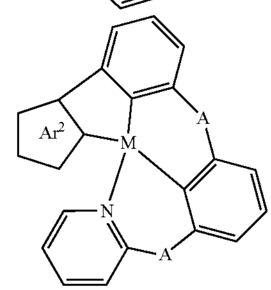
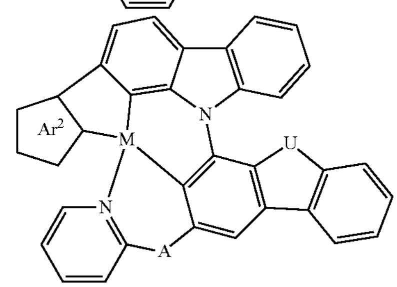
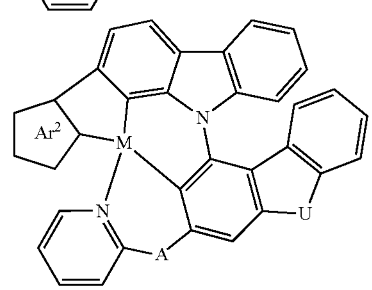
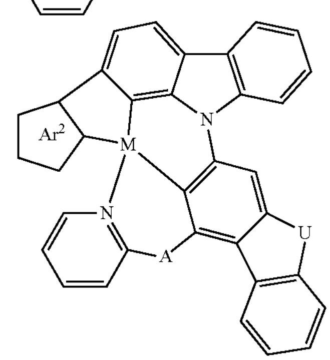

-continued
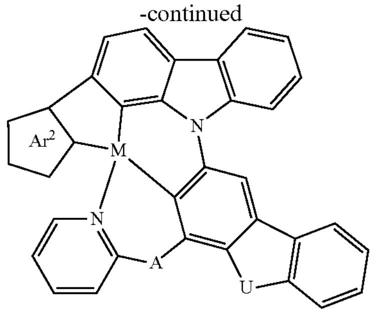
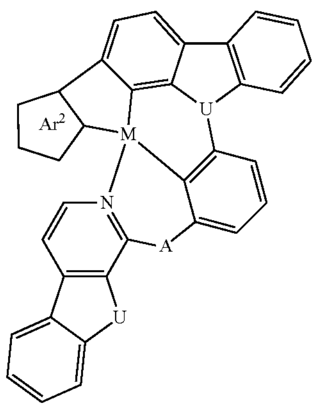
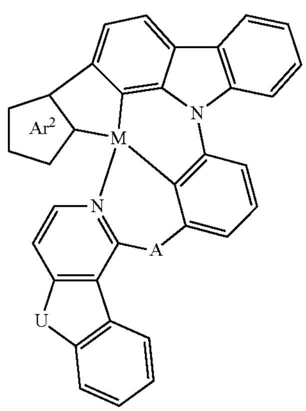
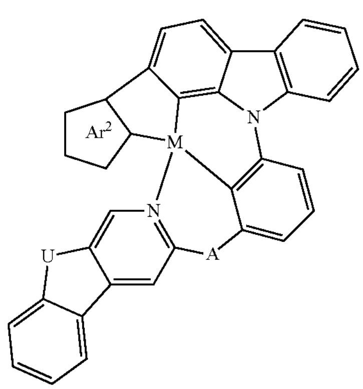
-continued
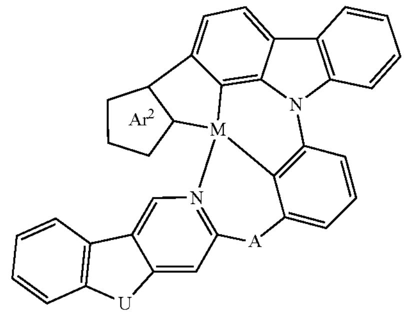
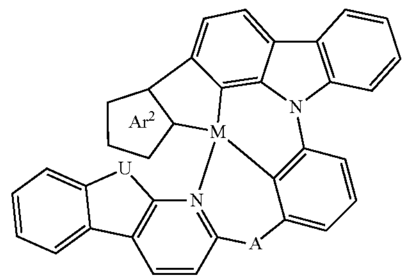
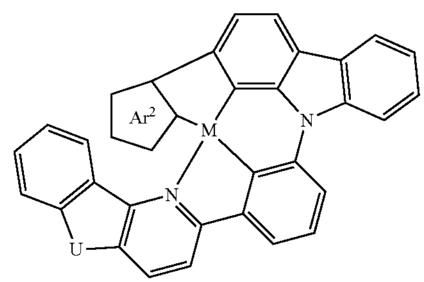
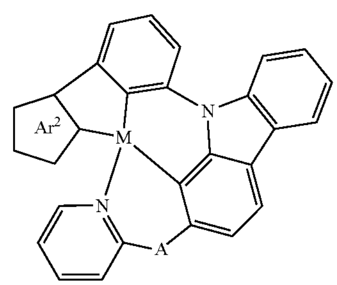
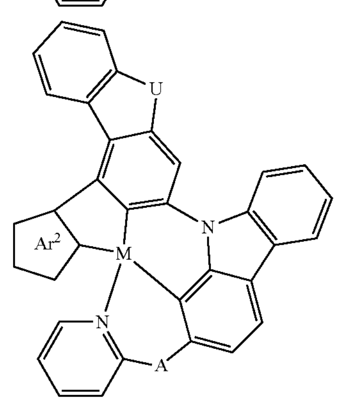

-continued
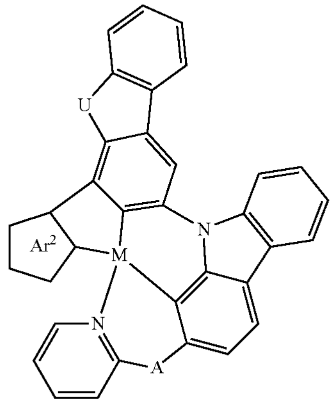
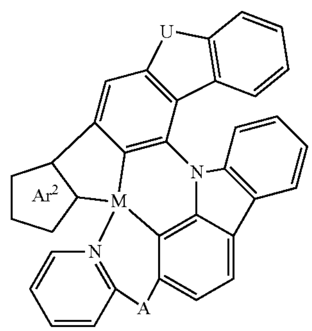
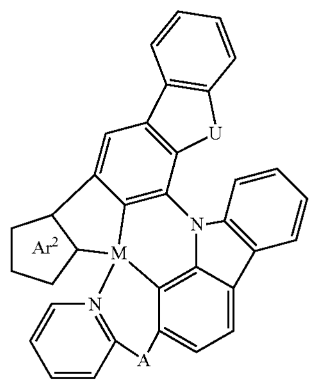
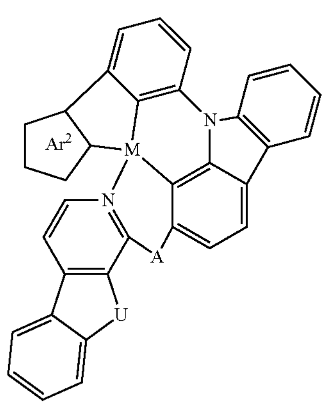
-continued
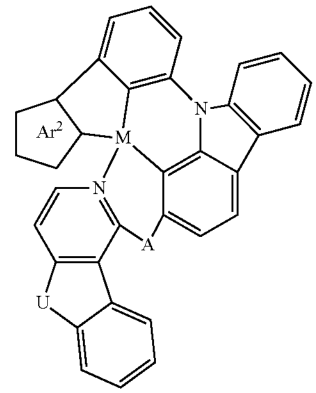
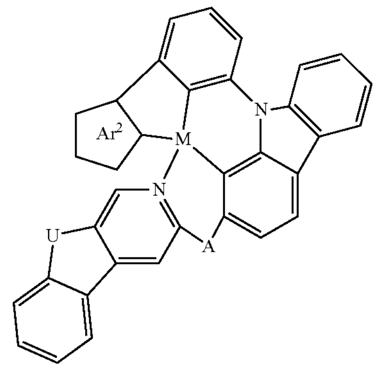
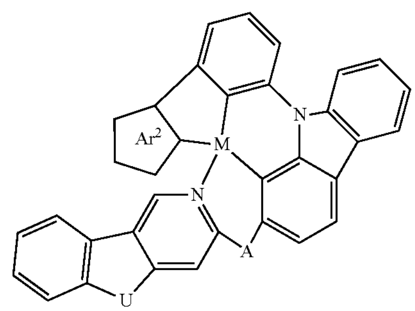
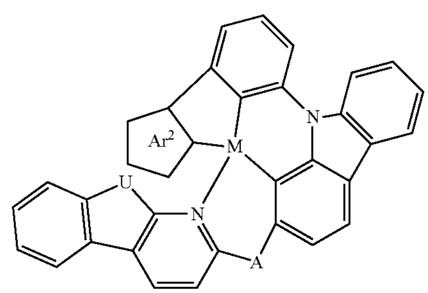
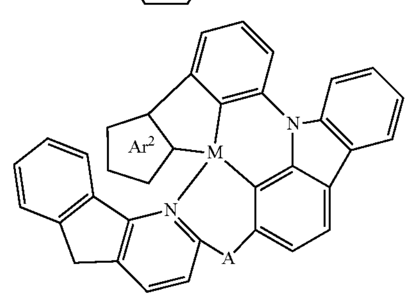

-continued
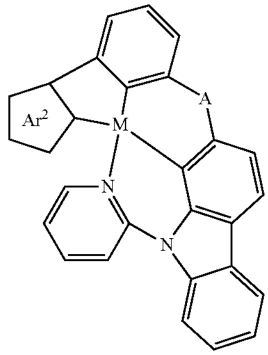
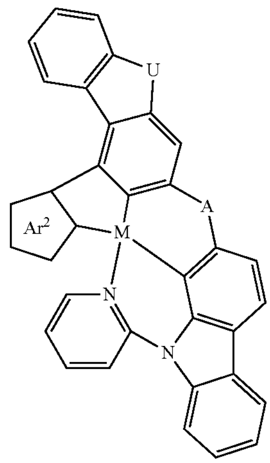
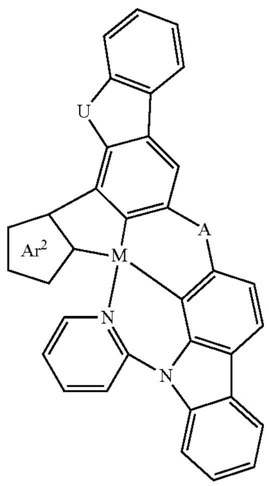
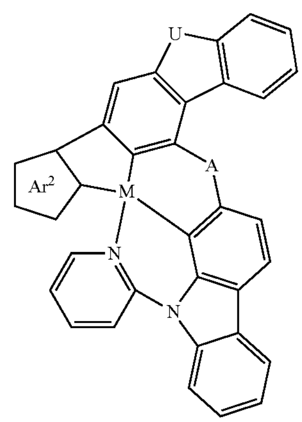
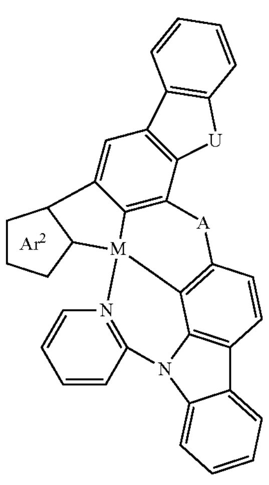
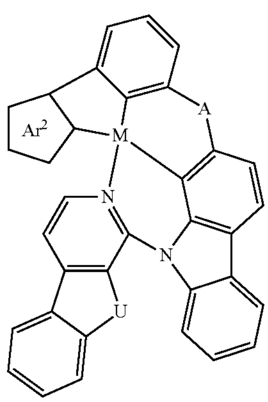
-continued
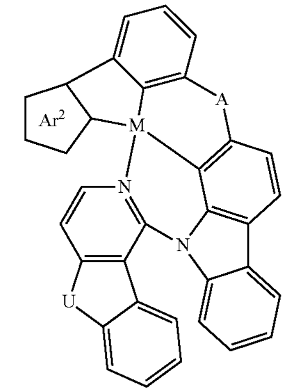
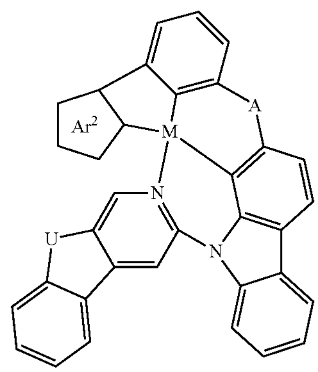
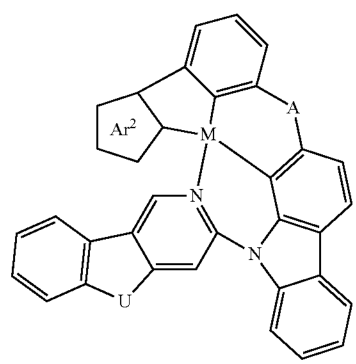
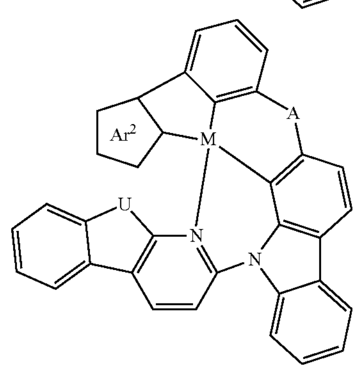

-continued
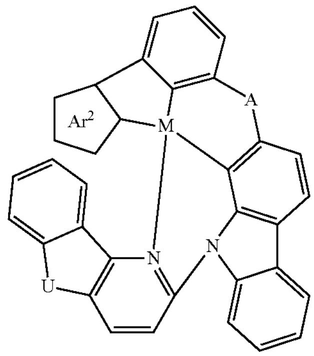
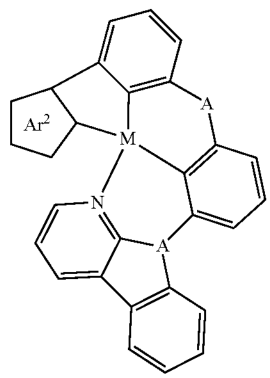
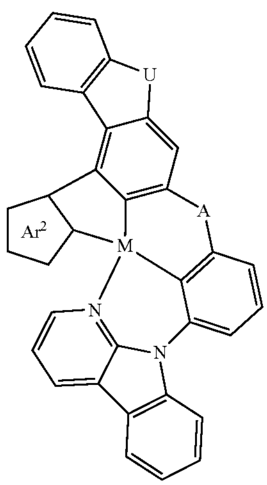
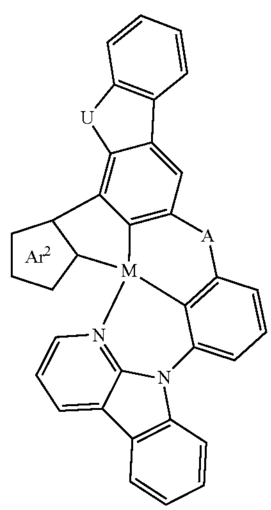
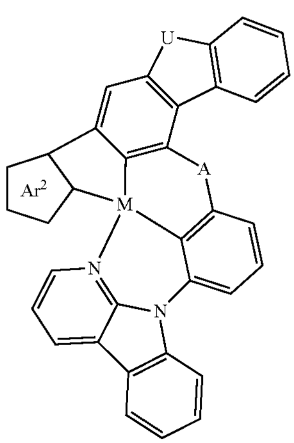
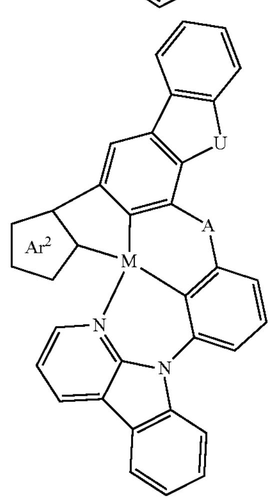
-continued
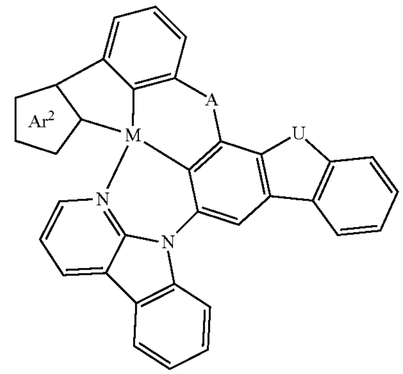
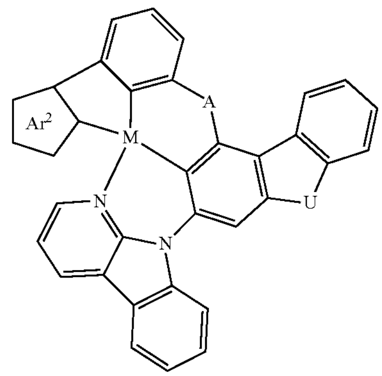
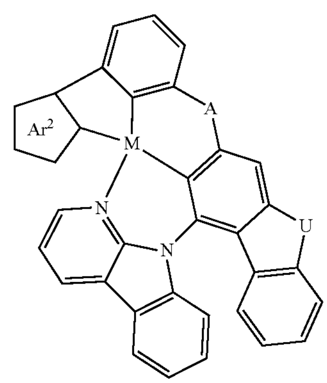
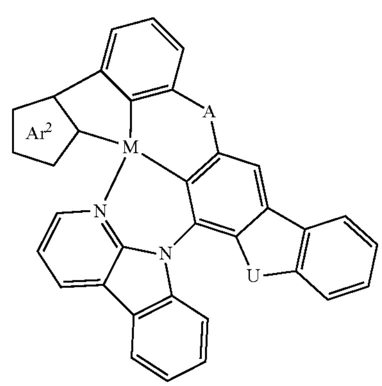

-continued
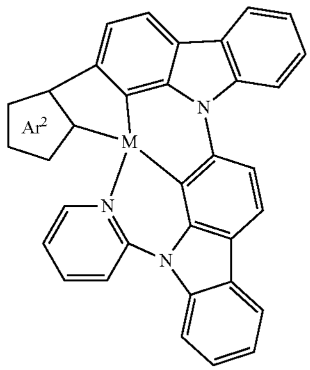
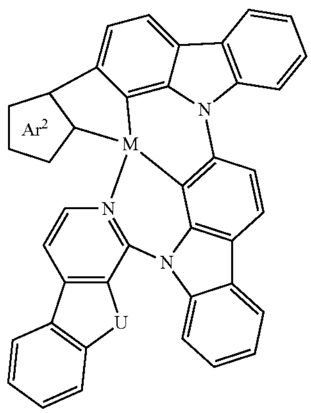
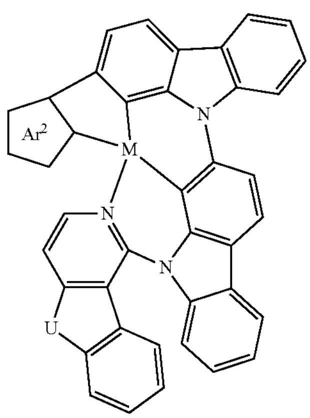
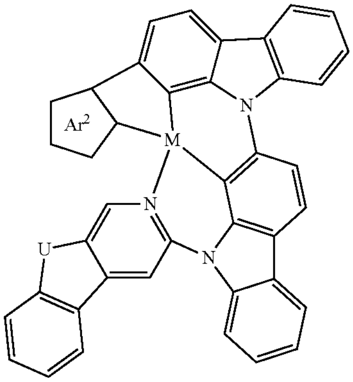
-continued
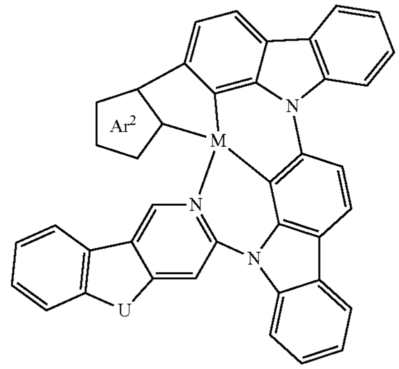
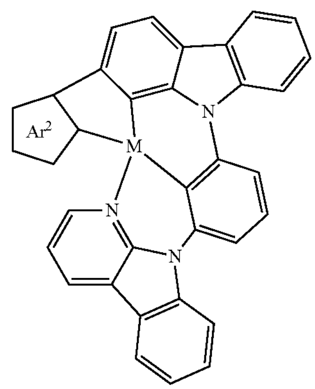
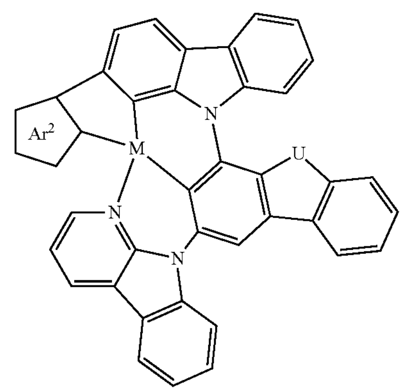
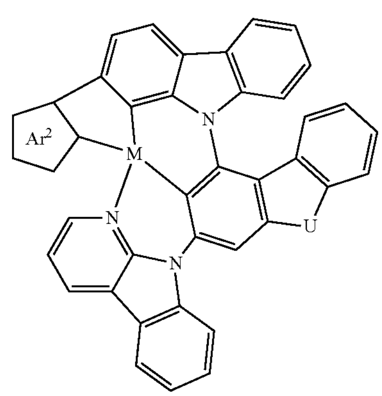

-continued
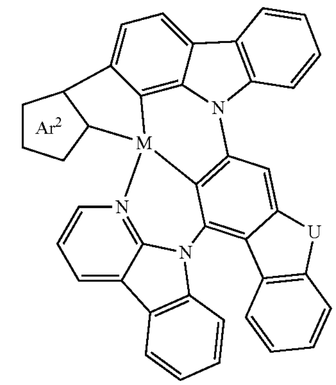
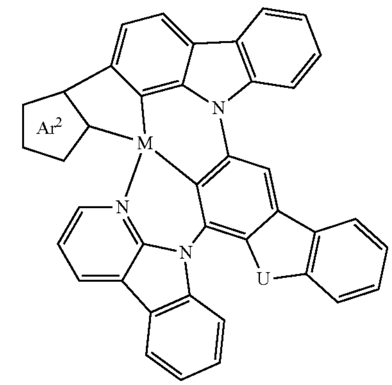
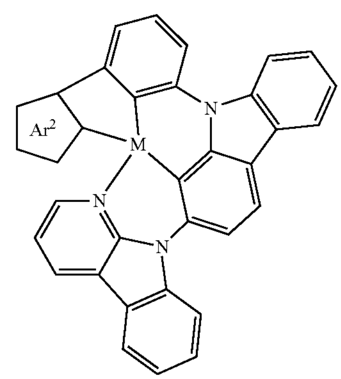
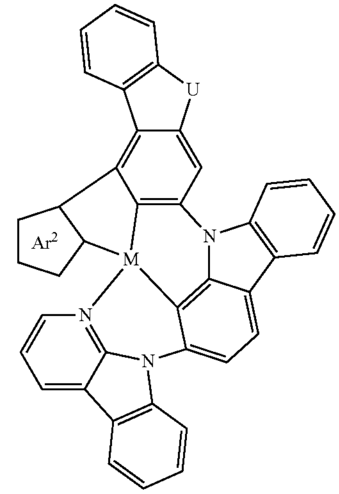
-continued
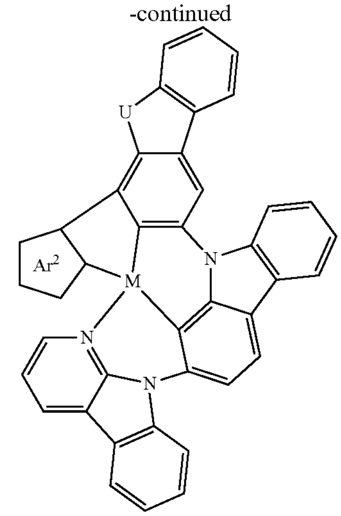
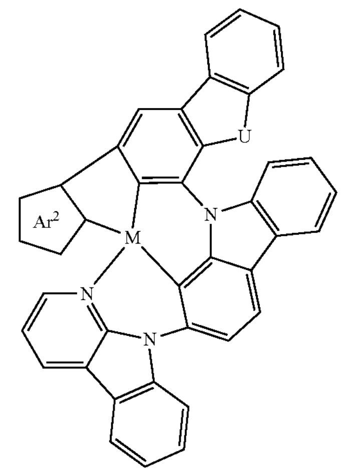
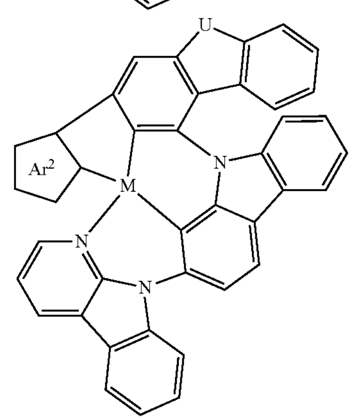
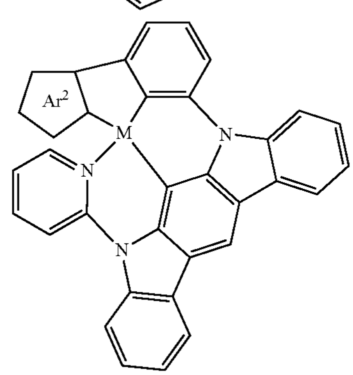

-continued
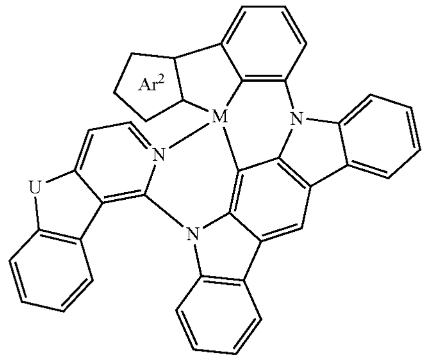
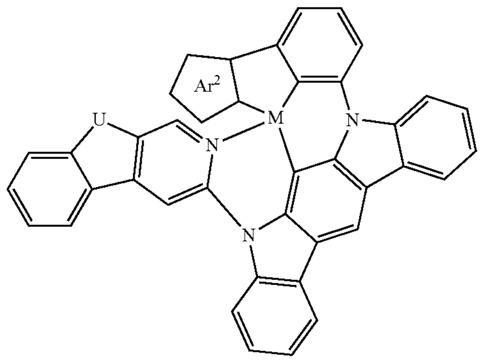
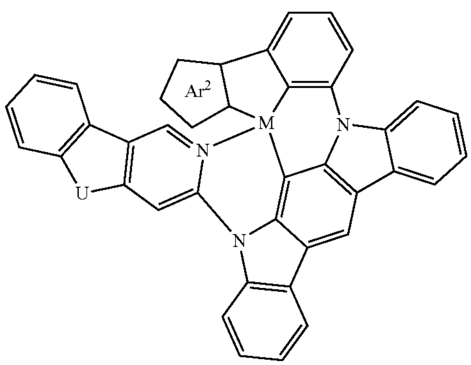
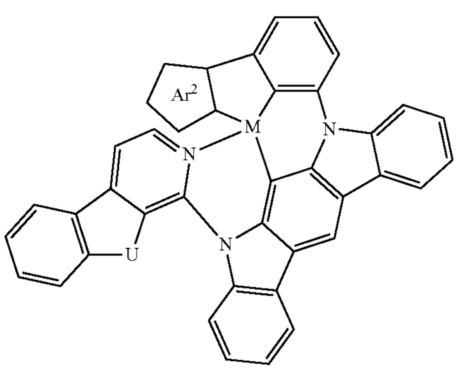
-continued
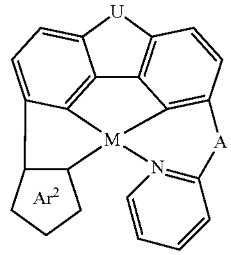
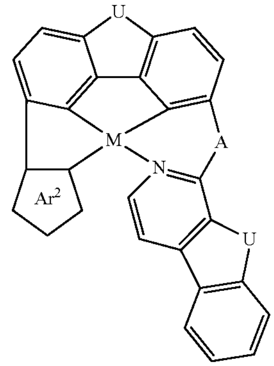
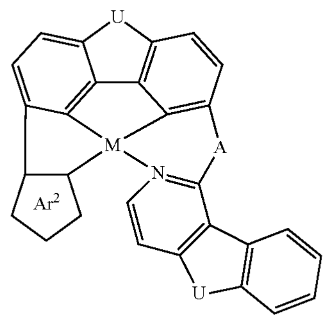
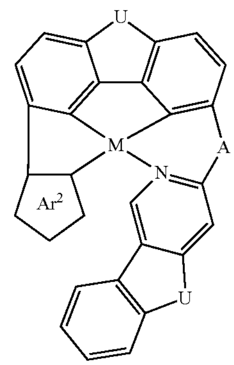
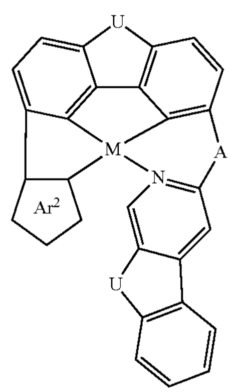
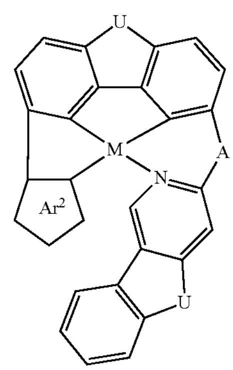
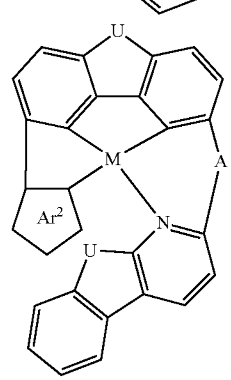
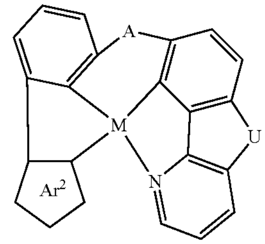

-continued
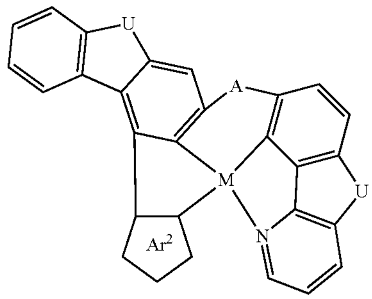
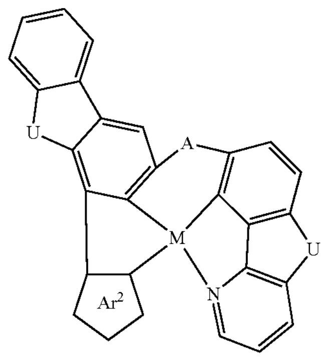
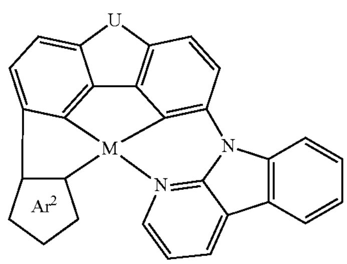
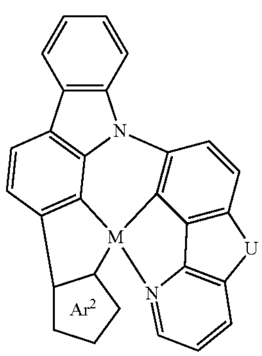
wherein each A independently is O, S, NR, PR, AsR, $CR_2$, $SiR_2$, or BR,
wherein each U independently is O S, NR, PR, AsR, $CR_2$, $SiR_2$, or BR,
wherein M is Pt or Pd, and
Wherein
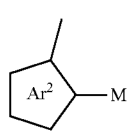
is any one of
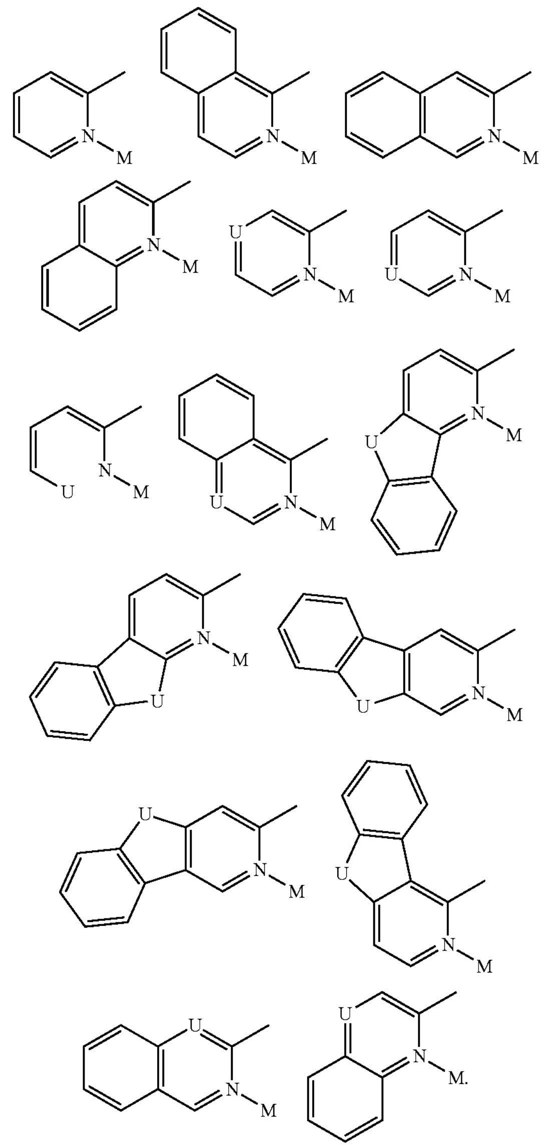
In one aspect, a disclosed complex can have the structure:
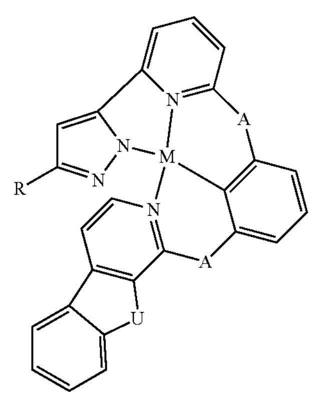

-continued
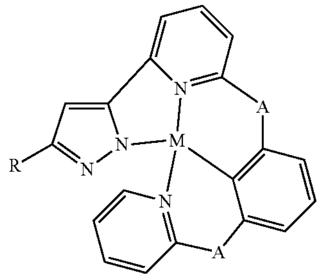
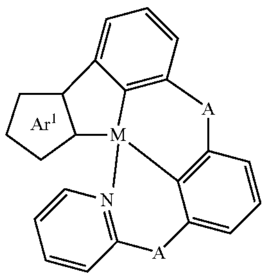
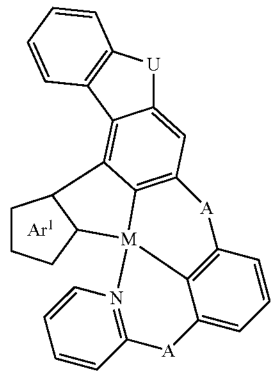
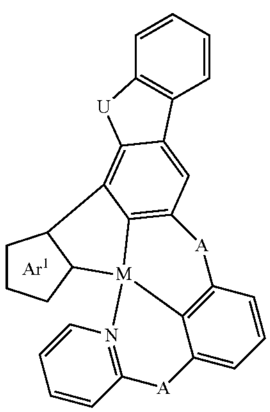
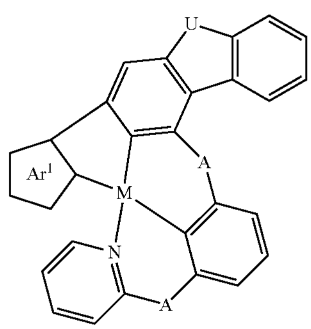
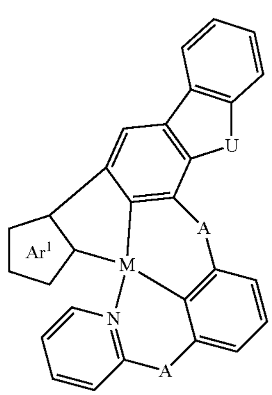
-continued
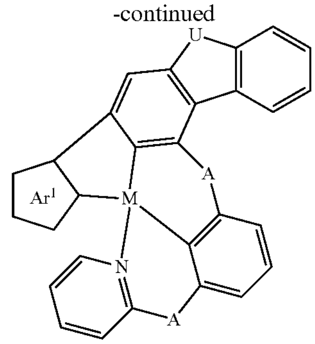
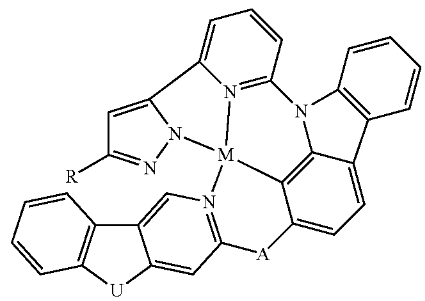
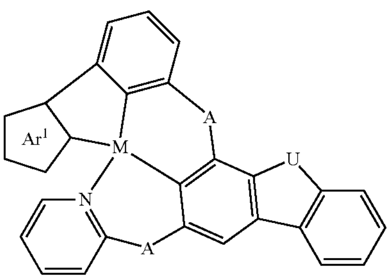
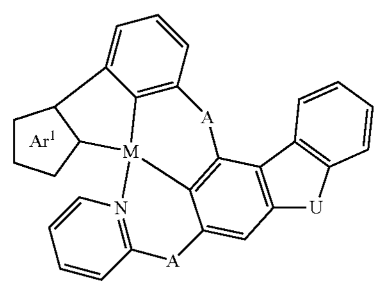
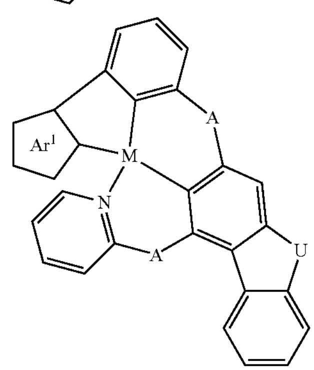

-continued
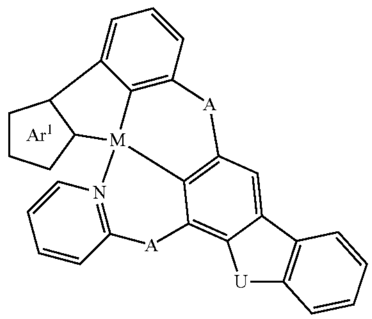
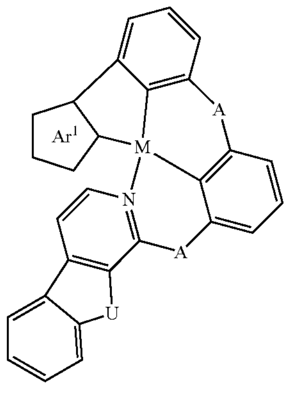
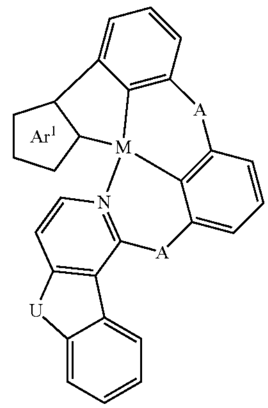
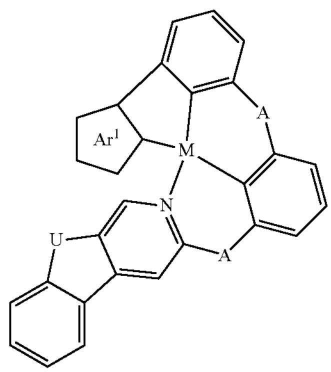
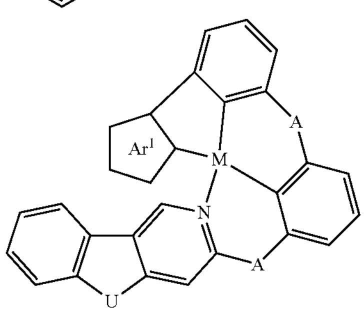
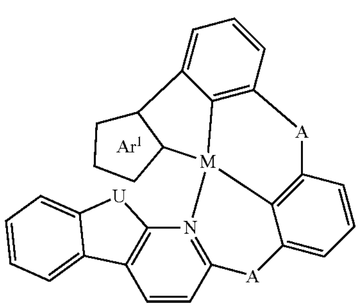
-continued
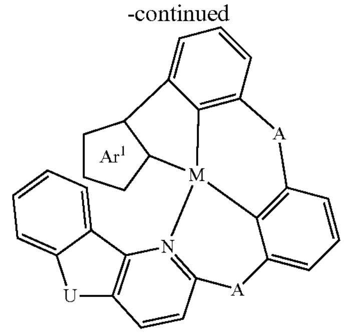
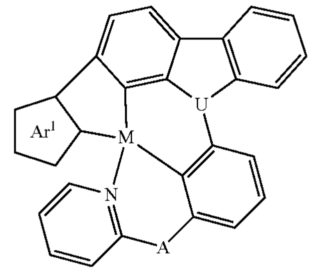
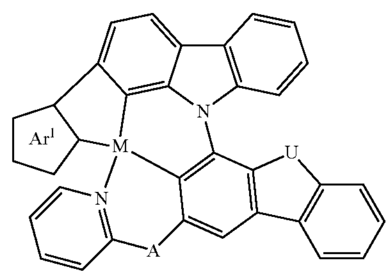
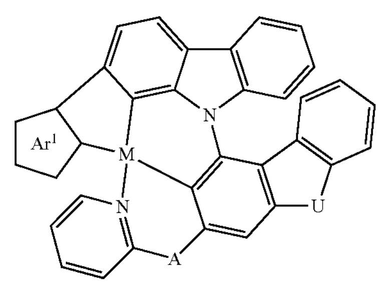
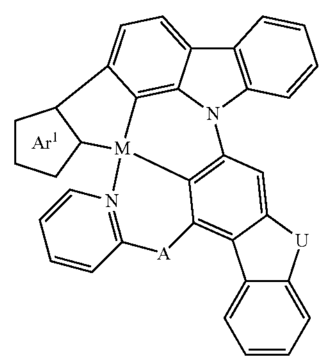

-continued
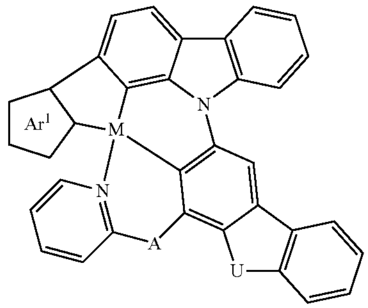
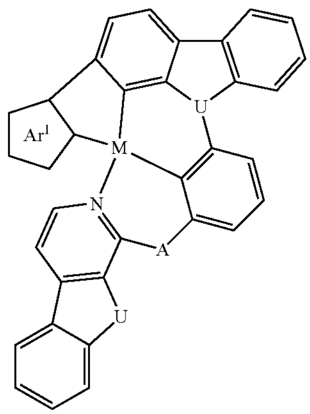
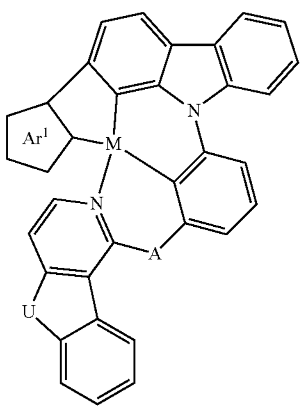
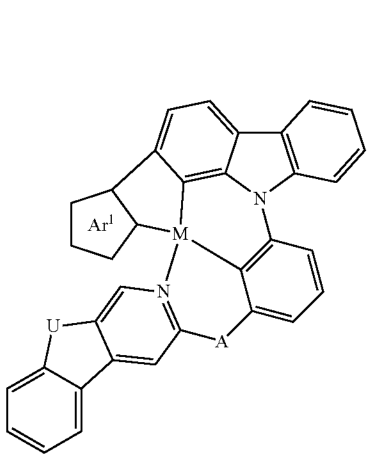
-continued
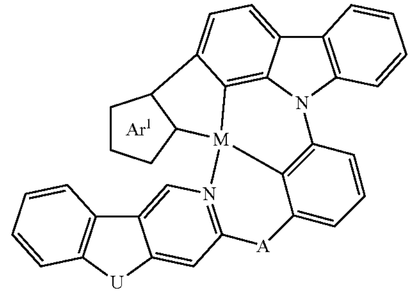
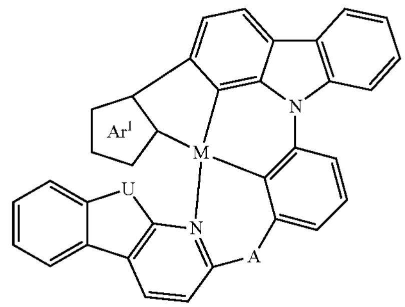
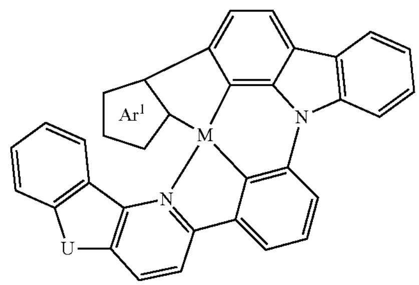
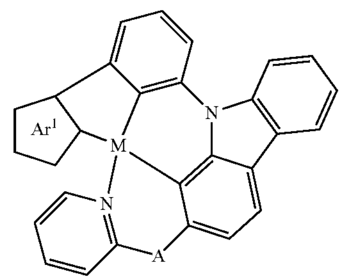
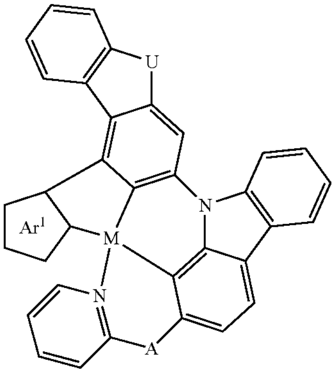

-continued
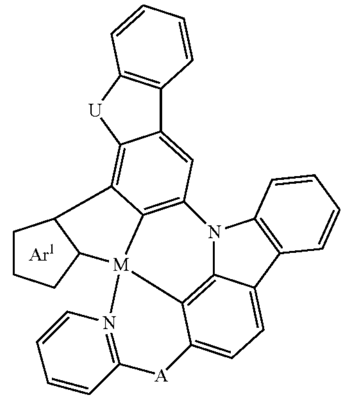
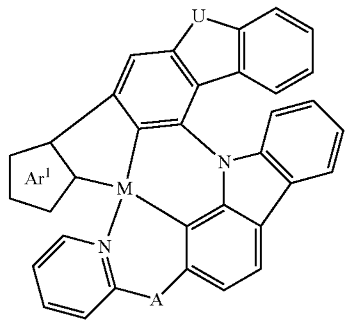
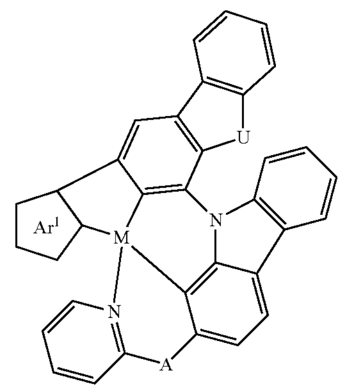
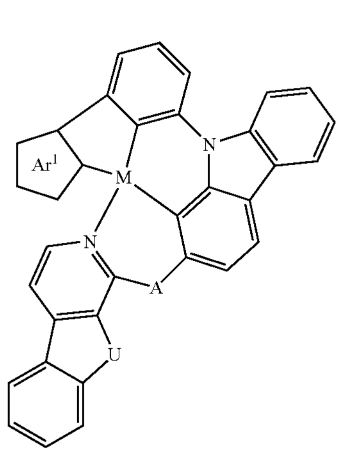
-continued
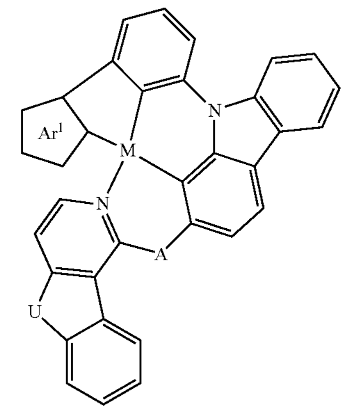
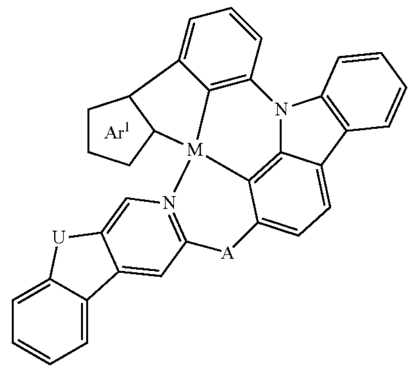
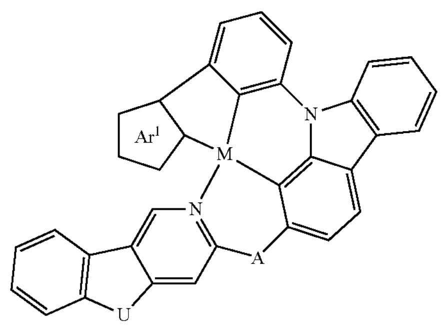
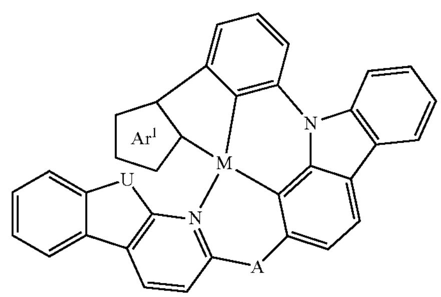
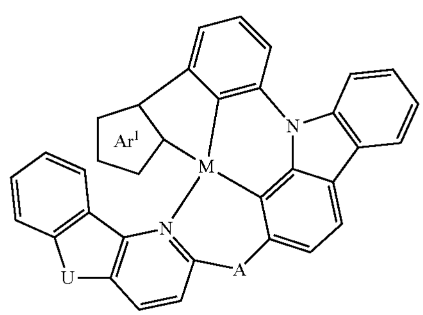

-continued
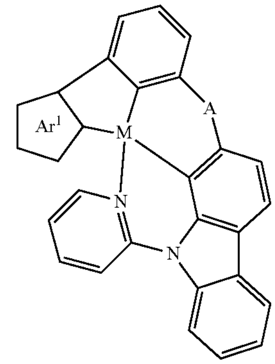
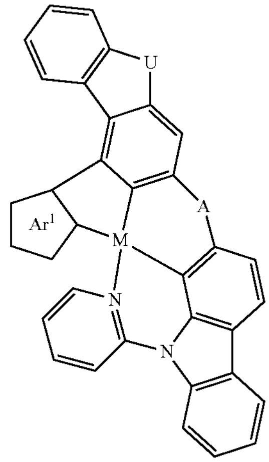
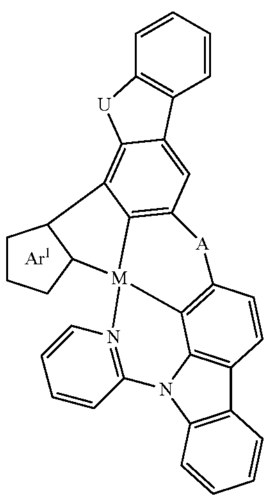
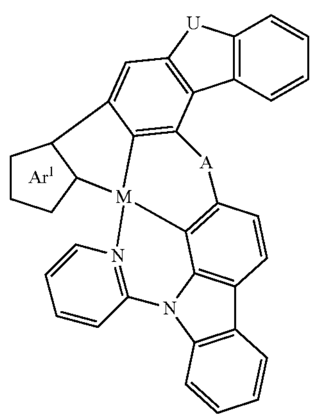
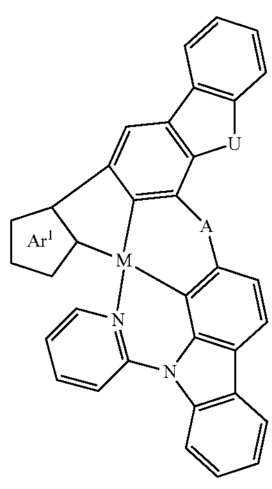
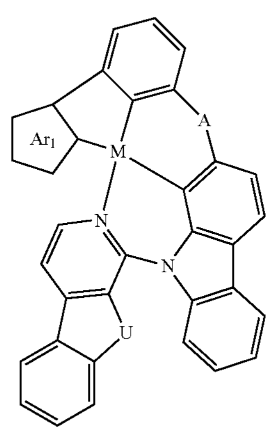
-continued
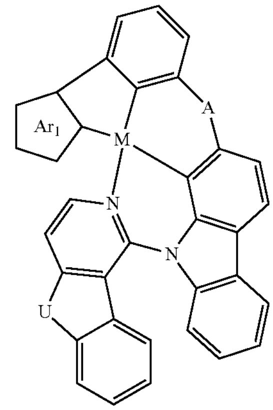
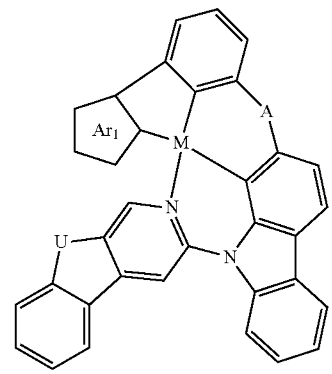
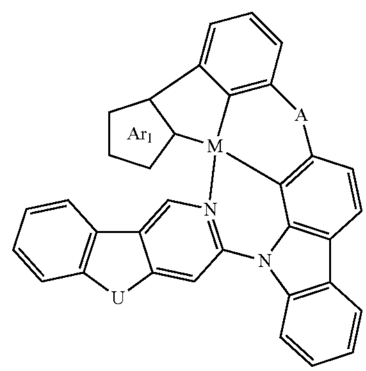
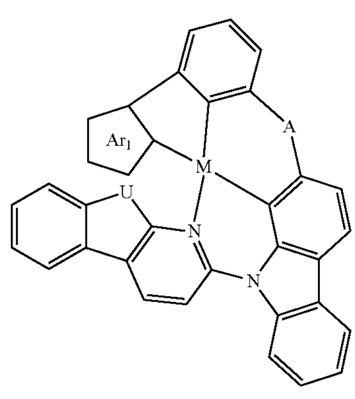

-continued
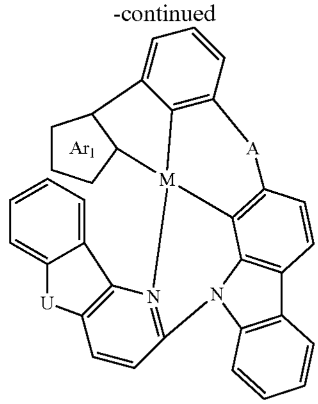
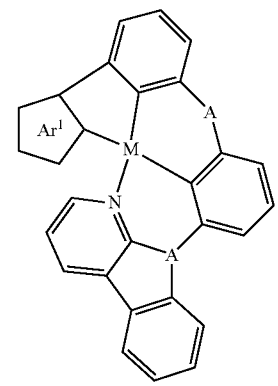
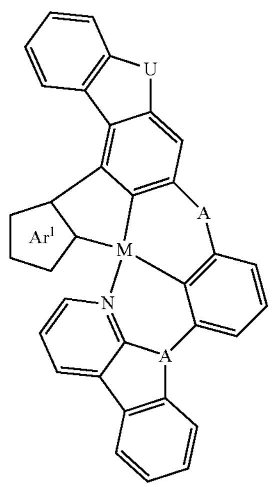
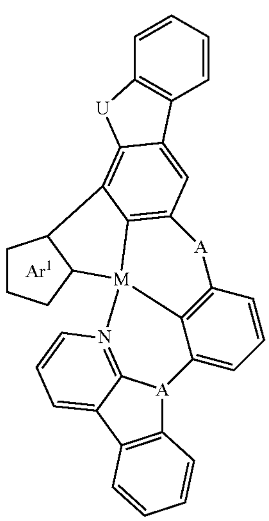
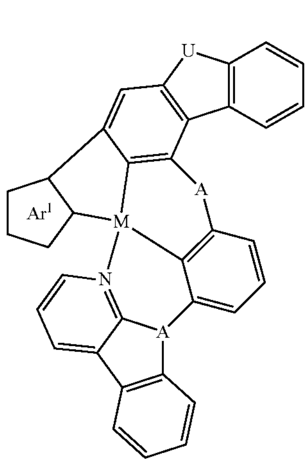
-continued
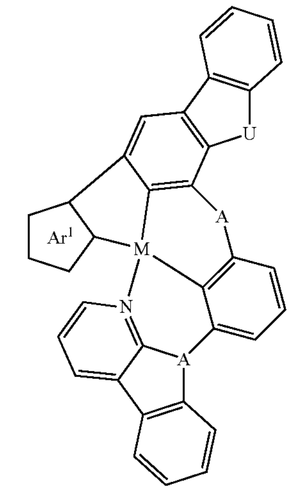
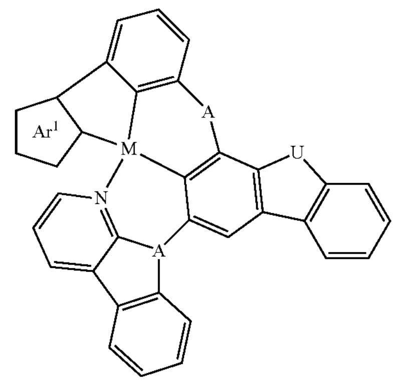
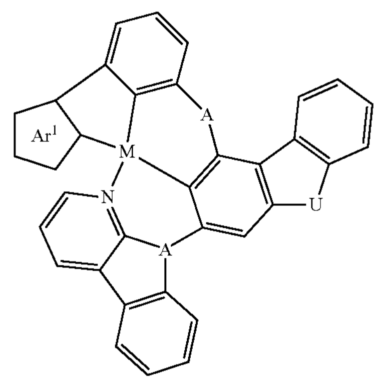
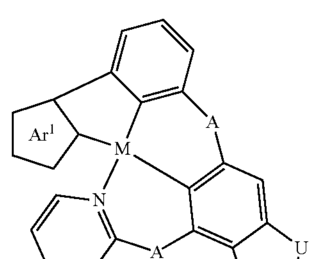

-continued
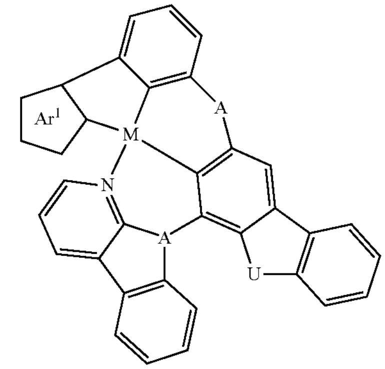
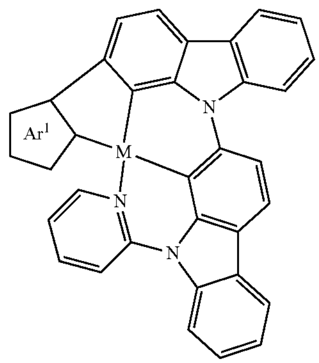
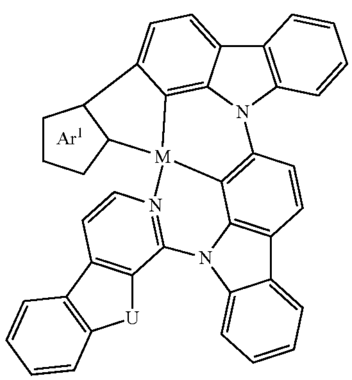
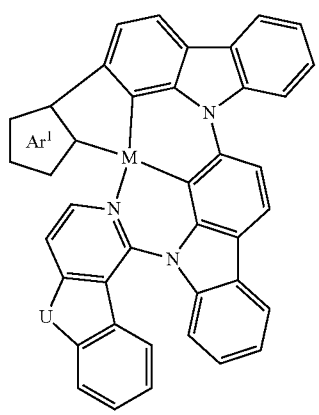
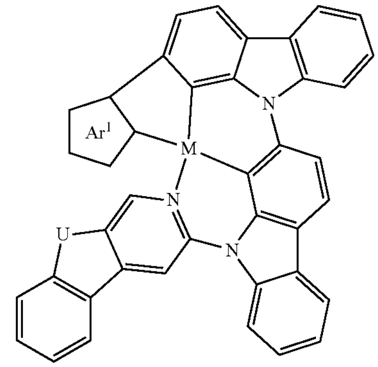
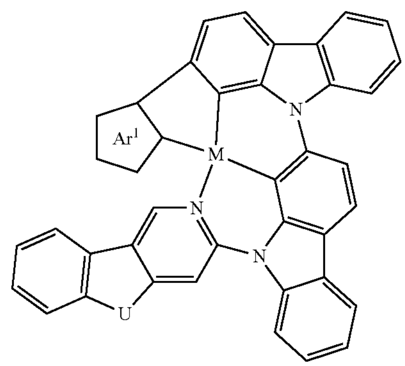
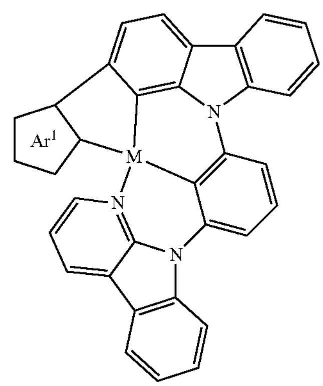
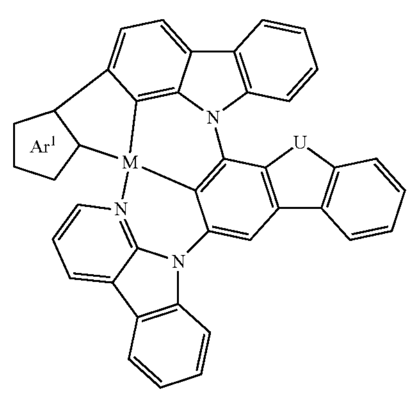

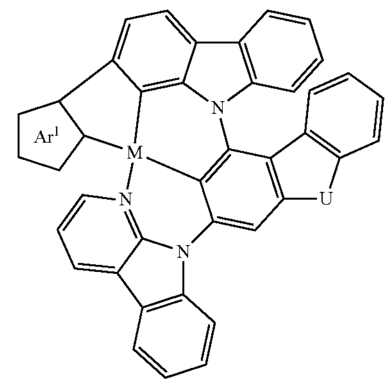
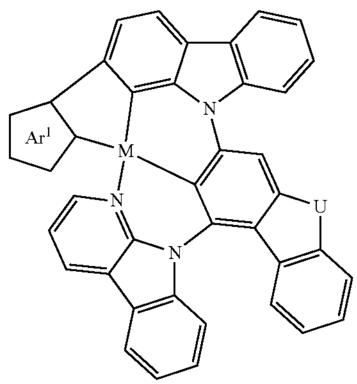
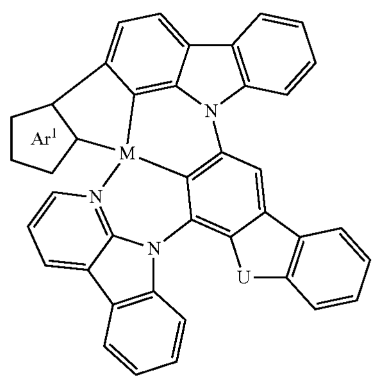
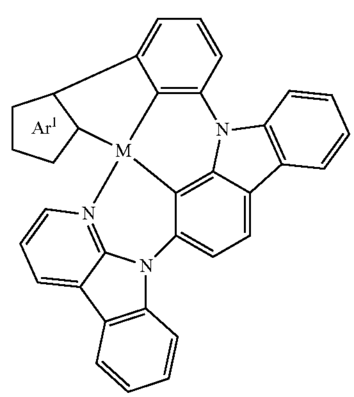
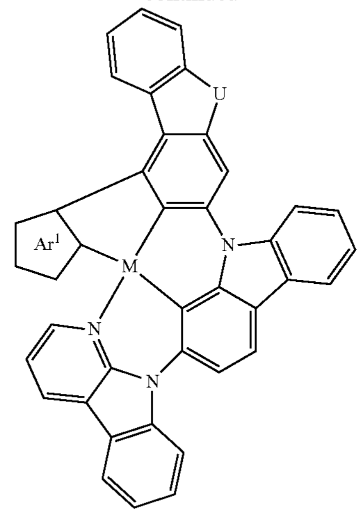
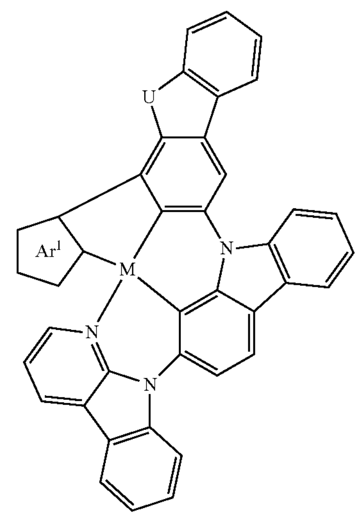
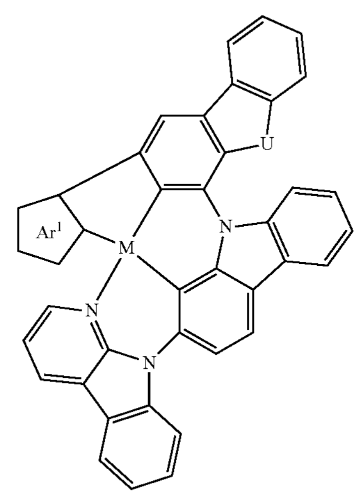

-continued
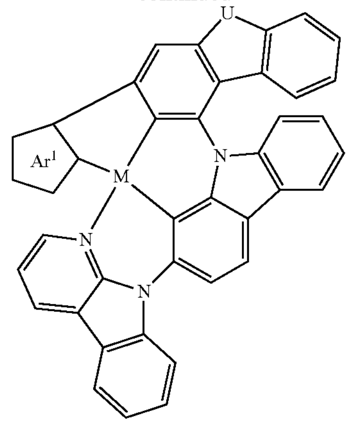
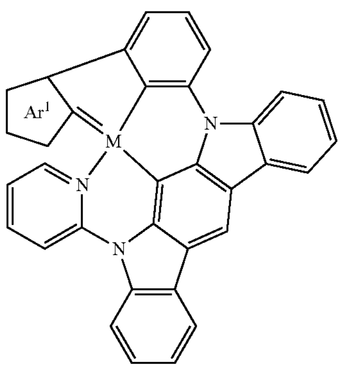
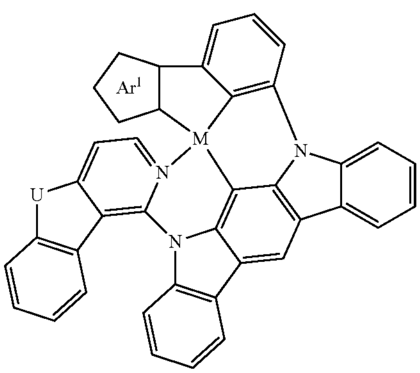
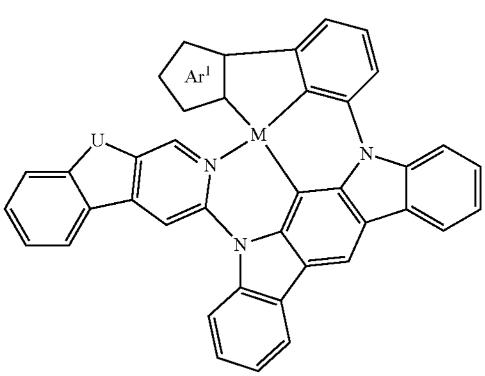
-continued
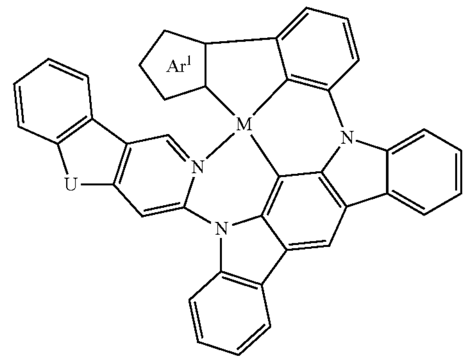
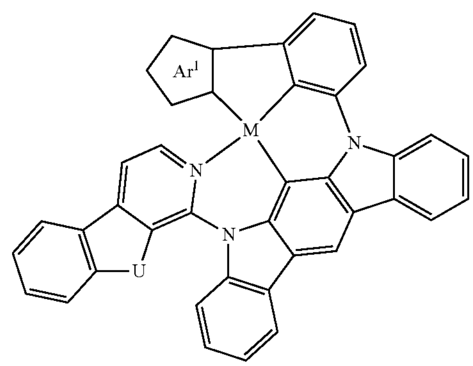
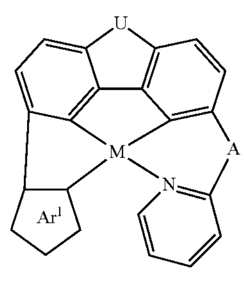
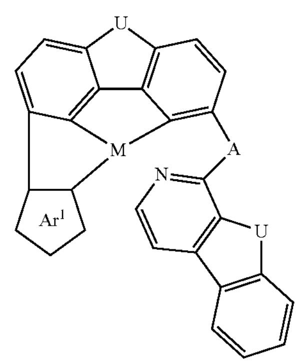
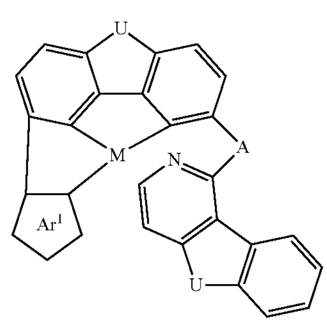
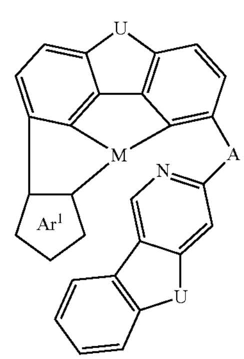

-continued
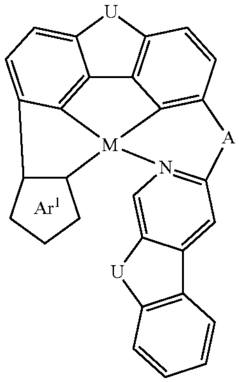
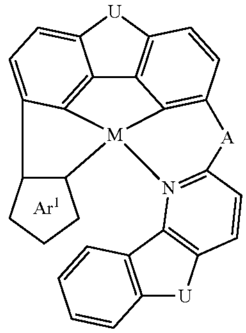
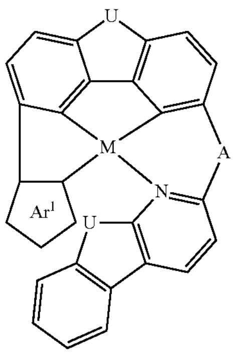
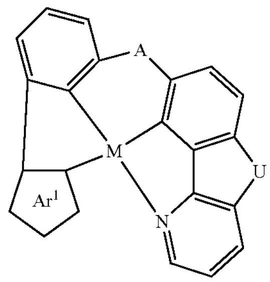
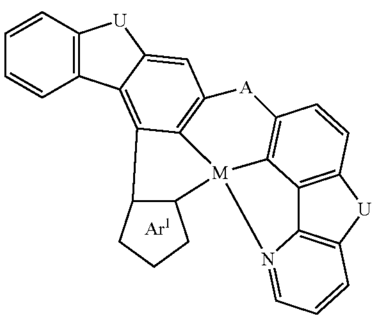
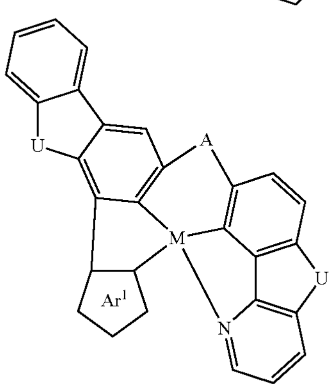
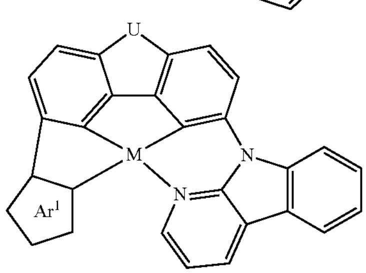
-continued
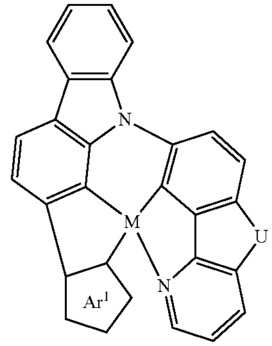
wherein each A independently is O, S, NR, PR, AsR, $CR_2$, $SiR_2$, or BR,
wherein each U independently is O S, NR, PR, AsR, $CR_2$, $SiR_2$, or BR,
wherein M is Mn or Ni, and
wherein
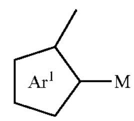
is any one of
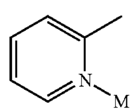
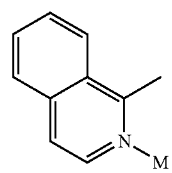
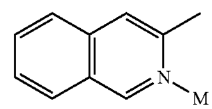
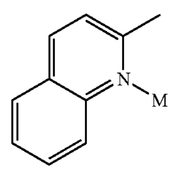
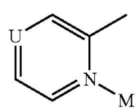
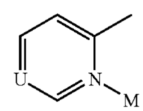
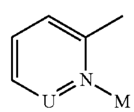
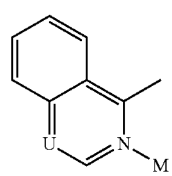
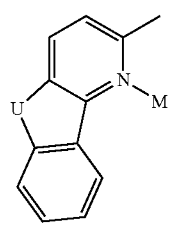
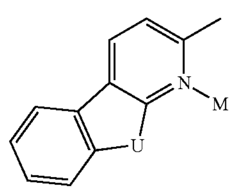
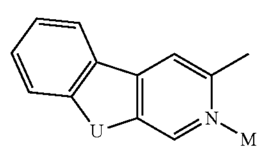

-continued
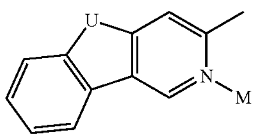
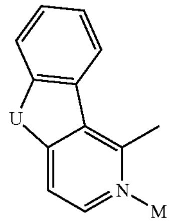
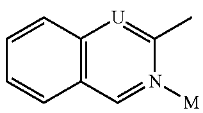
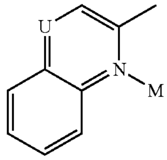
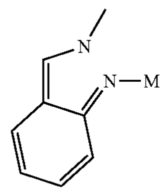
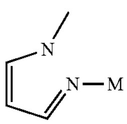
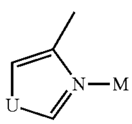
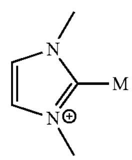
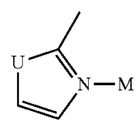
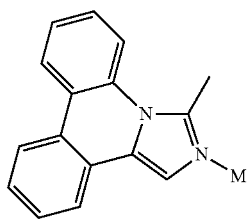
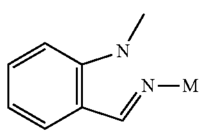
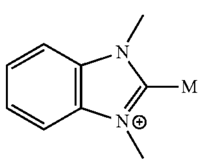
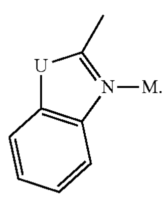
In one aspect, a disclosed complex can have the structure:
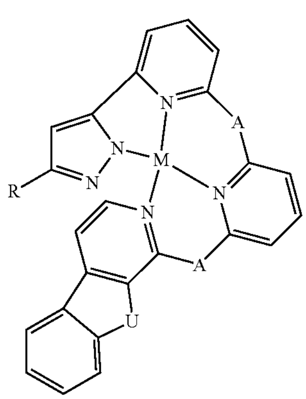
-continued
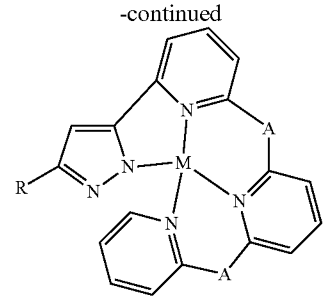
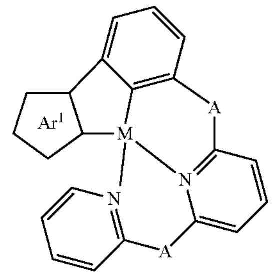
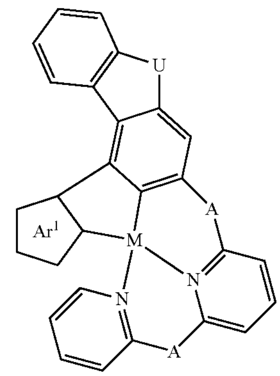
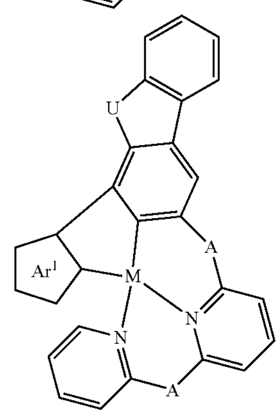
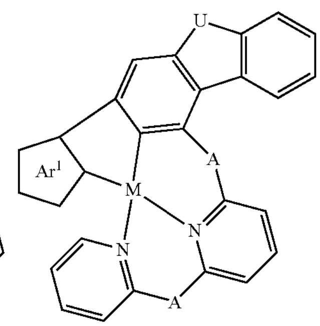
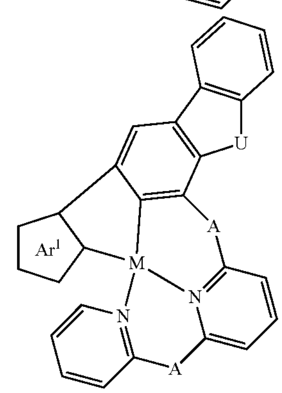
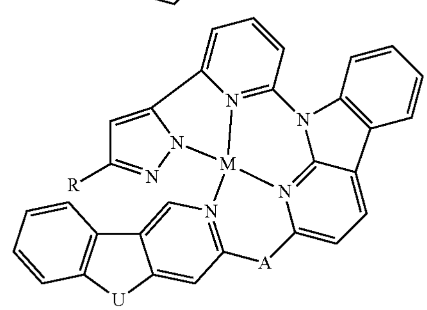

-continued
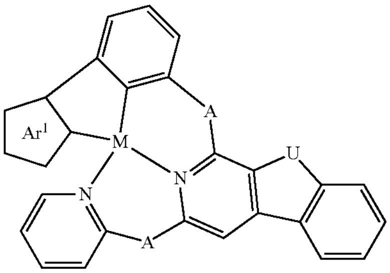
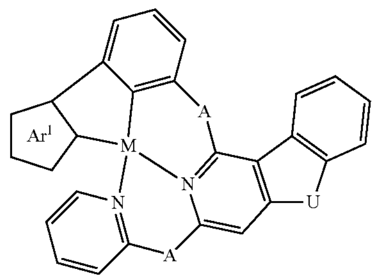
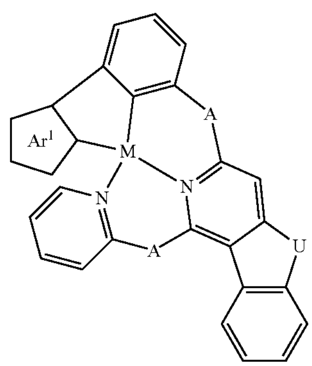
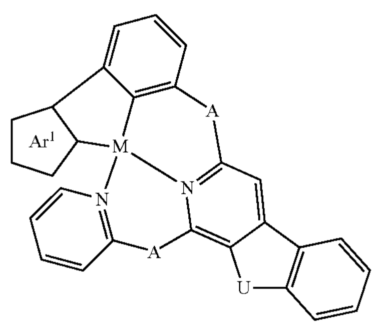
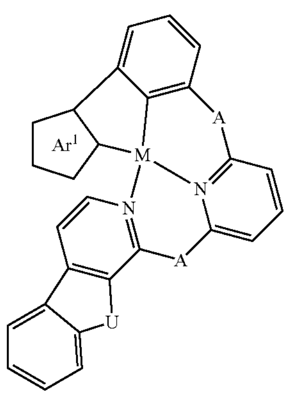
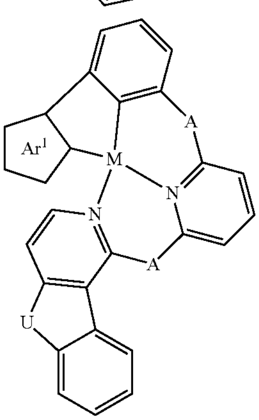
-continued
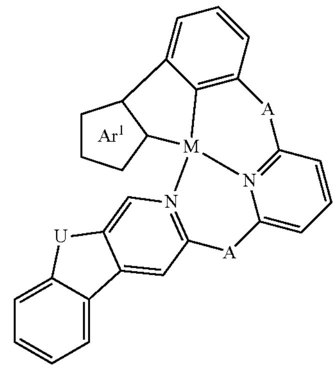
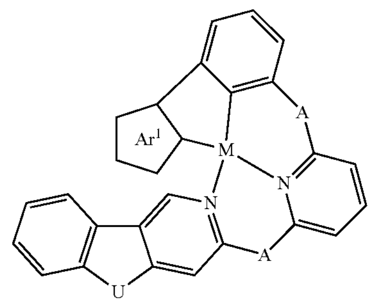
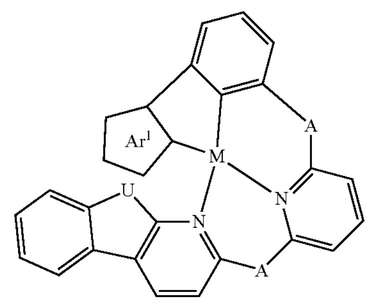
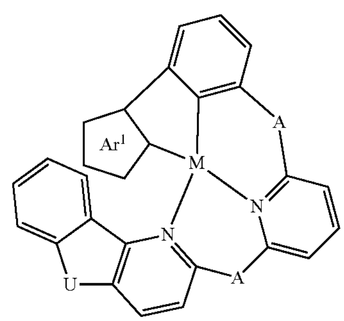
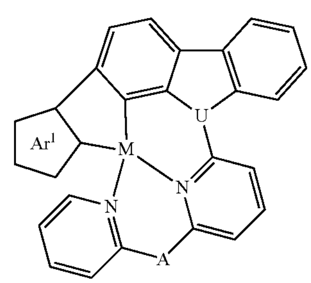

-continued
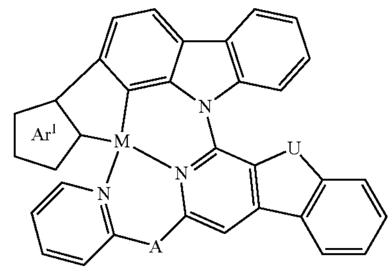
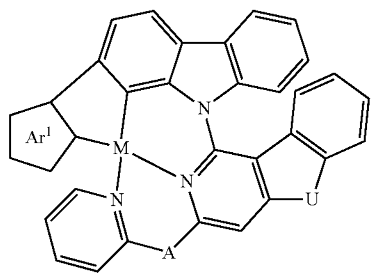
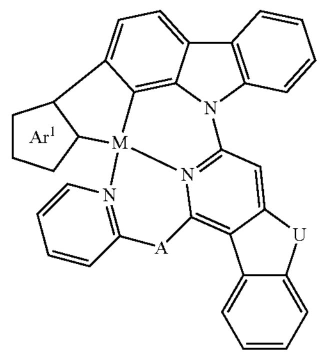
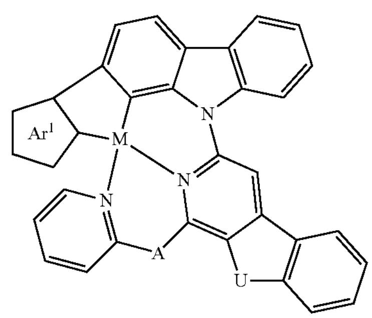
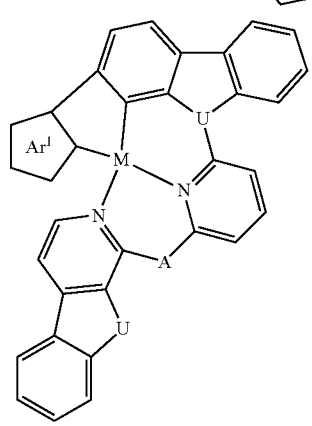
-continued
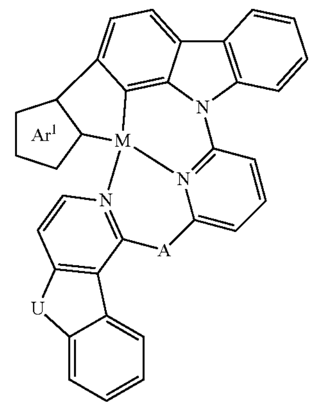
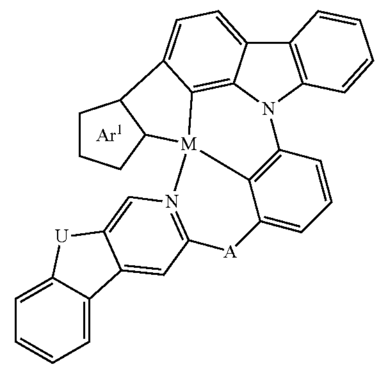
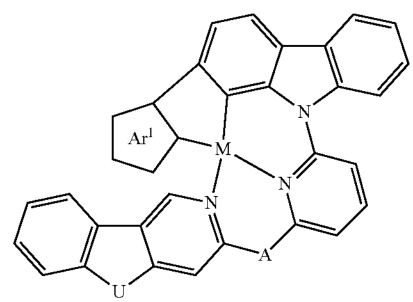
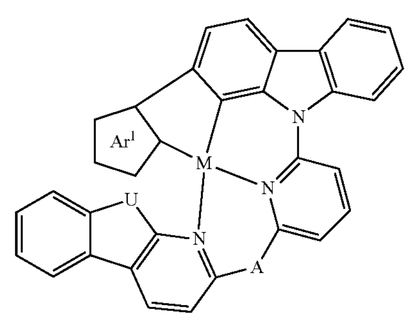
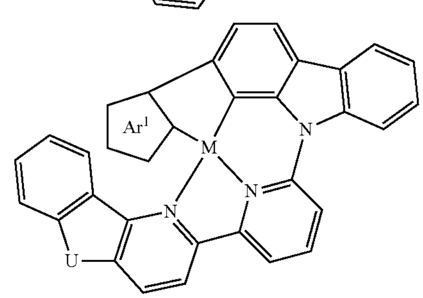

-continued
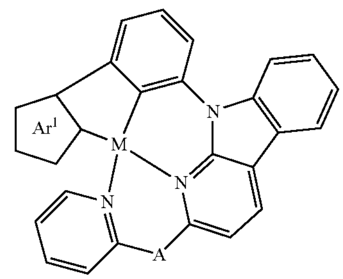
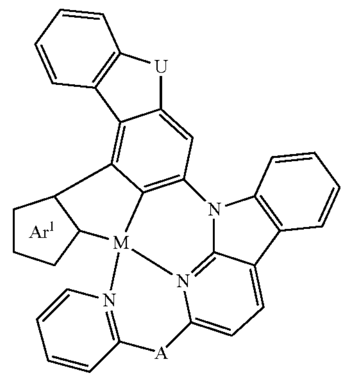
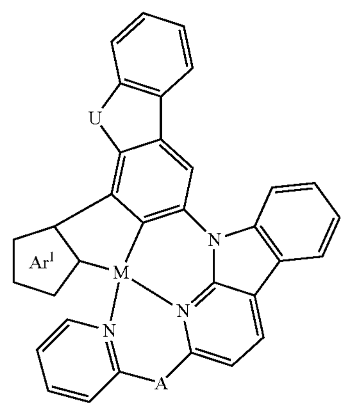
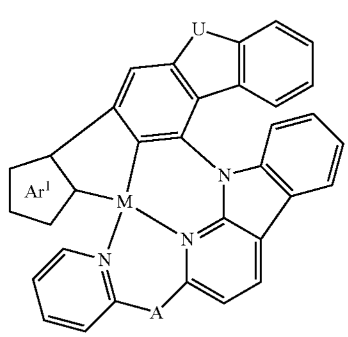
-continued
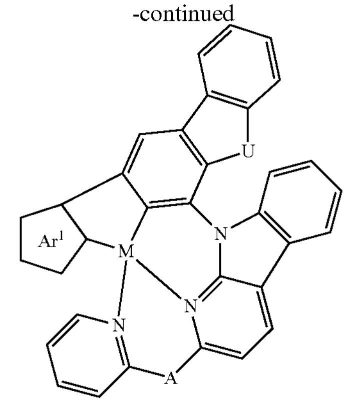
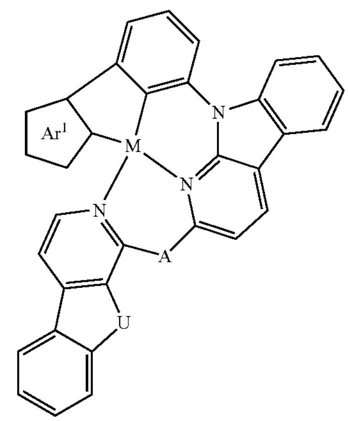
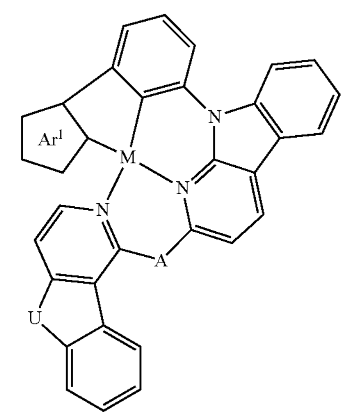
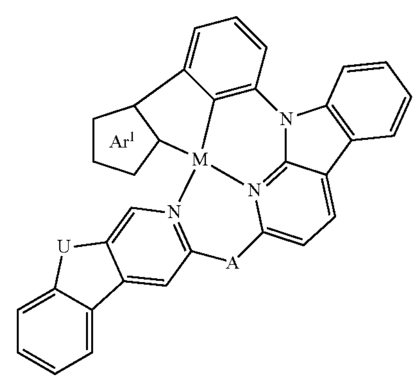

-continued
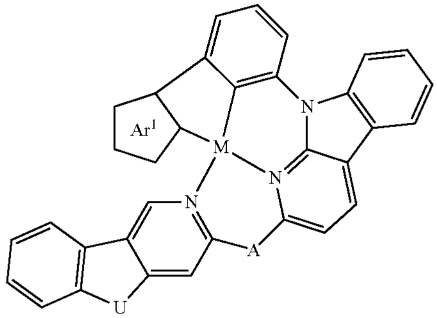
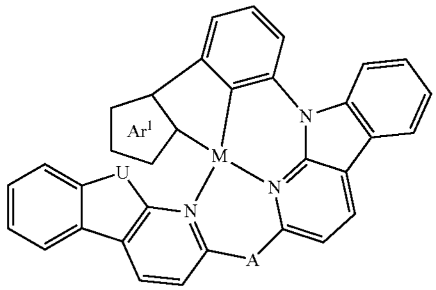
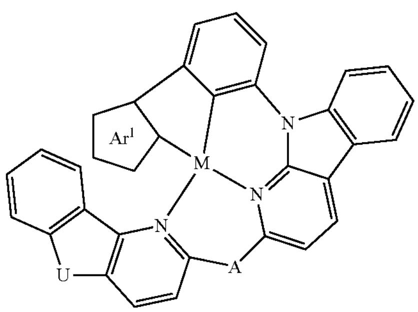
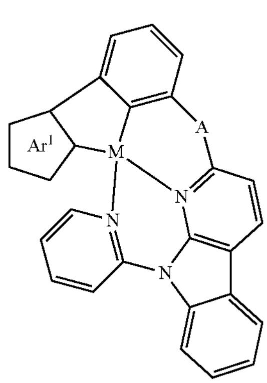
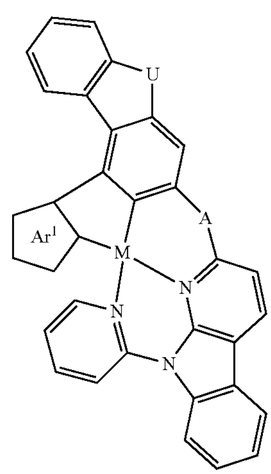
-continued
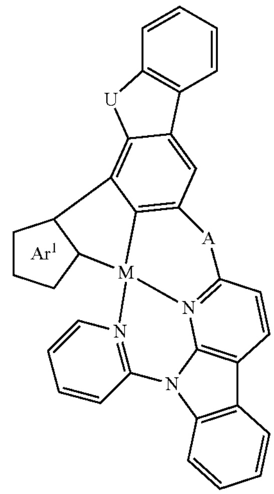
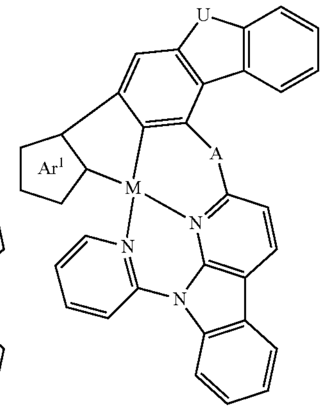
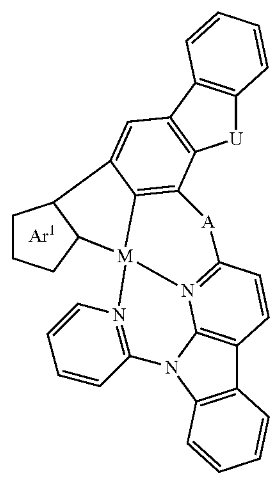
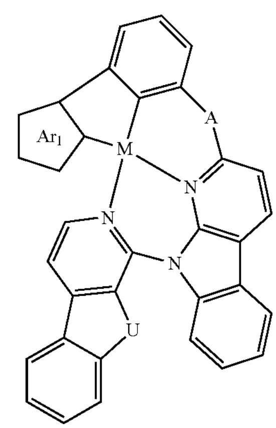
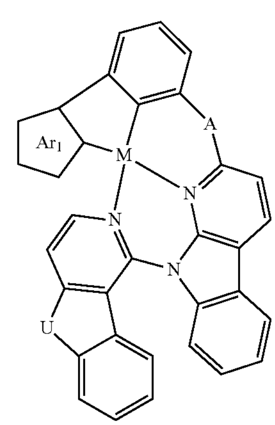

-continued
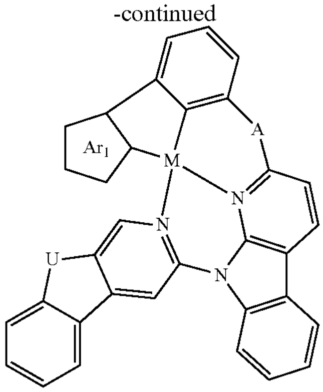
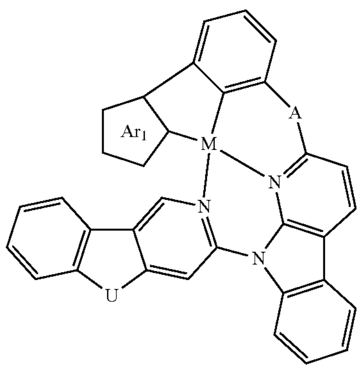
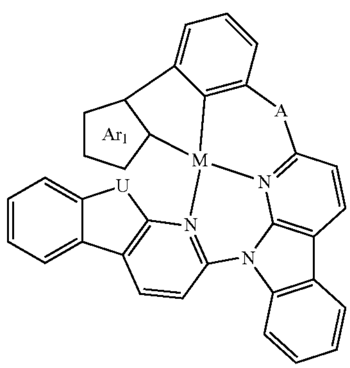
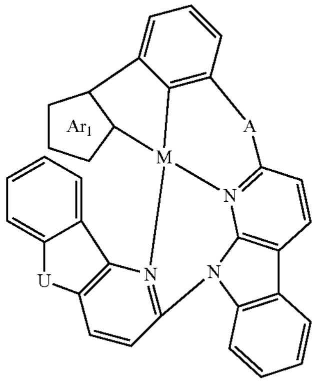
-continued
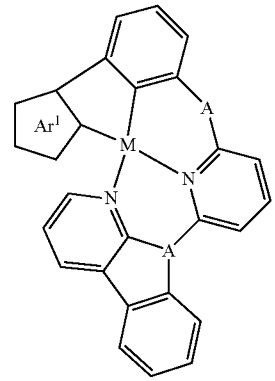
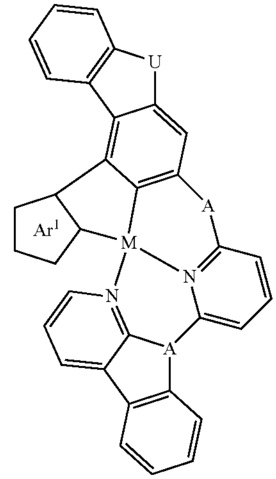
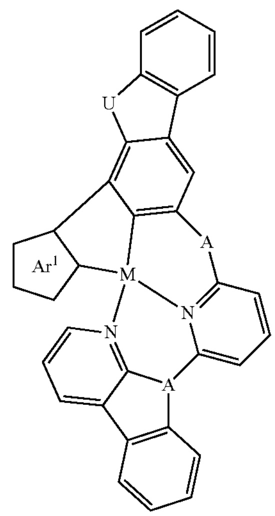
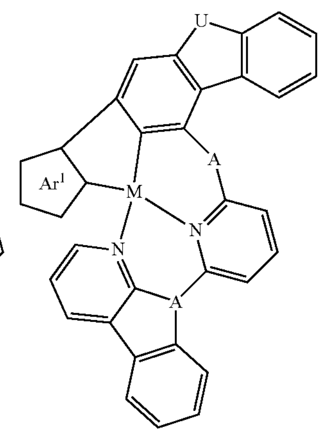
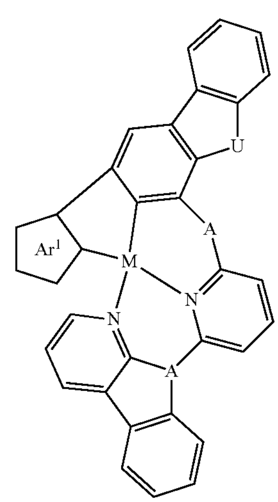

-continued
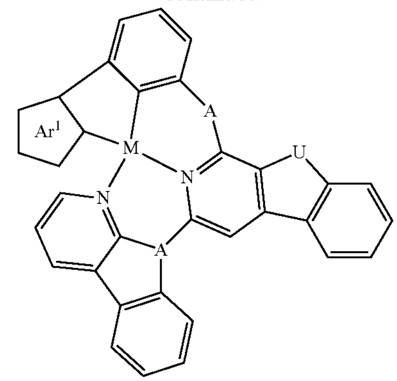
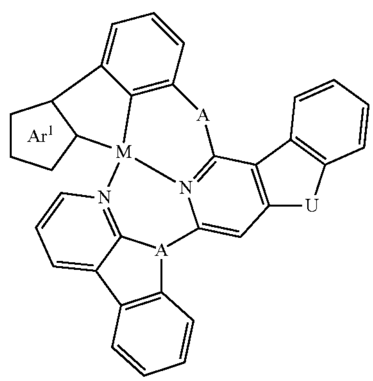
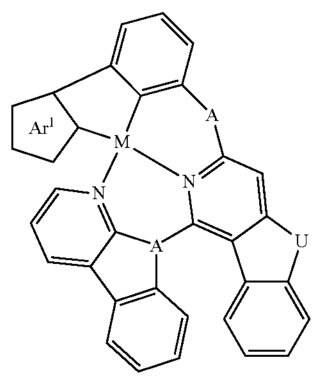
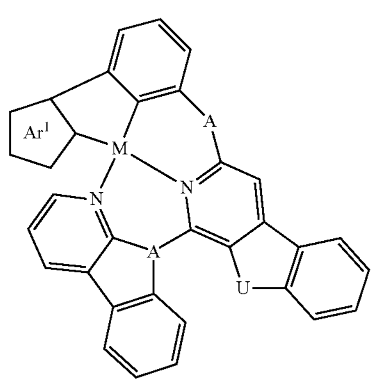
-continued
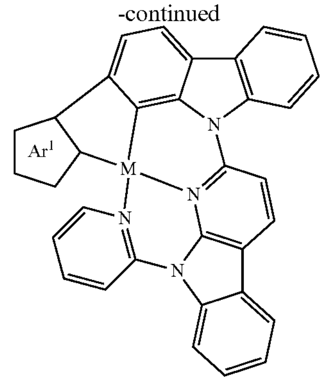
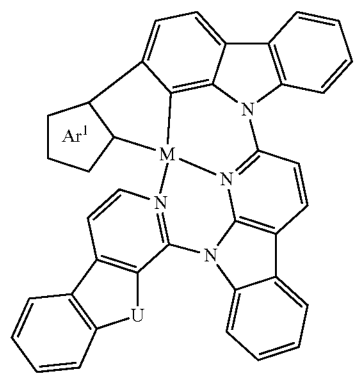
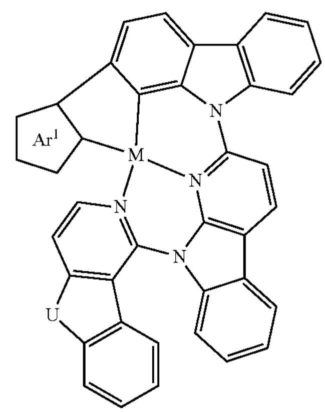
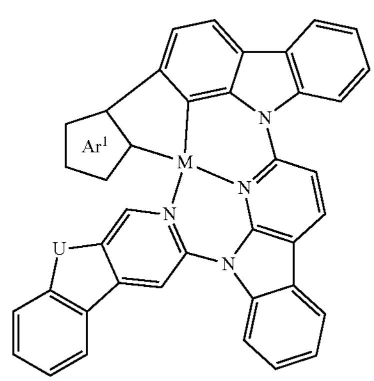

-continued
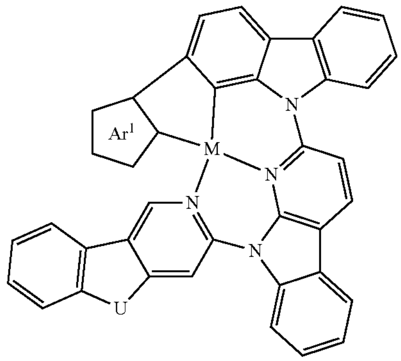
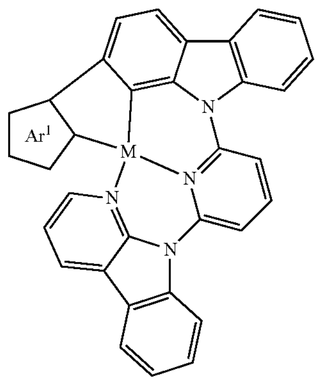
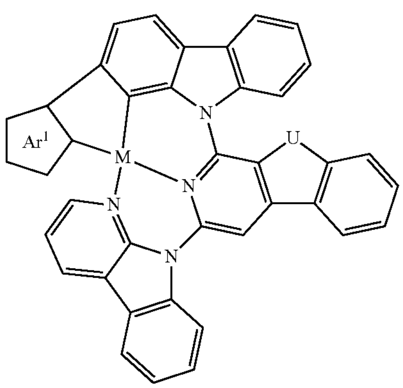
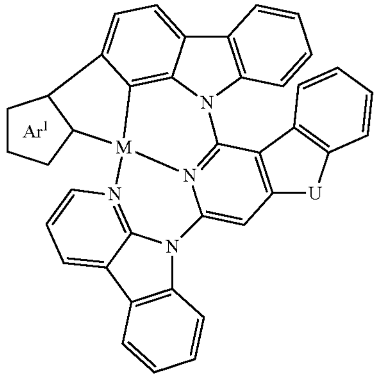
-continued
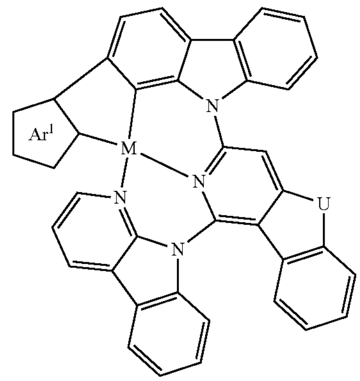
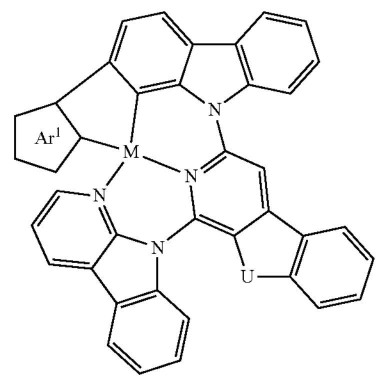
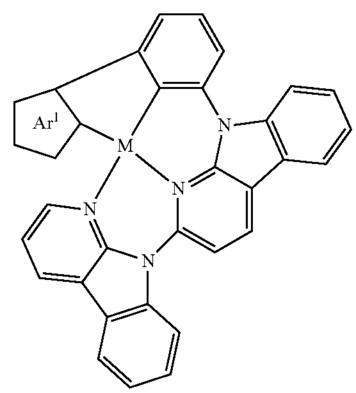
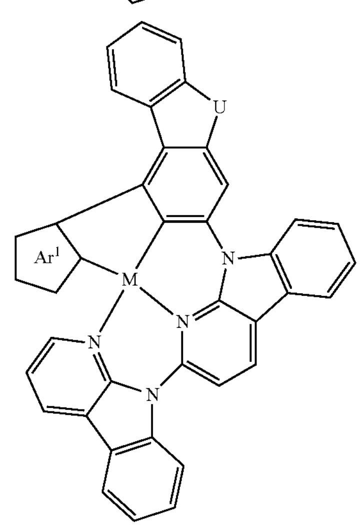

-continued
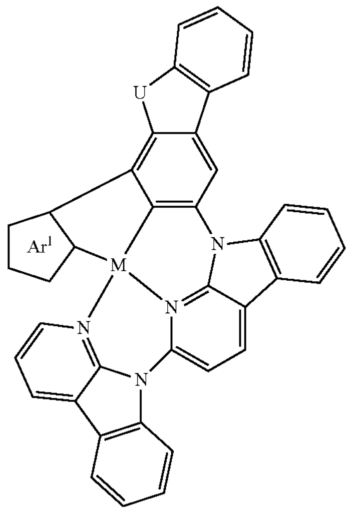
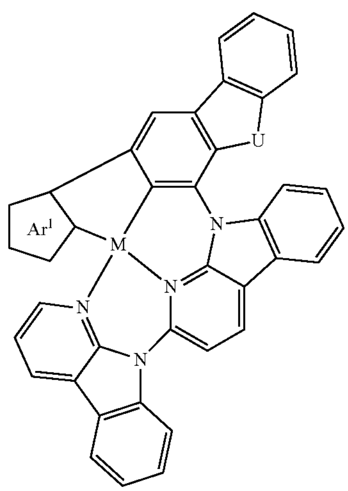
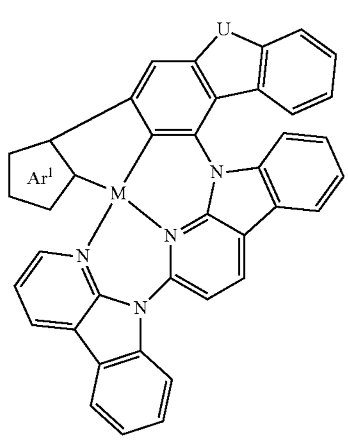
-continued
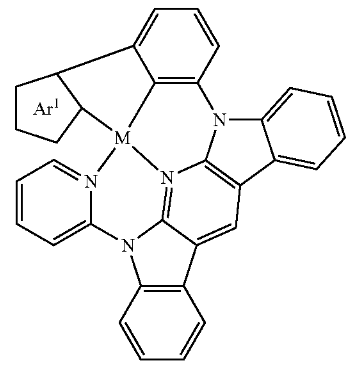
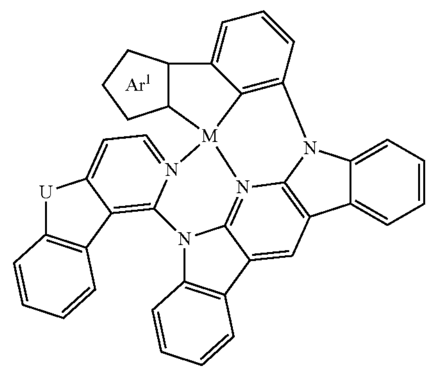
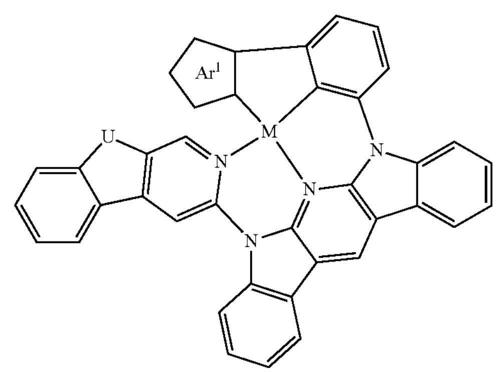
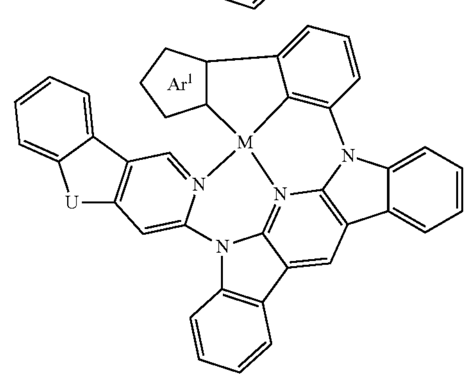

-continued
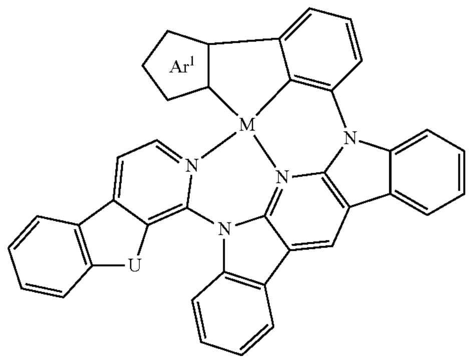
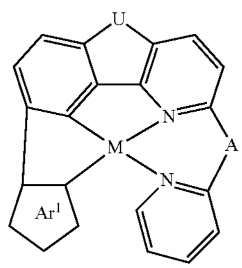
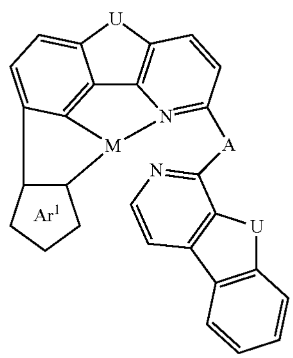
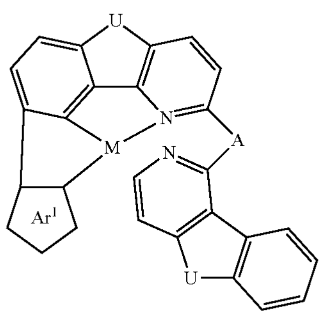
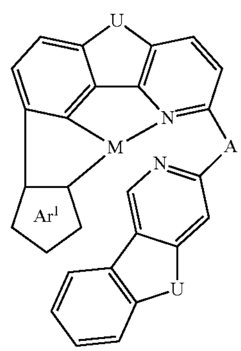
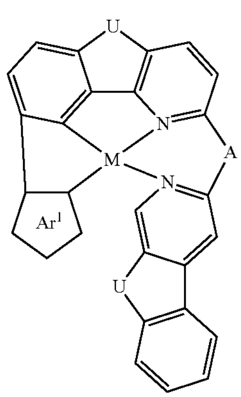
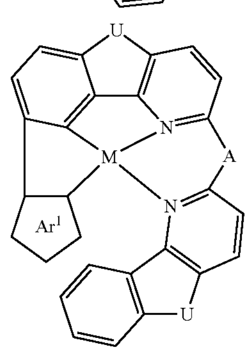
-continued
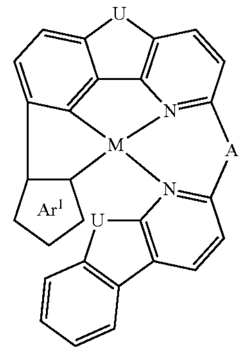
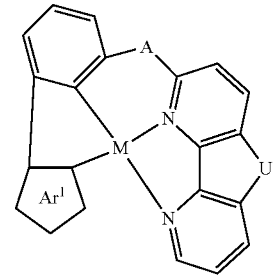
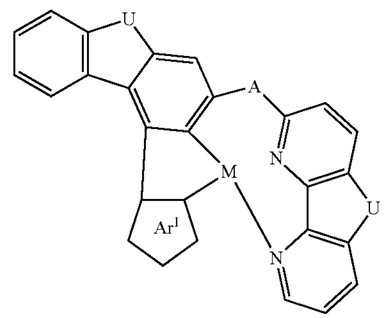
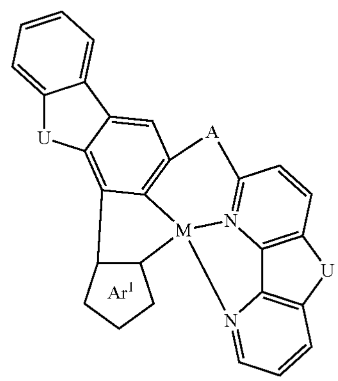
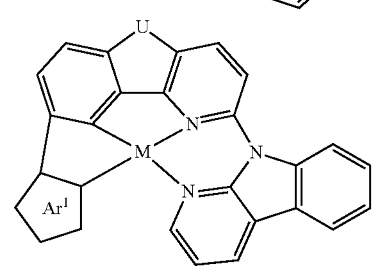
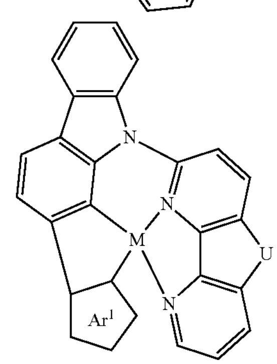
wherein each A independently is O, S, NR, PR, AsR, $CR_2$, $SiR_2$, or BR, wherein each U independently is O S, NR, PR, AsR, $CR_2$, $SiR_2$, or BR,
wherein M is Ir, Rh, or Cu, and
wherein
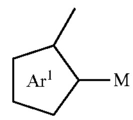
is any one of
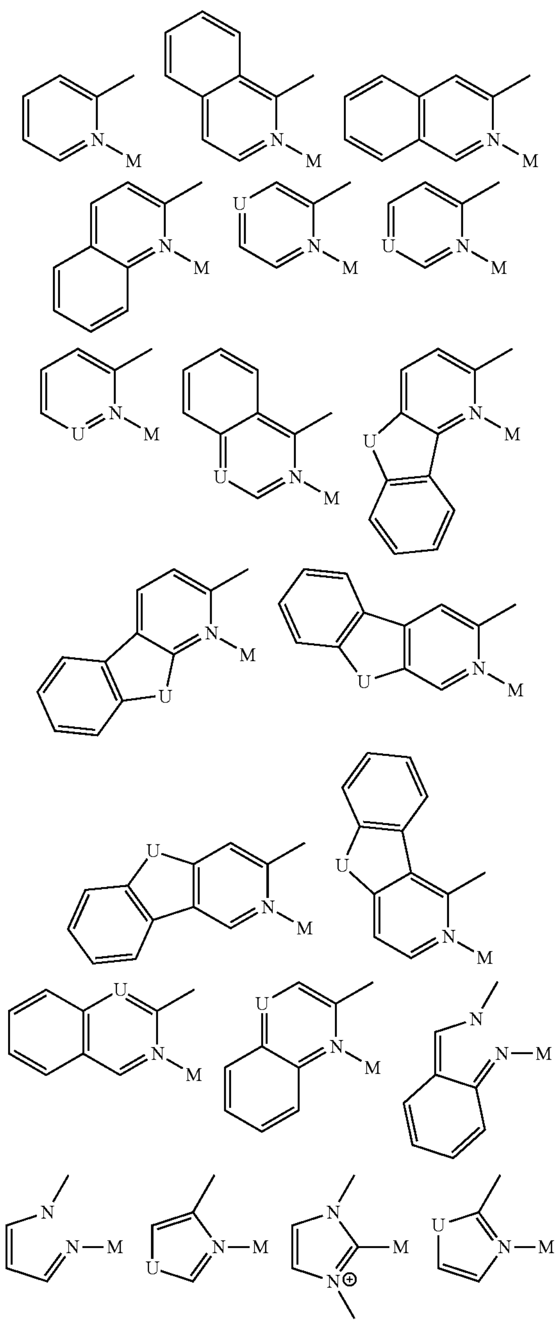
-continued
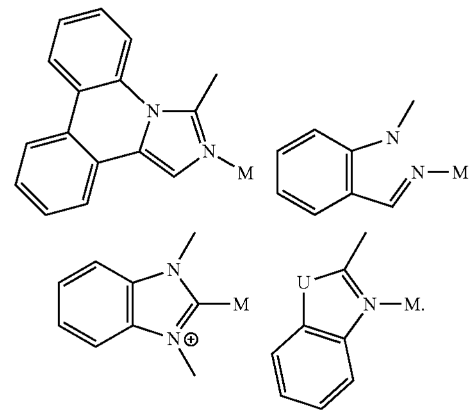
In one aspect, a disclosed compound can have the structure:
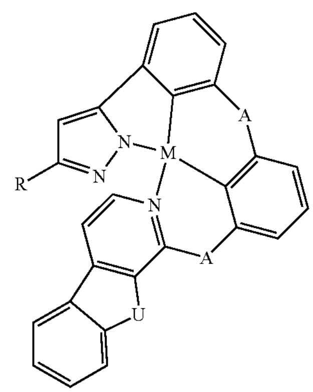
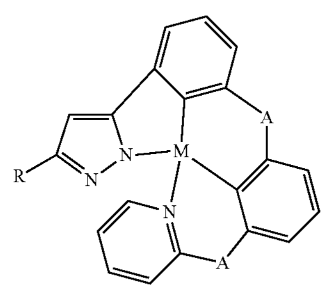
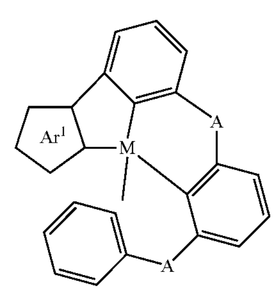
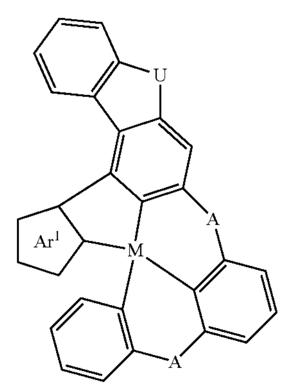

-continued
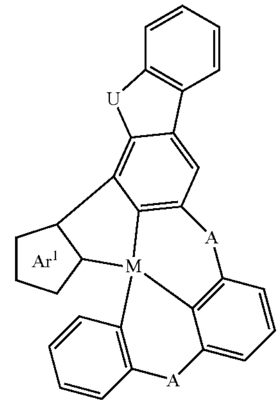
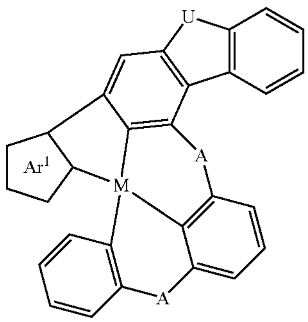
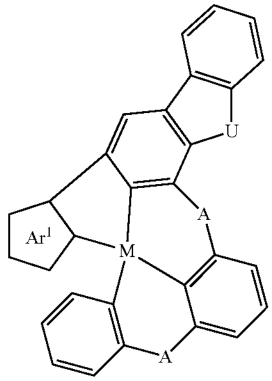
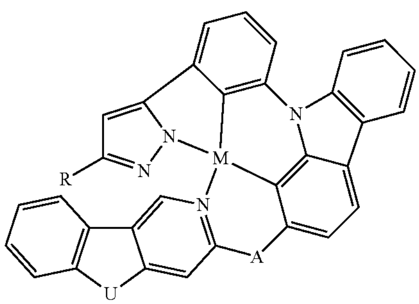
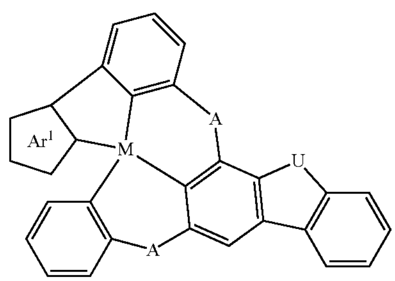
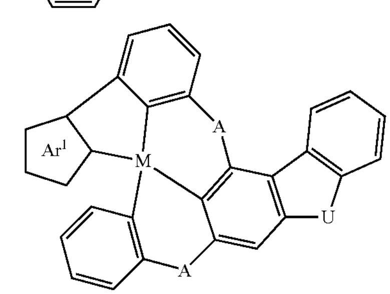
-continued
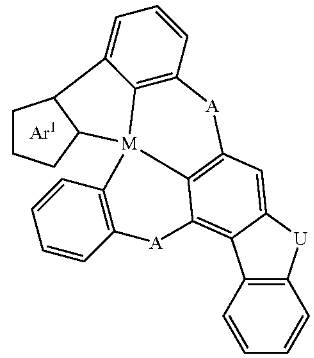
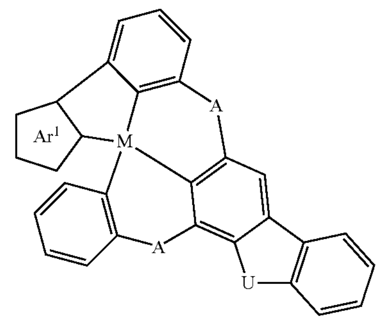
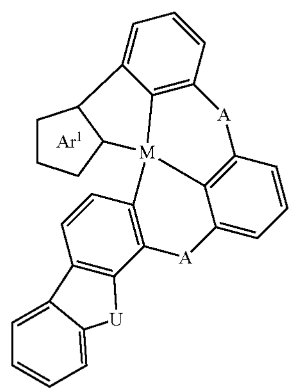
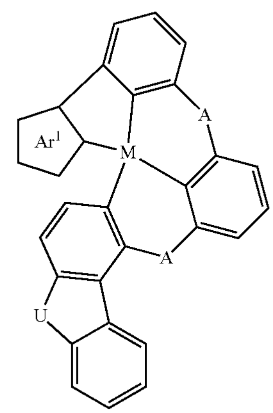
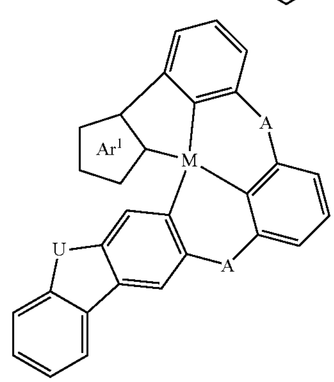

-continued
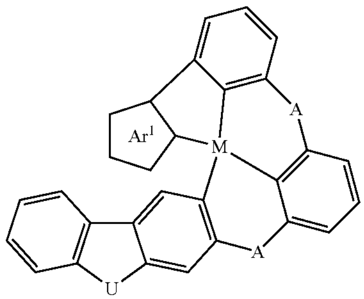
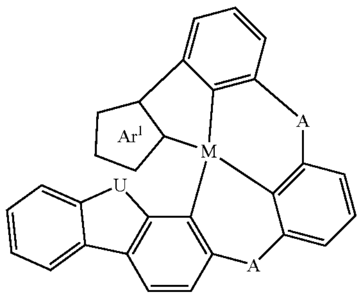
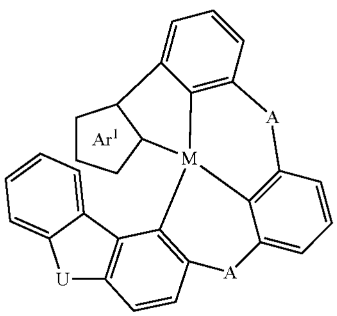
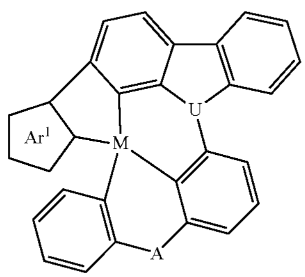
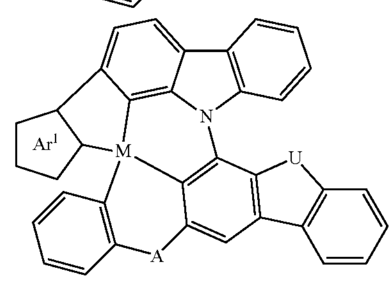
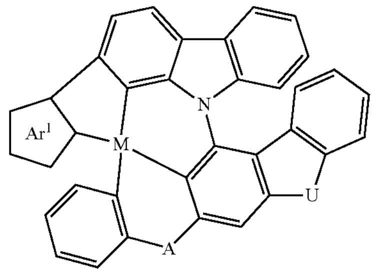
-continued
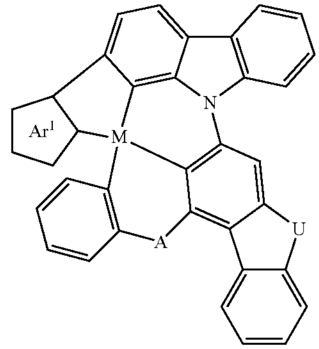
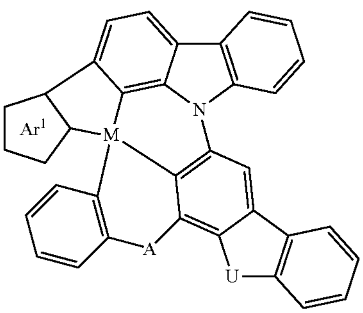
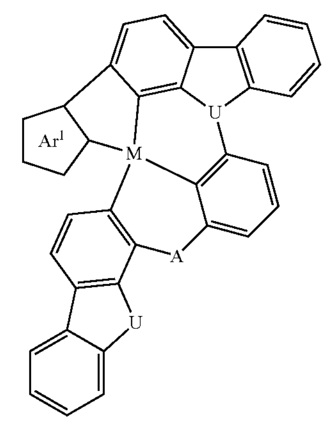
1-5
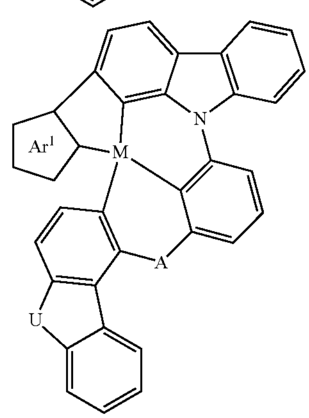
1-5

-continued
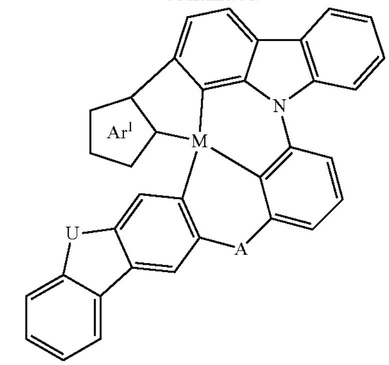
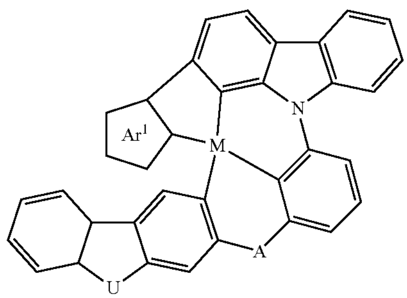
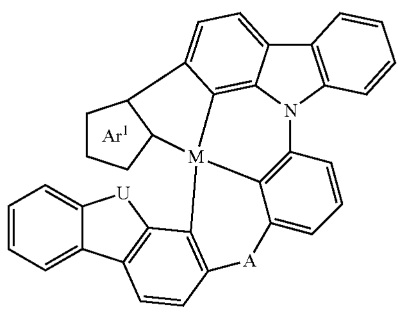
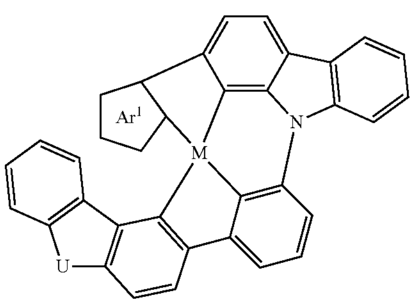
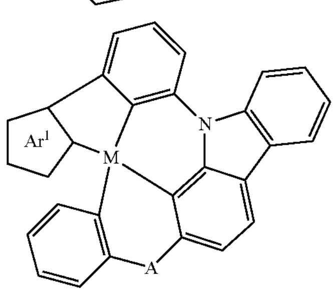
-continued
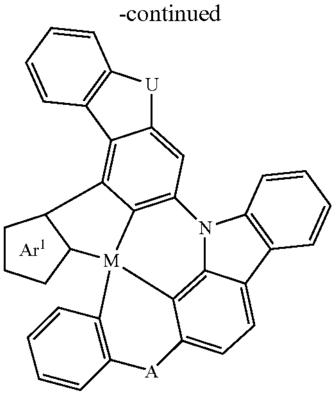
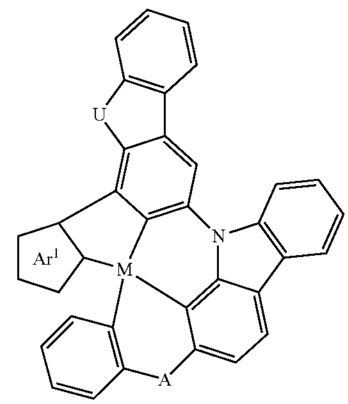
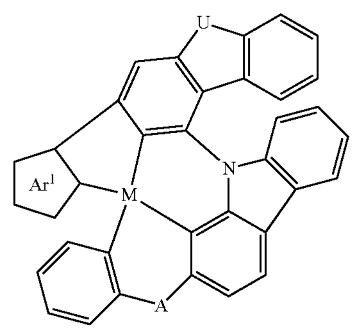
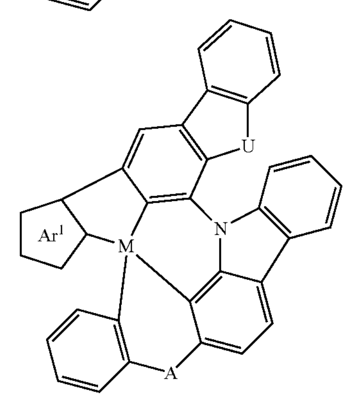

-continued
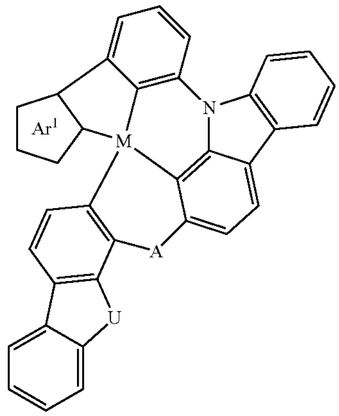
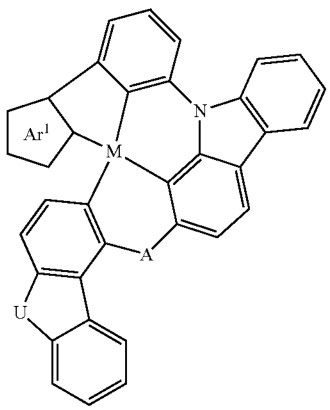
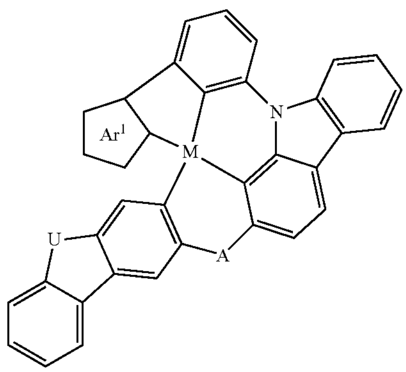
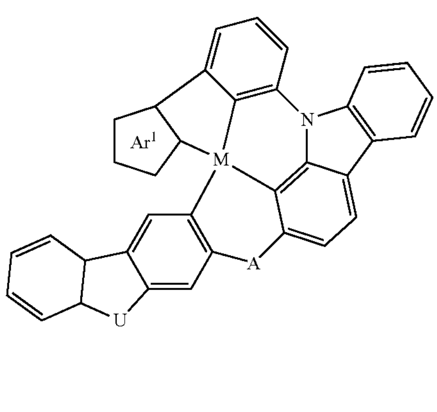
-continued
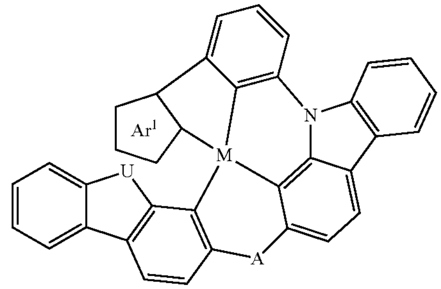
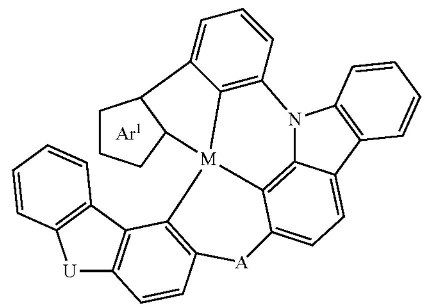
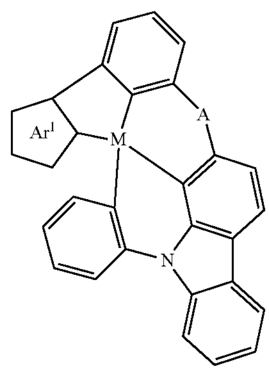
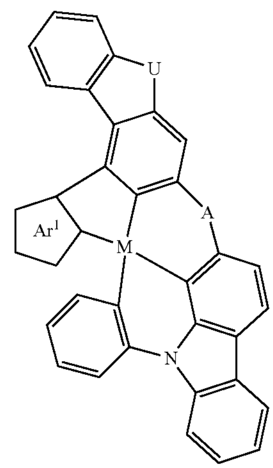
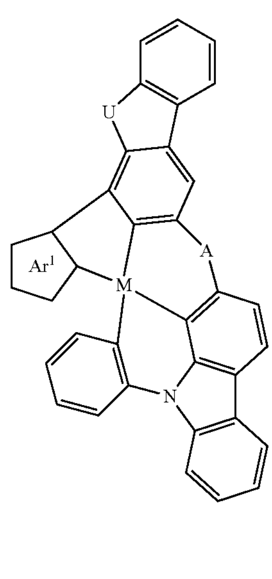
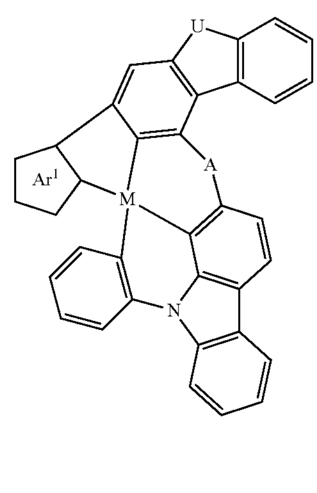

-continued
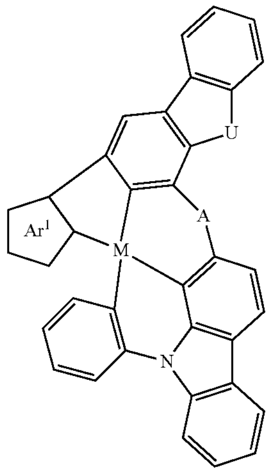
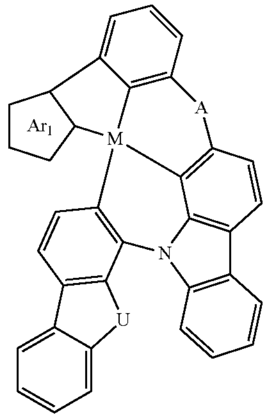
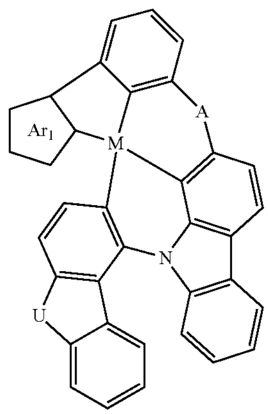
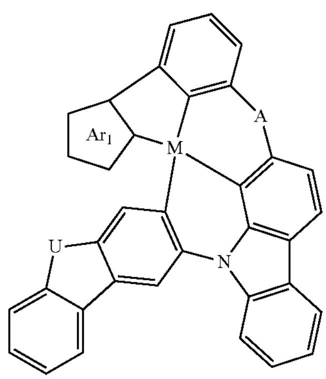
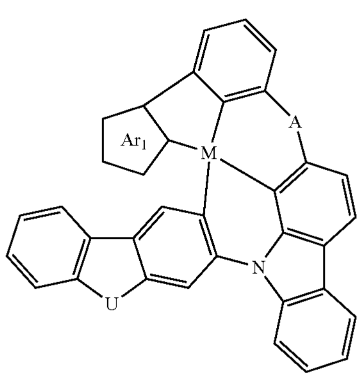
-continued
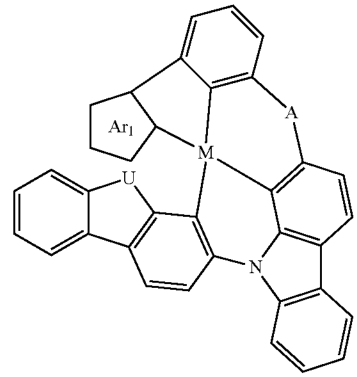
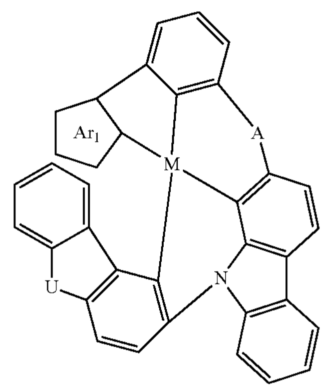
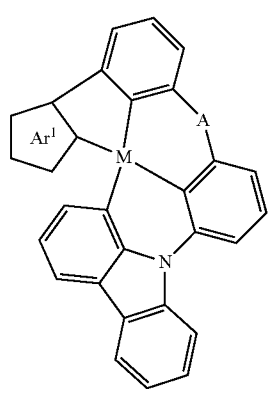
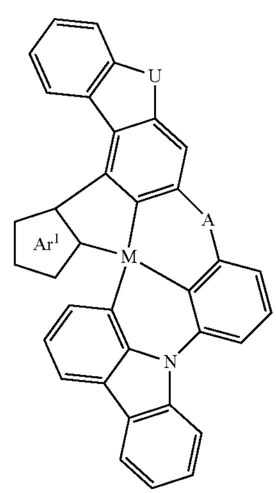

-continued
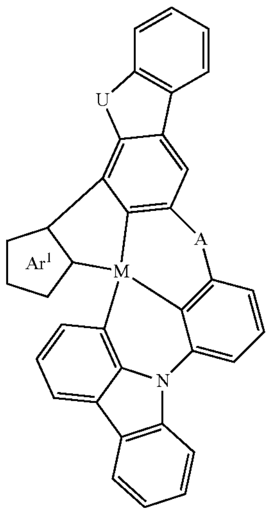
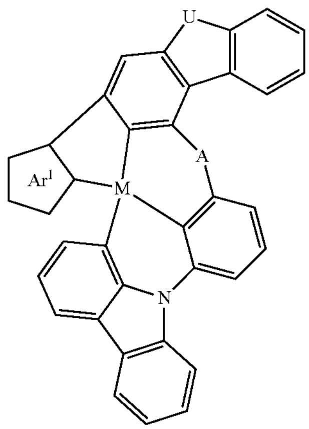
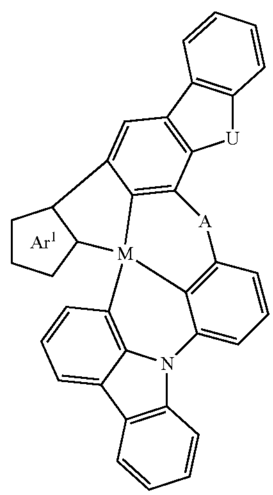
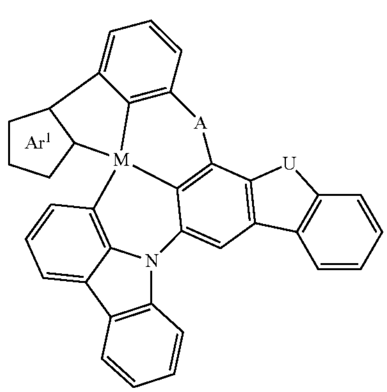
-continued
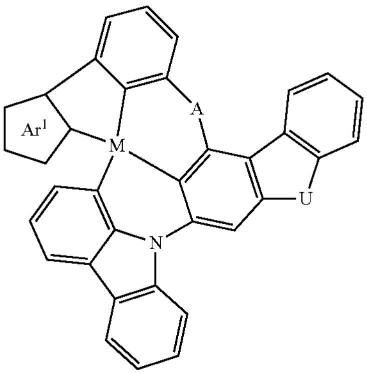
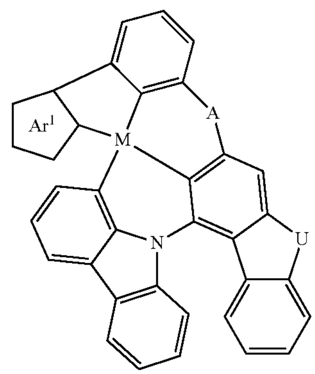
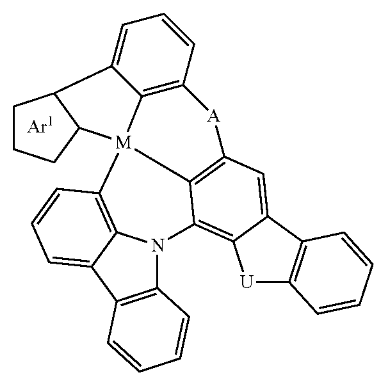
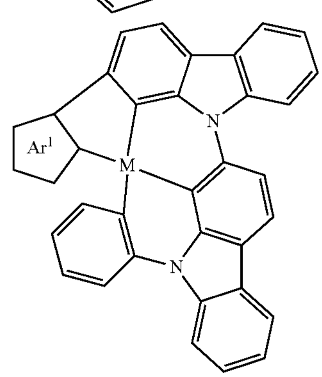

-continued
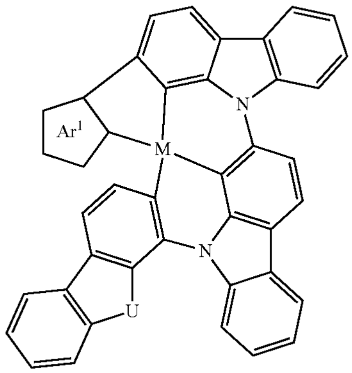
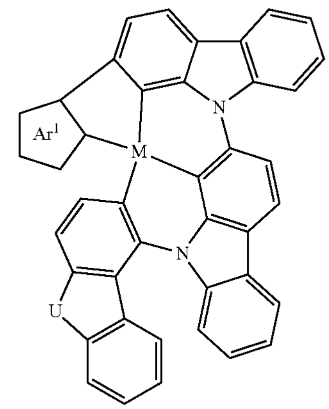
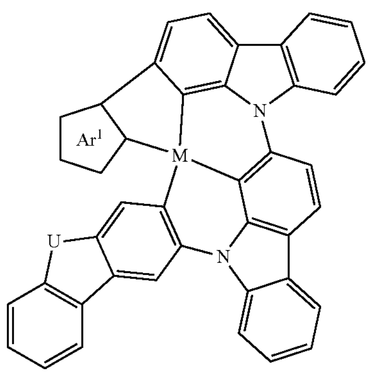
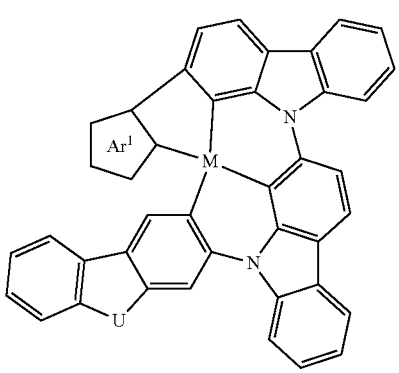
-continued
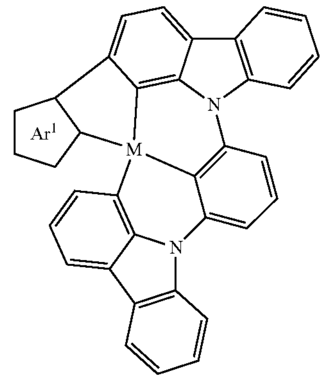
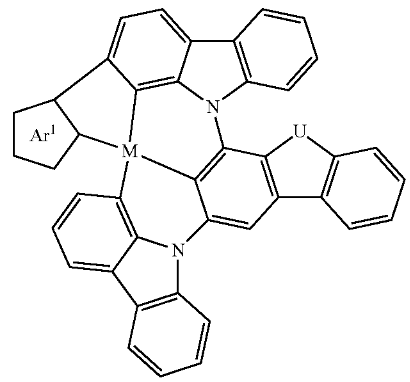
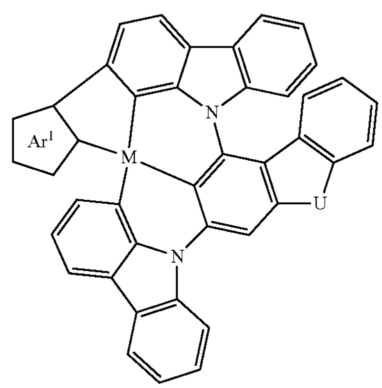
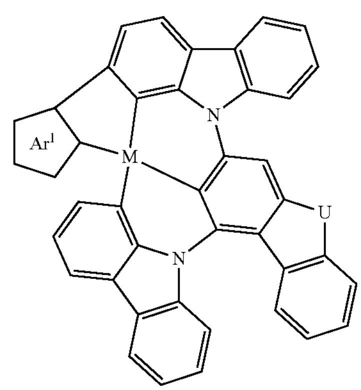

-continued
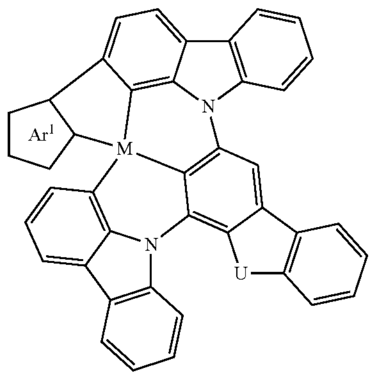
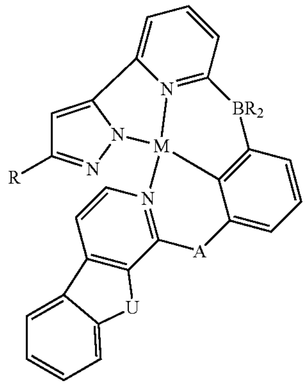
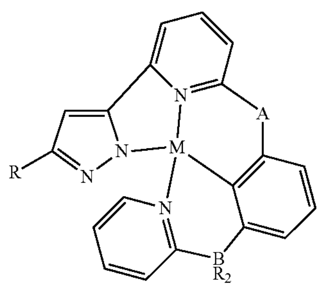
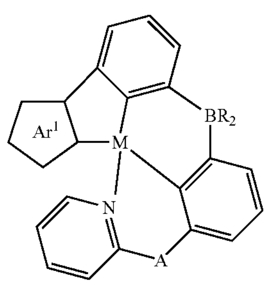
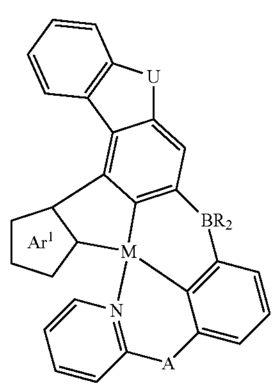
-continued
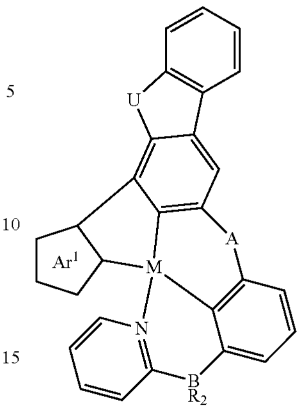
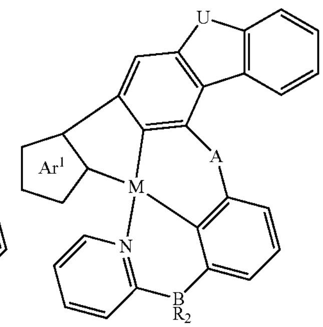
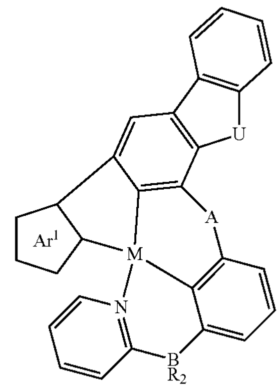
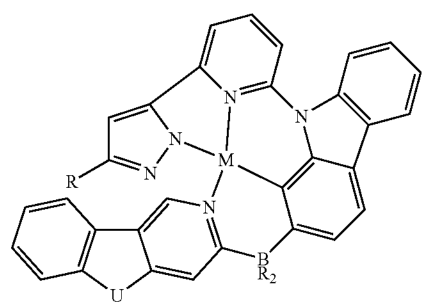
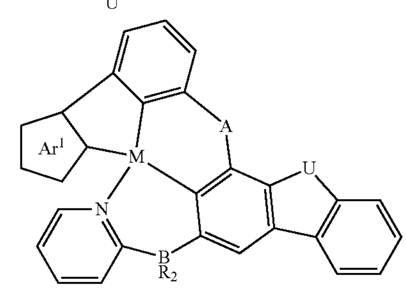
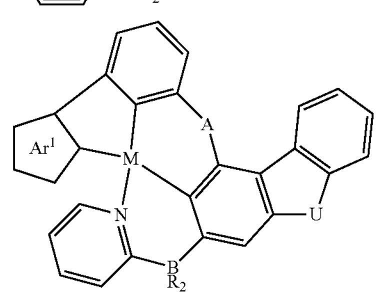

-continued
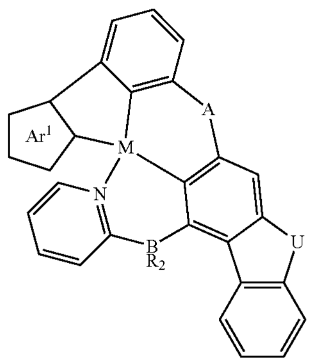
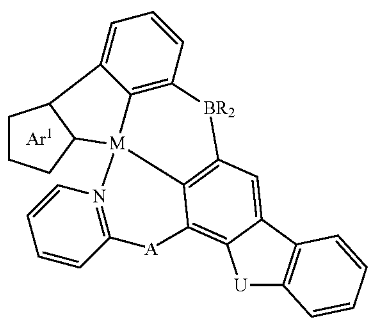
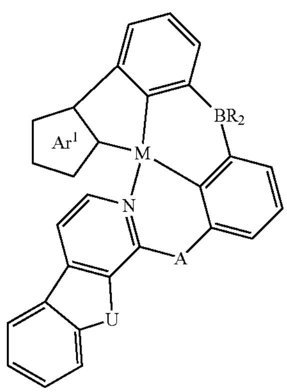
11-3
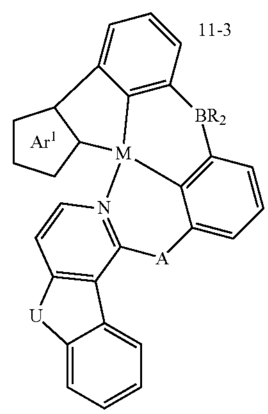
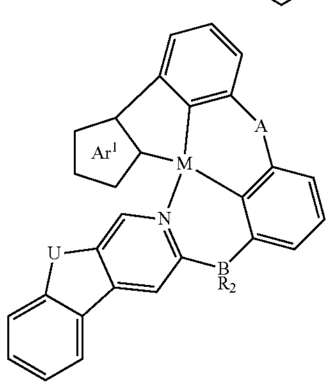
-continued
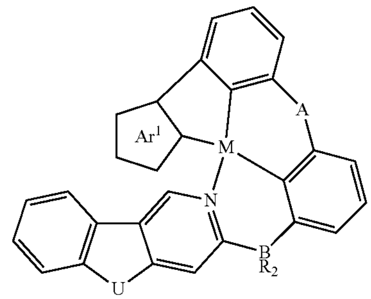
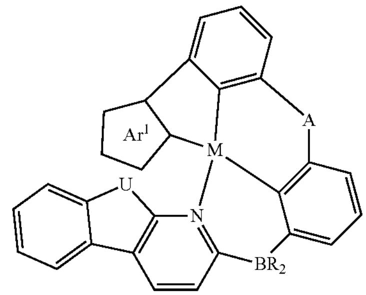
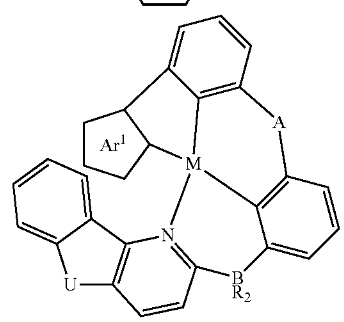
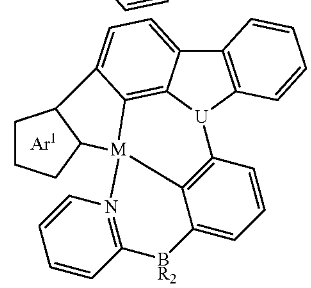
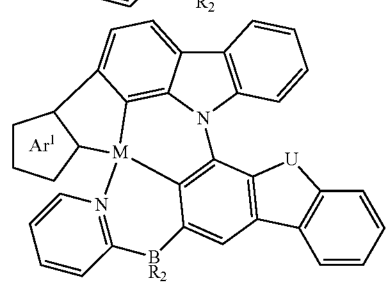
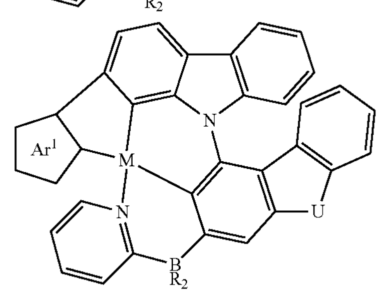

-continued
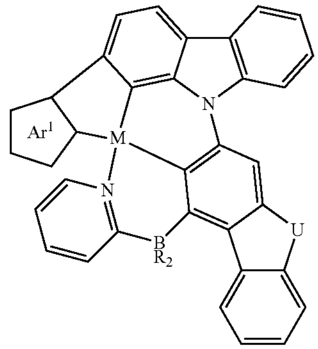
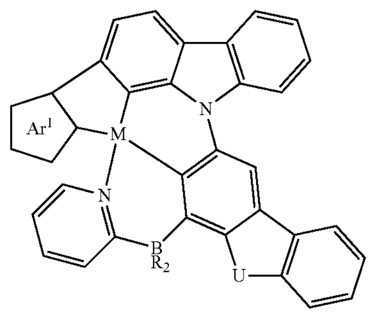
11-5
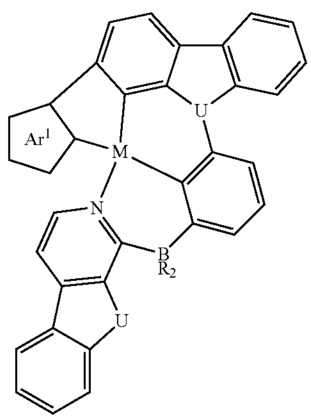
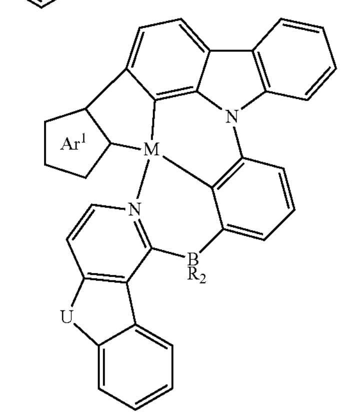
-continued
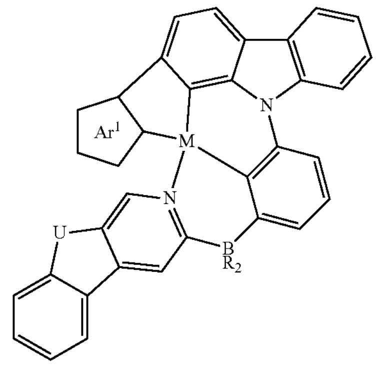
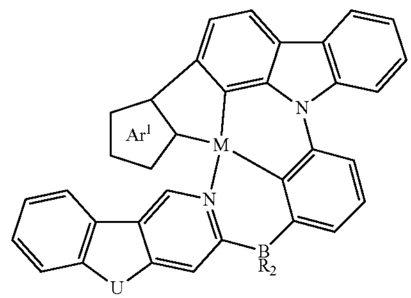
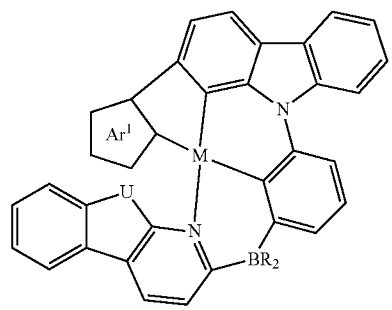
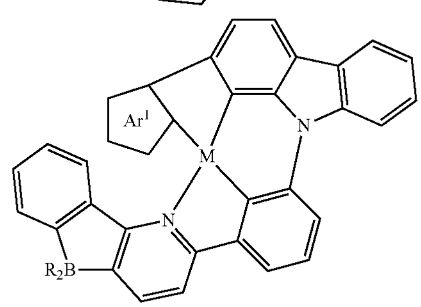
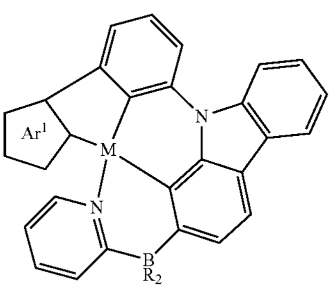

-continued
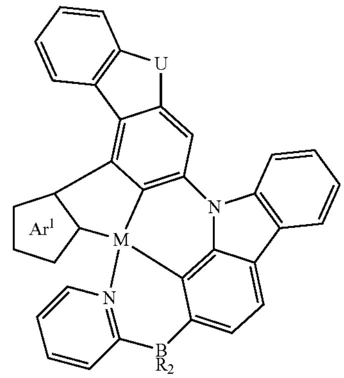
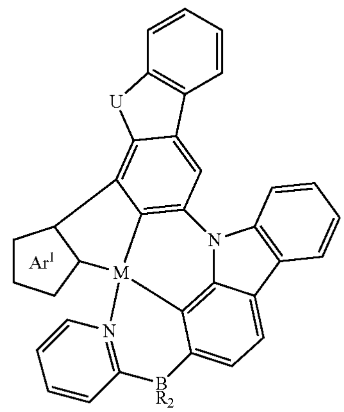
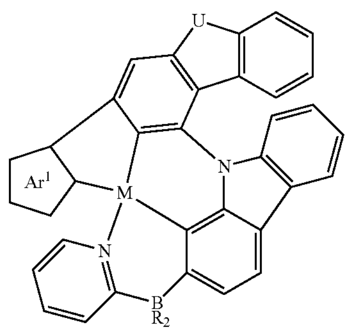
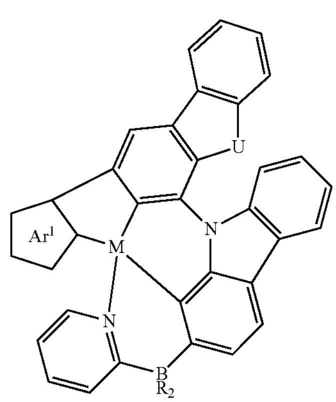
-continued
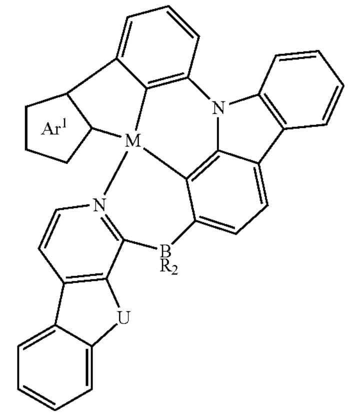
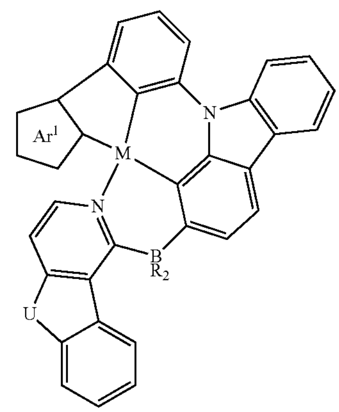
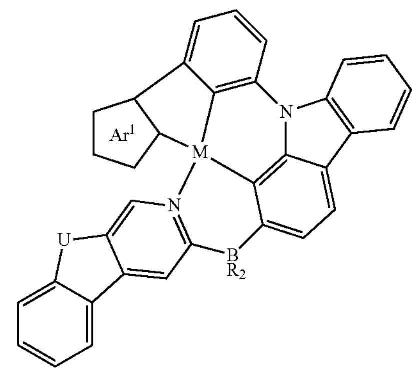
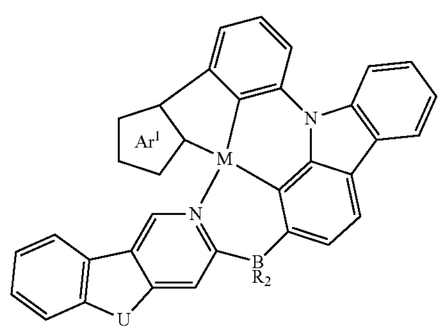

-continued
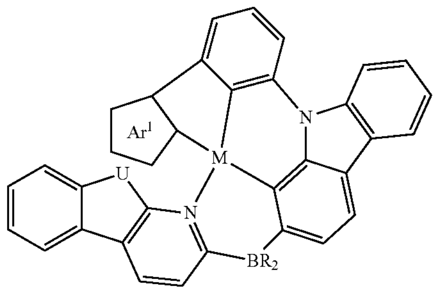
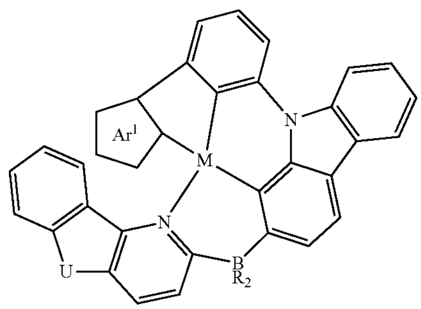
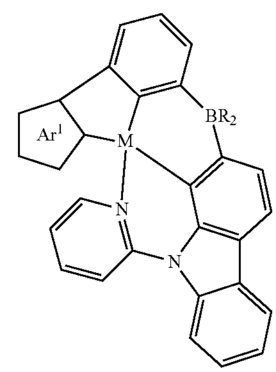
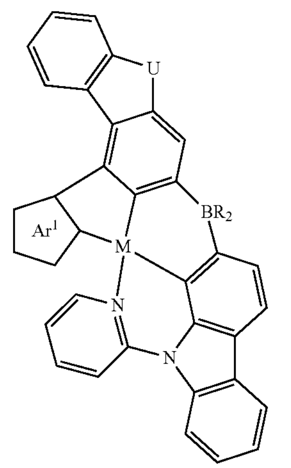
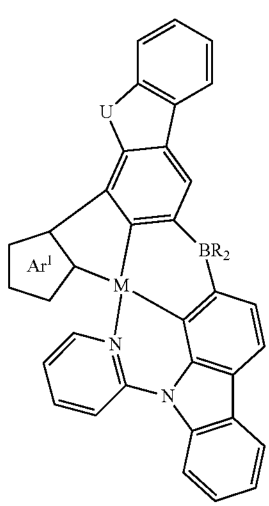
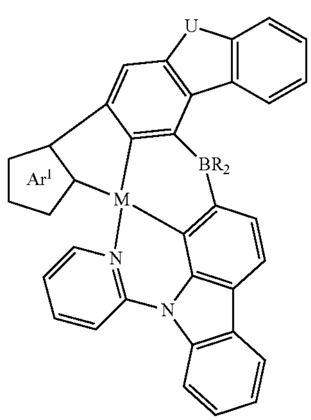
-continued
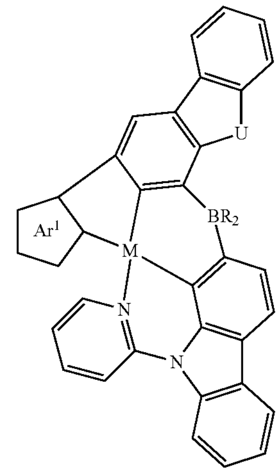
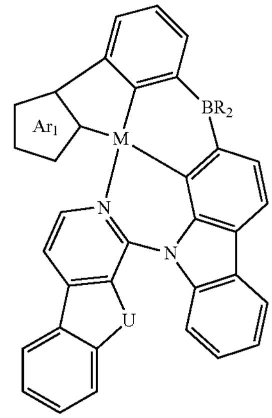
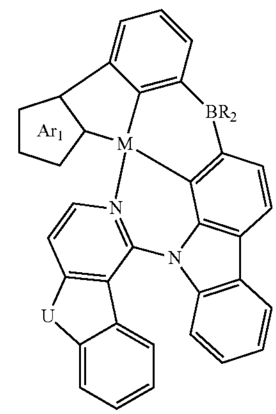
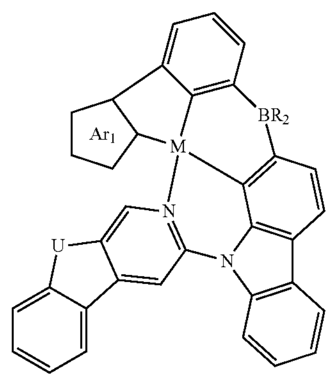
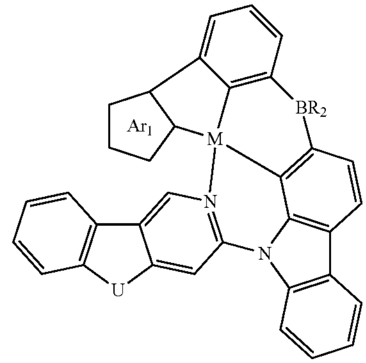

-continued
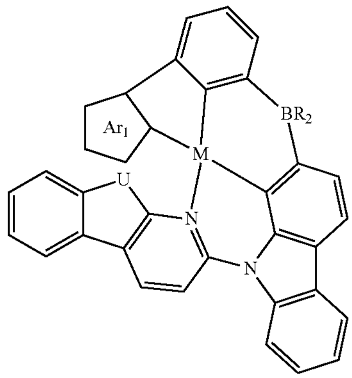
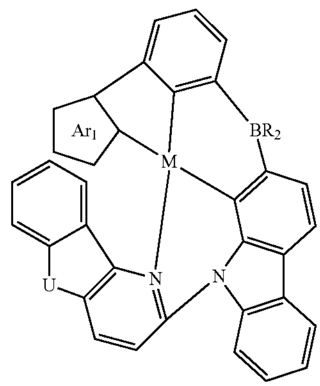
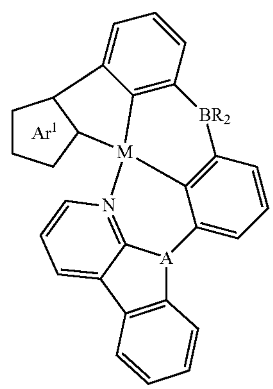
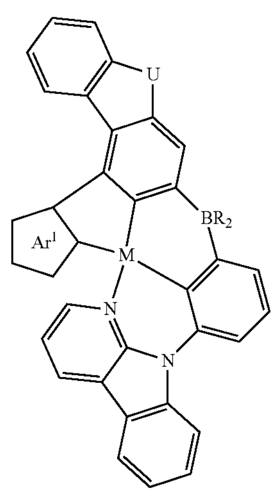
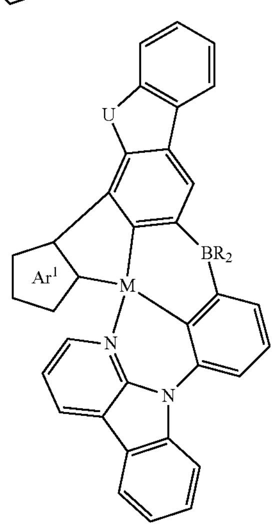
-continued
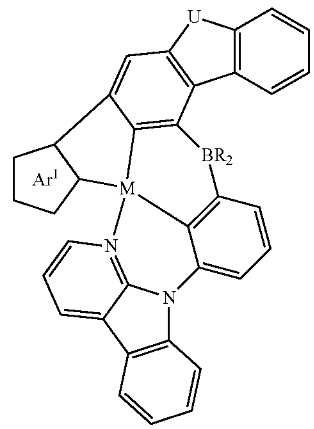
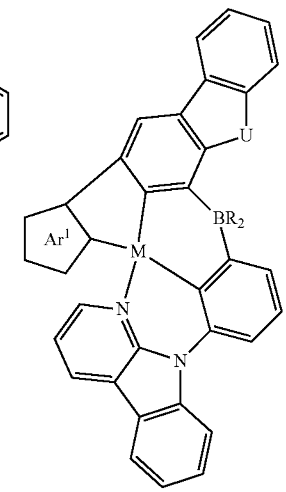
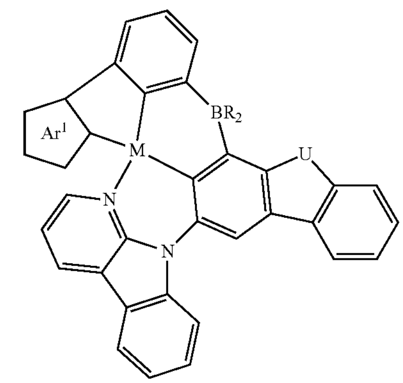
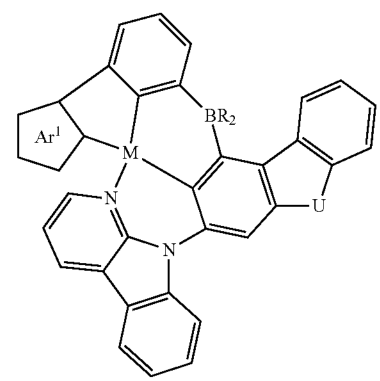
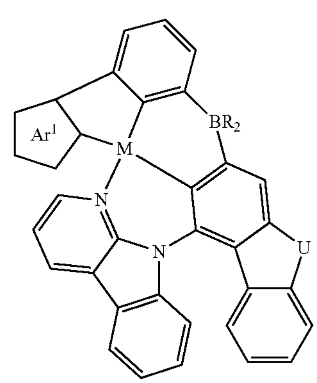

-continued
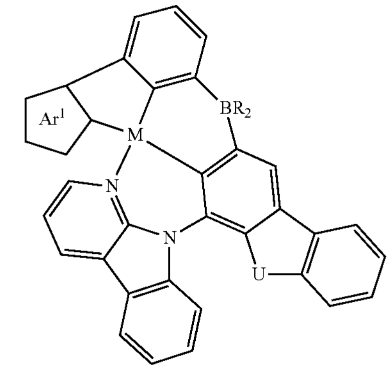
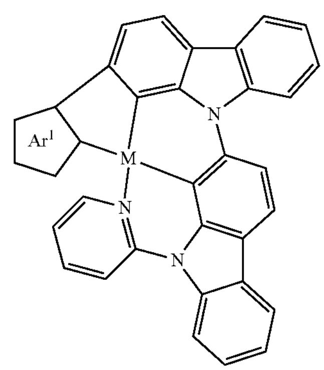
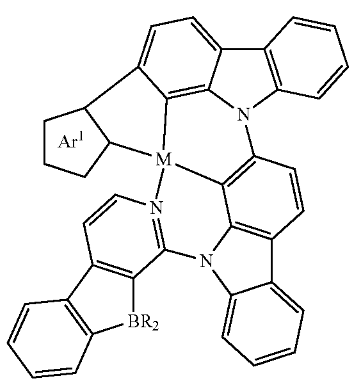
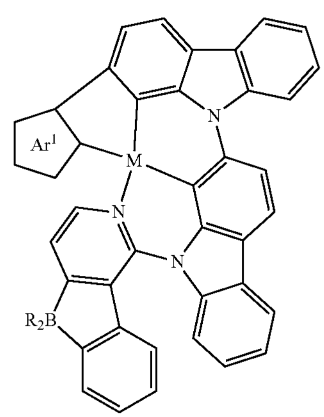
-continued
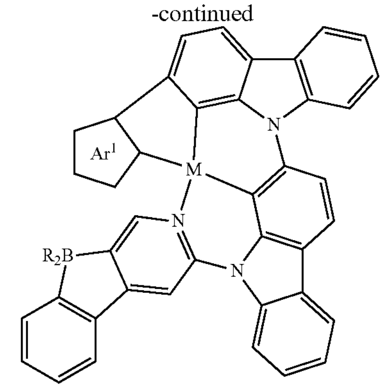
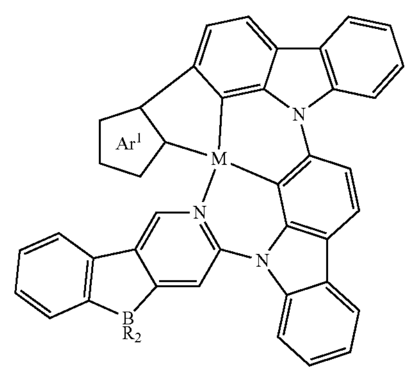
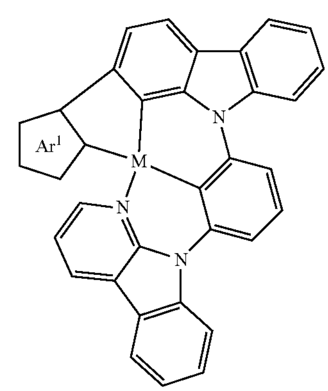
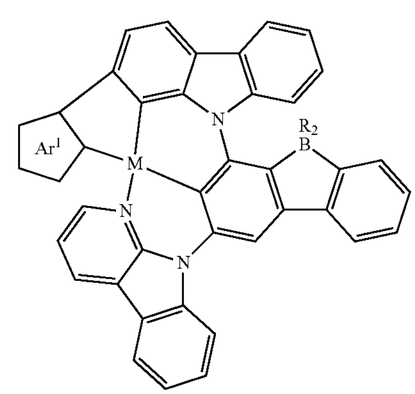

-continued
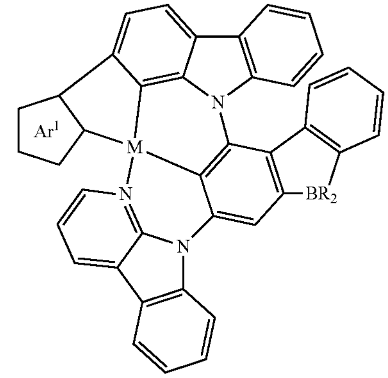
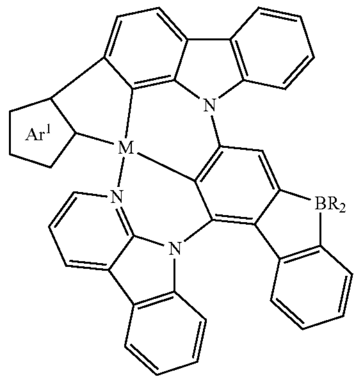
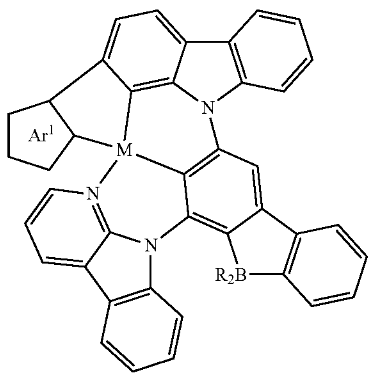
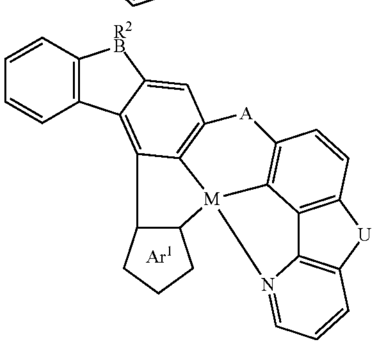
-continued
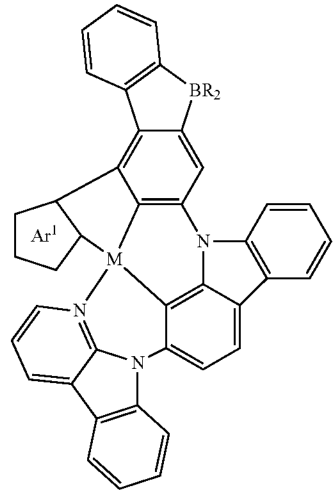
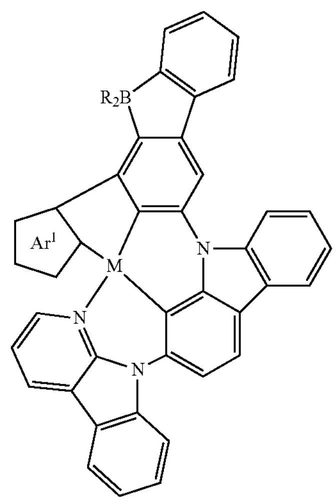
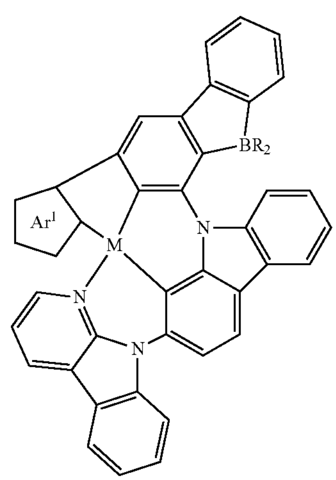

-continued
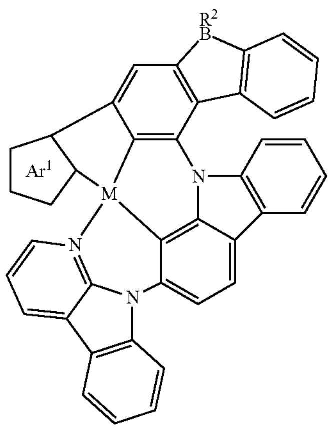
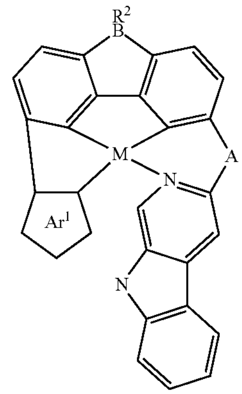
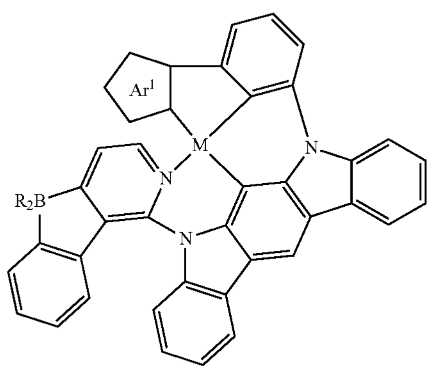
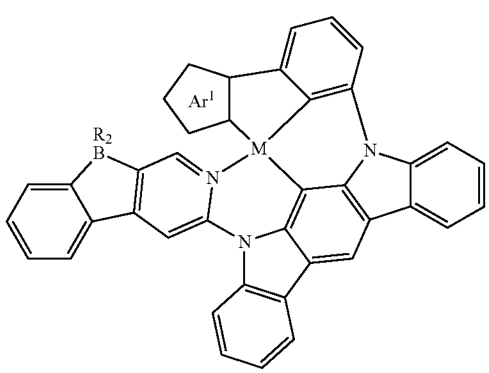
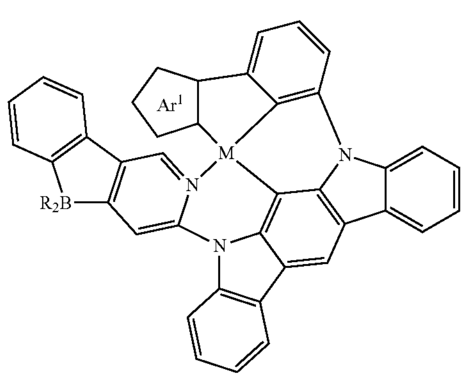
-continued
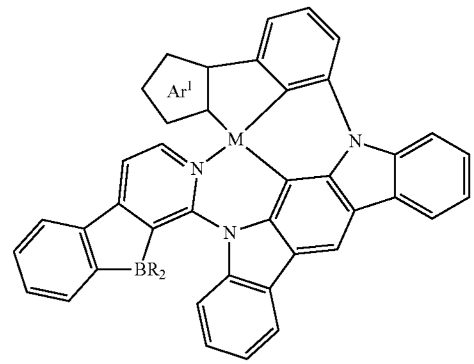
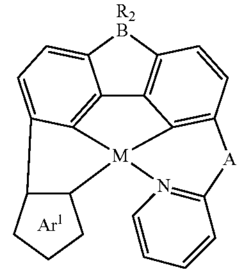
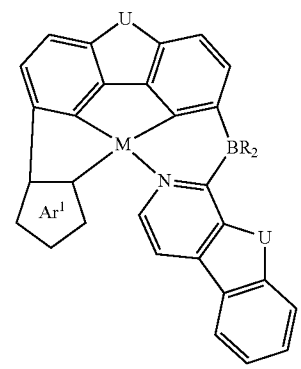
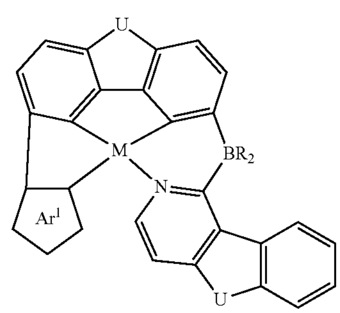
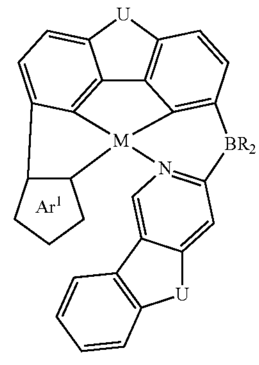
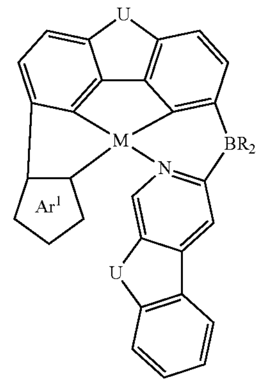

-continued
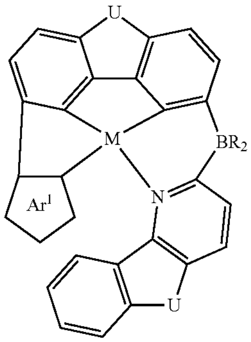
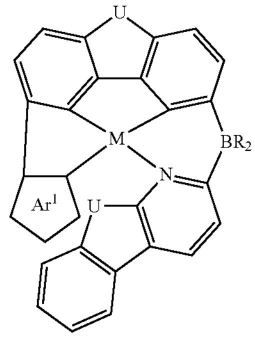
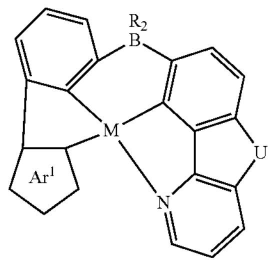
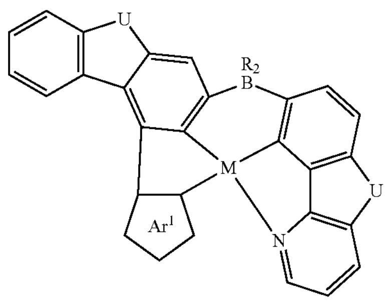
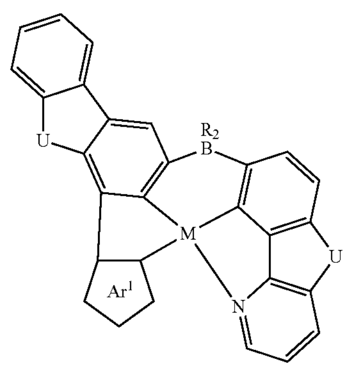
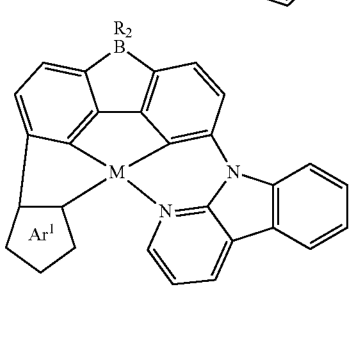
-continued
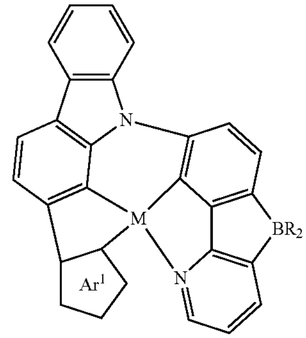
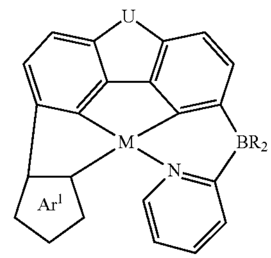
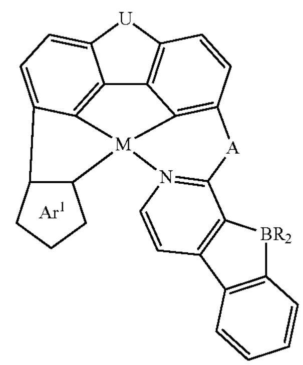
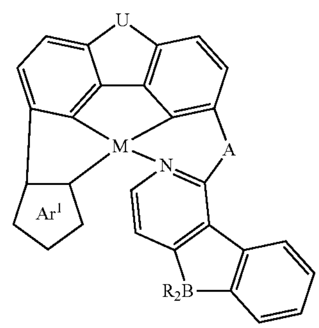
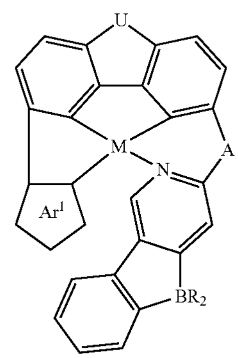
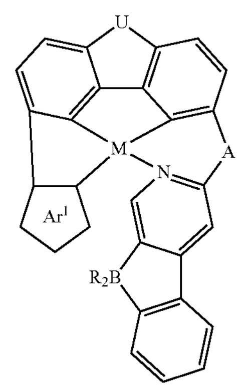
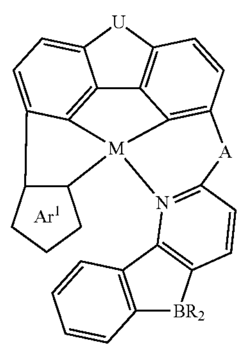

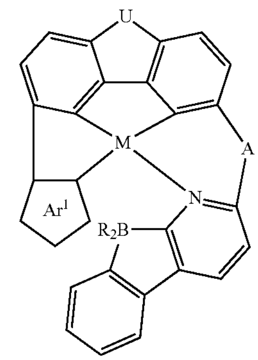
U
M
A
N
Ar1
R2B
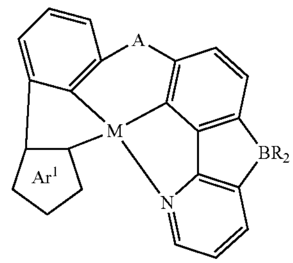
A
M
BR2
N
Ar1
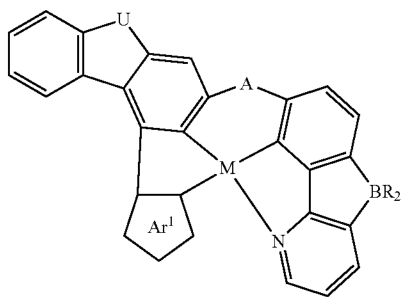
U
A
M
BR2
Ar1
N
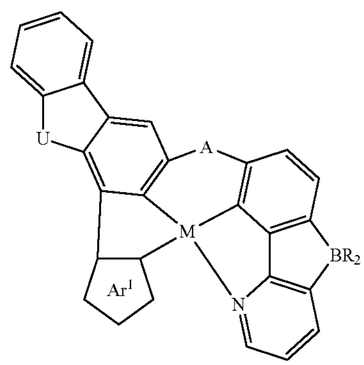
U
A
M
BR2
Ar1
N
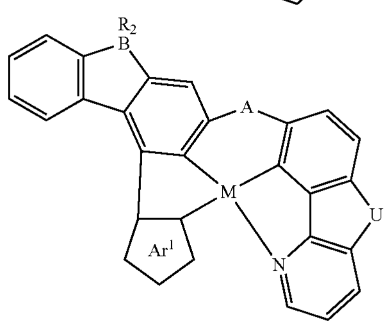
R2
B
A
M
U
Ar1
N
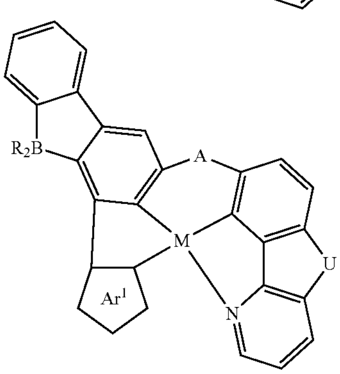
R2B
A
M
U
Ar1
N
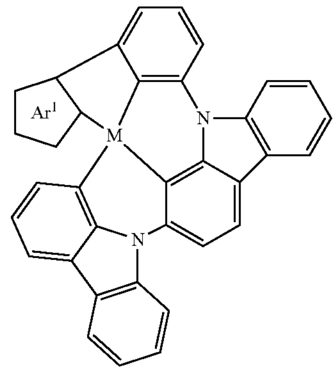
Ar1
M
N
N
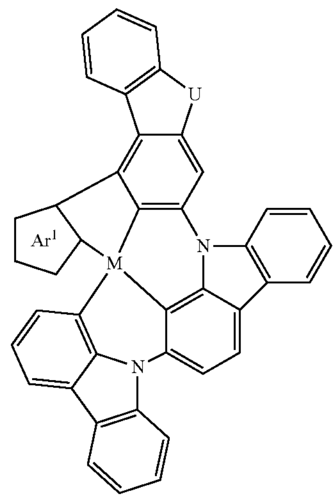
U
Ar1
M
N
N
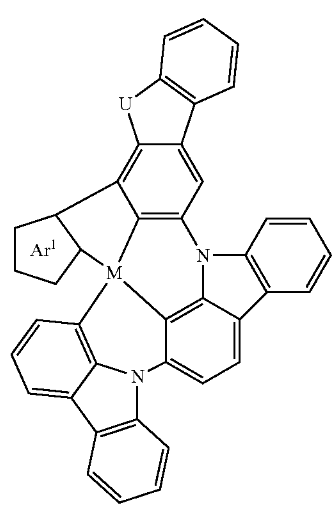
U
Ar1
M
N
N -continued
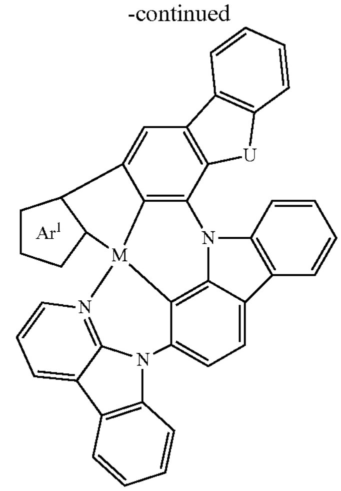
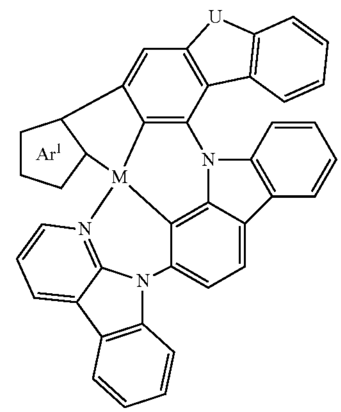
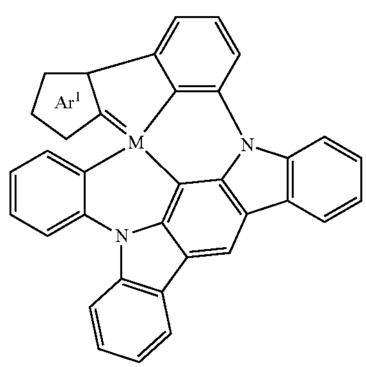
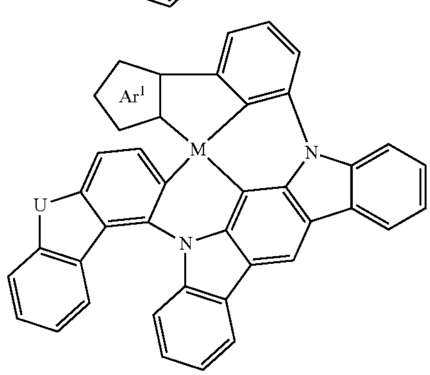
-continued
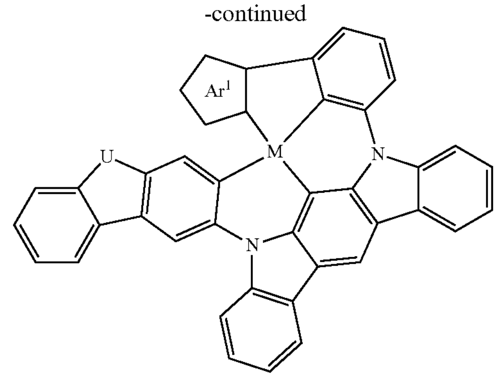
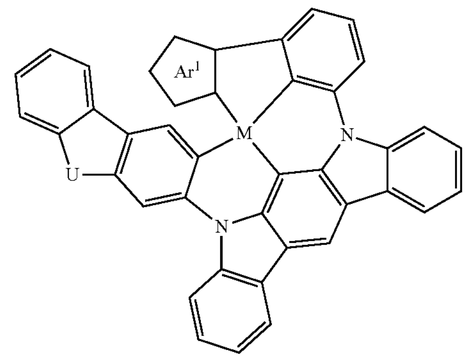
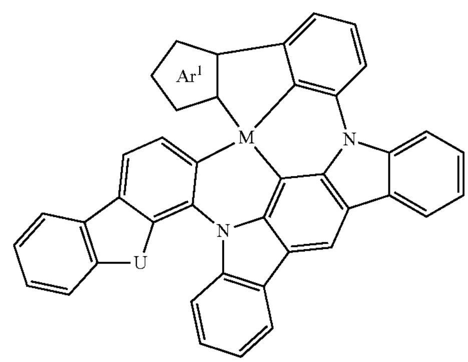
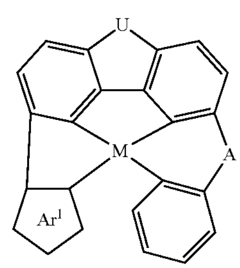
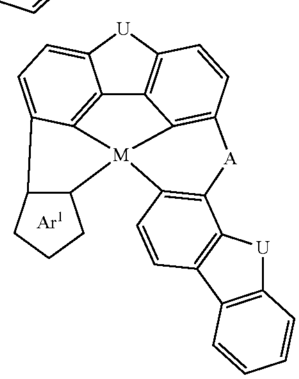
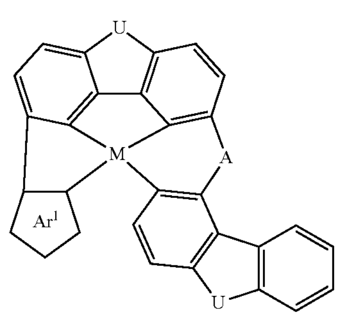

-continued
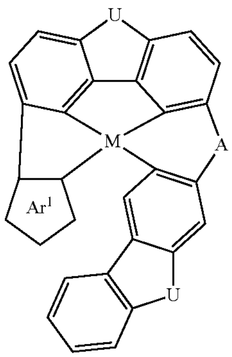
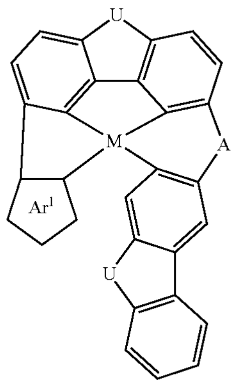
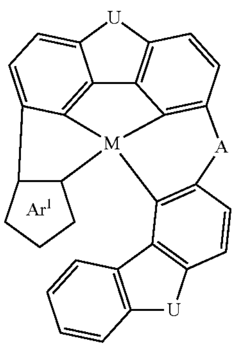
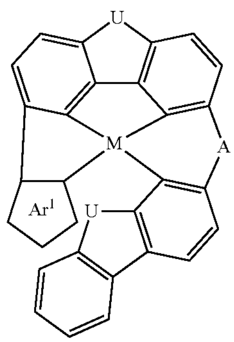
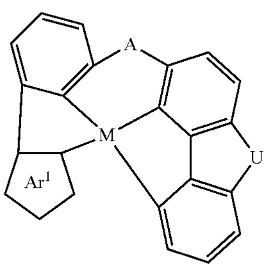
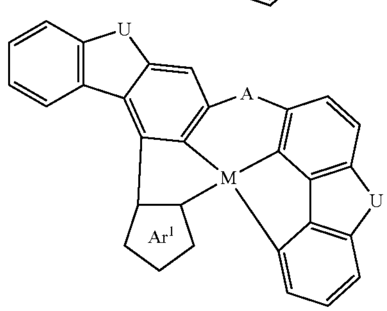
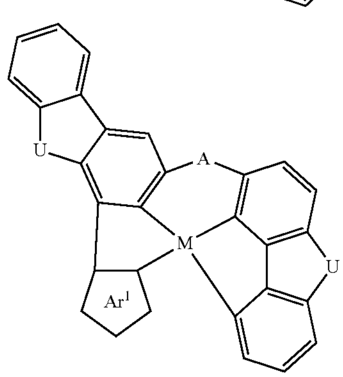
-continued
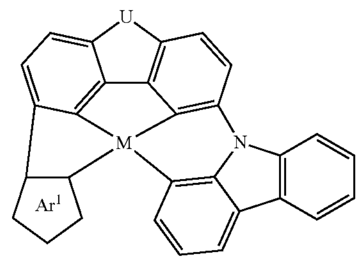
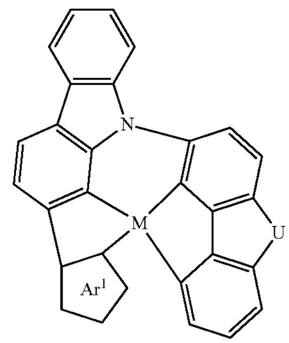
wherein each A independently is O, S, NR, PR, AsR, $CR_2$, $SiR_2$, or BR,
wherein each U independently is O S, NR, PR, AsR, $CR_2$, $SiR_2$, or BR,
wherein M is Au or Ag, and
wherein
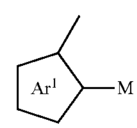
is any one of
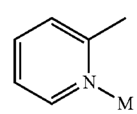
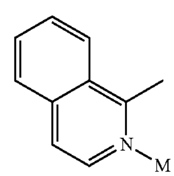
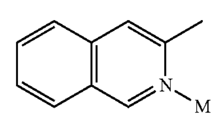
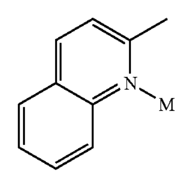
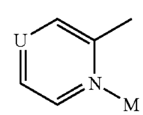
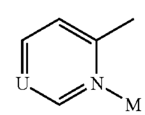
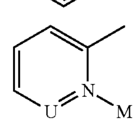
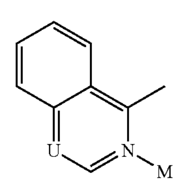
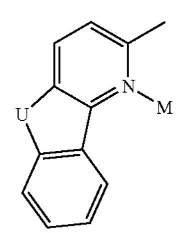

-continued
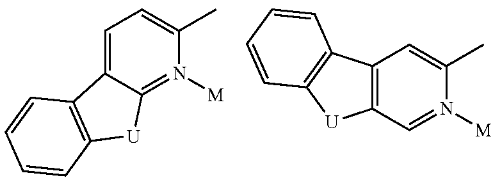
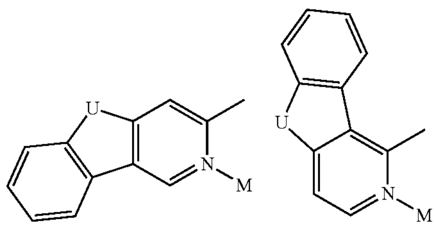
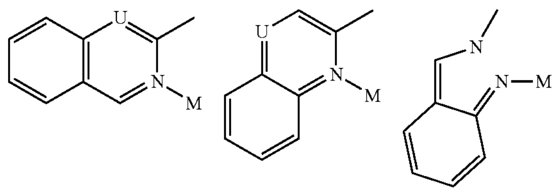
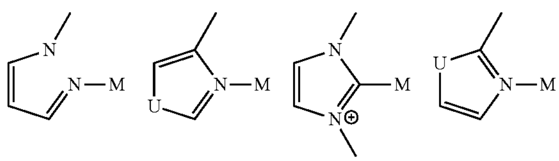
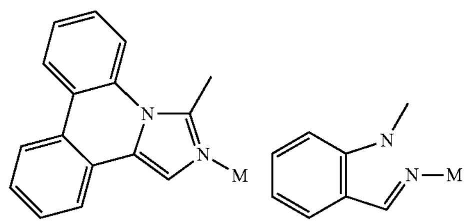
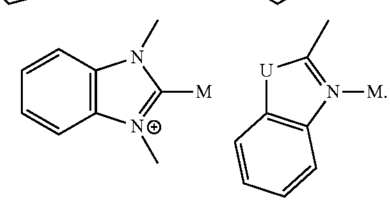
In one aspect, a disclosed complex can have the structure:
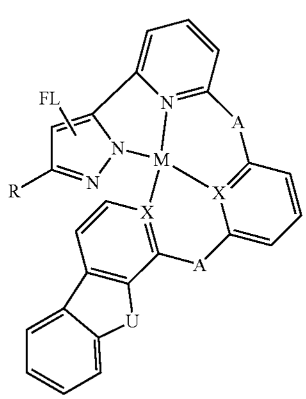
-continued
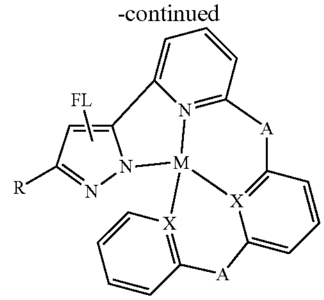
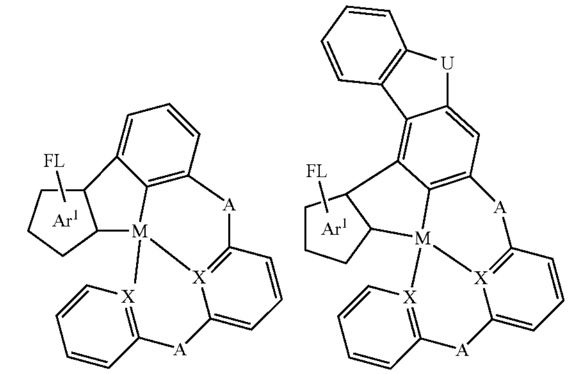
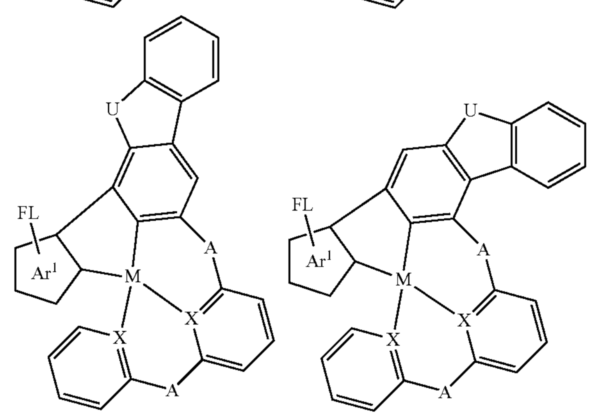
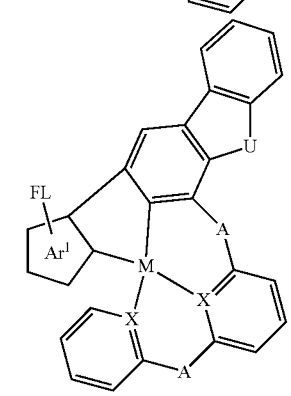
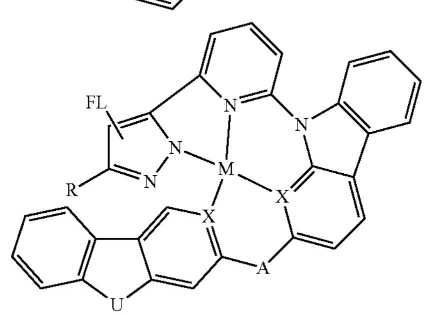

-continued
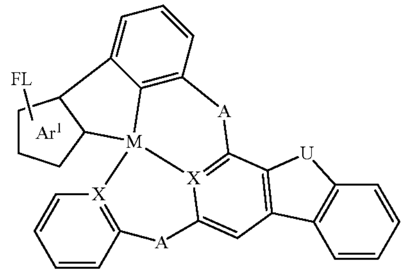
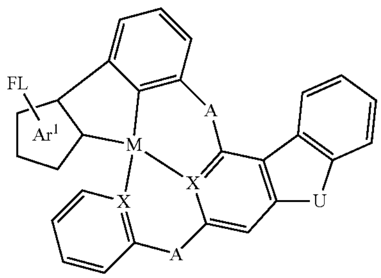
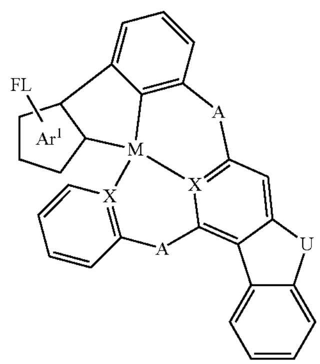
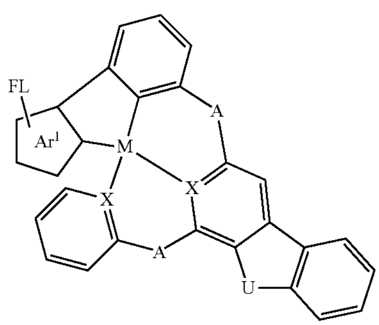
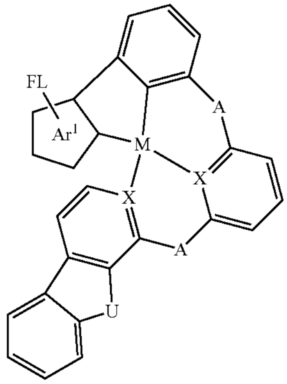
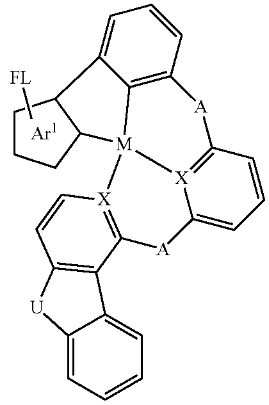
-continued
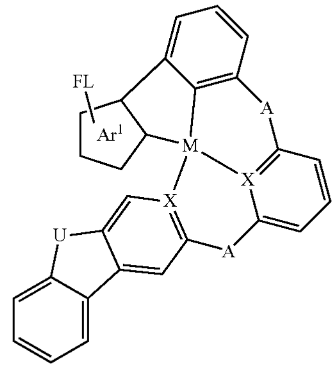
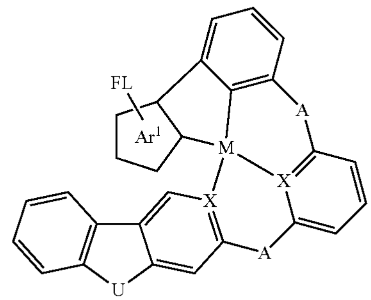
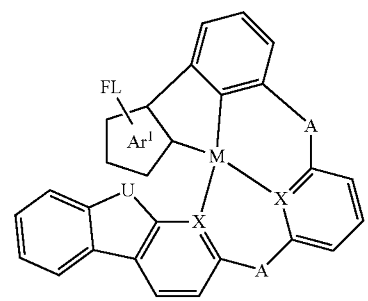
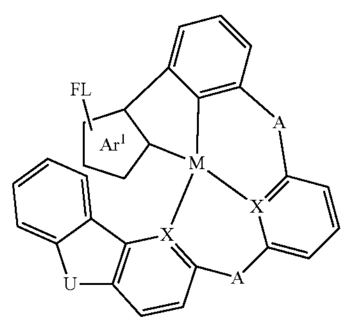
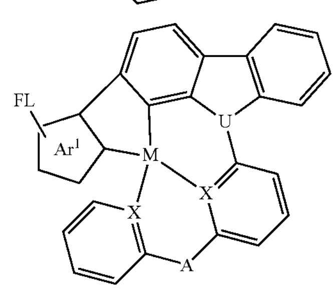

-continued
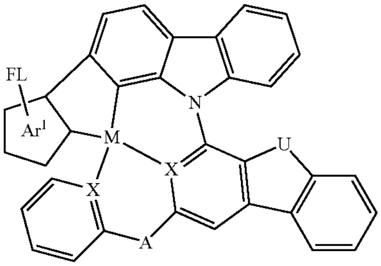
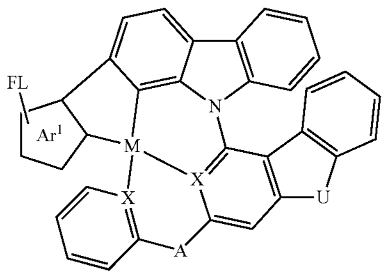
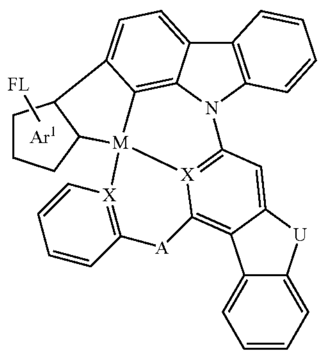
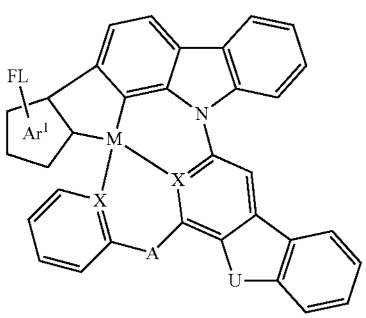
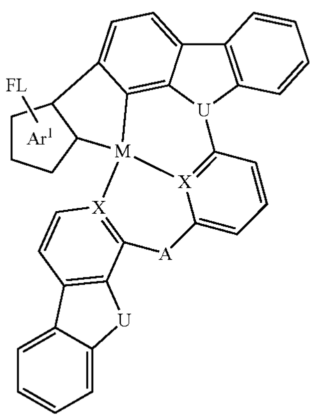
-continued
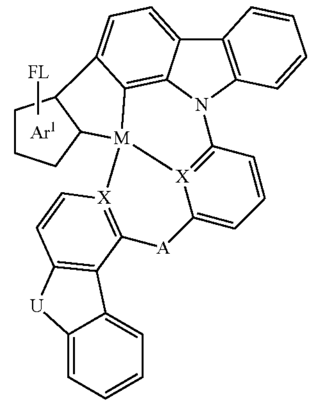
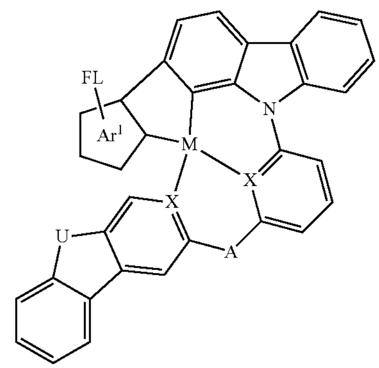
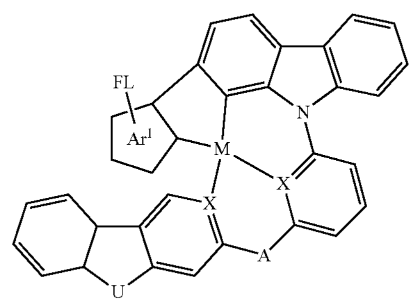
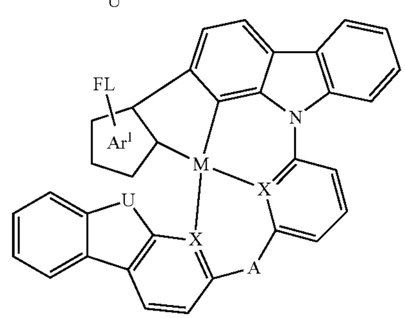
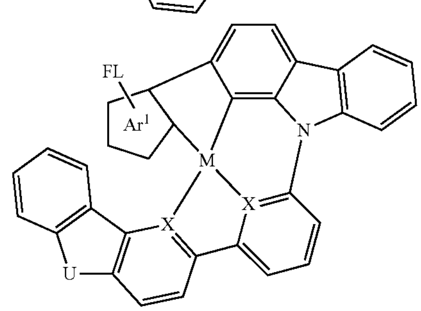

-continued
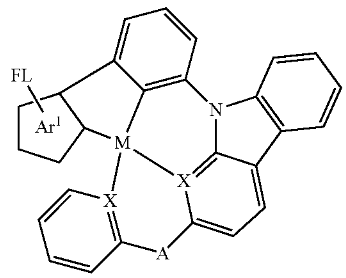
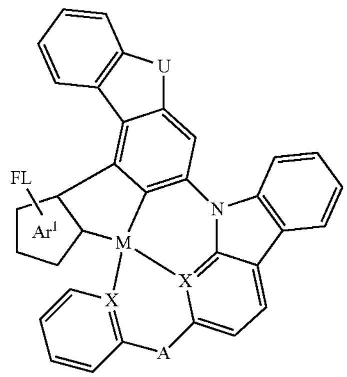
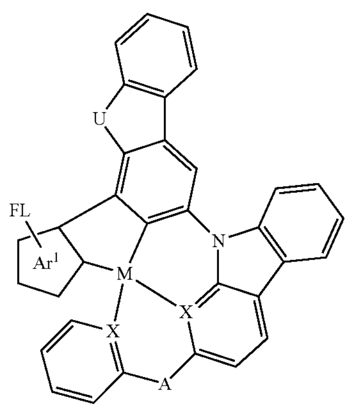
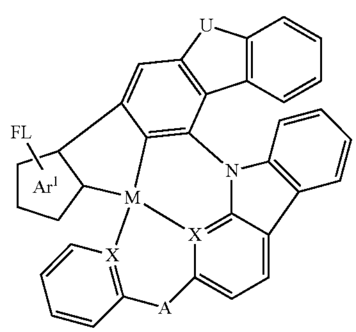
-continued
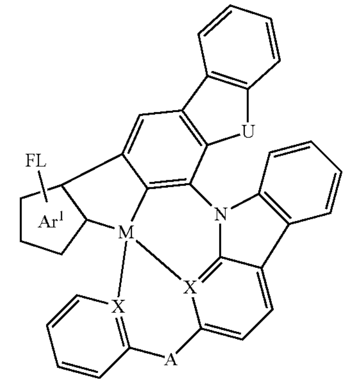
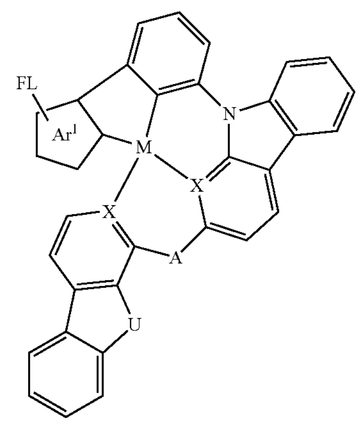
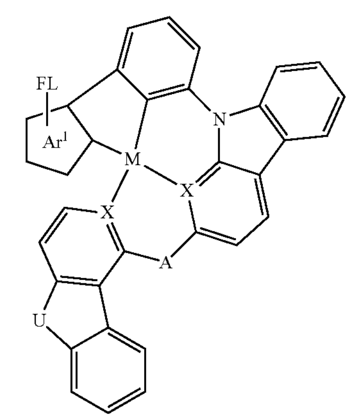
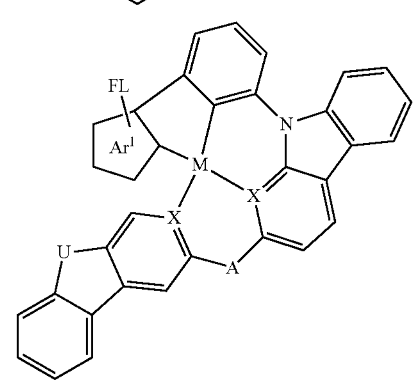

-continued
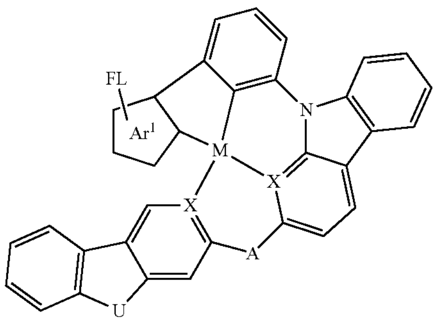
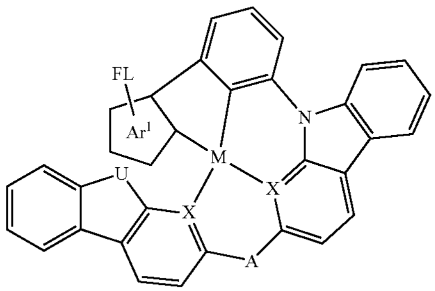
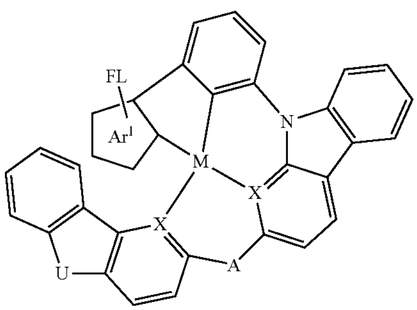
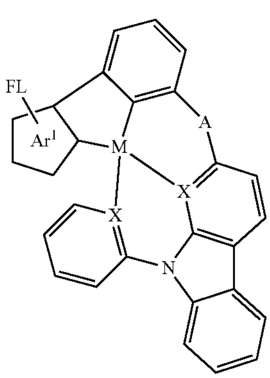
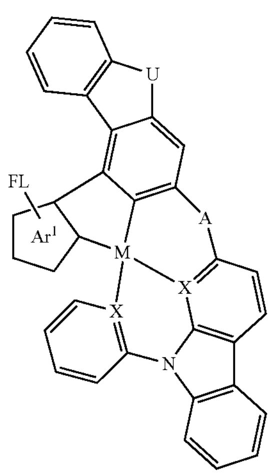
-continued
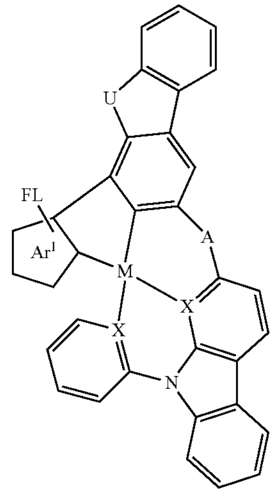
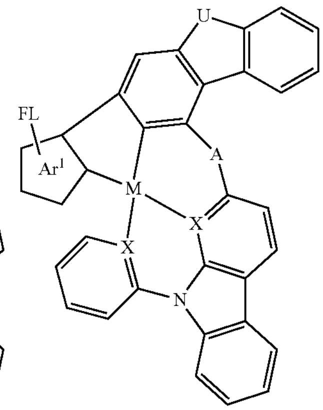
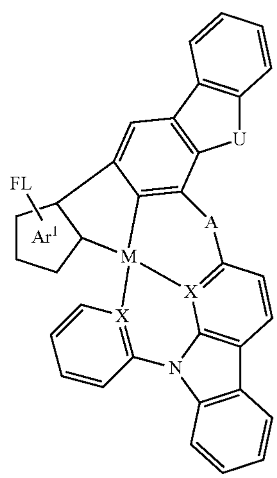
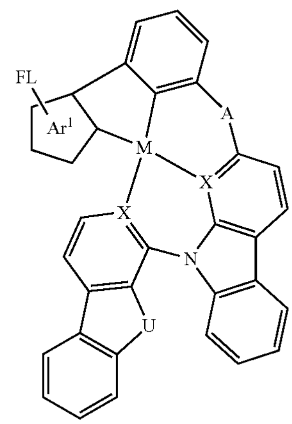
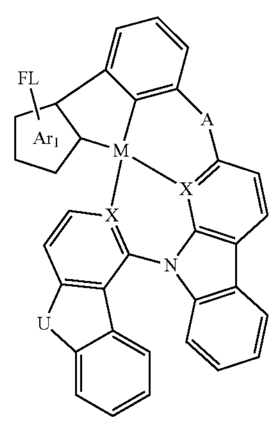

-continued
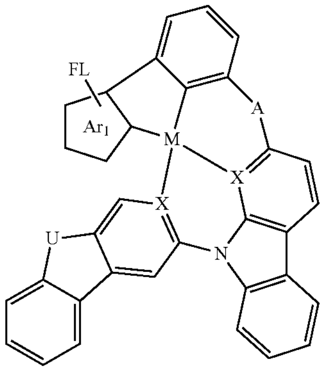
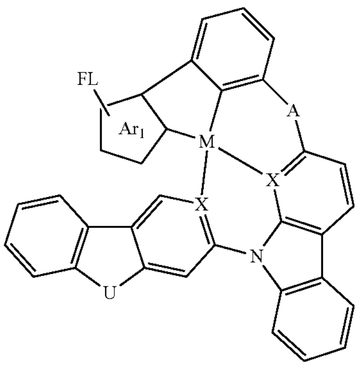
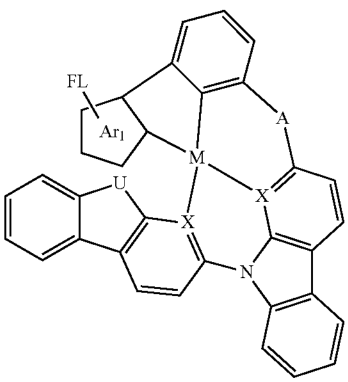
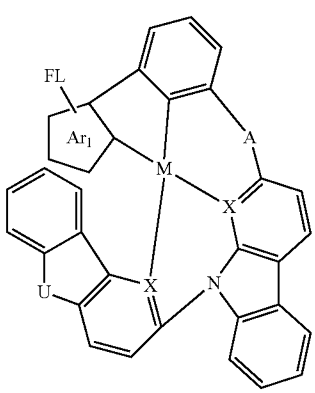
-continued
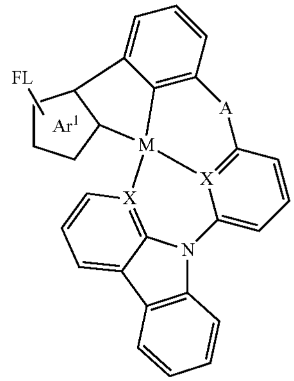
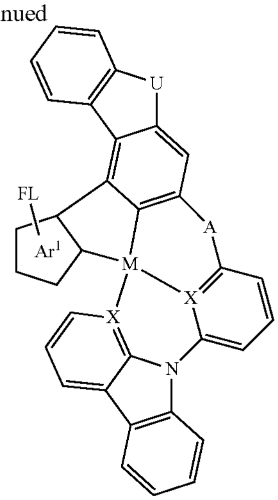
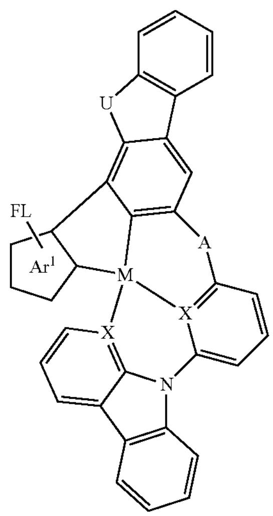
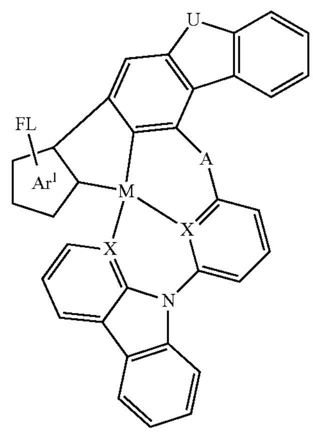
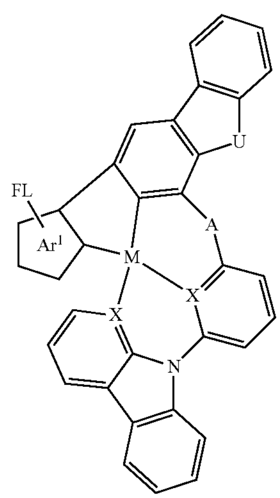

-continued
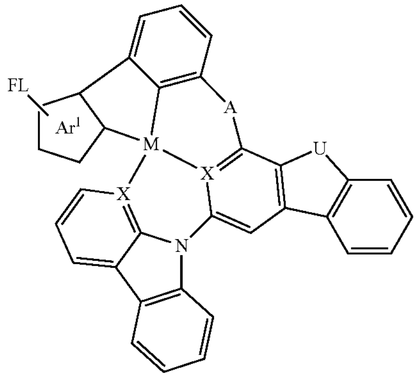
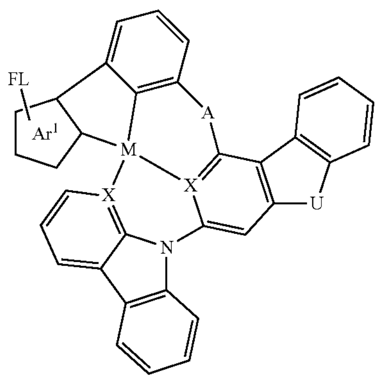
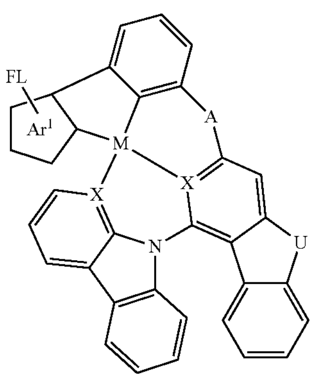
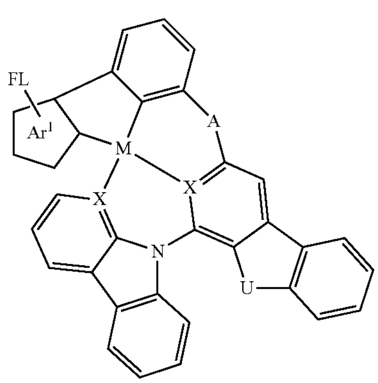
-continued
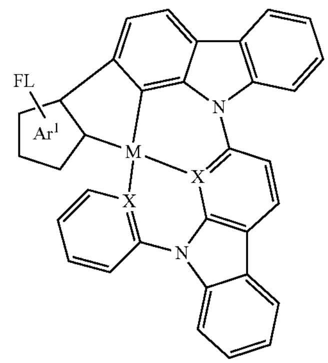
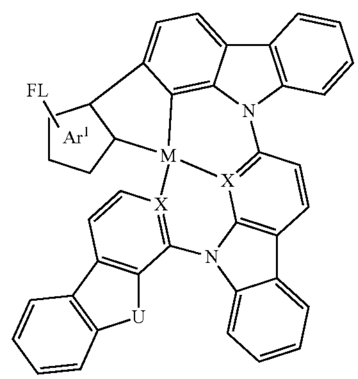
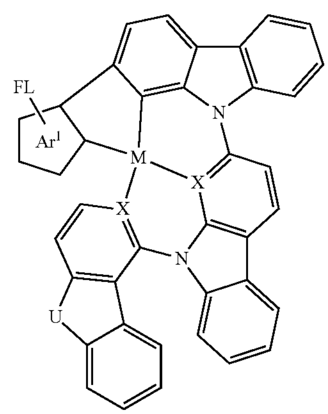
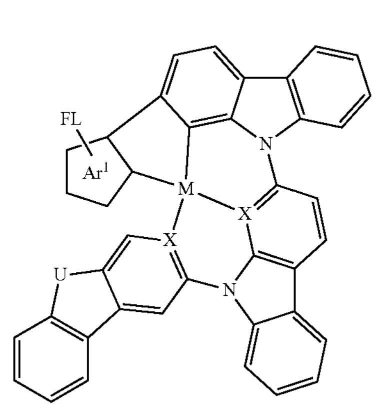

-continued
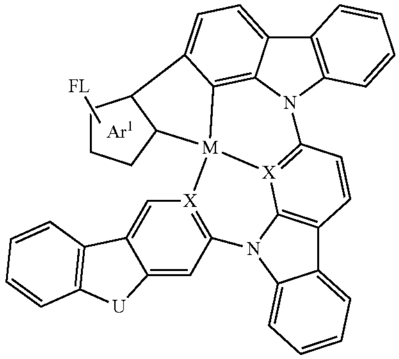
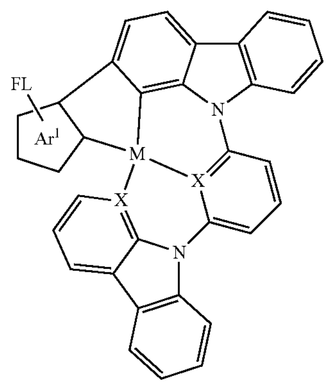
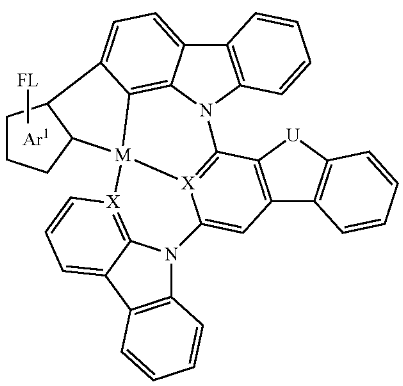
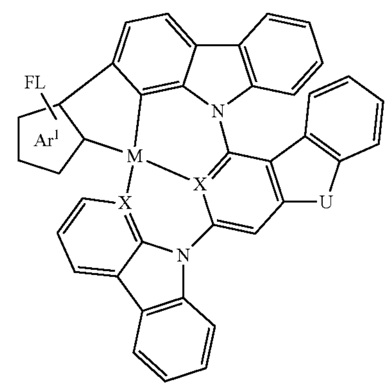
-continued
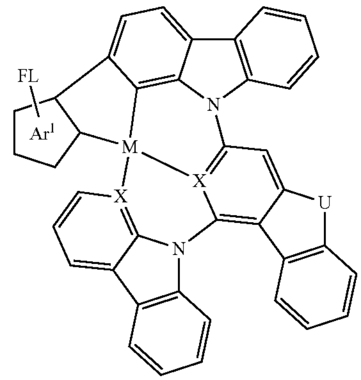
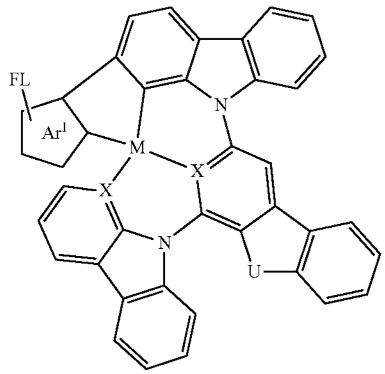
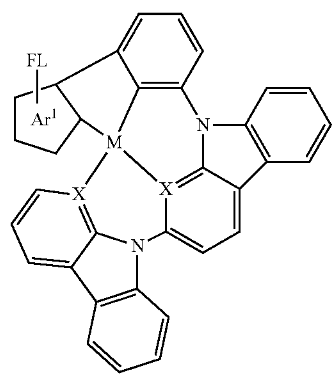
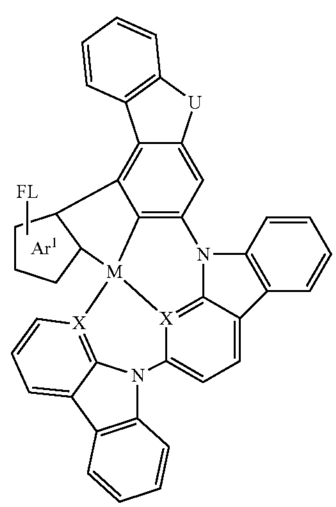

-continued
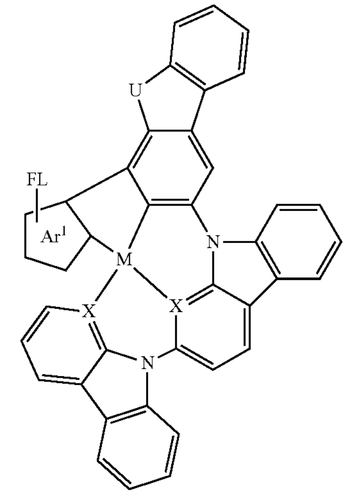
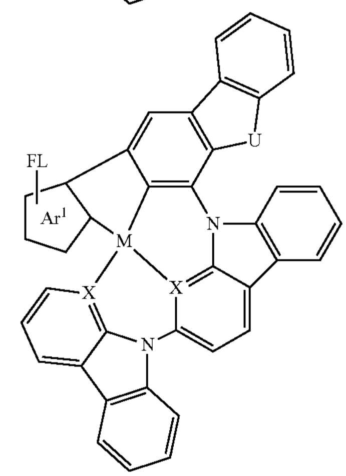
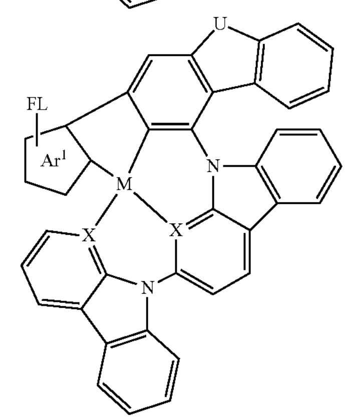
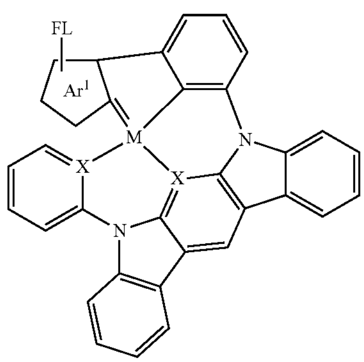
-continued
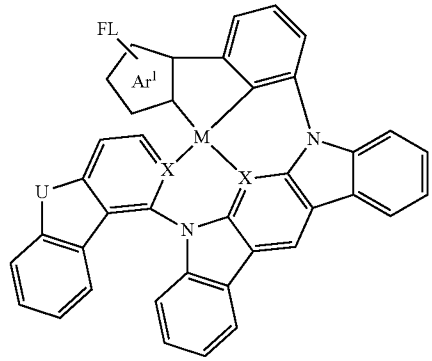
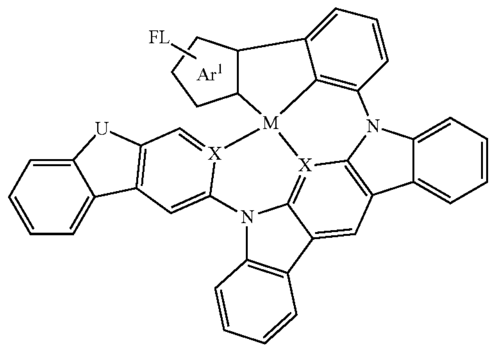
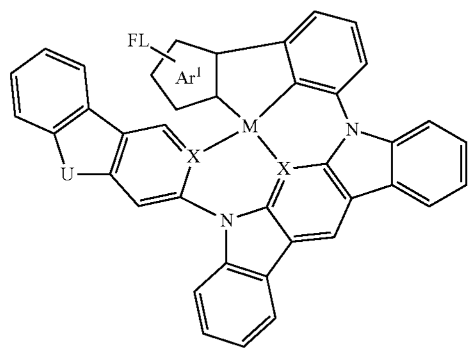
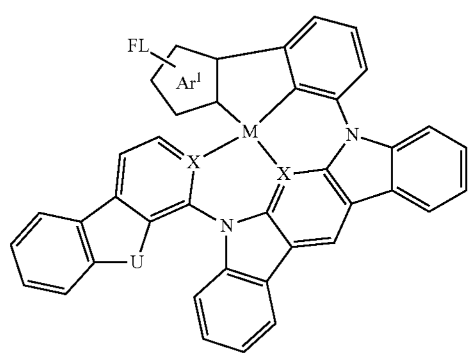

-continued
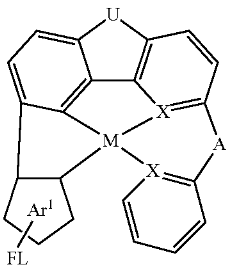
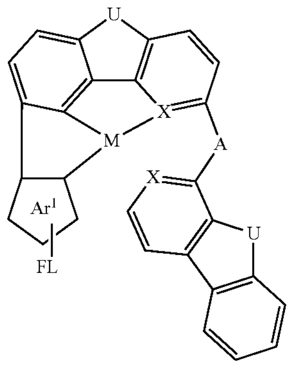
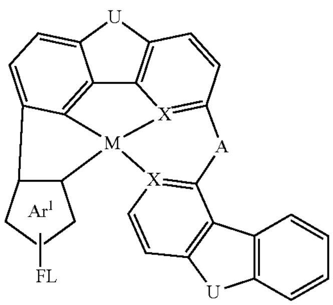
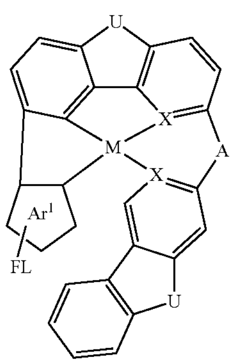
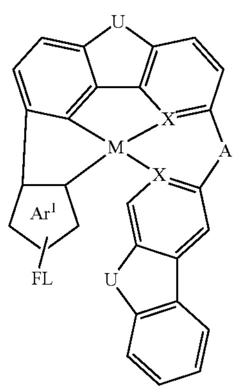
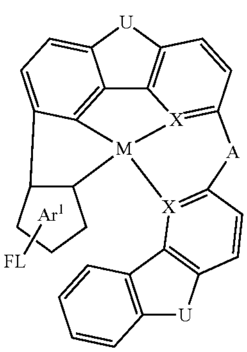
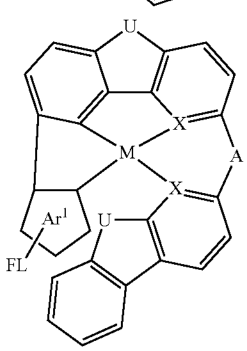
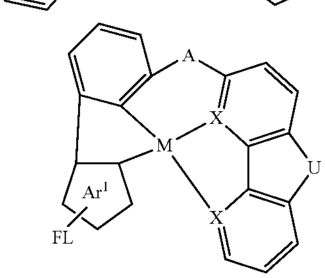
-continued
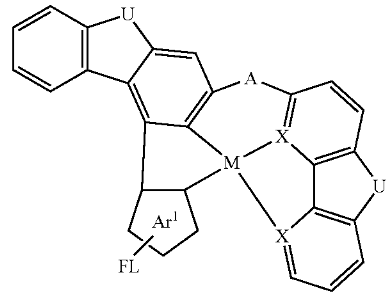
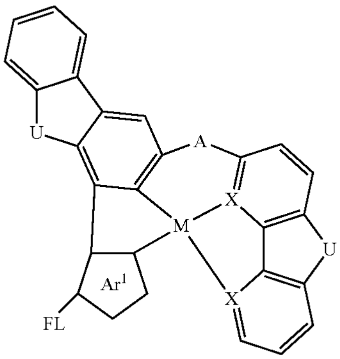
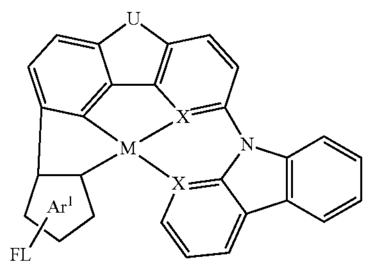
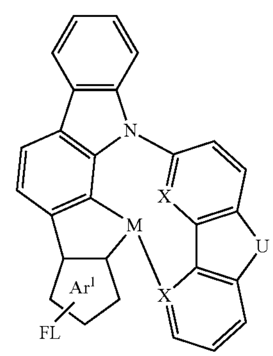
A=O, S, NR, PR, AsR, $CR_2$, $SiR_2$, BR, $BR^2$, etc U═O, S, NR, PR, AsR, $CR_2$, $SiR_2$, BR, etc
X═C, N etc M=Pd, Mn, Ni, Ir, Rh, Cu, Au, Ag
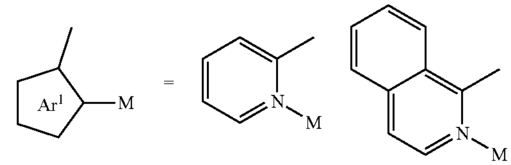

-continued
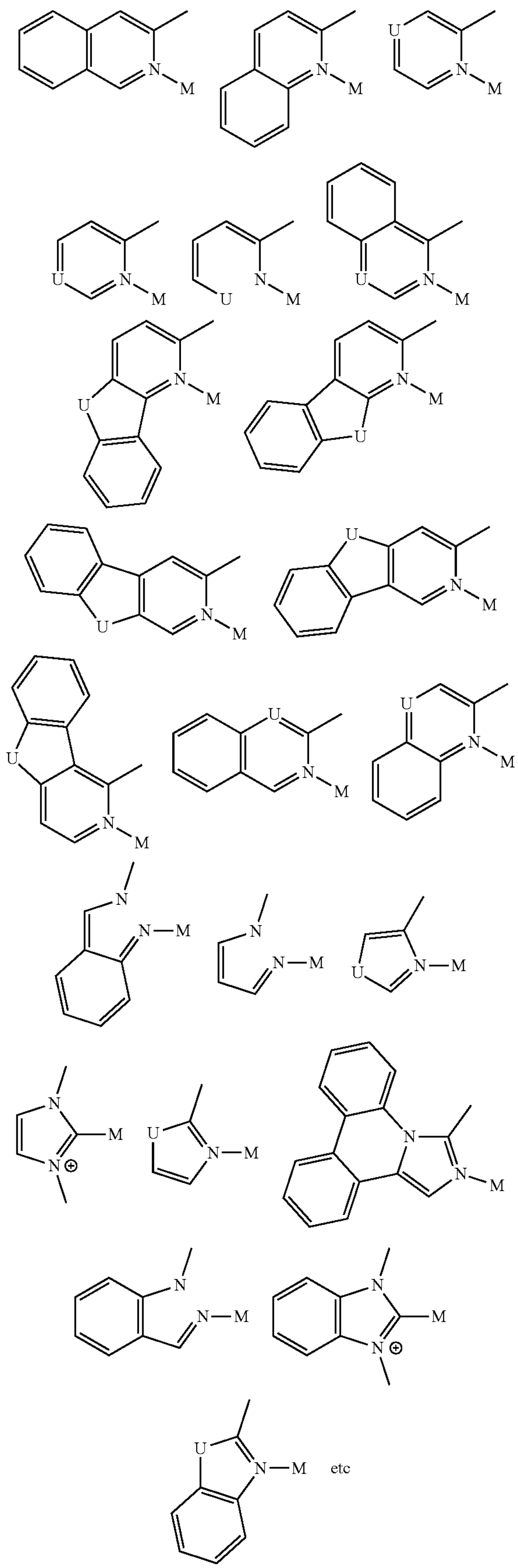
-continued
FL =
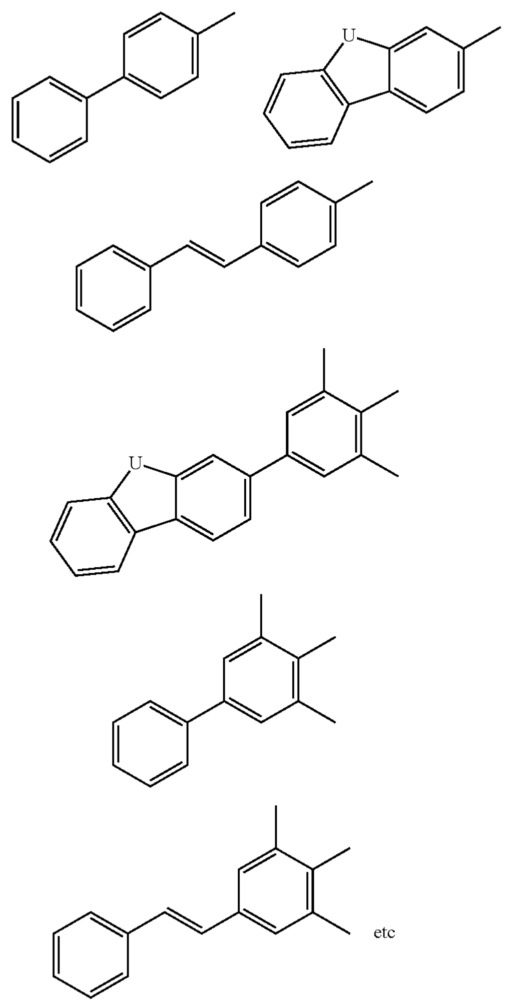
FL groups are convalently bonded to any component of metal complexes including the $Ar^1$ group.
wherein each A independently is O, S, NR, PR, AsR, $CR_2$, $SiR_2$, BR, or $BR^2$,
wherein each U independently is O S, NR, PR, AsR, $CR_2$, $SiR_2$, or BR,
wherein X is C or N,
wherein M is Pd, Mn, Ni, Ir, Rh, Cu, Au, or Ag,
wherein FL is any one of
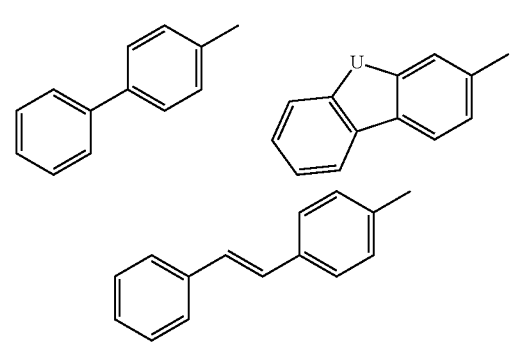

-continued

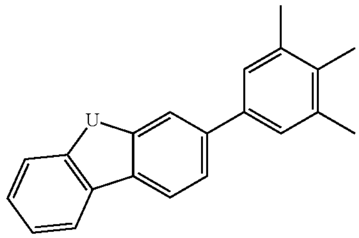

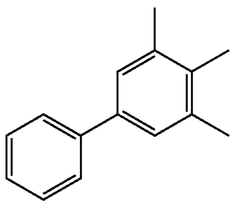

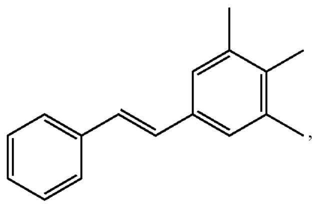

wherein FL is covalently bonded to any component of the complex, for example, the $Ar^1$ group;

wherein

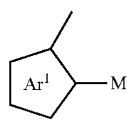

is any one of

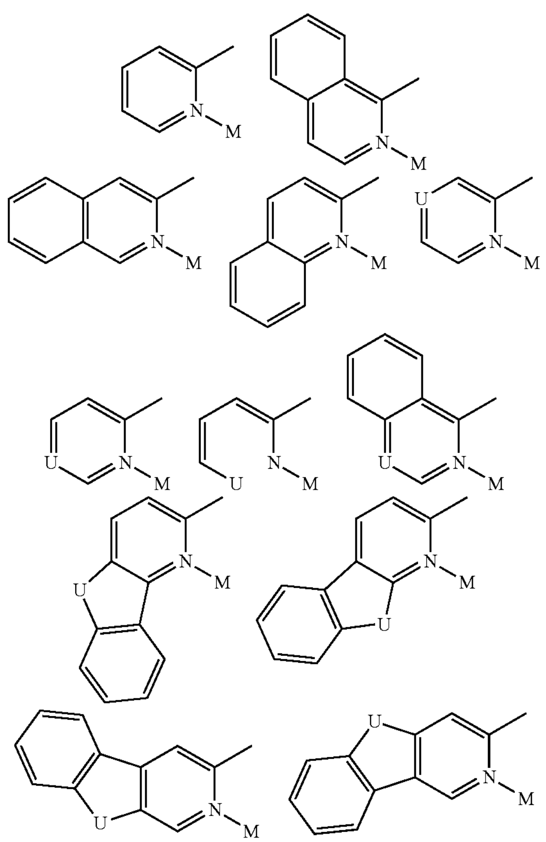

-continued

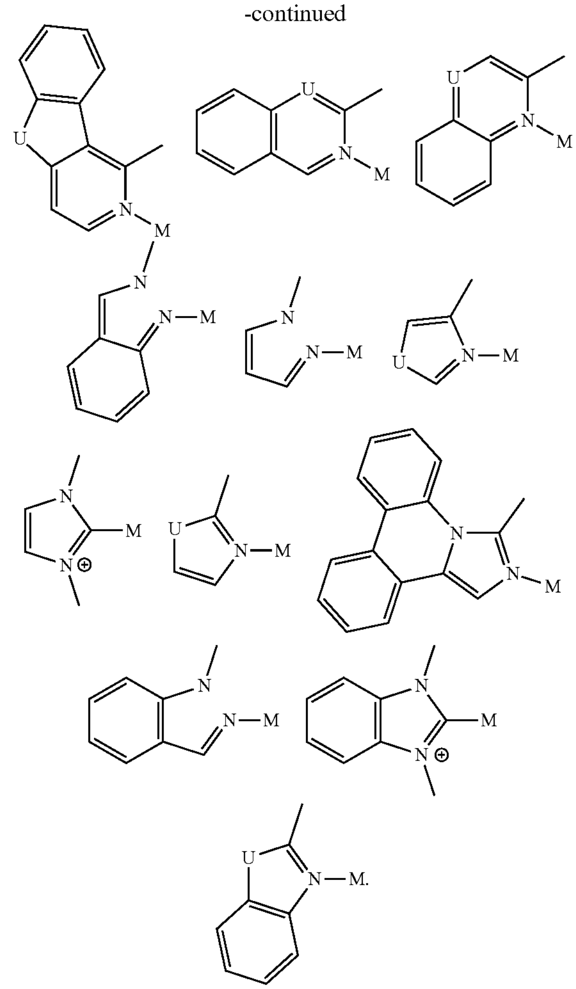

In one aspect, the FL group is covalently bonded to the $Ar^1$ group.

In one aspect, any one or more of the compounds disclosed herein can be excluded from the present invention.

The inventive complexes described herein can be prepared according to methods such as those provide in the Examples or that one of skill in the art, in possession of this disclosure, could readily discern from this disclosure and from methods known in the art.

Devices

Also disclosed herein is a device comprising one or more of the disclosed complexes or compounds. As briefly described above, the present invention is directed to metal complexes. In one aspect, the compositions disclosed here can be used as host materials for OLED applications, such as full color displays.

The organic light emitting diodes with metal-assisted delayed fluorescent emitters can have the potential of harvesting both electrogenerated singlet and triplet excitons and achieving 100% internal quantum efficiency in the device settings. The component of delayed fluorescence process will occurred at a higher energy than that of phosphorescence process, which can provide a blue-shifted emission spectrum than those originated exclusively from the lowest triplet excited state of metal complexes. On the other hand, the existence of metal ions (especially the heavy metal ions) will facilitate the phosphorescent emission inside of the emitters, ensuring a high emission quantum efficiency.

The energy of the singlet excited states of metal-assisted delayed fluorescent emitters can be adjusted separately from the lowest triplet excited by ether modifying the energy of donor-accepter ligands or attaching fluorescent emitters which are covalently bonded to metal complexes without having effective conjugation between fluorescent emitters and metal complexes.

The inventive compositions of the present disclosure can be useful in a wide variety of applications, such as, for example, lighting devices. In a particular aspect, one or more of the complexes can be useful as host materials for an organic light emitting display device.

The compounds of the invention are useful in a variety of applications. As light emitting materials, the compounds can be useful in organic light emitting diodes (OLED)s, luminescent devices and displays, and other light emitting devices.

The energy profile of the compounds can be tuned by varying the structure of the ligand surrounding the metal center. For example, compounds having a ligand with electron withdrawing substituents will generally exhibit different properties, than compounds having a ligand with electron donating substituents. Generally, a chemical structural change affects the electronic structure of the compound, which thereby affects the electrical transport and transfer functions of the material. Thus, the compounds of the present invention can be tailored or tuned to a specific application that desires an energy or transport characteristic.

In another aspect, the inventive compositions can provide improved efficiency and/or operational lifetimes in lighting devices, such as, for example, organic light emitting devices, as compared to conventional materials.

In other various aspects, the inventive compositions can be useful as, for example, host materials for organic light emitting diodes, lighting applications, and combinations thereof.

In one aspect, the compound in the device is selected to have 100% internal quantum efficiency in the device settings.

In one aspect, the device is an organic light emitting diode. In another aspect, the device is a full color display. In yet another aspect, the device is an organic solid state lighting In one embodiment, the compounds can be used in an OLED. FIG. 1 shows a cross-sectional view of an OLED 100, which includes substrate 102 with an anode 104, which is typically a transparent material, such as indium tin oxide, a layer of hole-transporting material(s) (HTL) 106, a layer of light processing material 108, such as an emissive material (EML) including an emitter and a host, a layer of electron-transporting material(s) (ETL) 110, and a metal cathode layer 112.

In one aspect, a light emitting device, such as, for example, an OLED, can comprise one or more layers. In various aspects, any of the one or more layers can comprise indium tin oxide (ITO), poly(3,4-ethylenedioxythiophene) (PEDOT), polystyrene sulfonate (PSS), N,N'-di-1-naphthyl-N,N'-diphenyl-1,1'-biphenyl-4,4'diamine (NPD), 1,1-bis((di-4-tolylamino)phenyl) cyclohexane (TAPC), 2,6-Bis(N-carbazolyl)pyridine (mCpy), 2,8-bis(diphenylphosphoryl) dibenzothiophene (PO15), LiF, Al, or a combination thereof. In another aspect, any of the one or more layers can comprise a material not specifically recited herein.

In this embodiment, the layer of light processing material 108 can comprise one or more compounds of the present invention optionally together with a host material. The host material can be any suitable host material known in the art. The emission color of an OLED is determined by the emission energy (optical energy gap) of the light processing material 108, which as discussed above can be tuned by tuning the electronic structure of the emitting compounds and/or the host material. Both the hole-transporting material in the HTL layer 106 and the electron-transporting material(s) in the ETL layer 110 can comprise any suitable hole-transporter known in the art. A selection of which is well within the purview of those skilled in the art.

It will be apparent that the compounds of the present invention can, in various aspects, exhibit phosphorescence. Phosphorescent OLEDs (i.e., OLEDs with phosphorescent emitters) typically have higher device efficiencies than other OLEDs, such as fluorescent OLEDs. Light emitting devices based on electrophosphorescent emitters are described in more detail in WO2000/070655 to Baldo et al., which is incorporated herein by this reference for its teaching of OLEDs, and in particular phosphorescent OLEDs.

The compounds of the invention can be made using a variety of methods, including, but not limited to those recited in the examples provided herein. In other aspects, one of skill in the art, in possession of this disclosure, could readily determine an appropriate method for the preparation of an iridium complex as recited herein.

EXAMPLES

The following examples are put forth so as to provide those of ordinary skill in the art with a complete disclosure and description of how the compounds, compositions, articles, devices and/or methods claimed herein are made and evaluated, and are intended to be purely exemplary of the invention and are not intended to limit the scope of what the inventors regard as their invention. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

Hereinafter, the preparation method of the compounds for the displays and lighting applications will be illustrated. However, the following embodiments are only exemplary and do not limit the scope of the present invention. Temperatures, catalysts, concentrations, reactant compositions, and other process conditions can vary, and one of skill in the art, in possession of this disclosure, could readily select appropriate reactants and conditions for a desired complex.

In one aspect, a PdN3N complex can be prepared based on the following examples.

Example 1: Synthesis of 4'-bromo-2-nitrobiphenyl

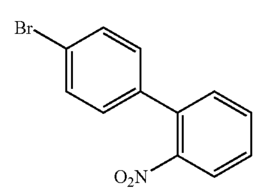 [SMILES: O=[N+]([O-])c1ccccc1-c1ccc(Br)cc1]

Under a nitrogen atmosphere, 20 mL of water was heated to 60° C. and 125 mmol of 2-nitrobyphenyl was added and stirred for 30 minutes before 6.3 mmol of iron trichloride was added and stirred for 30 minutes further. 140 mmol was added drop wise over 40 minutes and allowed to stir overnight before setting to reflux for 4 hours. After cooling, residual bromine was removed by washing with a sodium bisulfate solution. The organic residue was then washed with concentrated sodium hydroxide, and then twice with water. The organic portion was separated and dissolved in dichloromethane before being dried with magnesium sulfate. The solution was concentrated under reduced pressure, subjected to flash column chromatography of silica with dichloromethane as the eluent, and concentrated again under reduced pressure. 4'-bromo-2-nitrobiphenyl was collected by recrystallization from methanol in 50% yield.

Example 2: Synthesis of 2-bromo-9H-carbazole

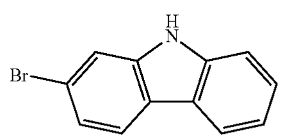 [SMILES: Brc1ccc2c(c1)[nH]c1ccccc12]

Under a nitrogen atmosphere, 100 mmol of 4'-bromo-2-nitrobiphenyl was set to reflux overnight in stirring tirethylphosphite. After cooling, the triethylphosphite was distilled off and 2-bromo-9H-carbazole was isolated by recrystallization from methanol and further purified by train sublimation, resulting in a 65% yield.

Example 3: Synthesis of 2-bromo-9-(pyridin-2-yl)-9H-carbazole

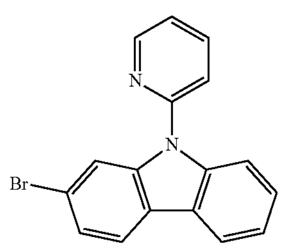 [SMILES: Brc1ccc2c3ccccc3n(-c3ccccn3)c2c1]

Under a nitrogen atmosphere, 10 mmol of 2-bromo-9H-carbazole, 10 mmol of 2-bromopyridine, 1 mmol of copper (I)iodide, 25 mmol of potassium carbonate, and 2 mmol of L-proline were combined in stirring degassed dimethyl sulfoxide. The mixture was heated to 90° C. for 3 days before being cooled and separated between dichloromethane and water. The water layer was washed twice with dichloromethane and the organics were combined and washed once with brine. The organic fraction was dried with magnesium sulfate and concentrated under reduced pressure and subjected to column chromatography of silica with dichloromethane as the eluent. After concentrating under reduced pressure, 2-bromo-9-(pyridin-2-yl)-9H-carbazole was isolated in a 70% yield.

Example 4: Synthesis of 2-[4-(2-nitrophenyl)phenyl]pyridine

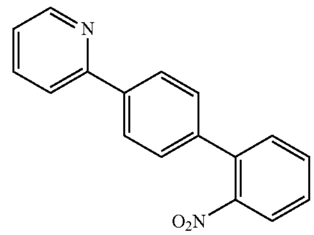 [SMILES: O=[N+]([O-])c1ccccc1-c1ccc(-c2ccccn2)cc1]

A vessel was charged with 5 mmol 4'-bromo-2-nitrobiphenyl, 12.5 mmol 2-(tributylstannyl)pyridine, 0.25 mmol tetrakistriphenylphosphine palladium(0), 20 mmol potassium fluoride, and 75 mL anhydrous, degassed toluene. The vessel was set to reflux under a nitrogen atmosphere for 3 days. The resulting solution was cooled, the solids filtered off, and poured into a stirring aqueous solution of potassium fluoride. The organic phase was collected, washed once more with aqueous potassium fluoride, and dried of magnesium sulfate. The solvent was removed under reduced pressure and the crude product was chromatographed over silica initially with hexane followed by dichloromethane to yield a viscous, colorless oil in 60% yield.

Example 5: Synthesis of 2-(2-pyridyl)-9H-carbazole

Under a nitrogen atmosphere, 100 mmol of 2-[4-(2-nitrophenyl)phenyl]pyridine was set to reflux overnight in stirring tirethylphosphite. After cooling, the triethylphosphite was distilled off, the solids dissolved in

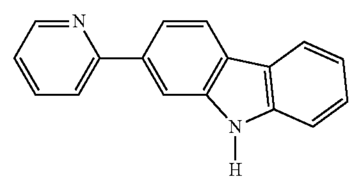 [SMILES: c1ccc(-c2ccc3c(c2)[nH]c2ccccc23)nc1]

dichloromethane, and rinsed three times with water. The organic fraction was dried with magnesium sulfate and concentrated under reduced pressure and subjected to column chromatography of silica with dichloromethane as the eluent. After concentrating under reduced pressure, 2-(2-pyridyl)-9H-carbazole was isolated in a 60% yield.

Example 6: Synthesis of 2-(2-pyridyl)-9-[9-(2-pyridyl)carbazol-2-yl]carbazole

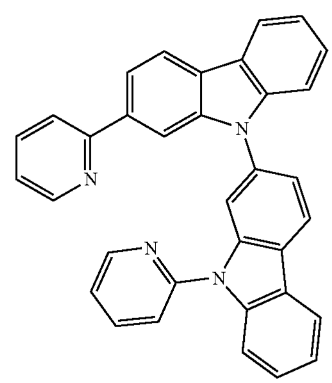 [SMILES: c1ccc(-c2ccc3c4ccccc4n(-c4ccc5c6ccccc6n(-c6ccccn6)c5c4)c3c2)nc1]

Under a nitrogen atmosphere, 10 mmol of 2-(2-pyridyl)-9H-carbazole, 10 mmol of 2-bromo-9-(pyridin-2-yl)-9H-carbazole, 1 mmol of copper(I)iodide, 25 mmol of potassium carbonate, and 2 mmol of L-proline were combined in stirring degassed dimethyl sulfoxide. The mixture was heated to 90° C. for 3 days before being cooled and separated between dichloromethane and water. The water layer was washed twice with dichloromethane and the organics were combined and washed once with brine. The organic fraction was dried with magnesium sulfate and concentrated under reduced pressure and subjected to column chromatography of silica with dichloromethane/ethyl acetate as the eluent. After concentrating under reduced pressure, 2-(2-pyridyl)-9-[9-(2-pyridyl)carbazol-2-yl]carbazole was isolated in a 60% yield.

Example 7: Synthesis of PdN3N

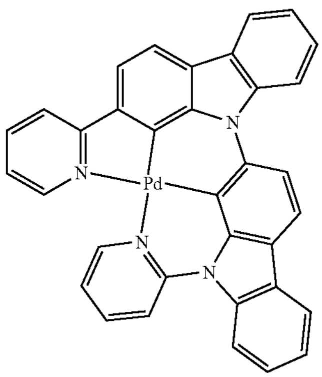

Under a nitrogen atmosphere, 10 mmol of 2-(2-pyridyl)-9-[9-(2-pyridyl)carbazol-2-yl]carbazole, 9 mmol of $PdCl_2$, and 4 Å molecular sieves were added to stirring acetic acid. The mixture was stirred at room temperature overnight, heated to 60° C. for 3 days, then to 90° C. for 3 days. The solution was cooled, and poured into 100 mL of stirring dichloromethane. The mixture was filtered, and the filtrate concentrated under reduced pressure. The solid was subjected to flash chromatography of alumina with dichloromethane as the eluent and isolate in 20% yield.

Example 8, Synthesis of PdN1N

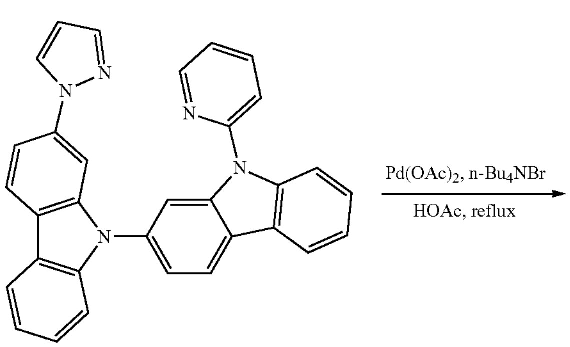

-continued

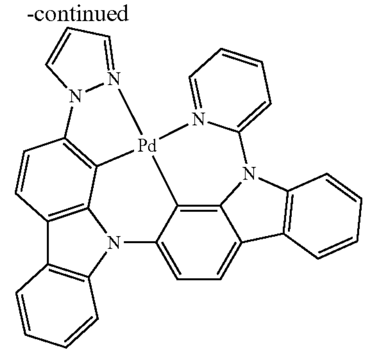

PdN1N

To a solution of substrate (247 mg) in HOAc (26 mL) were added $Pd(OAc)_2$ (123 mg) and $n\text{-}Bu_4NBr$ (17 mg). The mixture was heated to reflux for 3 days. The reaction mixture was cooled to rt, filtered through a pad of silica gel, and concentrated. Purification by column chromatography (hexanes:DCM=1:1 to 1:2) gave PdN1N (121 mg, yield: 40%). $^1H$ NMR (400 MHz, DMSO-$d_6$) δ 9.05 (d, J=5.6 Hz, 1H), 8.91 (d, J=2.6 Hz, 1H), 8.29-8.09 (m, 7H), 8.09-7.98 (m, 3H), 7.71 (d, J=8.2 Hz, 1H), 7.55-7.45 (m, 3H), 7.41 (t, J=7.5 Hz, 1H), 7.30 (t, J=7.5 Hz, 1H), 6.79 (t, J=2.5 Hz, 1H).

Example 9, Synthesis of PdN6N

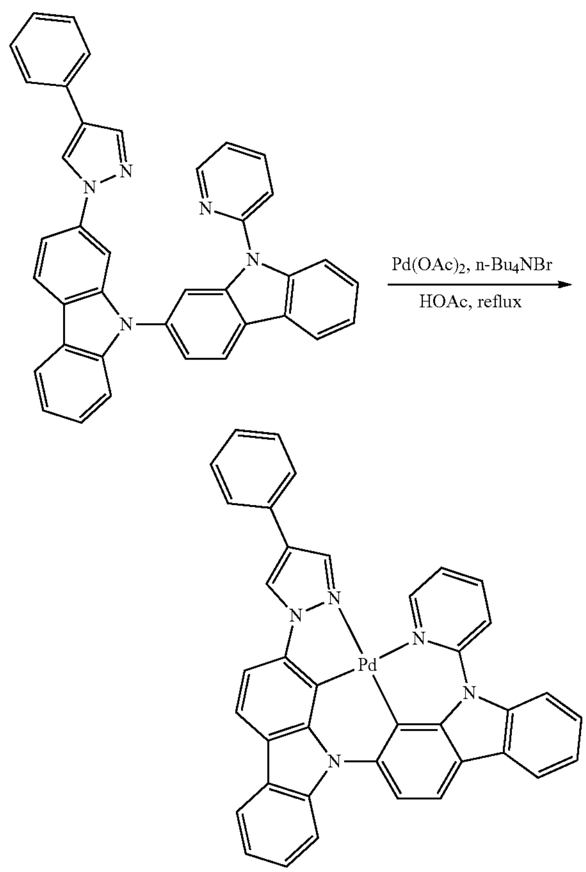

PdN6N

To a solution of substrate (827 mg) in HOAc (75 mL) were added $Pd(OAc)_2$ (354 mg) and $n\text{-}Bu_4NBr$ (48 mg). The mixture was heated to reflux for 3 days. The reaction mixture was cooled to rt, filtered through a pad of silica gel, and concentrated. Purification by column chromatography (hexanes:DCM=1:1 to 1:2) gave PdN6N (463 mg, yield: 47%). $^1$H NMR (400 MHz, DMSO-$d_6$) δ 9.42 (s, 1H), 9.13 (d, J=5.5 Hz, 1H), 8.61 (s, 1H), 8.30-8.12 (m, 6H), 8.10-8.02 (m, 3H), 7.89 (d, J=7.6 Hz, 2H), 7.74 (d, J=8.2 Hz, 1H), 7.57-7.45 (m, 5H), 7.42 (t, J=7.5 Hz, 1H), 7.36-7.28 (m, 2H).

Example 10, Synthesis of PdON3_1

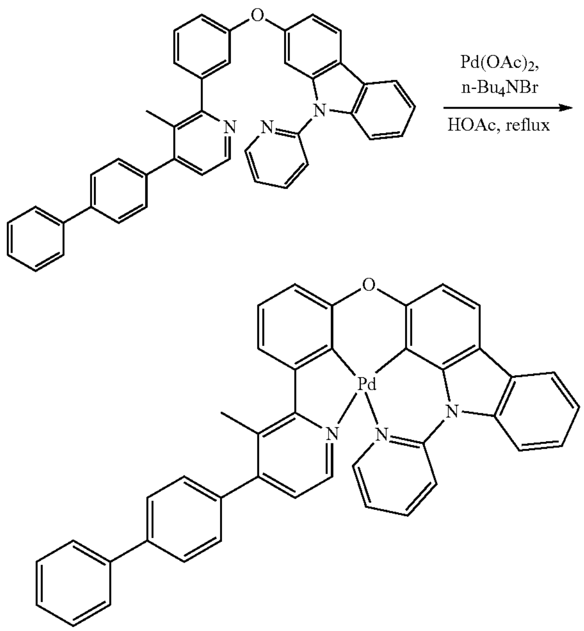

PdON3_1

To a solution of substrate (243 mg) in HOAc (21 mL) were added $Pd(OAc)_2$ (99 mg) and $n\text{-}Bu_4NBr$ (14 mg). The mixture was heated to reflux for 24 hours. The reaction mixture was cooled to rt, filtered through a pad of silica gel, and concentrated. Purification by column chromatography (hexanes:DCM=1:1 to 1:2) gave the product (216 mg, yield: 75%). $^1$H NMR (400 MHz, DMSO-$d_6$) δ 9.05 (d, J=5.5 Hz, 1H), 8.63 (d, J=5.5 Hz, 1H), 8.21-8.11 (m, 3H), 8.07 (d, J=8.2 Hz, 1H), 7.90 (d, J=8.2 Hz, 1H), 7.86 (d, J=7.8 Hz, 2H), 7.83-7.75 (m, 3H), 7.63 (d, J=7.8 Hz, 2H), 7.57-7.36 (m, 7H), 7.31 (t, J=7.6 Hz, 1H), 7.22 (d, J=8.2 Hz, 1H), 7.18 (d, J=7.9 Hz, 1H), 2.68 (s, 3H).

Example 11, Synthesis of PdON3_2

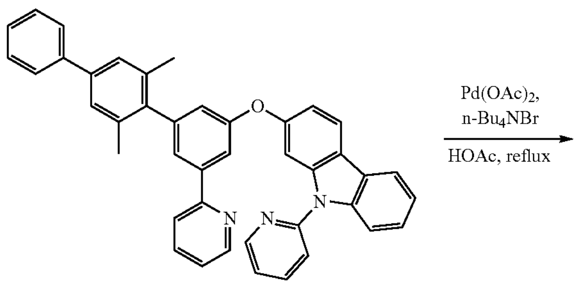

-continued

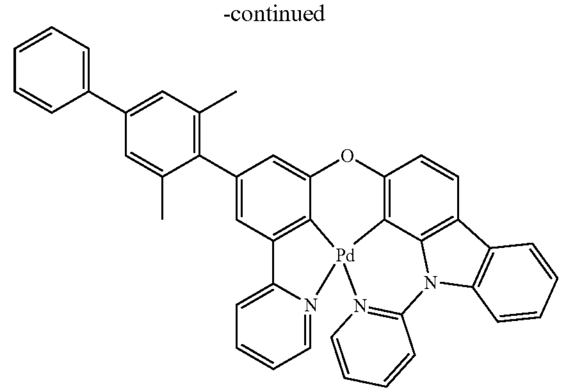

PdON3_2

To a solution of substrate (178 mg) in HOAc (15 mL) were added $Pd(OAc)_2$ (71 mg) and $n\text{-}Bu_4NBr$ (10 mg). The mixture was heated to reflux for 24 hours. The reaction mixture was cooled to rt, filtered through a pad of silica gel, and concentrated. Purification by column chromatography (hexanes:DCM=1:1 to 1:2) gave the product (162 mg, yield: 77%). $^1$H NMR (500 MHz, DMSO-$d_6$) δ 8.99 (d, J=4.4 Hz, 1H), 8.70 (d, J=4.4 Hz, 1H), 8.34 (d, J=8.3 Hz, 1H), 8.22-8.13 (m, 3H), 8.12-8.04 (m, 2H), 7.93 (d, J=8.3 Hz, 1H), 7.72 (d, J=7.2 Hz, 2H), 7.60 (s, 1H), 7.57 (t, J=6.0 Hz, 1H), 7.53-7.44 (m, 6H), 7.43-7.35 (m, 2H), 7.23 (d, J=8.2 Hz, 1H), 6.94 (d, J=1.5 Hz, 1H), 2.19 (s, 6H).

Example 12, Synthesis of PdON3_3

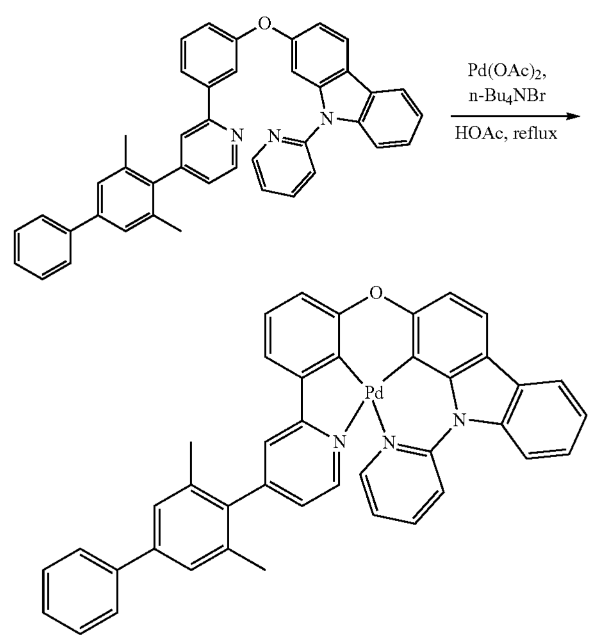

PdON3_3

To a solution of substrate (154 mg) in HOAc (13 mL) were added $Pd(OAc)_2$ (61 mg) and $n\text{-}Bu_4NBr$ (9 mg). The mixture was heated to reflux for 24 hours. The reaction mixture was cooled to rt, filtered through a pad of silica gel, and concentrated. Purification by column chromatography (hexanes:DCM=1:1 to 1:2) gave the product (153 mg, yield:

84%). $^{1}$H NMR (400 MHz, DMSO-$d_6$) δ 9.07 (d, J=5.5 Hz, 1H), 8.73 (d, J=5.5 Hz, 1H), 8.22-8.11 (m, 4H), 8.06 (d, J=8.3 Hz, 1H), 7.92 (d, J=8.3 Hz, 1H), 7.83 (d, J=7.5 Hz, 1H), 7.72 (d, J=7.1 Hz, 2H), 7.55-7.36 (m, 9H), 7.27-7.20 (m, 2H), 7.16 (d, J=8.0 Hz, 1H), 2.19 (s, 6H).

What is claimed is:

1. A metal complex comprising:

a transition metal selected from the group consisting of palladium (II), gold (III), iridium (I), and rhodium (I); and a tetradentate ligand bonded to the transition metal, wherein:

the metal complex has a lowest triplet excited state and a lowest singlet excited state, the lowest triplet excited state has a lower energy level than the lowest singlet excited state, the lowest triplet excited state is associated with phosphorescence, and a transition from the lowest triplet excited state to the lowest singlet excited state yields delayed fluorescence from the lowest singlet excited state;

wherein the metal complex is represented by formula (a):

(a)

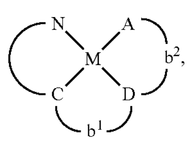

wherein M is palladium (II), gold (III), iridium (I), or rhodium (I), wherein A is an accepting group represented by comprising the following structure, which can optionally be substituted,

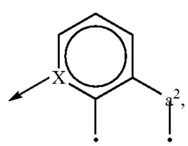

wherein D is a donor group represented by the structure,

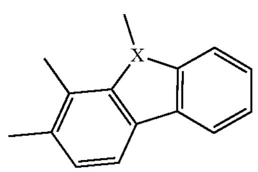

which can optionally be substituted, wherein C represents the structure,

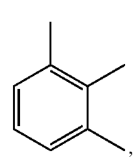

which can optionally be substituted, wherein N represents one or more of the following structures, which can optionally be substituted:

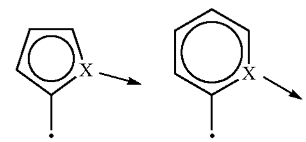

wherein $a^2$ is absent, wherein $b^1$ is present or absent, and if present, represents a linking group of one or more of the following:

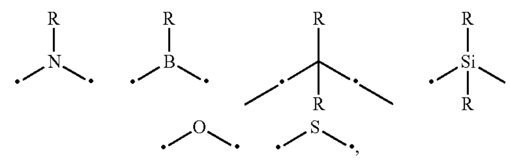

wherein $b^2$ is absent, wherein X is N, and wherein each of R is hydrogen, aryl, cycloalkyl, cycloalkenyl, heterocyclyl, heteroaryl, alkyl, alkenyl, alkynyl, deuterium, halogen, hydroxyl, thiol, nitro, cyano, amino, a mono- or di-alkylamino, a mono- or diaryl amino, alkoxy, aryloxy, haloalkyl, aralkyl, ester, nitrile, isonitrile, alkoxycarbonyl, acylamino, alkoxycarbonylamino, aryloxycarbonylamino, sulfonylamino, sulfamoyl, carbamoyl, alkylthio, sulfinyl, ureido, phosphoramide, amercapto, sulfo, carboxyl, hydrazino, substituted silyl, or polymerizable, or any conjugate or combination thereof.

2. The metal complex of claim 1, wherein the tetradentate ligand comprises at least four or six-membered aryl or heteroaryl groups.

3. The metal complex of claim 1, wherein N is

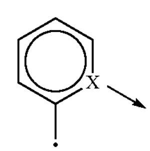

or R substituted

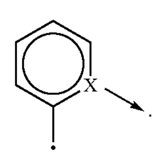

4. The metal complex of claim 1, represented by the following structure:
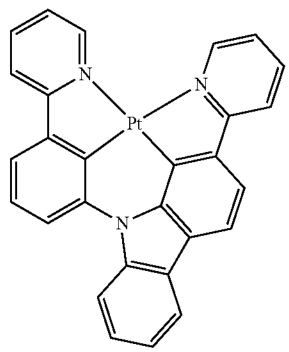
5. A device comprising the metal complex of claim 1.
6. The device of claim 5, wherein the device is an organic light emitting diode or a full color display.
* * * * *